US008907442B2

(12) United States Patent
Or-Bach et al.

(10) Patent No.: US 8,907,442 B2

(45) Date of Patent: Dec. 9, 2014

(54) SYSTEM COMPRISING A SEMICONDUCTOR DEVICE AND STRUCTURE

(75) Inventors: Zvi Or-Bach, San Jose, CA (US); Brian Cronquist, San Jose, CA (US); Israel Beinglass, Sunnyvale, CA (US); Jan Lodewijk de Jong, Cupertino, CA (US); Deepak C. Sekar, San Jose, CA (US); Zeev Wurman, Palo Alto, CA (US)

(73) Assignee: Monolthic 3D Inc., San Jose, CA (US)

(*) Notice: Subject to any disclaimer, the term of this patent is extended or adjusted under 35 U.S.C. 154(b) by 403 days.

(21) Appl. No.: 13/492,382

(22) Filed: Jun. 8, 2012

(65) Prior Publication Data

US 2012/0273955 A1 Nov. 1, 2012

Related U.S. Application Data

(63) Continuation of application No. 13/246,384, filed on Sep. 27, 2011, now Pat. No. 8,237,228, which is a (Continued)

(51) Int. Cl.

*H01L 21/50* (2006.01)

*H01L 21/98* (2006.01)

(Continued)

(52) U.S. Cl.

CPC .......... *H01L 21/8221* (2013.01); *G03F 9/7076* (2013.01); *G03F 9/7084* (2013.01); *H01L 21/76254* (2013.01); *H01L 21/84* (2013.01); *H01L 23/544* (2013.01); *H01L 27/0207* (2013.01); *H01L 27/0688* (2013.01); *H01L 27/105* (2013.01); *H01L 27/10876* (2013.01); *H01L 27/10894* (2013.01); *H01L 27/10897* (2013.01); *H01L 27/11* (2013.01); *H01L 27/1108* (2013.01); *H01L 27/112* (2013.01); *H01L 27/11551* (2013.01); *H01L 27/11578* (2013.01); *H01L 27/11807* (2013.01); *H01L 27/11898* (2013.01); *H01L 27/1203* (2013.01); *H01L 23/481* (2013.01); *H01L 2223/5442* (2013.01); *H01L 2223/54426* (2013.01); *H01L 2223/54453* (2013.01); *H01L 2924/3011* (2013.01); *H01L 2224/16145* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2924/15311* (2013.01); *H01L 2924/10253* (2013.01); *H01L 2224/45124* (2013.01); *H01L 2924/3025* (2013.01)

USPC ............................ 257/499; 257/368; 257/369

(58) Field of Classification Search

USPC ......................................... 257/368, 369, 499

See application file for complete search history.

(56) References Cited

U.S. PATENT DOCUMENTS

| | | | |
|---|---|---|---|
| 3,007,090 | A | 10/1961 | Rutz |
| 3,819,959 | A | 6/1974 | Chang et al. |

(Continued)

FOREIGN PATENT DOCUMENTS

| | | | |
|---|---|---|---|
| EP | 1267594 | A2 | 12/2002 |
| EP | 1909311 | A2 | 4/2008 |
| WO | PCT/US2008/063483 | | 5/2008 |

OTHER PUBLICATIONS

Colinge, J. P., et al., "Nanowire transistors without Junctions", Nature Nanotechnology, Feb. 21, 2010, pp. 1-5.

(Continued)

*Primary Examiner* — Evan Pert

(57) ABSTRACT

A semiconductor device, including: a first layer including first transistors; an interconnection layer overlying the first transistors, the interconnection layer providing interconnection for the first transistors; a bonding layer overlying the interconnection layer; a second layer overlying the bonding layer; and a carrier substrate for the transferring of the second layer, where the second layer includes at least one through second layer via, where the at least one through second layer via has a diameter of less than 100 nm, where the second layer includes a plurality of second transistors, and where the second layer is transferred from a donor wafer.

30 Claims, 491 Drawing Sheets

Related U.S. Application Data continuation of application No. 12/900,379, filed on Oct. 7, 2010, now Pat. No. 8,395,191, which is a continuation-in-part of application No. 12/859,665, filed on Aug. 19, 2010, now Pat. No. 8,405,420, which is a continuation-in-part of application No. 12/849,272, filed on Aug. 3, 2010, now Pat. No. 7,986,042, and a continuation-in-part of application No. 12/847,911, filed on Jul. 30, 2010, now Pat. No. 7,960,242, which is a continuation-in-part of application No. 12/792,673, filed on Jun. 2, 2010, now Pat. No. 7,964,916, and a continuation-in-part of application No. 12/797,493, filed on Jun. 9, 2010, now Pat. No. 8,115,511, and a continuation-in-part of application No. 12/706,520, filed on Feb. 16, 2010, said application No. 12/797,493 is a continuation-in-part of application No. 12/577,532, filed on Oct. 12, 2009, said application No. 12/792,673 is a continuation-in-part of application No. 12/577,532, filed on Oct. 12, 2009.

(51) Int. Cl.

| | |
|---|---|
| ***H01L 21/822*** | (2006.01) |
| ***G03F 9/00*** | (2006.01) |
| ***H01L 21/762*** | (2006.01) |
| ***H01L 21/84*** | (2006.01) |
| ***H01L 23/544*** | (2006.01) |
| ***H01L 27/02*** | (2006.01) |
| ***H01L 27/06*** | (2006.01) |
| ***H01L 27/105*** | (2006.01) |
| ***H01L 27/108*** | (2006.01) |
| ***H01L 27/11*** | (2006.01) |
| ***H01L 27/112*** | (2006.01) |
| ***H01L 27/115*** | (2006.01) |
| ***H01L 27/118*** | (2006.01) |
| ***H01L 27/12*** | (2006.01) |
| *H01L 23/48* | (2006.01) |

(56) References Cited

U.S. PATENT DOCUMENTS 4,197,555 A 4/1980 Uehara et al.
4,400,715 A 8/1983 Barbee et al.
4,487,635 A 12/1984 Kugimiya et al.
4,522,657 A 6/1985 Rohatgi et al.
4,612,083 A 9/1986 Yasumoto et al.
4,643,950 A 2/1987 Ogura et al.
4,704,785 A 11/1987 Curran
4,711,858 A 12/1987 Harder et al.
4,721,885 A 1/1988 Brodie
4,732,312 A 3/1988 Kennedy et al.
4,733,288 A 3/1988 Sato
4,829,018 A 5/1989 Wahlstrom
4,854,986 A 8/1989 Raby
4,866,304 A 9/1989 Yu
4,939,568 A 7/1990 Kato et al.
4,956,307 A 9/1990 Pollack et al.
5,012,153 A 4/1991 Atkinson et al.
5,032,007 A 7/1991 Silverstein et al.
5,047,979 A 9/1991 Leung
5,087,585 A 2/1992 Hayashi
5,093,704 A 3/1992 Sato et al.
5,106,775 A 4/1992 Kaga et al.
5,152,857 A 10/1992 Ito et al.
5,162,879 A 11/1992 Gill
5,217,916 A 6/1993 Anderson et al.
5,250,460 A 10/1993 Yamagata et al.
5,258,643 A 11/1993 Cohen
5,265,047 A 11/1993 Leung et al.
5,266,511 A 11/1993 Takao
5,277,748 A 1/1994 Sakaguchi et al.
5,286,670 A 2/1994 Kang et al.
5,294,556 A 3/1994 Kawamura
5,308,782 A 5/1994 Mazure et al.
5,312,771 A 5/1994 Yonehara
5,317,236 A 5/1994 Zavracky et al.
5,324,980 A 6/1994 Kusunoki
5,355,022 A 10/1994 Sugahara et al.
5,371,037 A 12/1994 Yonehara
5,374,564 A 12/1994 Bruel
5,374,581 A 12/1994 Ichikawa et al.
5,424,560 A 6/1995 Norman et al.
5,475,280 A 12/1995 Jones et al.
5,478,762 A 12/1995 Chao
5,485,031 A 1/1996 Zhang et al.
5,498,978 A 3/1996 Takahashi et al.
5,527,423 A 6/1996 Neville et al.
5,535,342 A 7/1996 Taylor
5,554,870 A 9/1996 Fitch et al.
5,563,084 A 10/1996 Ramm et al.
5,583,349 A 12/1996 Norman et al.
5,583,350 A 12/1996 Norman et al.
5,594,563 A 1/1997 Larson
5,604,137 A 2/1997 Yamazaki et al.
5,617,991 A 4/1997 Pramanick et al.
5,627,106 A 5/1997 Hsu
5,656,548 A 8/1997 Zavracky et al.
5,656,553 A 8/1997 Leas et al.
5,670,411 A 9/1997 Yonehara
5,681,756 A 10/1997 Norman et al.
5,695,557 A 12/1997 Yamagata et al.
5,701,027 A 12/1997 Gordon et al.
5,707,745 A 1/1998 Forrest et al.
5,714,395 A 2/1998 Bruel
5,721,160 A 2/1998 Forrest et al.
5,737,748 A 4/1998 Shigeeda
5,739,552 A 4/1998 Kimura et al.
5,744,979 A 4/1998 Goetting
5,748,161 A 5/1998 Lebby et al.
5,757,026 A 5/1998 Forrest et al.
5,770,881 A 6/1998 Pelella et al.
5,781,031 A 7/1998 Bertin et al.
5,829,026 A 10/1998 Leung et al.
5,835,396 A 11/1998 Zhang
5,854,123 A 12/1998 Sato et al.
5,861,929 A 1/1999 Spitzer
5,877,070 A 3/1999 Goesele et al.
5,882,987 A 3/1999 Srikrishnan
5,883,525 A 3/1999 Tavana et al.
5,889,903 A 3/1999 Rao
5,893,721 A 4/1999 Huang et al.
5,915,167 A 6/1999 Leedy
5,937,312 A 8/1999 Iyer et al.
5,943,574 A 8/1999 Tehrani et al.
5,952,680 A 9/1999 Strite
5,952,681 A 9/1999 Chen
5,965,875 A 10/1999 Merrill
5,977,579 A 11/1999 Noble
5,977,961 A 11/1999 Rindal
5,980,633 A 11/1999 Yamagata et al.
5,985,742 A 11/1999 Henley et al.
5,998,808 A 12/1999 Matsushita
6,001,693 A 12/1999 Yeouchung et al.
6,009,496 A 12/1999 Tsai
6,020,252 A 2/2000 Aspar et al.
6,020,263 A 2/2000 Shih et al.
6,027,958 A 2/2000 Vu et al.
6,030,700 A 2/2000 Forrest et al.
6,052,498 A 4/2000 Paniccia
6,057,212 A 5/2000 Chan et al.
6,071,795 A 6/2000 Cheung et al.
6,075,268 A 6/2000 Gardner et al.
6,103,597 A 8/2000 Aspar et al.
6,111,260 A 8/2000 Dawson et al.
6,125,217 A 9/2000 Paniccia et al.
6,153,495 A 11/2000 Kub et al.
6,191,007 B1 2/2001 Matsui et al.
6,222,203 B1 4/2001 Ishibashi et al.

(56) References Cited

U.S. PATENT DOCUMENTS

| | | | |
|---|---|---|---|
| 6,229,161 | B1 | 5/2001 | Nemati et al. |
| 6,242,324 | B1 | 6/2001 | Kub et al. |
| 6,242,778 | B1 | 6/2001 | Marmillion et al. |
| 6,259,623 | B1 | 7/2001 | Takahashi |
| 6,264,805 | B1 | 7/2001 | Forrest et al. |
| 6,281,102 | B1 | 8/2001 | Cao et al. |
| 6,294,018 | B1 | 9/2001 | Hamm et al. |
| 6,306,705 | B1 | 10/2001 | Parekh et al. |
| 6,321,134 | B1 | 11/2001 | Henley et al. |
| 6,322,903 | B1 | 11/2001 | Siniaguine et al. |
| 6,331,468 | B1 | 12/2001 | Aronowitz et al. |
| 6,331,790 | B1 | 12/2001 | Or-Bach et al. |
| 6,353,492 | B2 | 3/2002 | McClelland et al. |
| 6,355,501 | B1 | 3/2002 | Fung et al. |
| 6,358,631 | B1 | 3/2002 | Forrest et al. |
| 6,365,270 | B2 | 4/2002 | Forrest et al. |
| 6,376,337 | B1 | 4/2002 | Wang et al. |
| 6,380,046 | B1 | 4/2002 | Yamazaki |
| 6,392,253 | B1 | 5/2002 | Saxena |
| 6,417,108 | B1 | 7/2002 | Akino et al. |
| 6,420,215 | B1 | 7/2002 | Knall et al. |
| 6,423,614 | B1 | 7/2002 | Doyle |
| 6,429,481 | B1 | 8/2002 | Mo et al. |
| 6,429,484 | B1 | 8/2002 | Yu |
| 6,430,734 | B1 | 8/2002 | Zahar |
| 6,475,869 | B1 | 11/2002 | Yu |
| 6,476,493 | B2 | 11/2002 | Or-Bach et al. |
| 6,479,821 | B1 | 11/2002 | Hawryluk et al. |
| 6,515,511 | B2 | 2/2003 | Sugibayashi et al. |
| 6,526,559 | B2 | 2/2003 | Schiefele et al. |
| 6,528,391 | B1 | 3/2003 | Henley et al. |
| 6,534,352 | B1 | 3/2003 | Kim |
| 6,534,382 | B1 | 3/2003 | Sakaguchi et al. |
| 6,544,837 | B1 | 4/2003 | Divakauni et al. |
| 6,545,314 | B2 | 4/2003 | Forbes et al. |
| 6,555,901 | B1 | 4/2003 | Yoshihara et al. |
| 6,563,139 | B2 | 5/2003 | Hen |
| 6,580,289 | B2 | 6/2003 | Cox |
| 6,600,173 | B2 | 7/2003 | Tiwari |
| 6,620,659 | B2 | 9/2003 | Emmma et al. |
| 6,624,046 | B1 | 9/2003 | Zavracky et al. |
| 6,627,518 | B1 | 9/2003 | Inoue et al. |
| 6,630,713 | B2 | 10/2003 | Geusic |
| 6,635,552 | B1 | 10/2003 | Gonzalez |
| 6,635,588 | B1 | 10/2003 | Hawryluk et al. |
| 6,638,834 | B2 | 10/2003 | Gonzalez |
| 6,642,744 | B2 | 11/2003 | Or-Bach et al. |
| 6,653,209 | B1 | 11/2003 | Yamagata |
| 6,661,085 | B2 | 12/2003 | Kellar et al. |
| 6,677,204 | B2 | 1/2004 | Cleeves et al. |
| 6,686,253 | B2 | 2/2004 | Or-Bach |
| 6,703,328 | B2 | 3/2004 | Tanaka et al. |
| 6,756,633 | B2 | 6/2004 | Wang et al. |
| 6,756,811 | B2 | 6/2004 | Or-Bach |
| 6,759,282 | B2 | 7/2004 | Campbell et al. |
| 6,762,076 | B2 | 7/2004 | Kim et al. |
| 6,774,010 | B2 | 8/2004 | Chu et al. |
| 6,805,979 | B2 | 10/2004 | Ogura et al. |
| 6,806,171 | B1 | 10/2004 | Ulyashin et al. |
| 6,809,009 | B2 | 10/2004 | Aspar et al. |
| 6,815,781 | B2 | 11/2004 | Vyvoda et al. |
| 6,819,136 | B2 | 11/2004 | Or-Bach |
| 6,821,826 | B1 | 11/2004 | Chan et al. |
| 6,841,813 | B2 | 1/2005 | Walker et al. |
| 6,844,243 | B1 | 1/2005 | Gonzalez |
| 6,864,534 | B2 | 3/2005 | Ipposhi et al. |
| 6,875,671 | B2 | 4/2005 | Faris |
| 6,882,572 | B2 | 4/2005 | Wang et al. |
| 6,888,375 | B2 | 5/2005 | Feng et al. |
| 6,917,219 | B2 | 7/2005 | New |
| 6,927,431 | B2 | 8/2005 | Gonzalez |
| 6,930,511 | B2 | 8/2005 | Or-Bach |
| 6,943,067 | B2 | 9/2005 | Greenlaw |
| 6,943,407 | B2 | 9/2005 | Ouyang et al. |
| 6,949,421 | B1 | 9/2005 | Padmanabhan et al. |
| 6,953,956 | B2 | 10/2005 | Or-Bach et al. |
| 6,967,149 | B2 | 11/2005 | Meyer et al. |
| 6,985,012 | B2 | 1/2006 | Or-Bach |
| 6,989,687 | B2 | 1/2006 | Or-Bach |
| 6,995,430 | B2 | 2/2006 | Langdo et al. |
| 6,995,456 | B2 | 2/2006 | Nowak |
| 7,015,719 | B1 | 3/2006 | Feng et al. |
| 7,016,569 | B2 | 3/2006 | Mule et al. |
| 7,018,875 | B2 | 3/2006 | Madurawe |
| 7,019,557 | B2 | 3/2006 | Madurawe |
| 7,043,106 | B2 | 5/2006 | West et al. |
| 7,052,941 | B2 | 5/2006 | Lee |
| 7,064,579 | B2 | 6/2006 | Madurawe |
| 7,067,396 | B2 | 6/2006 | Aspar et al. |
| 7,067,909 | B2 | 6/2006 | Reif et al. |
| 7,068,070 | B2 | 6/2006 | Or-Bach |
| 7,068,072 | B2 | 6/2006 | New et al. |
| 7,078,739 | B1 | 7/2006 | Nemati et al. |
| 7,094,667 | B1 | 8/2006 | Bower |
| 7,098,691 | B2 | 8/2006 | Or-Bach et al. |
| 7,105,390 | B2 | 9/2006 | Brask et al. |
| 7,105,871 | B2 | 9/2006 | Or-Bach et al. |
| 7,109,092 | B2 | 9/2006 | Tong |
| 7,110,629 | B2 | 9/2006 | Bjorkman et al. |
| 7,111,149 | B2 | 9/2006 | Eilert |
| 7,115,945 | B2 | 10/2006 | Lee et al. |
| 7,115,966 | B2 | 10/2006 | Ido et al. |
| 7,141,853 | B2 | 11/2006 | Campbell et al. |
| 7,148,119 | B1 | 12/2006 | Sakaguchi et al. |
| 7,157,787 | B2 | 1/2007 | Kim et al. |
| 7,157,937 | B2 | 1/2007 | Apostol et al. |
| 7,166,520 | B1 | 1/2007 | Henley |
| 7,170,807 | B2 | 1/2007 | Fazan et al. |
| 7,173,369 | B2 | 2/2007 | Forrest et al. |
| 7,180,091 | B2 | 2/2007 | Yamazaki et al. |
| 7,180,379 | B1 | 2/2007 | Hopper et al. |
| 7,189,489 | B2 | 3/2007 | Kunimoto et al. |
| 7,205,204 | B2 | 4/2007 | Ogawa et al. |
| 7,209,384 | B1 | 4/2007 | Kim |
| 7,217,636 | B1 | 5/2007 | Atanackovic |
| 7,223,612 | B2 | 5/2007 | Sarma |
| 7,242,012 | B2 | 7/2007 | Leedy |
| 7,245,002 | B2 | 7/2007 | Akino et al. |
| 7,256,104 | B2 | 8/2007 | Ito et al. |
| 7,259,091 | B2 | 8/2007 | Schuehrer et al. |
| 7,265,421 | B2 | 9/2007 | Madurawe |
| 7,271,420 | B2 | 9/2007 | Cao |
| 7,282,951 | B2 | 10/2007 | Huppenthal et al. |
| 7,284,226 | B1 | 10/2007 | Kondapalli |
| 7,296,201 | B2 | 11/2007 | Abramovici |
| 7,304,355 | B2 | 12/2007 | Zhang |
| 7,312,109 | B2 | 12/2007 | Madurawe |
| 7,312,487 | B2 | 12/2007 | Alam et al. |
| 7,335,573 | B2 | 2/2008 | Takayama et al. |
| 7,337,425 | B2 | 2/2008 | Kirk |
| 7,338,884 | B2 | 3/2008 | Shimoto et al. |
| 7,351,644 | B2 | 4/2008 | Henley |
| 7,358,601 | B1 | 4/2008 | Plants et al. |
| 7,362,133 | B2 | 4/2008 | Madurawe |
| 7,369,435 | B2 | 5/2008 | Forbes |
| 7,371,660 | B2 | 5/2008 | Henley et al. |
| 7,378,702 | B2 | 5/2008 | Lee |
| 7,393,722 | B1 | 7/2008 | Issaq et al. |
| 7,419,844 | B2 | 9/2008 | Lee et al. |
| 7,436,027 | B2 | 10/2008 | Ogawa et al. |
| 7,439,773 | B2 | 10/2008 | Or-Bach et al. |
| 7,446,563 | B2 | 11/2008 | Madurawe |
| 7,459,752 | B2 | 12/2008 | Doris et al. |
| 7,459,763 | B1 | 12/2008 | Issaq et al. |
| 7,459,772 | B2 | 12/2008 | Speers |
| 7,463,062 | B2 | 12/2008 | Or-Bach et al. |
| 7,470,142 | B2 | 12/2008 | Lee |
| 7,470,598 | B2 | 12/2008 | Lee |
| 7,476,939 | B2 | 1/2009 | Okhonin et al. |
| 7,477,540 | B2 | 1/2009 | Okhonin et al. |
| 7,485,968 | B2 | 2/2009 | Enquist et al. |
| 7,486,563 | B2 | 2/2009 | Waller et al. |
| 7,488,980 | B2 | 2/2009 | Takafuji et al. |
| 7,492,632 | B2 | 2/2009 | Carman |

(56) References Cited

U.S. PATENT DOCUMENTS

| | | | |
|---|---|---|---|
| 7,495,473 | B2 | 2/2009 | McCollum et al. |
| 7,498,675 | B2 | 3/2009 | Farnworth et al. |
| 7,499,352 | B2 | 3/2009 | Singh |
| 7,499,358 | B2 | 3/2009 | Bauser |
| 7,508,034 | B2 | 3/2009 | Takafuji et al. |
| 7,514,748 | B2 | 4/2009 | Fazan et al. |
| 7,525,186 | B2 | 4/2009 | Kim et al. |
| 7,535,089 | B2 | 5/2009 | Fitzgerald |
| 7,541,616 | B2 | 6/2009 | Fazan et al. |
| 7,547,589 | B2 | 6/2009 | Iriguchi |
| 7,557,367 | B2 | 7/2009 | Rogers et al. |
| 7,563,659 | B2 | 7/2009 | Kwon et al. |
| 7,566,855 | B2 | 7/2009 | Olsen et al. |
| 7,586,778 | B2 | 9/2009 | Ho et al. |
| 7,589,375 | B2 | 9/2009 | Jang et al. |
| 7,608,848 | B2 | 10/2009 | Ho et al. |
| 7,622,367 | B1 | 11/2009 | Nuzzo et al. |
| 7,632,738 | B2 | 12/2009 | Lee |
| 7,633,162 | B2 | 12/2009 | Lee |
| 7,666,723 | B2 | 2/2010 | Frank et al. |
| 7,671,371 | B2 | 3/2010 | Lee |
| 7,671,460 | B2 | 3/2010 | Lauxtermann et al. |
| 7,674,687 | B2 | 3/2010 | Henley |
| 7,687,372 | B2 | 3/2010 | Jain |
| 7,688,619 | B2 | 3/2010 | Lung et al. |
| 7,692,202 | B2 | 4/2010 | Bensch |
| 7,692,448 | B2 | 4/2010 | Solomon |
| 7,692,944 | B2 | 4/2010 | Bernstein et al. |
| 7,697,316 | B2 | 4/2010 | Lai et al. |
| 7,709,932 | B2 | 5/2010 | Nemoto et al. |
| 7,718,508 | B2 | 5/2010 | Lee |
| 7,723,207 | B2 | 5/2010 | Alam et al. |
| 7,728,326 | B2 | 6/2010 | Yamazaki et al. |
| 7,732,301 | B1 | 6/2010 | Pinnington et al. |
| 7,741,673 | B2 | 6/2010 | Tak et al. |
| 7,745,250 | B2 | 6/2010 | Han |
| 7,749,884 | B2 | 7/2010 | Mathew et al. |
| 7,759,043 | B2 | 7/2010 | Tanabe et al. |
| 7,768,115 | B2 | 8/2010 | Lee et al. |
| 7,774,735 | B1 | 8/2010 | Sood |
| 7,776,715 | B2 | 8/2010 | Wells et al. |
| 7,777,330 | B2 | 8/2010 | Pelley et al. |
| 7,786,460 | B2 | 8/2010 | Lung et al. |
| 7,786,535 | B2 | 8/2010 | Abou-Khalil et al. |
| 7,790,524 | B2 | 9/2010 | Abadeer et al. |
| 7,795,619 | B2 | 9/2010 | Hara |
| 7,799,675 | B2 | 9/2010 | Lee |
| 7,800,099 | B2 | 9/2010 | Yamazaki et al. |
| 7,800,148 | B2 | 9/2010 | Lee et al. |
| 7,800,199 | B2 | 9/2010 | Oh et al. |
| 7,843,718 | B2 | 11/2010 | Koh et al. |
| 7,846,814 | B2 | 12/2010 | Lee |
| 7,863,095 | B2 | 1/2011 | Sasaki et al. |
| 7,867,822 | B2 | 1/2011 | Lee |
| 7,888,764 | B2 | 2/2011 | Lee |
| 7,915,164 | B2 | 3/2011 | Konevecki et al. |
| 7,968,965 | B2 | 6/2011 | Kim |
| 7,969,193 | B1 | 6/2011 | Wu et al. |
| 7,982,250 | B2 | 7/2011 | Yamazaki et al. |
| 8,013,399 | B2 | 9/2011 | Thomas et al. |
| 8,014,195 | B2 | 9/2011 | Okhonin et al. |
| 8,022,493 | B2 | 9/2011 | Bang |
| 8,030,780 | B2 | 10/2011 | Kirby et al. |
| 8,031,544 | B2 | 10/2011 | Kim et al. |
| 8,044,464 | B2 | 10/2011 | Yamazaki et al. |
| 8,106,520 | B2 | 1/2012 | Keeth et al. |
| 8,107,276 | B2 | 1/2012 | Breitwisch et al. |
| 8,129,256 | B2 | 3/2012 | Farooq et al. |
| 8,136,071 | B2 | 3/2012 | Solomon |
| 8,138,502 | B2 | 3/2012 | Nakamura et al. |
| 8,158,515 | B2 | 4/2012 | Farooq et al. |
| 8,183,630 | B2 | 5/2012 | Batude et al. |
| 8,184,463 | B2 | 5/2012 | Saen et al. |
| 8,203,187 | B2 | 6/2012 | Lung et al. |
| 8,208,279 | B2 | 6/2012 | Lue |
| 8,264,065 | B2 | 9/2012 | Su et al. |
| 8,343,851 | B2 | 1/2013 | Kim et al. |
| 8,354,308 | B2 | 1/2013 | Kang et al. |
| 8,482,132 | B2 * | 7/2013 | Yang et al. .................... 257/777 |
| 8,492,265 | B2 * | 7/2013 | Yang et al. .................... 438/618 |
| 8,497,512 | B2 | 7/2013 | Nakamura et al. |
| 8,525,342 | B2 | 9/2013 | Chandrasekaran |
| 8,546,956 | B2 | 10/2013 | Nguyen |
| 2001/0000005 | A1 | 3/2001 | Forrest et al. |
| 2001/0014391 | A1 | 8/2001 | Forrest et al. |
| 2001/0028059 | A1 | 10/2001 | Emma et al. |
| 2002/0024140 | A1 | 2/2002 | Nakajima et al. |
| 2002/0025604 | A1 | 2/2002 | Tiwari |
| 2002/0074668 | A1 | 6/2002 | Hofstee et al. |
| 2002/0081823 | A1 | 6/2002 | Cheung et al. |
| 2002/0090758 | A1 | 7/2002 | Henley et al. |
| 2002/0096681 | A1 | 7/2002 | Yamazaki et al. |
| 2002/0113289 | A1 | 8/2002 | Cordes et al. |
| 2002/0132465 | A1 | 9/2002 | Leedy |
| 2002/0141233 | A1 | 10/2002 | Hosotani et al. |
| 2002/0153243 | A1 | 10/2002 | Forrest et al. |
| 2002/0180069 | A1 | 12/2002 | Houston |
| 2002/0190232 | A1 | 12/2002 | Chason |
| 2002/0199110 | A1 | 12/2002 | Kean |
| 2003/0015713 | A1 | 1/2003 | Yoo |
| 2003/0032262 | A1 | 2/2003 | Dennison et al. |
| 2003/0059999 | A1 | 3/2003 | Gonzalez |
| 2003/0060034 | A1 | 3/2003 | Beyne et al. |
| 2003/0061555 | A1 | 3/2003 | Kamei |
| 2003/0067043 | A1 | 4/2003 | Zhang |
| 2003/0102079 | A1 | 6/2003 | Kalvesten et al. |
| 2003/0107117 | A1 | 6/2003 | Antonelli et al. |
| 2003/0113963 | A1 | 6/2003 | Wurzer |
| 2003/0119279 | A1 | 6/2003 | Enquist |
| 2003/0139011 | A1 | 7/2003 | Cleeves et al. |
| 2003/0157748 | A1 | 8/2003 | Kim et al. |
| 2003/0160888 | A1 | 8/2003 | Yoshikawa |
| 2003/0206036 | A1 | 11/2003 | Or-Bach |
| 2003/0213967 | A1 | 11/2003 | Forrest et al. |
| 2003/0224582 | A1 | 12/2003 | Shimoda et al. |
| 2003/0224596 | A1 | 12/2003 | Marxsen et al. |
| 2004/0007376 | A1 | 1/2004 | Urdahl et al. |
| 2004/0014299 | A1 | 1/2004 | Moriceau et al. |
| 2004/0033676 | A1 | 2/2004 | Coronel et al. |
| 2004/0036126 | A1 | 2/2004 | Chau et al. |
| 2004/0047539 | A1 | 3/2004 | Okubora et al. |
| 2004/0061176 | A1 | 4/2004 | Takafuji et al. |
| 2004/0113207 | A1 | 6/2004 | Hsu et al. |
| 2004/0150068 | A1 | 8/2004 | Leedy |
| 2004/0152272 | A1 | 8/2004 | Fladre et al. |
| 2004/0155301 | A1 | 8/2004 | Zhang |
| 2004/0156233 | A1 | 8/2004 | Bhattacharyya |
| 2004/0164425 | A1 | 8/2004 | Urakawa |
| 2004/0166649 | A1 | 8/2004 | Bressot et al. |
| 2004/0175902 | A1 | 9/2004 | Rayssac et al. |
| 2004/0178819 | A1 | 9/2004 | New |
| 2004/0195572 | A1 | 10/2004 | Kato et al. |
| 2004/0259312 | A1 | 12/2004 | Schlosser et al. |
| 2004/0262635 | A1 | 12/2004 | Lee |
| 2004/0262772 | A1 | 12/2004 | Ramanathan et al. |
| 2005/0003592 | A1 | 1/2005 | Jones |
| 2005/0010725 | A1 | 1/2005 | Eilert |
| 2005/0023656 | A1 | 2/2005 | Leedy |
| 2005/0067620 | A1 | 3/2005 | Chan et al. |
| 2005/0067625 | A1 | 3/2005 | Hata |
| 2005/0073060 | A1 | 4/2005 | Datta et al. |
| 2005/0098822 | A1 | 5/2005 | Mathew |
| 2005/0110041 | A1 | 5/2005 | Boutros et al. |
| 2005/0121676 | A1 | 6/2005 | Fried et al. |
| 2005/0121789 | A1 | 6/2005 | Madurawe |
| 2005/0130351 | A1 | 6/2005 | Leedy |
| 2005/0130429 | A1 | 6/2005 | Rayssac et al. |
| 2005/0148137 | A1 | 7/2005 | Brask et al. |
| 2005/0176174 | A1 | 8/2005 | Leedy |
| 2005/0218521 | A1 | 10/2005 | Lee |
| 2005/0225237 | A1 | 10/2005 | Winters |
| 2005/0266659 | A1 | 12/2005 | Ghyselen et al. |
| 2005/0273749 | A1 | 12/2005 | Kirk |
| 2005/0280061 | A1 | 12/2005 | Lee |

(56) References Cited

U.S. PATENT DOCUMENTS

| | | | |
|---|---|---|---|
| 2005/0280090 | A1 | 12/2005 | Anderson et al. |
| 2005/0280154 | A1 | 12/2005 | Lee |
| 2005/0280155 | A1 | 12/2005 | Lee |
| 2005/0280156 | A1 | 12/2005 | Lee |
| 2005/0282019 | A1 | 12/2005 | Fukushima et al. |
| 2006/0014331 | A1 | 1/2006 | Tang et al. |
| 2006/0024923 | A1 | 2/2006 | Sarma et al. |
| 2006/0033110 | A1 | 2/2006 | Alam et al. |
| 2006/0033124 | A1 | 2/2006 | Or-Bach et al. |
| 2006/0067122 | A1 | 3/2006 | Verhoeven |
| 2006/0071322 | A1 | 4/2006 | Kitamura |
| 2006/0071332 | A1 | 4/2006 | Speers |
| 2006/0083280 | A1 | 4/2006 | Tauzin et al. |
| 2006/0113522 | A1 | 6/2006 | Lee et al. |
| 2006/0118935 | A1 | 6/2006 | Kamiyama et al. |
| 2006/0121690 | A1 | 6/2006 | Pogge et al. |
| 2006/0170046 | A1 | 8/2006 | Hara |
| 2006/0179417 | A1 | 8/2006 | Madurawe |
| 2006/0181202 | A1 | 8/2006 | Liao et al. |
| 2006/0189095 | A1 | 8/2006 | Ghyselen et al. |
| 2006/0194401 | A1 | 8/2006 | Hu et al. |
| 2006/0195729 | A1 | 8/2006 | Huppenthal et al. |
| 2006/0207087 | A1 | 9/2006 | Jafri et al. |
| 2006/0249859 | A1 | 11/2006 | Eiles et al. |
| 2006/0275962 | A1 | 12/2006 | Lee |
| 2007/0014508 | A1 | 1/2007 | Chen et al. |
| 2007/0035329 | A1 | 2/2007 | Madurawe |
| 2007/0063259 | A1 | 3/2007 | Derderian et al. |
| 2007/0072391 | A1 | 3/2007 | Pocas et al. |
| 2007/0076509 | A1 | 4/2007 | Zhang |
| 2007/0077694 | A1 | 4/2007 | Lee |
| 2007/0077743 | A1 | 4/2007 | Rao et al. |
| 2007/0090416 | A1 | 4/2007 | Doyle et al. |
| 2007/0102737 | A1 | 5/2007 | Kashiwabara et al. |
| 2007/0108523 | A1 | 5/2007 | Ogawa et al. |
| 2007/0111386 | A1 | 5/2007 | Kim et al. |
| 2007/0111406 | A1 | 5/2007 | Joshi et al. |
| 2007/0132049 | A1 | 6/2007 | Stipe |
| 2007/0132369 | A1 | 6/2007 | Forrest et al. |
| 2007/0135013 | A1 | 6/2007 | Faris |
| 2007/0158659 | A1 | 7/2007 | Bensce |
| 2007/0158831 | A1 | 7/2007 | Cha et al. |
| 2007/0187775 | A1 | 8/2007 | Okhonin et al. |
| 2007/0190746 | A1 | 8/2007 | Ito et al. |
| 2007/0194453 | A1 | 8/2007 | Chakraborty et al. |
| 2007/0210336 | A1 | 9/2007 | Madurawe |
| 2007/0215903 | A1 | 9/2007 | Sakamoto et al. |
| 2007/0218622 | A1 | 9/2007 | Lee et al. |
| 2007/0228383 | A1 | 10/2007 | Bernstein et al. |
| 2007/0252203 | A1 | 11/2007 | Zhu et al. |
| 2007/0262457 | A1 | 11/2007 | Lin |
| 2007/0275520 | A1 | 11/2007 | Suzuki |
| 2007/0281439 | A1 | 12/2007 | Bedell et al. |
| 2007/0283298 | A1 | 12/2007 | Bernstein et al. |
| 2007/0287224 | A1 | 12/2007 | Alam et al. |
| 2008/0032463 | A1 | 2/2008 | Lee |
| 2008/0038902 | A1 | 2/2008 | Lee |
| 2008/0048327 | A1 | 2/2008 | Lee |
| 2008/0054359 | A1 | 3/2008 | Yang et al. |
| 2008/0067573 | A1 | 3/2008 | Jang et al. |
| 2008/0070340 | A1 | 3/2008 | Borrelli et al. |
| 2008/0099780 | A1 | 5/2008 | Tran |
| 2008/0108171 | A1 | 5/2008 | Rogers et al. |
| 2008/0124845 | A1 | 5/2008 | Yu et al. |
| 2008/0128745 | A1 | 6/2008 | Mastro et al. |
| 2008/0136455 | A1 | 6/2008 | Diamant et al. |
| 2008/0142959 | A1 | 6/2008 | DeMulder et al. |
| 2008/0150579 | A1 | 6/2008 | Madurawe |
| 2008/0160431 | A1 | 7/2008 | Scott et al. |
| 2008/0160726 | A1 | 7/2008 | Lim et al. |
| 2008/0179678 | A1 | 7/2008 | Dyer et al. |
| 2008/0191247 | A1 | 8/2008 | Yin et al. |
| 2008/0191312 | A1 | 8/2008 | Oh et al. |
| 2008/0194068 | A1 | 8/2008 | Temmler et al. |
| 2008/0203452 | A1 | 8/2008 | Moon et al. |
| 2008/0213982 | A1 | 9/2008 | Park et al. |
| 2008/0220558 | A1 | 9/2008 | Zehavi et al. |
| 2008/0220565 | A1 | 9/2008 | Hsu et al. |
| 2008/0224260 | A1 | 9/2008 | Schmit et al. |
| 2008/0237591 | A1 | 10/2008 | Leedy |
| 2008/0248618 | A1 | 10/2008 | Ahn et al. |
| 2008/0251862 | A1 | 10/2008 | Fonash et al. |
| 2008/0254561 | A2 | 10/2008 | Yoo |
| 2008/0254572 | A1 | 10/2008 | Leedy |
| 2008/0261378 | A1 | 10/2008 | Yao et al. |
| 2008/0272492 | A1 | 11/2008 | Tsang |
| 2008/0277778 | A1 | 11/2008 | Furman et al. |
| 2008/0283875 | A1 | 11/2008 | Mukasa et al. |
| 2008/0284611 | A1 | 11/2008 | Leedy |
| 2008/0296681 | A1 | 12/2008 | Georgakos et al. |
| 2008/0315351 | A1 | 12/2008 | Kakehata |
| 2009/0001469 | A1 | 1/2009 | Yoshida et al. |
| 2009/0001504 | A1 | 1/2009 | Takei et al. |
| 2009/0016716 | A1 | 1/2009 | Ishida |
| 2009/0032899 | A1 | 2/2009 | Irie |
| 2009/0032951 | A1 | 2/2009 | Andry et al. |
| 2009/0039918 | A1 | 2/2009 | Madurawe |
| 2009/0052827 | A1 | 2/2009 | Durfee et al. |
| 2009/0055789 | A1 | 2/2009 | McIlrath |
| 2009/0057879 | A1 | 3/2009 | Garrou et al. |
| 2009/0061572 | A1 | 3/2009 | Hareland et al. |
| 2009/0064058 | A1 | 3/2009 | McIlrath |
| 2009/0066365 | A1 | 3/2009 | Solomon |
| 2009/0066366 | A1 | 3/2009 | Solomon |
| 2009/0070721 | A1 | 3/2009 | Solomon |
| 2009/0070727 | A1 | 3/2009 | Solomon |
| 2009/0079000 | A1 | 3/2009 | Yamasaki et al. |
| 2009/0081848 | A1 | 3/2009 | Erokhin |
| 2009/0087759 | A1 | 4/2009 | Matsumoto et al. |
| 2009/0096009 | A1 | 4/2009 | Dong et al. |
| 2009/0096024 | A1 | 4/2009 | Shingu et al. |
| 2009/0115042 | A1 | 5/2009 | Koyanagi |
| 2009/0128189 | A1 | 5/2009 | Madurawe et al. |
| 2009/0134397 | A1 | 5/2009 | Yokoi et al. |
| 2009/0144669 | A1 | 6/2009 | Bose et al. |
| 2009/0144678 | A1 | 6/2009 | Bose et al. |
| 2009/0146172 | A1 | 6/2009 | Pumyea |
| 2009/0159870 | A1 | 6/2009 | Lin et al. |
| 2009/0160482 | A1 | 6/2009 | Karp et al. |
| 2009/0161401 | A1 | 6/2009 | Bilger et al. |
| 2009/0179268 | A1 | 7/2009 | Abou-Khalil et al. |
| 2009/0194152 | A1 | 8/2009 | Liu et al. |
| 2009/0194768 | A1 | 8/2009 | Leedy |
| 2009/0194836 | A1 | 8/2009 | Kim |
| 2009/0204933 | A1 | 8/2009 | Rezgui |
| 2009/0212317 | A1 | 8/2009 | Kolodin et al. |
| 2009/0218627 | A1 | 9/2009 | Zhu |
| 2009/0221110 | A1 | 9/2009 | Lee et al. |
| 2009/0224364 | A1 | 9/2009 | Oh et al. |
| 2009/0234331 | A1 | 9/2009 | Langereis et al. |
| 2009/0236749 | A1 | 9/2009 | Otemba et al. |
| 2009/0242893 | A1 | 10/2009 | Tomiyasu |
| 2009/0242935 | A1 | 10/2009 | Fitzgerald |
| 2009/0250686 | A1 | 10/2009 | Sato et al. |
| 2009/0262583 | A1 | 10/2009 | Lue |
| 2009/0263942 | A1 | 10/2009 | Ohnuma et al. |
| 2009/0267233 | A1 | 10/2009 | Lee |
| 2009/0272989 | A1 | 11/2009 | Shum et al. |
| 2009/0290434 | A1 | 11/2009 | Kurjanowicz |
| 2009/0294822 | A1 | 12/2009 | Batude et al. |
| 2009/0294861 | A1 | 12/2009 | Thomas et al. |
| 2009/0302387 | A1 | 12/2009 | Joshi et al. |
| 2009/0302394 | A1 | 12/2009 | Fujita |
| 2009/0309152 | A1 | 12/2009 | Knoefler et al. |
| 2009/0317950 | A1 | 12/2009 | Okihara |
| 2009/0321830 | A1 | 12/2009 | Maly |
| 2009/0321853 | A1 | 12/2009 | Cheng |
| 2009/0321948 | A1 | 12/2009 | Wang et al. |
| 2009/0325343 | A1 | 12/2009 | Lee |
| 2010/0001282 | A1 | 1/2010 | Mieno |
| 2010/0025766 | A1 | 2/2010 | Nuttinck et al. |
| 2010/0031217 | A1 | 2/2010 | Sinha et al. |
| 2010/0038743 | A1 | 2/2010 | Lee |
| 2010/0052134 | A1 | 3/2010 | Werner et al. |

(56) References Cited

U.S. PATENT DOCUMENTS

| | | | |
|---|---|---|---|
| 2010/0058580 | A1 | 3/2010 | Yazdani |
| 2010/0059796 | A1 | 3/2010 | Scheuerlein |
| 2010/0081232 | A1 | 4/2010 | Furman et al. |
| 2010/0112753 | A1 | 5/2010 | Lee |
| 2010/0112810 | A1 | 5/2010 | Lee et al. |
| 2010/0123202 | A1 | 5/2010 | Hofmann |
| 2010/0133695 | A1 | 6/2010 | Lee |
| 2010/0133704 | A1 | 6/2010 | Marimuthu et al. |
| 2010/0137143 | A1 | 6/2010 | Rothberg et al. |
| 2010/0139836 | A1 | 6/2010 | Horikoshi |
| 2010/0140790 | A1 | 6/2010 | Setiadi et al. |
| 2010/0157117 | A1 | 6/2010 | Wang |
| 2010/0190334 | A1 | 7/2010 | Lee |
| 2010/0193884 | A1 | 8/2010 | Park et al. |
| 2010/0193964 | A1 | 8/2010 | Farooq et al. |
| 2010/0224915 | A1 | 9/2010 | Kawashima et al. |
| 2010/0225002 | A1 | 9/2010 | Law et al. |
| 2010/0276662 | A1 | 11/2010 | Colinge |
| 2010/0307572 | A1 | 12/2010 | Bedell et al. |
| 2010/0308211 | A1 | 12/2010 | Cho et al. |
| 2010/0308863 | A1 | 12/2010 | Gliese et al. |
| 2011/0001172 | A1 | 1/2011 | Lee |
| 2011/0003438 | A1 | 1/2011 | Lee |
| 2011/0024724 | A1 | 2/2011 | Frolov et al. |
| 2011/0026263 | A1 | 2/2011 | Xu |
| 2011/0037052 | A1 | 2/2011 | Schmidt et al. |
| 2011/0042696 | A1 | 2/2011 | Smith et al. |
| 2011/0049336 | A1 | 3/2011 | Matsunuma |
| 2011/0050125 | A1 | 3/2011 | Medendorp et al. |
| 2011/0053332 | A1 | 3/2011 | Lee |
| 2011/0101537 | A1 | 5/2011 | Barth et al. |
| 2011/0102014 | A1 | 5/2011 | Madurawe |
| 2011/0143506 | A1 | 6/2011 | Lee |
| 2011/0147791 | A1 | 6/2011 | Norman et al. |
| 2011/0147849 | A1 | 6/2011 | Augendre et al. |
| 2011/0221022 | A1 | 9/2011 | Toda |
| 2011/0227158 | A1 | 9/2011 | Zhu |
| 2011/0241082 | A1 | 10/2011 | Bernstein et al. |
| 2011/0284992 | A1 | 11/2011 | Zhu |
| 2011/0286283 | A1 | 11/2011 | Lung et al. |
| 2011/0304765 | A1 | 12/2011 | Yogo et al. |
| 2012/0001184 | A1 | 1/2012 | Ha et al. |
| 2012/0003815 | A1 | 1/2012 | Lee |
| 2012/0013013 | A1 | 1/2012 | Sadaka et al. |
| 2012/0025388 | A1 | 2/2012 | Law et al. |
| 2012/0063090 | A1 | 3/2012 | Hsiao et al. |
| 2012/0074466 | A1 | 3/2012 | Setiadi et al. |
| 2012/0178211 | A1 | 7/2012 | Hebert |
| 2012/0181654 | A1 | 7/2012 | Lue |
| 2012/0182801 | A1 | 7/2012 | Lue |
| 2012/0241919 | A1 | 9/2012 | Mitani |
| 2012/0319728 | A1 | 12/2012 | Madurawe |
| 2013/0026663 | A1 | 1/2013 | Radu et al. |
| 2013/0193550 | A1 | 8/2013 | Sklenard et al. |
| 2013/0196500 | A1 | 8/2013 | Batude et al. |
| 2013/0203248 | A1 | 8/2013 | Ernst et al. |

OTHER PUBLICATIONS

Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, Jun. 10-12, 2003.

Kim, J.Y., et al., "The excellent scalability of the RCAT (recess-channel-array-transistor) technology for sub-70nm DRAM feature size and beyond," 2005 IEEE VLSI-TSA International Symposium, pp. 33-34, Apr. 25-27, 2005.

Abramovici, Breuer and Friedman, Digital Systems Testing and Testable Design, Computer Science Press, 1990, pp. 432-447.

Topol, A.W., et al., "Enabling SOI-Based Assembly Technology for Three-Dimensional (3D) Integrated Circuits (ICs)," IEDM Tech. Digest, Dec. 5, 2005, pp. 363-366.

Demeester, P., et al., "Epitaxial lift-off and its applications," Semicond. Sci. Technol., 1993, pp. 1124-1135, vol. 8.

Yoon, J., et al., "GaAs Photovoltaics and optoelectronics using releasable multilayer epitaxial assemblies", Nature, vol. 465, May 20, 2010, pp. 329-334.

Yonehara, T., et al., "ELTRAN: SOI-Epi Wafer by Epitaxial Layer transfer from porous Silicon", the 198th Electrochemical Society Meeting, abstract No. 438 (2000).

Yonehara, T., et al., "Eltran®, Novel SOI Wafer Technology," JSAP International, Jul. 2001, pp. 10-16, No. 4.

Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.

Bangsaruntip, S., et al., "High performance and highly uniform gate-all-around silicon nanowire MOSFETs with wire size dependent scaling," Electron Devices Meeting (IEDM), 2009 IEEE International , pp. 297-300, Dec. 7-9, 2009.

Bakir and Meindl, "Integrated Interconnect Technologies for 3D Nanoelectronic Systems", Artech House, 2009, Chapter 13, pp. 389-419.

Tanaka, H., et al., "Bit Cost Scalable Technology with Punch and Plug Process for Ultra High Density Flash Memory," VLSI Technology, 2007 IEEE Symposium on , vol., No., pp. 14-15, Jun. 12-14, 2007.

Burr, G. W., et al., "Overview of candidate device technologies for storage-class memory," IBM Journal of Research and Development, vol. 52, No. 4.5, pp. 449-464, Jul. 2008.

Lue, H.-T., et al., "A Highly Scalable 8-Layer 3D Vertical-Gate (VG) TFT NAND Flash Using Junction-Free Buried Channel BE-SONOS Device," Symposium on VLSI Technology, 2010, pp. 131-132.

Bez, R., et al., "Introduction to Flash memory," Proceedings IEEE, 91(4), 489-502 (2003).

Kim, W., et al., "Multi-layered Vertical Gate NAND Flash overcoming stacking limit for terabit density storage", Symposium on VLSI Technology Digest of Technical Papers, 2009, pp. 188-189.

Auth, C., et al., "45nm High-k + Metal Gate Strain-Enhanced Transistors," Symposium on VLSI Technology Digest of Technical Papers, 2008, pp. 128-129.

Jan, C. H., et al., "A 32nm SoC Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.

Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IEEE International, Dec. 10-12, 2007, p. 247.

Ragnarsson, L., et al., "Ultralow-EOT (5 Å) Gate-First and Gate-Last High Performance CMOS Achieved by Gate-Electrode Optimization," IEDM Tech. Dig., pp. 663-666, 2009.

Sen, P. & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.

Iwai, H., et.al., "NiSi Salicide Technology for Scaled CMOS," Microelectronic Engineering, 60 (2002), pp. 157-169.

Froment, B., et al., "Nickel vs. Cobalt Silicide integration for sub-50nm CMOS", IMEC ESS Circuits, 2003. pp. 215-219.

James, D., "65 and 45-nm Devices—an Overview", Semicon West, Jul. 2008, paper No. ctr_024377.

Davis, J.A., et.al., "Interconnect Limits on Gigascale Integration(GSI) in the 21st Century", Proc. IEEE, vol. 89, No. 3, pp. 305-324, Mar. 2001.

DiCioccio, L., et. al., "Direct bonding for wafer level 3D integration", ICICDT 2010, pp. 110-113.

Shino, T., et al., "Floating Body RAM Technology and its Scalability to 32nm Node and Beyond," Electron Devices Meeting, 2006, IEDM '06, International , pp. 1-4, Dec. 11-13, 2006.

Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.

(56) References Cited

OTHER PUBLICATIONS

Okhonin, S., et al., "New Generation of Z-RAM", Electron Devices Meeting, 2007. IEDM 2007. IEEE International, pp. 925-928, Dec. 10-12, 2007.
Kim, W., et al., "Multi-Layered Vertical Gate NAND Flash Overcoming Stacking Limit for Terabit Density Storage," Symposium on VLSI Technology, 2009, pp. 188-189.
Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.
Hubert, A., et al., "A Stacked SONOS Technology, Up to 4 Levels and 6nm Crystalline Nanowires, with Gate-All-Around or Independent Gates (ΦFlash), Suitable for Full 3D Integration", International Electron Devices Meeting, 2009, pp. 637-640.
Celler, G.K., et al., "Frontiers of silicon-on-insulator," J. App. Phys., May 1, 2003, pp. 4955-4978, vol. 93, No. 9.
Henttinen, K. et al., "Mechanically Induced Si Layer Transfer in Hydrogen-Implanted Si Wafers," Applied Physics Letters, Apr. 24, 2000, p. 2370-2372, vol. 76, No. 17.
Lee, C.-W., et al., "Junctionless multigate field-effect transistor," Applied Physics Letters, vol. 94, pp. 053511-1 to 053511-2, 2009.
Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518, Dec. 13-15, 2004.
Kim, J.Y., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.
Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European , pp. 177-180, Sep. 12-16, 2005.
Chung, S.-W., et al., "Highly Scalable Saddle-Fin (S-Fin) Transistor for Sub-50nnn DRAM Technology," 2006 Symposium on VLSI Technology Digest of Technical Papers, pp. 32-33.
Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.
Henttinen, K. et al., "Cold ion-cutting of hydrogen implanted Si," J. Nucl. Instr. and Meth. in Phys. Res. B, 2002, pp. 761-766, vol. 190.
Brumfiel, G., "Solar cells sliced and diced", May 19, 2010, Nature News.
Dragoi, et al., "Plasma-activated wafer bonding: the new low-temperature tool for MEMS fabrication", Proc. SPIE, vol. 6589, 65890T (2007).
Rajendran, B., et al., "Electrical Integrity of MOS Devices in Laser Annealed 3D IC Structures", proceedings VLSI Multi Level Interconnect Conference 2004, pp. 73-74.
Rajendran, B., "Sequential 3D IC Fabrication: Challenges and Prospects", Proceedings of VLSI Multi Level Interconnect Conference 2006, pp. 57-64.
Jung, S.-M., et al., "The revolutionary and truly 3-dimensional 25F2 SRAM technology with the smallest S3 (stacked single-crystal Si) cell, 0.16um2, and SSTFT (stacked single-crystal thin film transistor) for ultra high density SRAM," VLSI Technology, 2004. Digest of Technical Papers, pp. 228-229, Jun. 15-17, 2004.
Vengurlekar, A., et al., "Mechanism of Dopant Activation Enhancement in Shallow Junctions by Hydrogen", Proceedings of the Materials Research Society, vol. 864, Spring 2005, E9.28.1-6.
Hui, K. N., et al., "Design of vertically-stacked polychromatic light-emitting diodes," Optics Express, Jun. 8, 2009, pp. 9873-9878, vol. 17, No. 12.
Yamada, M., et al., "Phosphor Free High-Luminous-Efficiency White Light-Emitting Diodes Composed of InGaN Multi-Quantum Well," Japanese Journal of Applied Physics, 2002, pp. L246-L248, vol. 41.
Guo, X., et al., "Cascade single-chip phosphor-free white light emitting diodes," Applied Physics Letters, 2008, pp. 013507-1-013507-3, vol. 92.
Chuai, D. X., et al., "A Trichromatic Phosphor-Free White Light-Emitting Diode by Using Adhesive Bonding Scheme," Proc. SPIE, 2009, vol. 7635.
Suntharalingam, V., et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.
Coudrain, P., et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.
Takafuji, Y., et al., "Integration of Single Crystal Si TFTs and Circuits on a Large Glass Substrate," IEEE International Electron Devices Meeting (IEDM), Dec. 7-9, 2009, pp. 1-4.
Flamand, G., et al., "Towards Highly Efficient 4-Terminal Mechanical Photovoltaic Stacks," III-Vs Review, Sep.-Oct. 2006, pp. 24-27, vol. 19, Issue 7.
Zahler, J.M., et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.
Wierer, J.J., et al., "High-power AlGaInN flip-chip light-emitting diodes, " Applied Physics Letters, May 28, 2001, pp. 3379-3381, vol. 78, No. 22.
El-Gamal, A., "Trends in CMOS Image Sensor Technology and Design," International Electron Devices Meeting Digest of Technical Papers, Dec. 2002.
Ahn, S.W., "Fabrication of a 50 nm half-pitch wire grid polarizer using nanoimprint lithography," Nanotechnology, 2005, pp. 1874-1877, vol. 16, No. 9.
Johnson, R.C., "Switching LEDs on and off to enlighten wireless communications," EE Times, Jun. 2010, last accessed Oct 11, 2010, <http://www.embeddedinternetdesign.com/design/225402094>.
Ohsawa, et al.,"Autonomous Refresh of Floating Body Cell (FBC)", International Electron Device Meeting, 2008, pp. 801-804.
Sekar, D. C., et al., "A 3D-IC Technology with Integrated Microchannel Cooling", Proc. Intl. Interconnect Technology Conference, 2008, pp. 13-15.
Brunschweiler, T., et al., "Forced Convective Interlayer Cooling in Vertically Integrated Packages," Proc. Intersoc. Conference on Thermal Management (ITHERM), 2008, pp. 1114-1125.
Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, pp. 41.1-41.31.
Chen, P., et al., "Effects of Hydrogen Implantation Damage on the Performance of InP/InGaAs/InP p-i-n Photodiodes, Transferred on Silicon," Applied Physics Letters, vol. 94, No. 1, Jan. 2009, pp. 012101-1 to 012101-3.
Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.
Shi, X., et al., "Characterization of Low-Temperature Processed Single-Crystalline Silicon Thin-Film Transistor on Glass," IEEE Electron Device Letters, vol. 24, No. 9, Sep. 2003, pp. 574-576.
Chen, W., et al., "InP Layer Transfer with Masked Implantation," Electrochemical and Solid-State Letters, Issue 12, No. 4, Apr. 2009, H149-150.
Motoyoshi, M., "3D-IC Integration," 3rd Stanford and Tohoku University Joint Open Workshop, Dec. 4, 2009, pp. 1-52.
Wong, S., et al., "Monolithic 3D Integrated Circuits," VLSI Technology, Systems and Applications, 2007, International Symposium on VLSI-TSA 2007, pp. 1-4.
Feng, J., et al., "Integration of Germanium-on-Insulator and Silicon MOSFETs on a Silicon Substrate, " IEEE Electron Device Letters, vol. 27, No. 11, Nov. 2006, pp. 911-913.
Zhang, S., et al., "Stacked CMOS Technology on SOI Substrate," IEEE Electron Device Letters, vol. 25, No. 9, Sep. 2004, pp. 661-663.

(56) References Cited

OTHER PUBLICATIONS

Batude, P., et al., "Advances in 3D CMOS Sequential Integration," 2009 IEEE International Electron Devices Meeting (Baltimore, Maryland), Dec. 7-9, 2009, pp. 345-348.
Tan, C.S., et al., "Wafer Level 3-D ICs Process Technology," ISBN-10: 0387765328, Springer, 1st Ed., Sep. 19, 2008, pp. v-xii, 34, 58, and 59.
Yoon, S.W. et al., "Fabrication and Packaging of Microbump Interconnections for 3D TSV," IEEE International Conference on 3D System Integration (3DIC), Sep. 28-30, 2009, pp. 1-5.
Franzon, P.D., et al., "Design and CAD for 3D Integrated Circuits," 45th ACM/IEEE Design, Automation Conference (DAC), Jun. 8-13, 2008, pp. 668-673.
Brebner, G., "Tooling up for Reconfigurable System Design," IEE Colloquium on Reconfigurable Systems, 1999, Ref. No. 1999/061, pp. 2/1-2/4.
Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.
Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.
Dong, C., et al., "Reconfigurable Circuit Design with Nanomaterials," Design, Automation & Test in Europe Conference & Exhibition, Apr. 20-24, 2009, pp. 442-447.
Razavi, S.A., et al., "A Tileable Switch Module Architecture for Homogeneous 3D FPGAs," IEEE International Conference on 3D System Integration (3DIC), Sep. 28-30, 2009, 4 pages.
Bakir M., et al., "3D Device-Stacking Technology for Memory," pp. 407-410.
Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.
Valsamakis, E.A., "Generator for a Custom Statistical Bipolar Transistor Model," IEEE Journal of Solid-State Circuits, Apr. 1985, pp. 586-589, vol. SC-20, No. 2.
Srivastava, P., et al., "Silicon Substrate Removal of GaN DHFETs for enhanced (>1100V) Breakdown Voltage," Aug. 2010, IEEE Electron Device Letters, vol. 31, No. 8, pp. 851-852.
Weis, M., et al., "Stacked 3-Dimensional 6T SRAM Cell with Independent Double Gate Transistors," IC Design and Technology, May 18-20, 2009.
Doucette, P., "Integrating Photonics: Hitachi, Oki Put LEDs on Silicon," Solid State Technology, Jan. 2007, p. 22, vol. 50, No. 1.
Gosele, U., et al., "Semiconductor Wafer Bonding," Annual Review of Materials Science, Aug. 1998, pp. 215-241, vol. 28.
Spangler, L.J., et al., "A Technology for High Performance Single-Crystal Silicon-on-Insulator Transistors," IEEE Electron Device Letters, Apr. 1987, pp. 137-139, vol. 8, No. 4.
Luo, Z.S., et al., "Enhancement of (In, Ga)N. Light-emitting Diode Performance by Laser Liftoff and Transfer from Sapphire to Silicon," Photonics Technology Letters, Oct. 2002, pp. 1400-1402, vol. 14, No. 10.
Zahler, J.M. et al., "Wafer Bonding and Layer Transfer Processes for High Efficiency Solar Cells," NCPV and Solar Program Review Meeting, 2003, pp. 723-726.
Larrieu, G., et al., "Low Temperature Implementation of Dopant-Segregated Band-edger Metallic S/D junctions in Thin-Body SOI p-MOSFETs", Proceedings IEDM, 2007, pp. 147-150.
Qui, Z., et al., "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008, pp. 396-403.
Khater, M.H., et al., "High-k/Metal-Gate Fully Depleted SOI CMOS With Single-Silicide Schottky Source/Drain With Sub-30-nm Gate Length", IEEE Electron Device Letters, vol. 31, No. 4, Apr. 2010, pp. 275-277.
Abramovici, M., "In-system silicon validation and debug", (2008) IEEE Design and Test of Computers, 25 (3), pp. 216-223.
Saxena, P., et al., "Repeater Scaling and Its Impact on CAD", IEEE Transactions on Computer-Aided Design of Integrated Circuits and Systems, vol. 23, No. 4, Apr. 2004.
Abrmovici, M., et al., A reconfigurable design-for-debug infrastructure for SoCs, (2006) Proceedings—Design Automation Conference, pp. 7-12.
Anis, E., et al., "Low cost debug architecture using lossy compression for silicon debug", (2007) Proceedings of the IEEE/ACM Design, pp. 225-230.
Anis, E., et al., "On using lossless compression of debug data in embedded logic analysis", (2007) Proceedings of the IEEE International Test Conference, paper 18.3, pp. 1-10.
Boule, M., et al., "Adding debug enhancements to assertion checkers for hardware emulation and silicon debug", (2006) Proceedings of the IEEE International Conference on Computer Design, pp. 294-299.
Boule, M., et al., "Assertion checkers in verification, silicon debug and in-field diagnosis", (2007) Proceedings—Eighth International Symposium on Quality Electronic Design, ISQED 2007, pp. 613-618.
Burtscher, M., et al., "The VPC trace-compression algorithms", (2005) IEEE Transactions on Computers, 54 (11), Nov. 2005, pp. 1329-1344.
Frieden, B., "Trace port on powerPC 405 cores", (2007) Electronic Product Design, 28 (6), pp. 12-14.
Hopkins, A.B.T., et al., "Debug support for complex systems on-chip: A review", (2006) IEEE Proceedings: Computers and Digital Techniques, 153 (4), Jul. 2006, pp. 197-207.
Hsu, Y.-C., et al., "Visibility enhancement for silicon debug", (2006) Proceedings—Design Automation Conference, Jul. 24-28, 2006, San Francisco, pp. 13-18.
Josephson, D., et al., "The crazy mixed up world of silicon debug", (2004) Proceedings of the Custom Integrated Circuits Conference, paper 30-1, pp. 665-670.
Josephson, D.D., "The manic depression of microprocessor debug", (2002) IEEE International Test Conference (TC), paper 23.4, pp. 657-663.
Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.
Ko, H.F., et al., "Distributed embedded logic analysis for post-silicon validation of SOCs", (2008) Proceedings of the IEEE International Test Conference, paper 16.3, pp. 755-763.
Ko, H.F., et al., "Functional scan chain design at RTL for skewed-load delay fault testing", (2004) Proceedings of the Asian Test Symposium, pp. 454-459.
Ko, H.F., et al., "Resource-efficient programmable trigger units for post-silicon validation", (2009) Proceedings of the 14th IEEE European Test Symposium, ETS 2009, pp. 17-22.
Liu, X., et al., "On reusing test access mechanisms for debug data transfer in SoC post-silicon validation", (2008) Proceedings of the Asian Test Symposium, pp. 303-308.
Liu, X., et al., "Trace signal selection for visibility enhancement in post-silicon validation", (2009) Proceedings DATE, pp. 1338-1343.
McLaughlin, R., et al., "Automated debug of speed path failures using functional tests", (2009) Proceedings of the IEEE VLSI Test Symposium, pp. 91-96.
Morris, K., "On-Chip Debugging—Built-in Logic Analyzers on your FPGA", (2004) Journal of FPGA and Structured ASIC, 2 (3).
Nicolici, N., et al., "Design-for-debug for post-silicon validation: Can high-level descriptions help?", (2009) Proceedings—IEEE International High-Level Design Validation and Test Workshop, HLDVT, pp. 172-175.
Park, S.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.

(56) References Cited

OTHER PUBLICATIONS

Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.
Moore, B., et al., "High Throughput Non-contact SiP Testing", (2007) Proceedings—International Test Conference, paper 12.3.
Riley, M.W., et al., "Cell broadband engine debugging for unknown events", (2007) IEEE Design and Test of Computers, 24 (5), pp. 486-493.
Vermeulen, B., "Functional debug techniques for embedded systems", (2008) IEEE Design and Test of Computers, 25 (3), pp. 208-215.
Vermeulen, B., et al., "Automatic Generation of Breakpoint Hardware for Silicon Debug", Proceeding of the 41st Design Automation Conference, Jun. 7-11, 2004, p. 514-517.
Vermeulen, B., et al., "Design for debug: Catching design errors in digital chips", (2002) IEEE Design and Test of Computers, 19 (3), pp. 37-45.
Vermeulen, B., et al., "Core-based scan architecture for silicon debug", (2002) IEEE International Test Conference (TC), pp. 638-647.
Vanrootselaar, G. J., et al., "Silicon debug: scan chains alone are not enough", (1999) IEEE International Test Conference (TC), pp. 892-902.
Kada, M., "Updated results of R&D on functionally innovative 3D-integrated circuit (dream chip) technology in FY2009", (2010) International Microsystems Packaging Assembly and Circuits Technology Conference, IMPACT 2010 and International 3D IC Conference, Proceedings.
Kada, M., "Development of functionally innovative 3D-integrated circuit (dream chip) technology / high-density 3D-integration technology for multifunctional devices", (2009) IEEE International Conference on 3D System Integration, 3DIC 2009.
Kim, G.-S., et al., "A 25-mV-sensitivity 2-Gb/s optimum-logic-threshold capacitive-coupling receiver for wireless wafer probing systems", (2009) IEEE Transactions on Circuits and Systems II: Express Briefs, 56 (9), pp. 709-713.
Marchal, P., et al., "3-D technology assessment: Path-finding the technology/design sweet-spot", (2009) Proceedings of the IEEE, 97 (1), pp. 96-107.
Xie, Y., et al., "Design space exploration for 3D architectures", (2006) ACM Journal on Emerging Technologies in Computing Systems, 2 (2), Apr. 2006, pp. 65-103.
Sellathamby, C.V., et al., "Non-contact wafer probe using wireless probe cards", (2005) Proceedings—International Test Conference, 2005, pp. 447-452.
Souri, S., et al., "Multiple Si layers ICs: motivation, performance analysis, and design Implications", (2000) Proceedings—Design Automation Conference, pp. 213-220.
Vinet, M., et.al., "3D monolithic integration: Technological challenges and electrical results", Microelectronic Engineering Apr. 2011 vol. 88, Issue 4, pp. 331-335.
Bobba, S., et al., "*Celoncel: Effective Design Technique for 3-D Monolithic Integration targeting High Performance Integrated Circuits", Asia pacific DAC* 2011, paper 4A-4.
Choudhury, D., "3D Integration Technologies for Emerging Microsystems", IEEE Proceedings of the IMS 2010, pp. 1-4.
Lee, Y.-J., et. al, "3D 65nm CMOS with 320° C. Microwave Dopant Activation", IEDM 2010, pp. 1-4.
Crnogorac, F., et al., "Semiconductor crystal islands for three-dimensional integration", J. Vac. Sci. Technol. B 28(6), Nov/Dec 2010, pp. C6P53-C6P58.
Park, J.-H., et al., "N-Channel Germanium MOSFET Fabricated Below 360° C. by Cobalt-Induced Dopant Activation for Monolithic Three-Dimensional-ICs", IEEE Electron Device Letters, vol. 32, No. 3, Mar. 2011, pp. 234-236.
Jung, S.-M., et al., "Soft Error Immune 0.46pm2 SRAM Cell with MIM Node Capacitor by 65nm CMOS Technology for Ultra High Speed SRAM", IEDM 2003, pp. 289-292.
Brillouet, M., "Emerging Technologies on Silicon", IEDM 2004, pp. 17-24.
Jung, S.-M., et al., "Highly Area Efficient and Cost Effective Double Stacked S3(Stacked Single-crystal Si ) Peripheral CMOS SSTFT and SRAM Cell Technology for 512M bit density SRAM", IEDM 2003, pp. 265-268.
Joyner, J.W., "Opportunities and Limitations of Three-dimensional Integration for Interconnect Design", PhD Thesis, Georgia Institute of Technology, Jul. 2003.
Choi, S.-J., "A Novel TFT with a Laterally Engineered Bandgap for of 3D Logic and Flash Memory", 2010 Symposium of VLSI Technology Digest, pp. 111-112.
Meindl, J. D., "Beyond Moore's Law: The Interconnect Era", IEEE Computing in Science & Engineering, Jan./Feb. 2003, pp. 20-24.
Radu, I., et al., "Recent Developments of Cu—Cu non-thermo compression bonding for wafer-to-wafer 3D stacking", IEEE 3D Systems Integration Conference (3DIC), Nov. 16-18, 2010.
Gaudin, G., et al., "Low temperature direct wafer to wafer bonding for 3D integration", 3D Systems Integration Conference (3DIC), IEEE, 2010, Munich, Nov. 16-18, 2010, pp. 1-4.
Jung, S.-M., et al., "Three Dimensionally Stacked NAND Flash Memory Technology Using Stacking Single Crystal Si Layers on ILD and TANOS Structure for Beyond 30nnn Node", IEDM 2006, Dec. 11-13, 2006.
Souri, S. J., "Interconnect Performance in 3-Dimensional Integrated Circuits", PhD Thesis, Stanford, Jul. 2003.
Uemoto, Y., et al., "A High-Performance Stacked-CMOS SRAM Cell by Solid Phase Growth Technique", Symposium on VLSI Technology, 2010, pp. 21-22.
Jung, S.-M., et al., "Highly Cost Effective and High Performance 65nm S3( Stacked Single-crystal Si) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221.
Steen, S.E., et al., "Overlay as the key to drive wafer scale 3D integration", Microelectronic Engineering 84 (2007) 1412-1415.
Maeda, N., et al., "Development of Sub 10-μm Ultra-Thinning Technology using Device Wafers for 3D Manufacturing of Terabit Memory", 2010 Symposium on VLSI Technology Digest of Technical Papers, pp. 105-106.
Lin, X., et al., "Local Clustering 3-D Stacked CMOS Technology for Interconnect Loading Reduction", IEEE Transactions on electron Devices, vol. 53, No. 6, Jun. 2006, pp. 1405-1410.
Chan, M., et al., "3-Dimensional Integration for Interconnect Reduction in for Nano-CMOS Technologies", IEEE Tencon, Nov. 23, 2006, Hong Kong.
Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.
Naito, T., et al., "World's first monolithic 3D-FPGA with TFT SRAM over 90nm 9 layer Cu CMOS", 2010 Symposium on VLSI Technology Digest of Technical Papers, pp. 219-220.
Bernard, E., et al., "Novel integration process and performances analysis of Low STandby Power (LSTP) 3D Multi-Channel CMOSFET (MCFET) on SOI with Metal / High-K Gate stack", 2008 Symposium on VLSI Technology Digest of Technical Papers, pp. 16-17.
Cong, J., et al., "Quantitative Studies of Impact of 3D IC Design on Repeater Usage", Proceedings of International VLSI/ULSI Multilevel Interconnection Conference, pp. 344-348, 2008.
Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.
Crnogorac, F., et al., "Nano-graphoepitaxy of semiconductors for 3D integration", Microelectronic Engineering 84 (2007) 891-894.
Koyanagi, M, "Different Approaches to 3D Chips", 3D IC Review, Stanford University, May 2005.
Koyanagi, M, "Three-Dimensional Integration Technology and Integrated Systems", ASPDAC 2009 presentation.
Koyanagi, M., et al., "Three-Dimensional Integration Technology and Integrated Systems", ASPDAC 2009, paper 4D-1, pp. 409-415.

(56) References Cited

OTHER PUBLICATIONS

Hayashi, Y., et al., "A New Three Dimensional IC Fabrication Technology Stacking Thin Film Dual-CMOS Layers", IEDM 1991, paper 25.6.1, pp. 657-660.
Clavelier, L., et al., "Engineered Substrates for Future More Moore and More Than Moore Integrated Devices", IEDM 2010, paper 2.6.1, pp. 42-45.
Kim, K., "From the Future Si Technology Perspective: Challenges and Opportunities", IEDM 2010, pp. 1.1.1-1.1.9.
Ababei, C., et al., "Exploring Potential Benefits of 3D FPGA Integration", in book by Becker, J.et al. Eds., "Field Programmable Logic 2004", LNCS 3203, pp. 874-880, 2004, Springer-Verlag Berlin Heidelberg.
Ramaswami, S., "3D TSV IC Processing", 3DIC Technology Forum Semicon Taiwan 2010, Sep. 9, 2010.
Davis, W.R., et al., "Demystifying 3D Ics: Pros and Cons of Going Vertical", IEEE Design and Test of Computers, Nov.-Dec. 2005, pp. 498-510.
Lin, M., et al., "Performance Benefits of Monolithically Stacked 3DFPGA", FPGA06, Feb. 22-24, 2006, Monterey, California, pp. 113-122.
Dong, C., et al., "Performance and Power Evaluation of a 3D CMOS/Nanomaterial Reconfigurable Architecture", ICCAD 2007, pp. 758-764.
Gojman, B., et al., "3D Nanowire-Based Programmable Logic", International Conference on Nano-Networks (Nanonets 2006), Sep. 14-16, 2006.
He, T., et al., "Controllable Molecular Modulation of Conductivity in Silicon-Based Devices", J. Am. Chem. Soc. 2009, 131, 10023-10030.
Henley, F., "Engineered Substrates Using the Nanocleave Process", SemiconWest, TechXPOT Conference—Challenges in Device Scaling, Jul. 19, 2006, San Francisco.
Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.
Diamant, G., et al., "Integrated Circuits based on Nanoscale Vacuum Phototubes", Applied Physics Letters 92, 262903-1 to 262903-3 (2008).
Landesberger, C., et al., "Carrier techniques for thin wafer processing", CS MANTECH Conference, May 14-17, 2007 Austin, Texas, pp. 33-36.
Golshani, N., et al., "Monolithic 3D Integration of SRAM and Image Sensor Using Two Layers of Single Grain Silicon", 2010 IEEE International 3D Systems Integration Conference (3DIC), Nov. 16-18, 2010, pp. 1-4.
Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.
Rajendran, B., et al., "Thermal Simulation of laser Annealing for 3D Integration", Proceedings VMIC 2003.
Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.
Borland, J.O., "Low Temperature Activation of Ion Implanted Dopants: A Review", International Workshop on Junction technology 2002, S7-3, Japan Society of Applied Physics, pp. 85-88.
Vengurlekar, A., et al., "Hydrogen Plasma Enhancement of Boron Activation in Shallow Junctions", Applied Physics Letters, vol. 85, No. 18, Nov. 1, 2004, pp. 4052-4054.
El-Maleh, A. H., et al., "Transistor-Level Defect Tolerant Digital System Design at the Nanoscale", Research Proposal Submitted to Internal Track Research Grant Programs, 2007. Internal Track Research Grant Programs.
Austin, T., et al., "Reliable Systems on Unreliable Fabrics", IEEE Design & Test of Computers, Jul./Aug. 2008, vol. 25, issue 4, pp. 322-332.
Borkar, S., "Designing Reliable Systems from Unreliable Components: The Challenges of Transistor Variability and Degradation", IEEE Micro, IEEE Computer Society, Nov.-Dec. 2005, pp. 10-16.
Zhu, S., et al., "N-Type Schottky Barrier Source/Drain MOSFET Using Ytterbium Silicide", IEEE Electron Device Letters, vol. 25, No. 8, Aug. 2004, pp. 565-567.
Zhang, Z., et al., "Sharp Reduction of Contact Resistivities by Effective Schottky Barrier Lowering With Silicides as Diffusion Sources," IEEE Electron Device Letters, vol. 31, No. 7, Jul. 2010, pp. 731-733.
Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.
Awano, M., et al., "Advanced DSS MOSFET Technology for Ultrahigh Performance Applications", 2008 Symposium on VLSI Technology Digest of Technical Papers, pp. 24-25.
Choi, S.-J., et al., "Performance Breakthrough in NOR Flash Memory with Dopant-Segregated Schottky-Barrier (DSSB) SONOS Devices", 2009 Symposium of VLSI Technology Digest, pp. 222-223.
Zhang, M., et al., "Schottky barrier height modulation using dopant segregation in Schottky-barrier SOI-MOSFETs", Proceeding of ESSDERC, Grenoble, France, 2005, pp. 457-460.
Larrieu, G., et al., "Arsenic-Segregated Rare-Earth Silicide Junctions: Reduction of Schottky Barrier and Integration in Metallic n-MOSFETs on SOI", IEEE Electron Device Letters, vol. 30, No. 12, Dec. 2009, pp. 1266-1268.
Ko, C.H., et al., "NiSi Schottky Barrier Process-Strained Si (SB-PSS) CMOS Technology for High Performance Applications", 2006 Symposium on VLSI Technology Digest of Technical Papers.
Kinoshita, A., et al., "Solution for High-Performance Schottky-Source/Drain MOSFETs: Schottky Barrier Height Engineering with Dopant Segregation Technique", 2004 Symposium on VLSI Technology Digest of Technical Papers, pp. 168-169.
Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.
Kaneko, A., et al., "High-Performance FinFET with Dopant-Segregated Schottky Source/Drain", IEDM 2006.
Kinoshita, A., et al., "Ultra Low Voltage Operations in Bulk CMOS Logic Circuits with Dopant Segregated Schottky Source/Drain Transistors", IEDM 2006.
Kinoshita, A., et al., "Comprehensive Study on Injection Velocity Enhancement in Dopant-Segregated Schottky MOSFETs", IEDM 2006.
Choi, S.-J., et al., "High Speed Flash Memory and 1T-DRAM on Dopant Segregated Schottky Barrier (DSSB) FinFET SONOS Device for Multi-functional SoC Applications", 2008 IEDM, pp. 223-226.
Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.
Agoura Technologies white paper, "Wire Grid Polarizers: a New High Contrast Polarizer Technology for Liquid Crystal Displays", 2008, pp. 1-12.
Unipixel Displays, Inc. white paper, "Time Multi-plexed Optical Shutter (TMOS) Displays", Jun. 2007, pp. 1-49.
Woo, H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.
Azevedo, I. L., et al., "The Transition to Solid-State Lighting", Proc. IEEE, vol. 97, No. 3, Mar. 2009, pp. 481-510.
Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.
Tong, Q.-Y., et al., "A "smarter-cut" approach to low temperature silicon layer transfer", Applied Physics Letters, vol. 72, No. 1, Jan. 5, 1998, pp. 49-51.

(56) References Cited

OTHER PUBLICATIONS

Sadaka, M., et al., "Building Blocks for wafer level 3D integration", www.electroiq.com , Aug. 18, 2010, last accessed Aug. 18, 2010.
Tong, Q.-Y., et al., "Low Temperature Si Layer Splitting", Proceedings 1997 IEEE International SOI Conference, Oct. 1997, pp. 126-127.
Nguyen, P., et al., "Systematic study of the splitting kinetic of H/He co-implanted substrate", SOI Conference, 2003, pp. 132-134.
Ma, X., et al., "A high-quality SOI structure fabricated by low-temperature technology with B+/H+ co-implantation and plasma bonding", Semiconductor Science and Technology, vol., 21, 2006, pp. 959-963.
Yu, C.Y., et al., "Low-temperature fabrication and characterization of Ge-on-insulator structures", Applied Physics Letters, vol. 89, 101913-1 to 101913-2 (2006).
Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.
Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.
Aspar, B., et al., "Transfer of structured and patterned thin silicon films using the Smart-Cut process", Electronics Letters, Oct. 10, 1996, vol. 32, No. 21, pp. 1985-1986.
Madan, N., et al., "Leveraging 3D Technology for Improved Reliability," Proceedings of the 40th Annual IEEE/ACM International Symposium on Microarchitecture (Micro 2007), IEEE Computer Society.
Hayashi, Y., et al., "Fabrication of Three Dimensional IC Using "Cumulatively Bonded IC" (CUBIC) Technology", 1990 Symposium on VLSI Technology, pp. 95-96.
Akasaka, Y., "Three Dimensional IC Trends," Proceedings of the IEEE, vol. 24, No. 12, Dec. 1986.
Guarini, K. W., et al., "Electrical Integrity of State-of-the-Art 0.13um SOI Device and Circuits Transferred for Three-Dimensional (3D) Integrated Circuit (Ic) Fabrication," IEDM 2002, paper 16.6, pp. 943-945.
Kunio, T., et al., "Three Dimensional ICs, Having Four Stacked Active Device Layers," IEDM 1989, paper 34.6, pp. 837-840.
Agarwal, A., et al., "Efficient production of silicon-on-insulator films by co-implantation of He+ with H+" Applied Physics Letters, vol. 72, No. 9, Mar. 1998, pp. 1086-1088.
Cook III, G. O., et al., "Overview of transient liquid phase and partial transient liquid phase bonding," Journal of Material Science, vol. 46, 2011, pp. 5305-5323.
Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.
Gaillardon, P-E., et al., "Can We Go Towards True 3-D Architectures?," DAC 2011, paper 58, pp. 282-283.
Subbarao, M., et al., "Depth from Defocus: A Spatial Domain Approach," International Journal of Computer Vision, vol. 13, No. 3, pp. 271-294 (1994).
Subbarao, M., et al., "Focused Image Recovery from Two Defocused Images Recorded with Different Camera Settings," IEEE Transactions on Image Processing, vol. 4, No. 12, Dec. 1995, pp. 1613-1628.
Yun, J-G., et al., "Single-Crystalline Si Stacked Array (STAR) NAND Flash Memory," IEEE Transactions on Electron Devices, vol. 58, No. 4, Apr. 2011, pp. 1006-1014.
Kim, Y., et al., "Three-Dimensional NAND Flash Architecture Design Based on Single-Crystalline Stacked Array," IEEE Transactions on Electron Devices, vol. 59, No. 1, Jan. 2012, pp. 35-45.
Goplen, B., et al., "Thermal Via Placement in 3DICs," Proceedings of the International Symposium on Physical Design, Apr. 3-6, 2005, San Francisco.
Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).
Gawlik, G., et al., "GaAs on Si: towards a low-temperature "smart-cut" technology", Vacuum, vol. 70, pp. 103-107 (2003).
Weldon, M. K., et al., "Mechanism of Silicon Exfoliation Induced by Hydrogen/Helium Co-implantation," Applied Physics Letters, vol. 73, No. 25, pp. 3721-3723 (1998).
Bobba, S., et al., "Performance Analysis of 3-D Monolithic Integrated Circuits," 2010 IEEE International 3D Systems Integration Conference (3DIC), Nov. 2010, Munich, pp. 1-4.
Batude, P., et al., "Demonstration of low temperature 3D sequential FDSOI integration down to 50nm gate length," 2011 Symposium on VLSI Technology Digest of Technical Papers, pp. 158-159.
Batude, P., et al., "Advances, Challenges and Opportunities in 3D CMOS Sequential Integration," 2011 IEEE International Electron Devices Meeting, paper 7.3, Dec. 2011, pp. 151-154.
Miller, D.A.B., "Optical interconnects to electronic chips," Applied Optics, vol. 49, No. 25, Sep. 1, 2010, pp. F59-F70.
Yun, C. H., et al., "Transfer of patterned ion-cut silicon layers", Applied Physics Letters, vol. 73, No. 19, Nov. 1998, pp. 2772-2774.
En, W. G., et al., "The Genesis Process": A New SOI wafer fabrication method, Proceedings 1998 IEEE International SOI Conference, Oct. 1998, pp. 163-164.
Kuroda, T., "ThruChip Interface for Heterogeneous Chip Stacking," ElectroChemicalSociety Transactions, 50 (14) 63-68 (2012).
Miura, N., et al., "A Scalable 3D Heterogeneous Multi-Core Processor with Inductive-Coupling ThruChip Interface," IEEE Micro Cool Chips XVI, Yokohama, Apr. 17-19, 2013, pp. 1-3(2013).
Kuroda, T., "Wireless Proximity Communications for 3D System Integration," Future Directions in IC and Package Design Workshop, Oct. 29, 2007.
Ishihara, R., et al., "Monolithic 3D-ICs with single grain Si thin film transistors," Solid-State Electronics 71 (2012) pp. 80-87.
Lee, S. Y., et al., "Architecture of 3D Memory Cell Array on 3D IC," IEEE International Memory Workshop, May 20, 2012, Monterey, CA.
Lee, S. Y., et al., "3D IC Architecture for High Density Memories," IEEE International Memory Workshop, p. 1-6, May 2010.
Rajendran, B., et al., "CMOS transistor processing compatible with monolithic 3-D Integration," Proceedings VMIC 2005.
Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012.
Uchikoga, S., et al., "Low temperature poly-Si TFT-LCD by excimer laser anneal," Thin Solid Films, vol. 383 (2001), pp. 19-24.
He, M., et al., "Large Polycrystalline Silicon Grains Prepared by Excimer Laser Crystallization of Sputtered Amorphous Silicon Film with Process Temperature at 100 C," Japanese Journal of Applied Physics, vol. 46, No. 3B, 2007, pp. 1245-1249.
Derakhshandeh, J., et al., "A Study of the CMP Effect on the Quality of Thin Silicon Films Crystallized by Using the u-Czochralski Process," Journal of the Korean Physical Society, vol. 54, No. 1, 2009, pp. 432-436.
Kim, S.D., et al., "Advanced source/drain engineering for box-shaped ultra shallow junction formation using laser annealing and pre-amorphization implantation in sub-100-nm SOI CMOS," IEEE Trans. Electron Devices, vol. 49, No. 10, pp. 1748-1754, Oct. 2002.
Ahn, J., et al., "High-quality MOSFET's with ultrathin LPCVD gate SiO2," IEEE Electron Device Lett., vol. 13, No. 4, pp. 186-188, Apr. 1992.
Huet, K., et al., "Ultra Low Thermal Budget Anneals for 3D Memories: Access Device Formation," Ion Implantation Technology 2012, AIP Conf Proceedings 1496, 135-138 (2012).
Batude, P., et al., "3D Monolithic Integration," ISCAS 2011 pp. 2233-2236.
Batude, P., et al., "3D Sequential Integration: A Key Enabling Technology for Heterogeneous C-Integration of New Function With CMOS," IEEE Journal on Emerging and Selected Topics in Circuits and Systems (JETCAS), vol. 2, No. 4, Dec. 2012, pp. 714-722.

(56) References Cited

OTHER PUBLICATIONS

Vinet, M., et.al., "Germanium on Insulator and new 3D architectures opportunities for integration", International Journal of Nanotechnology, vol. 7, No. 4, pp. 304-319.
Kawaguchi, N., et al., "Pulsed Green-Laser Annealing for Single-Crystalline Silicon Film Transferred onto Silicon wafer and Non-alkaline Glass by Hydrogen-Induced Exfoliation," Japanese Journal of Appl,ied Physics, vol. 46, No. 1, 2007, pp. 21-23.
Faynot, O. et al., "Planar Fully depleted SOI technology: A Powerful architecture for the 20nnn node and beyond," Electron Devices Meeting (IEDM), 2010 IEEE International, vol. No. pp. 3.2.1, 3.2.4, Dec. 6-8, 2010.
Khakifirooz, A., "ETSOI Technology for 20nnn and Beyond", SOI Consortium Workshop: Fully Depleted SOI, Apr. 28, 2011, Hsinchu Taiwan.
Bernstein, K., et al., "Interconnects in the Third Dimension: Design Challenges for 3DICs," Design Automation Conference, 2007, DAC'07, 44th ACM/IEEE, vol. No. pp. 562-567, Jun. 4-8, 2007.
Qiang, J-Q, "3-D Hyperintegration and Packaging Technologies for Micro-Nano Systems," Proceedings of the IEEE, 97.1 (2009) pp. 18-30.
Kim, J., et al., "A Stacked Memory Device on Logic 3D Technology for Ultra-high-density Data Storage," Nanotechnology, vol. 22, 254006 (2011).
Yang, M., et al., "High Performance CMOS Fabricated on Hybrid Substrate with Different Crystal Orientation," Proceedings IEDM 2003.
Lee, K. W., et al., "Three-dimensional shared memory fabricated using wafer stacking technology," IEDM Tech. Dig., 2000, pp. 165-168.
Yin, H., et al., "Scalable 3-D finlike poly-Si TFT and its nonvolatile memory application," IEEE Trans. Electron Devices, vol. 55, No. 2, pp. 578-584, Feb. 2008.
Chen, H. Y., et al., "HfOx Based Vertical Resistive Random Access Memory for Cost Effective 3D Cross-Point Architecture without Cell Selector," Proceedings IEDM 2012, pp. 497-499.

* cited by examiner

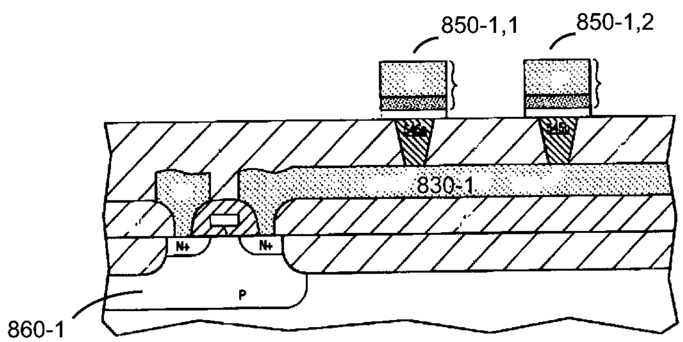
Fig 2 - prior art

N
S
3402
3404
3406
3408
3410
3412
3414
N+
P+
P-
N-
P- Si substrate

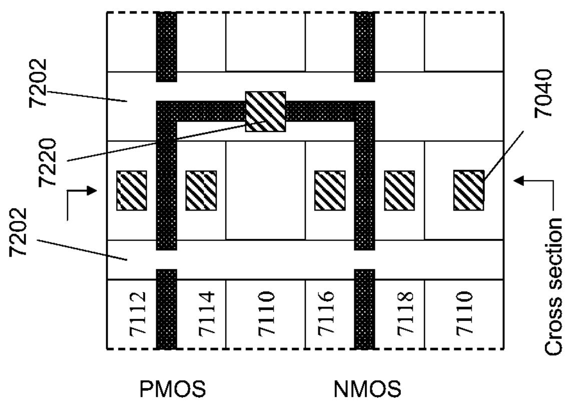
Fig 72F
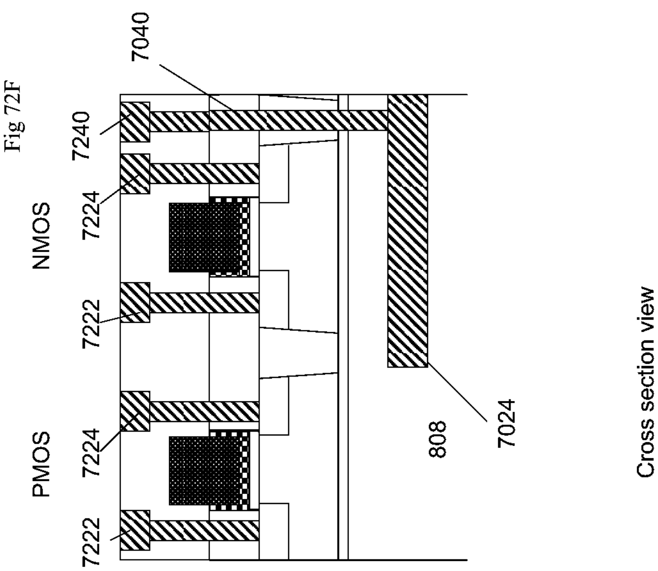

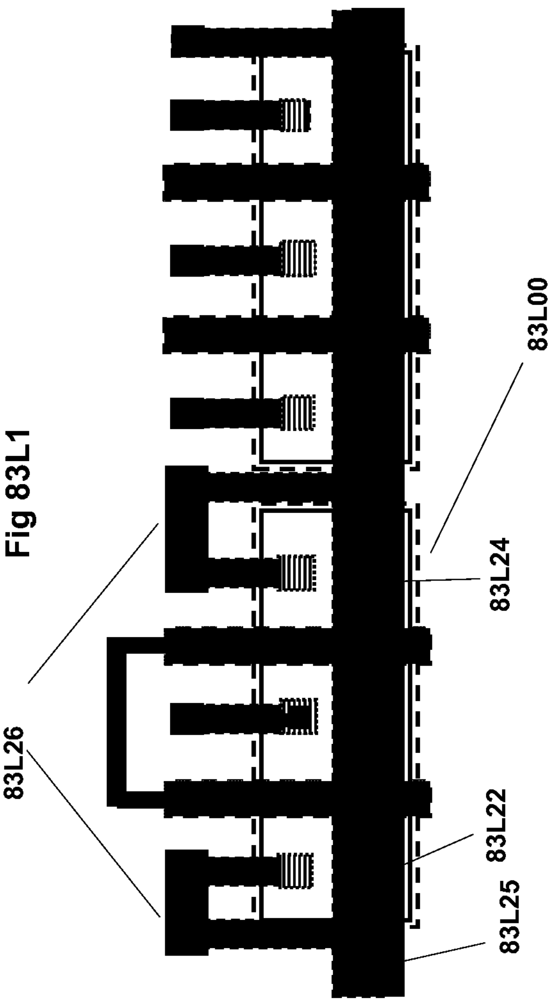
Fig 83L1

Fig 83L2
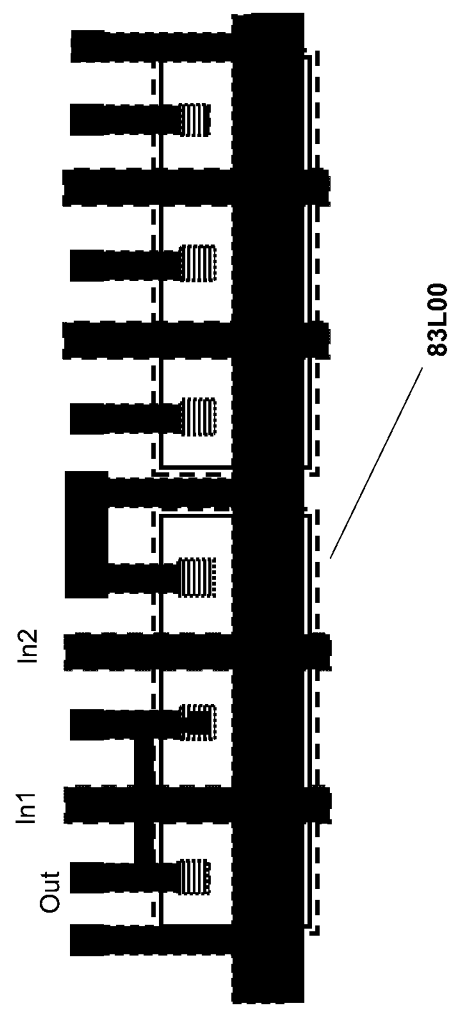

Fig 83L3
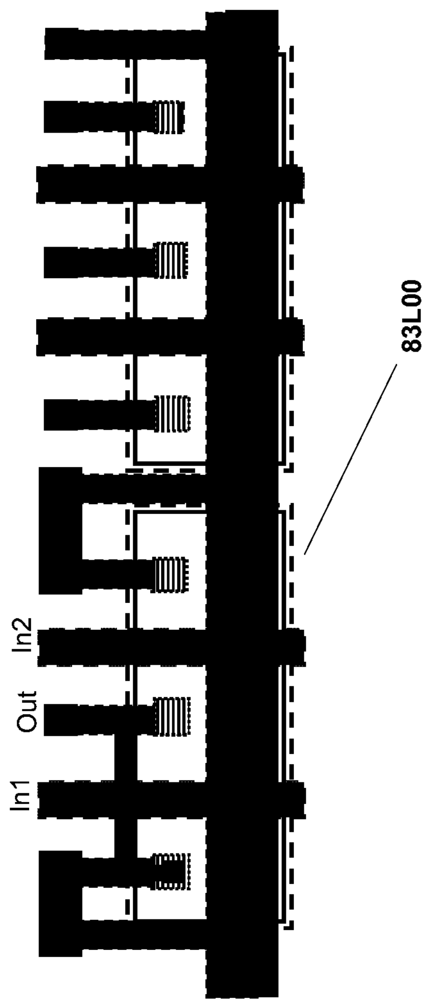

Fig 83L4
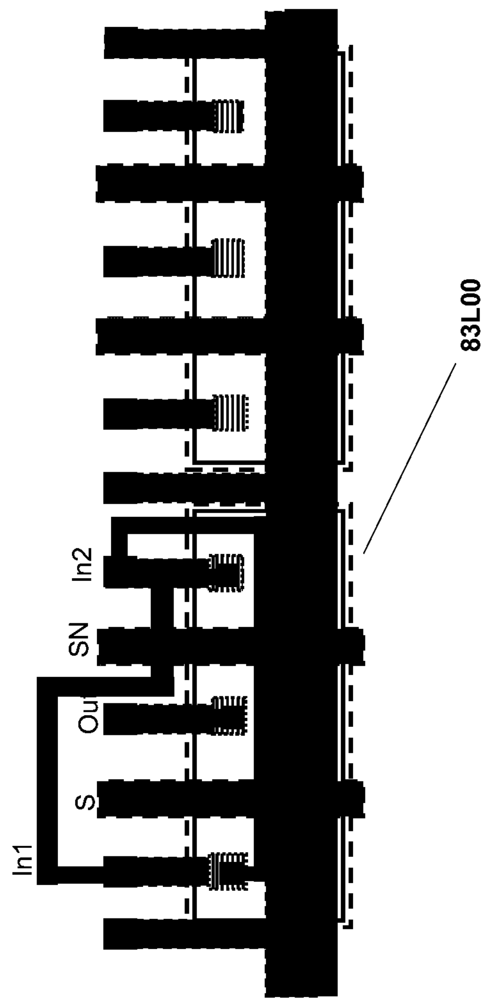

8402

8402

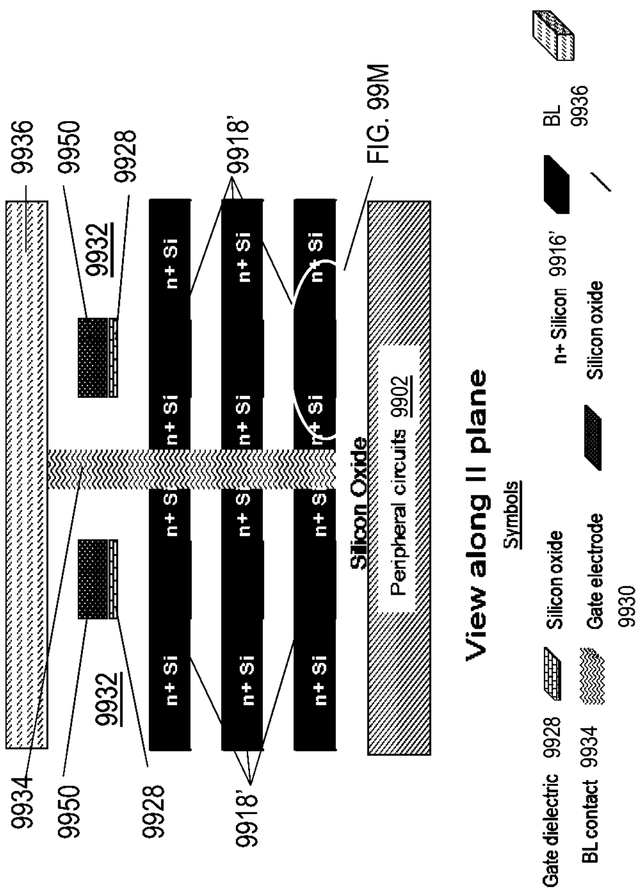
FIG. 99L1

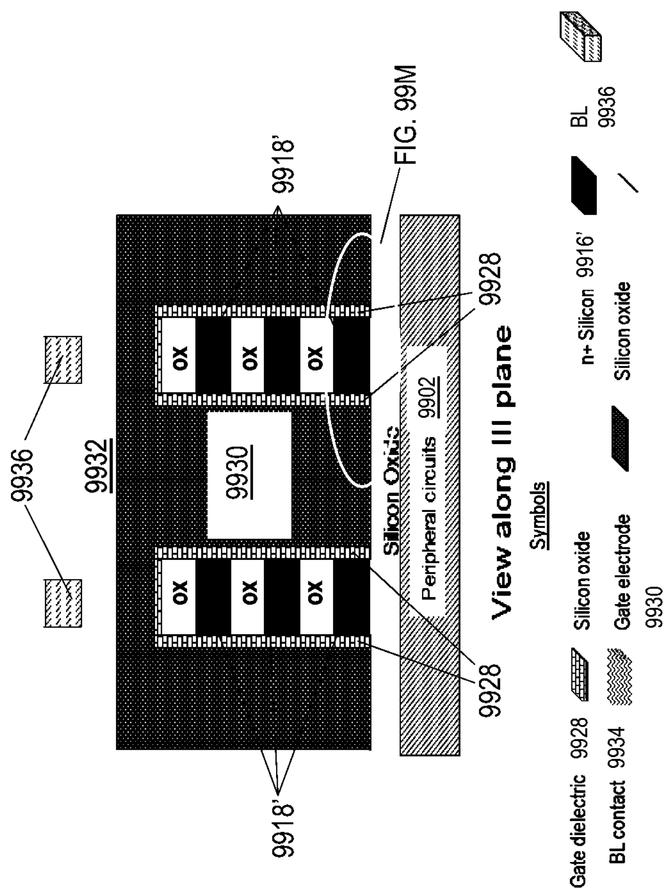
FIG. 99L2

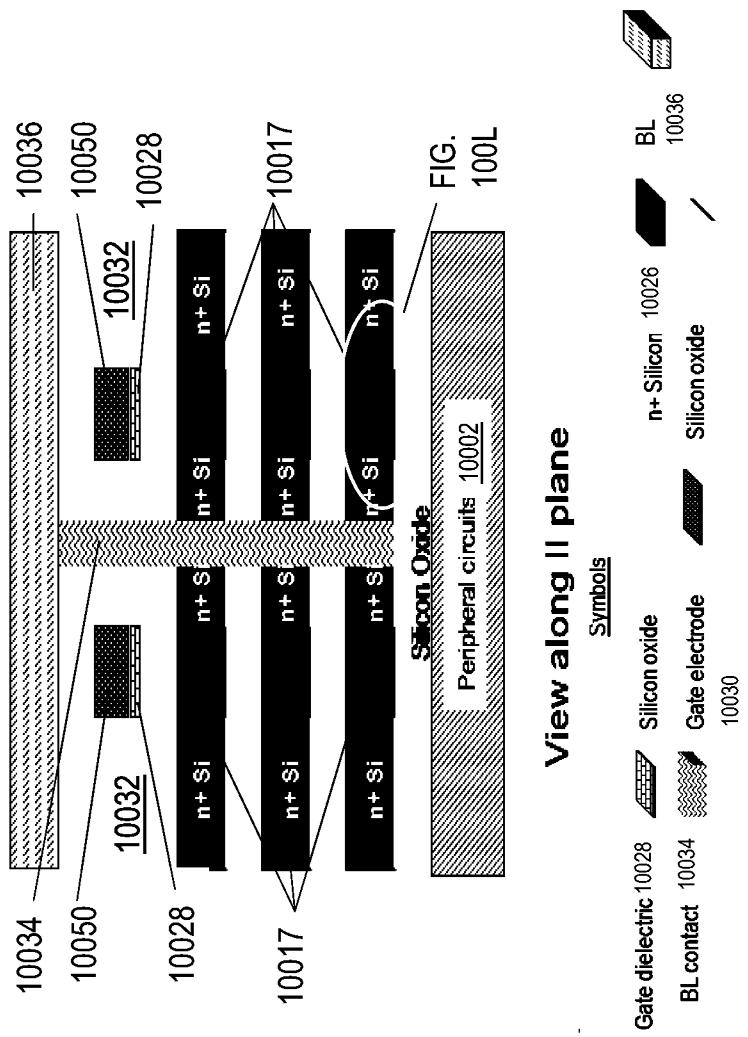
FIG. 100K1

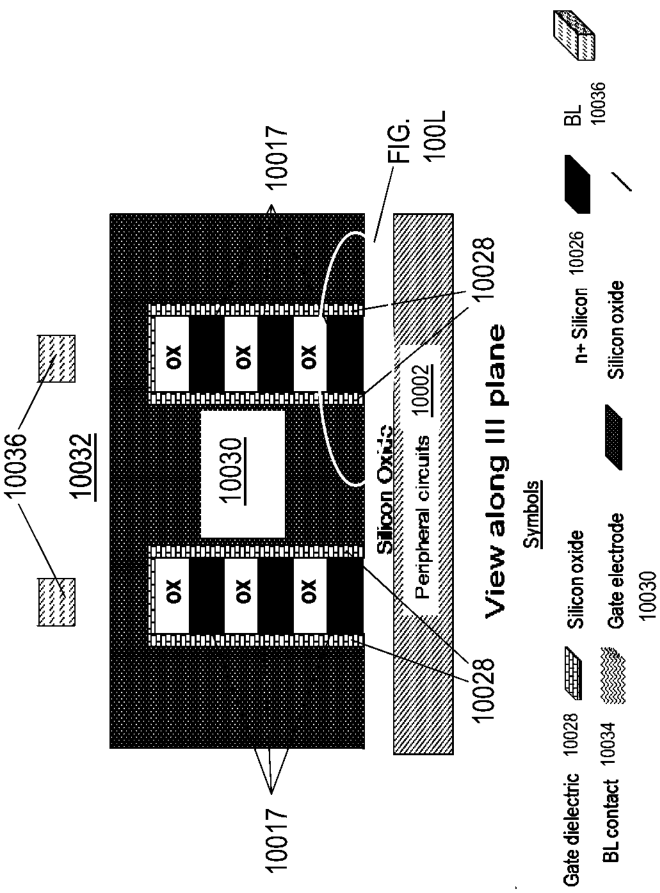
FIG. 100K2

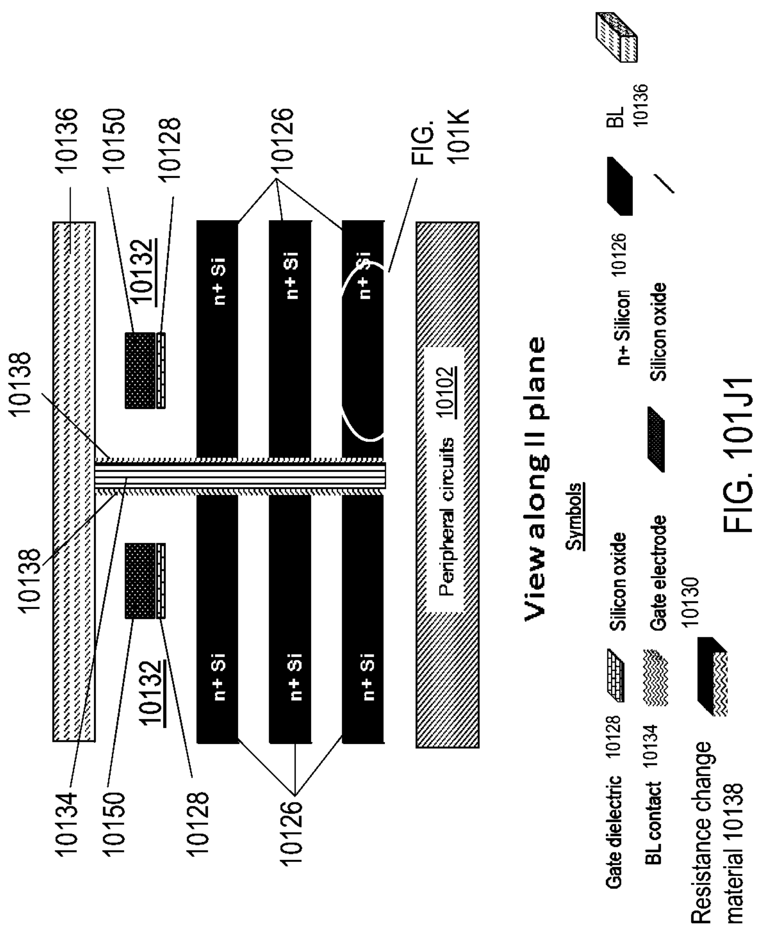
FIG. 101J1

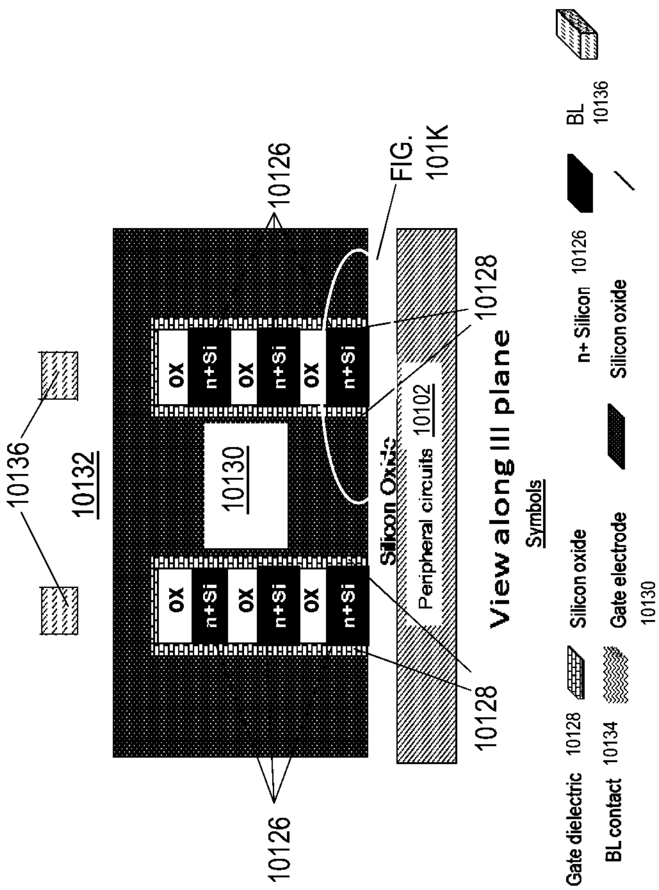
FIG. 101J2

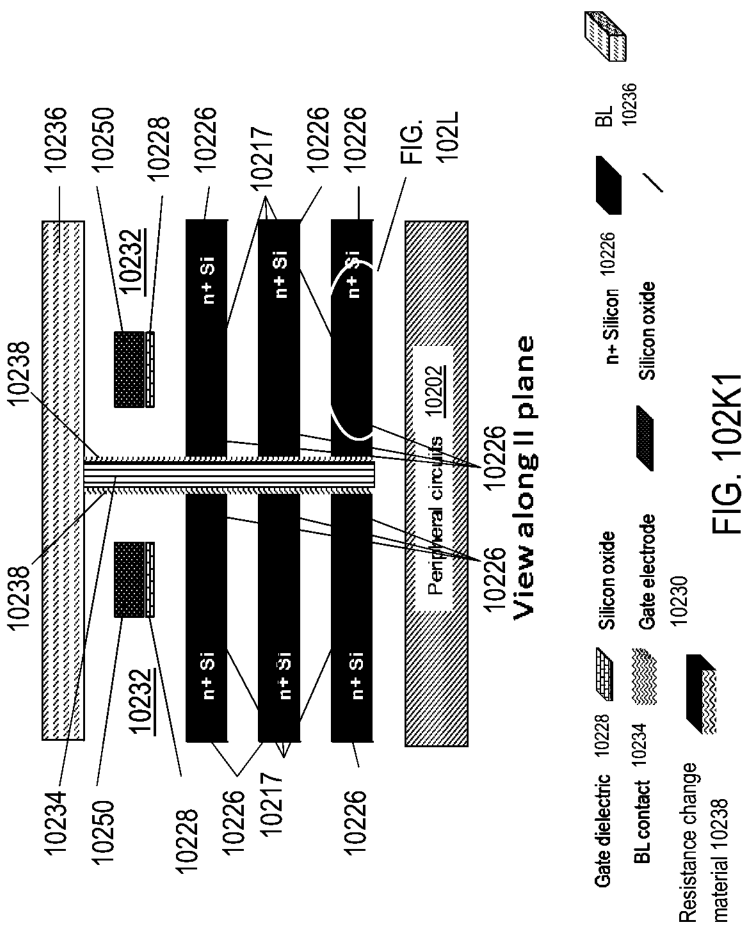
FIG. 102K1

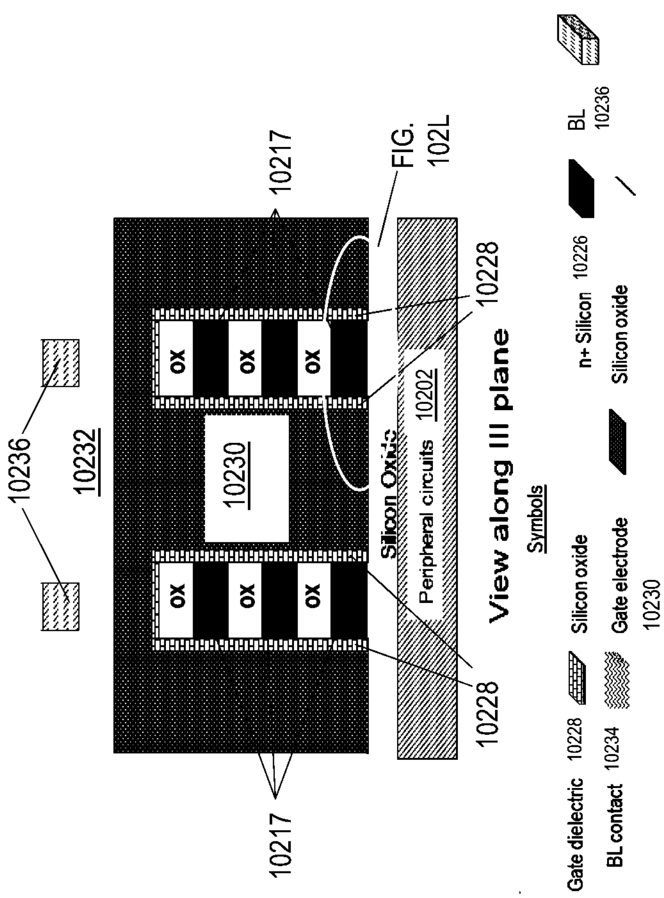
FIG. 102K2

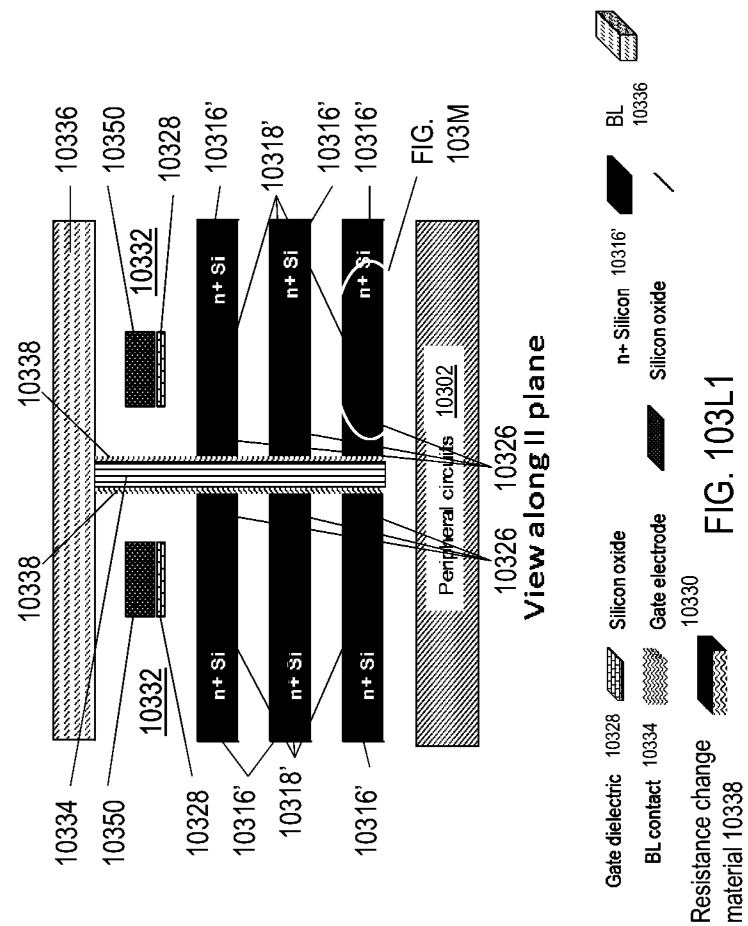
FIG. 103L1

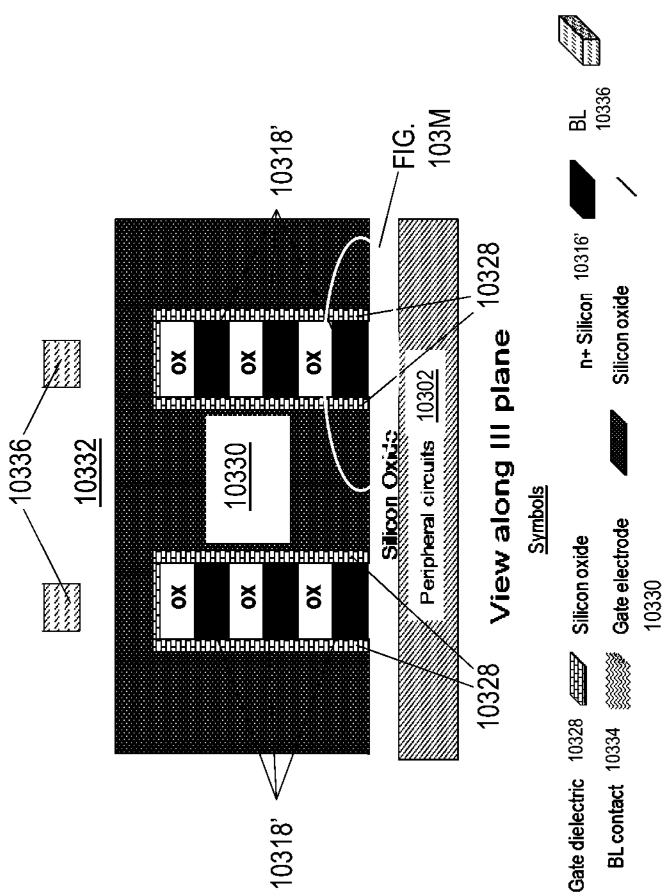
FIG. 103L2

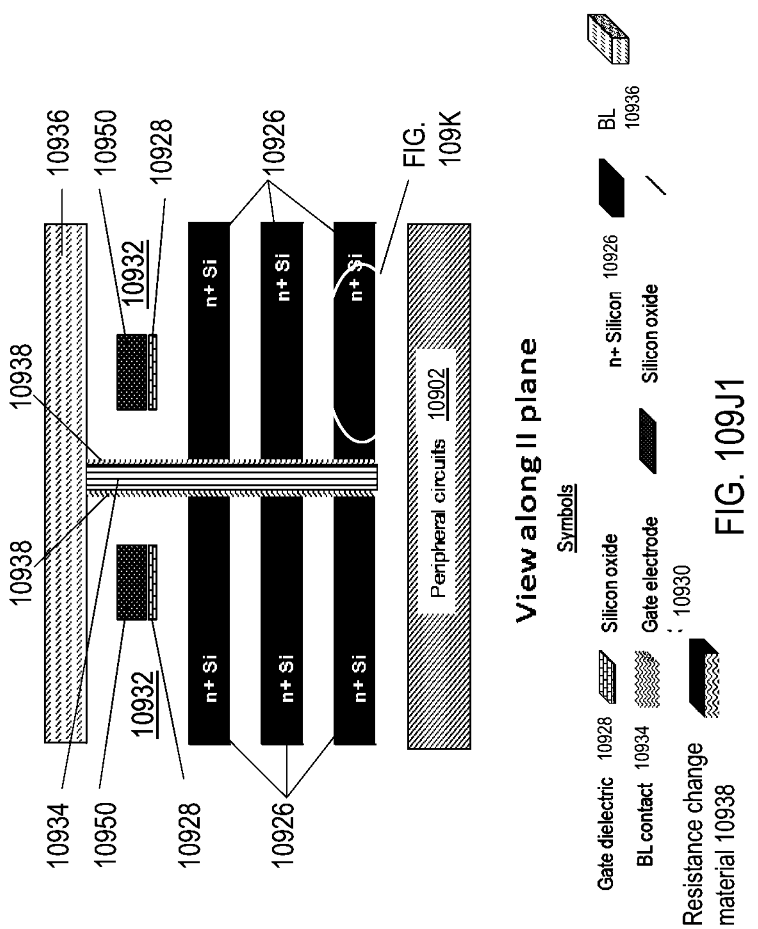
FIG. 109J1

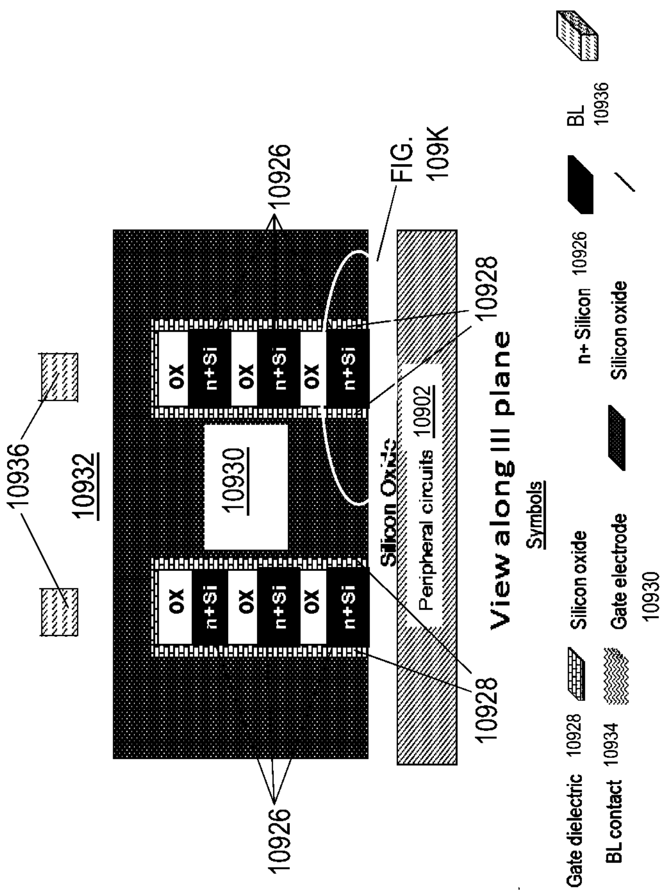
FIG. 109J2

FIG. 110A
Silicon Oxide 11004
Silicon Substrate 11002

SYSTEM COMPRISING A SEMICONDUCTOR DEVICE AND STRUCTURE

CROSS-REFERENCES TO RELATED APPLICATIONS

This application is a continuation of co-pending U.S. patent application Ser. No. 13/246,384 filed Sep. 27, 2011, which is a continuation of co-pending U.S. patent application Ser. No. 12/900,379 filed Oct. 7, 2010, which is a continuation-in-part of co-pending U.S. patent application Ser. No. 12/859,665 filed Aug. 19, 2010, which is a continuation-in-part of U.S. patent application Ser. No. 12/849,272 filed Aug. 3, 2010 (now issued as U.S. Pat. No. 7,986,042) and U.S. patent application Ser. No. 12/847,911 filed Jul. 30, 2010 (now issued as U.S. Pat. No. 7,960,242); U.S. patent application Ser. No. 12/847,911 is a continuation-in-part of U.S. patent application Ser. No. 12/792,673 filed Jun. 2, 2010 (now issued as U.S. Pat. No. 7,964,916), U.S. patent application Ser. No. 12/797,493 filed Jun. 9, 2010, and U.S. patent application Ser. No. 12/706,520 filed Feb. 16, 2010; both U.S. patent application Ser. No. 12/792,673 and U.S. patent application Ser. No. 12/797,493 are continuation-in-part applications of U.S. patent application Ser. No. 12/577,532 filed Oct. 12, 2009.

BACKGROUND OF THE INVENTION

1. Field of the Invention

The present invention relates to the general field of Integrated Circuit (IC) devices and fabrication methods, and more particularly to multilayer or Three Dimensional Integrated Circuit (3D IC) devices and fabrication methods.

2. Discussion of Background Art

Semiconductor manufacturing is known to improve device density in an exponential manner over time, but such improvements come with a price. The mask set cost required for each new process technology has also been increasing exponentially. While 20 years ago a mask set cost less than $20,000, it is now quite common to be charged more than $1M for today's state of the art device mask set.

These changes represent an increasing challenge primarily to custom products, which tend to target smaller volume and less diverse markets therefore making the increased cost of product development very hard to accommodate.

Custom Integrated Circuits can be segmented into two groups. The first group includes devices that have all their layers custom made. The second group includes devices that have at least some generic layers used across different custom products. Well-known examples of the second kind are Gate Arrays, which use generic layers for all layers up to a contact layer that couples the silicon devices to the metal conductors, and Field Programmable Gate Array (FPGA) devices where all the layers are generic. The generic layers in such devices are mostly a repeating pattern structure, called a Master Slice, in an array form.

The logic array technology is based on a generic fabric that is customized for a specific design during the customization stage. For an FPGA the customization is done through programming by electrical signals. For Gate Arrays, which in their modern form are sometimes called Structured Application Specific Integrated Circuits (or Structured ASICs), the customization is by at least one custom layer, which might be done with Direct Write eBeam or with a custom mask. As designs tend to be highly variable in the amount of logic and memory and type of input & output (I/O) each one needs, vendors of logic arrays create product families, each product having a different number of Master Slices covering a range of logic, memory size and I/O options. Yet, it is always a challenge to come up with minimum set of Master Slices that will provide a good fit for the maximal number of designs because it is quite costly if a dedicated mask set is required for each product.

U.S. Pat. No. 4,733,288 issued to Sato in March 1988 ("Sato"), discloses a method "to provide a gate-array LSI chip which can be cut into a plurality of chips, each of the chips having a desired size and a desired number of gates in accordance with a circuit design." The references cited in Sato present a few alternative methods to utilize a generic structure for different sizes of custom devices.

The array structure fits the objective of variable sizing. The difficulty to provide variable-sized array structure devices is due to the need of providing I/O cells and associated pads to connect the device to the package. To overcome this limitation Sato suggests a method where I/O could be constructed from the transistors that are also used for the general logic gates. Anderson also suggested a similar approach. U.S. Pat. No. 5,217,916 issued to Anderson et al. on Jun. 8, 1993, discloses a borderless configurable gate array free of predefined boundaries using transistor gate cells, of the same type of cells used for logic, to serve the input and output function. Accordingly, the input and output functions may be placed to surround the logic array sized for the specific application. This method places a severe limitation on the I/O cell to use the same type of transistors as used for the logic and; hence, would not allow the use of higher operating voltages for the I/O.

U.S. Pat. No. 7,105,871 issued to Or-Bach et al. on Sep. 12, 2006, discloses a semiconductor device that includes a borderless logic array and area I/Os. The logic array may comprise a repeating core, and at least one of the area I/Os may be a configurable I/O.

In the past it was reasonable to design an I/O cell that could be configured to the various needs of most customers. The ever increasing need of higher data transfer rate in and out of the device drove the development of special serial I/O circuits called SerDes (Serializer/Deserializer) transceivers. These circuits are complex and require a far larger silicon area than conventional I/Os. Consequently, the variations needed are combinations of various amounts of logic, various amounts and types of memories, and various amounts and types of I/O. This implies that even the use of the borderless logic array of the prior art will still require multiple expensive mask sets.

The most common FPGAs in the market today are based on Static Random Access Memory (SRAM) as the programming element. Floating-Gate Flash programmable elements are also utilized to some extent. Less commonly, FPGAs use an antifuse as the programming element. The first generation of antifuse FPGAs used antifuses that were built directly in contact with the silicon substrate itself. The second generation moved the antifuse to the metal layers to utilize what is called the Metal to Metal Antifuse. These antifuses function like programmable vias. However, unlike vias that are made with the same metal that is used for the interconnection, these antifuses generally use amorphous silicon and some additional interface layers. While in theory antifuse technology could support a higher density than SRAM, the SRAM FPGAs are dominating the market today. In fact, it seems that no one is advancing Antifuse FPGA devices anymore. One of the severe disadvantages of antifuse technology has been their lack of re-programmability. Another disadvantage has been the special silicon manufacturing process required for the antifuse technology which results in extra development costs and the associated time lag with respect to baseline IC technology scaling.

The general disadvantage of common FPGA technologies is their relatively poor use of silicon area. While the end customer only cares to have the device perform his desired function, the need to program the FPGA to any function requires the use of a very significant portion of the silicon area for the programming and programming check functions.

Some embodiments of the current invention seek to overcome the prior-art limitations and provide some additional benefits by making use of special types of transistors that are fabricated above or below the antifuse configurable interconnect circuits and thereby allow far better use of the silicon area.

One type of such transistors is commonly known in the art as Thin Film Transistors or TFT. Thin Film Transistors has been proposed and used for over three decades. One of the better-known usages has been for displays where the TFT are fabricated on top of the glass used for the display. Other type of transistors that could be fabricated above the antifuse configurable interconnect circuits are called Vacuum Field Effect Transistor (FET) and was introduced three decades ago such as in U.S. Pat. No. 4,721,885.

Other techniques could also be used such as employing Silicon On Insulator (SOI) technology. In U.S. Pat. Nos. 6,355,501 and 6,821,826, both assigned to IBM, a multilayer three-dimensional Complementary Metal-Oxide-Semiconductor (CMOS) Integrated Circuit is proposed. It suggests bonding an additional thin SOI wafer on top of another SOI wafer forming an integrated circuit on top of another integrated circuit and connecting them by the use of a through-silicon-via, or thru layer via (TLV). Substrate supplier Soitec SA, of Bernin, France is now offering a technology for stacking of a thin layer of a processed wafer on top of a base wafer.

Integrating top layer transistors above an insulation layer is not common in an IC because the quality and density of prior art top layer transistors are inferior to those formed in the base (or substrate) layer. The substrate may be formed of monocrystalline silicon and may be ideal for producing high density and high quality transistors, and hence preferable. There are some applications where it has been suggested to build memory cells using such transistors as in U.S. Pat. Nos. 6,815,781, 7,446,563 and a portion of an SRAM based FPGA such as in U.S. Pat. Nos. 6,515,511 and 7,265,421.

Embodiments of the current invention seek to take advantage of the top layer transistor to provide a much higher density antifuse-based programmable logic. An additional advantage for such use will be the option to further reduce cost in high volume production by utilizing custom mask(s) to replace the antifuse function, thereby eliminating the top layer(s) anti-fuse programming logic altogether.

Additionally some embodiments of the invention may provide innovative alternatives for multi layer 3D IC technology. As on-chip interconnects are becoming the limiting factor for performance and power enhancement with device scaling, 3D IC may be an important technology for future generations of ICs. Currently the only viable technology for 3D IC is to finish the IC by the use of Through-Silicon-Via (TSV). The problem with TSVs is that they are relatively large (a few microns each in area) and therefore may lead to highly limited vertical connectivity. The current invention may provide multiple alternatives for 3D IC with an order of magnitude improvement in vertical connectivity.

Constructing future 3D ICs will require new architectures and new ways of thinking. In particular, yield and reliability of extremely complex three dimensional systems will have to be addressed, particularly given the yield and reliability difficulties encountered in building complex Application Specific Integrated Circuits (ASIC) of recent deep submicron process generations.

Fortunately, current testing techniques will likely prove applicable to 3D IC manufacturing, though they will be applied in very different ways. FIG. 116 illustrates a prior art set scan architecture in a 2D IC ASIC 11600. The ASIC functionality is present in logic clouds 11620, 11622, 11624 and 11626 which are interspersed with sequential cells like, for example, pluralities of flip-flops indicated at 11612, 11614 and 11616. The ASIC 11600 also has input pads 11630 and output pads 11640. The flip-flops are typically provided with circuitry to allow them to function as a shift register in a test mode. In FIG. 116 the flip-flops form a scan register chain where pluralities of flip-flops 11612, 11614 and 11616 are coupled together in series with Scan Test Controller 11610. One scan chain is shown in FIG. 116, but in a practical design comprising millions of flip-flops, many sub-chains will be used.

In the test architecture of FIG. 116, test vectors are shifted into the scan chain in a test mode. Then the part is placed into operating mode for one or more clock cycles, after which the contents of the flip-flops are shifted out and compared with the expected results. This may provide an excellent way to isolate errors and diagnose problems, though the number of test vectors in a practical design can be very large and an external tester may be utilized.

FIG. 117 shows a prior art boundary scan architecture in exemplary ASIC 11700. The part functionality is shown in logic function block 11710. The part also has a variety of input/output cells 11720, each comprising a bond pad 11722, an input buffer 11724, and a tri-state output buffer 11726. Boundary Scan Register Chains 11732 and 11734 are shown coupled in series with Scan Test Control block 11730. This architecture operates in a similar manner as the set scan architecture of FIG. 116. Test vectors are shifted in, the part is clocked, and the results are then shifted out to compare with expected results. Typically, set scan and boundary scan are used together in the same ASIC to provide complete test coverage.

FIG. 118 shows a prior art Built-In Self Test (BIST) architecture for testing a logic block 11800 which comprises a core block function 11810 (what is being tested), inputs 11812, outputs 11814, a BIST Controller 11820, an input Linear Feedback Shift Register (LFSR) 11822, and an output Cyclical Redundancy Check (CRC) circuit 11824. Under control of BIST Controller 11820, LFSR 11822 and CRC 11824 are seeded (i.e., set to a known starting value), the block 11800 is clocked a predetermined number of times with LFSR 11822 presenting pseudo-random test vectors to the inputs of Block Function 11810 and CRC 11824 monitoring the outputs of Block Function 11810. After the predetermined number of clocks, the contents of CRC 11824 are compared to the expected value (or signature). If the signature matches, block 11800 passes the test and is deemed good. This sort of testing is good for fast "go" or "no go" testing as it is self-contained to the block being tested and does not require storing a large number of test vectors or use of an external tester. BIST, set scan, and boundary scan techniques are often combined in complementary ways on the same ASIC. A detailed discussion of the theory of LSFRs and CRCs can be found in *Digital Systems Testing and Testable Design*, by Abramovici, Breuer and Friedman, Computer Science Press, 1990, pp 432-447.

Another prior art technique that is applicable to the yield and reliability of 3D ICs is Triple Modular Redundancy. This is a technique where the circuitry is instantiated in a design in triplicate and the results are compared. Because two or three of the circuit outputs are always in agreement (as is the case with binary signals) voting circuitry (or majority-of-three or MAJ3) takes that as the result. While primarily a technique used for noise suppression in high reliability or radiation tolerant systems in military, aerospace and space applications, it also can be used as a way of masking errors in faulty circuits since if any two of three replicated circuits are functional the system will behave as if it is fully functional. A discussion of the radiation tolerant aspects of TMR systems, Single Event Effects (SEE), Single Event Upsets (SEU) and Single Event Transients (SET) can be found in U.S. Patent Application Publication 2009/0204933 to Rezgui ("Rezgui").

Additionally the 3D technology according to some embodiments of the current invention may enable some very innovative IC alternatives with reduced development costs, increased yield, and other important benefits.

SUMMARY

Embodiments of the present invention seek to provide a new method for semiconductor device fabrication that may be highly desirable for custom products. Embodiments of the current invention suggest the use of a re-programmable antifuse in conjunction with 'Through Silicon Via' to construct a new type of configurable logic, or as usually called, FPGA devices. Embodiments of the current invention may provide a solution to the challenge of high mask-set cost and low flexibility that exists in the current common methods of semiconductor fabrication. An additional advantage of some embodiments of the invention is that it could reduce the high cost of manufacturing the many different mask sets needed in order to provide a commercially viable logic family with a range of products each with a different set of master slices. Embodiments of the current invention may improve upon the prior art in many respects, which may include the way the semiconductor device is structured and methods related to the fabrication of semiconductor devices.

Embodiments of the current invention reflect the motivation to save on the cost of masks with respect to the investment that would otherwise have been necessary to put in place a commercially viable set of master slices. Embodiments of the current invention also seek to provide the ability to incorporate various types of memory blocks in the configurable device. Embodiments of the current invention provide a method to construct a configurable device with the desired amount of logic, memory, I/Os, and analog functions.

In addition, embodiments of the current invention allow the use of repeating logic tiles that provide a continuous terrain of logic. Embodiments of the current invention show that with Through-Silicon-Via (TSV) a modular approach could be used to construct various configurable systems. Once a standard size and location of TSV has been defined one could build various configurable logic dies, configurable memory dies, configurable I/O dies and configurable analog dies which could be connected together to construct various configurable systems. In fact it may allow mix and match between configurable dies, fixed function dies, and dies manufactured in different processes.

Embodiments of the current invention seek to provide additional benefits by making use of special type of transistors that are placed above or below the antifuse configurable interconnect circuits and thereby allow a far better use of the silicon area. In general an FPGA device that utilizes antifuses to configure the device function may include the electronic circuits to program the antifuses. The programming circuits may be used primarily to configure the device and are mostly an overhead once the device is configured. The programming voltage used to program the antifuse may typically be significantly higher than the voltage used for the operating circuits of the device. The design of the antifuse structure may be designed such that an unused antifuse will not accidentally get fused. Accordingly, the incorporation of the antifuse programming in the silicon substrate may need special attention for this higher voltage, and additional silicon area may, accordingly, be allocated.

Unlike the operating transistors that are desired to operate as fast as possible, to enable fast system performance, the programming circuits could operate relatively slowly. Accordingly using a thin film transistor for the programming circuits could fit very well with the function and would reduce the needed silicon area.

The programming circuits may, therefore, be constructed with thin film transistors, which may be fabricated after the fabrication of the operating circuitry, on top of the configurable interconnection layers that incorporate and use the antifuses. An additional advantage of such embodiments of the invention is the ability to reduce cost of the high volume production. One may only need to use mask-defined links instead of the antifuses and their programming circuits. One custom via mask may be used, and this may save steps associated with the fabrication of the antifuse layers, the thin film transistors, and/or the associated connection layers of the programming circuitry.

In accordance with an embodiment of the present invention an Integrated Circuit device is thus provided, comprising; a plurality of antifuse configurable interconnect circuits and plurality of transistors to configure at least one of said antifuses; wherein said transistors are fabricated after said antifuse.

Further provided in accordance with an embodiment of the present invention is an Integrated Circuit device comprising; a plurality of antifuse configurable interconnect circuits and plurality of transistors to configure at least one of said antifuses; wherein said transistors are placed over said antifuse.

Still further in accordance with an embodiment of the present invention the Integrated Circuit device comprises second antifuse configurable logic cells and plurality of second transistors to configure said second antifuses wherein these second transistors are fabricated before said second antifuses.

Still further in accordance with an embodiment of the present invention the Integrated Circuit device comprises also second antifuse configurable logic cells and a plurality of second transistors to configure said second antifuses wherein said second transistors are placed underneath said second antifuses.

Further provided in accordance with an embodiment of the present invention is an Integrated Circuit device comprising; first antifuse layer, at least two metal layers over it and a second antifuse layer overlaying the two metal layers.

In accordance with an embodiment of the present invention a configurable logic device is presented, comprising: antifuse configurable look up table logic interconnected by antifuse configurable interconnect.

In accordance with an embodiment of the present invention a configurable logic device is also provided, comprising: plurality of configurable look up table logic, plurality of configurable programmable logic array (PLA) logic, and plurality of antifuse configurable interconnect.

In accordance with an embodiment of the present invention a configurable logic device is also provided, comprising:

plurality of configurable look up table logic and plurality of configurable drive cells wherein the drive cells are configured by plurality of antifuses.

In accordance with an embodiment of the present invention a configurable logic device is additionally provided, comprising: configurable logic cells interconnected by a plurality of antifuse configurable interconnect circuits wherein at least one of the antifuse configurable interconnect circuits is configured as part of a non volatile memory.

Further in accordance with an embodiment of the present invention the configurable logic device comprises at least one antifuse configurable interconnect circuit, which is also configurable to a PLA function.

In accordance with an alternative embodiment of the present invention an integrated circuit system is also provided, comprising a configurable logic die and an I/O die wherein the configurable logic die is connected to the I/O die by the use of Through-Silicon-Via.

Further in accordance with an embodiment of the present invention the integrated circuit system comprises; a configurable logic die and a memory die wherein these dies are connected by the use of Through-Silicon-Via.

Still further in accordance with an embodiment of the present invention the integrated circuit system comprises a first configurable logic die and second configurable logic die wherein the first configurable logic die and the second configurable logic die are connected by the use of Through-Silicon-Via.

Moreover in accordance with an embodiment of the present invention the integrated circuit system comprises an I/O die that was fabricated utilizing a different process than the process utilized to fabricate the configurable logic die.

Further in accordance with an embodiment of the present invention the integrated circuit system comprises at least two logic dies connected by the use of Through-Silicon-Via and wherein some of the Through-Silicon-Vias are utilized to carry the system bus signal.

Moreover in accordance with an embodiment of the present invention the integrated circuit system comprises at least one configurable logic device.

Further in accordance with an embodiment of the present invention the integrated circuit system comprises, an antifuse configurable logic die and programmer die and these dies are connected by the use of Through-Silicon-Via.

Additionally there is a growing need to reduce the impact of inter-chip interconnects. In fact, interconnects are now dominating IC performance and power. One solution to shorten interconnect may be to use a 3D IC. Currently, the only known way for general logic 3D IC is to integrate finished device one on top of the other by utilizing Through-Silicon-Vias as now called TSVs. The problem with TSVs is that their large size, usually a few microns each, may severely limit the number of connections that can be made. Some embodiments of the current invention may provide multiple alternatives to constructing a 3D IC wherein many connections may be made less than one micron in size, thus enabling the use of 3D IC technology for most device applications.

Additionally some embodiments of this invention may offer new device alternatives by utilizing the proposed 3D IC technology.

BRIEF DESCRIPTION OF THE DRAWINGS

Various embodiments of the present invention will be understood and appreciated more fully from the following detailed description, taken in conjunction with the drawings in which:

FIG. 83 L1-L4 are drawing illustrations of a formation of top planar transistors;

Figure 97:
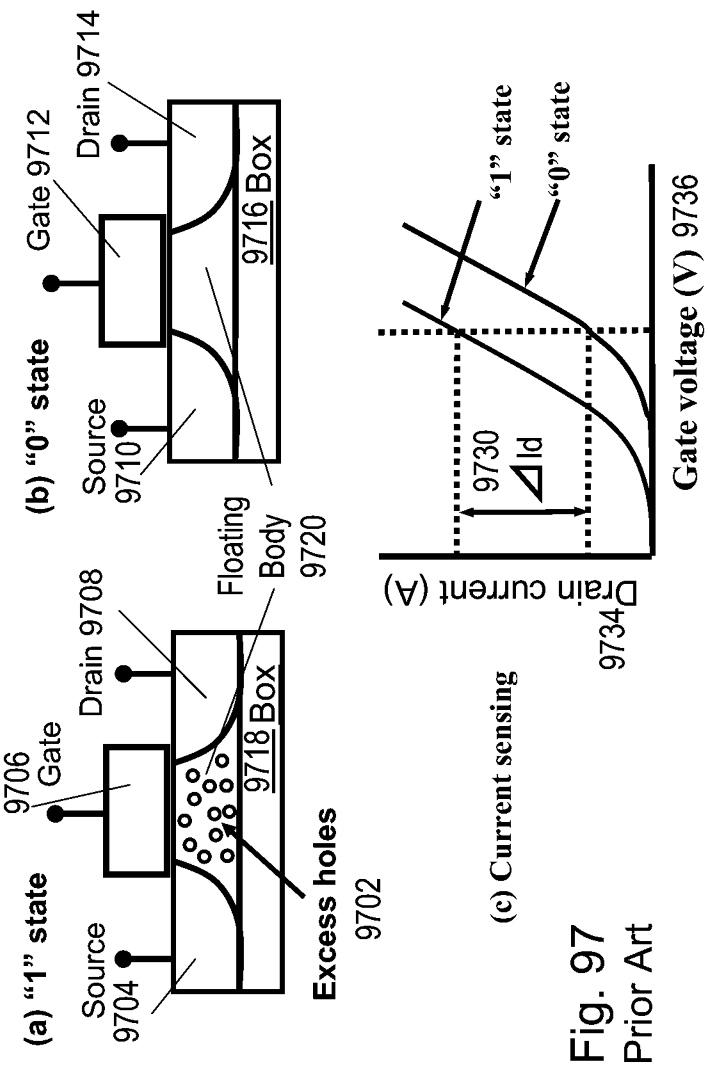
Figure 112:
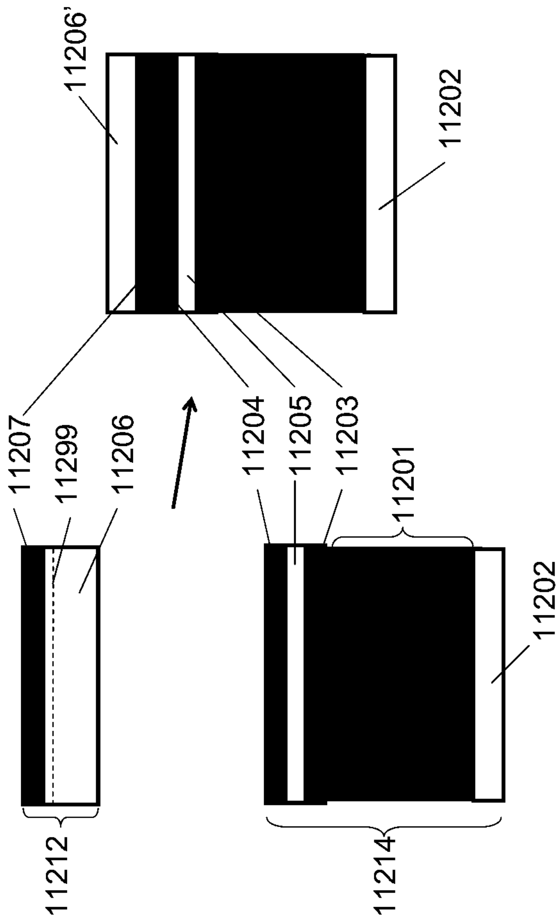
Figure 114:
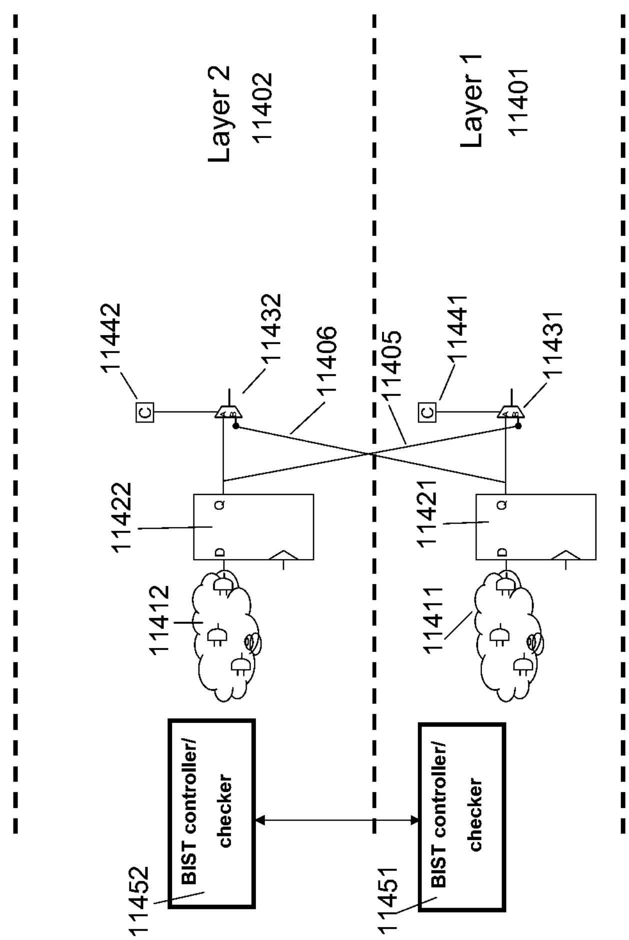
Figure 115:
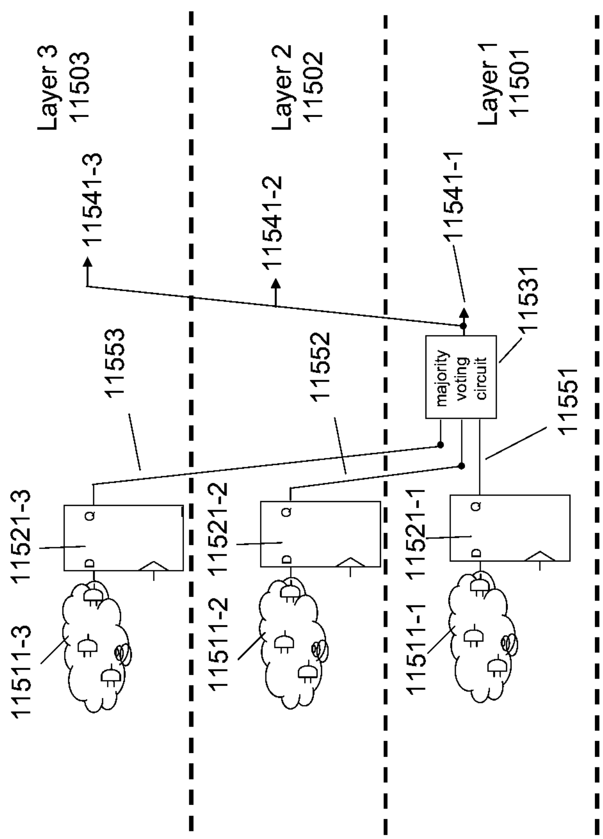
Figure 116:
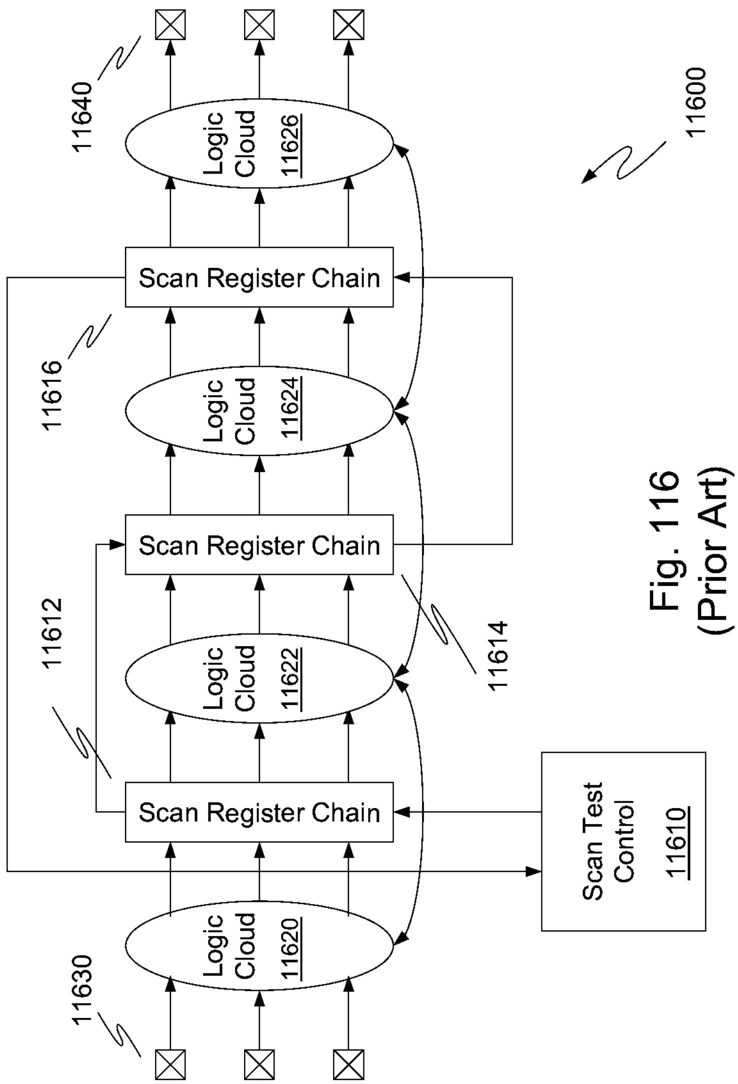
Figure 117:
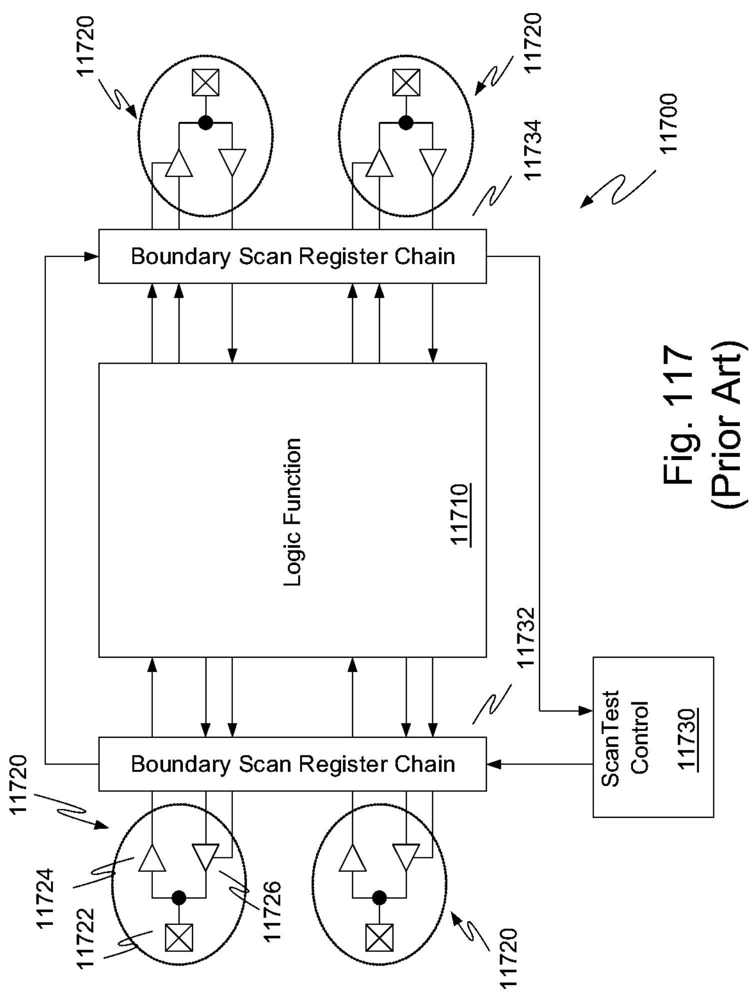
Figure 118:
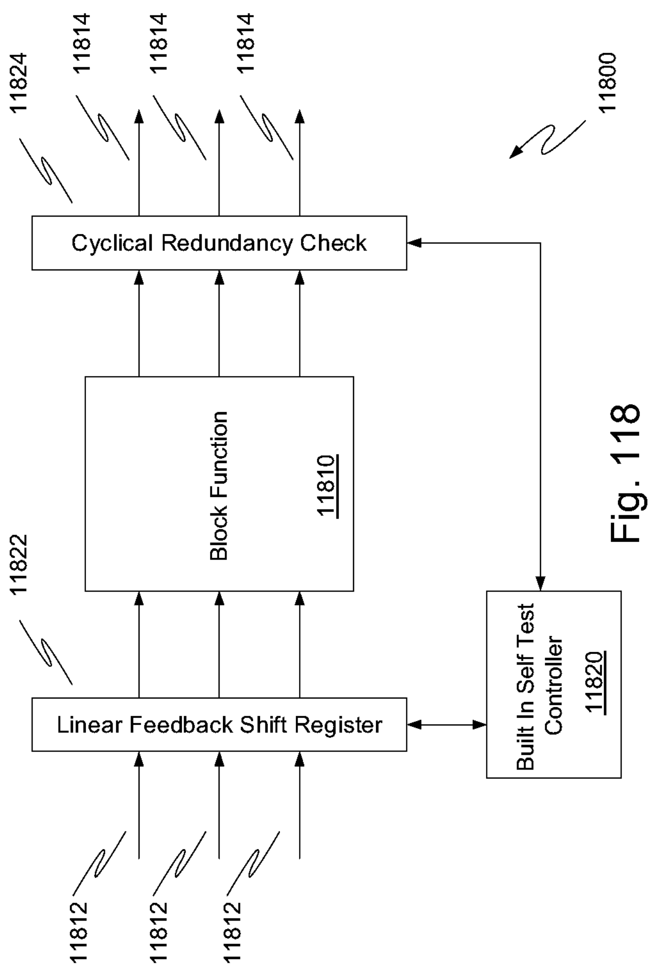
Figure 119:
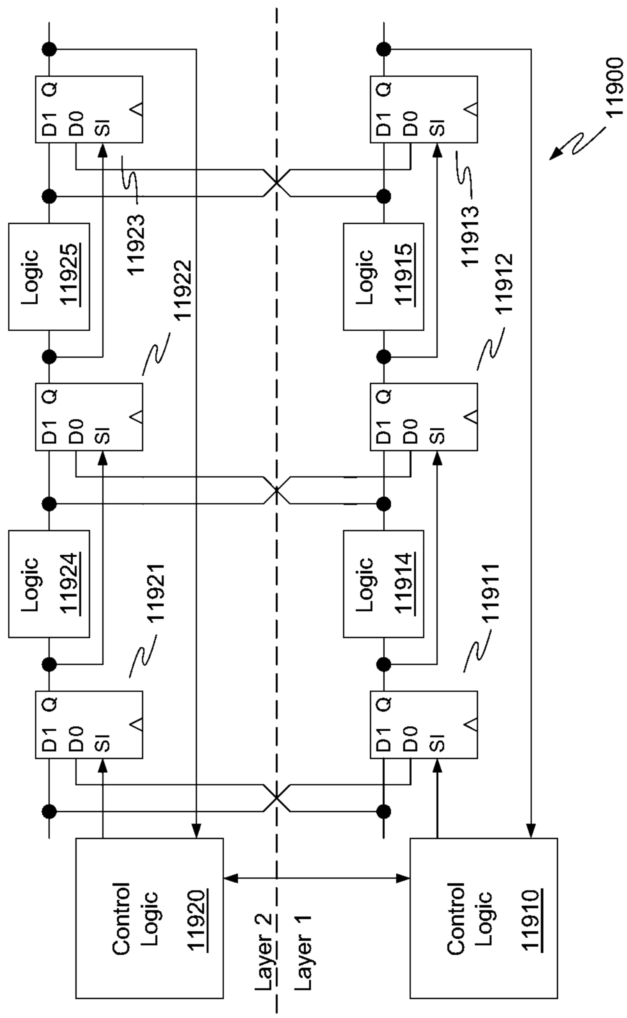
Figure 120:
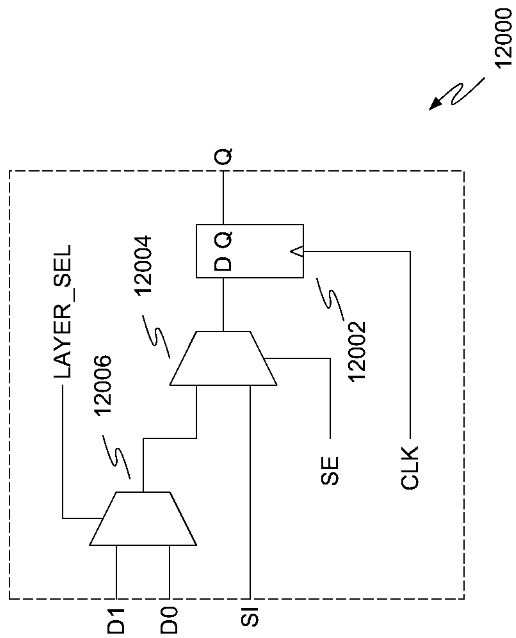
Figure 121:
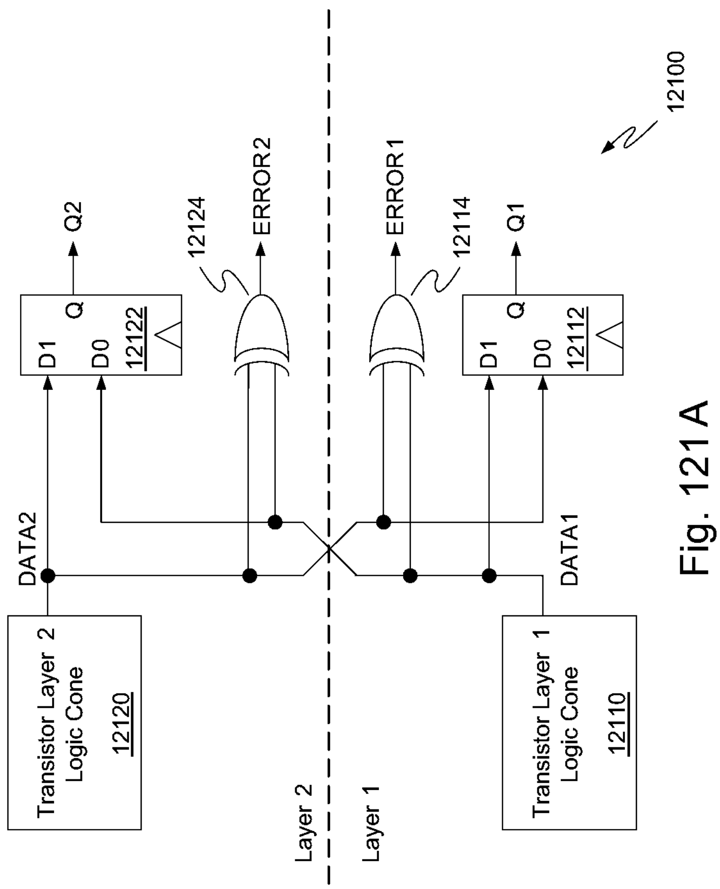
Figure 121B:
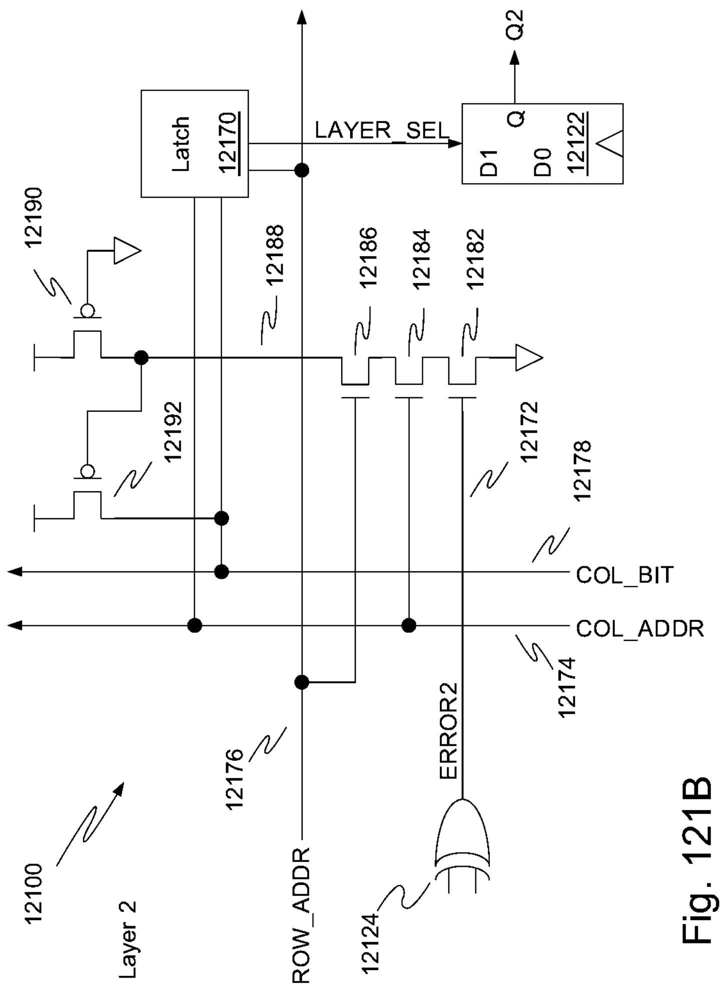
Figure 122:
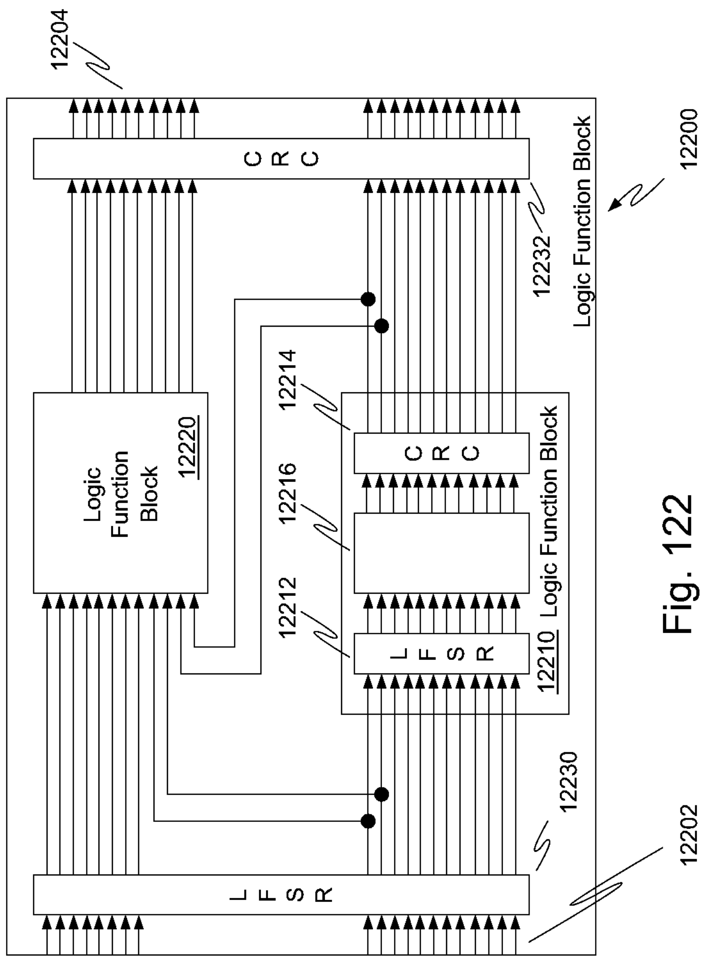
Figure 123:
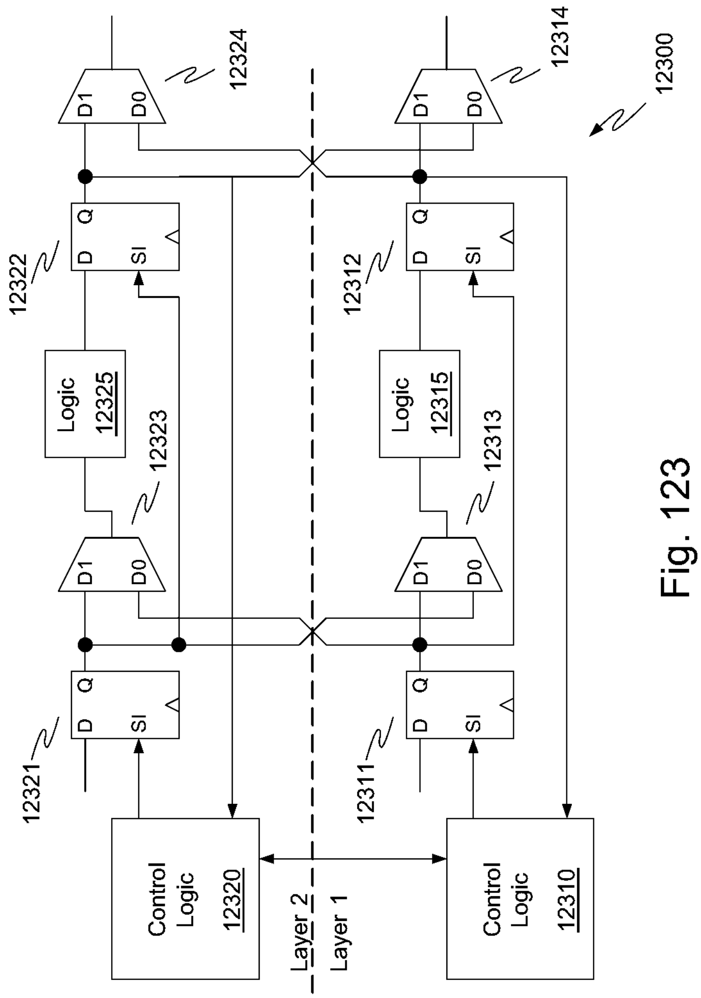
Figure 124:
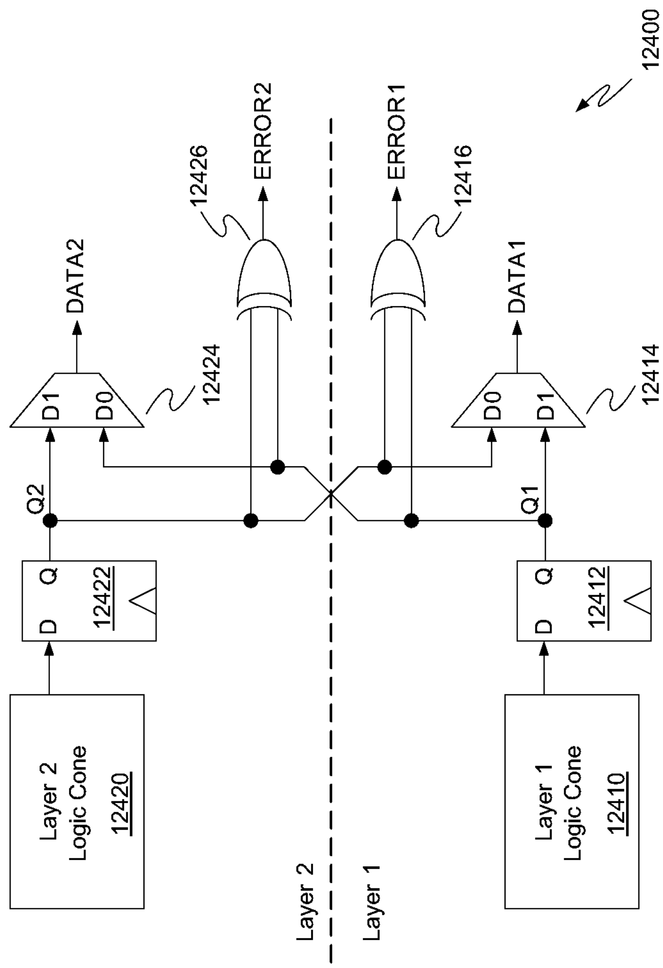
Figure 125:
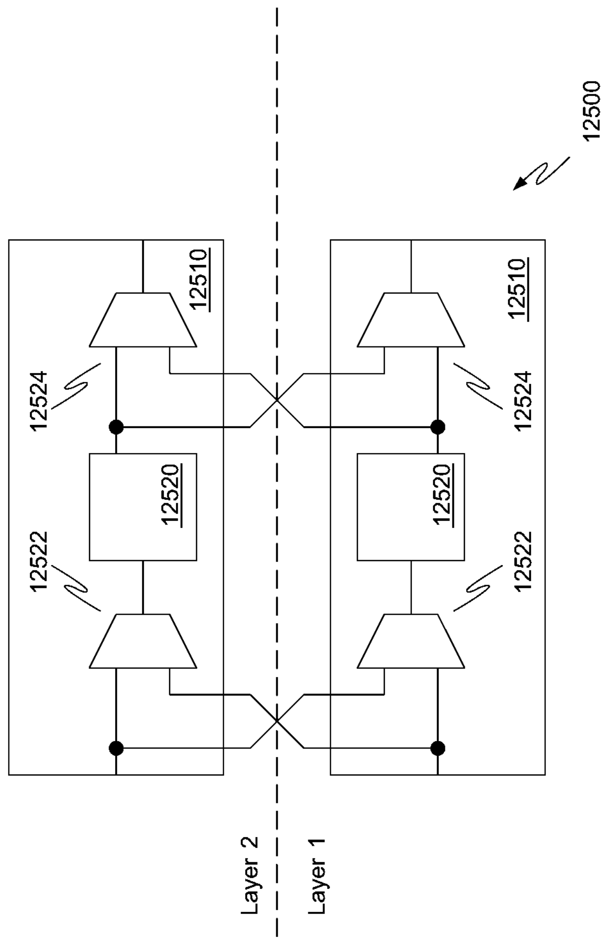
Figure 125B:
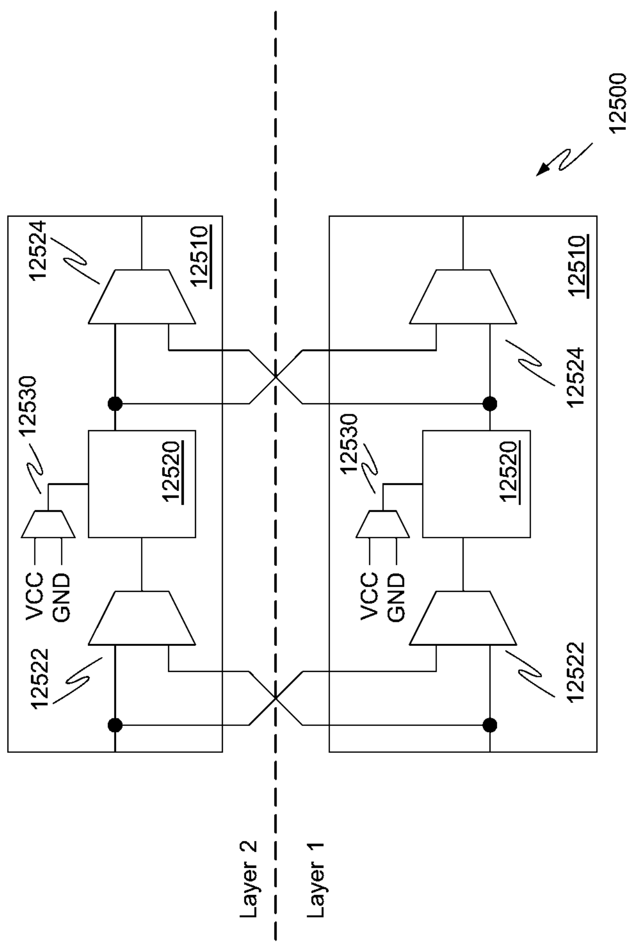
Figure 126:
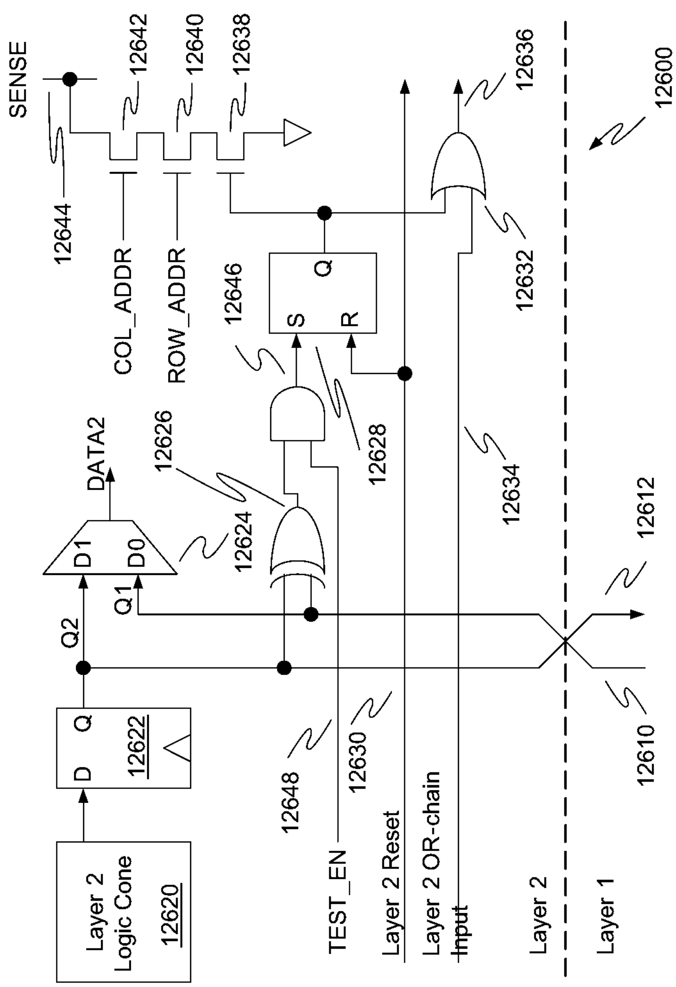
Figure 127:
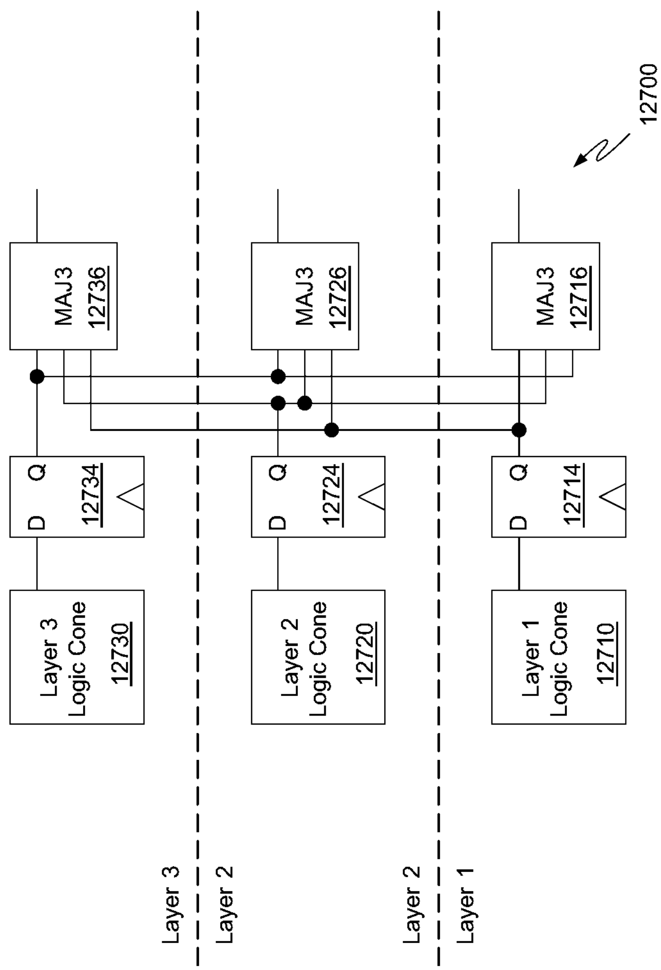
Figure 128:
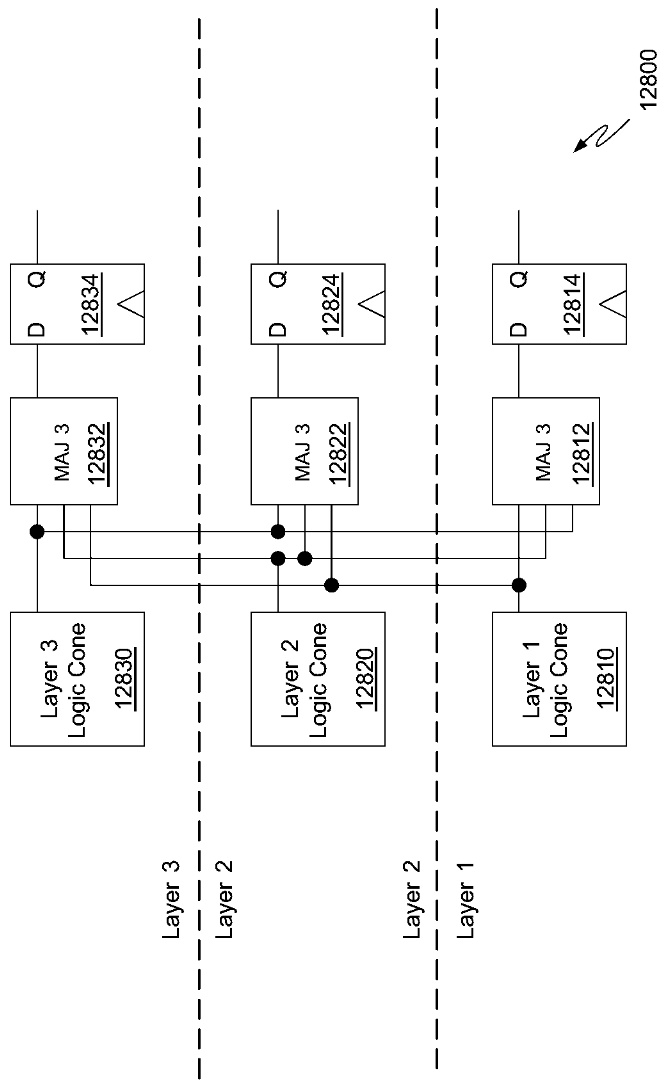
Figure 129:
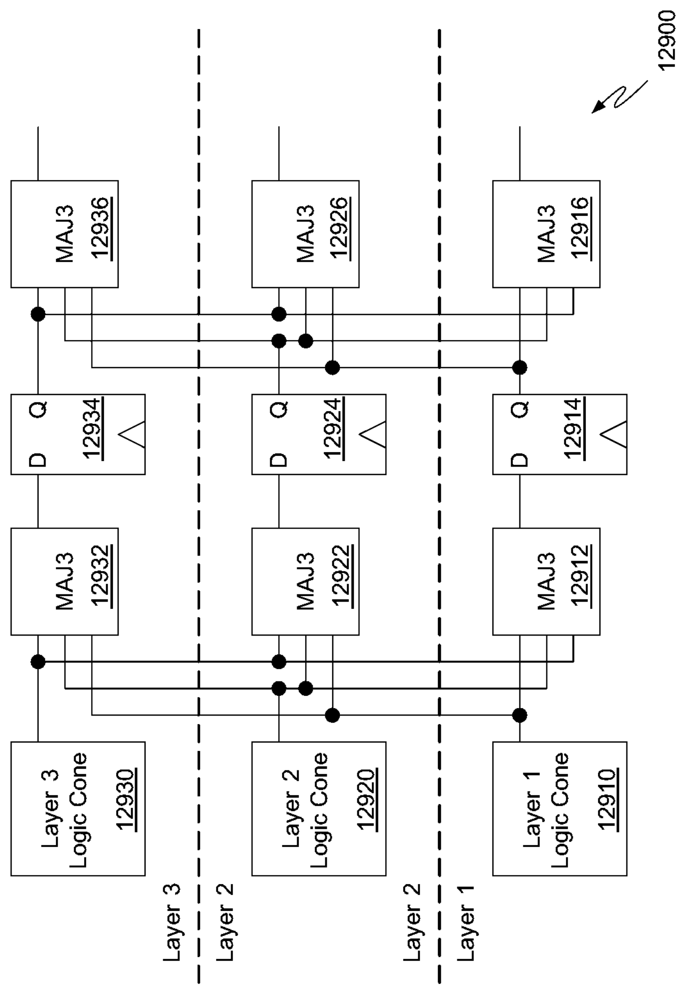
Figure 130B:
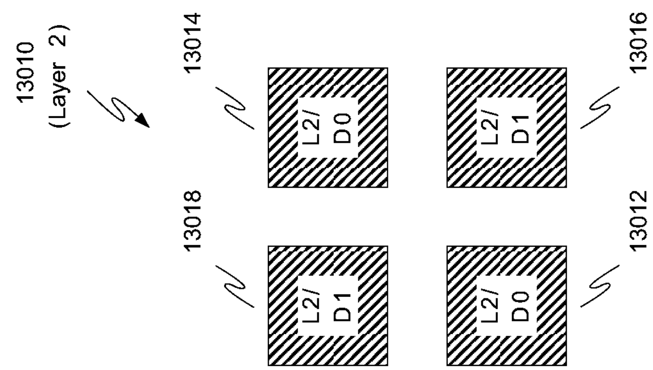
Figure 130A:
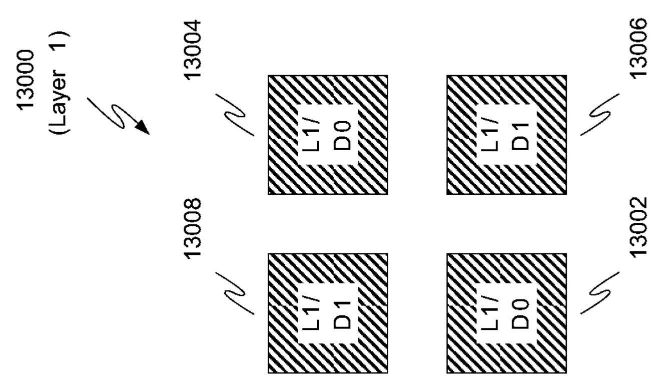
Figure 130C:
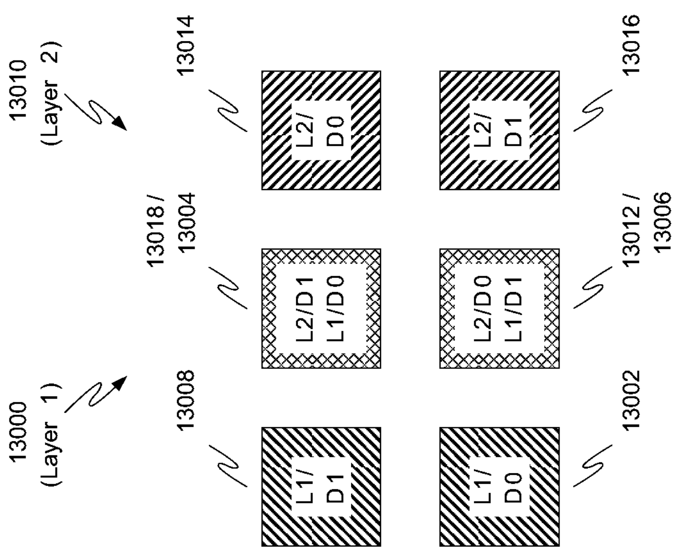
Figure 130D:
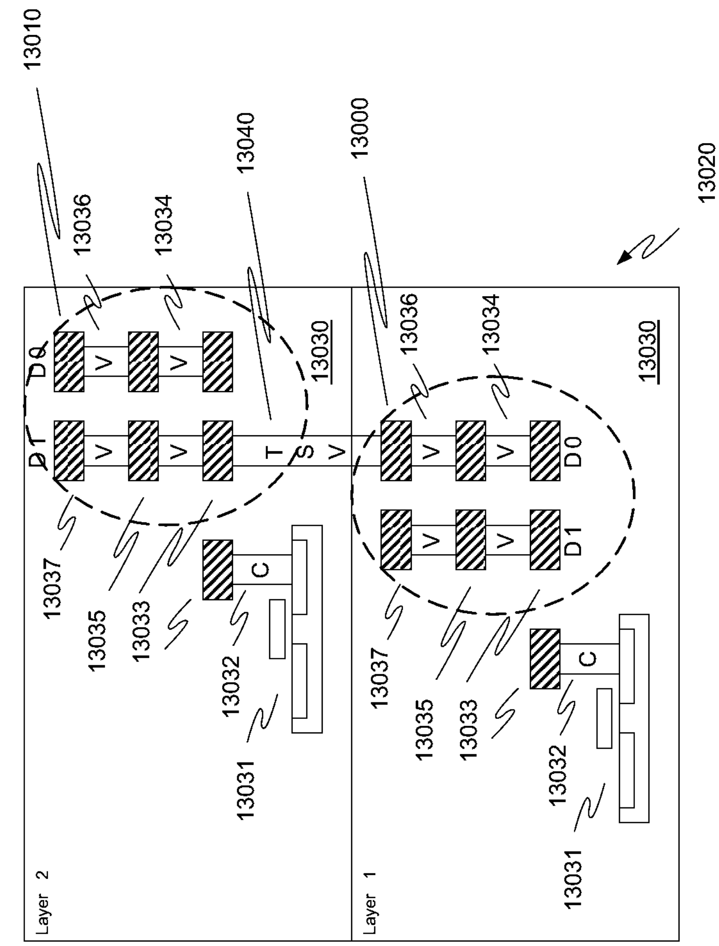
Figure 131A:
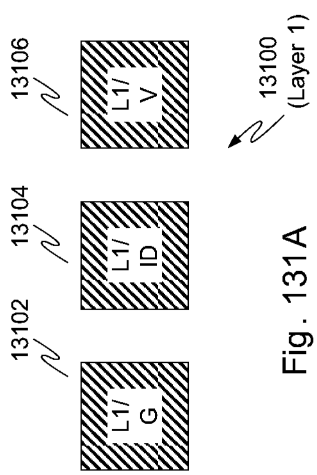
Figure 131B:
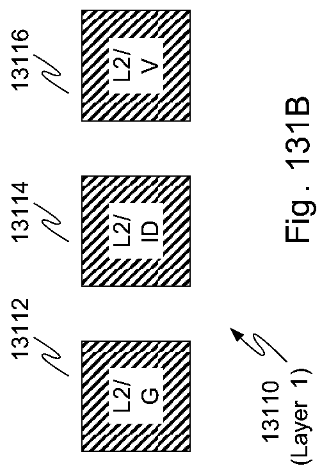
Figure 131C:
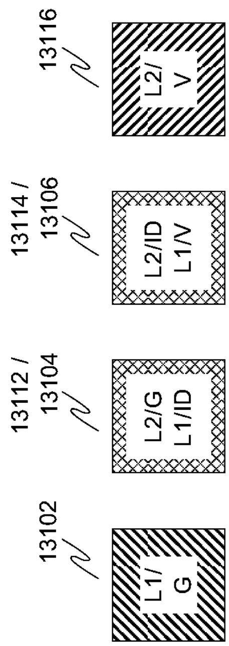
Figure 132A:
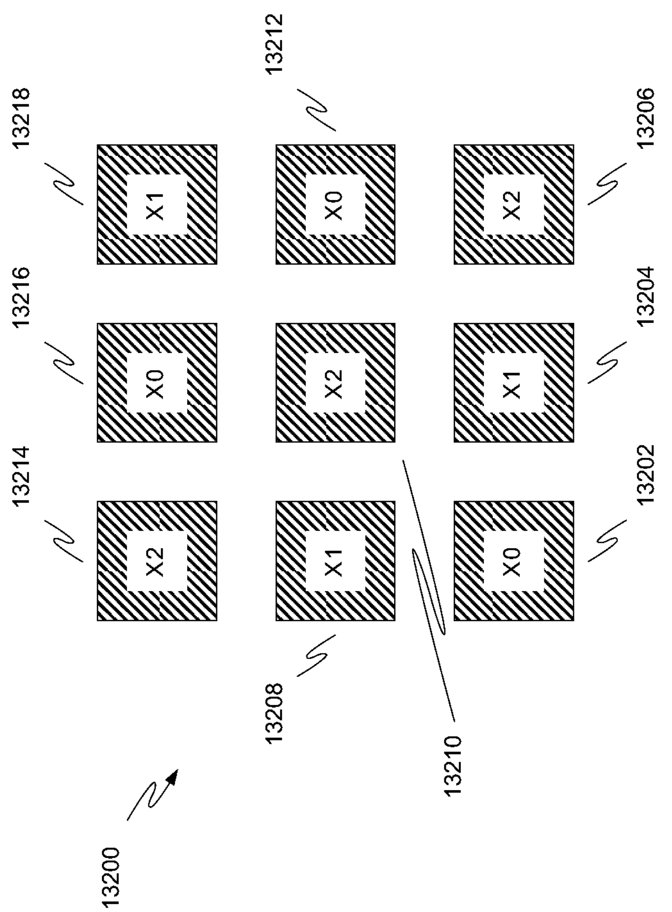
Figure 132B:
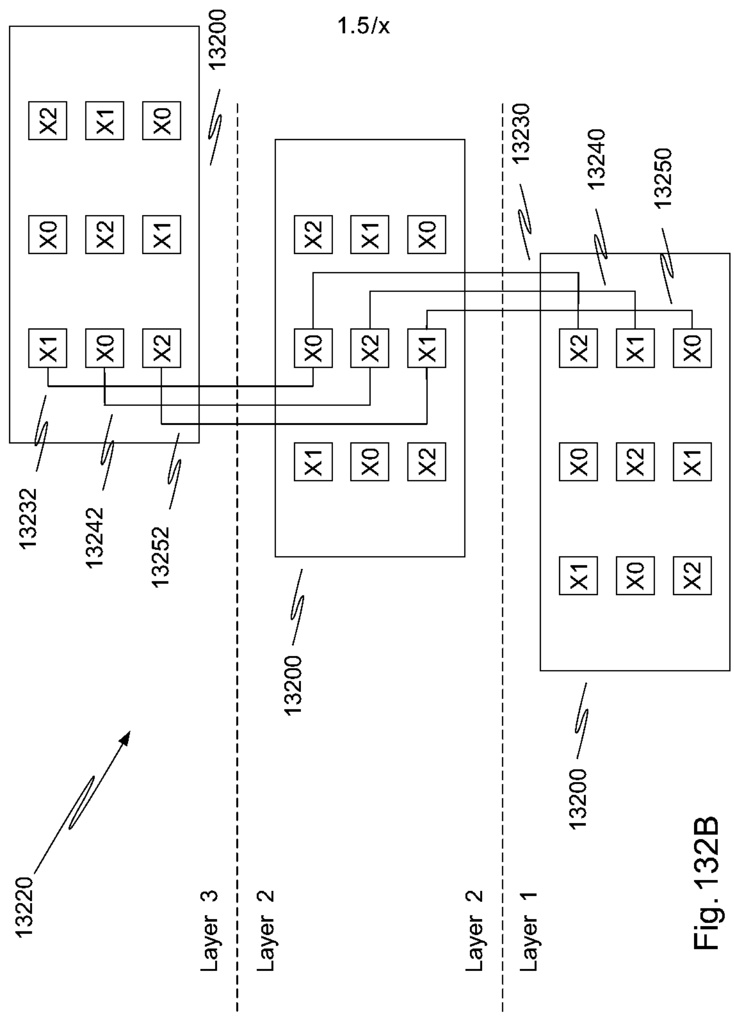
Figure 136:
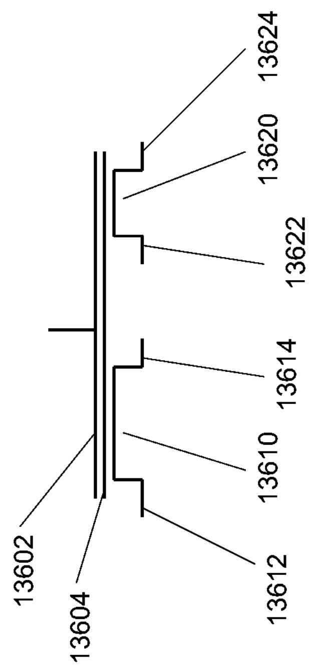

FIG. 94 A-C are drawing illustrations of an advanced TSV multi-connections flow;

FIG. 95 A-J are drawing illustrations of formation of CMOS recessed channel array transistors;

FIG. 96 A-J are drawing illustrations of the formation of a junction-less transistor;

FIG. 97 is a drawing illustration of the basics of floating body DRAM;

FIG. 98 A-H are drawing illustrations of the formation of a floating body DRAM transistor;

FIG. 99 A-M are drawing illustrations of the formation of a floating body DRAM transistor;

FIG. 100 A-L are drawing illustrations of the formation of a floating body DRAM transistor;

FIG. 101 A-K are drawing illustrations of the formation of a resistive memory transistor;

FIG. 102 A-L are drawing illustrations of the formation of a resistive memory transistor;

FIG. 103 A-M are drawing illustrations of the formation of a resistive memory transistor;

FIG. 104 A-F are drawing illustrations of the formation of a resistive memory transistor;

FIG. 105 A-G are drawing illustrations of the formation of a charge trap memory transistor;

FIG. 106 A-G are drawing illustrations of the formation of a charge trap memory transistor;

FIG. 107 A-G are drawing illustrations of the formation of a floating gate memory transistor;

FIG. 108 A-H are drawing illustrations of the formation of a floating gate memory transistor;

FIG. 109 A-K are drawing illustrations of the formation of a resistive memory transistor;

FIG. 110 A-J are drawing illustrations of the formation of a resistive memory transistor with periphery on top;

FIG. 111A-D are exemplary drawing illustrations of a generalized layer transfer process flow with alignment windows;

FIG. 112 is a drawing illustration of a heat spreader in a 3D IC;

FIG. 113 A-B are drawing illustrations of an integrated heat removal configuration for 3D ICs;

FIG. 114 is a drawing illustration of a field repairable 3D IC;

FIG. 115 is a drawing illustration of a Triple Modular Redundancy 3D IC;

FIG. 116 is a drawing illustration of a set scan architecture of the prior art;

FIG. 117 is a drawing illustration of a boundary scan architecture of the prior art;

FIG. 118 is a drawing illustration of a BIST architecture of the prior art;

FIG. 119 is a drawing illustration of a second field repairable 3D IC;

FIG. 120 is a drawing illustration of a scan flip-flop suitable for use with the 3D IC of FIG. 119;

FIG. 121A is a drawing illustration of a third field repairable 3D IC;

FIG. 121B is a drawing illustration of additional aspects of the field repairable 3D IC of FIG. 121A;

FIG. 122 is a drawing illustration of a fourth field repairable 3D IC;

FIG. 123 is a drawing illustration of a fifth field repairable 3D IC;

FIG. 124 is a drawing illustration of a sixth field repairable 3D IC;

FIG. 125A is a drawing illustration of a seventh field repairable 3D IC;

FIG. 125B is a drawing illustration of additional aspects of the field repairable 3D IC of FIG. 125A;

FIG. 126 is a drawing illustration of an eighth field repairable 3D IC;

FIG. 127 is a drawing illustration of a second Triple Modular Redundancy 3D IC;

FIG. 128 is a drawing illustration of a third Triple Modular Redundancy 3D IC;

FIG. 129 is a drawing illustration of a fourth Triple Modular Redundancy 3D IC;

FIG. 130A is a drawing illustration of a first via metal overlap pattern;

FIG. 130B is a drawing illustration of a second via metal overlap pattern;

FIG. 130C is a drawing illustration of the alignment of the via metal overlap patterns of FIGS. 130A and 130B in a 3D IC;

FIG. 130D is a drawing illustration of a side view of the structure of FIG. 130C;

FIG. 131A is a drawing illustration of a third via metal overlap pattern;

FIG. 131B is a drawing illustration of a fourth via metal overlap pattern;

FIG. 131C is a drawing illustration of the alignment of the via metal overlap patterns of FIGS. 131A and 131B in a 3D IC;

FIG. 132A is a drawing illustration of a fifth via metal overlap pattern;

FIG. 132B is a drawing illustration of the alignment of three instances of the via metal overlap patterns of FIG. 132A in a 3D IC;

FIG. 133 A-I are exemplary drawing illustrations of formation of a recessed channel array transistor with source and drain silicide;

FIG. 134 A-F are drawing illustrations of a 3D IC FPGA process flow;

FIG. 135 A-D are drawing illustrations of an alternative 3D IC FPGA process flow;

FIG. 136 is a drawing illustration of an NVM FPGA configuration cell; and

FIG. 137 A-G are drawing illustrations of a 3D IC NVM FPGA configuration cell process flow.

DETAILED DESCRIPTION

Embodiments of the present invention are now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Figure 1:
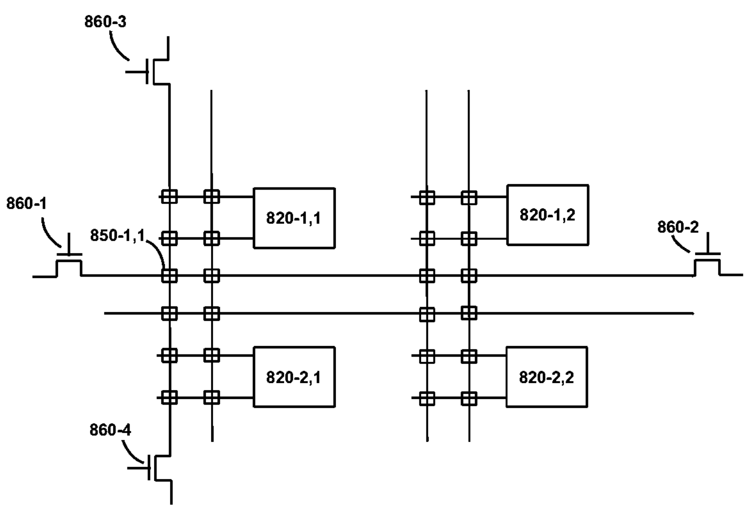
FIG. 1 is a circuit diagram illustration of a prior art.

FIG. 1 illustrates a circuit diagram illustration of a prior art, where, for example, 860-1 to 860-4 are the programming transistors to program antifuse 850-1,1.

Figure 81A:
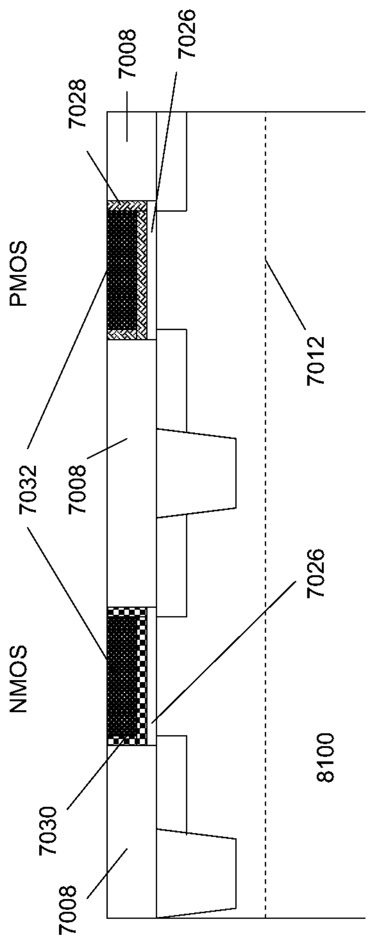
FIG. 81 A-E, 81E-1, 81F, 81F-1, 81F-2 are drawing illustrations of a formation of top planar transistors.
Figure 81B:
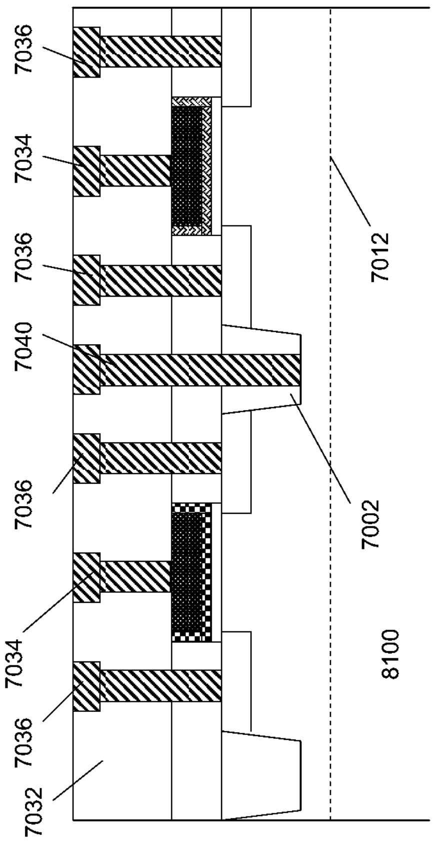
Figure 81C:
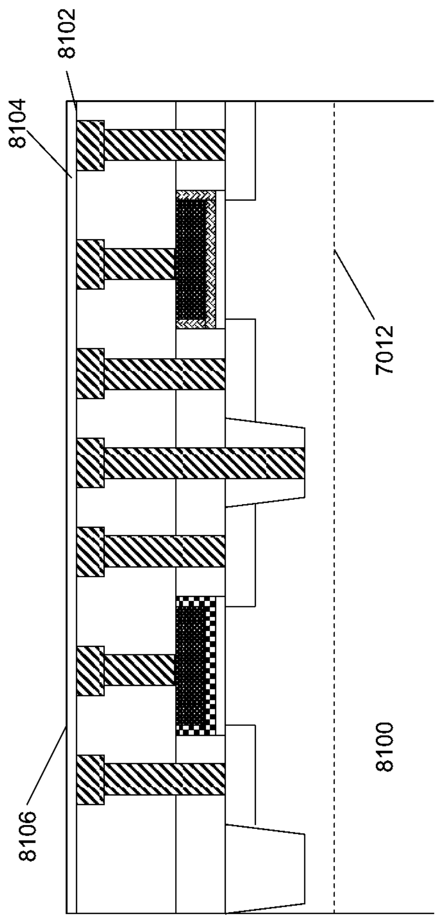
Figure 81D:
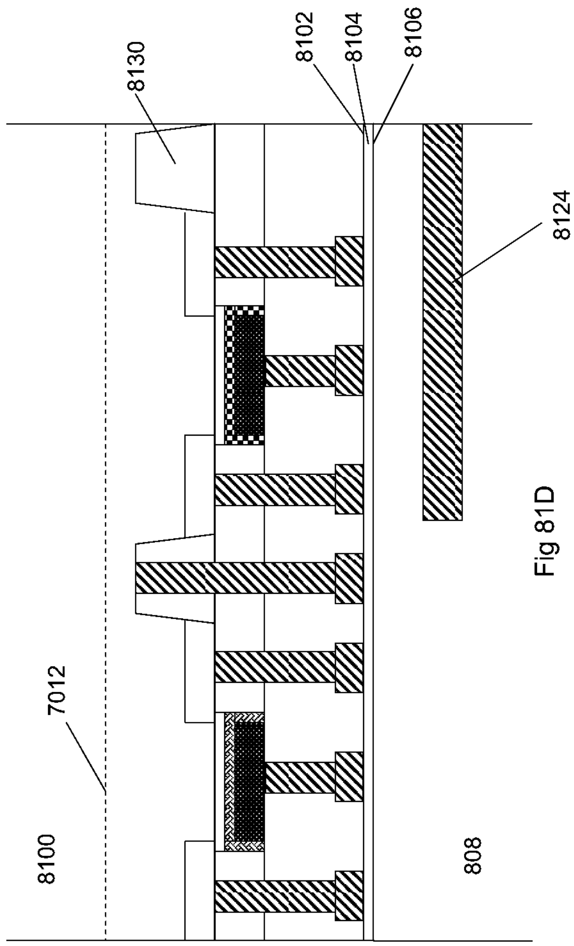
Figure 81E:
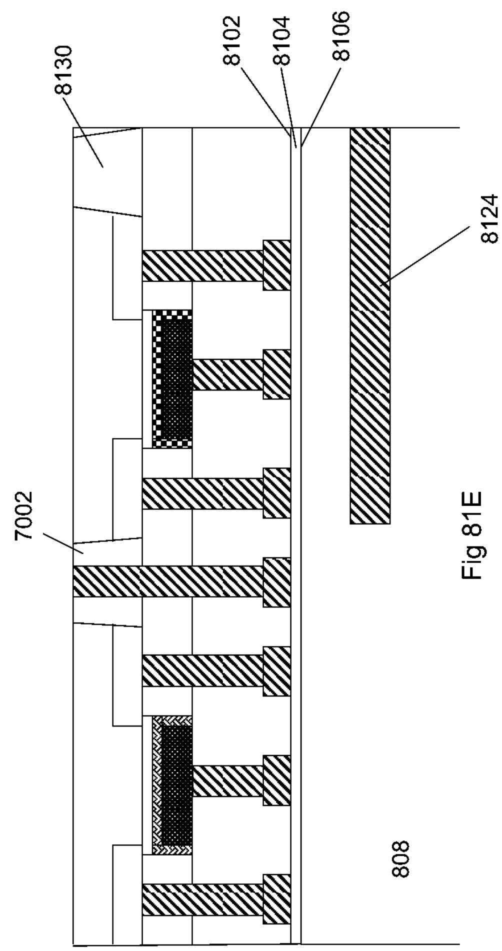
Figures 1, 81E:
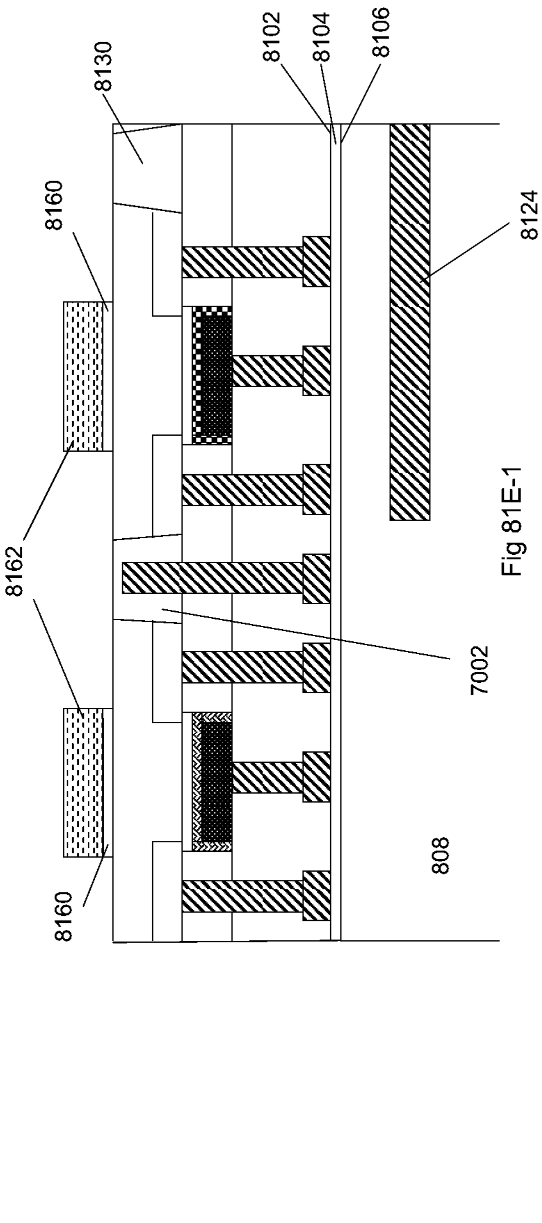
Figure 81F:
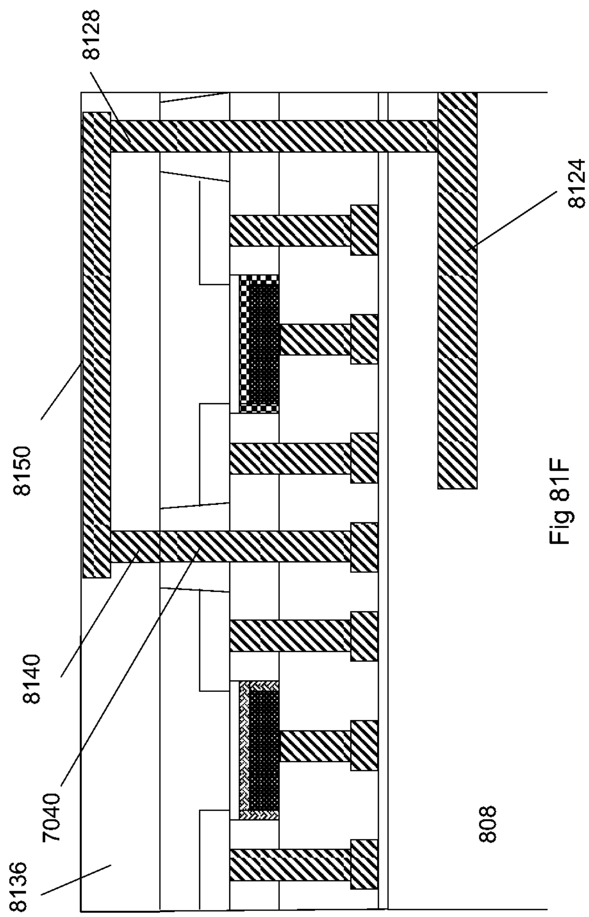
Figures 1, 81F:
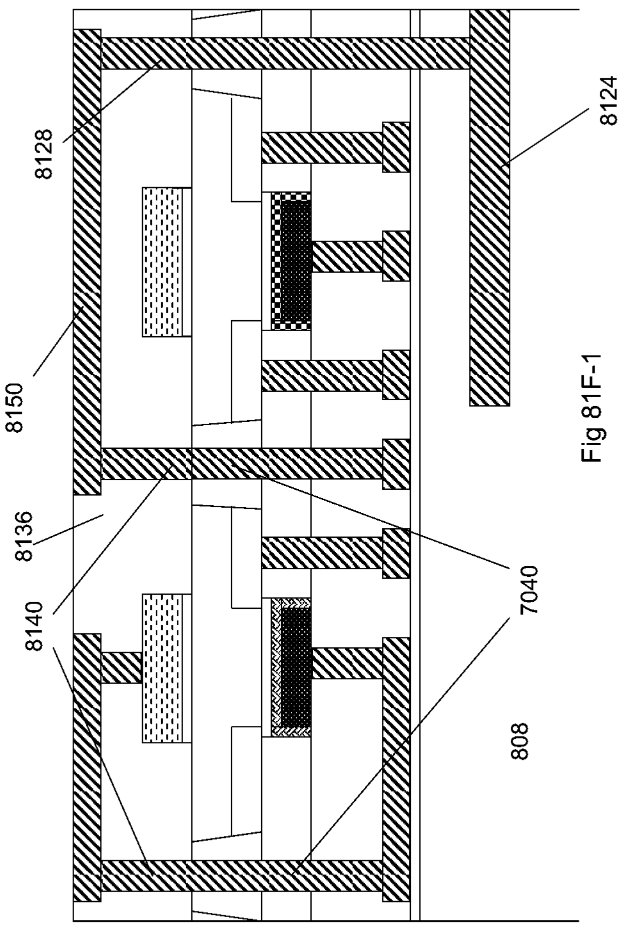
Figures 2, 81F:
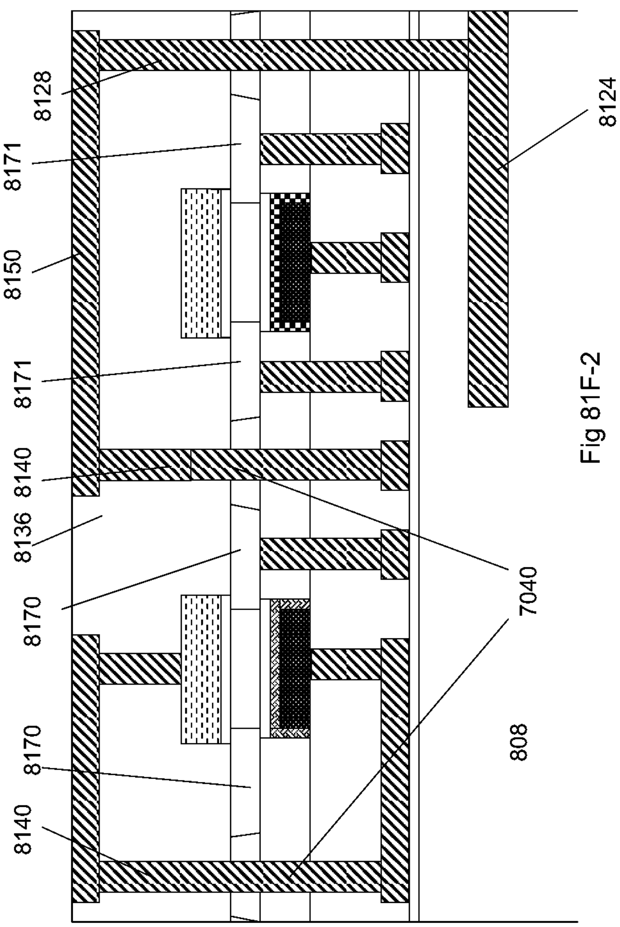
FIG. 2 is a cross-section illustration of a portion of a prior art represented by the circuit diagram of FIG. 1.

FIG. 2 is a cross-section illustration of a portion of a prior art represented by the circuit diagram of FIG. 1 showing the programming transistor 860-1 built as part of the silicon substrate.

Figure 3A:
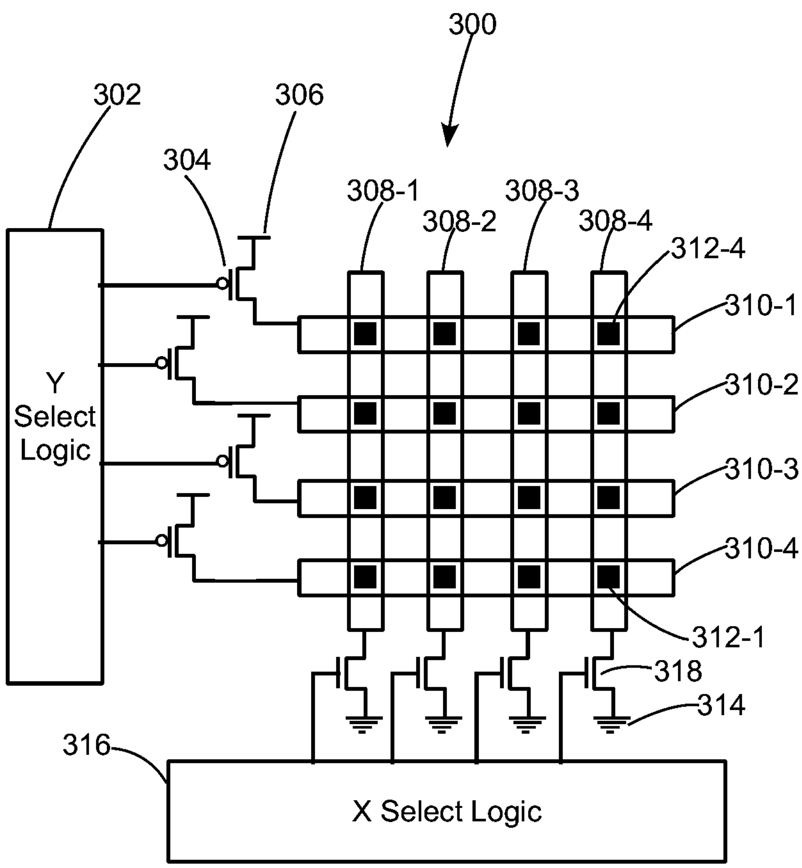
FIG. 3A is a drawing illustration of a programmable interconnect structure.

FIG. 3A is a drawing illustration of a programmable interconnect tile. 310-1 is one of 4 horizontal metal strips, which form a band of strips. The typical IC today has many metal layers. In a typical programmable device the first two or three metal layers will be used to construct the logic elements. On top of them metal 4 to metal 7 will be used to construct the interconnection of those logic elements. In an FPGA device the logic elements are programmable, as well as the interconnects between the logic elements. The configurable interconnect of the current invention is constructed from 4 metal layers or more. For example, metal 4 and 5 could be used for long strips and metal 6 and 7 would comprise short strips. Typically the strips forming the programmable interconnect have mostly the same length and are oriented in the same direction, forming a parallel band of strips as 310-1, 310-2, 310-3 and 310-4. Typically one band will comprise 10 to 40 strips. Typically the strips of the following layer will be oriented perpendicularly as illustrated in FIG. 3A, wherein strips 310 are of metal 6 and strips 308 are of metal 7. In this example the dielectric between metal 6 and metal 7 comprises antifuse positions at the crossings between the strips of metal 6 and metal 7. Tile 300 comprises 16 such antifuses. 312-1 is the antifuse at the cross of strip 310-4 and 308-4. If activated, it will connect strip 310-4 with strip 308-4. FIG. 3A was made simplified, as the typical tile will comprise 10-40 strips in each layer and multiplicity of such tiles, which comprises the antifuse configurable interconnect structure.

304 is one of the Y programming transistors connected to strip 310-1. 318 is one of the X programming transistors connected to strip 308-4 and ground 314. 302 is the Y select logic which at the programming phase allows the selection of a Y programming transistor. 316 is the X select logic which at the programming phase allows the selection of an X programming transistor. Once 304 and 318 are selected the programming voltage 306 will be applied to strip 310-1 while strip 308-4 will be grounded causing the antifuse 312-4 to be activated.

Figure 3B:
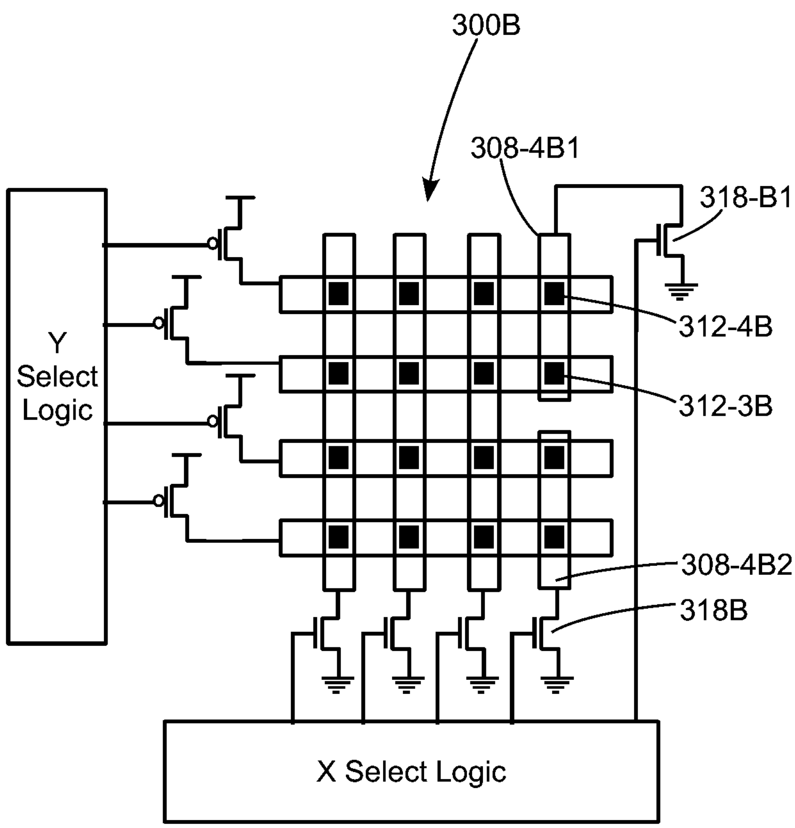
FIG. 3B is a drawing illustration of a programmable interconnect structure.

FIG. 3B is a drawing illustration of a programmable interconnect structure 300B. 300B is variation of 300A wherein some strips in the band are of a different length. Instead of strip 308-4 in this variation there are two shorter strips 308-4B1 and 308-4B2. This might be useful for bringing signals in or out of the programmable interconnect structure 300B in order to reduce the number of strips in the tile, that are dedicated to bringing signals in and out of the interconnect structure versus strips that are available to perform the routing. In such variation the programming circuit needs to be augmented to support the programming of antifuses 312-3B and 312-4B.

Unlike the prior art, various embodiments of the current invention suggest constructing the programming transistors not in the base silicon diffusion layer but rather above or below the antifuse configurable interconnect circuits. The programming voltage used to program the antifuse is typically significantly higher than the voltage used for the operational circuits of the device. This is part of the design of the antifuse structure so that the antifuse will not become accidentally activated. In addition, extra attention, design effort, and silicon resources might be needed to make sure that the programming phase will not damage the operating circuits. Accordingly the incorporation of the antifuse programming transistors in the silicon substrate may need attention and extra silicon area.

Unlike the operational transistors that are desired to operate as fast as possible and so to enable fast system performance, the programming circuits could operate relatively slowly. Accordingly, a thin film transistor for the programming circuits could provide the function and could reduce the silicon area.

Alternatively other type of transistors, such as Vacuum FET, bipolar, etc., could be used for the programming circuits and may be placed not in the base silicon but rather above or below the antifuse configurable interconnect.

Yet in another alternative the programming transistors and the programming circuits could be fabricated on SOI wafers which may then be bonded to the configurable logic wafer and connected to it by the use of through-silicon-via (TSV), or thru layer via (TLV). An advantage of using an SOI wafer for the antifuse programming function is that the high voltage transistors that could be built on it are very efficient and could be used for the programming circuit including support function such as the programming controller function. Yet as an additional variation, the programming circuits could be fabricated on an older process on SOI wafers to further reduce cost. Or some other process technology and/or wafer fab located anywhere in the world.

Also there are advanced technologies to deposit silicon or other semiconductors layers that could be integrated on top of the antifuse configurable interconnect for the construction of the antifuse programming circuit. As an example, a recent technology proposed the use of a plasma gun to spray semiconductor grade silicon to form semiconductor structures including, for example, a p-n junction. The sprayed silicon may be doped to the respective semiconductor type. In addition there are more and more techniques to use graphene and Carbon Nano Tubes (CNT) to perform a semiconductor function. For the purpose of this invention we will use the term “Thin-Film-Transistors” as general name for all those technologies, as well as any similar technologies, known or yet to be discovered.

A common objective is to reduce cost for high volume production without redesign and with minimal additional mask cost. The use of thin-film-transistors, for the programming transistors, enables a relatively simple and direct volume cost reduction. Instead of embedding antifuses in the isolation layer a custom mask could be used to define vias on substantially all the locations that used to have their respective antifuse activated. Accordingly the same connection between the strips that used to be programmed is now connected by fixed vias. This may allow saving the cost associated with the fabrication of the antifuse programming layers and their programming circuits. It should be noted that there might be differences between the antifuse resistance and the mask defined via resistance. A conventional way to handle it is by providing the simulation models for both options so the designer could validate that the design will work properly in both cases.

An additional objective for having the programming circuits above the antifuse layer is to achieve better circuit density. Many connections are needed to connect the programming transistors to their respective metal strips. If those connections are going upward they could reduce the circuit overhead by not blocking interconnection routes on the connection layers underneath.

While FIG. 3A shows an interconnection structure of 4×4 strips, the typical interconnection structure will have far more strips and in many cases more than 20×30. For a 20×30 tile there is needed about 20+30=50 programming transistors. The 20×30 tile area is about 20 hp×30 vp where 'hp' is the horizontal pitch and 'vp' is the vertical pitch. This may result in a relatively large area for the programming transistor of about 12 hp×vp (20 hp×30 vp/50=12hp×vp). Additionally, the area available for each connection between the programming layer and the programmable interconnection fabric needs to be handled. Accordingly, one or two redistribution layers might be needed in order to redistribute the connection within the available area and then bring those connections down, preferably aligned so to create minimum blockage as they are routed to the underlying strip 310 of the programmable interconnection structure.

Figure 4A:
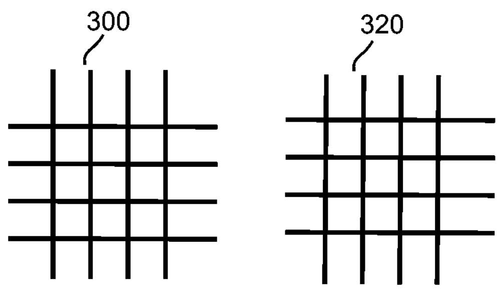
FIG. 4A is a drawing illustration of a programmable interconnect tile.
Figure 4B:
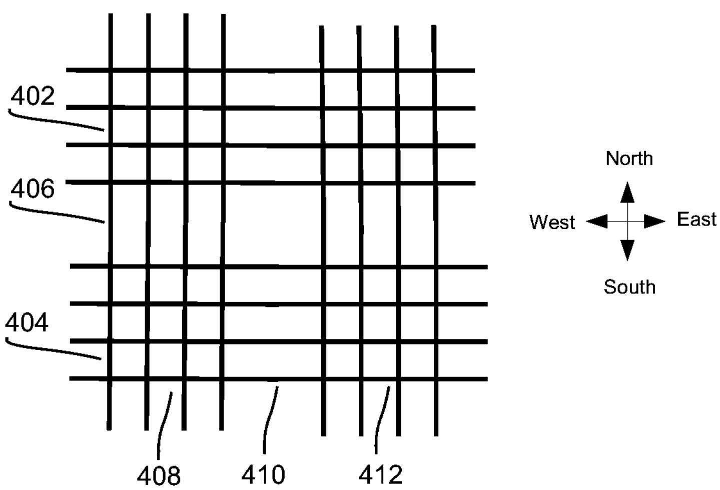
FIG. 4B is a drawing illustration of a programmable interconnect of 2×2 tiles.

FIG. 4A is a drawing illustration of a programmable interconnect tile 300 and another programmable interface tile 320. As a higher silicon density is achieved it becomes desirable to construct the configurable interconnect in the most compact fashion. FIG. 4B is a drawing illustration of a programmable interconnect of 2×2 tiles. It comprises checkerboard style of tiles 300 and tiles 320 which is a tile 300 rotated by 90 degrees. For a signal to travel South to North, south to north strips 402 and 404 need to be connected with antifuses such as 406. 406 and 410 are antifuses that are positioned at the end of a strip such as 402, 404, 408, 412 to allow it to connect to another strip in the same direction. The signal traveling from South to North is alternating from metal 6 to metal 7. Once the direction needs to change, an antifuse such as 312-1 is used.

The configurable interconnection structure function may be used to interconnect the output of logic cells to the input of logic cells to construct the desired semi-custom logic. The logic cells themselves are constructed by utilizing the first few metal layers to connect transistors that are built in the silicon substrate. Usually the metal 1 layer and metal 2 layer are used for the construction of the logic cells. Sometimes it is effective to also use metal 3 or a part of it.

Figure 5A:
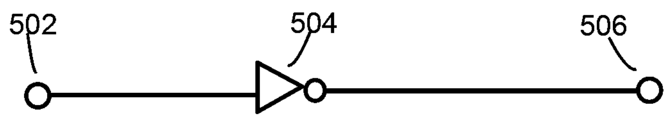
FIG. 5A is a drawing illustration of an inverter logic cell.

FIG. 5A is a drawing illustration of inverter 504 with an input 502 and an output 506. An inverter is the simplest logic cell. The input 502 and the output 506 might be connected to strips in the configurable interconnection structure.

Figure 5B:
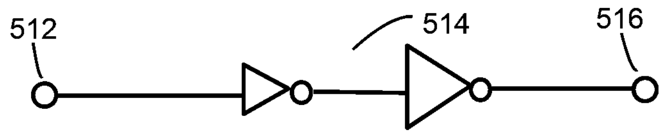
FIG. 5B is a drawing illustration of a buffer logic cell.

FIG. 5B is a drawing illustration of a buffer 514 with an input 512 and an output 516. The input 512 and the output 516 might be connected to strips in the configurable interconnection structure.

Figure 5C:
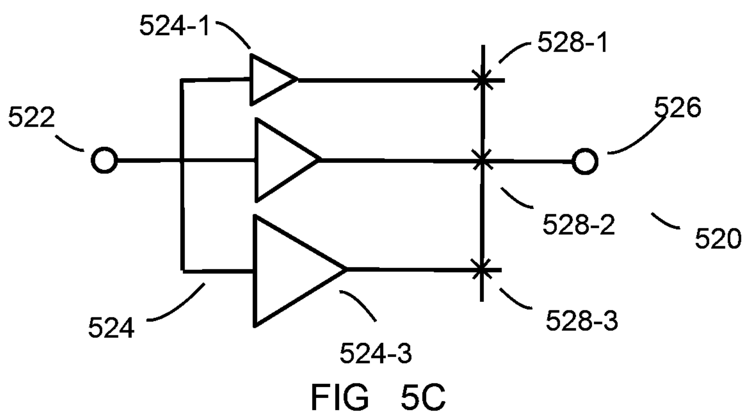
FIG. 5C is a drawing illustration of a configurable strength buffer logic cell.

FIG. 5C is a drawing illustration of a configurable strength buffer 524 with an input 522 and an output 526. The input 522 and the output 526 might be connected to strips in the configurable interconnection structure. 524 is configurable by means of antifuses 528-1, 528-2 and 528-3 constructing an antifuse configurable drive cell.

Figure 5D:
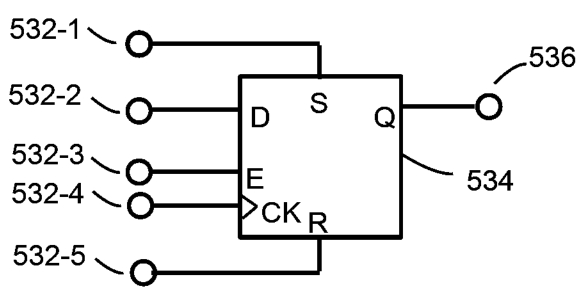
FIG. 5D is a drawing illustration of a D-Flip Flop logic cell.

FIG. 5D is a drawing illustration of D-Flip Flop 534 with inputs 532-2, and output 536 with control inputs 532-1, 532-3, 532-4 and 532-5. The control signals could be connected to the configurable interconnects or to local or global control signals.

Figure 6:
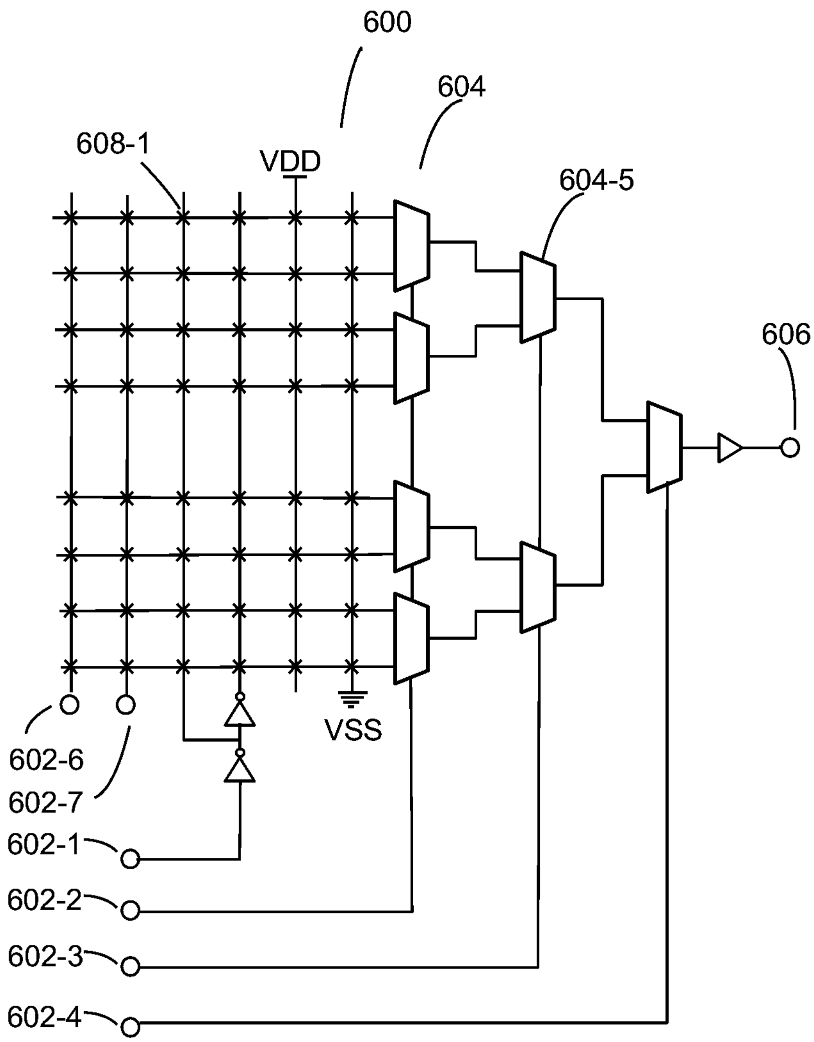
FIG. 6 is a drawing illustration of a LUT 4 logic cell.

FIG. 6 is a drawing illustration of a LUT 4. LUT4 604 is a well-known logic element in the FPGA art called a 16 bit Look-Up-Table or in short LUT4. It has 4 inputs 602-1, 602-2, 602-3 and 602-4. It has an output 606. In general a LUT4 can be programmed to perform any logic function of 4 inputs or less. The LUT function of FIG. 6 may be implemented by 32 antifuses such as 608-1. 604-5 is a two to one multiplexer. The common way to implement a LUT4 in FPGA is by using 16 SRAM bit-cells and 15 multiplexers. The illustration of FIG. 6 demonstrates an antifuse configurable look-up-table implementation of a LUT4 by 32 antifuses and 7 multiplexers. The programmable cell of FIG. 6 may comprise additional inputs 602-6, 602-7 with additional 8 antifuse for each input to allow some functionality in addition to just LUT4.

Figure 6A:
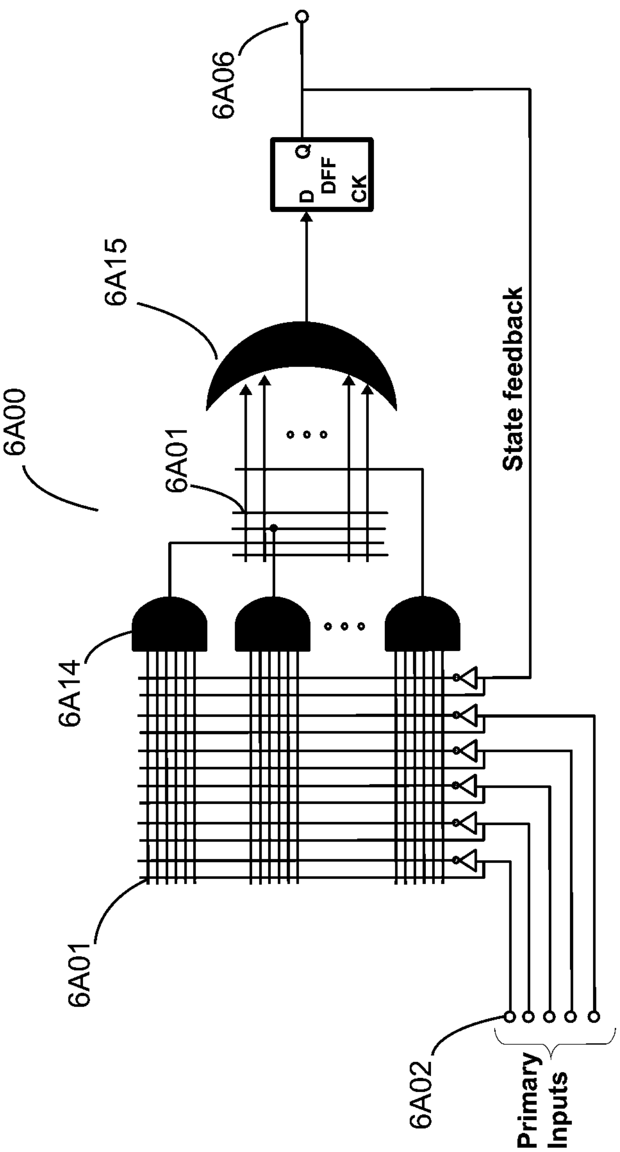
FIG. 6A is a drawing illustration of a PLA logic cell.

FIG. 6A is a drawing illustration of a PLA logic cell 6A00. This used to be the most popular programmable logic primitive until LUT logic took the leadership. Other acronyms used for this type of logic are PLD and PAL. 6A01 is one of the antifuses that enables the selection of the signal fed to the multi-input AND 6A14. In this drawing any cross between vertical line and horizontal line comprises an antifuse to allow the connection to be made according to the desired end function. The large AND cell 6A14 constructs the product term by performing the AND function on the selection of inputs 6A02 or their inverted replicas. A multi-input OR 6A15 performs the OR function on a selection of those product terms to construct an output 6A06. FIG. 6A illustrates an antifuse configurable PLA logic.

The logic cells presented in FIG. 5, FIG. 6 and FIG. 6A are just representatives. There exist many options for construction of programmable logic fabric including additional logic cells such as AND, MUX and many others, and variations on those cells. Also, in the construction of the logic fabric there might be variation with respect to which of their inputs and outputs are connected by the configurable interconnect fabric and which are connected directly in a non-configurable way.

Figure 7:
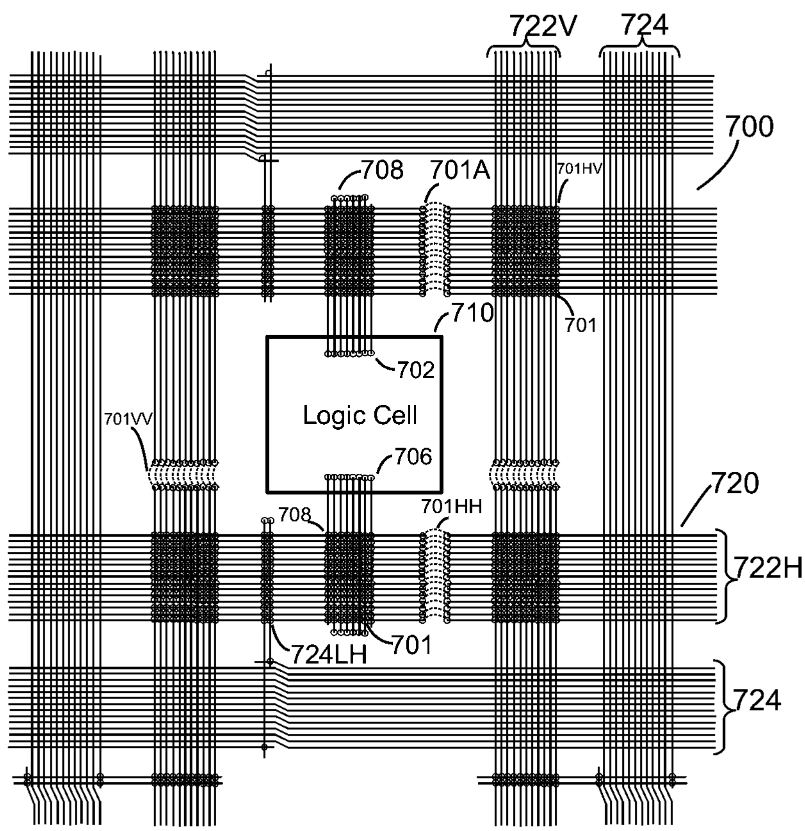
FIG. 7 is a drawing illustration of a programmable cell.

FIG. 7 is a drawing illustration of a programmable cell 700. By tiling such cells a programmable fabric is constructed. The tiling could be of the same cell being repeated over and over to form a homogenous fabric. Alternatively, a blend of different cells could be tiled for heterogeneous fabric. The logic cell 700 could be any of those presented in FIGS. 5 and 6, a mix and match of them or other primitives as discussed before. The logic cell 710 inputs 702 and output 706 are connected to the configurable interconnection fabric 720 with input and output strips 708 with associated antifuses 701. The short interconnects 722 are comprising metal strips that are the length of the tile, they comprise horizontal strips 722H, on one metal layer and vertical strips 722V on another layer, with antifuse 701HV in the cross between them, to allow selectively connecting horizontal strip to vertical strip. The connection of a horizontal strip to another horizontal strip is with antifuse 701HH that functions like antifuse 410 of FIG. 4. The connection of a vertical strip to another vertical strip is with antifuse 701VV that functions like fuse 406 of FIG. 4. The long horizontal strips 724 are used to route signals that travel a longer distance, usually the length of 8 or more tiles. Usually one strip of the long bundle will have a selective connection by antifuse 724LH to the short strips, and similarly, for the vertical long strips 724. FIG. 7 illustrates the programmable cell 700 as a two dimensional illustration. In real life 700 is a three dimensional construct where the logic cell 710 utilizes the base silicon with Metal 1, Metal 2, and sometimes Metal 3. The programmable interconnect fabric including the associated antifuses will be constructed on top of it.

Figure 8:
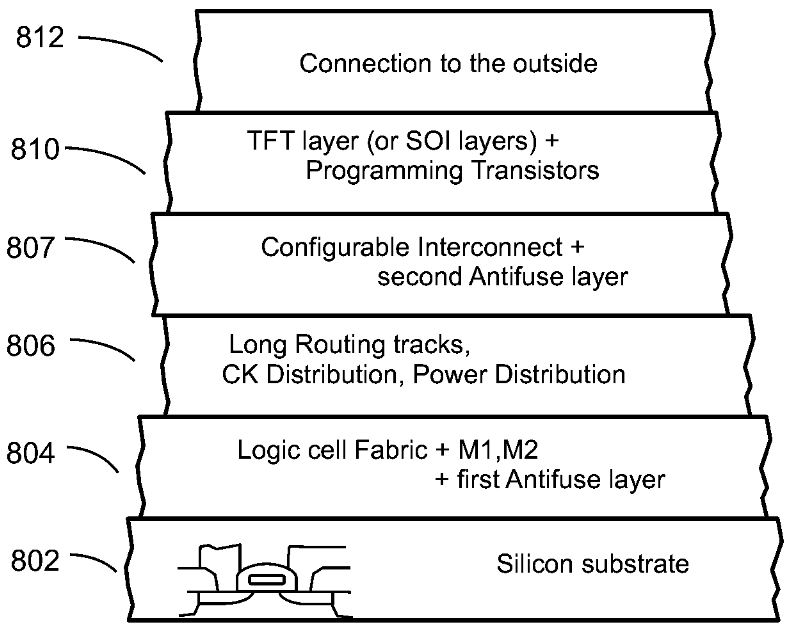
FIG. 8 is a drawing illustration of a programmable device layers structure.

FIG. 8 is a drawing illustration of a programmable device layers structure according to an alternative of the current invention. In this alternative there are two layers comprising antifuses. The first is designated to configure the logic terrain and, in some cases, to also configure the logic clock distribution. The first antifuse layer could also be used to manage some of the power distribution to save power by not providing power to unused circuits. This layer could also be used to connect some of the long routing tracks and/or connections to the inputs and outputs of the logic cells.

The device fabrication of the example shown in FIG. 8 starts with the semiconductor substrate 802 comprising the transistors used for the logic cells and also the first antifuse layer programming transistors. Then comes layers 804 comprising Metal 1, dielectric, Metal 2, and sometimes Metal 3. These layers are used to construct the logic cells and often I/O and other analog cells. In this alternative of the current invention a plurality of first antifuses are incorporated in the isolation layer between metal 1 and metal 2 or in the isolation layer between metal 2 and metal 3 and their programming transistors could be embedded in the silicon substrate 802 being underneath the first antifuses. These first antifuses could be used to program logic cells such as 520, 600 and 700 and to connect individual cells to construct larger logic functions. These first antifuses could also be used to configure the logic clock distribution. The first antifuse layer could also be used to manage some of the power distribution to save power by not providing power to unused circuits. This layer could also be used to connect some of the long routing tracks and/or one or more connections to the inputs and outputs of the cells.

The following few layers 806 could comprise long interconnection tracks for power distribution and clock networks, or a portion of these, in addition to what was fabricated in the first few layers 804.

The following few layers 807 could comprise the antifuse configurable interconnection fabric. It might be called the short interconnection fabric, too. If metal 6 and metal 7 are used for the strips of this configurable interconnection fabric then the second antifuse may be embedded in the dielectric layer between metal 6 and metal 7.

The programming transistors and the other parts of the programming circuit could be fabricated afterward and be on top of the configurable interconnection fabric 810. The programming element could be a thin film transistor or other alternatives for over oxide transistors as was mentioned previously. In such case the antifuse programming transistors are placed over the antifuse layer, which may thereby enable the configurable interconnect 808 or 804. It should be noted that in some cases it might be useful to construct part of the control logic for the second antifuse programming circuits, in the base layers 802 and 804.

The final step is the connection to the outside 812. These could be pads for wire bonding, soldering balls for flip chip, optical, or other connection structures such as those for TSV.

In another alternative of the current invention the antifuse programmable interconnect structure could be designed for multiple use. The same structure could be used as a part of the interconnection fabric, or as a part of the PLA logic cell, or as part of a Read Only Memory (ROM) function. In an FPGA product it might be desirable to have an element that could be used for multiple purposes. Having resources that could be used for multiple functions could increase the utility of the FPGA device.

Figure 8A:
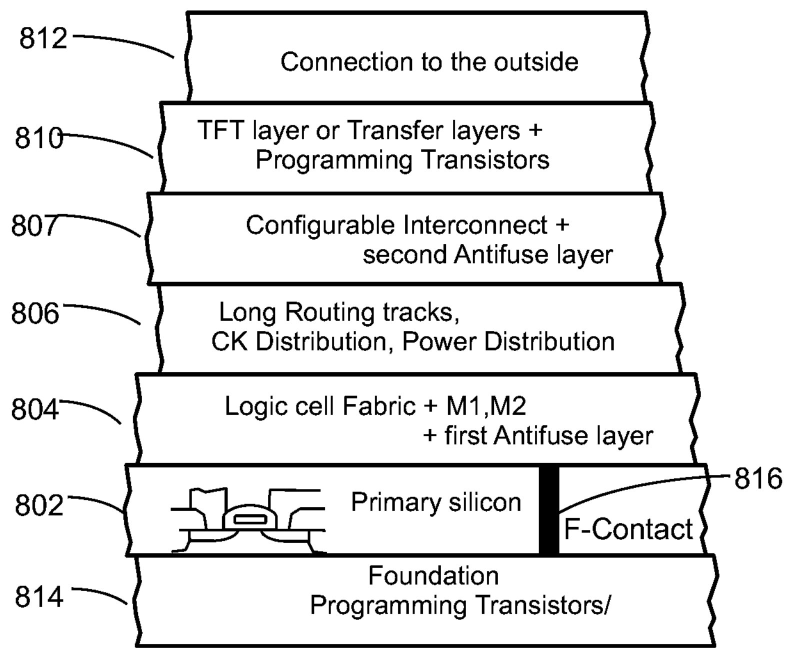
FIG. 8A is a drawing illustration of a programmable device layers structure.

FIG. 8A is a drawing illustration of a programmable device layers structure according to another alternative of the current invention. In this alternative there is additional circuit 814 connected by contact connection 816 to the first antifuse layer 804. This underlying device is providing the programming transistor for the first antifuse layer 804. In this way, the programmable device substrate diffusion layer 816 does not suffer the cost penalty of the programming transistors for the first antifuse layer 804. Accordingly the programming connection of the first antifuse layer 804 will be directed downward to connect to the underlying programming device 814 while the programming connection to the second antifuse layer 807 will be directed upward to connect to the programming circuits 810. This could provide less congestion of the circuit internal interconnection routes.

The reference 808 in subsequent figures can be any one of a vast number of combinations of possible preprocessed wafers or layers containing many combinations of transfer layers that fall within the scope of the invention. The term "preprocessed wafer or layer" may be generic and reference number 808 when used in a drawing figure to illustrate an embodiment of the current invention may represent many different preprocessed wafer or layer types including but not limited to underlying prefabricated layers, a lower layer interconnect wiring, a base layer, a substrate layer, a processed house wafer, an acceptor wafer, a logic house wafer, an acceptor wafer house, an acceptor substrate, target wafer, preprocessed circuitry, a preprocessed circuitry acceptor wafer, a base wafer layer, a lower layer, an underlying main wafer, a foundation layer, an attic layer, or a house wafer.

Figure 8B:
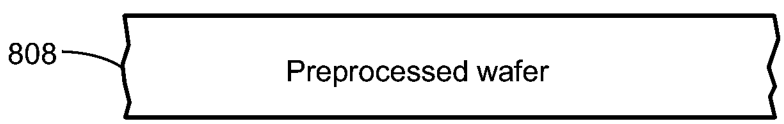
FIG. 8B-I are drawing illustrations of the preprocessed wafers and layers and generalized layer transfer.

FIG. 8B is a drawing illustration of a generalized preprocessed wafer or layer 808. The wafer or layer 808 may have preprocessed circuitry, such as, for example, logic circuitry, microprocessors, circuitry comprising transistors of various types, and other types of digital or analog circuitry including, but not limited to, the various embodiments described herein. Preprocessed wafer or layer 808 may have preprocessed metal interconnects and may be comprised of copper or aluminum. The preprocessed metal interconnects may be designed and prepared for layer transfer and electrical coupling from preprocessed wafer or layer 808 to the layer or layers to be transferred.

Figure 8C:
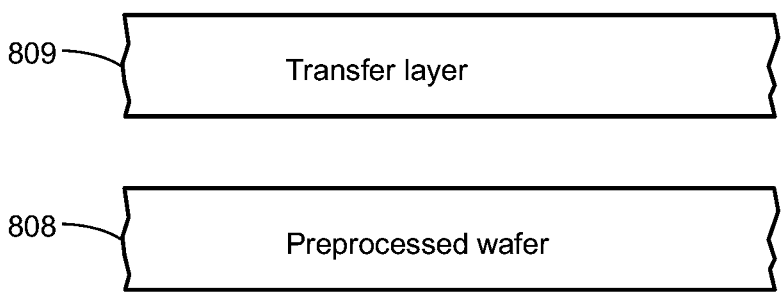

FIG. 8C is a drawing illustration of a generalized transfer layer 809 prior to being attached to preprocessed wafer or layer 808. Transfer layer 809 may be attached to a carrier wafer or substrate during layer transfer. Preprocessed wafer or layer 808 may be called a target wafer, acceptor substrate, or acceptor wafer. The acceptor wafer may have acceptor wafer metal connect pads or strips designed and prepared for electrical coupling to transfer layer 809. Transfer layer 809 may be attached to a carrier wafer or substrate during layer transfer. Transfer layer 809 may have metal interconnects designed and prepared for layer transfer and electrical coupling to preprocessed wafer or layer 808. Electrical coupling from transferred layer 809 to preprocessed wafer or layer 808 may utilize thru layer vias (TLVs). Transfer layer 809 may be comprised of single crystal silicon, or mono-crystalline silicon, or doped mono-crystalline layer or layers, or other semiconductor, metal, and insulator materials, layers; or multiple regions of single crystal silicon, or mono-crystalline silicon, or dope mono-crystalline silicon, or other semiconductor, metal, or insulator materials.

Figure 8D:
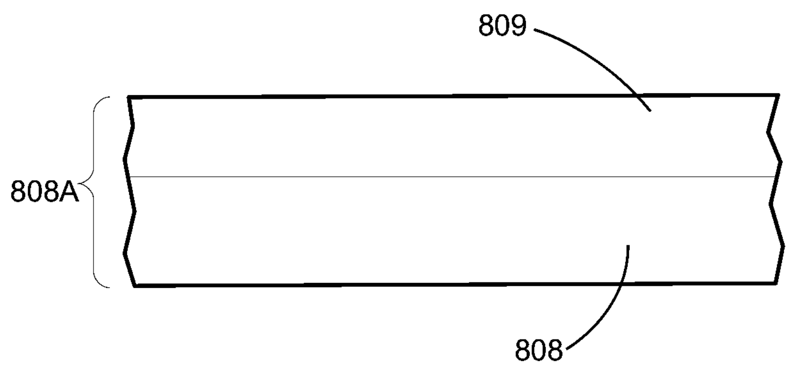

FIG. 8D is a drawing illustration of a preprocessed wafer or layer 808A created by the layer transfer of transfer layer 809 on top of preprocessed wafer or layer 808. The top of preprocessed wafer or layer 808A may be further processed with metal interconnects designed and prepared for layer transfer and electrical coupling from preprocessed wafer or layer 808A to the next layer or layers to be transferred.

Figure 8E:
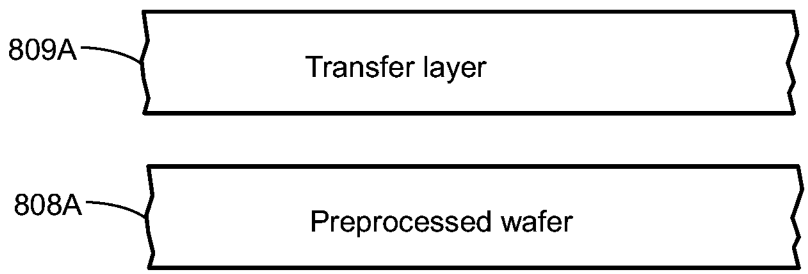

FIG. 8E is a drawing illustration of a generalized transfer layer 809A prior to being attached to preprocessed wafer or layer 808A. Transfer layer 809A may be attached to a carrier wafer or substrate during layer transfer. Transfer layer 809A may have metal interconnects designed and prepared for layer transfer and electrical coupling to preprocessed wafer or layer 808A.

Figure 8F:
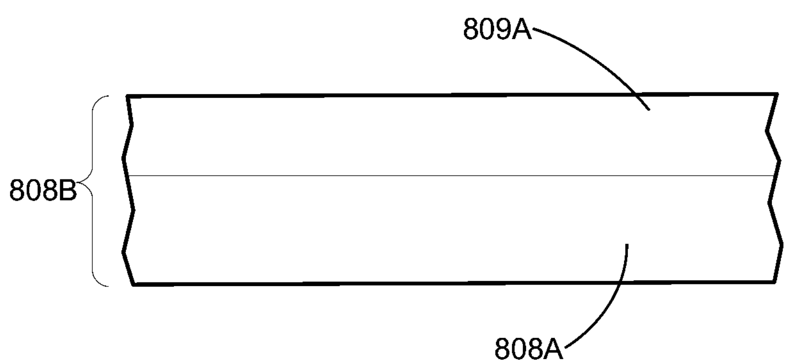

FIG. 8F is a drawing illustration of a preprocessed wafer or layer 808B created by the layer transfer of transfer layer 809A on top of preprocessed wafer or layer 808A. The top of preprocessed wafer or layer 808B may be further processed with metal interconnects designed and prepared for layer transfer and electrical coupling from preprocessed wafer or layer 808B to the next layer or layers to be transferred.

Figure 8G:
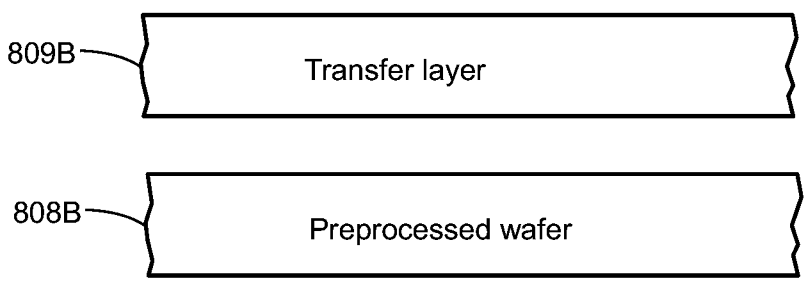

FIG. 8G is a drawing illustration of a generalized transfer layer 809B prior to being attached to preprocessed wafer or layer 808B. Transfer layer 809B may be attached to a carrier wafer or substrate during layer transfer. Transfer layer 809B may have metal interconnects designed and prepared for layer transfer and electrical coupling to preprocessed wafer or layer 808B.

Figure 8H:

FIG. 8H is a drawing illustration of preprocessed wafer layer 808C created by the layer transfer of transfer layer 809B on top of preprocessed wafer or layer 808B. The top of preprocessed wafer or layer 808C may be further processed with metal interconnect designed and prepared for layer transfer and electrical coupling from preprocessed wafer or layer 808C to the next layer or layers to be transferred.

Figure 8I:
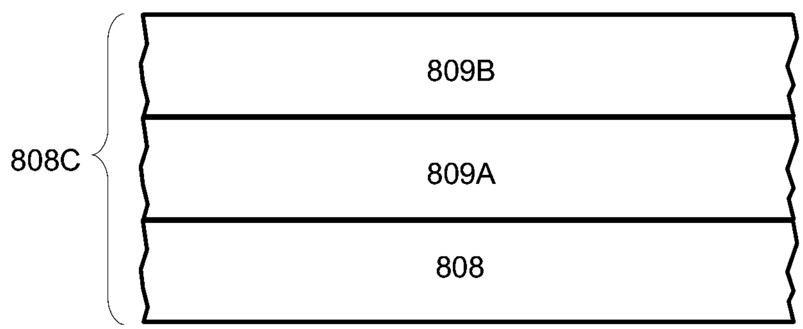

FIG. 8I is a drawing illustration of preprocessed wafer or layer 808C, a 3D IC stack, which may comprise transferred layers 809A and 809B on top of the original preprocessed wafer or layer 808. Transferred layers 809A and 809B and the original preprocessed wafer or layer 808 may comprise transistors of one or more types in one or more layers, metallization such as, for example, copper or aluminum in one or more layers, interconnections to and between layers above and below, and interconnections within the layer. The transistors may be of various types that may be different from layer to layer or within the same layer. The transistors may be in various organized patterns. The transistors may be in various pattern repeats or bands. The transistors may be in multiple layers involved in the transfer layer. The transistors may be junction-less transistors or recessed channel transistors. Transferred layers 809A and 809B and the original preprocessed wafer or layer 808 may further comprise semiconductor devices such as resistors and capacitors and inductors, one or more programmable interconnects, memory structures and devices, sensors, radio frequency devices, or optical interconnect with associated transceivers. The terms carrier wafer or carrier substrate may also be called holder wafer or holder substrate.

This layer transfer process can be repeated many times, thereby creating preprocessed wafers comprising many different transferred layers which, when combined, can then become preprocessed wafers or layers for future transfers. This layer transfer process may be sufficiently flexible that preprocessed wafers and transfer layers, if properly prepared, can be flipped over and processed on either side with further transfers in either direction as a matter of design choice.

Persons of ordinary skill in the art will appreciate that the illustrations in FIGS. 8 through 8I are exemplary only and are not drawn to scale. Such skilled persons will further appreciate that many variations are possible such as, for example, the preprocessed wafer or layer 808 may act as a base or substrate layer in a wafer transfer flow, or as a preprocessed or partially preprocessed circuitry acceptor wafer in a wafer transfer process flow. Many other modifications within the scope of the invention will suggest themselves to such skilled persons after reading this specification. Thus the invention is to be limited only by the appended claims.

An alternative technology for such underlying circuitry is to use the “SmartCut” process. The “SmartCut” process is a well understood technology used for fabrication of SOI wafers. The “SmartCut” process, together with wafer bonding technology, enables a “Layer Transfer” whereby a thin layer of a single or mono-crystalline silicon wafer is transferred from one wafer to another wafer. The “Layer Transfer” could be done at less than 400° C. and the resultant transferred layer could be even less than 100 nm thick. The process with some variations and under different names is commercially available by two companies, namely, Soitec (Crolles, France) and SiGen—Silicon Genesis Corporation (San Jose, Calif.). A room temperature wafer bonding process utilizing ion-beam preparation of the wafer surfaces in a vacuum has been recently demonstrated by Mitsubishi Heavy Industries Ltd., Tokyo, Japan. This process allows room temperature layer transfer.

Alternatively, other technology may also be used. For example, other technologies may be utilized for layer transfer as described in, for example, IBM’s layer transfer method shown at IEDM 2005 by A. W. Topol, et. al. The IBM’s layer transfer method employs a SOI technology and utilizes glass handle wafers. The donor circuit may be high-temperature processed on an SOI wafer, temporarily bonded to a borosilicate glass handle wafer, backside thinned by chemical mechanical polishing of the silicon and then the Buried Oxide (BOX) is selectively etched off. The now thinned donor wafer is subsequently aligned and low-temperature oxide-to-oxide bonded to the acceptor wafer topside. A low temperature release of the glass handle wafer from the thinned donor wafer is performed, and then thru bond via connections are made. Additionally, epitaxial liftoff (ELO) technology as shown by P. Demeester, et. al, of IMEC in Semiconductor Science Technology 1993 may be utilized for layer transfer. ELO makes use of the selective removal of a very thin sacrificial layer between the substrate and the layer structure to be transferred. The to-be-transferred layer of GaAs or silicon may be adhesively ‘rolled’ up on a cylinder or removed from the substrate by utilizing a flexible carrier, such as, for example, black wax, to bow up the to-be-transferred layer structure when the selective etch, such as, for example, diluted Hydrofluoric (HF) Acid, etches the exposed release layer, such as, for example, silicon oxide in SOI or AlAs. After liftoff, the transferred layer is then aligned and bonded to the desired acceptor substrate or wafer. The manufacturability of the ELO process for multilayer layer transfer use was recently improved by J. Yoon, et. al., of the University of Illinois at Urbana-Champaign as described in Nature May 20, 2010. Canon developed a layer transfer technology called ELTRAN—Epitaxial Layer TRANsfer from porous silicon. ELTRAN may be utilized. The Electrochemical Society Meeting abstract No. 438 from year 2000 and the JSAP International July 2001 paper show a seed wafer being anodized in an HF/ethanol solution to create pores in the top layer of silicon, the pores are treated with a low temperature oxidation and then high temperature hydrogen annealed to seal the pores. Epitaxial silicon may then be deposited on top of the porous silicon and then oxidized to form the SOI BOX. The seed wafer may be bonded to a handle wafer and the seed wafer may be split off by high pressure water directed at the porous silicon layer. The porous silicon may then be selectively etched off leaving a uniform silicon layer.

Figure 14:
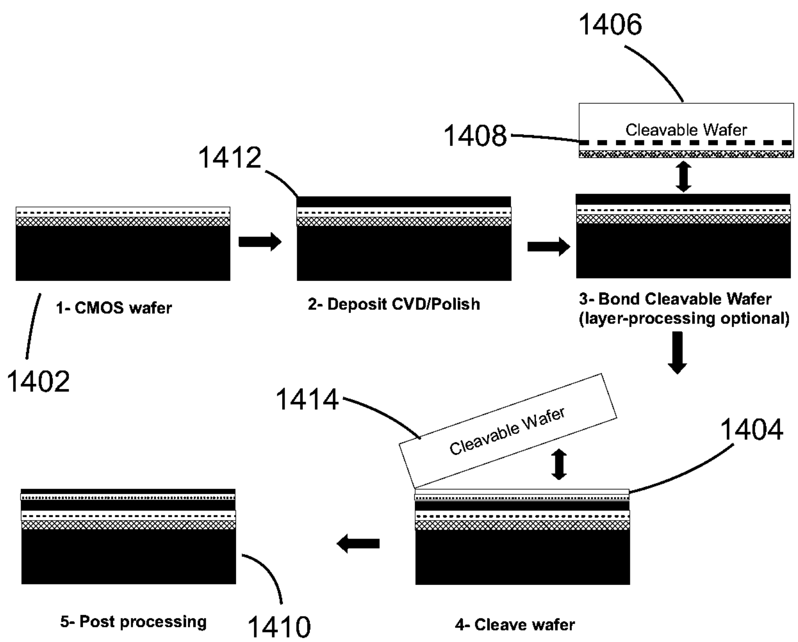
FIG. 14 is a drawing illustration of a layer transfer process flow.

FIG. 14 is a drawing illustration of a layer transfer process flow. In another alternative of the invention, “Layer-Transfer” is used for construction of the underlying circuitry 814. 1402 is a wafer that was processed to construct the underlying circuitry. The wafer 1402 could be of the most advanced process or more likely a few generations behind. It could comprise the programming circuits 814 and other useful structures and may be a preprocessed CMOS silicon wafer, or a partially processed CMOS, or other prepared silicon or semiconductor substrate. Wafer 1402 may also be called an acceptor substrate or a target wafer. An oxide layer 1412 is then deposited on top of the wafer 1402 and then is polished for better planarization and surface preparation. A donor wafer 1406 is then brought in to be bonded to 1402. The surfaces of both donor wafer 1406 and wafer 1402 may be pre-processed for low temperature bonding by various surface treatments, such as an RCA pre-clean that may comprise dilute ammonium hydroxide or hydrochloric acid, and may include plasma surface preparations to lower the bonding energy and enhance the wafer to wafer bond strength. The donor wafer 1406 is pre-prepared for "SmartCut" by an ion implant of an atomic species, such as H+ ions, at the desired depth to prepare the SmartCut line 1408. SmartCut line 1408 may also be called a layer transfer demarcation plane, shown as a dashed line. The SmartCut line 1408 or layer transfer demarcation plane may be formed before or after other processing on the donor wafer 1406. Donor wafer 1406 may be bonded to wafer 1402 by bringing the donor wafer 1406 surface in physical contact with the wafer 1402 surface, and then applying mechanical force and/or thermal annealing to strengthen the oxide to oxide bond. Alignment of the donor wafer 1406 with the wafer 1402 may be performed immediately prior to the wafer bonding. Acceptable bond strengths may be obtained with bonding thermal cycles that do not exceed approximately 400° C. After bonding the two wafers a SmartCut step is performed to cleave and remove the top portion 1414 of the donor wafer 1406 along the cut layer 1408. The cleaving may be accomplished by various applications of energy to the SmartCut line 1408, or layer transfer demarcation plane, such as a mechanical strike by a knife or jet of liquid or jet of air, or by local laser heating, or other suitable methods. The result is a 3D wafer 1410 which comprises wafer 1402 with an added layer 1404 of mono-crystalline silicon, or multiple layers of materials. Layer 1404 may be polished chemically and mechanically to provide a suitable surface for further processing. Layer 1404 could be quite thin at the range of 50-200 nm as desired. The described flow is called "layer transfer". Layer transfer is commonly utilized in the fabrication of SOI—Silicon On Insulator—wafers. For SOI wafers the upper surface is oxidized so that after "layer transfer" a buried oxide—BOX—provides isolation between the top thin mono-crystalline silicon layer and the bulk of the wafer. The use of an implanted atomic species, such as Hydrogen or Helium or a combination, to create a cleaving plane as described above may be referred to in this document as "ion-cut" and is the preferred and illustrated layer transfer method utilized.

Persons of ordinary skill in the art will appreciate that the illustrations in FIG. 14 are exemplary only and are not drawn to scale. Such skilled persons will further appreciate that many variations are possible such as, for example, a heavily doped (greater than 1e20 atoms/cm3) boron layer or silicon germanium (SiGe) layer may be utilized as an etch stop either within the ion-cut process flow, wherein the layer transfer demarcation plane may be placed within the etch stop layer or into the substrate material below, or the etch stop layers may be utilized without a implant cleave process and the donor wafer may be preferentially etched away until the etch stop layer is reached. Such skilled persons will further appreciate that the oxide layer within an SOI or GeOI donor wafer may serve as the etch stop layer. Many other modifications within the scope of the invention will suggest themselves to such skilled persons after reading this specification. Thus the invention is to be limited only by the appended claims.

Now that a "layer transfer" process is used to bond a thin mono-crystalline silicon layer 1404 on top of the preprocessed wafer 1402, a standard process could ensue to construct the rest of the desired circuits as is illustrated in FIG. 8A, starting with layer 802 on the transferred layer 1404. The lithography step will use alignment marks on wafer 1402 so the following circuits 802 and 816 and so forth could be properly connected to the underlying circuits 814. An aspect that should be accounted for is the high temperature that would be needed for the processing of circuits 802. The pre-processed circuits on wafer 1402 would need to withstand this high temperature needed for the activation of the semiconductor transistors 802 fabricated on the 1404 layer. Those circuits on wafer 1402 will comprise transistors and local interconnects of poly-crystalline silicon (polysilicon or poly) and some other type of interconnection that could withstand high temperature such as tungsten. A processed wafer that can withstand subsequent processing of transistors on top at high temperatures may be a called the "Foundation" or a foundation wafer, layer or circuitry. An advantage of using layer transfer for the construction of the underlying circuits is having the layer transferred 1404 be very thin which enables the through silicon via connections 816, or thru layer vias (TLVs), to have low aspect ratios and be more like normal contacts, which could be made very small and with minimum area penalty. The thin transferred layer also allows conventional direct thru-layer alignment techniques to be performed, thus increasing the density of silicon via connections 816.

Figure 15:
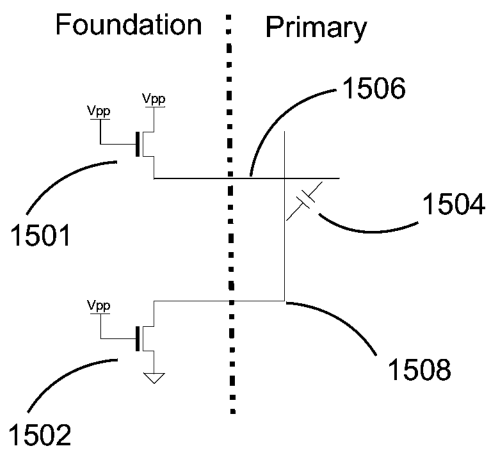
FIG. 15 is a drawing illustration of an underlying programming circuits.

FIG. 15 is a drawing illustration of an underlying programming circuit. Programming Transistors 1501 and 1502 are pre-fabricated on the foundation wafer 1402 and then the programmable logic circuits and the antifuse 1504 are built on the transferred layer 1404. The programming connections 1506, 1508 are connected to the programming transistors by contact holes through layer 1404 as illustrated in FIG. 8A by 816. The programming transistors are designed to withstand the relatively higher programming voltage for the antifuse 1504 programming.

Figure 16:
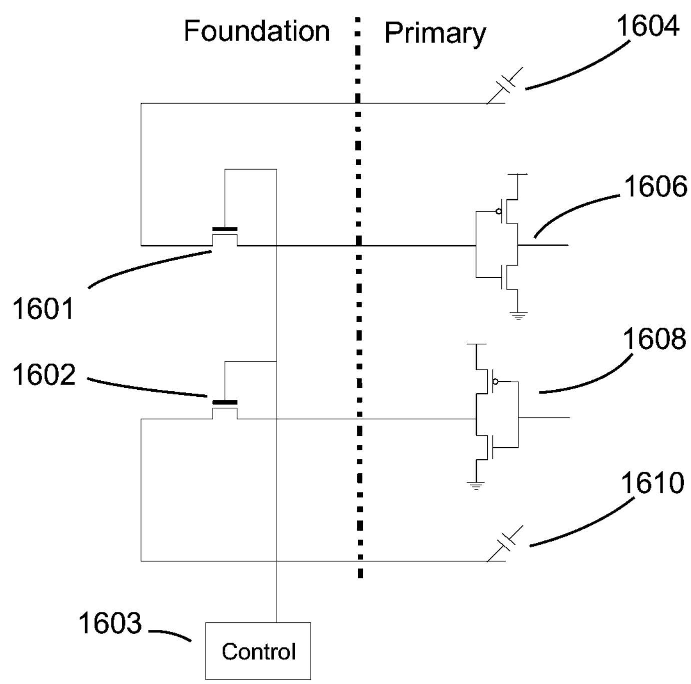
FIG. 16 is a drawing illustration of an underlying isolation transistors circuits.

FIG. 16 is a drawing illustration of an underlying isolation transistor circuit. The higher voltage used to program antifuses 1604 or 1610 might damage the logic transistors 1606, 1608. To protect the logic circuits, isolation transistors 1601, 1602, which are designed to withstand higher voltage, are used. The higher programming voltage is only used at the programming phase at which time the isolation transistors are turned off by the control circuit 1603. The underlying wafer 1402 could also be used to carry the isolation transistors. Having the relatively large programming transistors and isolation transistor on the foundation silicon 1402 allows far better use of the primary silicon 802 (1404). Usually the primary silicon will be built in an advanced process to provide high density and performance. The foundation silicon could be built in a less advanced process to reduce costs and support the higher voltage transistors. It could also be built with other than CMOS transistors such as Double Diffused Metal Oxide Semiconductor (DMOS) or bi-polar junction transistors when such is advantageous for the programming and the isolation function. In many cases there is a need to have protection diodes for the gate input that are called Antennas. Such protection diodes could be also effectively integrated in the foundation alongside the input related Isolation Transistors. On the other hand the isolation transistors 1601, 1602 would provide the protection for the antenna effect so no additional diodes would be needed.

An additional alternative embodiment of the invention is where the foundation layer 1402 is pre-processed to carry a plurality of back bias voltage generators. A known challenge in advanced semiconductor logic devices is die-to-die and within-a-die parameter variations. Various sites within the die might have different electrical characteristics due to dopant variations and such. The most critical of these parameters that affect the variation is the threshold voltage of the transistor. Threshold voltage variability across the die is mainly due to channel dopant, gate dielectric, and critical dimension variability. This variation becomes profound in sub 45 nm node devices. The usual implication is that the design should be done for the worst case, resulting in a quite significant performance penalty. Alternatively complete new designs of devices are being proposed to solve this variability problem with significant uncertainty in yield and cost. A possible solution is to use localized back bias to drive upward the performance of the worst zones and allow better overall performance with minimal additional power. The foundation-located back bias could also be used to minimize leakage due to process variation.

Figure 17A:
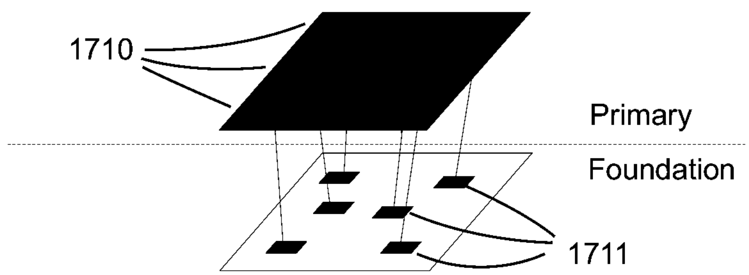
FIG. 17A is a topology drawing illustration of underlying back bias circuitry.

FIG. 17A is a topology drawing illustration of back bias circuitry. The foundation layer 1402 carries back bias circuits 1711 to allow enhancing the performance of some of the zones 1710 on the primary device which otherwise will have lower performance.

Figure 17B:
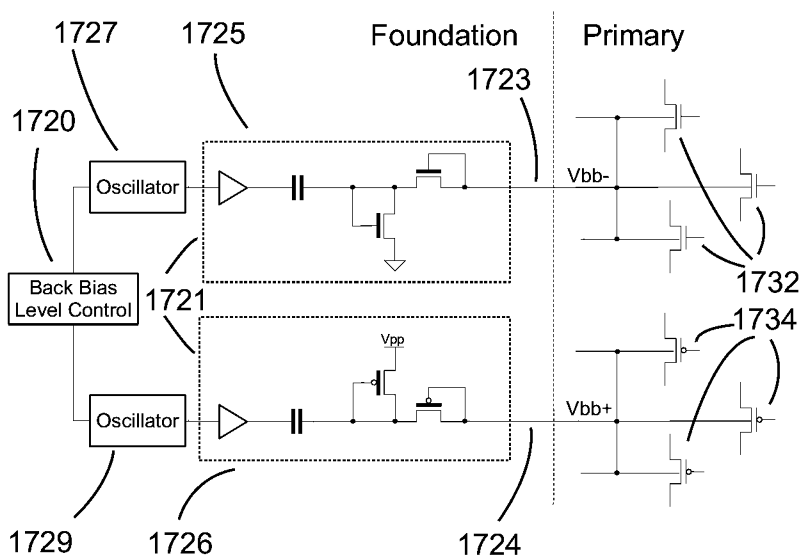
FIG. 17B is a drawing illustration of underlying back bias circuits.

FIG. 17B is a drawing illustration of back bias circuits. A back bias level control circuit 1720 is controlling the oscillators 1727 and 1729 to drive the voltage generators 1721. The negative voltage generator 1725 will generate the desired negative bias which will be connected to the primary circuit by connection 1723 to back bias the N-channel Metal-Oxide-Semiconductor (NMOS) transistors 1732 on the primary silicon 1404. The positive voltage generator 1726 will generate the desired negative bias which will be connected to the primary circuit by connection 1724 to back bias the P-channel Metal-Oxide-Semiconductor (PMOS) transistors 1734 on the primary silicon 1404. The setting of the proper back bias level per zone will be done in the initiation phase. It could be done by using external tester and controller or by on-chip self test circuitry. Preferably a non volatile memory will be used to store the per zone back bias voltage level so the device could be properly initialized at power up. Alternatively a dynamic scheme could be used where different back bias level(s) are used in different operating modes of the device. Having the back bias circuitry in the foundation allows better utilization of the primary device silicon resources and less distortion for the logic operation on the primary device.

Figure 17C:
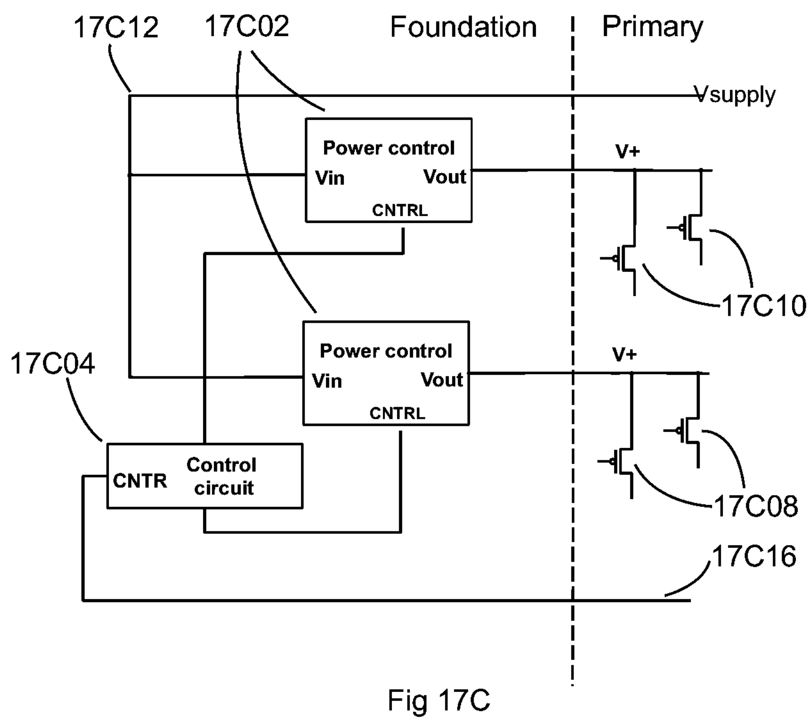
FIG. 17C is a drawing illustration of power control circuits

FIG. 17C illustrates an alternative circuit function that may fit well in the "Foundation." In many IC designs it is desired to integrate power control to reduce either voltage to sections of the device or to totally power off these sections when those sections are not needed or in an almost 'sleep' mode. In general such power control is best done with higher voltage transistors. Accordingly a power control circuit cell 17C02 may be constructed in the Foundation. Such power control 17C02 may have its own higher voltage supply and control or regulate supply voltage for sections 17C10 and 17C08 in the "Primary" device. The control may come from the primary device 17C16 and be managed by control circuit 17C04 in the Foundation.

Figure 17D:
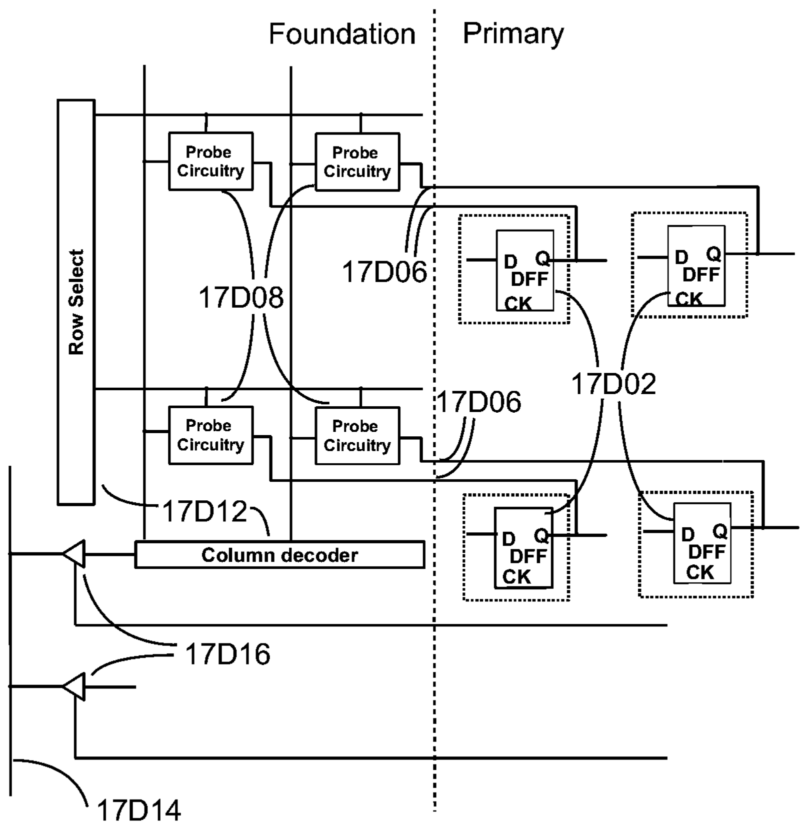
FIG. 17D is a drawing illustration of probe circuits

FIG. 17D illustrates an alternative circuit function that may fit well in the "Foundation." In many IC designs it is desired to integrate a probe auxiliary system that will make it very easy to probe the device in the debugging phase, and to support production testing. Probe circuits have been used in the prior art sharing the same transistor layer as the primary circuit. FIG. 17D illustrates a probe circuit constructed in the Foundation underneath the active circuits in the primary layer. FIG. 17D illustrates that the connections are made to the sequential active circuit elements 17D02. Those connections are routed to the Foundation through interconnect lines 17D06 where high impedance probe circuits 17D08 will be used to sense the sequential element output. A selector circuit 17D12 allows one or more of those sequential outputs to be routed out through one or more buffers 17D16 which may be controlled by signals from the Primary circuit to supply the drive of the sequential output signal to the probed signal output 17D14 for debugging or testing. Persons of ordinary skill in the art will appreciate that other configurations are possible like, for example, having multiple groups of probe circuitry 17D08, multiple probe output signals 17D14, and controlling buffers 17D16 with signals not originating in the primary circuit.

Figure 18:
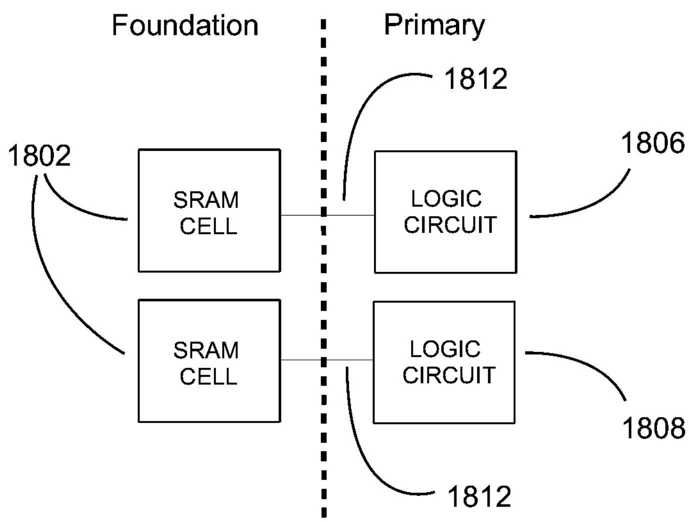
FIG. 18 is a drawing illustration of an underlying SRAM.

In another alternative the foundation substrate 1402 could additionally carry SRAM cells as illustrated in FIG. 18. The SRAM cells 1802 pre-fabricated on the underlying substrate 1402 could be connected 1812 to the primary logic circuit 1806, 1808 built on 1404. As mentioned before, the layers built on 1404 could be aligned to the pre-fabricated structure on the underlying substrate 1402 so that the logic cells could be properly connected to the underlying RAM cells.

Figure 19A:
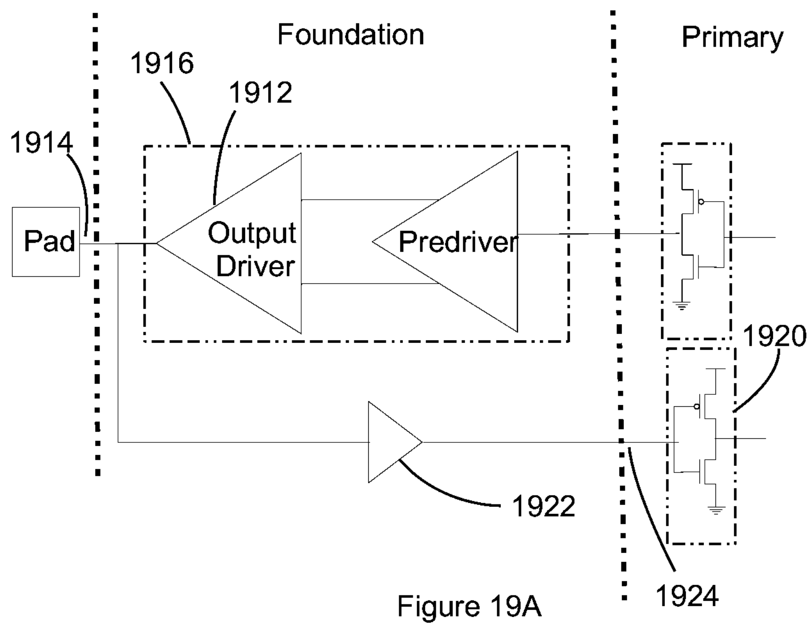
FIG. 19A is a drawing illustration of an underlying I/O.
Figure 19B:
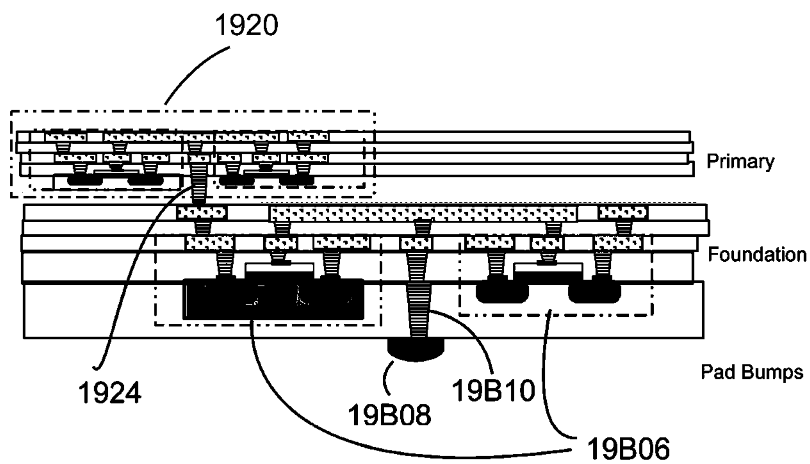
FIG. 19B is a drawing illustration of side "cut"

FIG. 19A is a drawing illustration of an underlying I/O. The foundation 1402 could also be preprocessed to carry the I/O circuits or part of it, such as the relatively large transistors of the output drive 1912. Additionally TSV in the foundation could be used to bring the I/O connection 1914 all the way to the back side of the foundation. FIG. 19B is a drawing illustration of a side "cut" of an integrated device according to an embodiment of the present invention. The Output Driver is illustrated by PMOS and NMOS output transistors 19B06 coupled through TSV 19B10 to connect to a backside pad or pad bump 19B08. The connection material used in the foundation 1402 can be selected to withstand the temperature of the following process constructing the full device on 1404 as illustrated in FIG. 8A—802, 804, 806, 807, 810, 812, such as tungsten. The foundation could also carry the input protection circuit 1916 connecting the pad 19B08 to the input logic 1920 in the primary circuits or buffer 1922.

An additional embodiment of the present invention may be to use TSVs in the foundation such as TSV 19B10 to connect between wafers to form 3D Integrated Systems. In general each TSV takes a relatively large area, typically a few square microns. When the need is for many TSVs, the overall cost of the area for these TSVs might be high if the use of that area for high density transistors is precluded. Pre-processing these TSVs on the donor wafer on a relatively older process line will significantly reduce the effective costs of the 3D TSV connections. The connection 1924 to the primary silicon circuitry 1920 could be then made at the minimum contact size of few tens of square nanometers, which is two orders of magnitude lower than the few square microns needed by the TSVs. Those of ordinary skill in the art will appreciate that FIG. 19B is for illustration only and is not drawn to scale. Such skilled persons will understand there are many alternative embodiments and component arrangements that could be constructed using the inventive principles shown and that FIG. 19B is not limiting in any way.

Figure 19C:
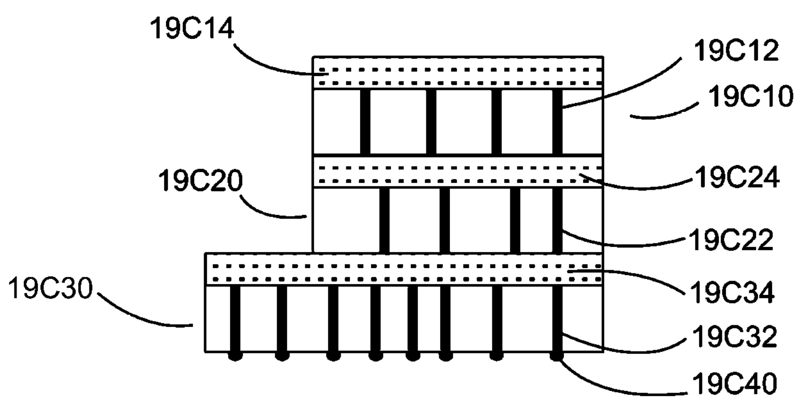
FIG. 19C is a drawing illustration of a 3D IC system.

FIG. 19C demonstrates a 3D system comprising three dice 19C10, 19C20 and 19C30 coupled together with TSVs 19C12, 19C22 and 19C32 similar to TSV 19B10 as described in association with FIG. 19A. The stack of three dice utilize TSV in the Foundations 19C12, 19C22, and 19C32 for the 3D interconnect may allow for minimum effect or silicon area loss of the Primary silicon 19C14, 19C24 and 19C34 connected to their respective Foundations with minimum size via connections. The three die stacks may be connected to a PC Board using bumps 19C40 connected to the bottom die TSVs 19C32. Those of ordinary skill in the art will appreciate that FIG. 19C is for illustration only and is not drawn to scale. Such skilled persons will understand there are many alternative embodiments and component arrangements that could be constructed using the inventive principles shown and that FIG. 19C is not limiting in any way. For example, a die stack could be placed in a package using flip chip bonding or the bumps 19C40 could be replaced with bond pads and the part flipped over and bonded in a conventional package with bond wires.

Figure 19D:
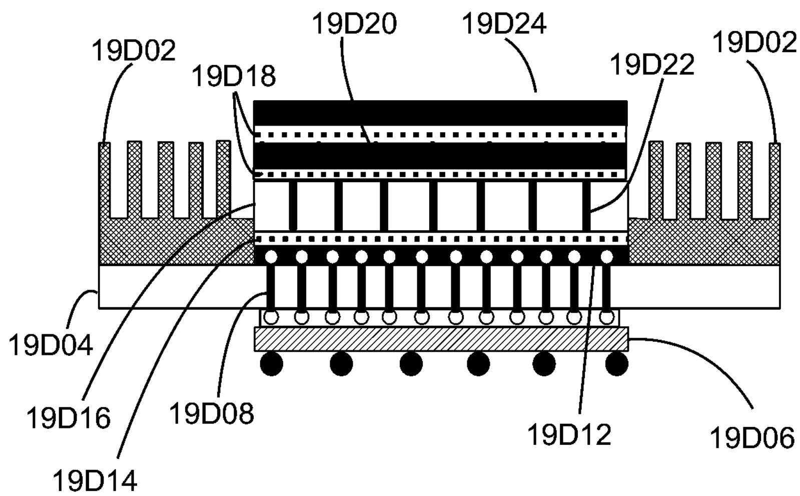
FIG. 19D is a drawing illustration of a 3D IC processor and DRAM system.

FIG. 19D illustrates a 3D IC processor and DRAM system. A well known problem in the computing industry is known as the "memory wall" and relates to the speed the processor can access the DRAM. The prior art proposed solution was to connect a DRAM stack using TSV directly on top of the processor and use a heat spreader attached to the processor back to remove the processor heat. But in order to do so, a special via needs to go "through DRAM" so that the processor I/Os and power could be connected. Having many processor-related 'through-DRAM vias" leads to a few severe disadvantages. First, it reduces the usable silicon area of the DRAM by a few percent. Second, it increases the power overhead by a few percent. Third, it requires that the DRAM design be coordinated with the processor design which is very commercially challenging. The embodiment of FIG. 19D illustrates one solution to mitigate the above mentioned disadvantages by having a foundation with TSVs as illustrated in FIGS. 19B and 19C. The use of the foundation and primary structure may enable the connections of the processor without going through the DRAM.

In FIG. 19D the processor I/Os and power may be coupled from the face-down microprocessor active area 19D14—the primary layer, by vias 19D08 through heat spreader substrate 19D04 to an interposer 19D06. A heat spreader 19D12, the heat spreader substrate 19D04, and heat sink 19D02 are used to spread the heat generated on the processor active area 19D14. TSVs 19D22 through the Foundation 19D16 are used for the connection of the DRAM stack 19D24. The DRAM stack comprises multiple thinned DRAM 19D18 interconnected by TSV 19D20. Accordingly the DRAM stack does not need to pass through the processor I/O and power planes and could be designed and produced independent of the processor design and layout. The DRAM chip 19D18 that is closest to the Foundation 19D16 may be designed to connect to the Foundation TSVs 19D22, or a separate ReDistribution Layer (or RDL, not shown) may be added in between, or the Foundation 19D16 could serve that function with preprocessed high temperature interconnect layers, such as Tungsten, as described previously. And the processor's active area is not compromised by having TSVs through it as those are done in the Foundation 19D16.

Alternatively the Foundation vias 19D22 could be used to pass the processor I/O and power to the substrate 19D04 and to the interposer 19D06 while the DRAM stack would be coupled directly to the processor active area 19D14. Persons of ordinary skill in the art will appreciate that many more combinations are possible within the scope of the disclosed invention.

Figure 19E:
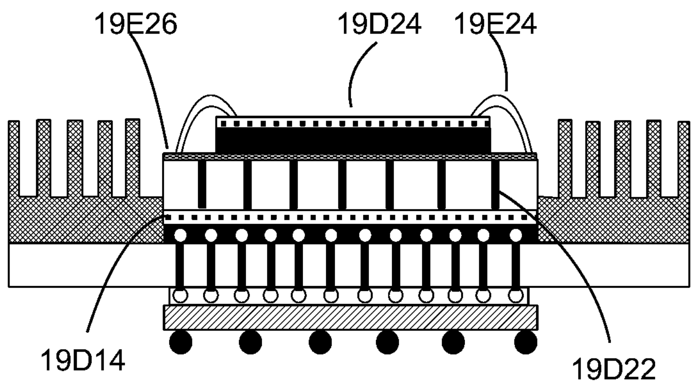
FIG. 19E is a drawing illustration of a 3D IC processor and DRAM system.

FIG. 19E illustrates another embodiment of the present invention wherein the DRAM stack 19D24 may be coupled by wire bonds 19E24 to an RDL (ReDistribution Layer) 19E26 that couples the DRAM to the Foundation vias 19D22, and thus couples them to the face-down processor 19D14.

Figure 19F:
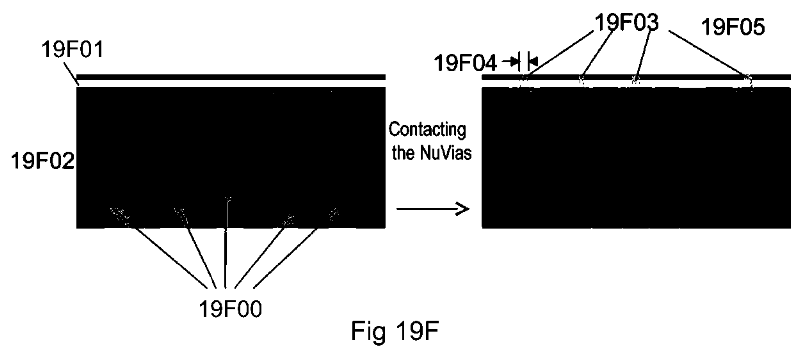
FIG. 19F is a drawing illustration of a custom SOI wafer used to build through-silicon connections.
Figure 19G:
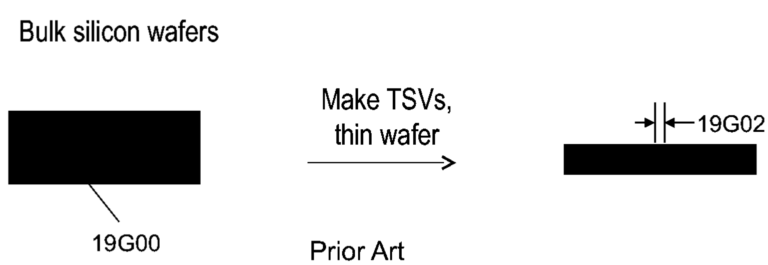
FIG. 19G is a drawing illustration of a prior art method to make through-silicon vias.

In yet another embodiment, custom SOI wafers are used where NuVias 19F00 may be processed by the wafer supplier. NuVias 19F00 may be conventional TSVs that may be 1 micron or larger in diameter and may be preprocessed by an SOI wafer vendor. This is illustrated in FIG. 19F with handle wafer 19F02 and Buried Oxide BOX 19F01. The handle wafer 19F02 may typically be many hundreds of microns thick, and the BOX 19F01 may typically be a few hundred nanometers thick. The Integrated Device Manufacturer (IDM) or foundry then processes NuContacts 19F03 to connect to the NuVias 19F00. NuContacts may be conventionally dimensioned contacts etched thru the thin silicon 19F05 and the BOX 19F01 of the SOI and filled with metal. The NuContact diameter DNuContact 19F04, in FIG. 19F may then be processed into the tens of nanometer range. The prior art of construction with bulk silicon wafers 19G00 as illustrated in FIG. 19G typically has a TSV diameter, DTSV_prior_art 19G02, in the micron range. The reduced dimension of NuContact DNuContact 19F04 in FIG. 19F may have important implications for semiconductor designers. The use of NuContacts may provide reduced die size penalty of through-silicon connections, reduced handling of very thin silicon wafers, and reduced design complexity. The arrangement of TSVs in custom SOI wafers can be based on a high-volume integrated device manufacturer (IDM) or foundry's request, or be based on a commonly agreed industry standard.

Figure 19H:
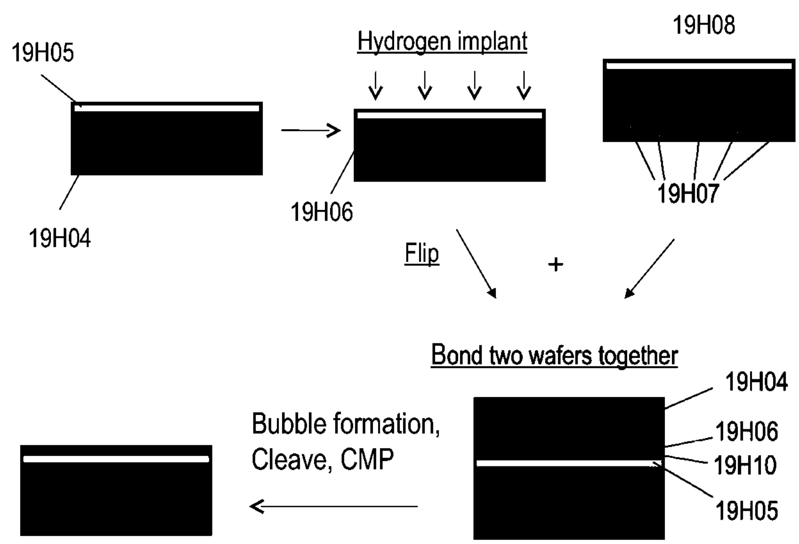
FIG. 19H is a drawing illustration of a process flow for making custom SOI wafers.

A process flow as illustrated in FIG. 19H may be utilized to manufacture these custom SOI wafers. Such a flow may be used by a wafer supplier. A silicon donor wafer 19H04 is taken and its surface 19H05 may be oxidized. An atomic species, such as, for example, hydrogen, may then be implanted at a certain depth 19H06. Oxide-to-oxide bonding as described in other embodiments may then be used to bond this wafer with an acceptor wafer 19H08 having pre-processed NuVias 19H07. The NuVias 19H07 may be constructed with a conductive material, such as tungsten or doped silicon, which can withstand high-temperature processing. An insulating barrier, such as, for example, silicon oxide, may be utilized to electrically isolate the NuVia 19H07 from the silicon of the acceptor wafer 19H08. Alternatively, the wafer supplier may construct NuVias 19H07 with silicon oxide. The integrated device manufacturer or foundry etches out this oxide after the high-temperature (more than 400° C.) transistor fabrication is complete and may replace this oxide with a metal such as copper or aluminum. This process may allow a low-melting point, but highly conductive metal, like copper to be used. Following the bonding, a portion 19H10 of the donor silicon wafer 19H04 may be cleaved at 19H06 and then chemically mechanically polished as described in other embodiments.

Figure 19I:
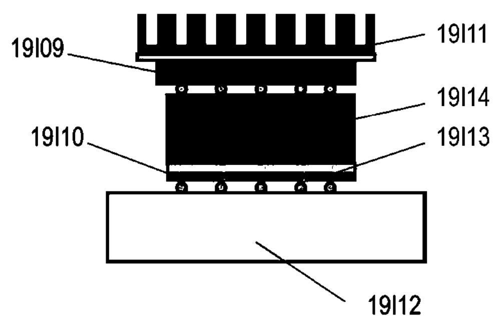
FIG. 19I is a drawing illustration of a processor-DRAM stack.
Figure 19J:
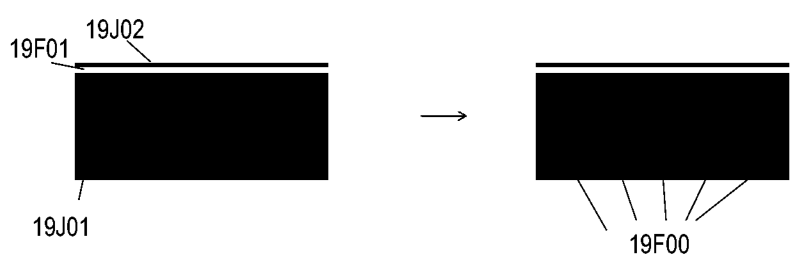
FIG. 19J is a drawing illustration of a process flow for making custom SOI wafers.

FIG. 19J depicts another technique to manufacture custom SOI wafers. A standard SOI wafer with substrate 19J01, box 19F01, and top silicon layer 19J02 may be taken and NuVias 19F00 may be formed from the back-side up to the oxide layer. This technique might have a thicker buried oxide 19F01 than a standard SOI process.

FIG. 19I depicts how a custom SOI wafer may be used for 3D stacking of a processor 19I09 and a DRAM 19I10. In this configuration, a processor's power distribution and I/O connections have to pass from the substrate 19I12, go through the DRAM 19I10 and then connect onto the processor 19I09. The above described technique in FIG. 19F may result in a small contact area on the DRAM active silicon, which is very convenient for this processor-DRAM stacking application. The transistor area lost on the DRAM die due to the through-silicon connection 19I13 and 19I14 is very small due to the tens of nanometer diameter of NuContact 19I13 in the active DRAM silicon. It is difficult to design a DRAM when large areas in its center are blocked by large through-silicon connections. Having small size through-silicon connections may help tackle this issue. Persons of ordinary skill in the art will appreciate that this technique may be applied to building processor-SRAM stacks, processor-flash memory stacks, processor-graphics-memory stacks, any combination of the above, and any other combination of related integrated circuits such as, for example, SRAM-based programmable logic devices and their associated configuration ROM/PROM/EPROM/EEPROM devices, ASICs and power regulators, microcontrollers and analog functions, etc. Additionally, the silicon on insulator (SOI) may be a material such as polysilicon, GaAs, GaN, etc. on an insulator. Such skilled persons will appreciate that the applications of NuVia and NuContact technology are extremely general and the scope of the invention is to be limited only by the appended claims.

In another embodiment of the present invention the foundation substrate 1402 could additionally carry re-drive cells (often called buffers). Re-drive cells are common in the industry for signals which is routed over a relatively long path. As the routing has a severe resistance and capacitance penalty it is helpful to insert re-drive circuits along the path to avoid a severe degradation of signal timing and shape. An advantage of having re-drivers in the foundation 1402 is that these re-drivers could be constructed from transistors who could withstand the programming voltage. Otherwise isolation transistors such as 1601 and 1602 or other isolation scheme may be used at the logic cell input and output.

FIG. 8A is a cut illustration of a programmable device, with two antifuse layers. The programming transistors for the first one 804 could be prefabricated on 814, and then, utilizing "smart-cut", a single crystal, or mono-crystalline, silicon layer 1404 is transferred on which the primary programmable logic 802 is fabricated with advanced logic transistors and other circuits. Then multi-metal layers are fabricated including a lower layer of antifuses 804, interconnection layers 806 and second antifuse layer with its configurable interconnects 807. For the second antifuse layer the programming transistors 810 could be fabricated also utilizing a second "smart-cut" layer transfer.

Figure 20:
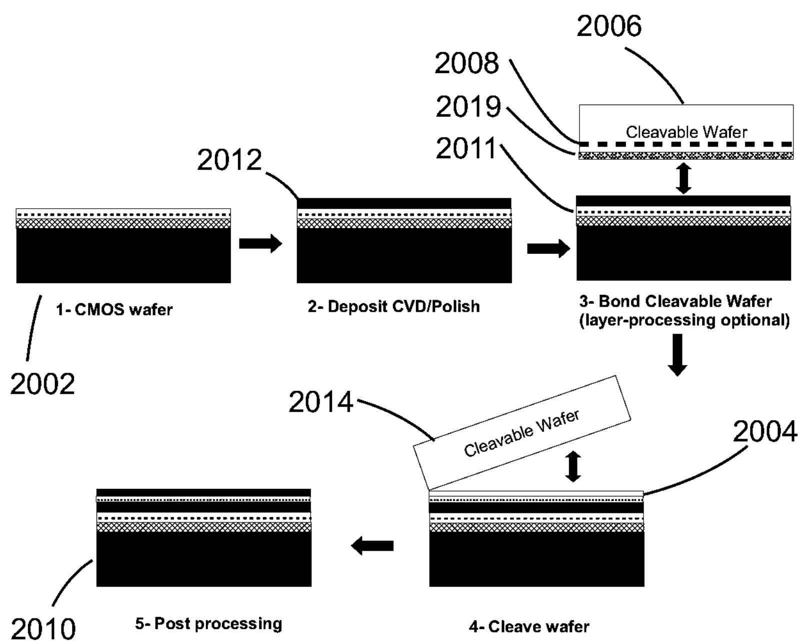
FIG. 20 is a drawing illustration of a layer transfer process flow.

FIG. 20 is a drawing illustration of the second layer transfer process flow. The primary processed wafer 2002 comprises all the prior layers—814, 802, 804, 806, and 807. Layer 2011 may include metal interconnect for said prior layers. An oxide layer 2012 is then deposited on top of the wafer 2002 and then polished for better planarization and surface preparation. A donor wafer 2006 (or cleavable wafer as labeled in the drawing) is then brought in to be bonded to 2002. The donor wafer 2006 is pre processed to comprise the semiconductor layers 2019 which will be later used to construct the top layer of programming transistors 810 as an alternative to the TFT transistors. The donor wafer 2006 is also prepared for "SmartCut" by ion implant of an atomic species, such as H+, at the desired depth to prepare the SmartCut line 2008. After bonding the two wafers a SmartCut step is performed to pull out the top portion 2014 of the donor wafer 2006 along the cut layer 2008. This donor wafer may now also be processed and reused for more layer transfers. The result is a 3D wafer 2010 which comprises wafer 2002 with an added layer 2004 of single crystal silicon pre-processed to carry additional semiconductor layers. The transferred slice 2004 could be quite thin at the range of 10-200 nm as desired. Utilizing "SmartCut" layer transfer provides single crystal semiconductors layer on top of a pre-processed wafer without heating the pre-processed wafer to more than 400° C.

There are a few alternative methods to construct the top transistors precisely aligned to the underlying pre-fabricated layers such as pre-processed wafer or layer 808, utilizing "SmartCut" layer transfer and not exceeding the temperature limit of the underlying pre-fabricated structure. As the layer transfer is less than 200 nm thick, then the transistors defined on it could be aligned precisely to the top metal layer of the pre-processed wafer or layer 808 as may be needed and those transistors have less than 40 nm misalignment.

One alternative method is to have a thin layer transfer of single crystal silicon which will be used for epitaxial Ge crystal growth using the transferred layer as the seed for the germanium. Another alternative method is to use the thin layer transfer of mono-crystalline silicon for epitaxial growth of GexSi1-x. The percent Ge in Silicon of such layer would be determined by the transistor specifications of the circuitry. Prior art have presented approaches whereby the base silicon is used to crystallize the germanium on top of the oxide by using holes in the oxide to drive crystal or lattice seeding from the underlying silicon crystal. However, it is very hard to do such on top of multiple interconnection layers. By using layer transfer we can have a mono-crystalline layer of silicon crystal on top and make it relatively easy to seed and crystallize an overlying germanium layer. Amorphous germanium could be conformally deposited by CVD at 300° C. and pattern aligned to the underlying layer, such as the pre-processed wafer or layer 808, and then encapsulated by a low temperature oxide. A short microsecond-duration heat pulse melts the Ge layer while keeping the underlying structure below 400° C. The Ge/Si interface will start the crystal or lattice epitaxial growth to crystallize the germanium or GexSi1-x layer. Then implants are made to form Ge transistors and activated by laser pulses without damaging the underlying structure taking advantage of the low activation temperature of dopants in germanium.

Figure 21A:
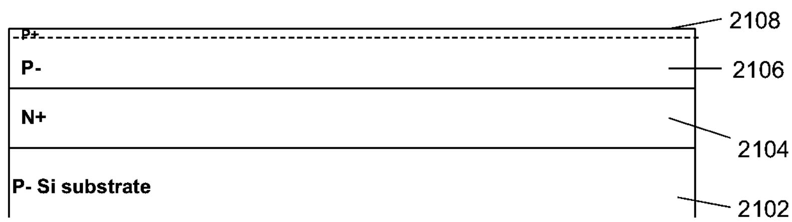
FIG. 21A is a drawing illustration of a pre-processed wafer used for a layer transfer.
Figure 21B:
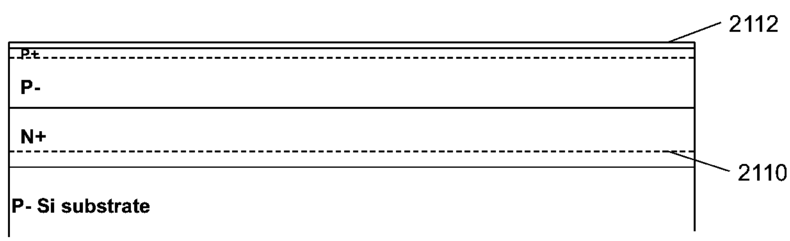
FIG. 21B is a drawing illustration of a pre-processed wafer ready for a layer transfer.

Another alternative method is to preprocess the wafer used for layer transfer as illustrated in FIG. 21. FIG. 21A is a drawing illustration of a pre-processed wafer used for a layer transfer. A lightly doped P-type wafer (P− wafer) 2102 may be processed to have a "buried" layer of highly doped N-type silicon (N+) 2104, by implant and activation, or by shallow N+ implant and diffusion followed by a P− epi growth (epitaxial growth) 2106. Optionally, if a substrate contact is needed for transistor performance, an additional shallow P+ layer 2108 is implanted and activated. FIG. 21B is a drawing illustration of the pre-processed wafer made ready for a layer transfer by an implant of an atomic species, such as H+, preparing the SmartCut "cleaving plane" 2110 in the lower part of the N+ region and an oxide deposition or growth 2112 in preparation for oxide to oxide bonding. Now a layer-transfer-flow should be performed to transfer the pre-processed single crystal P− silicon with N+ layer, on top of pre-processed wafer or layer 808. The top of pre-processed wafer or layer 808 may be prepared for bonding by deposition of an oxide, or surface treatments, or both. Persons of ordinary skill in the art will appreciate that the processing methods presented above are illustrative only and that other embodiments of the inventive principles described herein are possible and thus the scope if the invention is only limited by the appended claims.

Figure 22A:
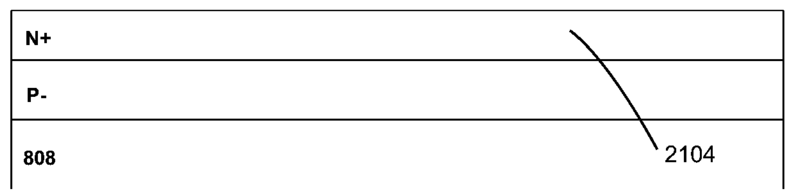
FIG. 22A-H are drawing illustrations of formation of top planar transistors.
Figure 22B:
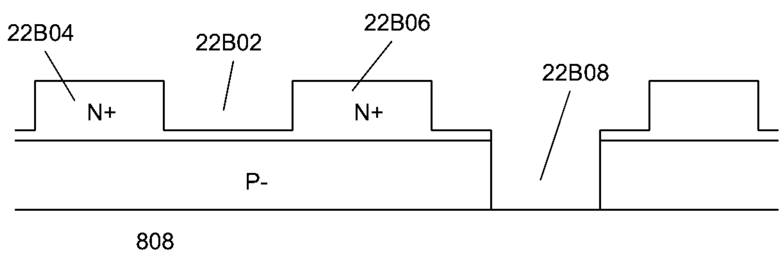
Figure 22C:
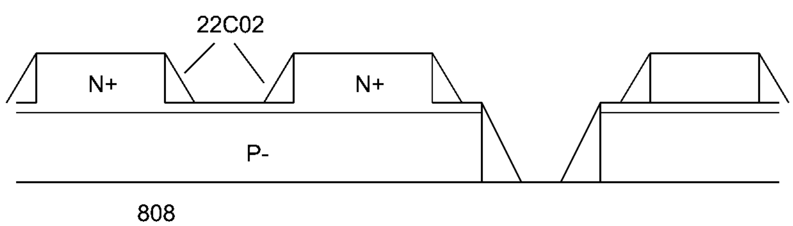
Figure 22D:
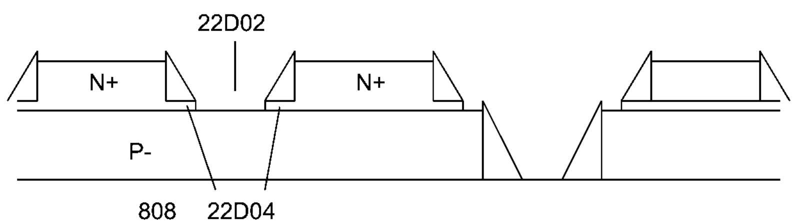
Figure 22E:
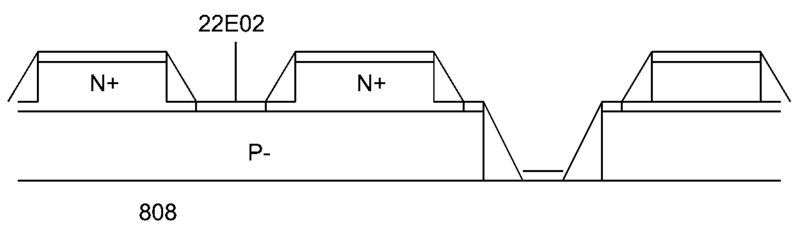

FIGS. 22A-22H are drawing illustrations of the formation of planar top source extension transistors. FIG. 22A illustrates the layer transferred on top of preprocessed wafer or layer 808 after the smart cut wherein the N+ 2104 is on top. Then the top transistor source 22B04 and drain 22B06 are defined by etching away the N+ from the region designated for gates 22B02, leaving a thin more lightly doped N+ layer for the future source and drain extensions, and the isolation region between transistors 22B08. Utilizing an additional masking layer, the isolation region 22B08 is defined by an etch all the way to the top of pre-processed wafer or layer 808 to provide full isolation between transistors or groups of transistors. Etching away the N+ layer between transistors is helpful as the N+ layer is conducting. This step is aligned to the top of the pre-processed wafer or layer 808 so that the formed transistors could be properly connected to metal layers of the pre-processed wafer or layer 808. Then a highly conformal Low-Temperature Oxide 22C02 (or Oxide/Nitride stack) is deposited and etched resulting in the structure illustrated in FIG. 22C. FIG. 22D illustrates the structure following a self aligned etch step preparation for gate formation 22D02, thereby forming the source and drain extensions 22D04. FIG. 22E illustrates the structure following a low temperature microwave oxidation technique, such as the TEL SPA (Tokyo Electron Limited Slot Plane Antenna) oxygen radical plasma, that grows or deposits a low temperature Gate Dielectric 22E02 to serve as the MOSFET gate oxide, or an atomic layer deposition (ALD) technique may be utilized. Alternatively, the gate structure may be formed by a high k metal gate process flow as follows. Following an industry standard HF/SC1/SC2 clean to create an atomically smooth surface, a high-k dielectric 22E02 is deposited. The semiconductor industry has chosen Hafnium-based dielectrics as the leading material of choice to replace SiO2 and Silicon oxynitride. The Hafnium-based family of dielectrics includes hafnium oxide and hafnium silicate/hafnium silicon oxynitride. Hafnium oxide, HfO2, has a dielectric constant twice as much as that of hafnium silicate/hafnium silicon oxynitride (HfSiO/HfSiON k~15). The choice of the metal is critical for the device to perform properly. A metal replacing N+ poly as the gate electrode needs to have a work function of approximately 4.2 eV for the device to operate properly and at the right threshold voltage. Alternatively, a metal replacing P+ poly as the gate electrode needs to have a work function of approximately 5.2 eV to operate properly. The TiAl and TiAlN based family of metals, for example, could be used to tune the work function of the metal from 4.2 eV to 5.2 eV.

Figure 22F:
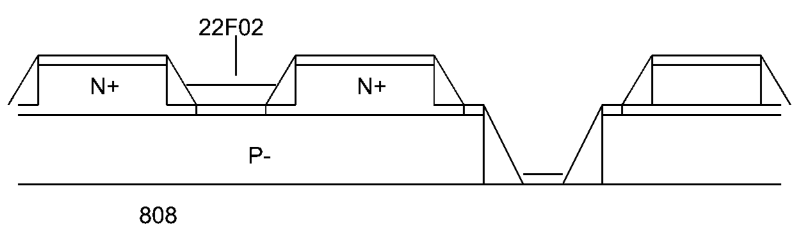

FIG. 22F illustrates the structure following deposition, mask, and etch of metal gate 22F02. Optionally, to improve transistor performance, a targeted stress layer to induce a higher channel strain may be employed. A tensile nitride layer may be deposited at low temperature to increase channel stress for the NMOS devices illustrated in FIG. 22. A PMOS transistor may be constructed via the above process flow by changing the initial P− wafer or epi-formed P− on N+ layer 2104 to an N− wafer or an N− on P+ epi layer; and the N+ layer 2104 to a P+ layer. Then a compressively stressed nitride film would be deposited post metal gate formation to improve the PMOS transistor performance.

Figure 22G:
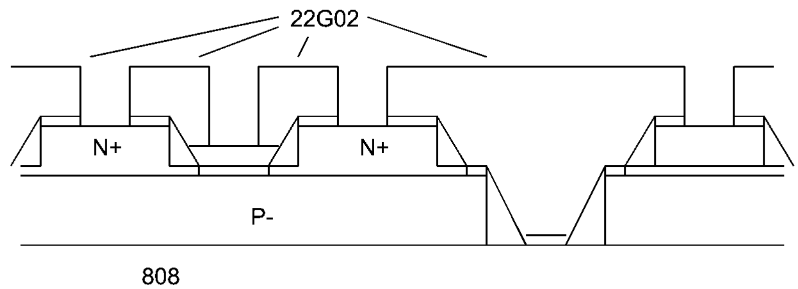
Figure 22H:
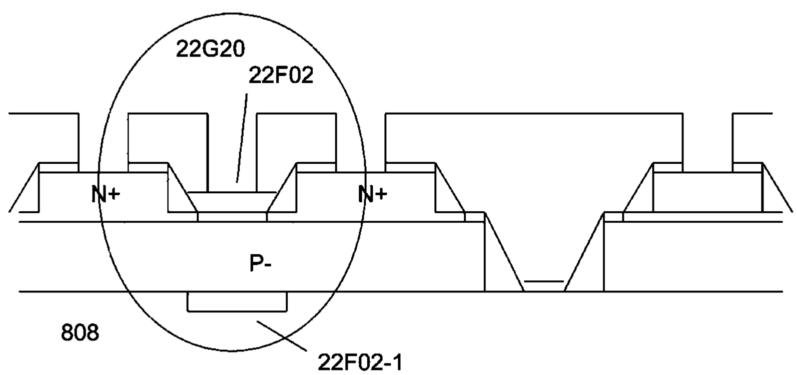

Finally a thick oxide 22G02 may be deposited and contact openings may be masked and etched preparing the transistors to be connected as illustrated in FIG. 22G. This thick or any low-temperature oxide in this document may be deposited via Chemical Vapor Deposition (CVD), Physical Vapor Deposition (PVD), or Plasma Enhanced Chemical Vapor Deposition (PECVD) techniques. This flow enables the formation of mono-crystalline top MOS transistors that could be connected to the underlying multi-metal layer semiconductor device without exposing the underlying devices and interconnects metals to high temperature. These transistors could be used as programming transistors of the Antifuse on layer 807, coupled to the pre-processed wafer or layer 808 to create a monolithic 3D circuit stack, or for other functions in a 3D integrated circuit. These transistors can be considered "planar MOSFET transistors," meaning that current flow in the transistor channel is substantially in the horizontal direction. These transistors, as well as others in this document, can also be referred to as horizontal transistors, horizontally oriented, or lateral transistors. An additional advantage of this flow is that the SmartCut H+, or other atomic species, implant step is done prior to the formation of the MOS transistor gates avoiding potential damage to the gate function. If needed the top layer of the pre-processed wafer or layer 808 could comprise a 'back-gate' 22F02-1 whereby gate 22F02 may be aligned to be directly on top of the back-gate 22F02-1 as illustrated in FIG. 22H. The back gate 22F02-1 may be formed from the top metal layer in the pre-processed wafer or layer 808 and may utilize the oxide layer deposited on top of the metal layer for the wafer bonding (not shown) to act as a gate oxide for the back gate.

According to some embodiments of the current invention, during a normal fabrication of the device layers as illustrated in FIG. 8, every new layer is aligned to the underlying layers using prior alignment marks. Sometimes the alignment marks of one layer could be used for the alignment of multiple layers on top of it and sometimes the new layer will also have alignment marks to be used for the alignment of additional layers put on top of it in the following fabrication step. So layers of 804 are aligned to layers of 802, layers of 806 are aligned to layers of 804 and so forth. An advantage of the described process flow is that the layer transferred is thin enough so that during the following patterning step as described in connection to FIG. 22B, the transferred layer may be aligned to the alignment marks of the pre-processed wafer or layer 808 or those of underneath layers such as layers 806, 804, 802, or other layers, to form the 3D IC. Therefore the 'back-gate' 22F02-1 which is part of the top metal layer of the pre-processed wafer or layer 808 would be precisely underneath gate 22F02 as all the layers are patterned as being aligned to each other. In this context alignment precision may be highly dependent on the equipment used for the patterning steps. For processes of 45 nm and below, overlay alignment of better than 5 nm is usually needed. The alignment requirement only gets tighter with scaling where modern steppers now can do better than 2 nm. This alignment requirement is orders of magnitude better than what could be achieved for TSV based 3D IC systems as described below in relation to FIG. 12 where even 0.5 micron overlay alignment is extremely hard to achieve. Connection between top-gate and back-gate would be made through a top layer via, or TLV. This may allow further reduction of leakage as both the gate 22F02 and the back-gate 22F02-1 could be connected together to better shut off the transistor 22G20. As well, one could create a sleep mode, a normal speed mode, and fast speed mode by dynamically changing the threshold voltage of the top gated transistor by independently changing the bias of the 'back-gate' 22F02-1. Additionally, an accumulation mode (fully depleted) MOSFET transistor could be constructed via the above process flow by changing the initial P− wafer 2102 or epi-formed P− 2106 on N+ layer 2104 to an N− wafer or an N− epi layer on N+.

An additional aspect of this technique for forming top transistors is the size of the via, or TLV, used to connect the top transistors 22G20 to the metal layers in pre-processed wafer and layer 808 underneath. The general rule of thumb is that the size of a via should be larger than one tenth the thickness of the layer that the via is going through. Since the thickness of the layers in the structures presented in FIG. 12 is usually more than 50 micron, the TSV used in such structures are about 10 micron on the side. The thickness of the transferred layer in FIG. 22A is less than 100 nm and accordingly the vias to connect top transistors 22G20 to the metal layers in pre-processed wafer and layer 808 underneath could be less than 50 nm on the side. As the process is scaled to smaller feature sizes, the thickness of the transferred layer and accordingly the size of the via to connect to the underlying structures could be scaled down. For some advanced processes, the end thickness of the transferred layer could be made below 10 nm.

Figures 29A, 29B, 29C:
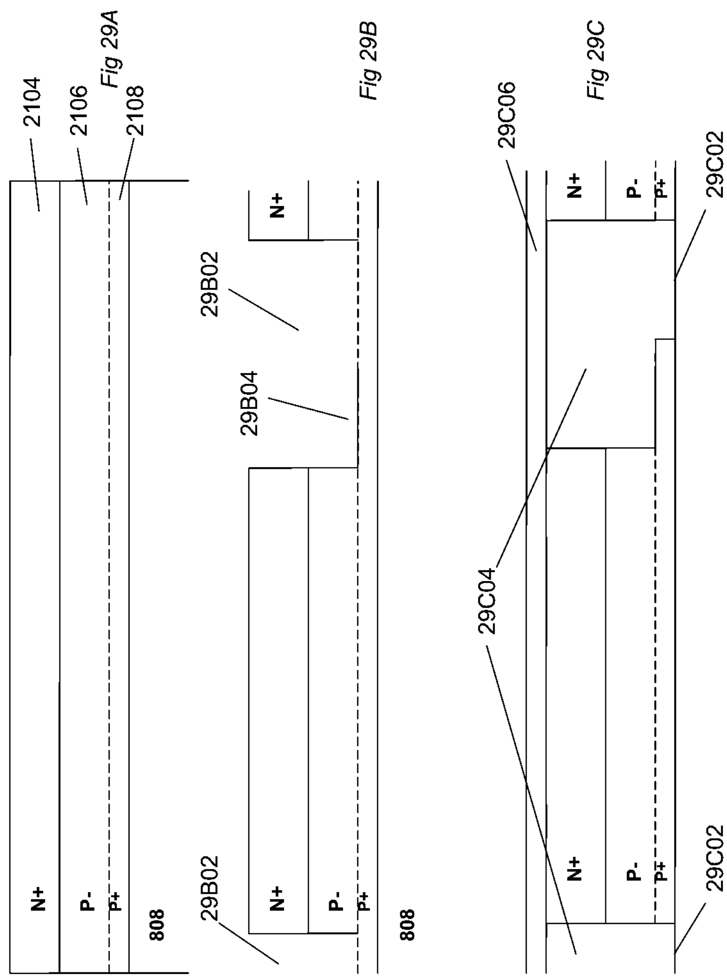
FIG. 29 A-G are drawing illustrations of formations of top planar transistors.
Figure 29D:
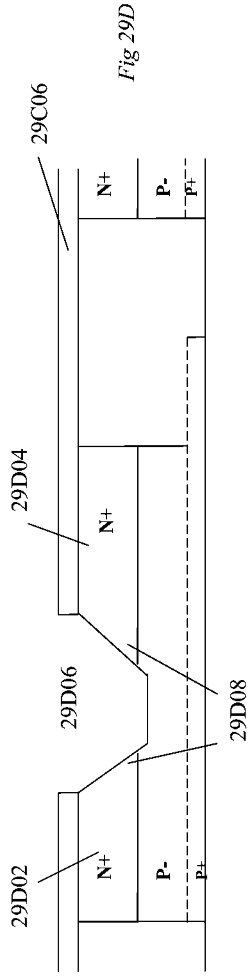
Figure 29E:
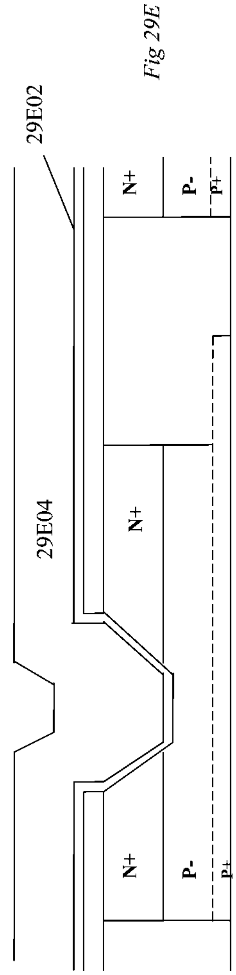

Another alternative for forming the planar top transistors with source and drain extensions is to process the prepared wafer of FIG. 21B as shown in FIGS. 29A-29G. FIG. 29A illustrates the layer transferred on top of pre-processed wafer or layer 808 after the smart cut wherein the N+ 2104 is on top, the P− 2106, and P+ 2108. The oxide layers used to facilitate the wafer to wafer bond are not shown. Then the substrate P+ source 29B04 contact opening and transistor isolation 29B02 is masked and etched as shown in FIG. 29B. Utilizing an additional masking layer, the isolation region 29C02 is defined by etch all the way to the top of the pre-processed wafer or layer 808 to provide full isolation between transistors or groups of transistors in FIG. 29C. Etching away the P+ layer between transistors is helpful as the P+ layer is conducting. Then a Low-Temperature Oxide 29C04 is deposited and chemically mechanically polished. Then a thin polish stop layer 29C06 such as low temperature silicon nitride is deposited resulting in the structure illustrated in FIG. 29C. Source 29D02, drain 29D04 and self-aligned Gate 29D06 may be defined by masking and etching the thin polish stop layer 29C06 and then a sloped N+ etch as illustrated in FIG. 29D. The sloped (30-90 degrees, 45 is shown) etch or etches may be accomplished with wet chemistry or plasma etching techniques. This process forms angular source and drain extensions 29D08. FIG. 29E illustrates the structure following deposition and densification of a low temperature based Gate Dielectric 29E02, or alternatively a low temperature microwave plasma oxidation of the silicon surfaces, or an atomic layer deposited (ALD) gate dielectric, to serve as the MOSFET gate oxide, and then deposition of a gate material 29E04, such as aluminum or tungsten.

Alternatively, a high-k metal gate structure may be formed as follows. Following an industry standard HF/SC1/SC2 cleaning to create an atomically smooth surface, a high-k dielectric 29E02 is deposited. The semiconductor industry has chosen Hafnium-based dielectrics as the leading material of choice to replace $SiO_2$ and Silicon oxynitride. The Hafnium-based family of dielectrics includes hafnium oxide and hafnium silicate/hafnium silicon oxynitride. Hafnium oxide, $HfO_2$, has a dielectric constant twice as much as that of hafnium silicate/hafnium silicon oxynitride (HfSiO/HfSiON k~15). The choice of the metal is critical for the device to perform properly. A metal replacing $N^+$ poly as the gate electrode needs to have a work function of approximately 4.2 eV for the device to operate properly and at the right threshold voltage. Alternatively, a metal replacing $P^+$ poly as the gate electrode needs to have a work function of approximately 5.2 eV to operate properly. The TiAl and TiAlN based family of metals, for example, could be used to tune the work function of the metal from 4.2 eV to 5.2 eV.

Figure 29F:
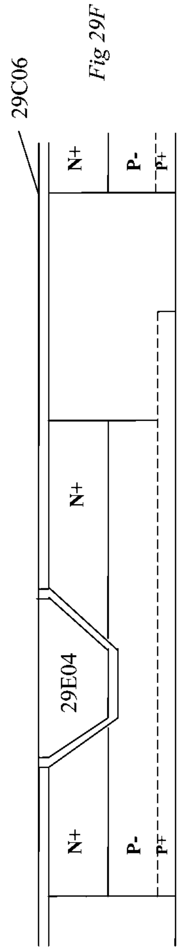

FIG. 29F illustrates the structure following a chemical mechanical polishing of the metal gate 29E04 utilizing the nitride polish stop layer 29C06. A PMOS transistor could be constructed via the above process flow by changing the initial P− wafer or epi-formed P− on N+ layer 2104 to an N− wafer or an N− on P+ epi layer; and the N+ layer 2104 to a P+ layer. Similarly, layer 2108 would change from P+ to N+ if the substrate contact option was used.

Figure 29G:
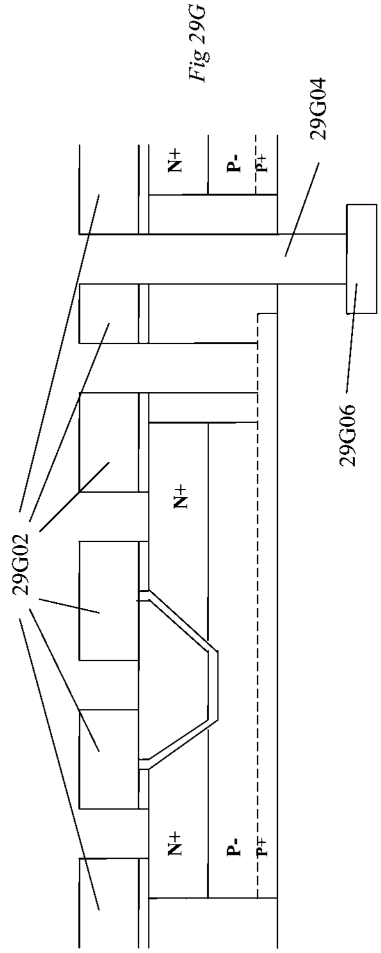

Finally a thick oxide 29G02 is deposited and contact openings are masked and etched preparing the transistors to be connected as illustrated in FIG. 29G. This figure also illustrates the layer transfer silicon via 29G04 masked and etched to provide interconnection of the top transistor wiring to the lower layer 808 interconnect wiring 29G06. This flow enables the formation of mono-crystalline top MOS transistors that may be connected to the underlying multi-metal layer semiconductor device without exposing the underlying devices and interconnects metals to high temperature. These transistors may be used as programming transistors of the antifuse on layer 807, to couple with the pre-processed wafer or layer 808 to form monolithic 3D ICs, or for other functions in a 3D integrated circuit. These transistors can be considered to be "planar MOSFET transistors", where current flow in the transistor channel is in the horizontal direction. These transistors can also be referred to as horizontal transistors or lateral transistors. An additional advantage of this flow is that the SmartCut H+, or other atomic species, implant step is done prior to the formation of the MOS transistor gates avoiding potential damage to the gate function. Additionally, an accumulation mode (fully depleted) MOSFET transistor may be constructed via the above process flow by changing the initial P− wafer or epi-formed P− on N+ layer 2104 to an N− wafer or an N− epi layer on N+. Additionally, a back gate similar to that shown in FIG. 22H may be utilized.

Figure 23A:
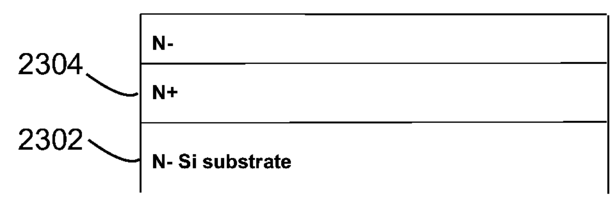
FIG. 23A, 23B is a drawing illustration of a pre-processed wafer used for a layer transfer.
Figure 23B:
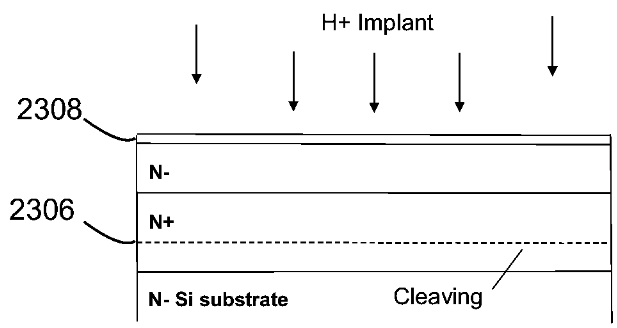

Another alternative method is to preprocess the wafer used for layer transfer as illustrated in FIG. 23. FIG. 23A is a drawing illustration of a pre-processed wafer used for a layer transfer. An N− wafer 2302 is processed to have a "buried" layer of N+ 2304, by implant and activation, or by shallow N+ implant and diffusion followed by an N− epi growth (epitaxial growth). FIG. 23B is a drawing illustration of the pre-processed wafer made ready for a layer transfer by a deposition or growth of an oxide 2308 and by an implant of an atomic species, such as H+, preparing the SmartCut cleaving plane 2306 in the lower part of the N+ region. Now a layer-transfer-flow should be performed to transfer the pre-processed mono-crystalline N− silicon with N+ layer, on top of the pre-processed wafer or layer 808.

Figure 24A:
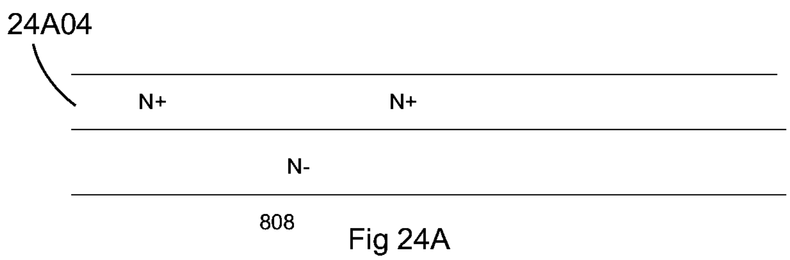
FIG. 24A-F are drawing illustrations of formation of top planar transistors.
Figure 24B:
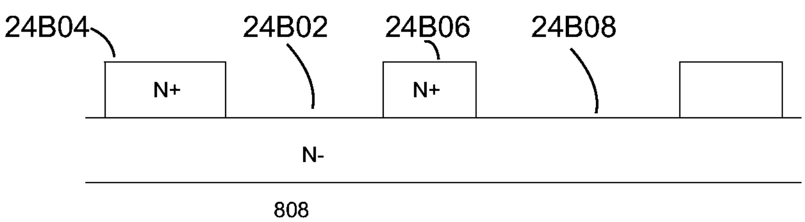
Figure 24C:
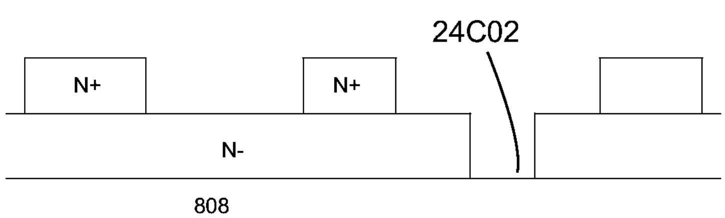
Figure 24D:
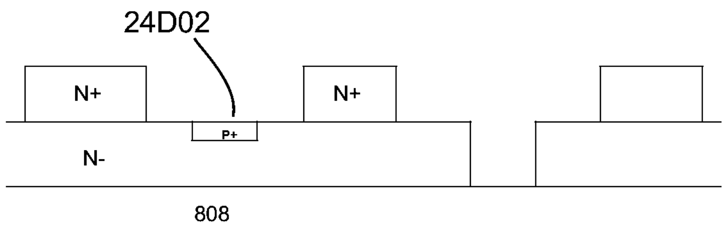
Figure 24E:
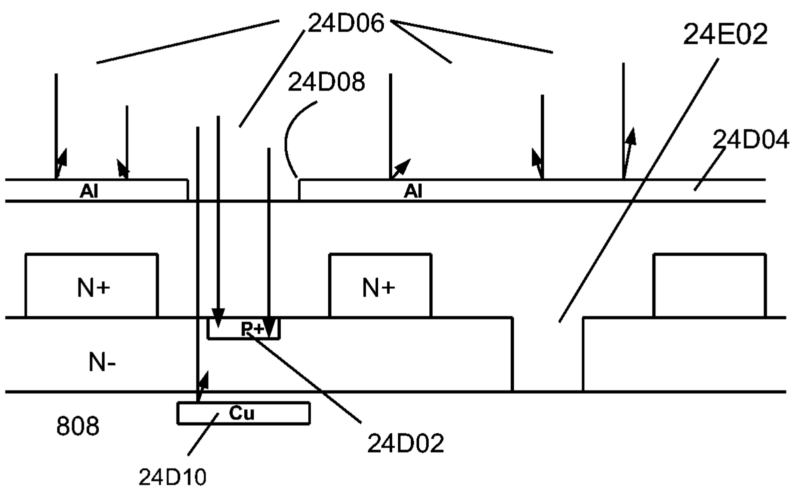
Figures 1, 24E:
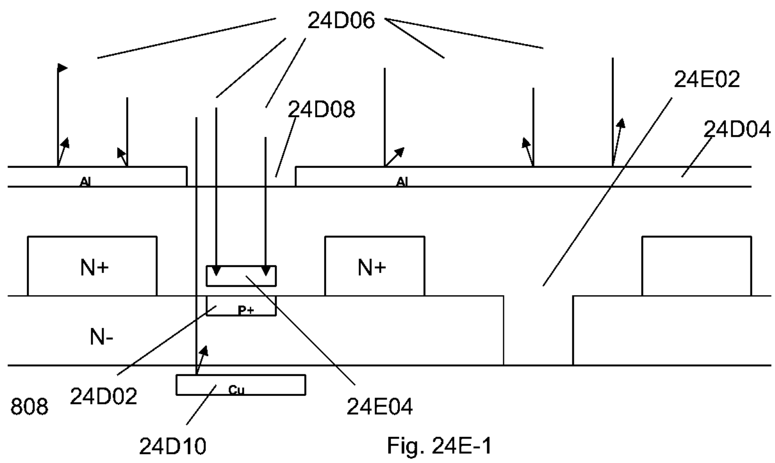

FIGS. 24A-24F are drawing illustrations of the formation of planar Junction Gate Field Effect Transistor (JFET) top transistors. FIG. 24A illustrates the structure after the layer is transferred on top of the pre-processed wafer or layer 808. So, after the smart cut, the N+ 2304 is on top and now marked as 24A04. Then the top transistor source 24B04 and drain 24B06 are defined by etching away the N+ from the region designated for gates 24B02 and the isolation region between transistors 24B08. This step is aligned to the pre-processed wafer or layer 808 so the formed transistors could be properly connected to the underlying layers of pre-processed wafer or layer 808. Then an additional masking and etch step is performed to remove the N− layer between transistors, shown as 24C02, thus providing better transistor isolation as illustrated in FIG. 24C. FIG. 24D illustrates an optional formation of shallow P+ region 24D02 for the JFET gate formation. In this option there might be a need for laser or other method of optical annealing to activate the P+. FIG. 24E illustrates how to utilize the laser anneal and minimize the heat transfer to pre-processed wafer or layer 808. After the thick oxide deposition 24E02, a layer of Aluminum 24D04, or other light reflecting material, is applied as a reflective layer. An opening 24D08 in the reflective layer is masked and etched, allowing the laser light 24D06 to heat the P+ 24D02 implanted area, and reflecting the majority of the laser energy 24D06 away from pre-processed wafer or layer 808. Normally, the open area 24D08 is less than 10% of the total wafer area. Additionally, a copper layer 24D10, or, alternatively, a reflective Aluminum layer or other reflective material, may be formed in the pre-processed wafer or layer 808 that will additionally reflect any of the unwanted laser energy 24D06 that might travel to pre-processed wafer or layer 808. Layer 24D10 could also be utilized as a ground plane or backgate electrically when the formed devices and circuits are in operation. Certainly, openings in layer 24D10 would be made through which later thru vias connecting the second top transferred layer to the pre-processed wafer or layer 808 may be constructed. This same reflective laser anneal or other methods of optical anneal technique might be utilized on any of the other illustrated structures to enable implant activation for transistor gates in the second layer transfer process flow. In addition, absorptive materials may, alone or in combination with reflective materials, also be utilized in the above laser or other method of optical annealing techniques. As shown in FIG. 24E-1, a photonic energy absorbing layer 24E04, such as amorphous carbon, may be deposited or sputtered at low temperature over the area that needs to be laser heated, and then masked and etched as appropriate. This allows the minimum laser or other optical energy to be employed to effectively heat the area to be implant activated, and thereby minimizes the heat stress on the reflective layers 24D04 & 24D10 and the base layer of pre-processed wafer or layer 808. The laser annealing could be done to cover the complete wafer surface or be directed to the specific regions where the gates are to further reduce the overall heat and further guarantee that no damage has been caused to the underlying layers.

Figure 24F:
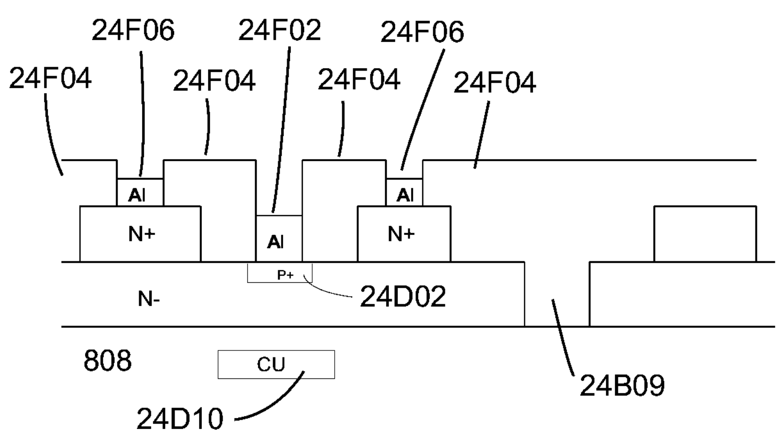

FIG. 24F illustrates the structure, following etching away of the laser reflecting layer 24D04, and the deposition, masking, and etch of a thick oxide 24F04 to open contacts 24F06 and 24F02, and deposition and partial etch-back (or Chemical Mechanical Polishing (CMP)) of aluminum (or other metal to obtain an optimal Schottky or ohmic contact at 24F02) to form contacts 24F06 and gate 24F02. If necessary, N+ contacts 24F06 and gate contact 24F02 can be masked and etched separately to allow a different metal to be deposited in each to create a Schottky or ohmic contact in the gate 24F02 and ohmic connections in the N+ contacts 24F06. The thick oxide 24F04 is a non conducting dielectric material also filling the etched space 24B08 and 24B09 between the top transistors and could comprise other isolating material such as silicon nitride. The top transistors will therefore end up being surrounded by isolating dielectric unlike conventional bulk integrated circuits transistors that are built in single crystal silicon wafer and only get covered by non conducting isolating material. This flow enables the formation of mono-crystalline top JFET transistors that could be connected to the underlying multi-metal layer semiconductor device without exposing the underlying device to high temperature.

Another variation of the previous flow could be in utilizing a transistor technology called pseudo-MOSFET utilizing a molecular monolayer that is covalently grafted onto the channel region between the drain and source. This is a process that can be done at relatively low temperatures (less than 400° C.).

Figure 25A:
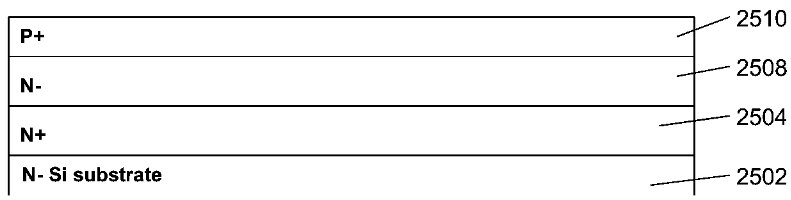
FIG. 25A, 25B is a drawing illustration of a pre-processed wafer used for a layer transfer.
Figure 25B:
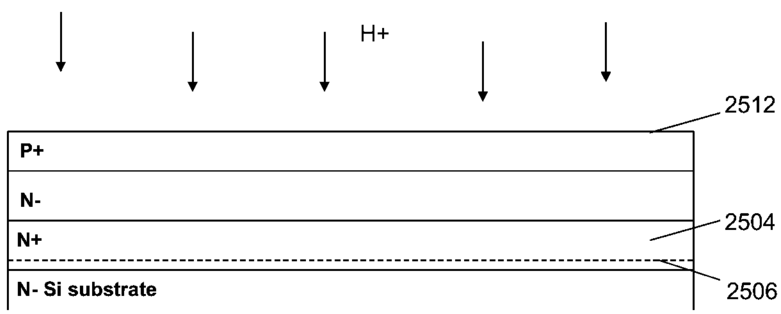

Another variation is to preprocess the wafer used for layer transfer as illustrated in FIG. 25. FIG. 25A is a drawing illustration of a pre-processed wafer used for a layer transfer. An N− wafer 2502 is processed to have a "buried" layer of N+ 2504, by implant and activation, or by shallow N+ implant and diffusion followed by an N− epi growth (epitaxial growth) 2508. An additional P+ layer 2510 is processed on top. This P+ layer 2510 could again be processed, by implant and activation, or by P+ epi growth. FIG. 25B is a drawing illustration of the pre-processed wafer made ready for a layer transfer by a deposition or growth of an oxide 2512 and by an implant of an atomic species, such as H+, preparing the SmartCut cleaving plane 2506 in the lower part of the N+ 2504 region. Now a layer-transfer-flow should be performed to transfer the pre-processed single crystal silicon with N+ and N− layers, on top of the pre-processed wafer or layer 808.

Figure 26A:
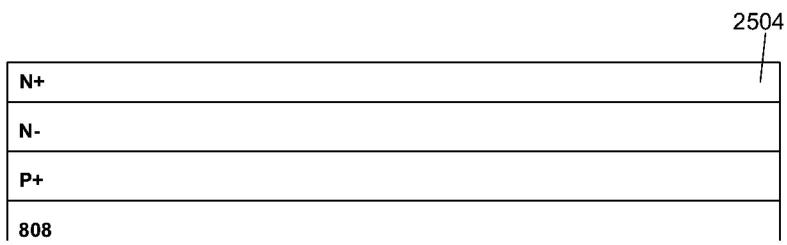
FIG. 26A-E are drawing illustrations of formation of top planar transistors.
Figure 26B:
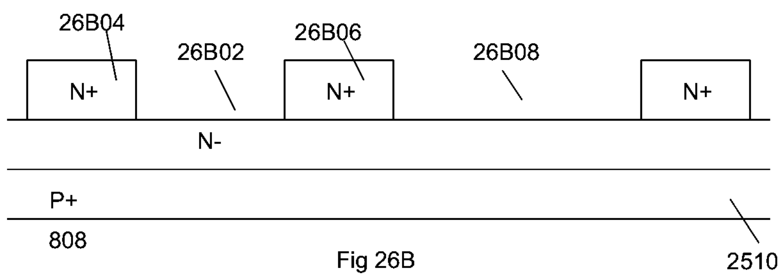
Figure 26C:
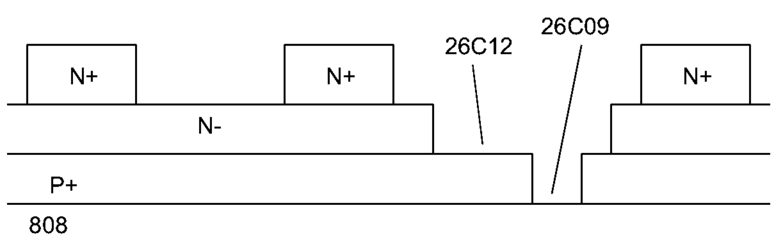
Figure 26D:
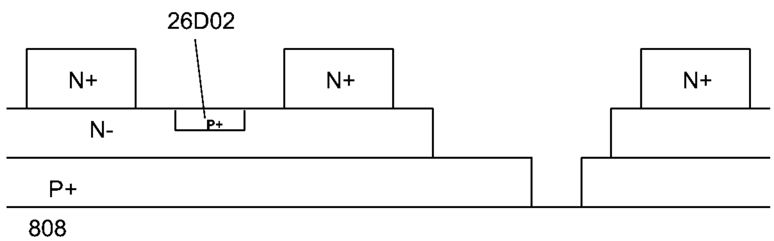
Figure 26E:
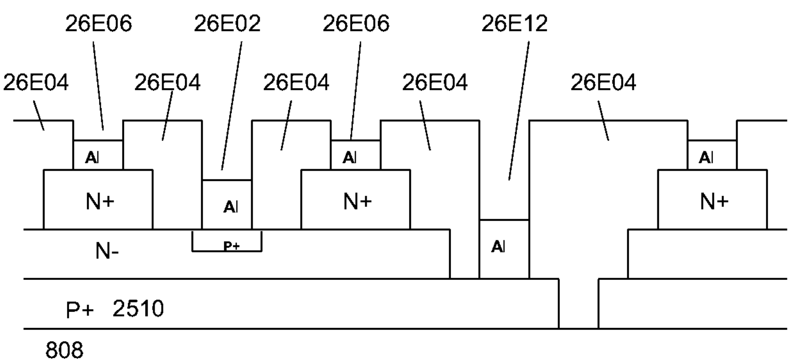

FIGS. 26A-26E are drawing illustrations of the formation of top planar JFET transistors with back bias or double gate. FIG. 26A illustrates the layer transferred on top of the pre-processed wafer or layer 808 after the smart cut wherein the N+ 2504 is on top. Then the top transistor source 26B04 and drain 26B06 are defined by etching away the N+ from the region designated for gates 26B02 and the isolation region between transistors 26B08. This step is aligned to the pre-processed wafer or layer 808 so that the formed transistors could be properly connected to the underlying layers of pre-processed wafer or layer 808. Then a masking and etch step is performed to remove the N− between transistors 26C12 and to allow contact to the now buried P+ layer 2510. And then a masking and etch step is performed to remove in between transistors 26C09 the buried P+ layer 2510 for full isolation as illustrated in FIG. 26C. FIG. 26D illustrates an optional formation of a shallow P+ region 26D02 for gate formation. In this option there might be a need for laser anneal to activate the P+. FIG. 26E illustrates the structure, following deposition and etch or CMP of a thick oxide 26E04, and deposition and partial etch-back of aluminum (or other metal to obtain an optimal Schottky or ohmic contact at 26E02) contacts 26E06, 26E12 and gate 26E02. If necessary, N+ contacts 26E06 and gate contact 26E02 can be masked and etched separately to allow a different metal to be deposited in each to create a Schottky or ohmic contact in the gate 26E02 and Schottky or ohmic connections in the N+ contacts 26E06 & 26E12. The thick oxide 26E04 is a non conducting dielectric material also filling the etched space 26B08 and 26C09 between the top transistors and could be comprised from other isolating material such as silicon nitride. Contact 26E12 is to allow a back bias of the transistor or can be connected to the gate 26E02 to provide a double gate JFET. Alternatively the connection for back bias could be included in layers of the pre-processed wafer or layer 808 connecting to layer 2510 from underneath. This flow enables the formation of mono-crystalline top ultra thin body planar JFET transistors with back bias or double gate capabilities that may be connected to the underlying multi-metal layer semiconductor device without exposing the underlying device to high temperature.

Figure 27A:
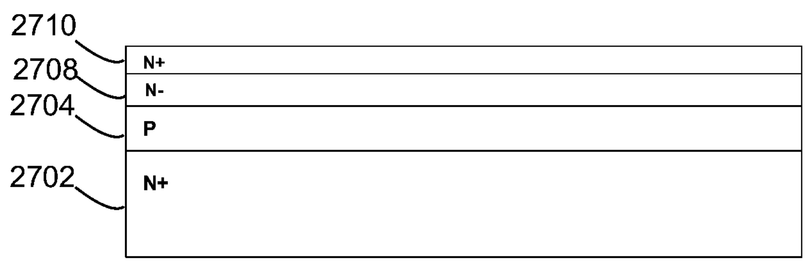
FIG. 27A, 27B is a drawing illustration of a pre-processed wafer used for a layer transfer.
Figure 27B:
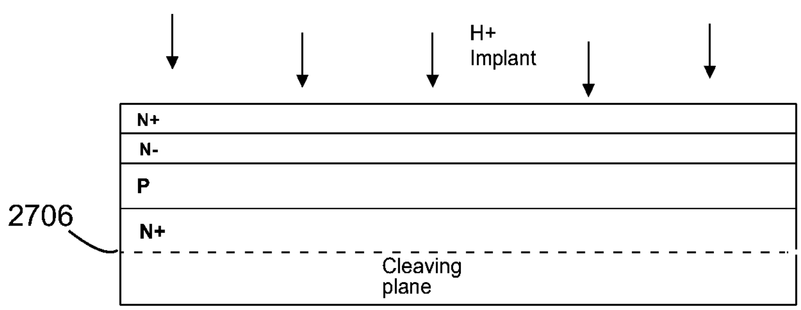

Another alternative is to preprocess the wafer used for layer transfer as illustrated in FIG. 27. FIG. 27A is a drawing illustration of a pre-processed wafer used for a layer transfer. An N+ wafer 2702 is processed to have "buried" layers either by ion implantation and activation anneals, or by diffusion to create a vertical structure to be the building block for NPN (or PNP) bipolar junction transistors. Multi layer epitaxial growth of the layers may also be utilized to create the doping layered structure. Starting with P layer 2704, then N− layer 2708, and finally N+ layer 2710 and then activating these layers by heating to a high activation temperature. FIG. 27B is a drawing illustration of the pre-processed wafer made ready for a layer transfer by a deposition or growth of an oxide (not shown) and by an implant of an atomic species, such as H+, preparing the SmartCut cleaving plane 2706 in the N+ region. Now a layer-transfer-flow should be performed to transfer the pre-processed layers, on top of pre-processed wafer or layer 808.

Figure 28A:
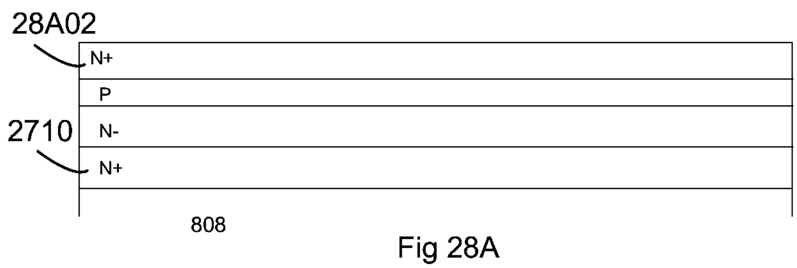
FIG. 28A-E are drawing illustrations of formations of top transistors.
Figure 28B:
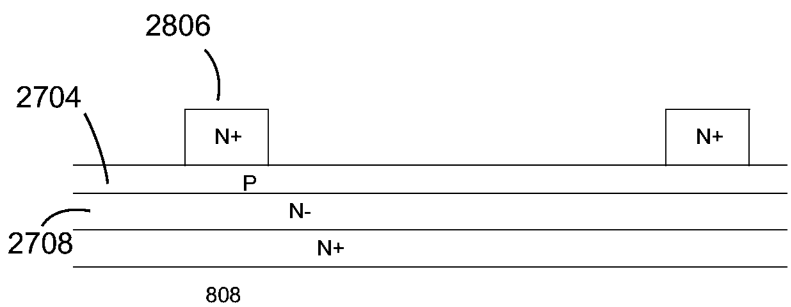
Figure 28C:
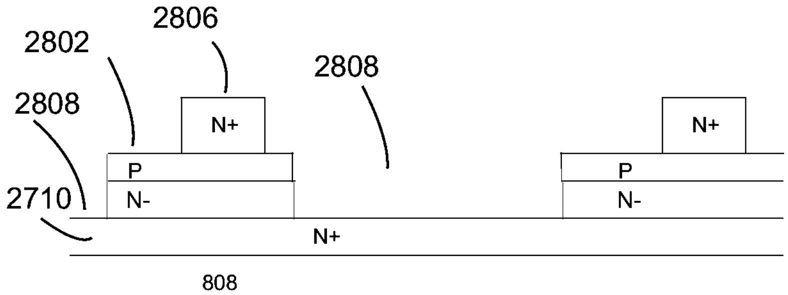
Figure 28D:
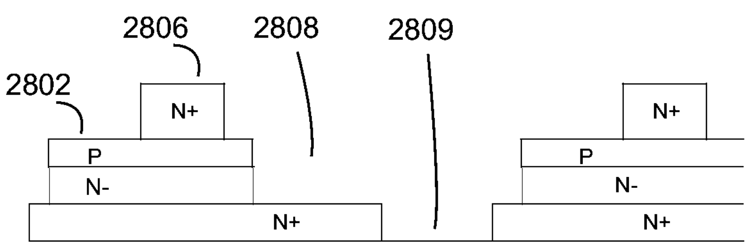
Figure 28E:
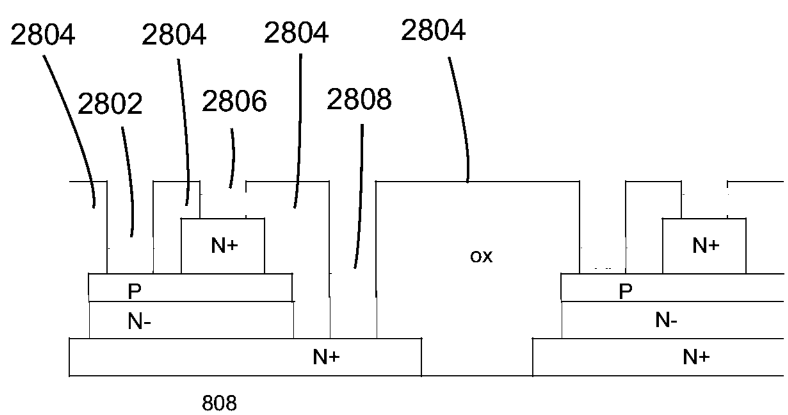

FIGS. 28A-28E are drawing illustrations of the formation of top layer bipolar junction transistors. FIG. 28A illustrates the layer transferred on top of wafer or layer 808 after the smart cut wherein the N+ 28A02 which was part of 2702 is now on top. Effectively at this point there is a giant transistor overlaying the entire wafer. The following steps are multiple etch steps as illustrated in FIG. 28B to 28D where the giant transistor is cut and defined as needed and aligned to the underlying layers of pre-processed wafer or layer 808. These etch steps also expose the different layers comprising the bipolar transistors to allow contacts to be made with the emitter 2806, base 2802 and collector 2808, and etching all the way to the top oxide of pre-processed wafer or layer 808 to isolate between transistors as 2809 in FIG. 28D. The top N+ doped layer 28A02 may be masked and etched as illustrated in FIG. 28B to form the emitter 2806. Then the p 2704 and N− 2706 doped layers may be masked and etched as illustrated in FIG. 28C to form the base 2802. Then the collector layer 2710 may be masked and etched to the top oxide of pre-processed wafer or layer 808, thereby creating isolation 2809 between transistors as illustrated in FIG. 28D. Then the entire structure may be covered with a Low Temperature Oxide 2804, the oxide planarized with CMP, and then masked and etched to form contacts to the emitter 2806, base 2802 and collector 2808 as illustrated in FIG. 28E. The oxide 2804 is a non conducting dielectric material also filling the etched space 2809 between the top transistors and could be comprised from other isolating material such as silicon nitride. This flow enables the formation of mono-crystalline top bipolar transistors that could be connected to the underlying multi-metal layer semiconductor device without exposing the underlying device to high temperature.

The bipolar transistors formed with reference to FIGS. 27 and 28 may be used to form analog or digital BiCMOS circuits where the CMOS transistors are on the substrate primary layer 802 with pre-processed wafer or layer 808 and the bipolar transistors may be formed in the transferred top layer.

Another class of devices that may be constructed partly at high temperature before layer transfer to a substrate with metal interconnects and then completed at low temperature after layer transfer is a junction-less transistor (JLT). For example, in deep sub micron processes copper metallization is utilized, so a high temperature would be above approximately 400° C., whereby a low temperature would be approximately 400° C. and below. The junction-less transistor structure avoids the sharply graded junctions needed as silicon technology scales, and provides the ability to have a thicker gate oxide for an equivalent performance when compared to a traditional MOSFET transistor. The junction-less transistor is also known as a nanowire transistor without junctions, or gated resistor, or nanowire transistor as described in a paper by Jean-Pierre Colinge, et. al., published in Nature Nanotechnology on Feb. 21, 2010. The junction-less transistors may be constructed whereby the transistor channel is a thin solid piece of evenly and heavily doped single crystal silicon. The doping concentration of the channel may be identical to that of the source and drain. The considerations may include the nanowire channel must be thin and narrow enough to allow for full depletion of the carriers when the device is turned off, and the channel doping must be high enough to allow a reasonable current to flow when the device is on. These considerations may lead to tight process variation boundaries for channel thickness, width, and doping for a reasonably obtainable gate work function and gate oxide thickness.

Figures 52A, 52B:
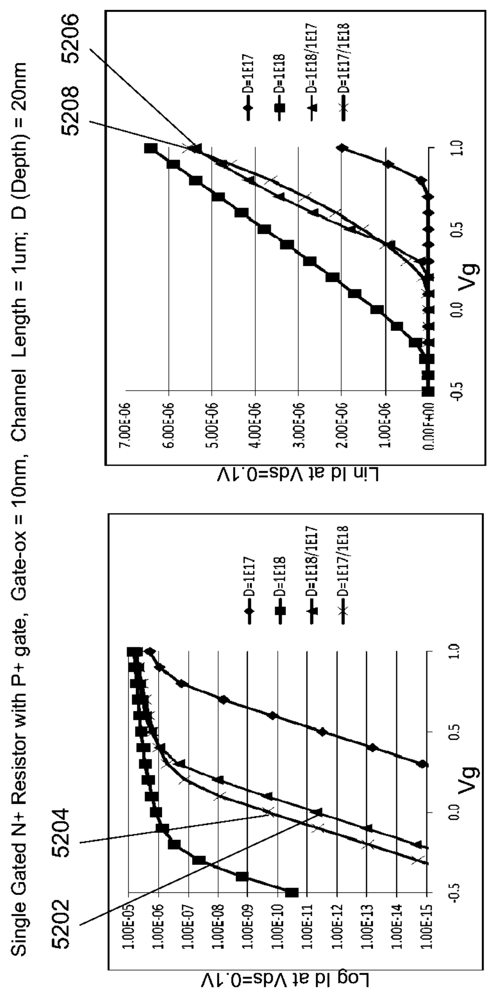
FIG. 52A, 52B are device simulations of a junction-less transistor.

One of the challenges of a junction-less transistor device is turning the channel off with minimal leakage at a zero gate bias. To enhance gate control over the transistor channel, the channel may be doped unevenly; whereby the heaviest doping is closest to the gate or gates and the channel doping is lighter the farther away from the gate electrode. One example would be where the center of a 2, 3, or 4 gate sided junction-less transistor channel is more lightly doped than the edges. This may enable much lower off currents for the same gate work function and control. FIGS. 52 A and 52B show, on logarithmic and linear scales respectively, simulated drain to source current Ids as a function of the gate voltage Vg for various junction-less transistor channel dopings where the total thickness of the n-channel is 20 nm. Two of the four curves in each figure correspond to evenly doping the 20 nm channel thickness to 1E17 and 1E18 atoms/cm3, respectively. The remaining two curves show simulation results where the 20 nm channel has two layers of 10 nm thickness each. In the legend denotations for the remaining two curves, the first number corresponds to the 10 nm portion of the channel that is the closest to the gate electrode. For example, the curve D=1E18/1E17 shows the simulated results where the 10 nm channel portion doped at 1E18 is closest to the gate electrode while the 10 nm channel portion doped at 1E17 is farthest away from the gate electrode. In FIG. 52 A, curves 5202 and 5204 correspond to doping patterns of D=1E18/1E17 and D=1E17/1E18, respectively. According to FIG. 52A, at a Vg of 0 volts, the off current for the doping pattern of D=1E18/1E17 is approximately 50 times lower than that of the reversed doping pattern of D=1E17/1E18. Likewise, in FIG. 52 B, curves 5206 and 5208 correspond to doping patterns of D=1E18/1E17 and D=1E17/1E18, respectively. FIG. 52B shows that at a Vg of 1 volt, the Ids of both doping patterns are within a few percent of each other.

The junction-less transistor channel may be constructed with even, graded, or discrete layers of doping. The channel may be constructed with materials other than doped mono-crystalline silicon, such as poly-crystalline silicon, or other semi-conducting, insulating, or conducting material, such as graphene or other graphitic material, and may be in combination with other layers of similar or different material. For example, the center of the channel may comprise a layer of oxide, or of lightly doped silicon, and the edges more heavily doped single crystal silicon. This may enhance the gate control effectiveness for the off state of the resistor, and may also increase the on-current due to strain effects on the other layer or layers in the channel. Strain techniques may also be employed from covering and insulator material above, below, and surrounding the transistor channel and gate. Lattice modifiers may also be employed to strain the silicon, such as an embedded SiGe implantation and anneal. The cross section of the transistor channel may be rectangular, circular, or oval shaped, to enhance the gate control of the channel. Alternatively, to optimize the mobility of the P-channel junction-less transistor in the 3D layer transfer method, the donor wafer may be rotated 90 degrees with respect to the acceptor wafer prior to bonding to facilitate the creation of the P-channel in the <110> silicon plane direction.

Figures 56A, 56B:
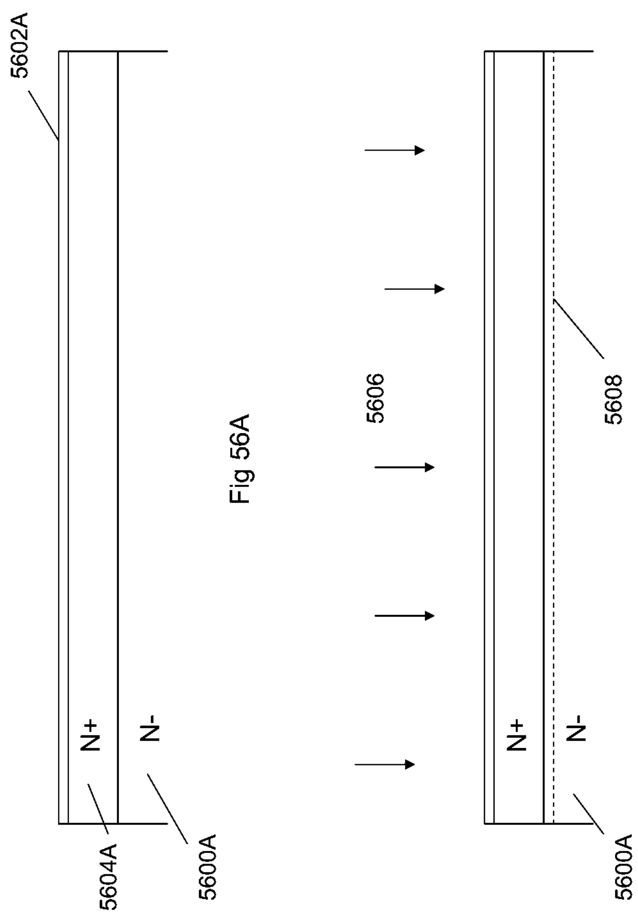
FIG. 56 A-M are drawing illustrations of the formation of a junction-less transistor.
Figure 56C:
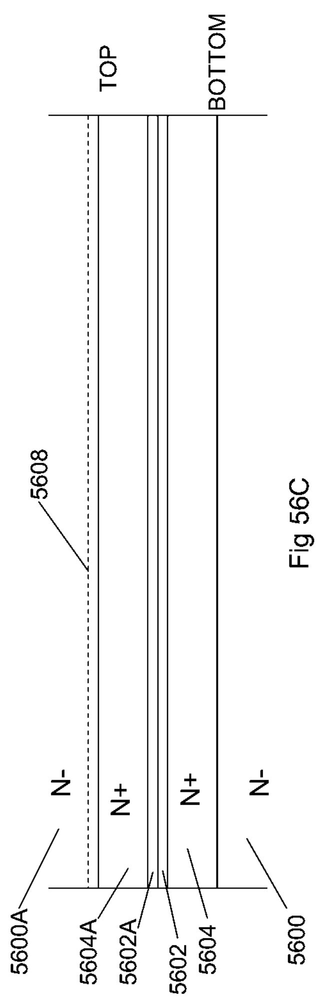
Figure 56D:
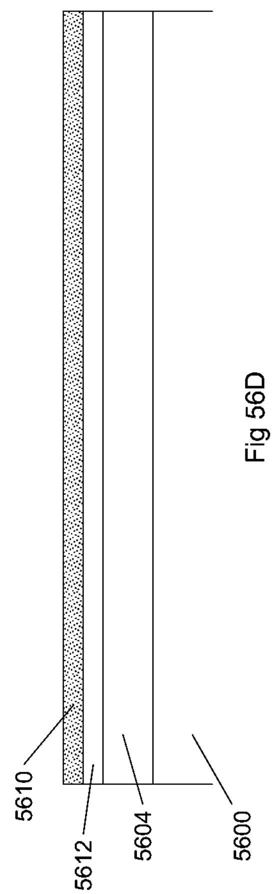

To construct an n-type 4-sided gated junction-less transistor a silicon wafer is preprocessed to be used for layer transfer as illustrated in FIG. 56A-56G. These processes may be at temperatures above 400 degree Centigrade as the layer transfer to the processed substrate with metal interconnects has yet to be done. As illustrated in FIG. 56A, an N− wafer 5600A is processed to have a layer of N+ 5604A, by implant and activation, by an N+ epitaxial growth, or may be a deposited layer of heavily N+ doped polysilicon. A gate oxide 5602A may be grown before or after the implant, to a thickness approximately half of the desired final top-gate oxide thickness. FIG. 56B is a drawing illustration of the pre-processed wafer made ready for a layer transfer by an implant 5606 of an atomic species, such as H+, preparing the "cleaving plane" 5608 in the N− region 5600A of the substrate and plasma or other surface treatments to prepare the oxide surface for wafer oxide to oxide bonding. Another wafer is prepared as above without the H+ implant and the two are bonded as illustrated in FIG. 56C, to transfer the pre-processed single crystal N− silicon with N+ layer and half gate oxide, on top of a similarly pre-processed, but not cleave implanted, N− wafer 5600 with N+ layer 5604 and oxide 5602. The top wafer is cleaved and removed from the bottom wafer. This top wafer may now also be processed and reused for more layer transfers to form the resistor layer. The remaining top wafer N− and N+ layers are chemically and mechanically polished to a very thin N+ silicon layer 5610 as illustrated in FIG. 56D. This thin N+ doped silicon layer 5610 is on the order of 5 to 40 nm thick and will eventually form the resistor that will be gated on four sides.

Figure 56E:
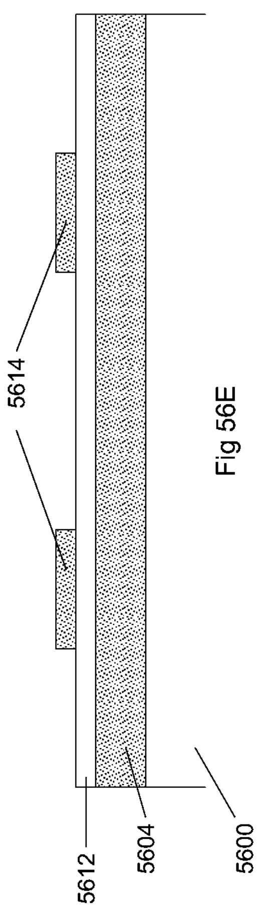

The two 'half' gate oxides 5602, 5602A may now be atomically bonded together to form the gate oxide 5612, which will eventually become the top gate oxide of the junction-less transistor in FIG. 56E. A high temperature anneal may be performed to remove any residual oxide or interface charges.

Alternatively, the wafer that becomes the bottom wafer in FIG. 56C may be constructed wherein the N+ layer 5604 may be formed with heavily doped polysilicon and the half gate oxide 5602 is deposited or grown prior to layer transfer. The bottom wafer N+ silicon or polysilicon layer 5604 will eventually become the top-gate of the junction-less transistor.

Figure 56F:
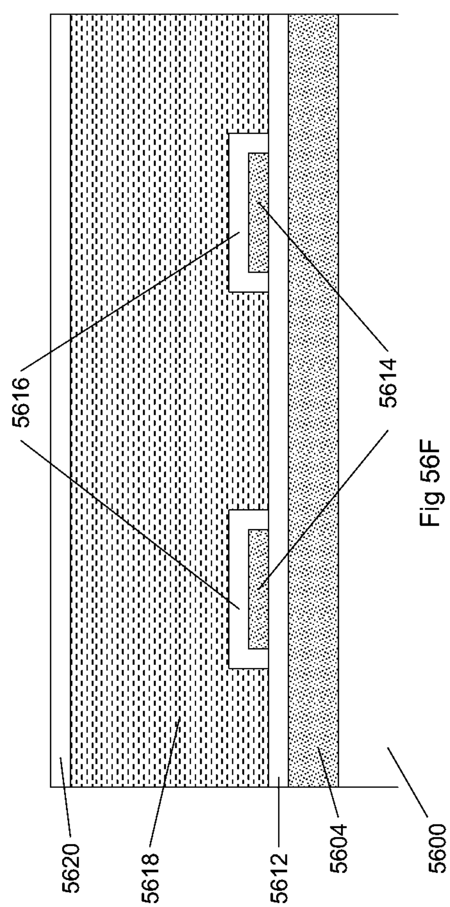
Figure 56G:
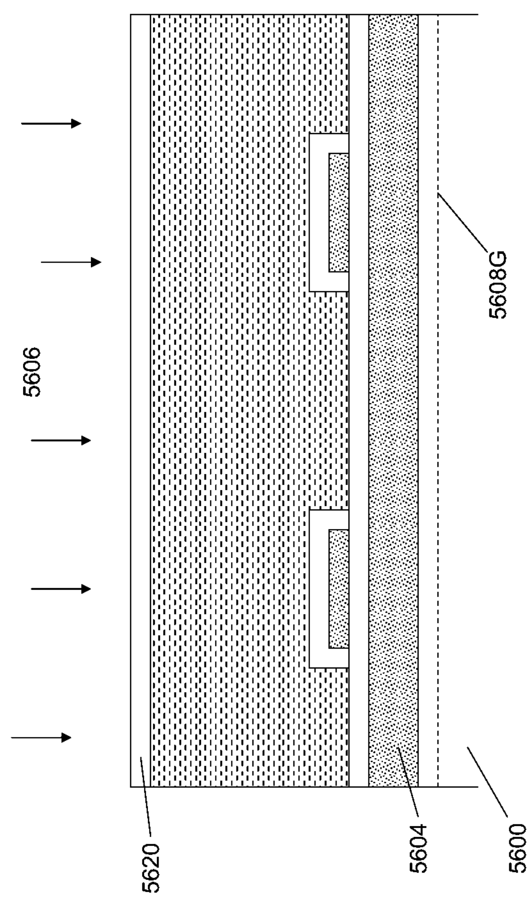
Figure 56H:
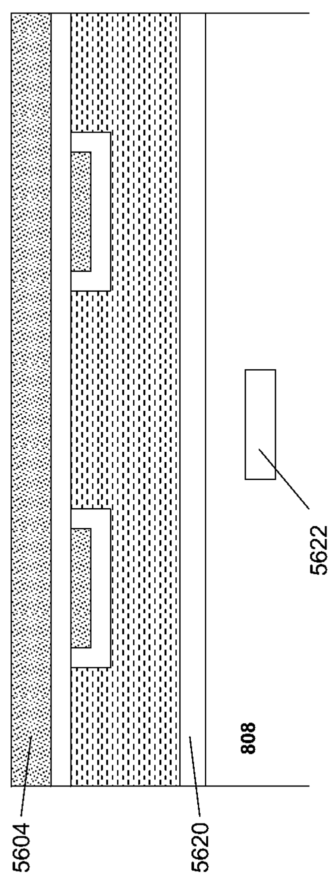

As illustrated in FIGS. 56E to 56G, the wafer is conventionally processed, at temperatures higher than 400° C. as necessary, in preparation to layer transfer the junction-less transistor structure to the processed 'house' wafer 808. A thin oxide may be grown to protect the thin resistor silicon 5610 layer top, and then parallel wires 5614 of repeated pitch of the thin resistor layer may be masked and etched as illustrated in FIG. 56E and then the photoresist is removed. The thin oxide, if present, may be striped in a dilute hydrofluoric acid (HF) solution and a conventional gate oxide 5616 is grown and polysilicon 5618, doped or undoped, is deposited as illustrated in FIG. 56F. The polysilicon is chemically and mechanically polished (CMP'ed) flat and a thin oxide 5620 is grown or deposited to facilitate a low temperature oxide to oxide wafer bonding in the next step. The polysilicon 5618 may be implanted for additional doping either before or after the CMP. This polysilicon will eventually become the bottom and side gates of the junction-less transistor. FIG. 56G is a drawing illustration of the wafer being made ready for a layer transfer by an implant 5606 of an atomic species, such as H+, preparing the "cleaving plane" 5608G in the N− region 5600 of the substrate and plasma or other surface treatments to prepare the oxide surface for wafer oxide to oxide bonding. The acceptor wafer 808 with logic transistors and metal interconnects is prepared for a low temperature oxide to oxide wafer bond with surface treatments of the top oxide and the two are bonded as illustrated in FIG. 56H. The top donor wafer is cleaved and removed from the bottom acceptor wafer 808 and the top N− substrate is removed by CMP (chemical mechanical polish). A metal interconnect strip 5622 in the house 808 is also illustrated in FIG. 56H.

Figure 56I:
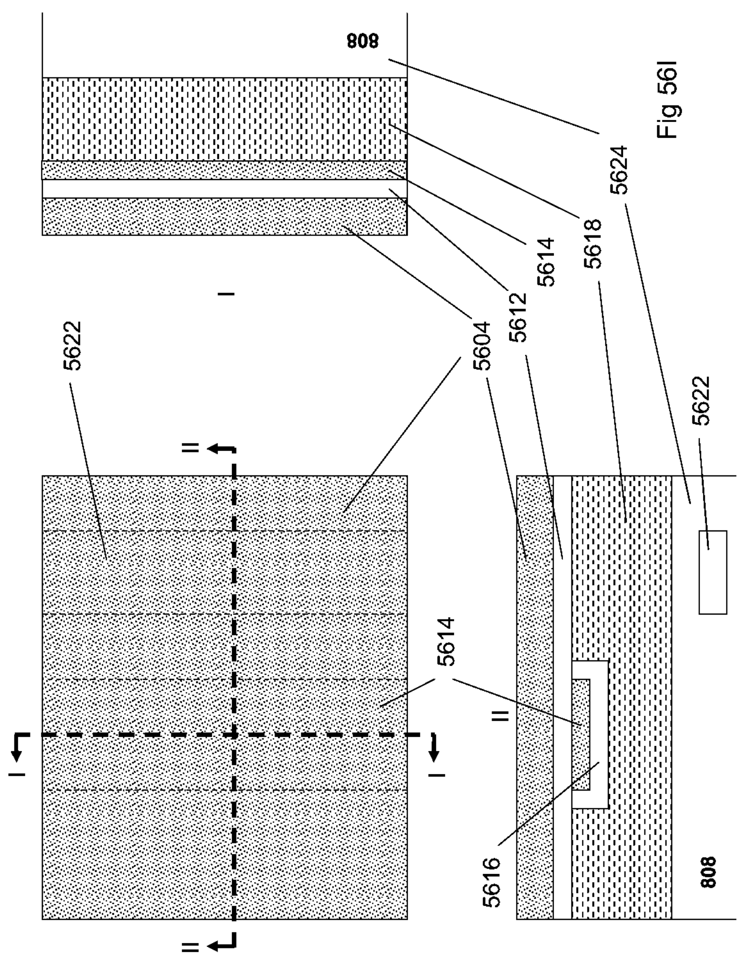

FIG. 56I is a top view of a wafer at the same step as FIG. 56H with two cross-sectional views I and II. The N+ layer 5604, which will eventually form the top gate of the resistor, and the top gate oxide 5612 will gate one side of the resistor line 5614, and the bottom and side gate oxide 5616 with the polysilicon bottom and side gates 5618 will gate the other three sides of the resistor 5614. The logic house wafer 808 has a top oxide layer 5624 that also encases the top metal interconnect strip 5622, extent shown as dotted lines in the top view.

Figure 56J:
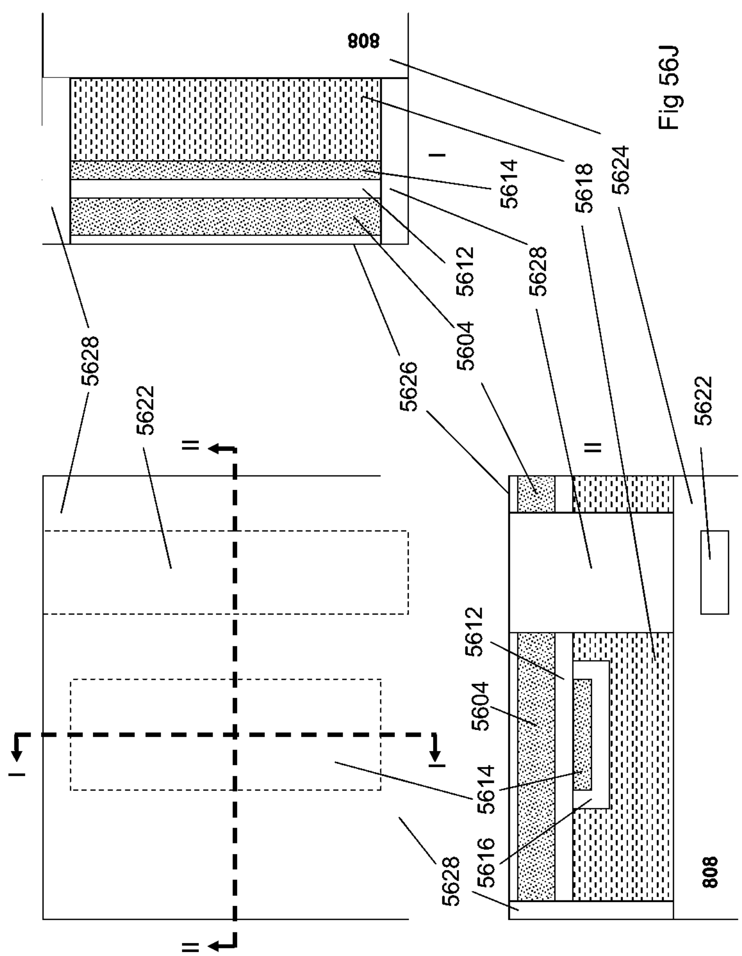
Figure 56K:
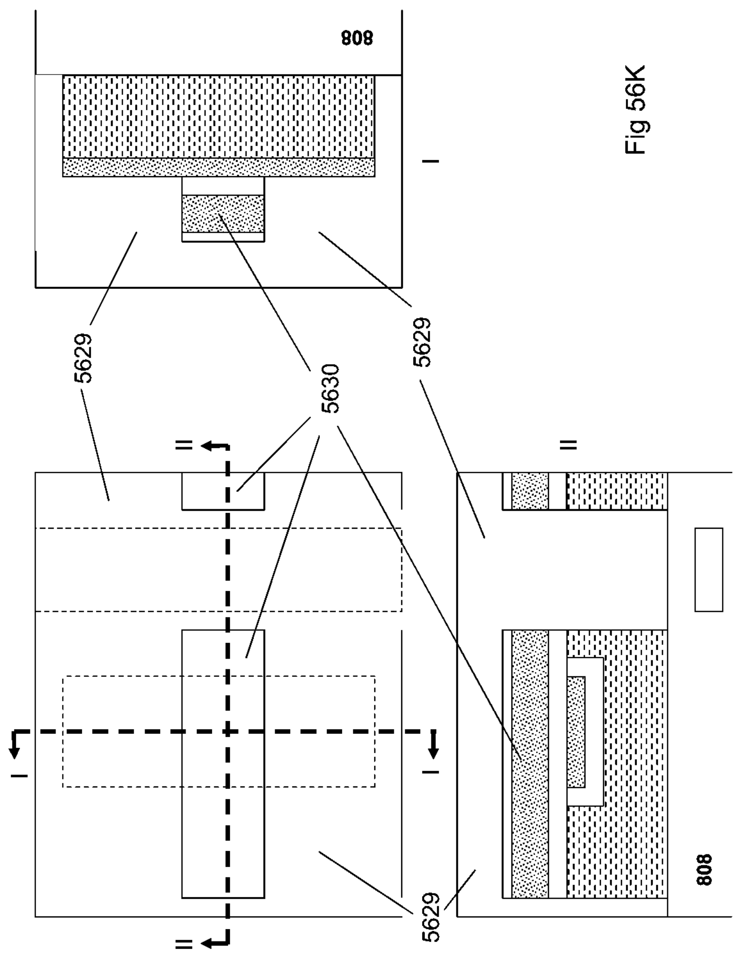

In FIG. 56J, a polish stop layer 5626 of a material such as oxide and silicon nitride is deposited on the top surface of the wafer, and isolation openings 5628 are masked and etched to the depth of the house 808 oxide 5624 to fully isolate transistors. The isolation openings 5628 are filled with a low temperature gap fill oxide, and chemically and mechanically polished (CMP'ed) flat. The top gate 5630 is masked and etched as illustrated in FIG. 56K, and then the etched openings 5629 are filled with a low temperature gap fill oxide deposition, and chemically and mechanically (CMP'ed) polished flat, then an additional oxide layer is deposited to enable interconnect metal isolation.

Figure 56L:
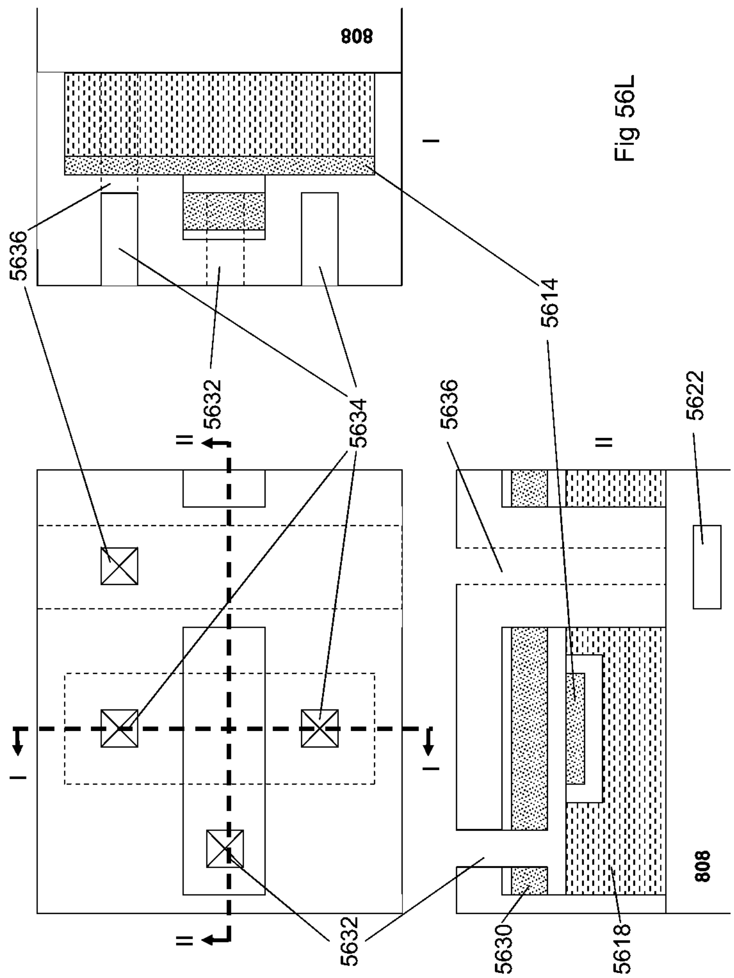

The contacts are masked and etched as illustrated in FIG. 56L. The gate contact 5632 is masked and etched, so that the contact etches through the top gate layer 5630, and during the metal opening mask and etch process the gate oxide is etched and the top 5630 and bottom 5618 gates are connected together. The contacts 5634 to the two terminals of the resistor layer 5614 are masked and etched. And then the thru vias 5636 to the house wafer 808 and metal interconnect strip 5622 are masked and etched.

Figure 56M:
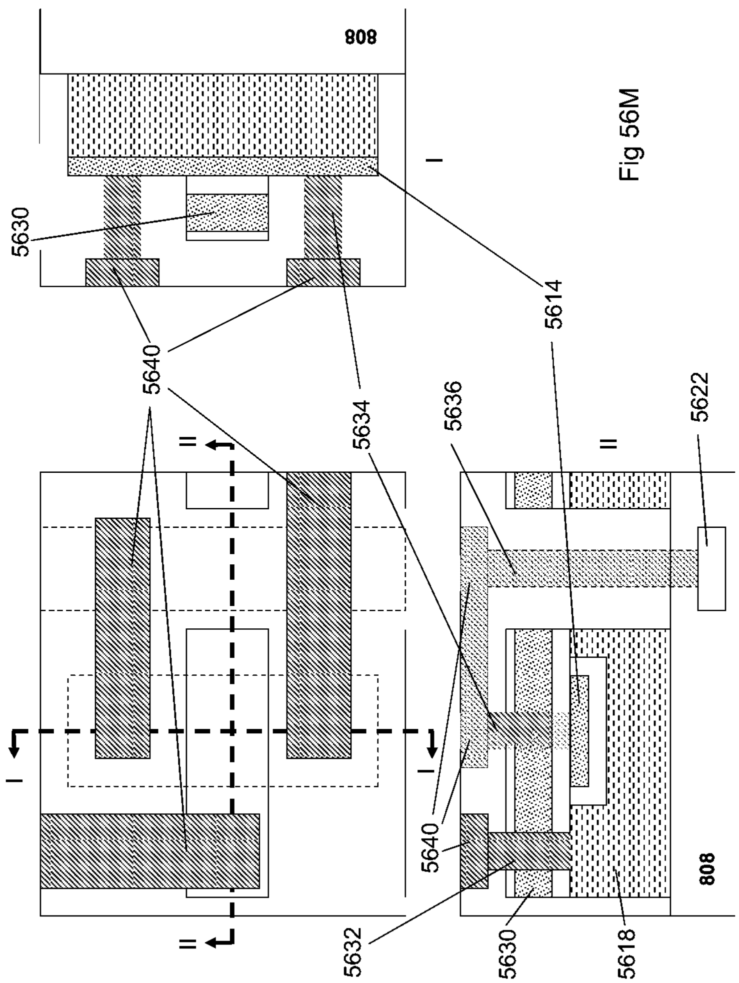

As illustrated in FIG. 56M, the metal lines 5640 are mask defined and etched, filled with barrier metals and copper interconnect, and CMP'ed in a normal metal interconnect scheme, thereby completing the contact via 5632 simultaneous coupling to the top 5630 and bottom 5618 gates, the two terminals 5634 of the resistor layer 5614, and the thru via to the house wafer 808 metal interconnect strip 5622. This flow enables the formation of a mono-crystalline 4-sided gated junction-less transistor that could be connected to the underlying multi-metal layer semiconductor device without exposing the underlying devices to high temperature.

Alternatively, as illustrated in FIGS. 96A to 96J, an n-channel 4-sided gated junction-less transistor (JLT) may be constructed that is suitable for 3D IC manufacturing. 4-sided gated JLTs can also be referred to as gate-all around JLTs or silicon nano-wire JLTs.

Figure 96A:
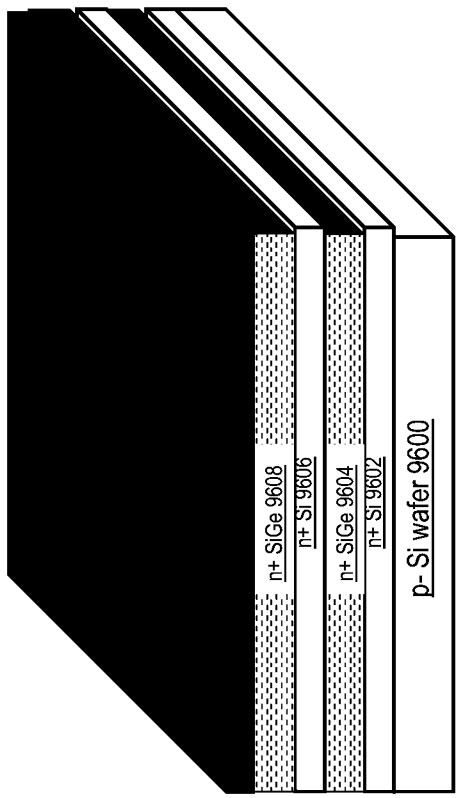

As illustrated in FIG. 96A, a P− (shown) or N− substrate donor wafer 9600 may be processed to comprise wafer sized layers of N+ doped silicon 9602 and 9606, and wafer sized layers of n+SiGe 9604 and 9608. Layers 9602, 9604, 9606, and 9608 may be grown epitaxially and are carefully engineered in terms of thickness and stoichiometry to keep the defect density due to the lattice mismatch between Si and SiGe low. The stoichiometry of the SiGe may be unique to each SiGe layer to provide for different etch rates as will be described later. Some techniques for achieving this include keeping the thickness of the SiGe layers below the critical thickness for forming defects. The top surface of donor wafer 9600 may be prepared for oxide wafer bonding with a deposition of an oxide 9613. These processes may be done at temperatures above approximately 400° C. as the layer transfer to the processed substrate with metal interconnects has yet to be done. A wafer sized layer denotes a continuous layer of material or combination of materials that extends across the wafer to the full extent of the wafer edges and may be approximately uniform in thickness. If the wafer sized layer compromises dopants, then the dopant concentration may be substantially the same in the x and y direction across the wafer, but can vary in the z direction perpendicular to the wafer surface.

Figure 96B:
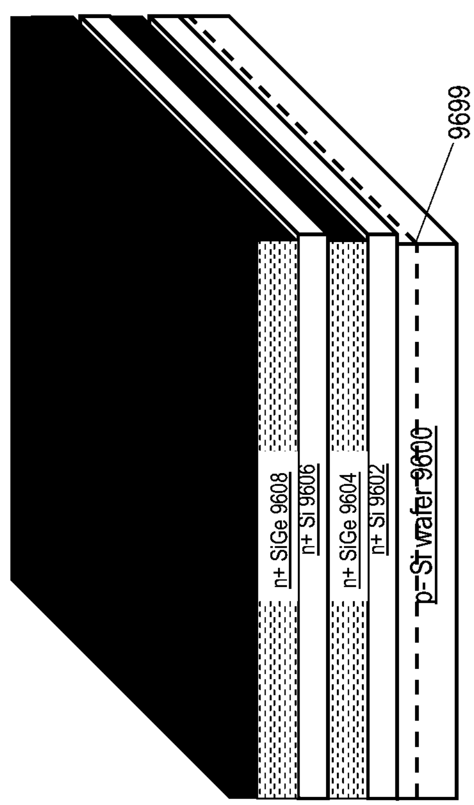

As illustrated in FIG. 96B, a layer transfer demarcation plane 9699 (shown as a dashed line) may be formed in donor wafer 9600 by hydrogen implantation or other methods as previously described.

Figure 96C:
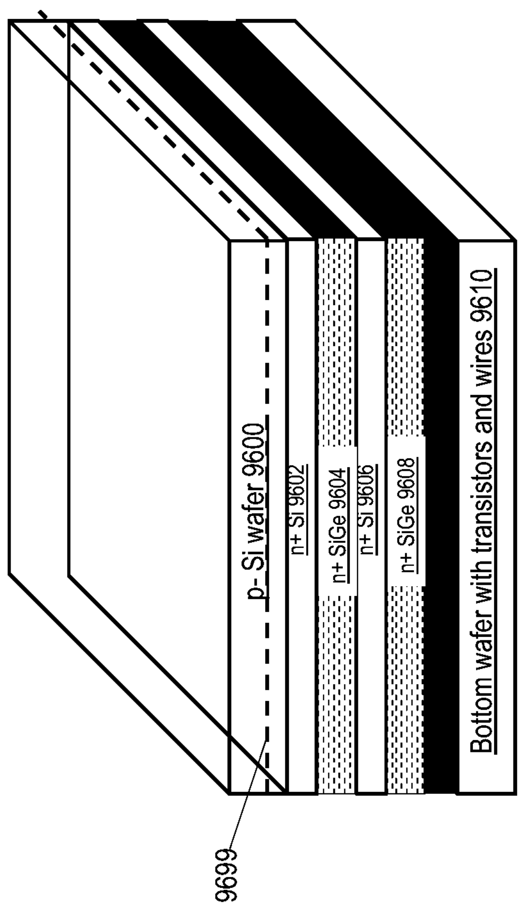

As illustrated in FIG. 96C, both the donor wafer 9600 and acceptor wafer 9610 top layers and surfaces may be prepared for wafer bonding as previously described and then donor wafer 9600 is flipped over, aligned to the acceptor wafer 9610 alignment marks (not shown) and bonded together at a low temperature (less than approximately 400° C.). Oxide 9613 from the donor wafer and the oxide of the surface of the acceptor wafer 9610 are thus atomically bonded together are designated as oxide 9614.

Figure 96D:
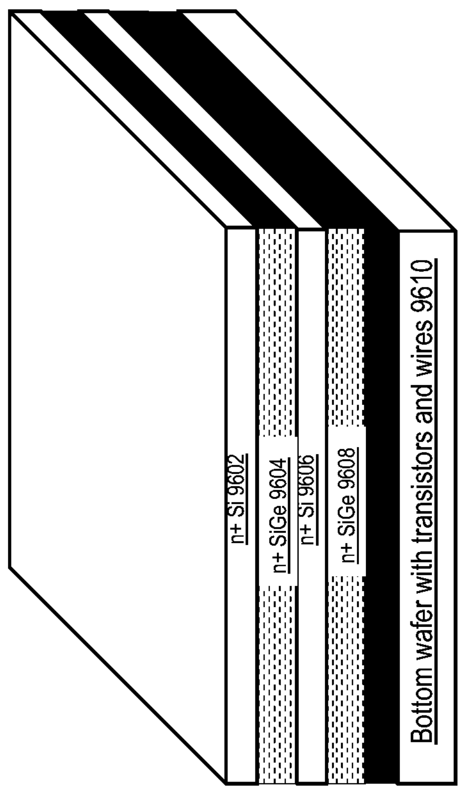

As illustrated in FIG. 96D, the portion of the P− donor wafer substrate 9600 that is above the layer transfer demarcation plane 9699 may be removed by cleaving and polishing, etching, or other low temperature processes as previously described. A CMP process may be used to remove the remaining P− layer until the N+ silicon layer 9602 is reached. This process of an ion implanted atomic species, such as Hydrogen, forming a layer transfer demarcation plane, and subsequent cleaving or thinning, may be called 'ion-cut'. Acceptor wafer 9610 may have similar meanings as wafer 808 previously described with reference to FIG. 8.

Figure 96E:
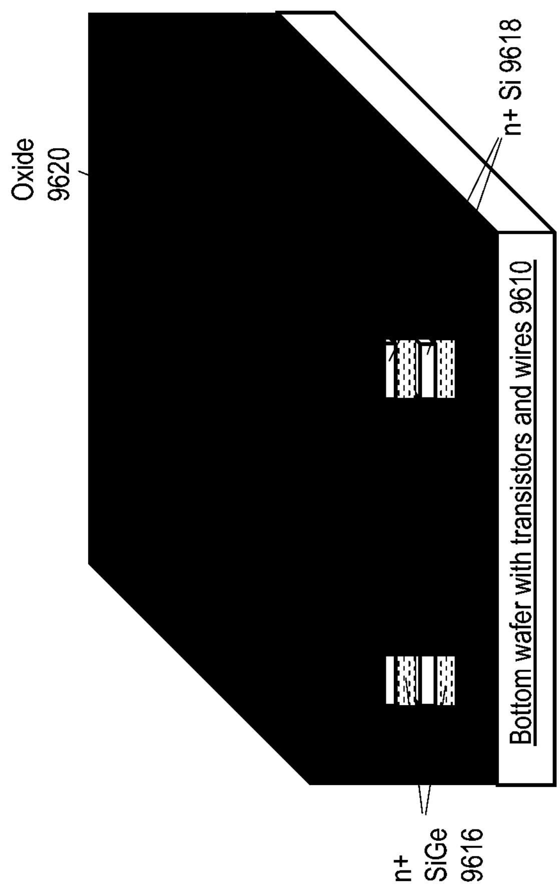

As illustrated in FIG. 96E, stacks of N+ silicon and n+SiGe regions that will become transistor channels and gate areas may be formed by lithographic definition and plasma/RIE etching of N+ silicon layers 9602 & 9606 and n+SiGe layers 9604 & 9608. The result is stacks of n+SiGe 9616 and N+ silicon 9618 regions. The isolation between stacks may be filled with a low temperature gap fill oxide 9620 and chemically and mechanically polished (CMP'ed) flat. This will fully isolate the transistors from each other. The stack ends are exposed in the illustration for clarity of understanding.

Figure 96F:
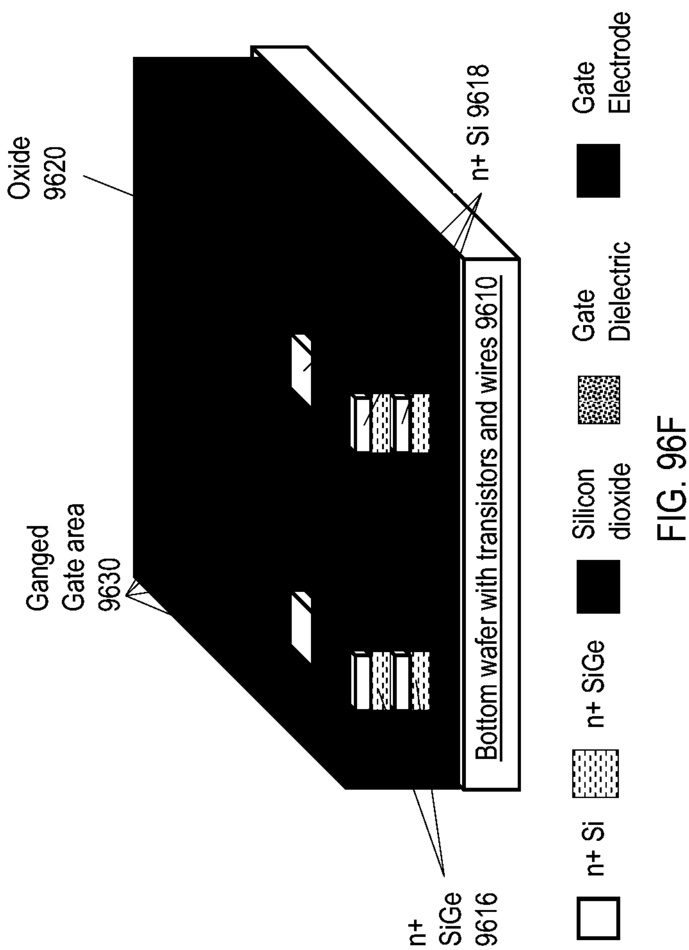

As illustrated in FIG. 96F, eventual ganged or common gate area 9630 may be lithographically defined and oxide etched. This will expose the transistor channels and gate area stack sidewalls of alternating N+ silicon 9618 and n+SiGe 9616 regions to the eventual ganged or common gate area 9630. The stack ends are exposed in the illustration for clarity of understanding.

Figure 96G:
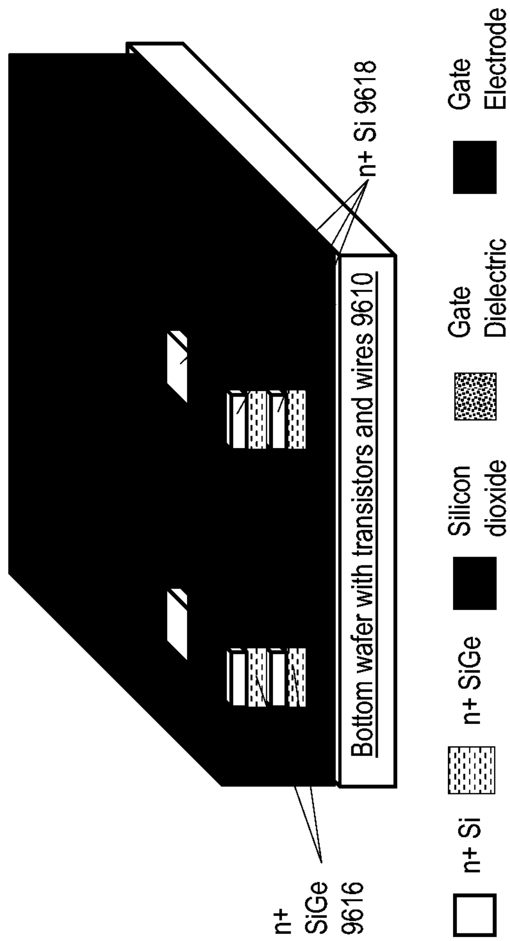

As illustrated in FIG. 96G, the exposed n+SiGe regions 9616 may be removed by a selective etch recipe that does not attack the N+ silicon regions 9618. This creates air gaps between the N+ silicon regions 9618 in the eventual ganged or common gate area 9630. Such etching recipes are described in "High performance 5 nm radius twin silicon nanowire MOSFET(TSNWFET): Fabrication on bulk Si wafer, characteristics, and reliability," in *Proc. IEDM Tech. Dig.*, 2005, pp. 717-720 by S. D. Suk, et. al. The n+SiGe layers farthest from the top edge may be stoichiometrically crafted such that the etch rate of the layer (now region) farthest from the top (such as n+SiGe layer 9608) may etch slightly faster than the layer (now region) closer to the top (such as n+SiGe layer 9604), thereby equalizing the eventual gate lengths of the two stacked transistors. The stack ends are exposed in the illustration for clarity of understanding.

Figure 96H:
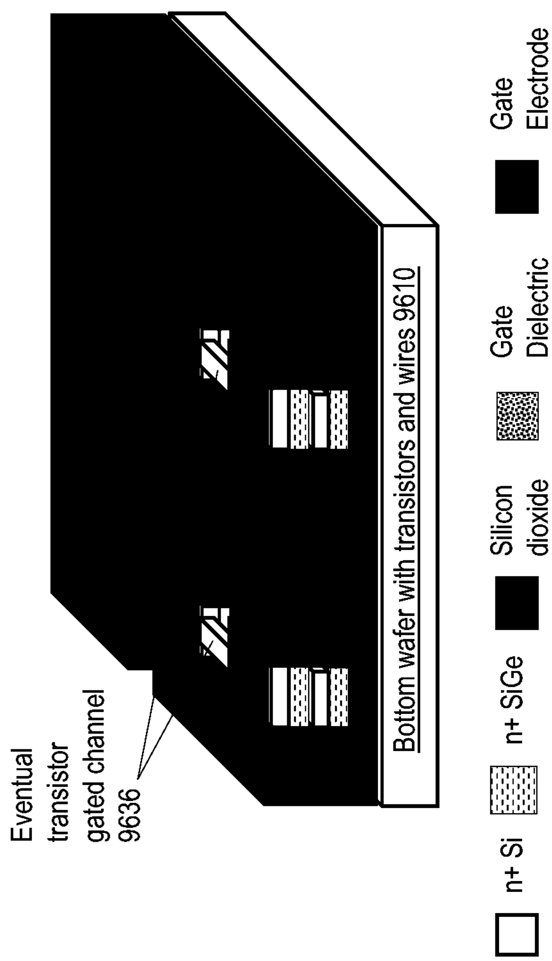

As illustrated in FIG. 96H, an optional step of reducing the surface roughness, rounding the edges, and thinning the diameter of the N+ silicon regions 9618 that are exposed in the ganged or common gate area may utilize a low temperature oxidation and subsequent HF etch removal of the oxide just formed. This may be repeated multiple times. Hydrogen may be added to the oxidation or separately utilized atomically as a plasma treatment to the exposed N+ silicon surfaces. The result may be a rounded silicon nanowire-like structure to form the eventual transistor gated channel 9636. The stack ends are exposed in the illustration for clarity of understanding.

Figure 96I:
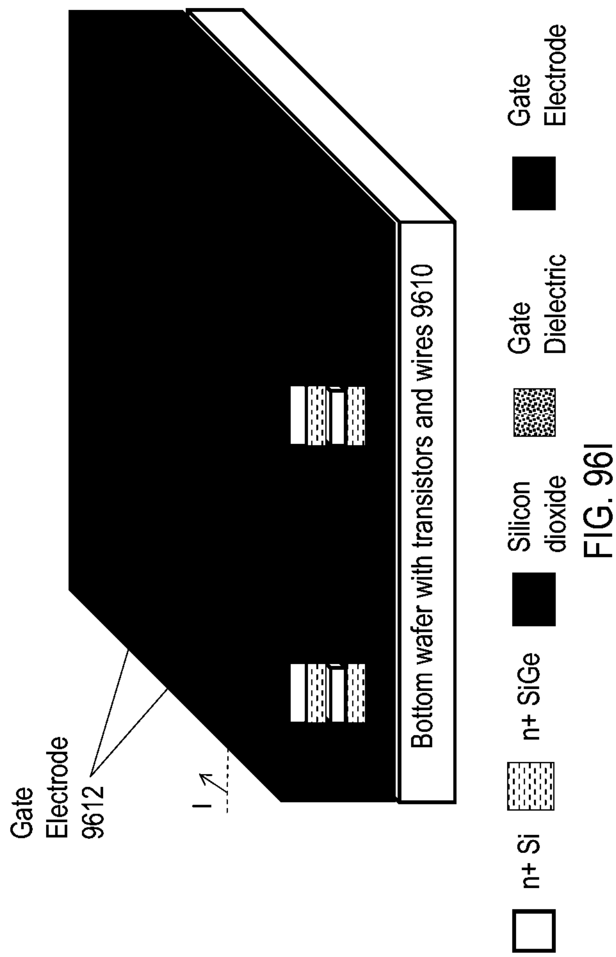

As illustrated in FIG. 96I a low temperature based Gate Dielectric 9611 may be deposited and densified to serve as the junction-less transistor gate oxide. Alternatively, a low temperature microwave plasma oxidation of the eventual transistor gated channel 9636 silicon surfaces may serve as the JLT gate oxide or an atomic layer deposition (ALD) technique may be utilized to form the HKMG gate oxide as previously described. Then deposition of a low temperature gate material 9612, such as P+ doped amorphous silicon, may be performed. Alternatively, a HKMG gate structure may be formed as described previously. A CMP is performed after the gate material deposition. The stack ends are exposed in the illustration for clarity of understanding.

Figure 96J:
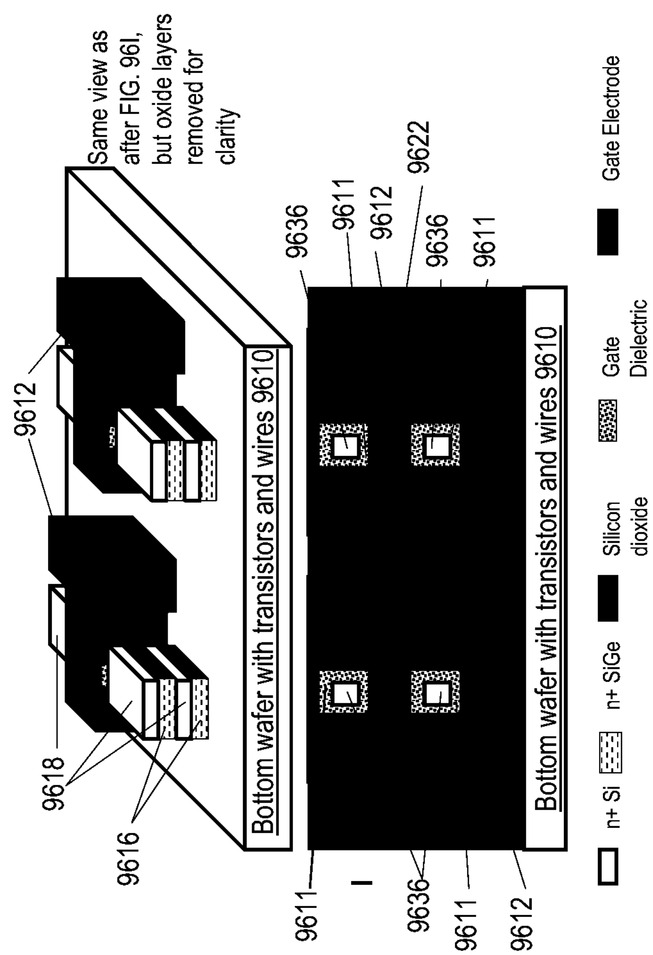

FIG. 96J shows the complete JLT transistor stack formed in FIG. 96I with the oxide removed for clarity of viewing, and a cross-sectional cut I of FIG. 96I. Gate 9612 and gate dielectric 9611 surround the transistor gated channel 9636 and each ganged transistor stack is isolated from one another by oxide 9622. The source and drain connections of the transistor stacks can be made to the N+ Silicon 9618 and n+SiGe 9616 regions that are not covered by the gate 9612.

Contacts to the 4-sided gated JLT's source, drain, and gate may be made with conventional Back end of Line (BEOL) processing as described previously and coupling from the formed JLTs to the acceptor wafer may be accomplished with formation of a thru layer via (TLV) connection to an acceptor wafer metal interconnect pad. This flow enables the formation of a mono-crystalline silicon channel 4-sided gated junction-less transistor that may be formed and connected to the underlying multi-metal layer semiconductor device without exposing the underlying devices to a high temperature.

A p channel 4-sided gated JLT may be constructed as above with the N+ silicon layers 9602 and 9608 formed as P+ doped, and the gate metals 9612 are of appropriate work function to shutoff the p channel at a gate voltage of zero.

While the process flow shown in FIG. 96A-J illustrates the key steps involved in forming a four-sided gated JLT with 3D stacked components, it is conceivable to one skilled in the art that changes to the process can be made. For example, process steps and additional materials/regions to add strain to JLTs may be added. Or N+SiGe layers 9604 and 9608 may instead be comprised of p+SiGe or undoped SiGe and the selective etchant formula adjusted. Furthermore, more than two layers of chips or circuits can be 3D stacked. Also, there are many methods to construct silicon nanowire transistors. These are described in "High performance and highly uniform gate-all-around silicon nanowire MOSFETs with wire size dependent scaling," *Electron Devices Meeting* (*IEDM*), 2009 *IEEE International*, vol., no., pp. 1-4, 7-9 Dec. 2009 by Bangsaruntip, S.; Cohen, G. M.; Majumdar, A.; et al. ("Bangsaruntip") and in "High performance 5 nm radius twin silicon nanowire MOSFET (TSNWFET): Fabrication on bulk Si wafer, characteristics, and reliability," in *Proc. IEDM Tech. Dig.*, 2005, pp. 717-720 by S. D. Suk, S.-Y. Lee, S.-M. Kim, et al. ("Suk"). Contents of these publications are incorporated in this document by reference. The techniques described in these publications can be utilized for fabricating four-sided gated JLTs.

Alternatively, an n-type 3-sided gated junction-less transistor may be constructed as illustrated in FIGS. 57 A to 57G. A silicon wafer is preprocessed to be used for layer transfer as illustrated in FIGS. 57A and 57B. These processes may be at temperatures above 400° C. as the layer transfer to the processed substrate with metal interconnects has yet to be done. As illustrated in FIG. 57A, an N− wafer 5700 is processed to have a layer of N+ 5704, by implant and activation, by an N+ epitaxial growth, or may be a deposited layer of heavily N+ doped polysilicon. A screen oxide 5702 may be grown before the implant to protect the silicon from implant contamination and to provide an oxide surface for later wafer to wafer bonding. FIG. 57B is a drawing illustration of the pre-processed wafer made ready for a layer transfer by an implant 5707 of an atomic species, such as H+, preparing the "cleaving plane" 5708 in the N− region 5700 of the donor substrate and plasma or other surface treatments to prepare the oxide surface for wafer oxide to oxide bonding. The acceptor wafer or house 808 with logic transistors and metal interconnects is prepared for a low temperature oxide to oxide wafer bond with surface treatments of the top oxide and the two are bonded as illustrated in FIG. 57C. The top donor wafer is cleaved and removed from the bottom acceptor wafer 808 and the top N− substrate is chemically and mechanically polished (CMP'ed) into the N+ layer 5704 to form the top gate layer of the junction-less transistor. A metal interconnect layer 5706 in the acceptor wafer or house 808 is also illustrated in FIG. 57C. For illustration simplicity and clarity, the donor wafer oxide layer 5702 will not be drawn independent of the acceptor wafer or house 808 oxides in FIGS. 57D through 57G.

Figures 57A, 57B:
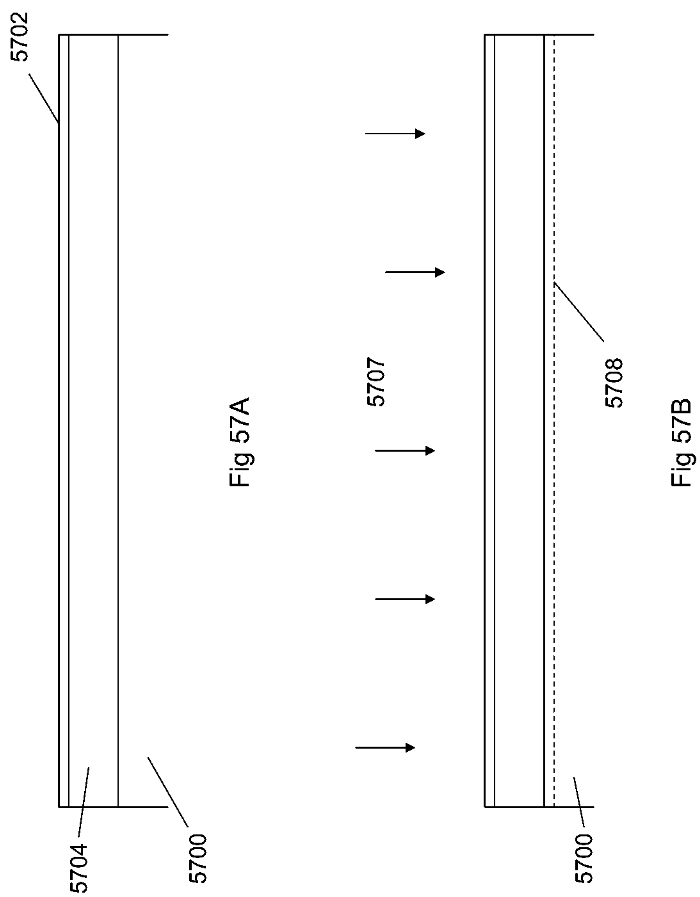
FIG. 57 A-G are drawing illustrations of the formation of a junction-less transistor.
Figure 57C:
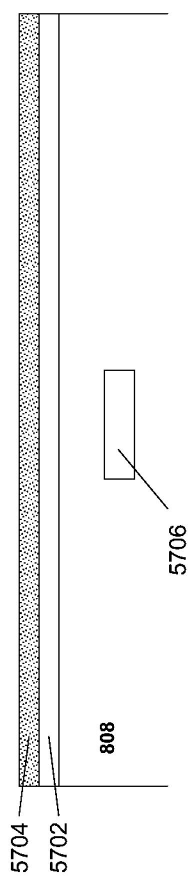
Figure 57D:
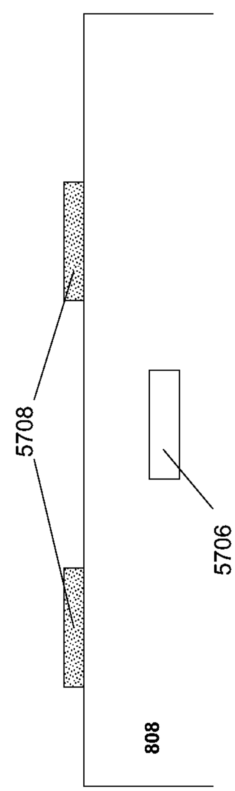

A thin oxide may be grown to protect the thin transistor silicon 5704 layer top, and then the transistor channel elements 5708 are masked and etched as illustrated in FIG. 57D and then the photoresist is removed. The thin oxide is striped in a dilute HF solution and a low temperature based Gate Dielectric may be deposited and densified to serve as the junction-less transistor gate oxide 5710. Alternatively, a low temperature microwave plasma oxidation of the silicon surfaces may serve as the junction-less transistor gate oxide 5710 or an atomic layer deposition (ALD) technique may be utilized.

Figure 57E:
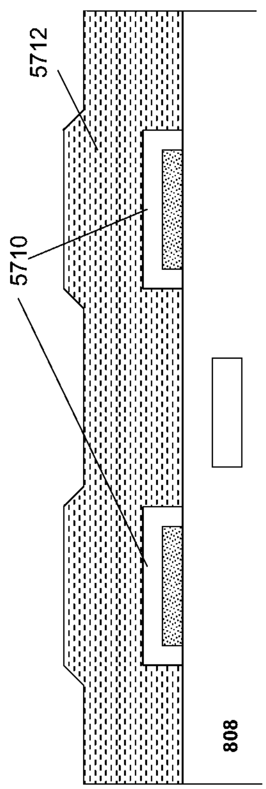
Figure 57F:
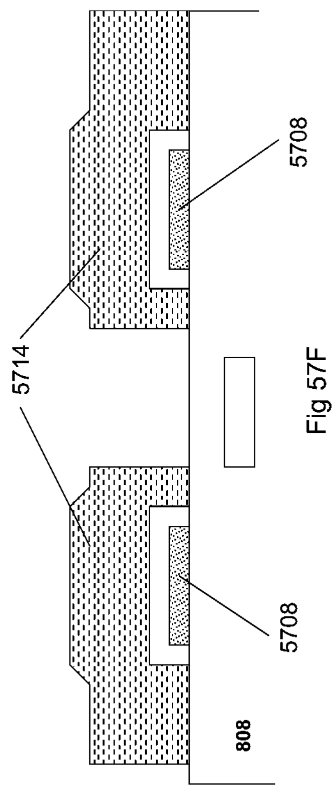

Then deposition of a low temperature gate material 5712, such as doped or undoped amorphous silicon as illustrated in FIG. 57E, may be performed. Alternatively, a high-k metal gate structure may be formed as described previously. The gate material 5712 is then masked and etched to define the top and side gates 5714 of the transistor channel elements 5708 in a crossing manner, generally orthogonally as shown in FIG. 57F.

Figure 57G:
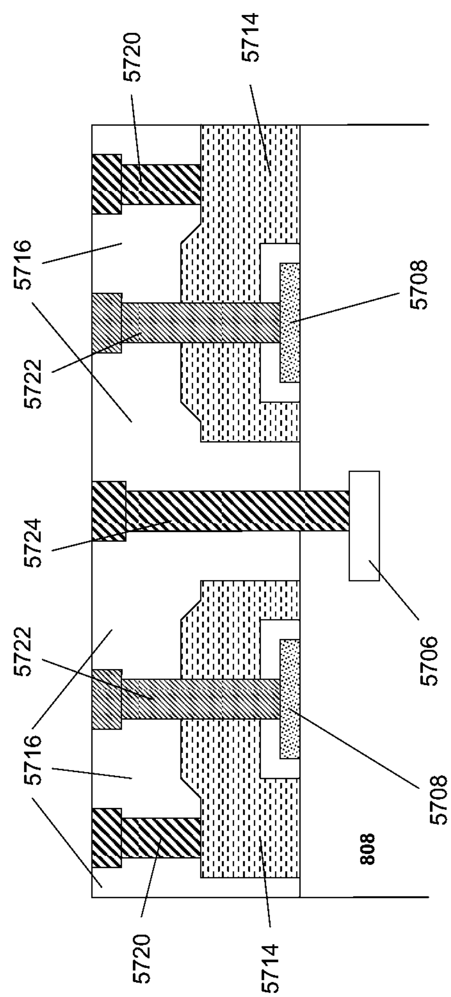

Then the entire structure may be covered with a Low Temperature Oxide 5716, the oxide planarized with chemical mechanical polishing, and then contacts and metal interconnects may be masked and etched as illustrated FIG. 57G. The gate contact 5720 connects to the gate 5714. The two transistor channel terminal contacts 5722 independently connect to transistor element 5708 on each side of the gate 5714. The thru via 5724 connects the transistor layer metallization to the acceptor wafer or house 808 at interconnect 5706. This flow enables the formation of mono-crystalline 3-sided gated junction-less transistor that may be formed and connected to the underlying multi-metal layer semiconductor device without exposing the underlying devices to a high temperature.

Figure 58A:
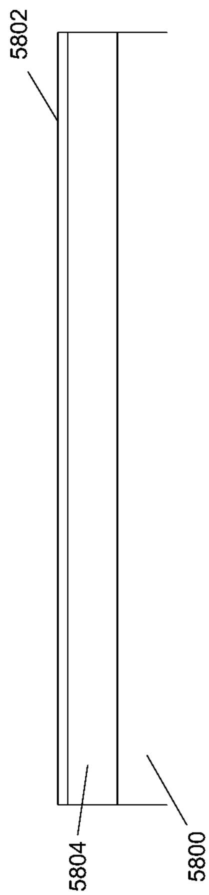
FIG. 58 A-G are drawing illustrations of the formation of a junction-less transistor.
Figure 58B:
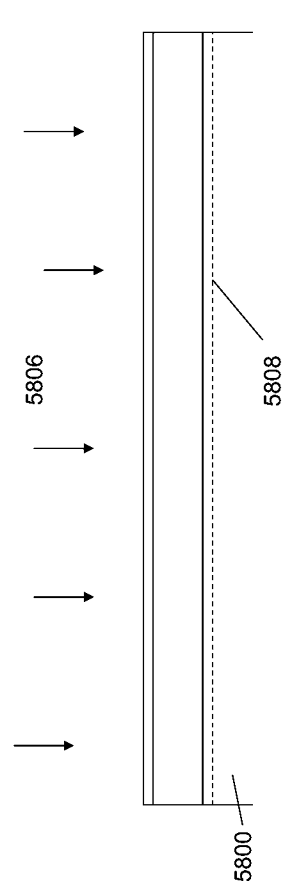
Figure 58C:
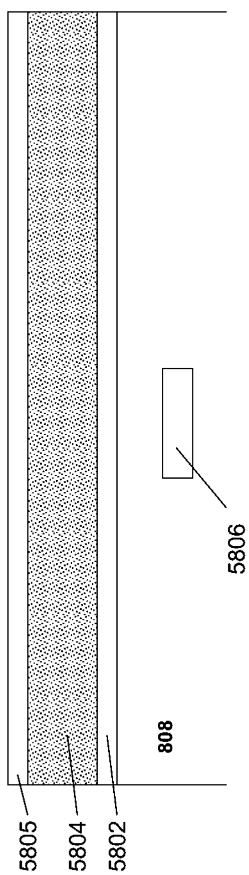

Alternatively, an n-type 3-sided gated thin-side-up junction-less transistor may be constructed as follows in FIGS. 58 A to 58G. A thin-side-up junction-less transistor may have the thinnest dimension of the channel cross-section facing up (oriented horizontally), that face being parallel to the silicon base substrate surface. Previously and subsequently described junction-less transistors may have the thinnest dimension of the channel cross section oriented vertically and perpendicular to the silicon base substrate surface. A silicon wafer is preprocessed to be used for layer transfer, as illustrated in FIGS. 58A and 58B. These processes may be at temperatures above 400° C. as the layer transfer to the processed substrate with metal interconnects has yet to be done. As illustrated in FIG. 58A, an N− wafer 5800 may be processed to have a layer of N+ 5804, by ion implantation and activation, by an N+ epitaxial growth, or may be a deposited layer of heavily N+ doped polysilicon. A screen oxide 5802 may be grown before the implant to protect the silicon from implant contamination and to provide an oxide surface for later wafer to wafer bonding. FIG. 58B is a drawing illustration of the pre-processed wafer made ready for a layer transfer by an implant 5806 of an atomic species, such as H+, preparing the "cleaving plane" 5808 in the N− region 5800 of the donor substrate, and plasma or other surface treatments to prepare the oxide surface for wafer oxide to oxide bonding. The acceptor wafer 808 with logic transistors and metal interconnects is prepared for a low temperature oxide to oxide wafer bond with surface treatments of the top oxide and the two are bonded as illustrated in FIG. 58C. The top donor wafer is cleaved and removed from the bottom acceptor wafer 808 and the top N− substrate is chemically and mechanically polished (CMP'ed) into the N+ layer 5804 to form the junction-less transistor channel layer. FIG. 58C also illustrates the deposition of a CMP and plasma etch stop layer 5805, such as low temperature SiN on oxide, on top of the N+ layer 5804. A metal interconnect layer 5806 in the acceptor wafer or house 808 is also shown in FIG. 58C. For illustration simplicity and clarity, the donor wafer oxide layer 5802 will not be drawn independent of the acceptor wafer or house 808 oxide in FIGS. 58D through 58G.

Figure 58D:
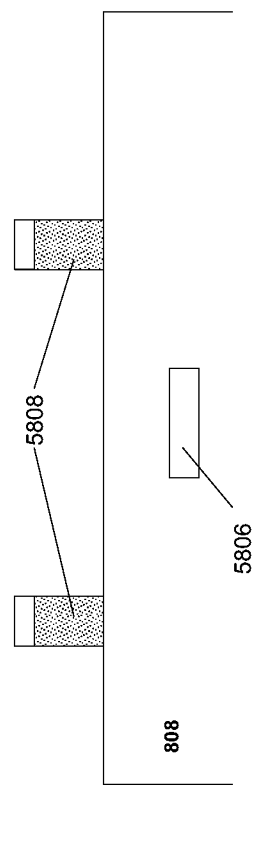
Figure 58E:
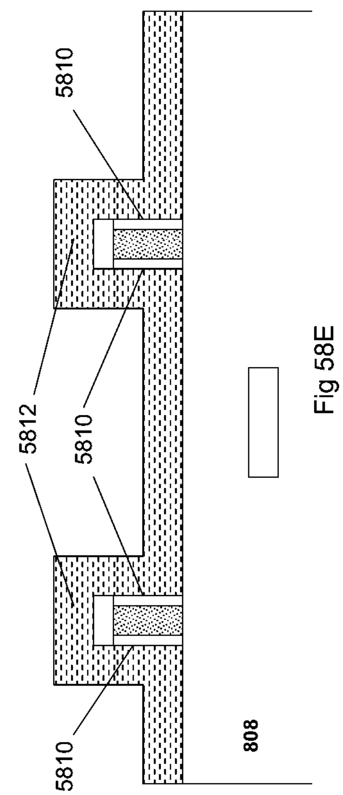
Figure 58F:
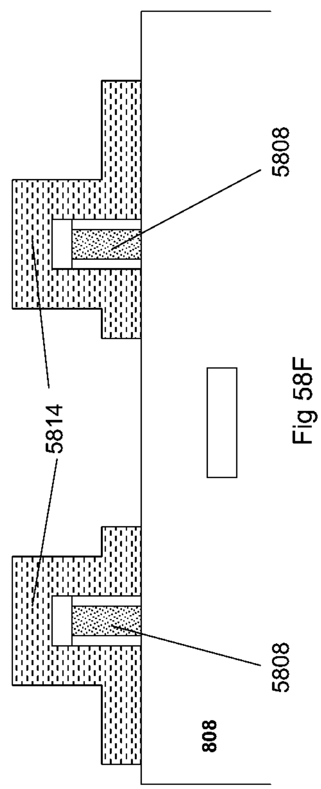
Figure 58G:
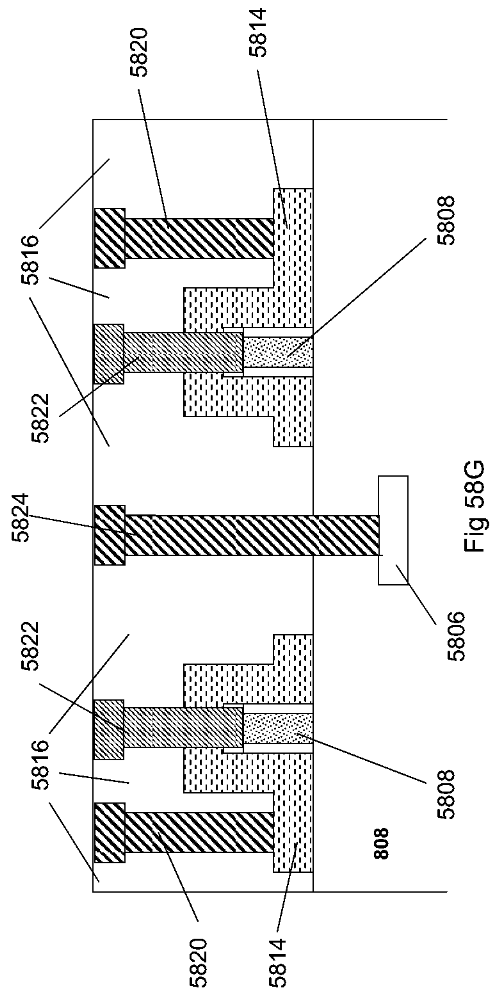

The transistor channel elements 5808 are masked and etched as illustrated in FIG. 58D and then the photoresist is removed. As illustrated in FIG. 58E, a low temperature based Gate Dielectric may be deposited and densified to serve as the junction-less transistor gate oxide 5810. Alternatively, a low temperature microwave plasma oxidation of the silicon surfaces may serve as the junction-less transistor gate oxide 5810 or an atomic layer deposition (ALD) technique may be utilized. Then deposition of a low temperature gate material 5812, such as P+ doped amorphous silicon may be performed. Alternatively, a high-k metal gate structure may be formed as described previously. The gate material 5812 is then masked and etched to define the top and side gates 5814 of the transistor channel elements 5808. As illustrated in FIG. 58G, the entire structure may be covered with a Low Temperature Oxide 5816, the oxide planarized with chemical mechanical polishing (CMP), and then contacts and metal interconnects may be masked and etched. The gate contact 5820 connects to the resistor gate 5814 (i.e., in front of and behind the plane of the other elements shown in FIG. 58G). The two transistor channel terminal contacts 5822 per transistor independently connect to the transistor channel element 5808 on each side of the gate 5814. The thru via 5824 connects the transistor layer metallization to the acceptor wafer or house 808 interconnect 5806. This flow enables the formation of mono-crystalline 3-gated sided thin-side-up junction-less transistor that may be formed and connected to the underlying multi-metal layer semiconductor device without exposing the underlying devices to a high temperature. Persons of ordinary skill in the art will appreciate that the illustrations in FIGS. 57A through 57G and FIGS. 58A through 58G are exemplary only and are not drawn to scale. Such skilled persons will further appreciate that many variations are possible like, for example, the process described in conjunction with FIGS. 57A through 57G could be used to make a junction-less transistor where the channel is taller than its width or that the process described in conjunction with FIGS. 58A through 58G could be used to make a junction-less transistor that is wider than its height. Many other modifications within the scope of the invention will suggest themselves to such skilled persons after reading this specification. Thus the invention is to be limited only by the appended claims.

Figure 61A:
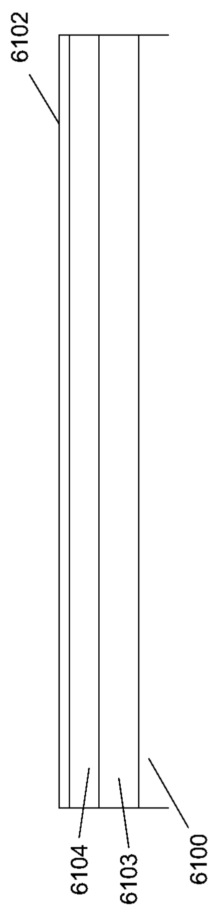
FIG. 61 A-I are drawing illustrations of a junction-less transistor.
Figure 61B:
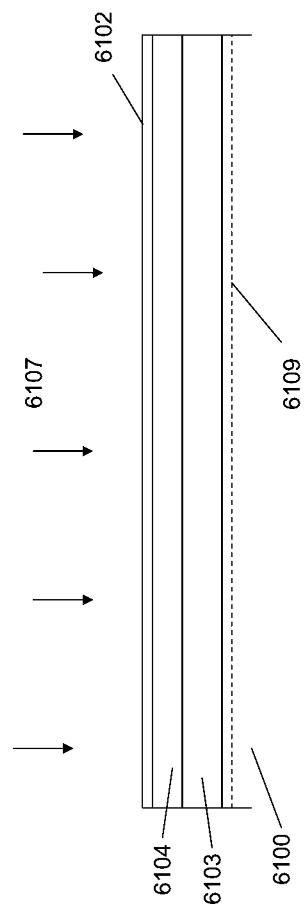

Alternatively, a two layer n-type 3-sided gated junction-less transistor may be constructed as shown in FIGS. 61A to 61I. This structure may improve the source and drain contact resistance by providing for a higher doping at the contact surface than the channel. Additionally, this structure may be utilized to create a two layer channel wherein the layer closest to the gate is more highly doped. A silicon wafer may be preprocessed for layer transfer as illustrated in FIGS. 61A and 61B. These preprocessings may be performed at temperatures above 400° C. as the layer transfer to the processed substrate with metal interconnects has yet to be done. As illustrated in FIG. 61A, an N− wafer 6100 is processed to have two layers of N+, the top layer 6104 with a lower doping concentration than the bottom N+ layer 6103, by an implant and activation, or an N+ epitaxial growth, or combinations thereof. One or more depositions of in-situ doped amorphous silicon may also be utilized to create the vertical dopant layers or gradients. A screen oxide 6102 may be grown before the implant to protect the silicon from implant contamination and to provide an oxide surface for later wafer-to-wafer bonding. FIG. 61B is a drawing illustration of the pre-processed wafer for a layer transfer by an implant 6107 of an atomic species, such as H+, preparing the "cleaving plane" 6109 in the N-region 6100 of the donor substrate and plasma or other surface treatments to prepare the oxide surface for wafer oxide to oxide bonding.

Figure 61C:
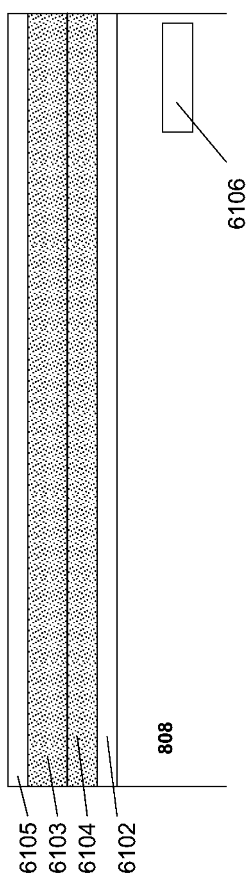

The acceptor wafer or house 808 with logic transistors and metal interconnects is prepared for a low temperature oxide-to-oxide wafer bond with surface treatments of the top oxide and the two are bonded as illustrated in FIG. 61C. The top donor wafer is cleaved and removed from the bottom acceptor wafer 808 and the top N− substrate is chemically and mechanically polished (CMP'ed) into the more highly doped N+ layer 6103. An etch hard mask layer of low temperature silicon nitride 6105 may be deposited on the surface of 6103, including a thin oxide stress buffer layer. A metal interconnect metal pad or strip 6106 in the acceptor wafer or house 808 is also illustrated in FIG. 61C. For illustration simplicity and clarity, the donor wafer oxide layer 6102 will not be drawn independent of the acceptor wafer or house 808 oxide in subsequent FIGS. 61D through 61I.

Figure 61D:
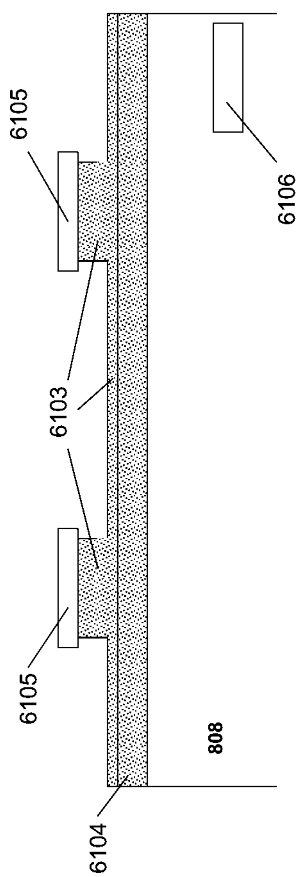

The source and drain connection areas may be masked, the silicon nitride 6105 layer may be etched, and the photoresist may be stripped. A partial or full silicon plasma etch may be performed, or a low temperature oxidation and then Hydrofluoric Acid etch of the oxide may be performed, to thin layer 6103. FIG. 61D illustrates a two-layer channel, as described and simulated above in conjunction with FIGS. 52A and 52B, formed by thinning layer 6103 with the above etch process to almost complete removal, leaving some of layer 6103 remaining on top of 6104 and the full thickness of 6103 still remaining underneath 6105. A complete removal of the top channel layer 6103 may also be performed. This etch process may also be utilized to adjust for wafer-to-wafer CMP variations of the remaining donor wafer layers, such as 6100 and 6103, after the layer transfer cleave to provide less variability in the channel thickness.

Figure 61E:
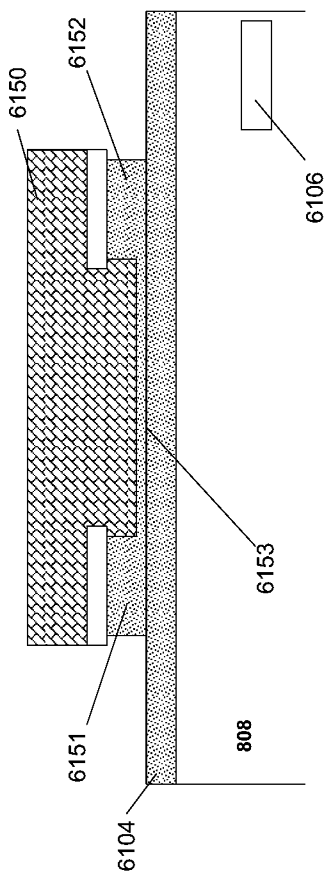

FIG. 61E illustrates the photoresist 6150 definition of the source 6151 (one full thickness 6103 region), drain 6152 (the other full thickness 6103 region), and channel 6153 (region of partial 6103 thickness and full 6104 thickness) of the junction-less transistor.

Figure 61F:
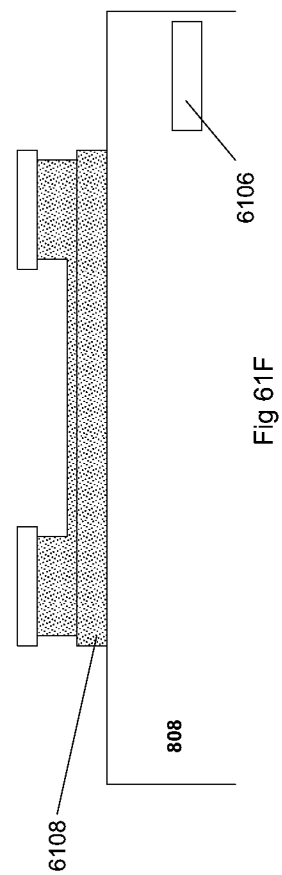

The exposed silicon remaining on layer 6104, as illustrated in FIG. 61F, may be plasma etched and the photoresist 6150 may be removed. This process may provide for an isolation between devices and may define the channel width of the junction-less transistor channel 6108.

Figure 61G:
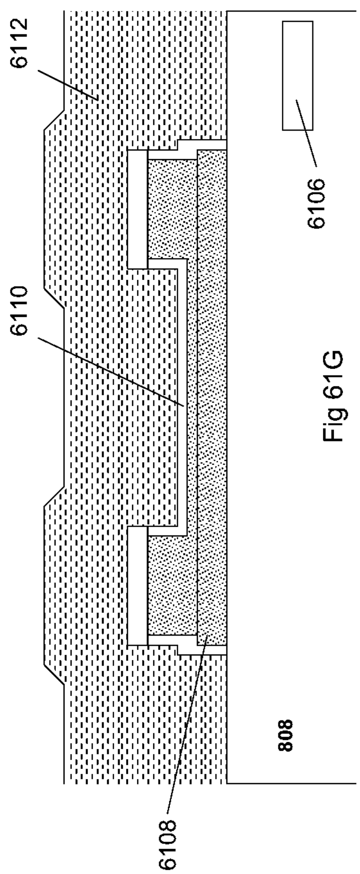

A low temperature based Gate Dielectric may be deposited and densified to serve as the junction-less transistor gate oxide 6110 as illustrated in FIG. 61G. Alternatively, a low temperature microwave plasma oxidation of the silicon surfaces may provide the junction-less transistor gate oxide 6110 or an atomic layer deposition (ALD) technique may be utilized. Then deposition of a low temperature gate material 6112, such as, for example, doped amorphous silicon, may be performed, as illustrated in FIG. 61G. Alternatively, a high-k metal gate structure may be formed as described previously.

Figure 61H:
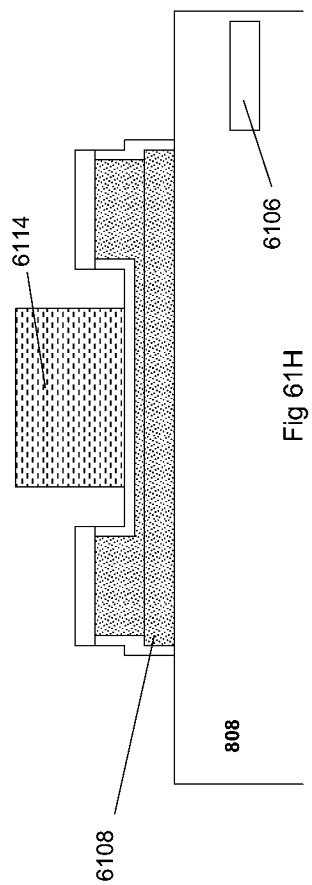

The gate material 6112 may then be masked and etched to define the top and side gates 6114 of the transistor channel elements 6108 in a crossing manner, generally orthogonally, as illustrated in FIG. 61H. Then the entire structure may be covered with a Low Temperature Oxide 6116, the oxide may be planarized by chemical mechanical polishing.

Figure 61I:
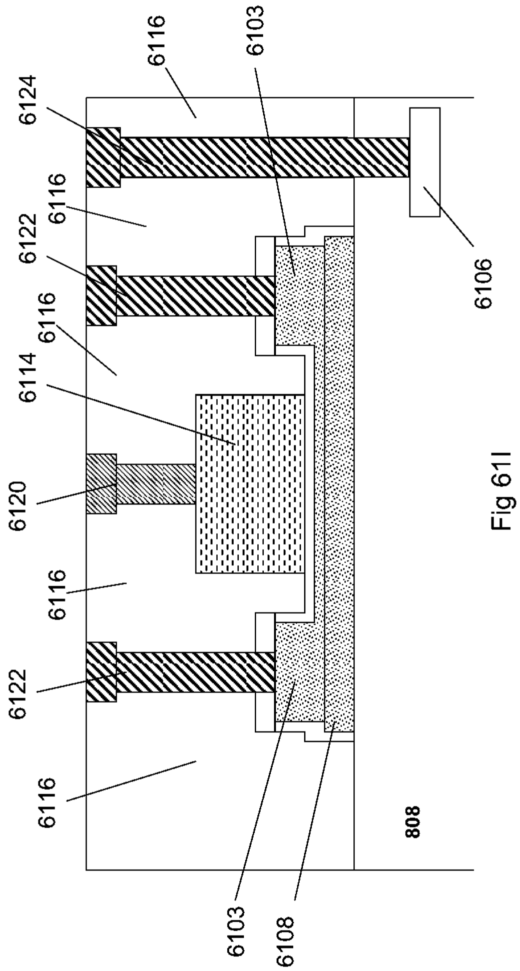

Then contacts and metal interconnects may be masked and etched as illustrated FIG. 61I. The gate contact 6120 may be connected to the gate 6114. The two transistor source/drain terminal contacts 6122 may be independently connected to the heavier doped layer 6103 and then to transistor channel element 6108 on each side of the gate 6114. The thru via 6124 may connect the junction-less transistor layer metallization to the acceptor wafer or house 808 at interconnect pad or strip 6106. The thru via 6124 may be independently masked and etched to provide process margin with respect to the other contacts 6122 and 6120. This flow may enable the formation of mono-crystalline two layer 3-sided gated junction-less transistor that may be formed and connected to the underlying multi-metal layer semiconductor device without exposing the underlying devices to a high temperature.

Figure 65A:
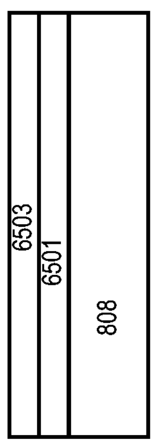
FIG. 65A-C are drawing illustrations of the formation of a junction-less transistor.
Figure 65B:
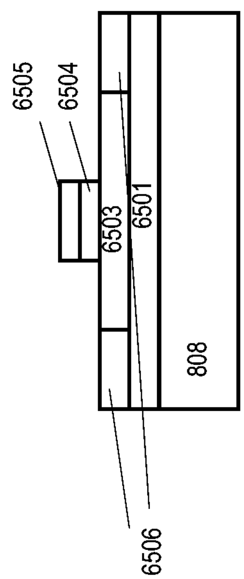
Figure 65C:
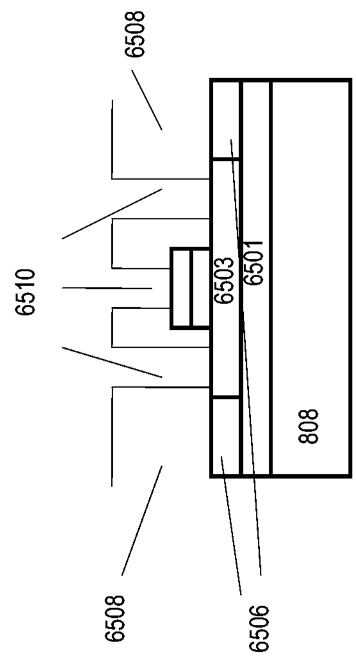

Alternatively, a 1-sided gated junction-less transistor can be constructed as shown in FIG. 65A-C. A thin layer of heavily doped silicon 6503 may be transferred on top of the acceptor wafer or house 808 using layer transfer techniques described previously wherein the donor wafer oxide layer 6501 may be utilized to form an oxide to oxide bond with the top of the acceptor wafer or house 808. The transferred doped layer 6503 may be N+ doped for an n-channel junction-less transistor or may be P+ doped for a p-channel junction-less transistor. As illustrated in FIG. 65B, oxide isolation 6506 may be formed by masking and etching the N+ layer 6503 and subsequent deposition of a low temperature oxide which may be chemical mechanically polished to the channel silicon 6503 thickness. The channel thickness 6503 may also be adjusted at this step. A low temperature gate dielectric 6504 and gate metal 6505 are deposited or grown as previously described and then photo-lithographically defined and etched. As shown in FIG. 65C, a low temperature oxide 6508 may then be deposited, which also may provide a mechanical stress on the channel for improved carrier mobility. Contact openings 6510 may then be opened to various terminals of the junction-less transistor. Persons of ordinary skill in the art will appreciate that the processing methods presented above are illustrative only and that other embodiments of the inventive principles described herein are possible and thus the scope if the invention is only limited by the appended claims.

A family of vertical devices can also be constructed as top transistors that are precisely aligned to the underlying pre-fabricated acceptor wafer or house 808. These vertical devices have implanted and annealed single crystal silicon layers in the transistor by utilizing the "SmartCut" layer transfer process that does not exceed the temperature limit of the underlying pre-fabricated structure. For example, vertical style MOSFET transistors, floating gate flash transistors, floating body DRAM, thyristor, bipolar, and Schottky gated JFET transistors, as well as memory devices, can be constructed. Junction-less transistors may also be constructed in a similar manner. The gates of the vertical transistors or resistors may be controlled by memory or logic elements such as MOSFET, DRAM, SRAM, floating flash, anti-fuse, floating body devices, etc. that are in layers above or below the vertical device, or in the same layer. As an example, a vertical gate-all-around n-MOSFET transistor construction is described below.

The donor wafer preprocessed for the general layer transfer process is illustrated in FIG. 39. A P− wafer 3902 is processed to have a "buried" layer of N+ 3904, by either implant and activation, or by shallow N+ implant and diffusion. This process may be followed by depositing an P− epi growth (epitaxial growth) layer 3906 and finally an additional N+ layer 3908 may be processed on top. This N+ layer 2510 could again be processed, by implant and activation, or by N+ epi growth.

Figures 39A, 39B:
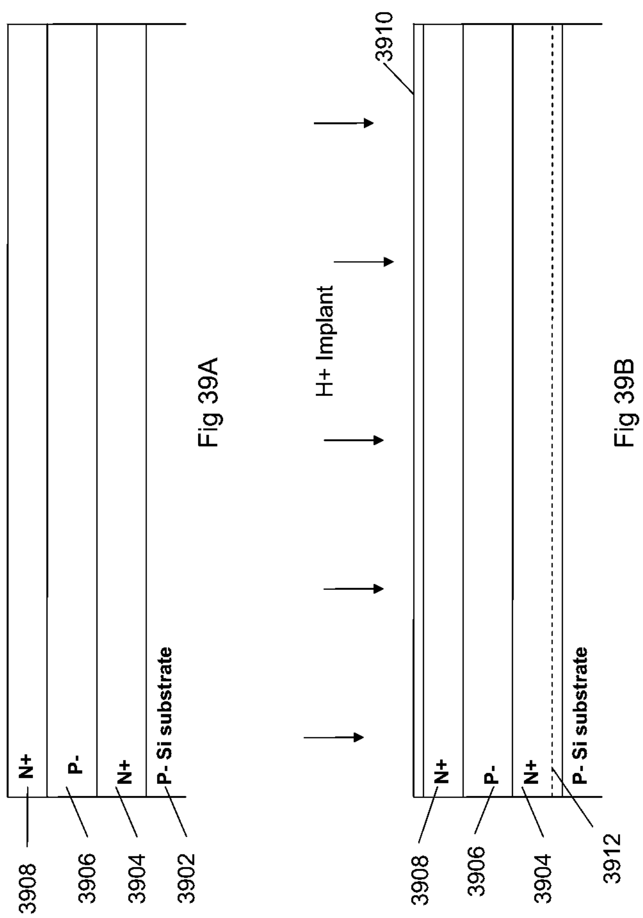
FIG. 39 A-C are drawing illustration of pre-processed wafers used for vertical transistors.

FIG. 39B is a drawing illustration of the pre-processed wafer made ready for a conductive bond layer transfer by a deposition of a conductive barrier layer 3910 such as TiN or TaN on top of N+ layer 3908 and an implant of an atomic species, such as H+, preparing the SmartCut cleaving plane 3912 in the lower part of the N+ 3904 region.

Figure 39C:
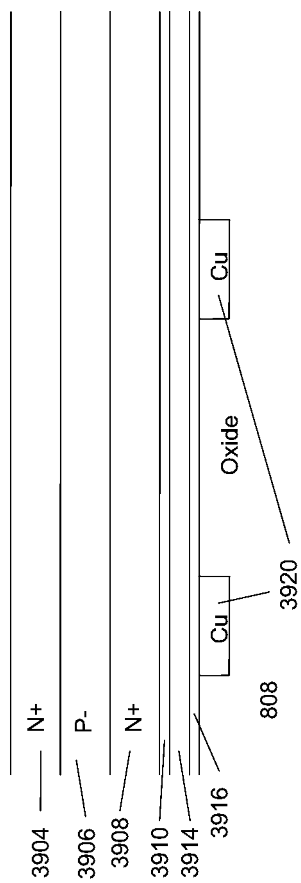

As shown in FIG. 39C, the acceptor wafer may be prepared with an oxide pre-clean and deposition of a conductive barrier layer 3916 and Al—Ge layers 3914. Al—Ge eutectic layer 3914 may form an Al—Ge eutectic bond with the conductive barrier 3910 during a thermo-compressive wafer to wafer bonding process as part of the layer-transfer-flow, thereby transferring the pre-processed single crystal silicon with N+ and P− layers. Thus, a conductive path is made from the house 808 top metal layers 3920 to the now bottom N+ layer 3908 of the transferred donor wafer. Alternatively, the Al—Ge eutectic layer 3914 may be made with copper and a copper-to-copper or copper-to-barrier layer thermo-compressive bond is formed. Likewise, a conductive path from donor wafer to house 808 may be made by house top metal lines 3920 of copper with barrier metal thermo-compressively bonded with the copper layer 3910 directly, where a majority of the bonded surface is donor copper to house oxide bonds and the remainder of the surface is donor copper to house 808 copper and barrier metal bonds.

Figure 40A:
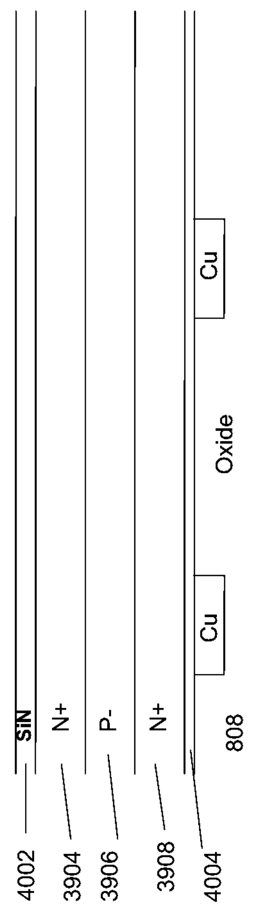
FIG. 40A-I are drawing illustrations of a vertical n-MOSFET top transistor.

FIGS. 40A-40I are drawing illustrations of the formation of a vertical gate-all-around n-MOSFET top transistor. FIG. 40A illustrates the first step. After the conductive path layer transfer described above, a deposition of a CMP and plasma etch stop layer 4002, such as low temperature SiN, may be deposited on top of the top N+ layer 3904. For simplicity, the conductive barrier clad Al—Ge eutectic layers 3910, 3914, and 3916 are represented by conductive layer 4004 in FIG. 40A.

Figure 40B:
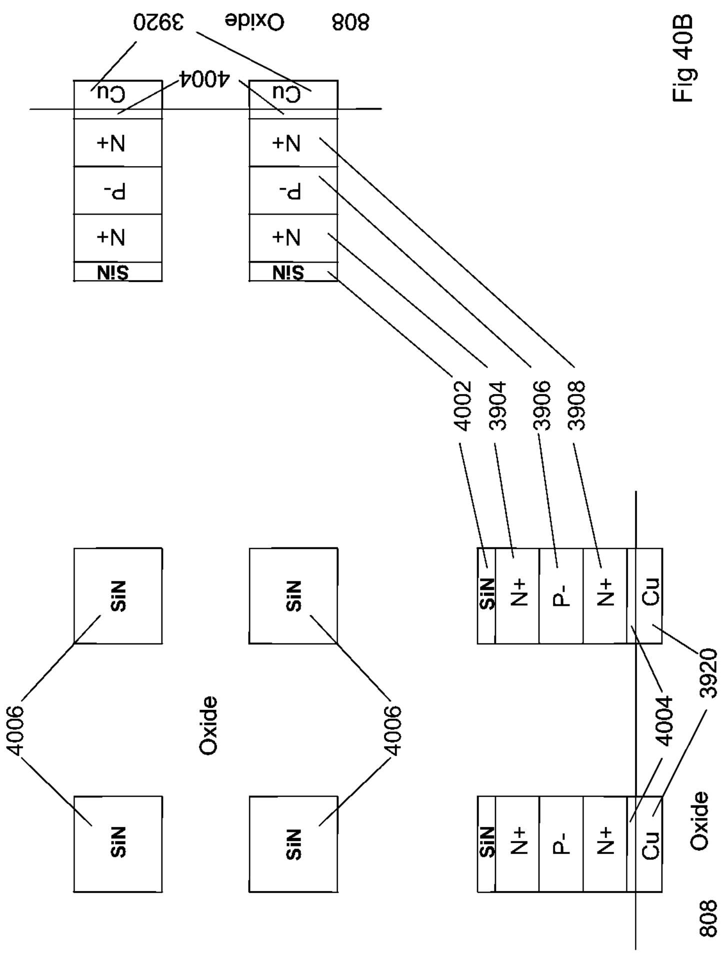

FIGS. 40B-H are drawn as orthographic projections (i.e., as top views with horizontal and vertical cross sections) to illustrate some process and topographical details. The transistor illustrated is square shaped when viewed from the top, but may be constructed in various rectangular shapes to provide different transistor widths and gate control effects. In addition, the square shaped transistor illustrated may be intentionally formed as a circle when viewed from the top and hence form a vertical cylinder shape, or it may become that shape during processing subsequent to forming the vertical towers. Turning now to FIG. 40B, vertical transistor towers 4006 are mask defined and then plasma/Reactive-ion Etching (RIE) etched thru the Chemical Mechanical Polishing (CMP) stop layer 4004, N+ layers 3904 and 3908, the P− layer 3906, the conductive metal bonding layer 4004, and into the house 808 oxide, and then the photoresist is removed as illustrated in FIG. 40B. This definition and etch now creates N-P-N stacks where the bottom N+ layer 3908 is electrically coupled to the house metal layer 3920 through conductive layer 4004.

Figure 40C:
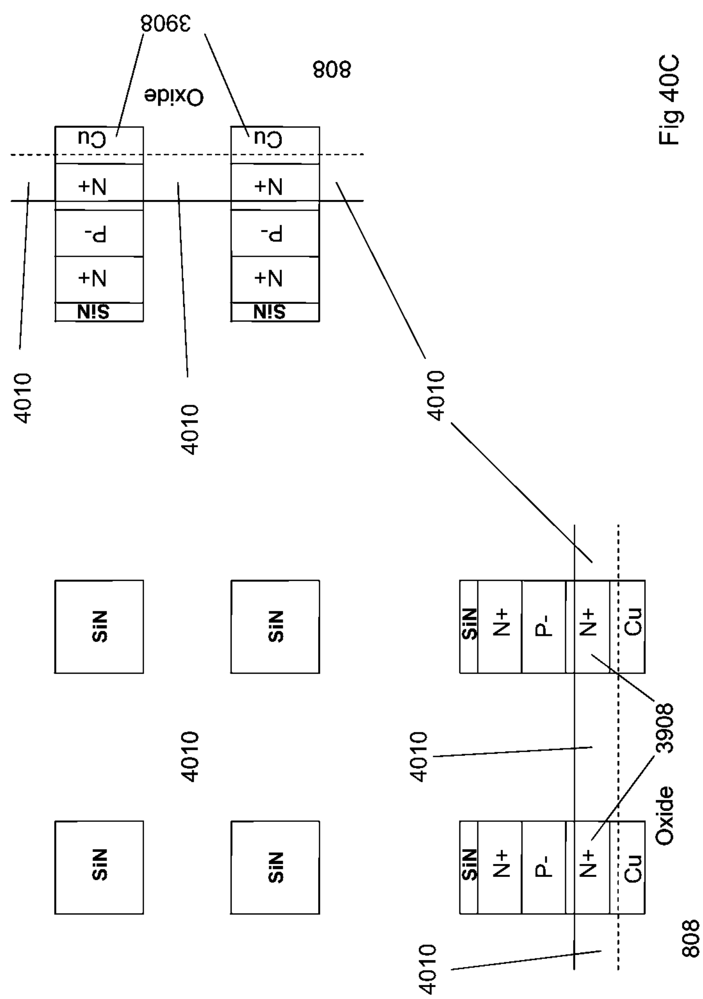

The area between the towers is partially filled with oxide 4010 via a Spin On Glass (SPG) spin, cure, and etch back sequence as illustrated in FIG. 40C. Alternatively, a low temperature CVD gap fill oxide may be deposited, then Chemically Mechanically Polished (CMP'ed) flat, and then selectively etched back to achieve the same oxide shape 4010 as shown in FIG. 40C. The level of the oxide 4010 is constructed such that a small amount of the bottom N+ tower layer 3908 is not covered by oxide. Alternatively, this step may also be accomplished by a conformal low temperature oxide CVD deposition and etch back sequence, creating a spacer profile coverage of the bottom N+ tower layer 3908.

Figure 40D:
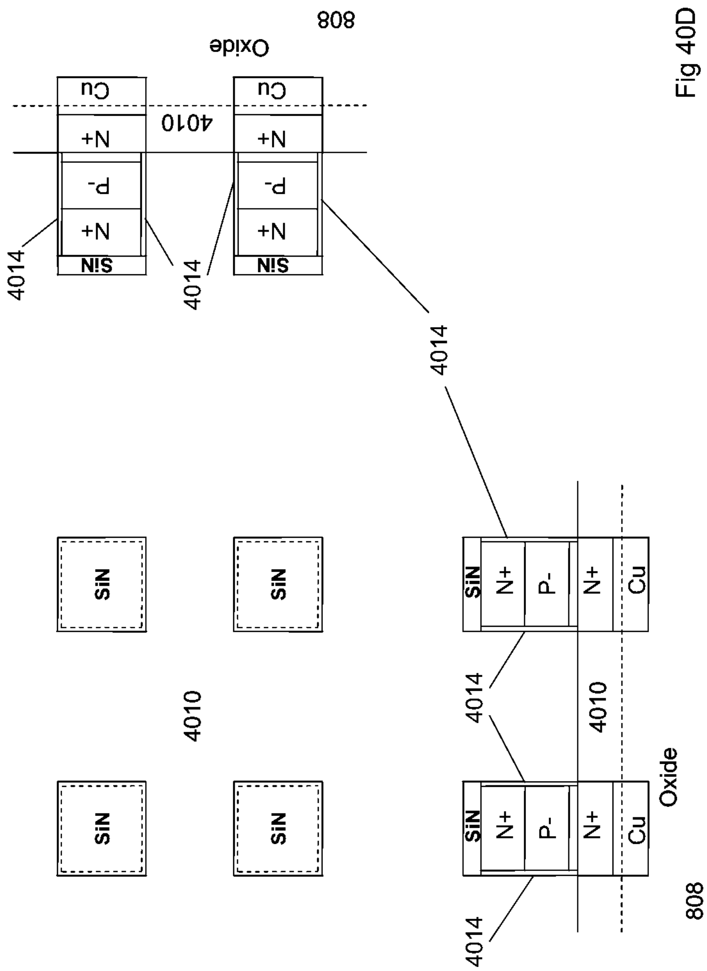

Next, the sidewall gate oxide 4014 is formed by a low temperature microwave oxidation technique, such as the TEL SPA (Tokyo Electron Limited Slot Plane Antenna) oxygen radical plasma, stripped by wet chemicals such as dilute HF, and grown again 4014 as illustrated in FIG. 40D.

Figure 40E:
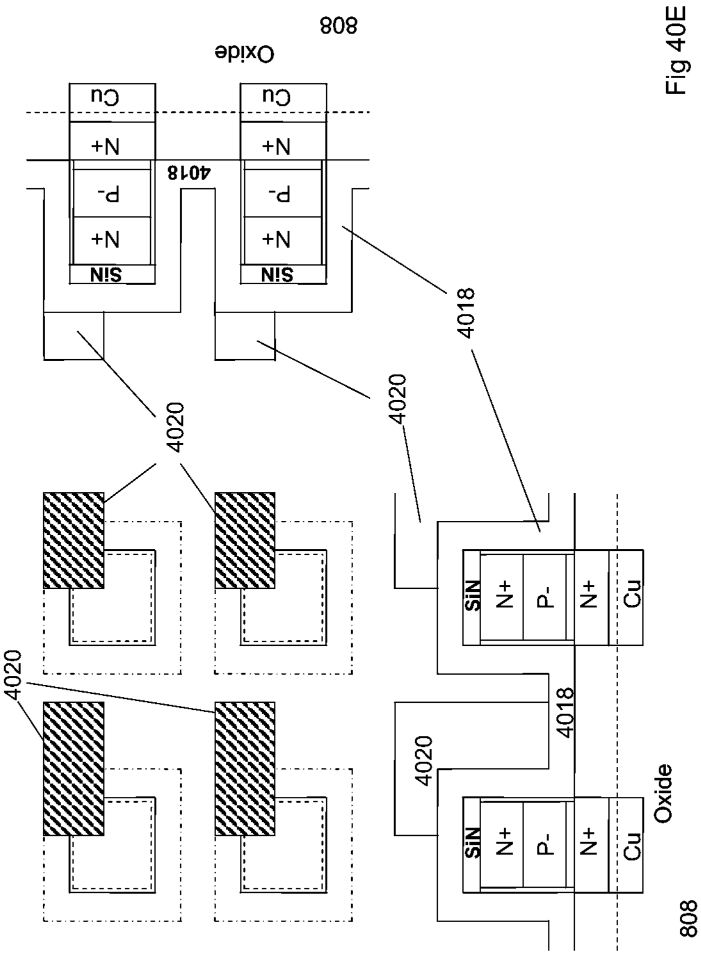

The gate electrode is then deposited, such as a conformal doped amorphous silicon layer 4018, as illustrated in FIG. 40E. The gate mask photoresist 4020 may then be defined.

Figure 40F:
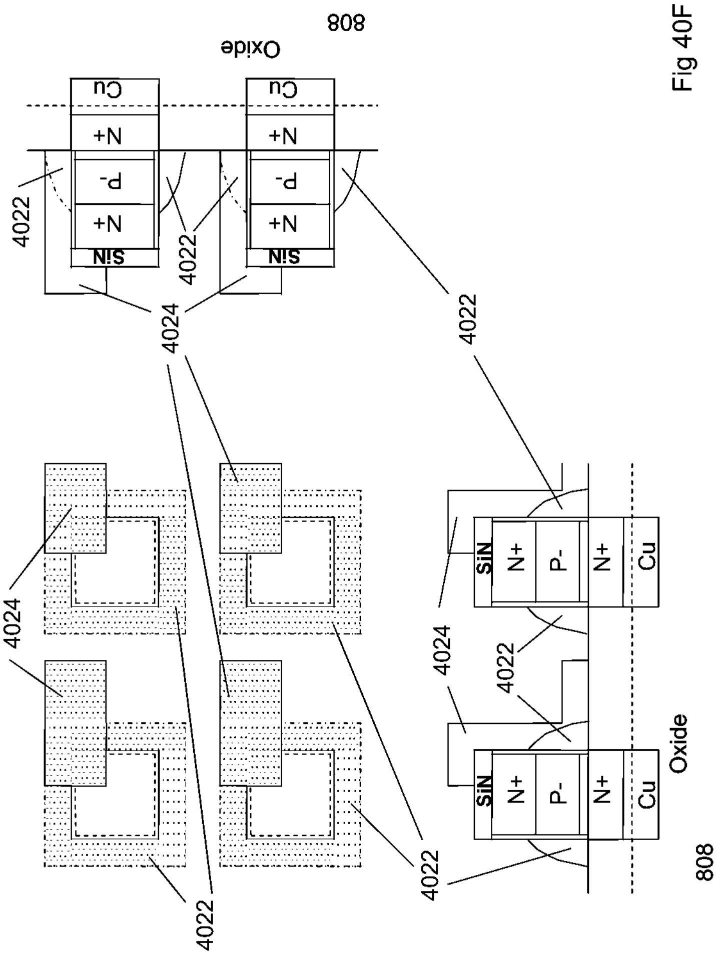

As illustrated in FIG. 40F, the gate layer 4018 is etched such that a spacer shaped gate electrode 4022 remains in regions not covered by the photoresist 4020. The full thickness of gate layer 4018 remains under area covered by the resist 4020 and the gate layer 4020 is also fully cleared from between the towers. Finally the photoresist 4020 is stripped. This approach minimizes the gate to drain overlap and eventually provides a clear contact connection to the gate electrode.

Figure 40G:
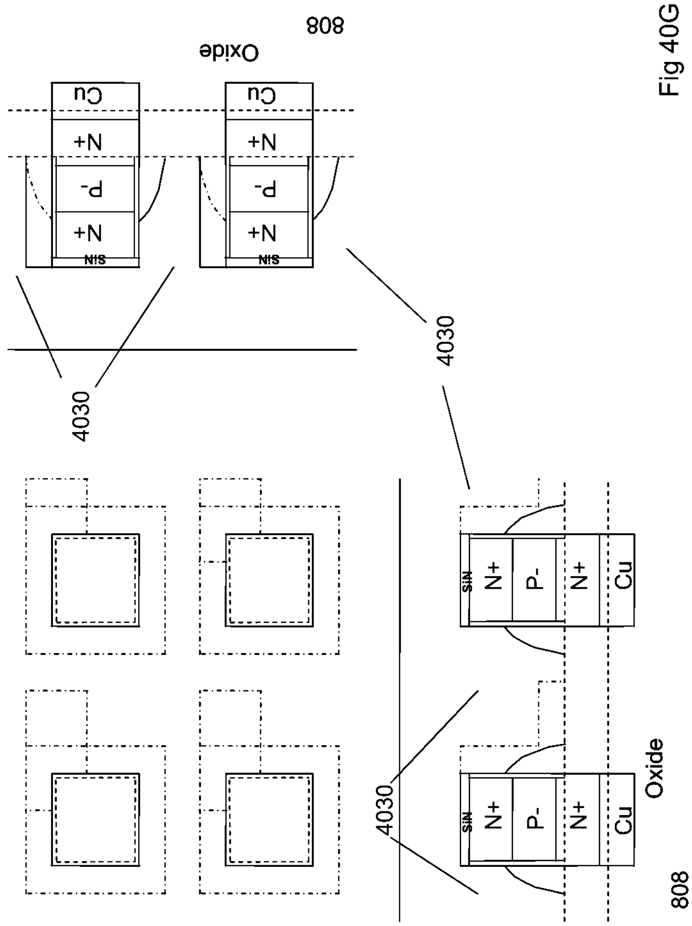

As illustrated in FIG. 40G, the spaces between the towers are filled and the towers are covered with oxide 4030 by low temperature gap fill deposition and CMP.

Figure 40H:
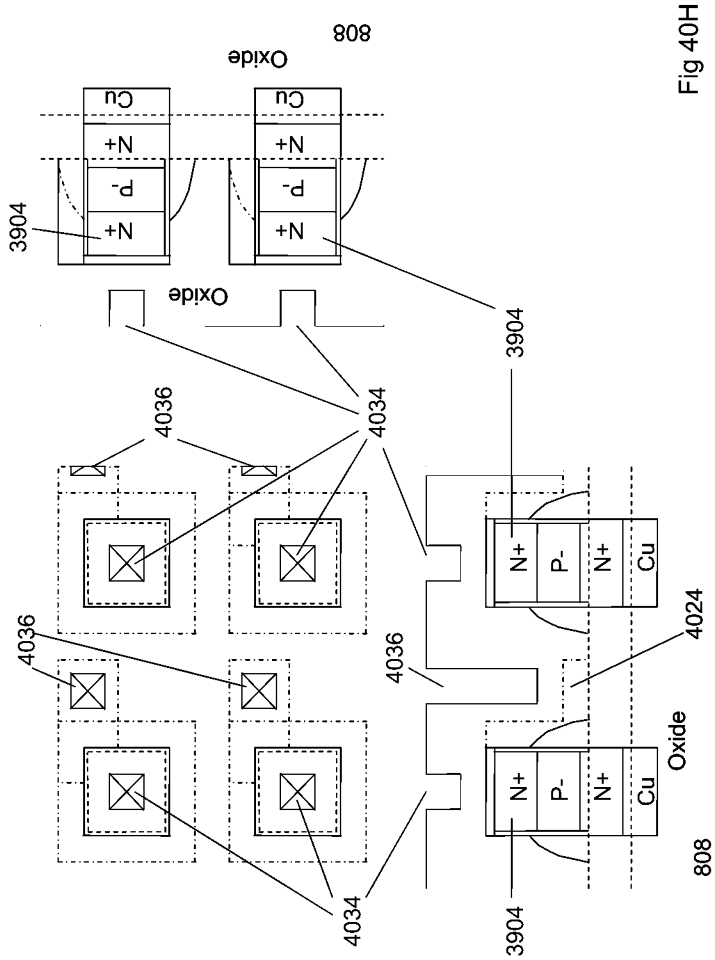

In FIG. 40H, the via contacts 4034 to the tower N+ layer 3904 are masked and etched, and then the via contacts 4036 to the gate electrode poly 4024 are masked and etch.

Figure 40I:
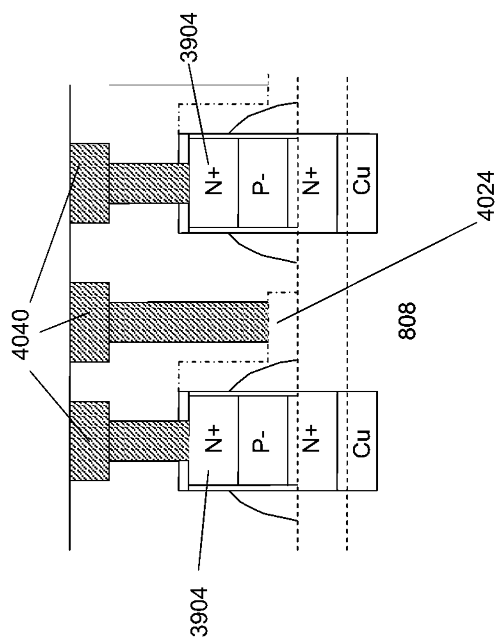

The metal lines 4040 are mask defined and etched, filled with barrier metals and copper interconnect, and CMP'd in a normal interconnect scheme, thereby completing the contact via connections to the tower N+ 3904 and the gate electrode 4024 as illustrated in FIG. 40I.

This flow enables the formation of mono-crystalline silicon top MOS transistors that are connected to the underlying multi-metal layer semiconductor device without exposing the underlying devices and interconnect metals to high temperature. These transistors could be used as programming transistors of the Antifuse on layer 807, or be coupled to metal layers in wafer or layer 808 to form monolithic 3D ICs, as a pass transistor for logic on wafer or layer 808, or FPGA use, or for additional uses in a 3D semiconductor device.

Figure 54A:
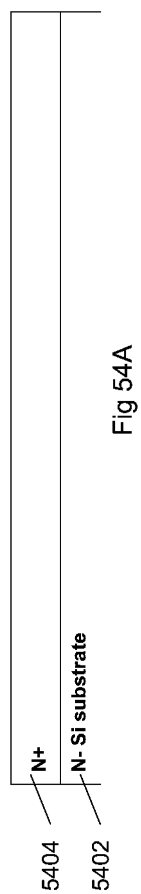
FIG. 54 A-C are drawing illustrations of the formation of a junction-less transistor.
Figure 54B:
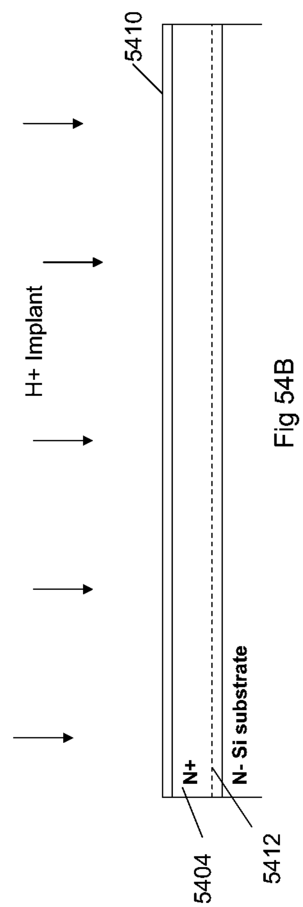

Additionally, a vertical gate all around junction-less transistor may be constructed as illustrated in FIGS. 54 and 55. The donor wafer preprocessed for the general layer transfer process is illustrated in FIG. 54. FIG. 54A is a drawing illustration of a pre-processed wafer used for a layer transfer. An N− wafer 5402 is processed to have a layer of N+ 5404, by ion implantation and activation, or an N+ epitaxial growth. FIG. 54B is a drawing illustration of the pre-processed wafer made ready for a conductive bond layer transfer by a deposition of a conductive barrier layer 5410 such as TiN or TaN and by an implant of an atomic species, such as H+, preparing the SmartCut cleaving plane 5412 in the lower part of the N+ 5404 region.

Figure 54C:
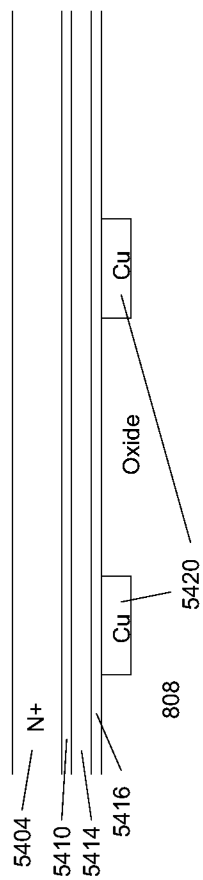

The acceptor wafer or house 808 is also prepared with an oxide pre-clean and deposition of a conductive barrier layer 5416 and Al and Ge layers to form a Ge—Al eutectic bond 5414 during a thermo-compressive wafer to wafer bonding as part of the layer-transfer-flow, thereby transferring the pre-processed single crystal silicon of FIG. 54B with an N+ layer 5404, on top of acceptor wafer or house 808, as illustrated in FIG. 54C. The N+ layer 5404 may be polished to remove damage from the cleaving procedure. Thus, a conductive path is made from the acceptor wafer or house 808 top metal layers 5420 to the N+ layer 5404 of the transferred donor wafer. Alternatively, the Al—Ge eutectic layer 5414 may be made with copper and a copper-to-copper or copper-to-barrier layer thermo-compressive bond is formed. Likewise, a conductive path from donor wafer to acceptor wafer or house 808 may be made by house top metal lines 5420 of copper with associated barrier metal thermo-compressively bonded with the copper layer 5410 directly, where a majority of the bonded surface is donor copper to house oxide bonds and the remainder of the surface is donor copper to acceptor wafer or house 808 copper and barrier metal bonds.

Figure 55A:
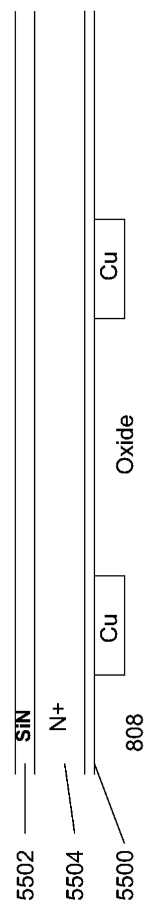
FIG. 55 A-I are drawing illustrations of the formation of a junction-less transistor.

FIGS. 55A-55I are drawing illustrations of the formation of a vertical gate-all-around junction-less transistor utilizing the above preprocessed acceptor wafer or house 808 of FIG. 54C. FIG. 55A illustrates the deposition of a CMP and plasma etch stop layer 5502, such as low temperature SiN, on top of the N+ layer 5504. For simplicity, the barrier clad Al—Ge eutectic layers 5410, 5414, and 5416 of FIG. 54C are represented by one illustrated layer 5500.

Figure 55B:
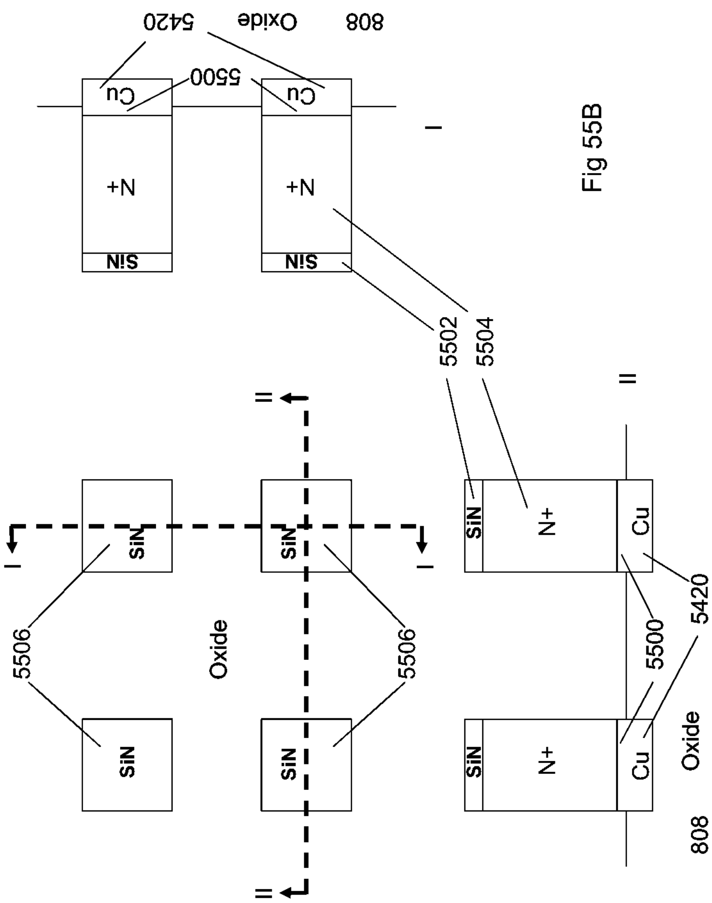

Similarly, FIGS. 55B-H are drawn as an orthographic projection to illustrate some process and topographical details. The junction-less transistor illustrated is square shaped when viewed from the top, but may be constructed in various rectangular shapes to provide different transistor channel thicknesses, widths, and gate control effects. In addition, the square shaped transistor illustrated may be intentionally formed as a circle when viewed from the top and hence form a vertical cylinder shape, or it may become that shape during processing subsequent to forming the vertical towers. The vertical transistor towers 5506 are mask defined and then plasma/Reactive-ion Etching (RIE) etched thru the Chemical Mechanical Polishing (CMP) stop layer 5502, N+ transistor channel layer 5504, the metal bonding layer 5500, and down to the acceptor wafer or house 808 oxide, and then the photoresist is removed, as illustrated in FIG. 55B. This definition and etch now creates N+ transistor channel stacks that are electrically isolated from each other yet the bottom of N+ layer 5404 is electrically connected to the house metal layer 5420.

Figure 55C:
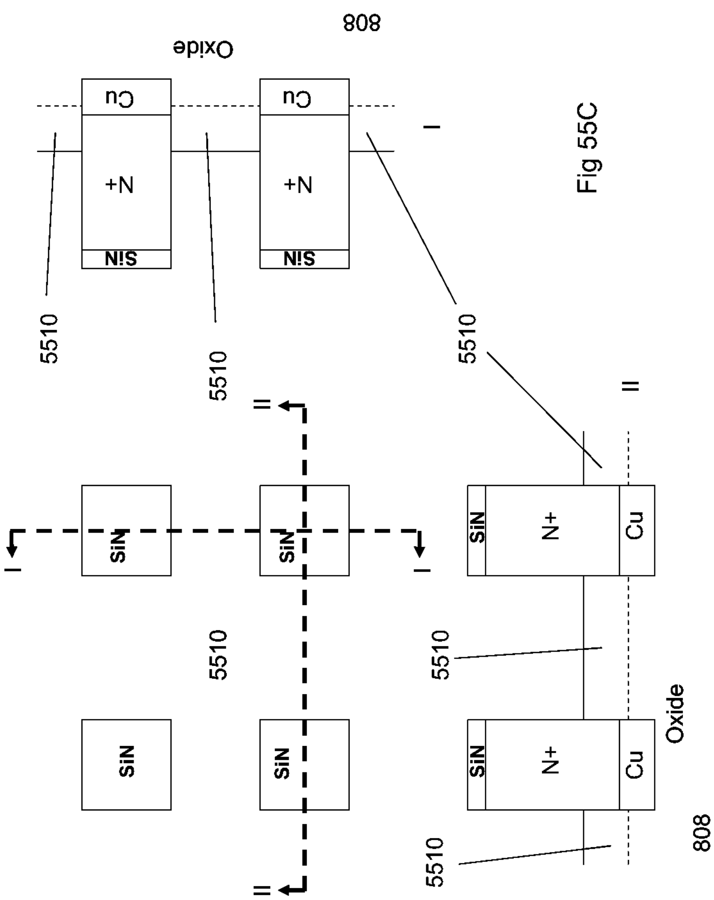

The area between the towers is then partially filled with oxide 5510 via a Spin On Glass (SPG) spin, low temperature cure, and etch back sequence as illustrated in FIG. 55C. Alternatively, a low temperature CVD gap fill oxide may be deposited, then Chemically Mechanically Polished (CMP'ed) flat, and then selectively etched back to achieve the same shaped 5510 as shown in FIG. 55C. Alternatively, this step may also be accomplished by a conformal low temperature oxide CVD deposition and etch back sequence, creating a spacer profile coverage of the N+ resistor tower layer 5504.

Figure 55D:
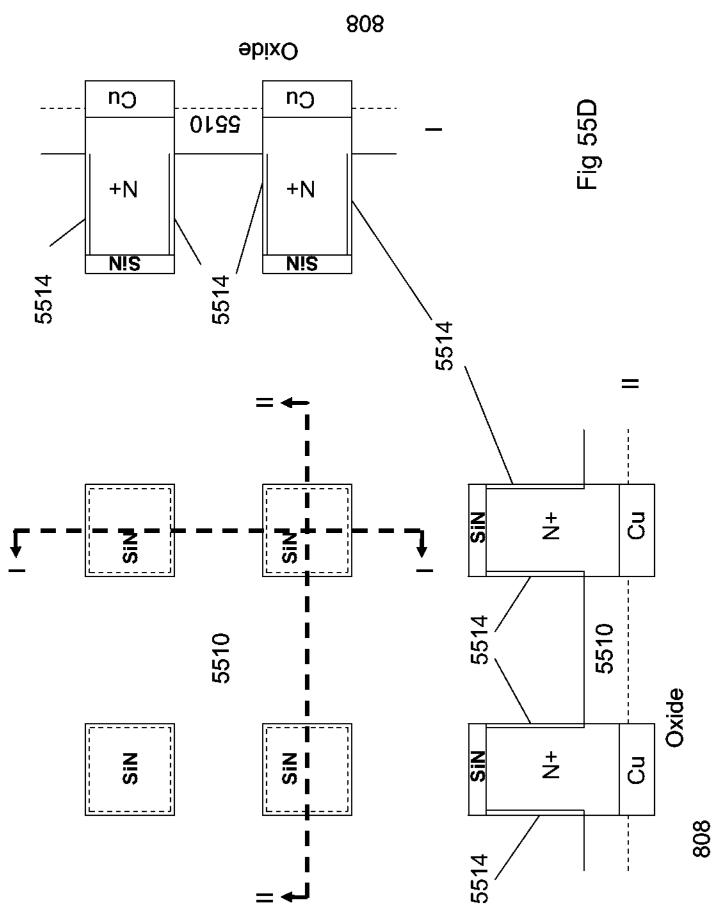

Next, the sidewall gate oxide 5514 is formed by a low temperature microwave oxidation technique, such as the TEL SPA (Tokyo Electron Limited Slot Plane Antenna) oxygen radical plasma, stripped by wet chemicals such as dilute HF, and grown again 5514 as illustrated in FIG. 55D.

Figure 55E:
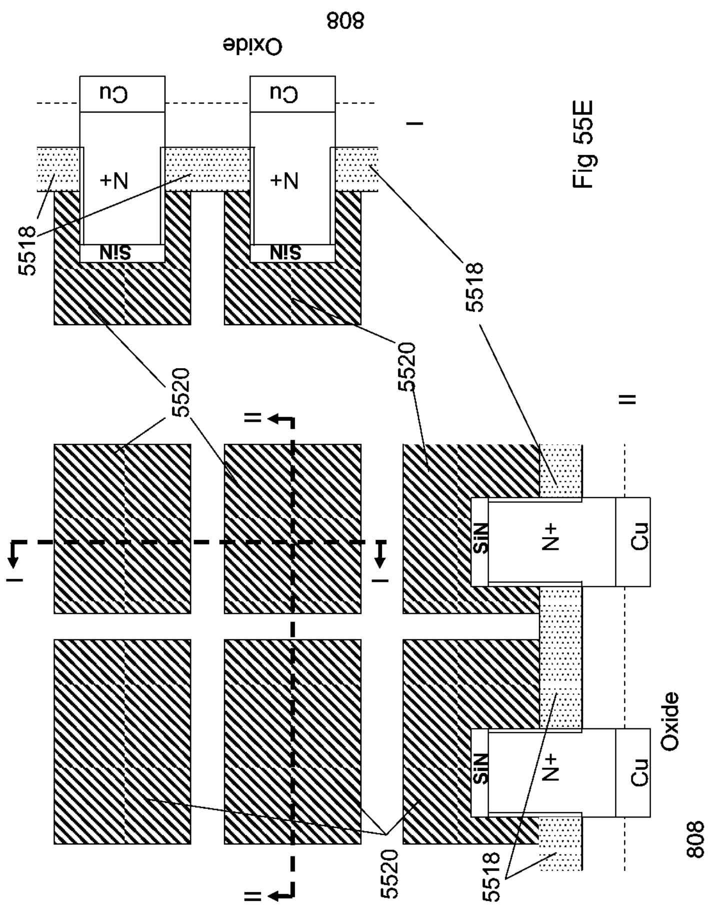

The gate electrode is then deposited, such as a P+ doped amorphous silicon layer 5518, then Chemically Mechanically Polished (CMP'ed) flat, and then selectively etched back to achieve the shape 5518 as shown in FIG. 55E, and then the gate mask photoresist 5520 may be defined as illustrated in FIG. 55E.

Figure 55F:
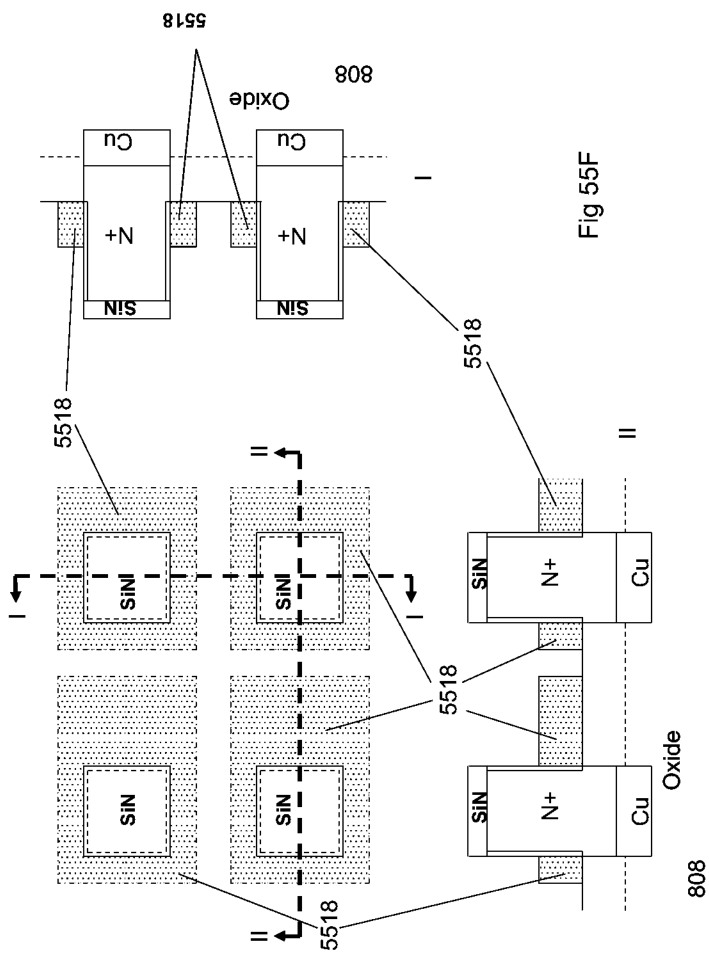

The gate layer 5518 is etched such that the gate layer is fully cleared from between the towers and then the photoresist is stripped as illustrated in FIG. 55F.

Figure 55G:
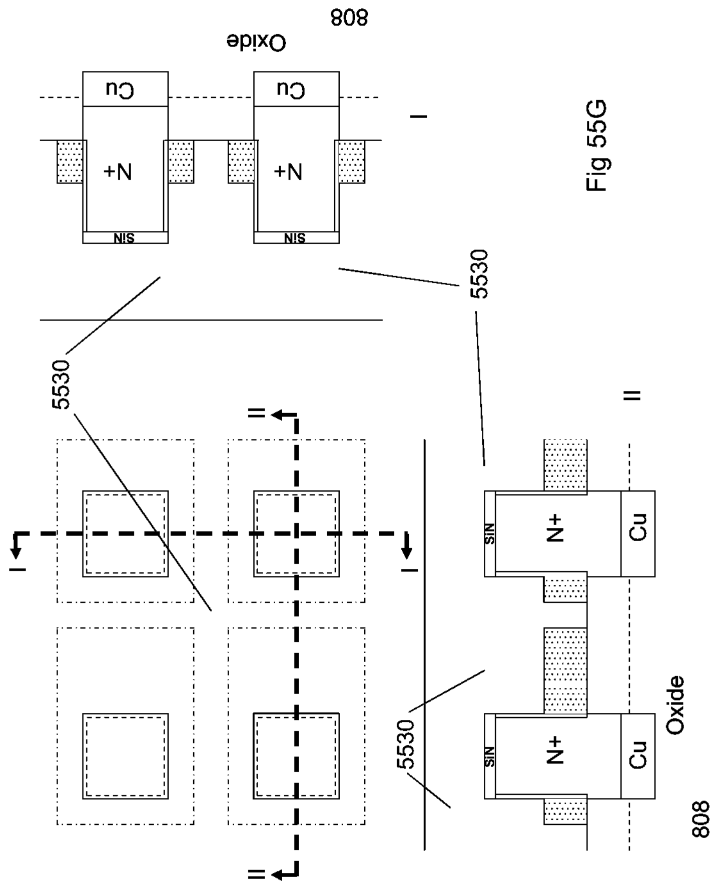

The spaces between the towers are filled and the towers are covered with oxide 5530 by low temperature gap fill deposition, CMP, then another oxide deposition as illustrated in FIG. 55G.

Figure 55H:
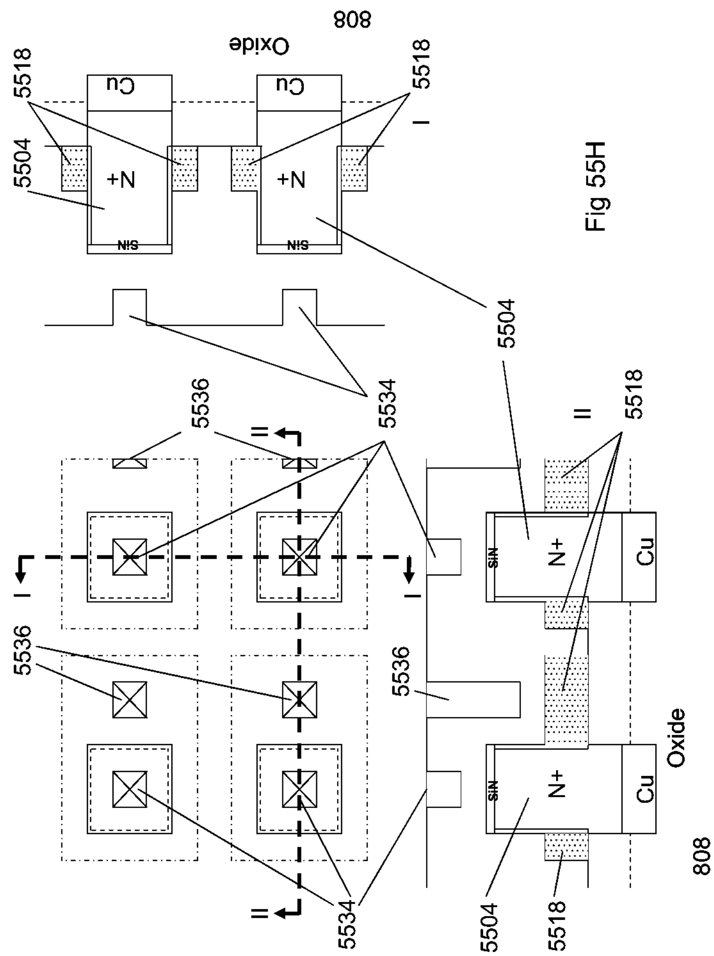
Figure 55I:
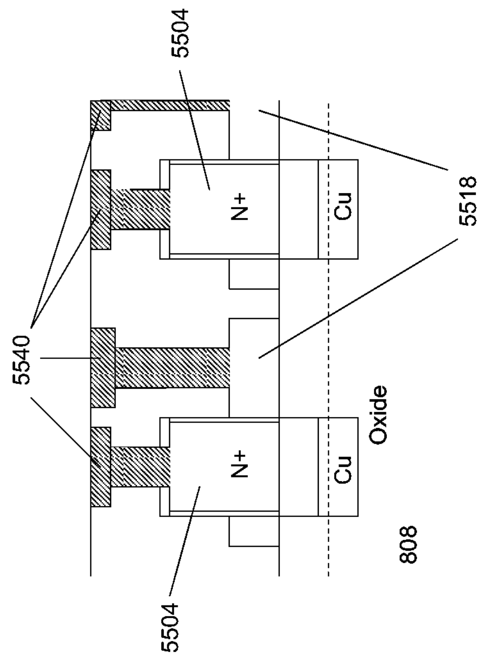

In FIG. 55H, the contacts 5534 to the transistor channel tower N+ 5504 are masked and etched, and then the contacts 5536 to the gate electrode 5518 are masked and etch. The metal lines 5540 are mask defined and etched, filled with barrier metals and copper interconnect, and CMP'ed in a normal Dual Damascene interconnect scheme, thereby completing the contact via connections to the transistor channel tower N+ 5504 and the gate electrode 5518 as illustrated in FIG. 55I.

This flow enables the formation of mono-crystalline silicon top vertical junction-less transistors that are connected to the underlying multi-metal layer semiconductor device without exposing the underlying devices and interconnect metals to high temperature. These junction-less transistors may be used as programming transistors of the Antifuse on acceptor wafer or house 808 or as a pass transistor for logic or FPGA use, or for additional uses in a 3D semiconductor device.

Figure 66:
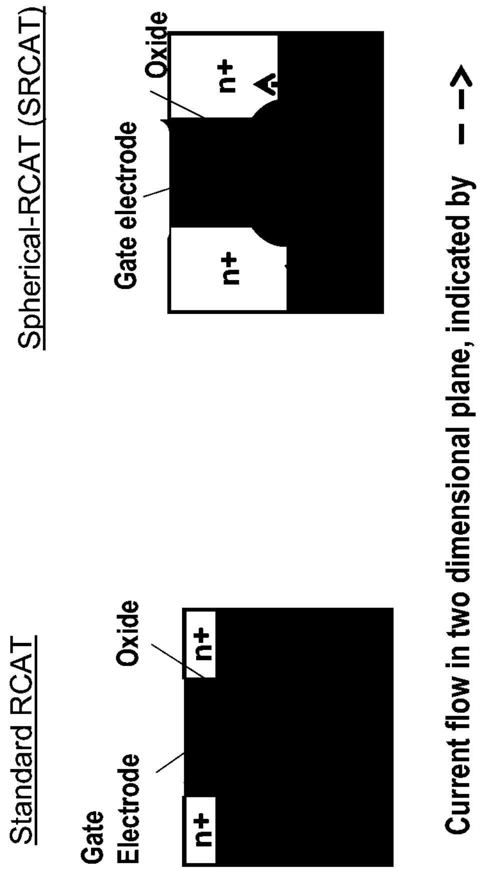
FIG. 66 are drawing illustrations of recessed channel array transistors.

Recessed Channel Array Transistors (RCATs) may be another transistor family that can utilize layer transfer and etch definition to construct a low-temperature monolithic 3D Integrated Circuit. Two types of RCAT device structures are shown in FIG. 66. These were described by J. Kim, et al. at the Symposium on VLSI Technology, in 2003 and 2005. Note that this prior art from Kim, et al. are for a single layer of transistors and did not use any layer transfer techniques. Their work also used high-temperature processes such as source-drain activation anneals, wherein the temperatures were above 400° C. In contrast, some embodiments of the current invention employ this transistor family in a two-dimensional plane. All transistors (junction-less, recessed channel or depletion, etc.) with the source and the drain in the same two dimensional planes may be considered planar transistors.

Figure 67A:
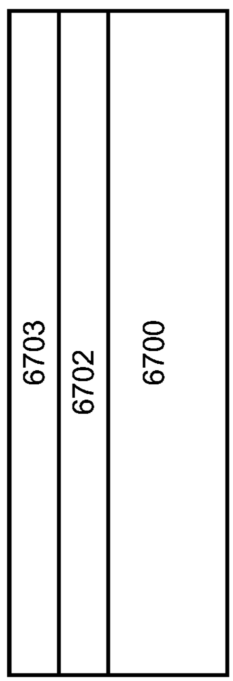
FIG. 67 A-F are drawing illustrations of formation of recessed channel array transistors.

A layer stacking approach to construct 3D integrated circuits with standard RCATs is illustrated in FIG. 67A-F. For an n-channel MOSFET, a p− silicon wafer 6700 may be the starting point. A buried layer of n+Si 6702 may then be implanted as shown in FIG. 67A, resulting in a layer of p− 6703 that is at the surface of the donor wafer. An alternative is to implant a shallow layer of n+Si and then epitaxially deposit a layer of p− Si 6703. To activate dopants in the n+ layer 6702, the wafer may be annealed, with standard annealing procedures such as thermal, or spike, or laser anneal.

Figure 67B:
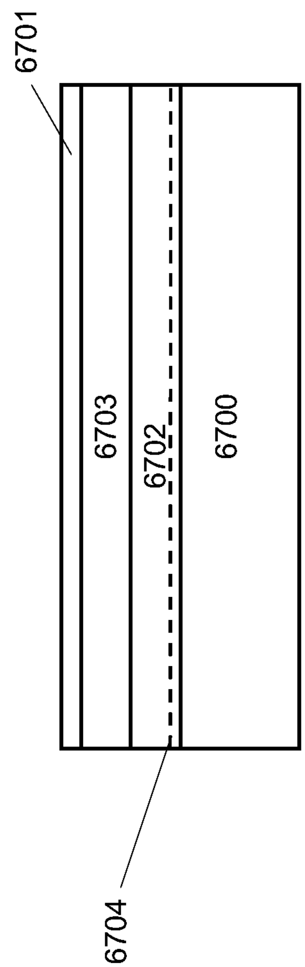

An oxide layer 6701 may be grown or deposited, as illustrated in FIG. 67B. Hydrogen is implanted into the wafer 6704 to enable "smart cut" process, as indicated in FIG. 67B.

Figure 67C:
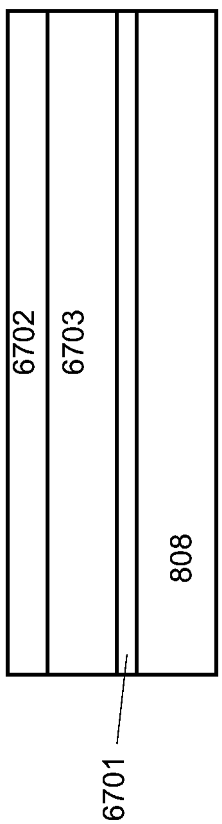

A layer transfer process may be conducted to attach the donor wafer in FIG. 67B to a pre-processed circuits acceptor wafer 808 as illustrated in FIG. 67C. The implanted hydrogen layer 6704 may now be utilized for cleaving away the remainder of the wafer 6700.

Figure 67D:
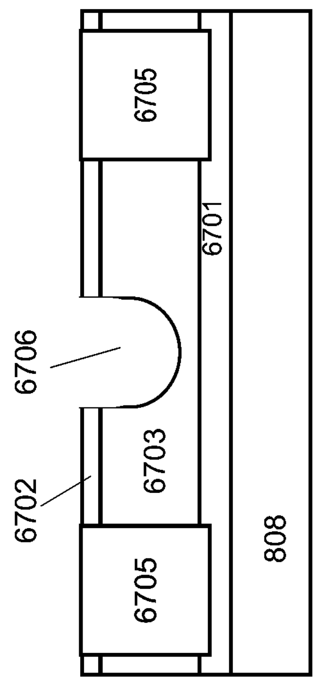

After the cut, chemical mechanical polishing (CMP) may be performed. Oxide isolation regions 6705 may be formed and an etch process may be conducted to form the recessed channel 6706 as illustrated in FIG. 67D. This etch process may be further customized so that corners are rounded to avoid high field issues.

Figure 67E:
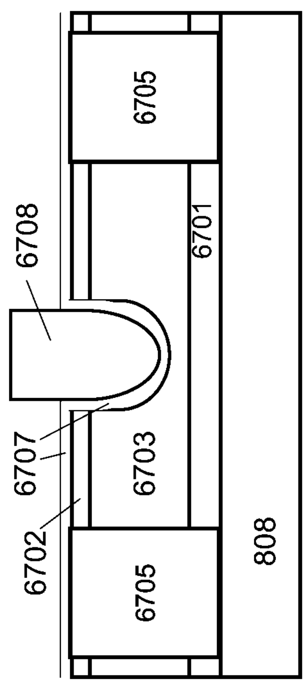

A gate dielectric 6707 may then be deposited, either through atomic layer deposition or through other low-temperature oxide formation procedures described previously. A metal gate 6708 may then be deposited to fill the recessed channel, followed by a CMP and gate patterning as illustrated in FIG. 67E.

Figure 67F:
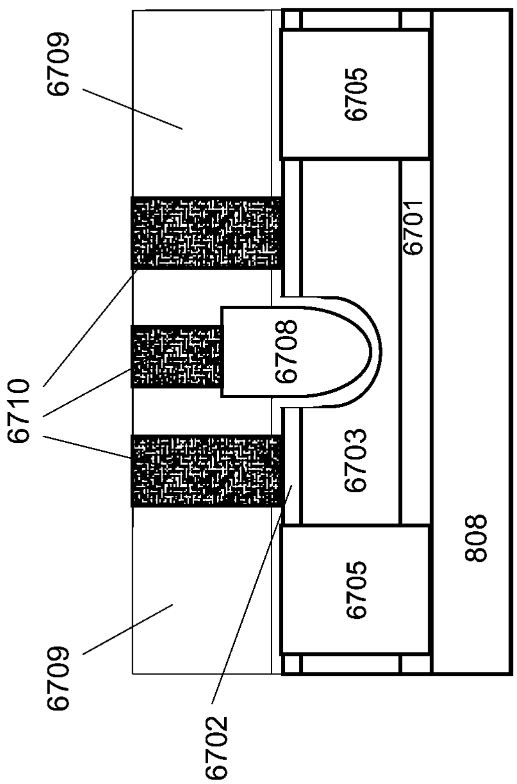

A low temperature oxide 6709 may be deposited and planarized by CMP. Contacts 6710 may be formed to connect to all electrodes of the transistor as illustrated in FIG. 67F. This flow enables the formation of a low temperature RCAT monolithically on top of pre-processed circuitry 808. A p-channel MOSFET may be formed with an analogous process. The p and n channel RCATs may be utilized to form a monolithic 3D CMOS circuit library as described later.

Figure 68A:
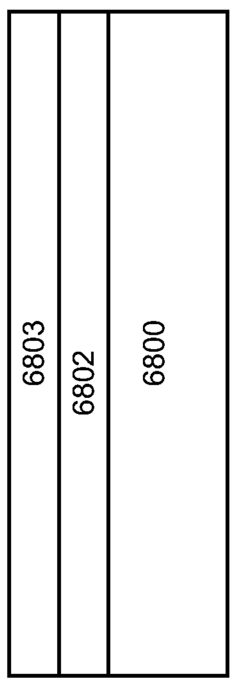
FIG. 68 A-F are drawing illustrations of formation of spherical recessed channel array transistors.

A layer stacking approach to construct 3D integrated circuits with spherical-RCATs (S-RCATs) is illustrated in FIG. 68A-F. For an n-channel MOSFET, a p− silicon wafer 6800 may be the starting point. A buried layer of n+Si 6802 may then implanted as shown in FIG. 68A, resulting in a layer of p− 6803 at the surface of the donor wafer. An alternative is to implant a shallow layer of n+Si and then epitaxially deposit a layer of p− Si 6803. To activate dopants in the n+ layer 6802, the wafer may be annealed, with standard annealing procedures such as thermal, or spike, or laser anneal.

Figure 68B:
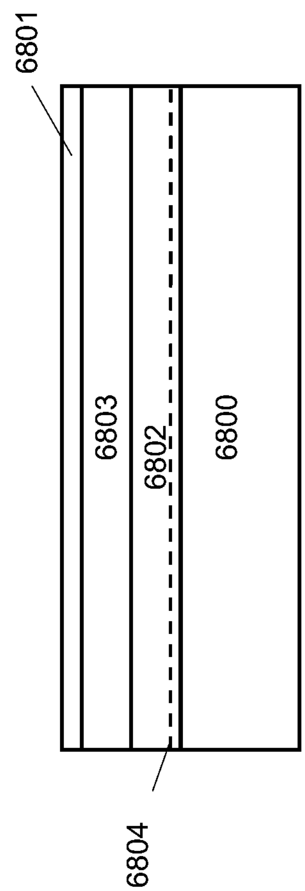

An oxide layer 6801 may be grown or deposited, as illustrated in FIG. 68B. Hydrogen may be implanted into the wafer 6804 to enable "smart cut" process, as indicated in FIG. 68B.

Figure 68C:
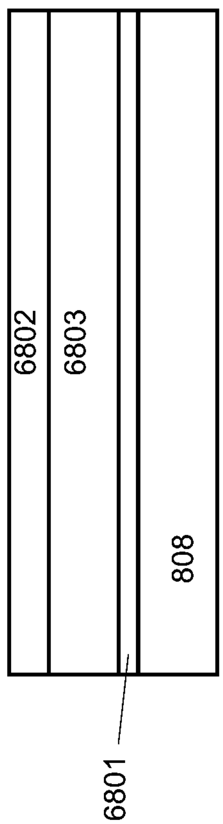

A layer transfer process may be conducted to attach the donor wafer in FIG. 68B to a pre-processed circuits acceptor wafer 808 as illustrated in FIG. 68C. The implanted hydrogen layer 6804 may now be utilized for cleaving away the remainder of the wafer 6800. After the cut, chemical mechanical polishing (CMP) may be performed.

Figure 68D:
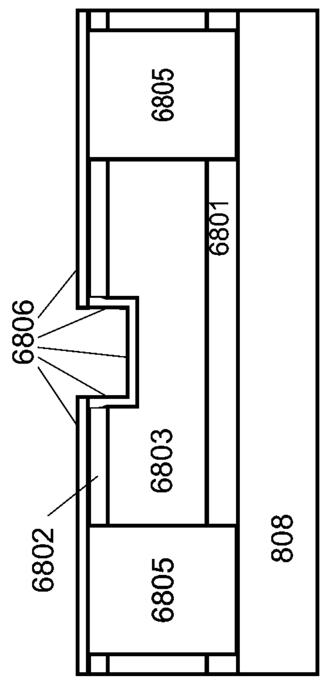

Oxide isolation regions 6805 may be formed as illustrated in FIG. 68D. The eventual gate electrode recessed channel may be masked and partially etched, and a spacer deposition 6806 may be performed with a conformal low temperature deposition such as silicon oxide or silicon nitride or a combination.

Figure 68E:
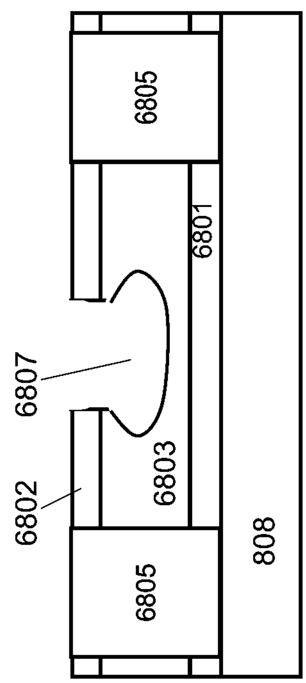

An anisotropic etch of the spacer may be performed to leave spacer material only on the vertical sidewalls of the recessed gate channel opening. An isotropic silicon etch may then be conducted to form the spherical recess 6807 as illustrated in FIG. 68E. The spacer on the sidewall may be removed with a selective etch.

Figure 68F:
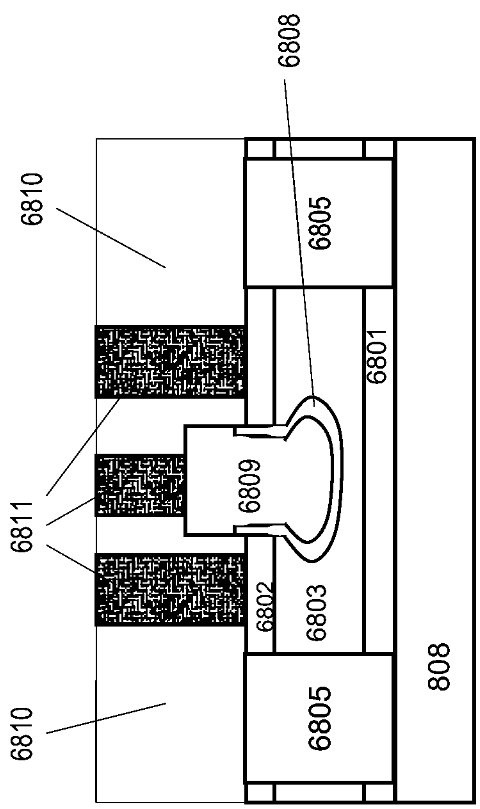

A gate dielectric 6808 may then be deposited, either through atomic layer deposition or through other low-temperature oxide formation procedures described previously. A metal gate 6809 may be deposited to fill the recessed channel, followed by a CMP and gate patterning as illustrated in FIG. 68F. The gate material may also be doped amorphous silicon or other low temperature conductor with the proper work function. A low temperature oxide 6810 may be deposited and planarized by the CMP. Contacts 6811 may be formed to connect to all electrodes of the transistor as illustrated in FIG. 68F.

This flow enables the formation of a low temperature S-RCAT monolithically on top of pre-processed circuitry 808. A p-channel MOSFET may be formed with an analogous process. The p and n channel S-RCATs may be utilized to form a monolithic 3D CMOS circuit library as described later. In addition, SRAM circuits constructed with RCATs may have different trench depths compared to logic circuits. The RCAT and S-RCAT devices may be utilized to form BiCMOS inverters and other mixed circuitry when the house 808 layer has conventional Bipolar Junction Transistors and the transferred layer or layers may be utilized to form the RCAT devices monolithically.

3D memory device structures may also be constructed in layers of mono-crystalline silicon and take advantage of pre-processing a donor wafer by forming wafer sized layers of various materials without a process temperature restriction, then layer transferring the pre-processed donor wafer to the acceptor wafer, followed by some optional processing steps, and repeating this procedure multiple times, and then processing with either low temperature (below approximately 400° C.) or high temperature (greater than approximately 400° C.) after the final layer transfer to form memory device structures, such as transistors, on or in the multiple transferred layers that may be physically aligned and may be electrically coupled to the acceptor wafer.

Novel monolithic 3D Dynamic Random Access Memories (DRAMs) may be constructed in the above manner. Some embodiments of this invention utilize the floating body DRAM type.

Floating-body DRAM is a next generation DRAM being developed by many companies such as Innovative Silicon, Hynix, and Toshiba. These floating-body DRAMs store data as charge in the floating body of an SOI MOSFET or a multi-gate MOSFET. Further details of a floating body DRAM and its operation modes can be found in U.S. Pat. Nos. 7,541,616, 7,514,748, 7,499,358, 7,499,352, 7,492,632, 7,486,563, 7,477,540, and 7,476,939, besides other literature. A monolithic 3D integrated DRAM can be constructed with floating-body transistors. Prior art for constructing monolithic 3D DRAMs used planar transistors where crystalline silicon layers were formed with either selective epi technology or laser recrystallization. Both selective epi technology and laser recrystallization may not provide perfectly single crystal silicon and often require a high thermal budget. A description of these processes is given in the book entitled "Integrated Interconnect Technologies for 3D Nanoelectronic Systems" by Bakir and Meindl.

As illustrated in FIG. 97 the fundamentals of operating a floating body DRAM are described. In order to store a '1' bit, excess holes 9702 may exist in the floating body region 9720 and change the threshold voltage of the memory cell transistor including source 9704, gate 9706, drain 9708, floating body 9720, and buried oxide (BOX) 9718. This is shown in FIG. 97(*a*). The '0' bit corresponds to no charge being stored in the floating body 9720 and affects the threshold voltage of the memory cell transistor including source 9710, gate 9712, drain 9714, floating body 9720, and buried oxide (BOX) 9716. This is shown in FIG. 97(*b*). The difference in threshold voltage between the memory cell transistor depicted in FIG. 97(*a*) and FIG. 97(*b*) manifests itself as a change in the drain current 9734 of the transistor at a particular gate voltage 9736. This is described in FIG. 97(*c*). This current differential 9730 may be sensed by a sense amplifier circuit to differentiate between '0' and '1' states and thus function as a memory bit.

As illustrated in FIGS. 98A to 98H, a horizontally-oriented monolithic 3D DRAM that utilizes two masking steps per memory layer may be constructed that is suitable for 3D IC manufacturing.

Figure 98A:
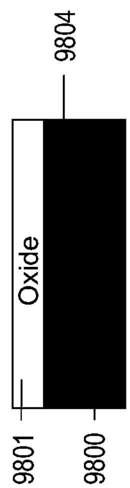

As illustrated in FIG. 98A, a P− substrate donor wafer 9800 may be processed to comprise a wafer sized layer of P− doping 9804. The P− layer 9804 may have the same or a different dopant concentration than the P− substrate 9800. The P− doping layer 9804 may be formed by ion implantation and thermal anneal. A screen oxide 9801 may be grown before the implant to protect the silicon from implant contamination and to provide an oxide surface for later wafer to wafer bonding.

Figure 98B:
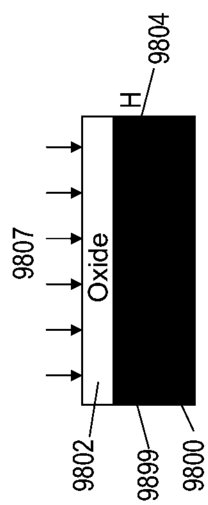

As illustrated in FIG. 98B, the top surface of donor wafer 9800 may be prepared for oxide to oxide wafer bonding with a deposition of an oxide 9802 or by thermal oxidation of the P− layer 9804 to form oxide layer 9802, or a re-oxidation of implant screen oxide 9801. A layer transfer demarcation plane 9899 (shown as a dashed line) may be formed in donor wafer 9800 or P− layer 9804 (shown) by hydrogen implantation 9807 or other methods as previously described. Both the donor wafer 9800 and acceptor wafer 9810 may be prepared for wafer bonding as previously described and then bonded, preferably at a low temperature (less than approximately 400° C.) to minimize stresses. The portion of the P− layer 9804 and the P− donor wafer substrate 9800 that are above the layer transfer demarcation plane 9899 may be removed by cleaving and polishing, or other processes as previously described, such as ion-cut or other methods.

Figure 98C:
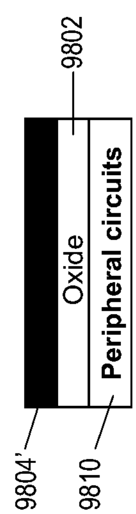

As illustrated in FIG. 98C, the remaining P− doped layer 9804', and oxide layer 9802 have been layer transferred to acceptor wafer 9810. Acceptor wafer 9810 may comprise peripheral circuits such that they can withstand an additional rapid-thermal-anneal (RTA) and still remain operational and retain good performance. For this purpose, the peripheral circuits may be formed such that they have not had an RTA for activating dopants or have had a weak RTA. Also, the peripheral circuits may utilize a refractory metal such as tungsten that can withstand high temperatures greater than approximately 400° C. The top surface of P− doped layer 9804' may be chemically or mechanically polished smooth and flat. Now transistors may be formed and aligned to the acceptor wafer 9810 alignment marks (not shown).

Figure 98D:
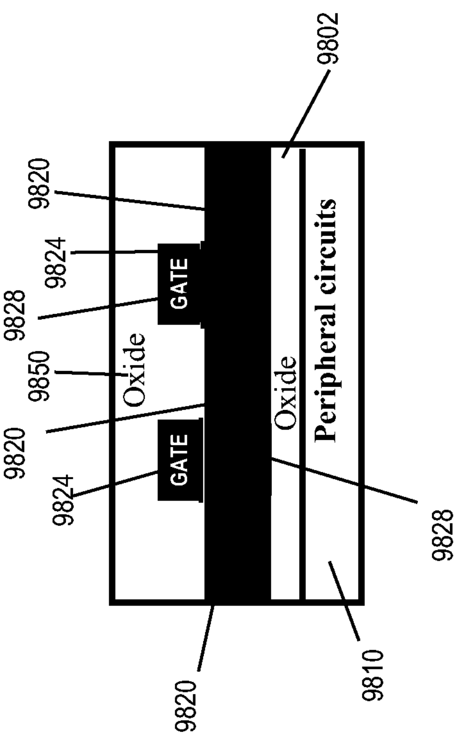

As illustrated in FIG. 98D shallow trench isolation (STI) oxide regions (not shown) may be lithographically defined and plasma/RIE etched to at least the top level of oxide layer 9802 removing regions of P− mono-crystalline silicon layer 9804'. A gap-fill oxide may be deposited and CMP'ed flat to form conventional STI oxide regions and P− doped mono-crystalline silicon regions (not shown) for forming the transistors. Threshold adjust implants may or may not be performed at this time. A gate stack 9824 may be formed with a gate dielectric, such as thermal oxide, and a gate metal material, such as polycrystalline silicon. Alternatively, the gate oxide may be an atomic layer deposited (ALD) gate dielectric that is paired with a work function specific gate metal according to an industry standard of high k metal gate process schemes described previously. Or the gate oxide may be formed with a rapid thermal oxidation (RTO), a low temperature oxide deposition or low temperature microwave plasma oxidation of the silicon surfaces and then a gate material such as tungsten or aluminum may be deposited. Gate stack self aligned LDD (Lightly Doped Drain) and halo punch-thru implants may be performed at this time to adjust junction and transistor breakdown characteristics. A conventional spacer deposition of oxide and/or nitride and a subsequent etchback may be done to form implant offset spacers (not shown) on the gate stacks 9824. Then a self aligned N+ source and drain implant may be performed to create transistor source and drains 9820 and remaining P− silicon NMOS transistor channels 9828. High temperature anneal steps may or may not be done at this time to activate the implants and set initial junction depths. Finally, the entire structure may be covered with a gap fill oxide 9850, which may be planarized with chemical mechanical polishing. The oxide surface may be prepared for oxide to oxide wafer bonding as previously described.

Figure 98E:
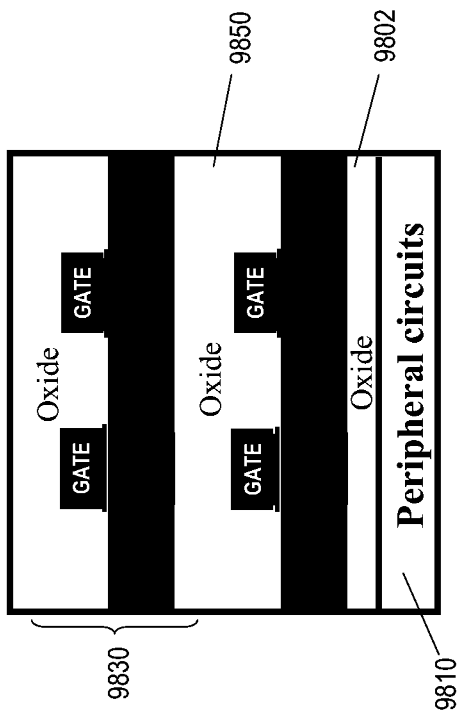

As illustrated in FIG. 98E, the transistor layer formation, bonding to acceptor wafer 9810 oxide 9850, and subsequent transistor formation as described in FIGS. 98A to 98D may be repeated to form the second tier 9830 of memory transistors. After all the desired memory layers are constructed, a rapid thermal anneal (RTA) may be conducted to activate the dopants in all of the memory layers and in the acceptor substrate 9810 peripheral circuits. Alternatively, optical anneals, such as, for example, a laser based anneal, may be performed.

Figure 98F:
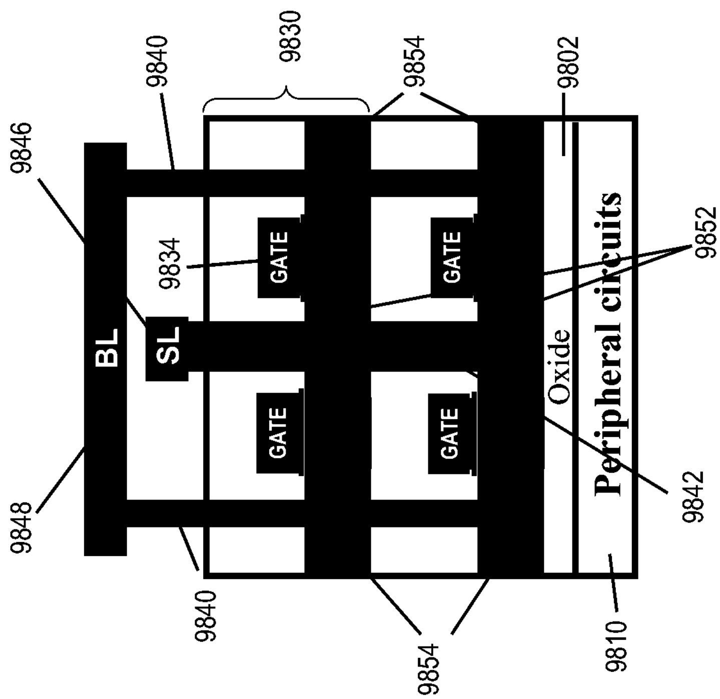

As illustrated in FIG. 98F, contacts and metal interconnects may be formed by lithography and plasma/RIE etch. Bit line (BL) contacts 9840 electrically couple the memory layers' transistor N+ regions on the transistor drain side 9854, and the source line contact 9842 electrically couples the memory layers' transistor N+ regions on the transistors source side 9852. The bit-line (BL) wiring 9848 and source-line (SL) wiring 9846 electrically couples the bit-line contacts 9840 and source-line contacts 9842 respectively. The gate stacks, such as 9834, may be connected with a contact and metallization (not shown) to form the word-lines (WLs). A thru layer via (not shown) may be formed to electrically couple the BL, SL, and WL metallization to the acceptor substrate 9810 peripheral circuitry via an acceptor wafer metal connect pad (not shown).

Figure 98G:
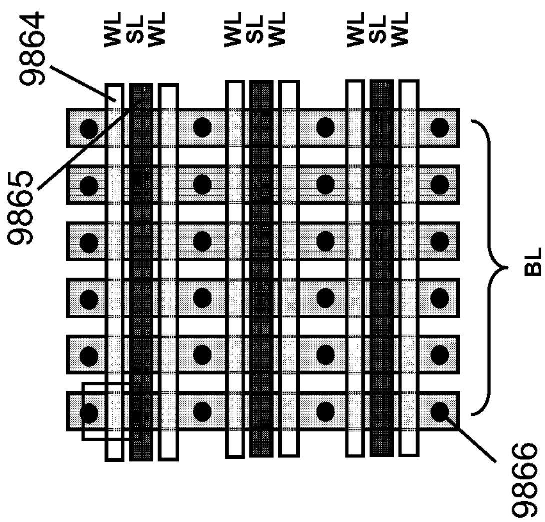

As illustrated in FIG. 98G, a top-view layout a section of the top of the memory array is shown where WL wiring 9864 and SL wiring 9865 may be perpendicular to the BL wiring 9866.

Figure 98H:
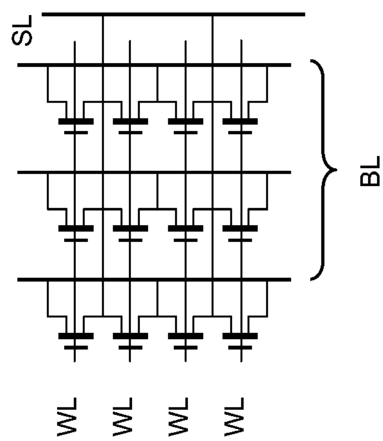

As illustrated in FIG. 98H, a schematic of each single layer of the DRAM array shows the connections for WLs, BLs and SLs at the array level. The multiple layers of the array share BL and SL contacts, but each layer has its own unique set of WL connections to allow each bit to be accessed independently of the others.

This flow enables the formation of a horizontally-oriented monolithic 3D DRAM array that utilizes two masking steps per memory layer and is constructed by layer transfers of wafer sized doped mono-crystalline silicon layers and this 3D DRAM array may be connected to an underlying multi-metal layer semiconductor device, which may or may not contain the peripheral circuits, used to control the DRAM's read and write functions.

Persons of ordinary skill in the art will appreciate that the illustrations in FIGS. 98A through 98H are exemplary only and are not drawn to scale. Such skilled persons will further appreciate that many variations are possible such as, for example, the transistors may be of another type such as RCATs, or junction-less. Or the contacts may utilize doped poly-crystalline silicon, or other conductive materials. Or the stacked memory layer may be connected to a periphery circuit that is above the memory stack. Many other modifications within the scope of the invention will suggest themselves to such skilled persons after reading this specification. Thus the invention is to be limited only by the appended claims.

As illustrated in FIGS. 99A to 99M, a horizontally-oriented monolithic 3D DRAM that utilizes one masking step per memory layer may be constructed that is suitable for 3D IC.

Figure 99A:
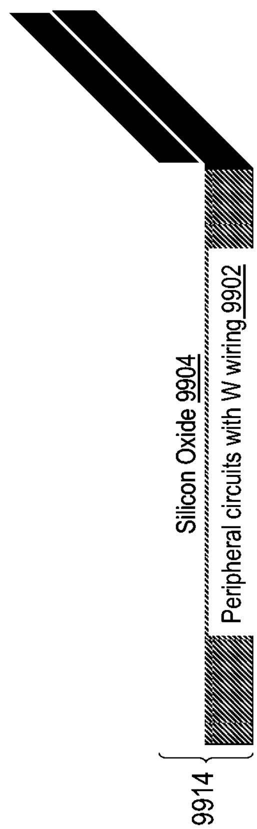

As illustrated in FIG. 99A, a silicon substrate with peripheral circuitry 9902 may be constructed with high temperature (greater than approximately 400° C.) resistant wiring, such as Tungsten. The peripheral circuitry substrate 9902 may comprise memory control circuits as well as circuitry for other purposes and of various types, such as analog, digital, radio-frequency (RF), or memory. The peripheral circuitry substrate 9902 may comprise peripheral circuits that can withstand an additional rapid-thermal-anneal (RTA) and still remain operational and retain good performance. For this purpose, the peripheral circuits may be formed such that they have been subject to a weak RTA or no RTA for activating dopants. The top surface of the peripheral circuitry substrate 9902 may be prepared for oxide wafer bonding with a deposition of a silicon oxide 9904, thus forming acceptor wafer 9914.

Figure 99B:
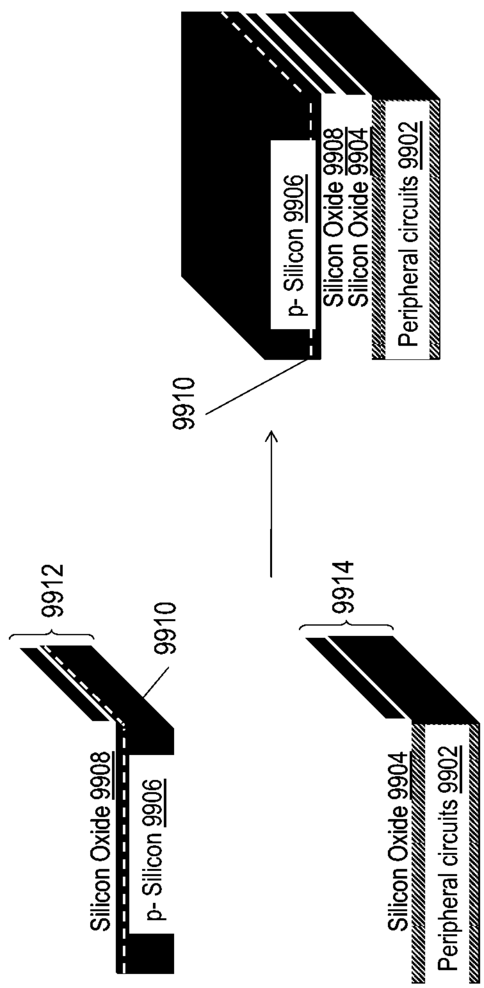

As illustrated in FIG. 99B, a mono-crystalline silicon donor wafer 9912 may be optionally processed to comprise a wafer sized layer of P− doping (not shown) which may have a different dopant concentration than the P− substrate 9906. The P− doping layer may be formed by ion implantation and thermal anneal. A screen oxide 9908 may be grown or deposited prior to the implant to protect the silicon from implant contamination and to provide an oxide surface for later wafer to wafer bonding. A layer transfer demarcation plane 9910 (shown as a dashed line) may be formed in donor wafer 9912 within the P− substrate 9906 or the P− doping layer (not shown) by hydrogen implantation or other methods as previously described. Both the donor wafer 9912 and acceptor wafer 9914 may be prepared for wafer bonding as previously described and then bonded at the surfaces of oxide layer 9904 and oxide layer 9908, at a low temperature (less than approximately 400° C.) preferred for lowest stresses, or a moderate temperature (less than approximately 900° C.).

Figure 99C:
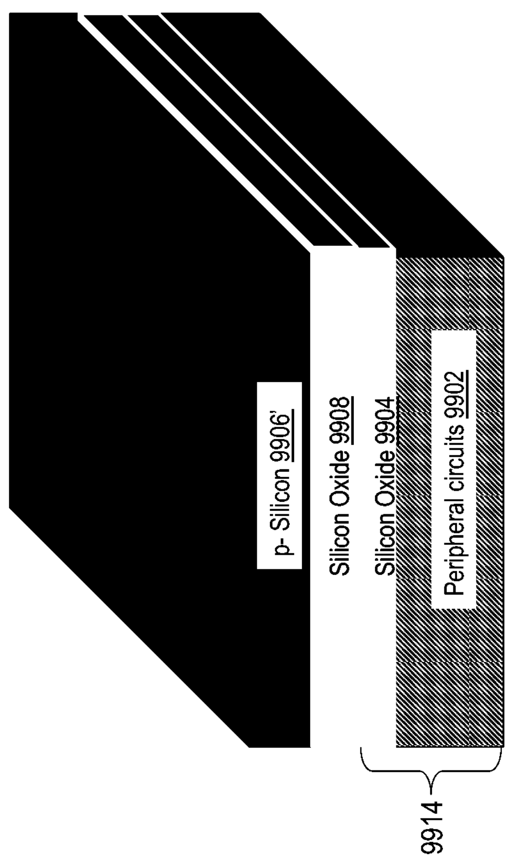

As illustrated in FIG. 99C, the portion of the P− layer (not shown) and the P− wafer substrate 9906 that are above the layer transfer demarcation plane 9910 may be removed by cleaving and polishing, or other processes as previously described, such as, for example, ion-cut or other methods, thus forming the remaining mono-crystalline silicon P− layer 9906'. Remaining P− layer 9906' and oxide layer 9908 have been layer transferred to acceptor wafer 9914. The top surface of P− layer 9906' may be chemically or mechanically polished smooth and flat. Now transistors or portions of transistors may be formed and aligned to the acceptor wafer 9914 alignment marks (not shown).

Figure 99D:
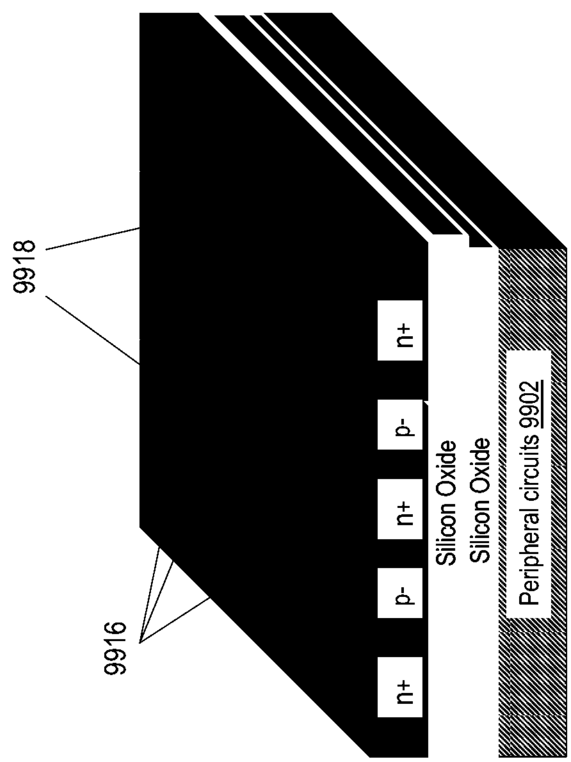

As illustrated in FIG. 99D, N+ silicon regions 9916 may be lithographically defined and N type species, such as Arsenic, may be ion implanted into P− silicon layer 9906'. This also forms remaining regions of P− silicon 9918.

Figure 99E:
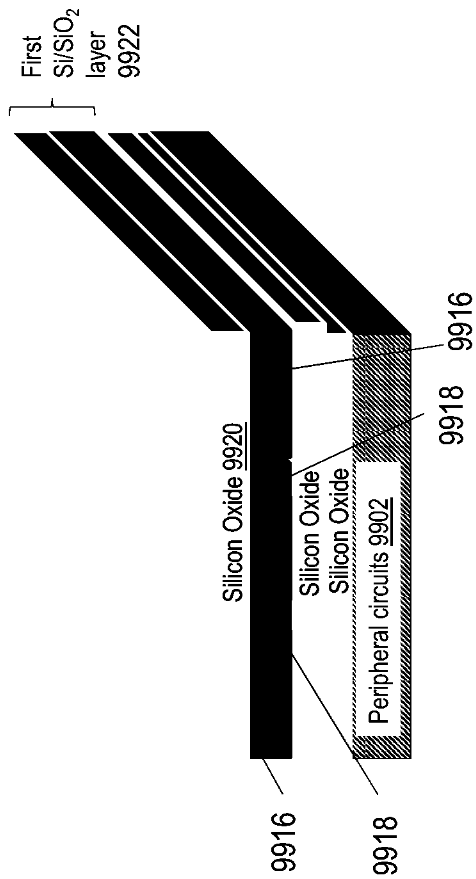

As illustrated in FIG. 99E, oxide layer 9920 may be deposited to prepare the surface for later oxide to oxide bonding, leading to the formation of the first Si/SiO2 layer 9922 which includes silicon oxide layer 9920, N+ silicon regions 9916, and P− silicon regions 9918.

Figure 99F:
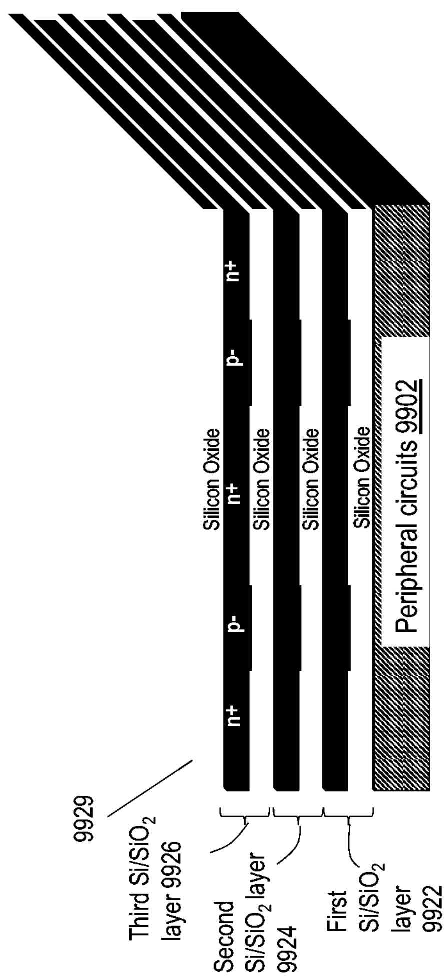

As illustrated in FIG. 99F, additional Si/SiO2 layers, such as second Si/SiO2 layer 9924 and third Si/SiO2 layer 9926, may each be formed as described in FIGS. 99A to 99E. Oxide layer 9929 may be deposited. After all the desired memory layers are constructed, a rapid thermal anneal (RTA) may be conducted to activate the dopants in substantially all of the memory layers 9922, 9924, 9926 and in the peripheral circuits 9902. Alternatively, optical anneals, such as, for example, a laser based anneal, may be performed.

Figure 99G:
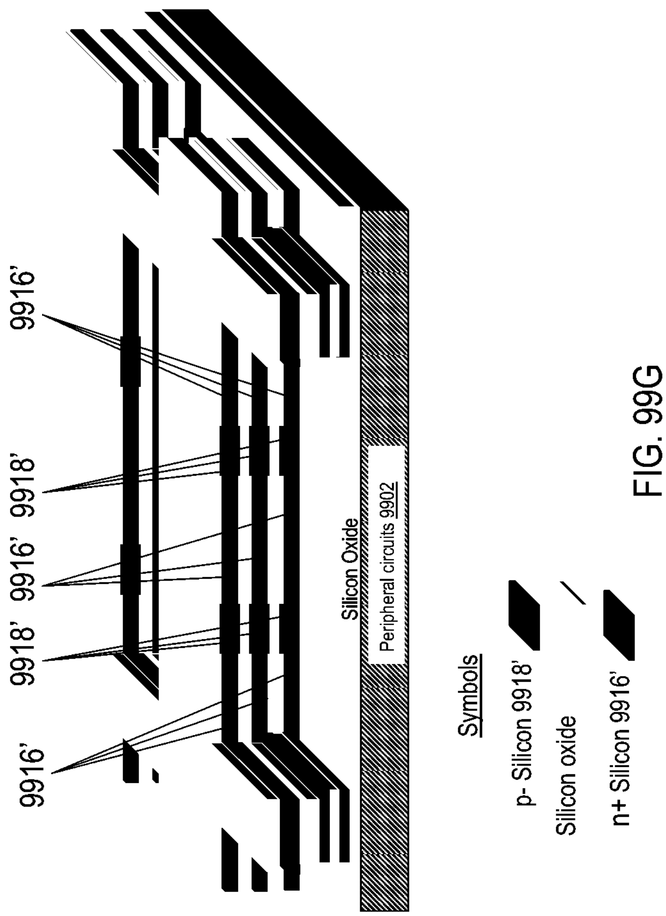

As illustrated in FIG. 99G, oxide layer 9929, third Si/SiO2 layer 9926, second Si/SiO2 layer 9924 and first Si/SiO2 layer 9922 may be lithographically defined and plasma/RIE etched to form a portion of the memory cell structure. The etching may form regions of P− silicon 9918', which will form the floating body transistor channels, and N+ silicon regions 9916', which form the source, drain and local source lines.

Figure 99H:
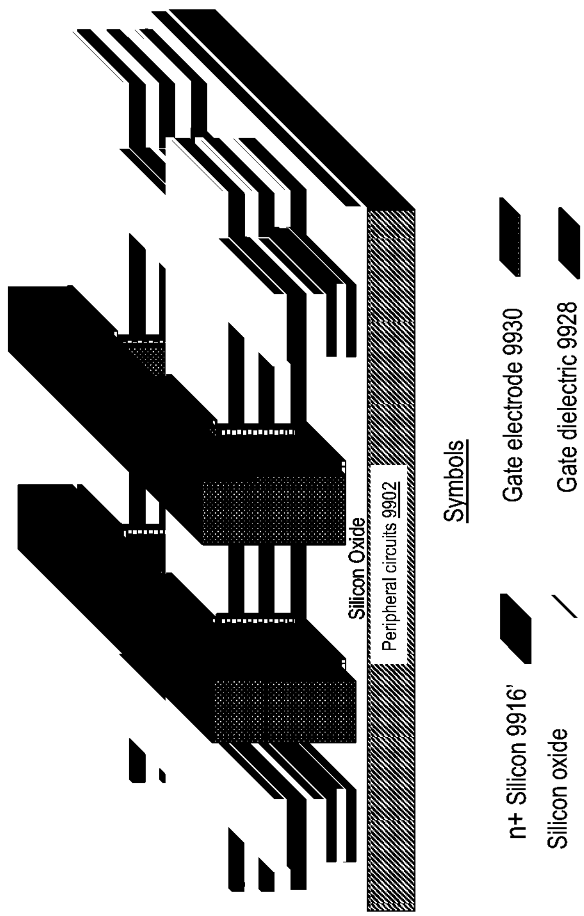

As illustrated in FIG. 99H, a gate dielectric and gate electrode material may be deposited, planarized with a chemical mechanical polish (CMP), and then lithographically defined and plasma/RIE etched to form gate dielectric regions 9928 which may be self aligned to and covered by gate electrodes 9930 (shown), or may substantially cover the entire silicon/oxide multi-layer structure. The gate electrode 9930 and gate dielectric 9928 stack may be sized and aligned such that P− silicon regions 9918' are substantially completely covered. The gate stack comprised of gate electrode 9930 and gate dielectric 9928 may be formed with a gate dielectric, such as thermal oxide, and a gate electrode material, such as polycrystalline silicon. Alternatively, the gate dielectric may be an atomic layer deposited (ALD) material that is paired with a work function specific gate metal according to an industry standard of high k metal gate process schemes described previously. Further the gate dielectric may be formed with a rapid thermal oxidation (RTO), a low temperature oxide deposition or low temperature microwave plasma oxidation of the silicon surfaces and then a gate electrode such as tungsten or aluminum may be deposited.

Figure 99I:
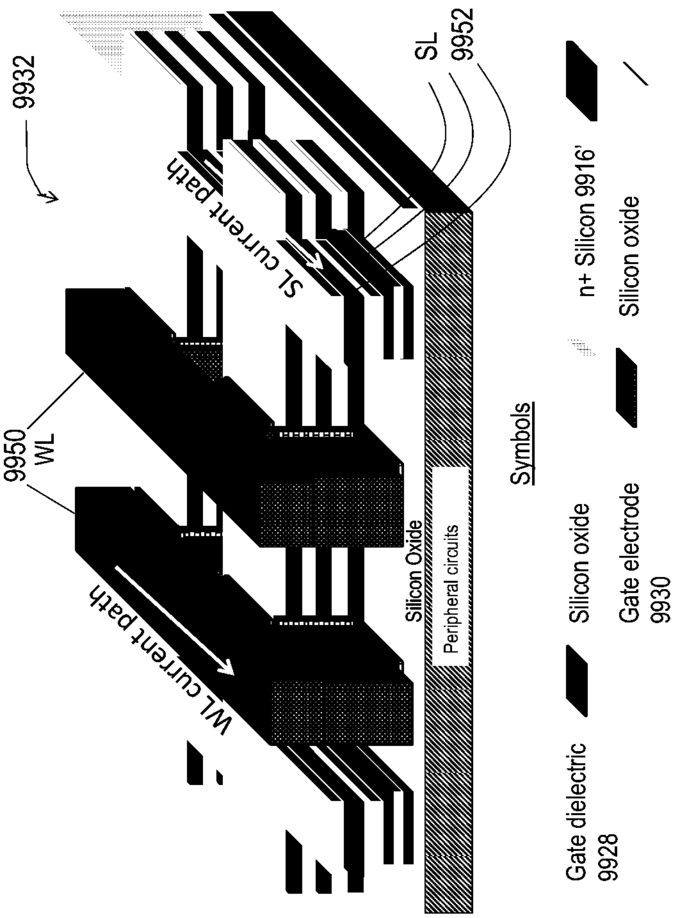

As illustrated in FIG. 99I, substantially the entire structure may be covered with a gap fill oxide 9932, which may be planarized with chemical mechanical polishing. The oxide 9932 is shown transparent in the figure for clarity, along with word-line regions (WL) 9950, coupled with and composed of gate electrodes 9930, and source-line regions (SL) 9952, composed of indicated N+ silicon regions 9916'.

Figure 99J:
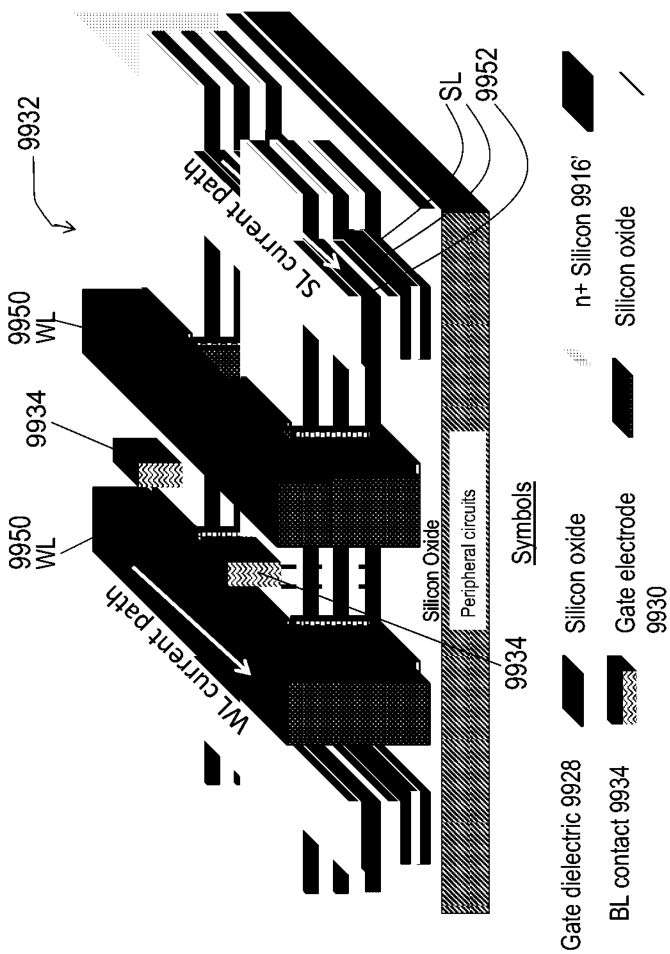

As illustrated in FIG. 99J, bit-line (BL) contacts 9934 may be lithographically defined, etched along with plasma/RIE, and processed by a photoresist removal. Afterwards, metal, such as copper, aluminum, or tungsten, may be deposited to fill the contact and subsequently etched or polished to the top of oxide 9932. Each BL contact 9934 may be shared among substantially all layers of memory, shown as three layers of memory in FIG. 99J. A thru layer via (not shown) may be formed to electrically couple the BL, SL, and WL metallization to the acceptor substrate 9914 peripheral circuitry via an acceptor wafer metal connect pad (not shown).

Figure 99K:
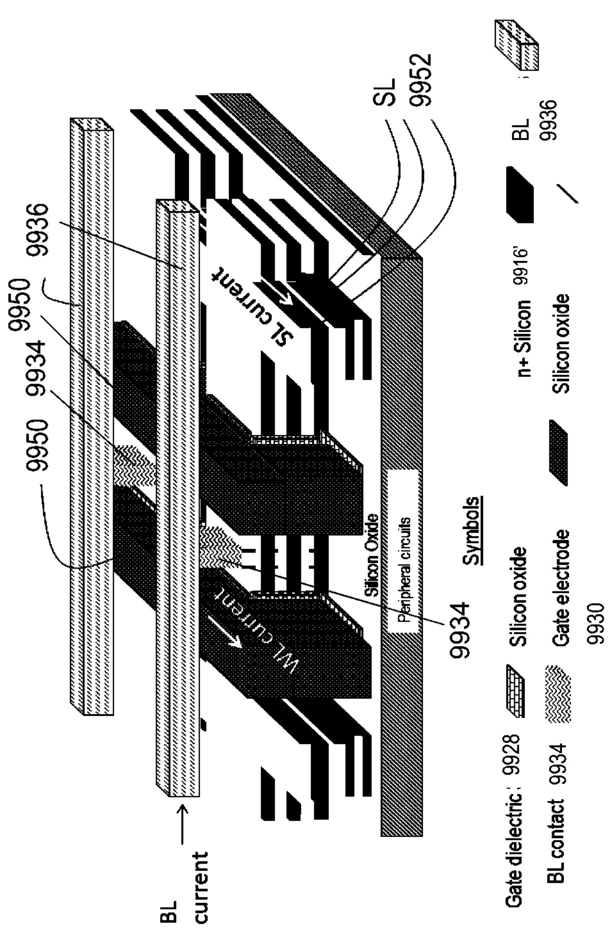

As illustrated in FIG. 99K, BL metal lines 9936 may be formed and connected to the associated BL contacts 9934. Contacts and associated metal interconnect lines (not shown) may be formed for the WL and SL at the memory array edges. SL contacts can be made into stair-like structures using techniques described in "Bit Cost Scalable Technology with Punch and Plug Process for Ultra High Density Flash Memory," *VLSI Technology,* 2007 *IEEE Symposium on, vol., no., pp.* 14-15, 12-14 Jun. 2007 by Tanaka, H.; Kido, M.; Yahashi, K.; Oomura, M.; et al.

Figure 99L:
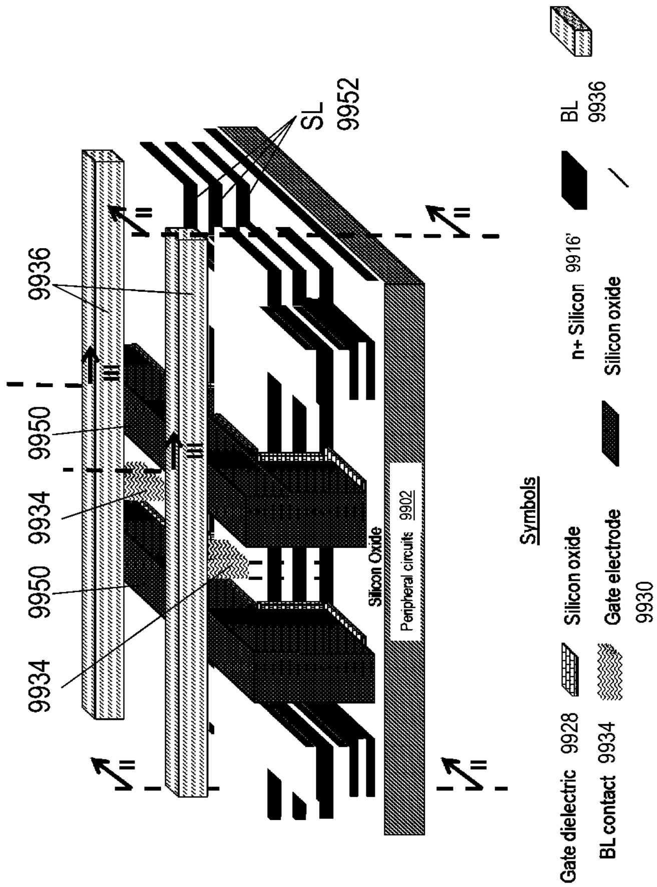

As illustrated in FIGS. 99L, 99L1 and 99L2, cross section cut II of FIG. 99L is shown in FIG. 99L1, and cross section cut III of FIG. 99L is shown in FIG. 99L2. BL metal line 9936, oxide 9932, BL contact 9934, WL regions 9950, gate dielectric 9928, P− silicon regions 9918', and peripheral circuits substrate 9902 are shown in FIG. 99L1. The BL contact 9934 connects to one side of the three levels of floating body transistors that may be comprised of two N+ silicon regions 9916' in each level with their associated P− silicon region 9918'. BL metal lines 9936, oxide 9932, gate electrode 9930, gate dielectric 9928, P− silicon regions 9918', interlayer oxide region ('ox'), and peripheral circuits substrate 9902 are shown in FIG. 99L2. The gate electrode 9930 is common to substantially all six P− silicon regions 9918' and forms six two-sided gated floating body transistors.

Figure 99M:
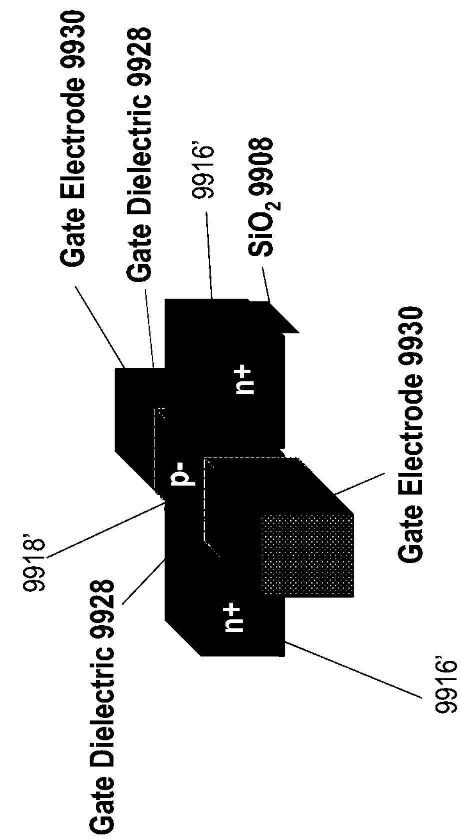

As illustrated in FIG. 99M, a single exemplary floating body transistor with two gates on the first Si/SiO2 layer 9922 may include P− silicon region 9918' (functioning as the floating body transistor channel), N+ silicon regions 9916' (functioning as source and drain), and two gate electrodes 9930 with associated gate dielectrics 9928. The transistor may be electrically isolated from beneath by oxide layer 9908.

This flow enables the formation of a horizontally-oriented monolithic 3D DRAM that utilizes one masking step per memory layer constructed by layer transfers of wafer sized doped mono-crystalline silicon layers and this 3D DRAM may be connected to an underlying multi-metal layer semiconductor device.

Persons of ordinary skill in the art will appreciate that the illustrations in FIGS. 99A through 99M are exemplary only and are not drawn to scale. Such skilled persons will further appreciate that many variations are possible such as, for example, the transistors may be of another type such as RCATs, or junction-less. Or the contacts may utilize doped poly-crystalline silicon, or other conductive materials. Or the stacked memory layers may be connected to a periphery circuit that is above the memory stack. Or Si/SiO2 layers 9922, 9924 and 9926 may be annealed layer-by-layer as soon as their associated implantations are complete by using a laser anneal system. Many other modifications within the scope of the invention will suggest themselves to such skilled persons after reading this specification. Thus the invention is to be limited only by the appended claims.

As illustrated in FIGS. 100A to 100L, a horizontally-oriented monolithic 3D DRAM that utilizes zero additional masking steps per memory layer by sharing mask steps after substantially all the layers have been transferred may be constructed. The 3D DRAM is suitable for 3D IC manufacturing.

Figure 100A:
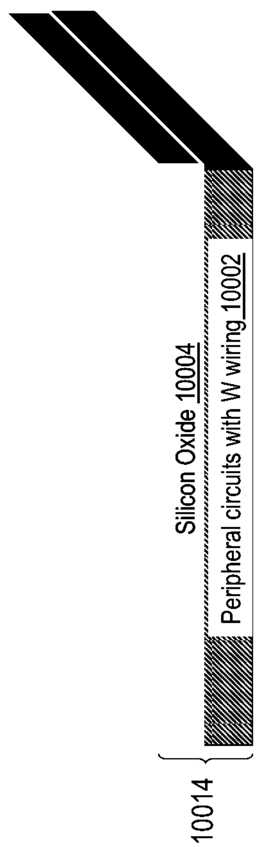

As illustrated in FIG. 100A, a silicon substrate with peripheral circuitry 10002 may be constructed with high temperature (greater than approximately 400° C.) resistant wiring, such as Tungsten. The peripheral circuitry substrate 10002 may comprise memory control circuits as well as circuitry for other purposes and of various types, such as analog, digital, RF, or memory. The peripheral circuitry substrate 10002 may include peripheral circuits that can withstand an additional rapid-thermal-anneal (RTA) and still remain operational and retain good performance. For this purpose, the peripheral circuits may be formed such that they have been subject to a weak RTA or no RTA for activating dopants. The top surface of the peripheral circuitry substrate 10002 may be prepared for oxide wafer bonding with a deposition of a silicon oxide 10004, thus forming acceptor wafer 10014.

Figure 100B:
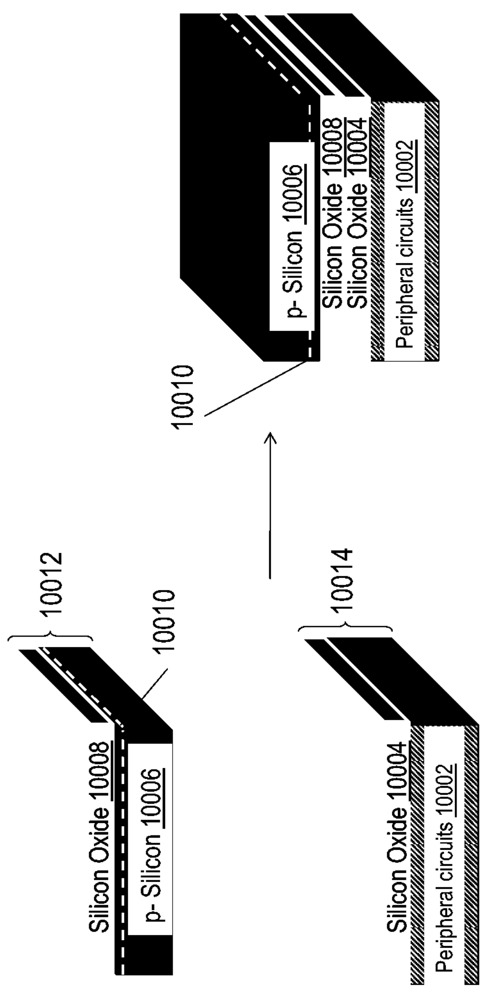

As illustrated in FIG. 100B, a mono-crystalline silicon donor wafer 10012 may be processed to comprise a wafer sized layer of P− doping (not shown) which may have a different dopant concentration than the P− substrate 10006. The P− doping layer may be formed by ion implantation and thermal anneal. A screen oxide 10008 may be grown or deposited prior to the implant to protect the silicon from implant contamination and to provide an oxide surface for later wafer to wafer bonding. A layer transfer demarcation plane 10010 (shown as a dashed line) may be formed in donor wafer 10012 within the P− substrate 10006 or the P− doping layer (not shown) by hydrogen implantation or other methods as previously described. Both the donor wafer 10012 and acceptor wafer 10014 may be prepared for wafer bonding as previously described and then bonded at the surfaces of oxide layer 10004 and oxide layer 10008, at a low temperature (less than approximately 400° C.) preferred for lowest stresses, or a moderate temperature (less than approximately 900° C.).

Figure 100C:
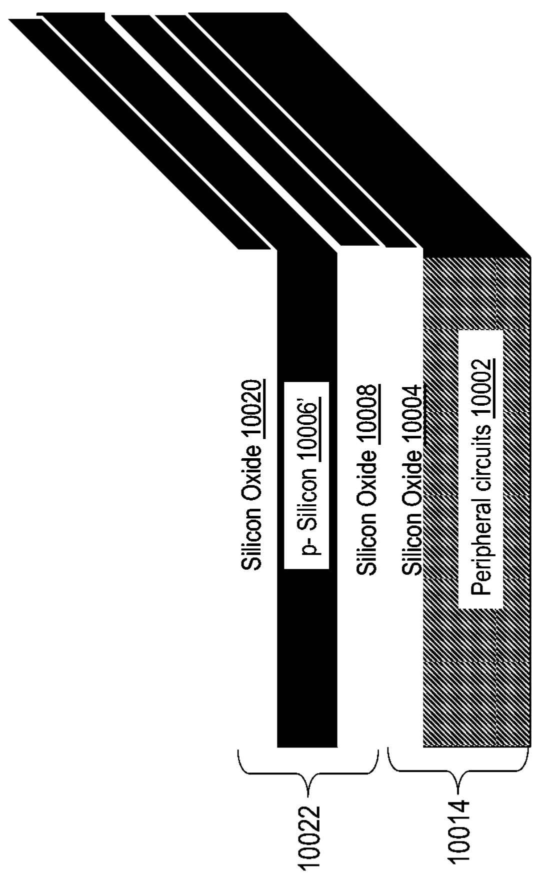

As illustrated in FIG. 100C, the portion of the P− layer (not shown) and the P− wafer substrate 10006 that are above the layer transfer demarcation plane 10010 may be removed by cleaving and polishing, or other processes as previously described, such as ion-cut or other methods, thus forming the remaining mono-crystalline silicon P− layer 10006'. Remaining P− layer 10006' and oxide layer 10008 have been layer transferred to acceptor wafer 10014. The top surface of P− layer 10006' may be chemically or mechanically polished smooth and flat. Now transistors or portions of transistors may be formed and aligned to the acceptor wafer 10014 alignment marks (not shown). Oxide layer 10020 may be deposited to prepare the surface for later oxide to oxide bonding. This now forms the first Si/SiO2 layer 10023 which includes silicon oxide layer 10020, P− silicon layer 10006', and oxide layer 10008.

Figure 100D:
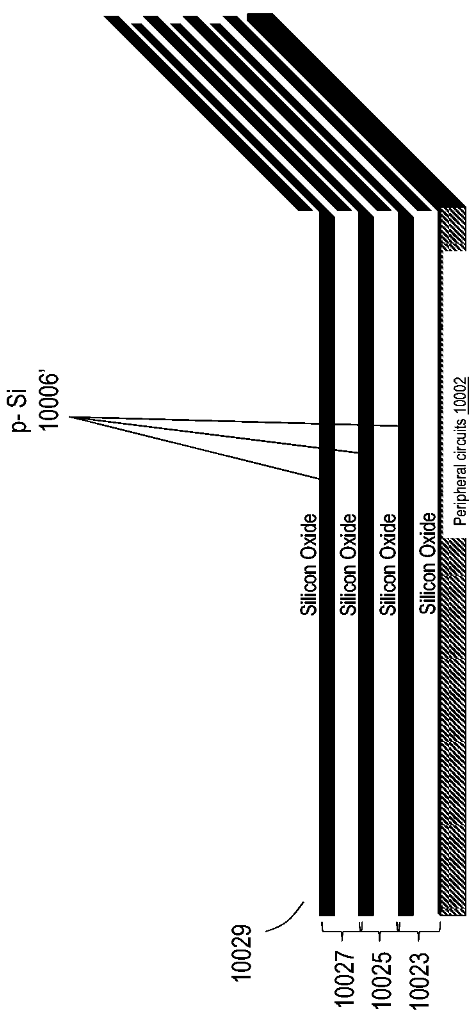

As illustrated in FIG. 100D, additional Si/SiO2 layers, such as second Si/SiO2 layer 10025 and third Si/SiO2 layer 10027, may each be formed as described in FIGS. 100A to 100C. Oxide layer 10029 may be deposited to electrically isolate the top silicon layer.

Figure 100E:
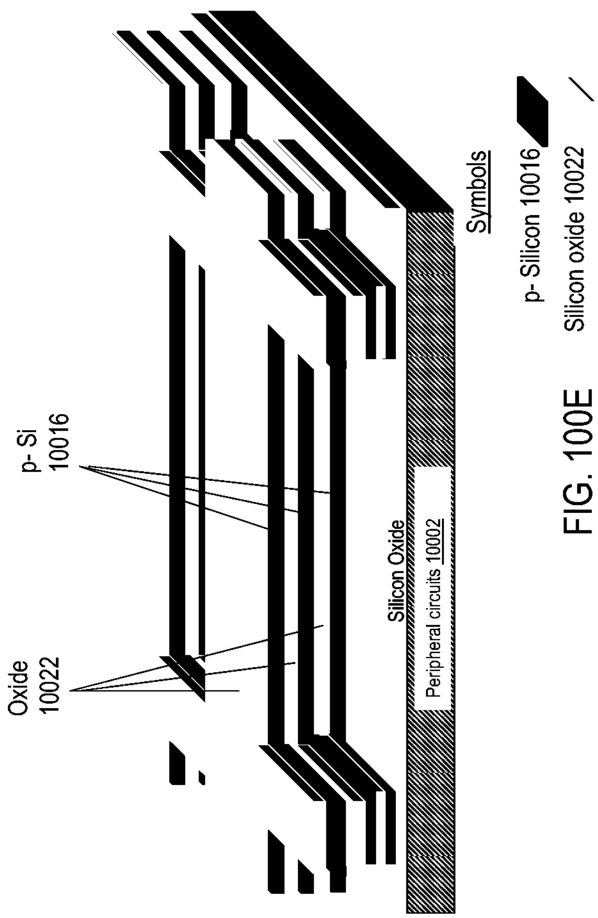

As illustrated in FIG. 100E, oxide 10029, third Si/SiO2 layer 10027, second Si/SiO2 layer 10025 and first Si/SiO2 layer 10023 may be lithographically defined and plasma/RIE etched to form a portion of the memory cell structure, which now includes regions of P− silicon 10016 and oxide 10022.

Figure 100F:
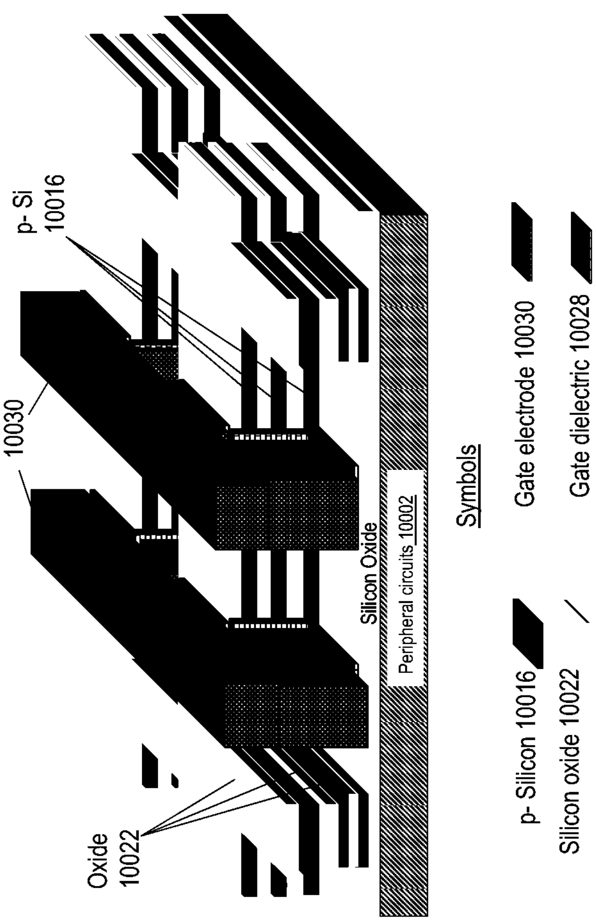

As illustrated in FIG. 100F, a gate dielectric and gate electrode material may be deposited, planarized with a chemical mechanical polish (CMP), and then lithographically defined and plasma/RIE etched to form gate dielectric regions 10028 which may either be self aligned to and covered by gate electrodes 10030 (shown), or cover the entire silicon/oxide multi-layer structure. The gate stack including gate electrode 10030 and gate dielectric 10028 may be formed with a gate dielectric, such as, for example, thermal oxide, and a gate electrode material, such as poly-crystalline silicon. Alternatively, the gate dielectric may be an atomic layer deposited (ALD) material that is paired with a work function specific gate metal according to an industry standard of high k metal gate process schemes described previously. Or the gate dielectric may be formed with a rapid thermal oxidation (RTO), a low temperature oxide deposition or low temperature microwave plasma oxidation of the silicon surfaces and then a gate electrode such as, for example, tungsten or aluminum may be deposited.

Figure 100G:
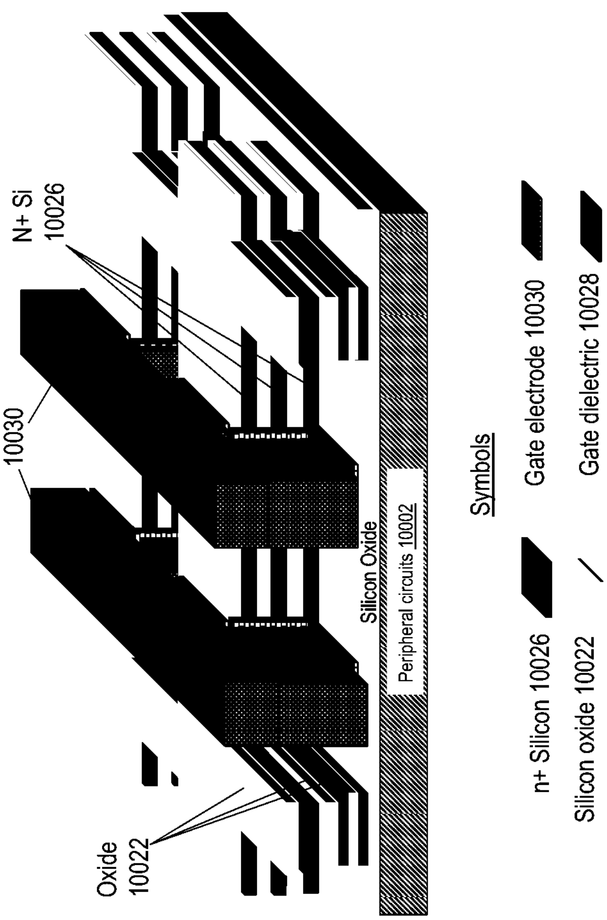

As illustrated in FIG. 100G, N+ silicon regions 10026 may be formed in a self aligned manner to the gate electrodes 10030 by ion implantation of an N type species, such as Arsenic, into the regions of P− silicon 10016 that are not blocked by the gate electrodes 10030. This also forms remaining regions of P− silicon 10017 (not shown) in the gate electrode 10030 blocked areas. Different implant energies or angles, or multiples of each, may be utilized to place the N type species into each layer of P− silicon regions 10016. Spacers (not shown) may be utilized during this multi-step implantation process and layers of silicon present in different layers of the stack may have different spacer widths to account for the differing lateral straggle of N type species implants. Bottom layers, such as 10023, could have larger spacer widths than top layers, such as, for example, 10027. Alternatively, angular ion implantation with substrate rotation may be utilized to compensate for the differing implant straggle. The top layer implantation may have a slanted angle, rather than perpendicular, to the wafer surface and hence land ions slightly underneath the gate electrode 10030 edges and closely match a more perpendicular lower layer implantation which may land ions slightly underneath the gate electrode 10030 edge due to the straggle effects of the greater implant energy needed to reach the lower layer. A rapid thermal anneal (RTA) may be conducted to activate the dopants in substantially all of the memory layers 10023, 10025, 10027 and in the peripheral circuits 10002. Alternatively, optical anneals, such as, for example, a laser based anneal, may be performed.

Figure 100H:
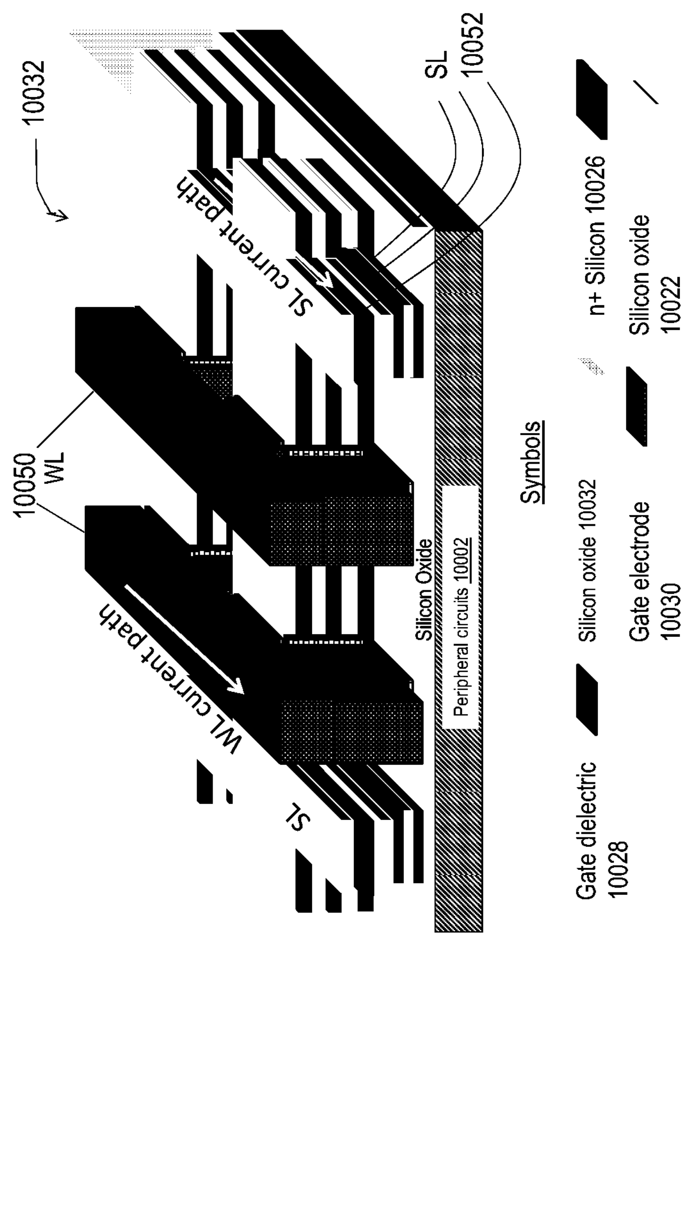

As illustrated in FIG. 100H, the entire structure may be covered with a gap fill oxide 10032, which be planarized with chemical mechanical polishing. The oxide 10032 is shown transparent in the figure for clarity. Word-line regions (WL) 10050, coupled with and composed of gate electrodes 10030, and source-line regions (SL) 10052, composed of indicated N+ silicon regions 10026, are shown.

Figure 100I:
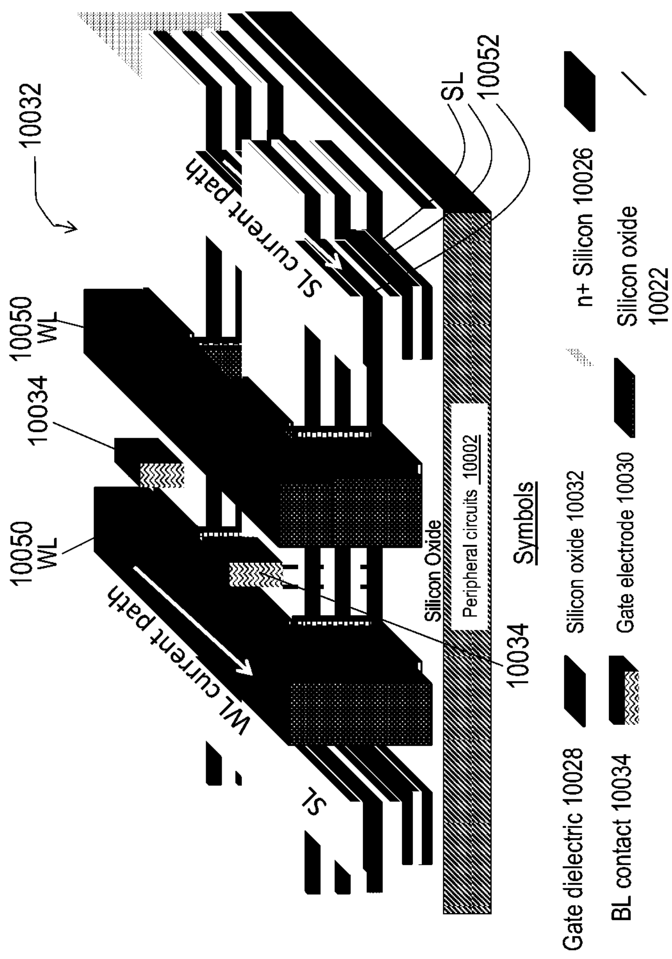

As illustrated in FIG. 100I, bit-line (BL) contacts 10034 may be lithographically defined, etched with plasma/RIE, and processed by a photoresist removal. Afterwards, metal, such as, for example, copper, aluminum, or tungsten, may be deposited to fill the contact and etched or polished to the top of oxide 10032. Each BL contact 10034 may be shared among substantially all layers of memory, shown as three layers of memory in FIG. 100I. A thru layer via 10060 (not shown) may be formed to electrically couple the BL, SL, and WL metallization to the acceptor substrate 10014 peripheral circuitry via an acceptor wafer metal connect pad 10080 (not shown).

Figure 100J:
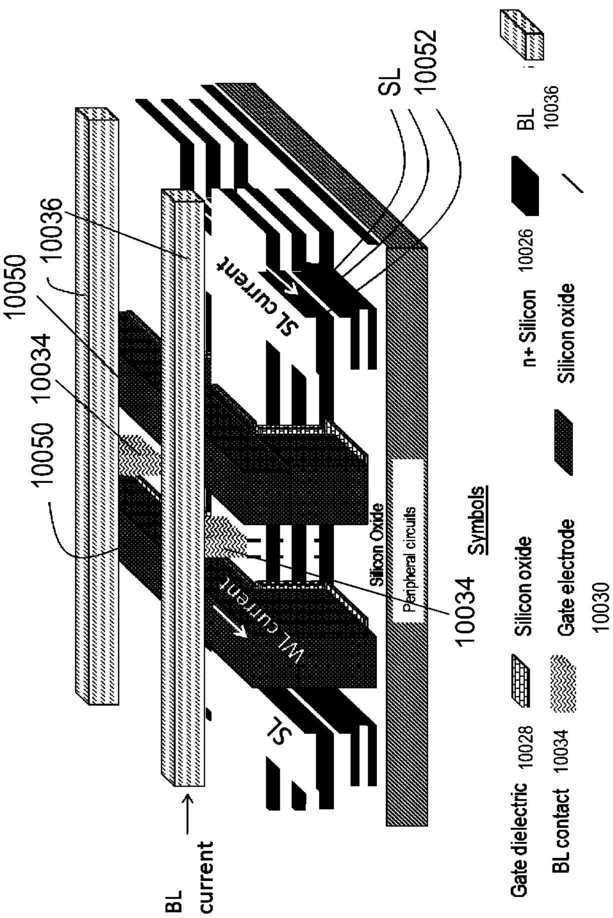

As illustrated in FIG. 100J, BL metal lines 10036 may be formed and connect to the associated BL contacts 10034. Contacts and associated metal interconnect lines (not shown) may be formed for the WL and SL at the memory array edges.

Figure 100K:
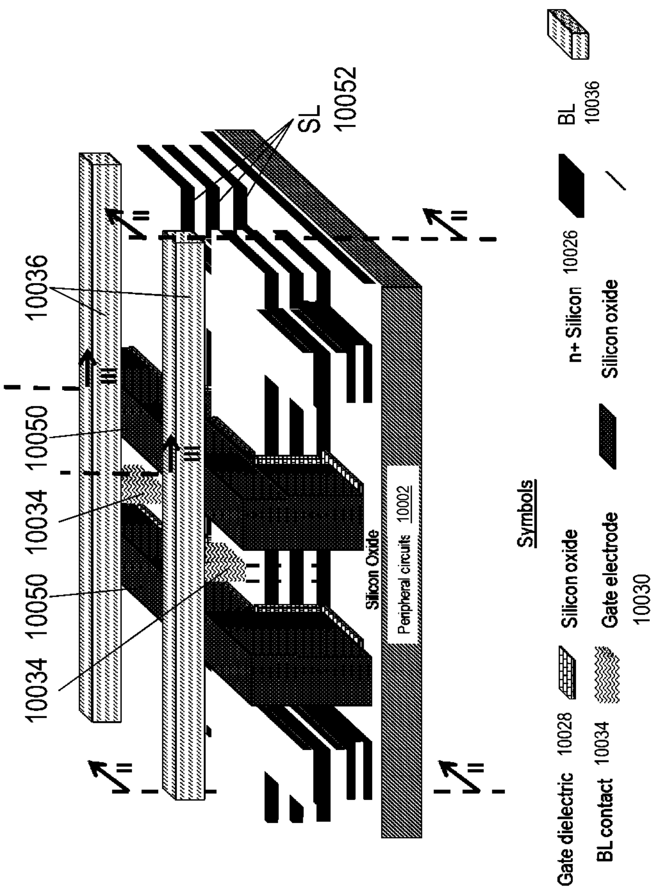

FIG. 100K1 shows a cross-sectional cut II of FIG. 100K, while FIG. 100K2 shows a cross-sectional cut III of FIG. 100K. FIG. 100K1 shows BL metal line 10036, oxide 10032, BL contact 10034, WL regions 10050, gate dielectric 10028, N+ silicon regions 10026, P− silicon regions 10017, and peripheral circuits substrate 10002. The BL contact 10034 couples to one side of the three levels of floating body transistors that may include two N+ silicon regions 10026 in each level with their associated P− silicon region 10017. FIG. 100K2 shows BL metal lines 10036, oxide 10032, gate electrode 10030, gate dielectric 10028, P− silicon regions 10017, interlayer oxide region ('ox'), and peripheral circuits substrate 10002. The gate electrode 10030 is common to substantially all six P− silicon regions 10017 and forms six two-sided gated floating body transistors.

Figure 100L:
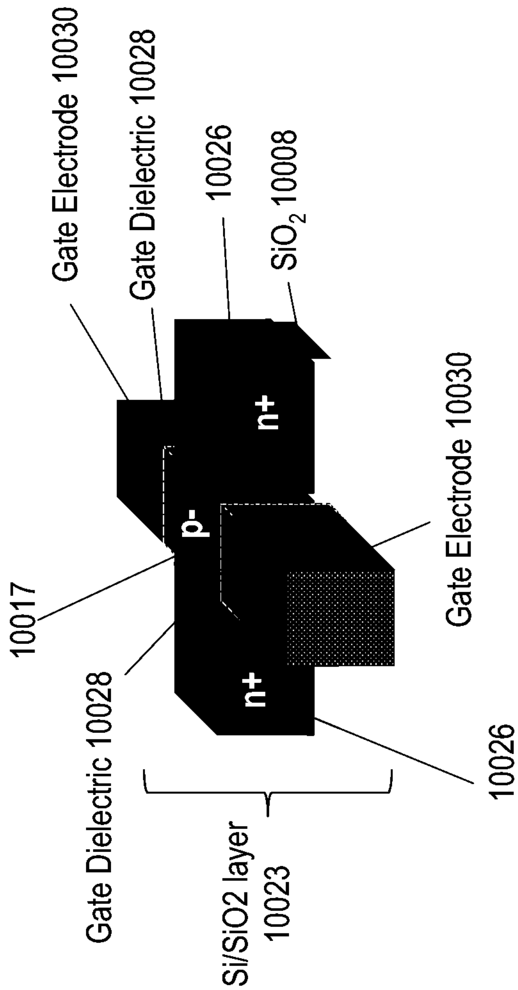

As illustrated in FIG. 100LM, a single exemplary floating body two gate transistor on the first Si/SiO2 layer 10023, may include P− silicon region 10017 (functioning as the floating body transistor channel), N+ silicon regions 10026 (functioning as source and drain), and two gate electrodes 10030 with associated gate dielectrics 10028. The transistor is electrically isolated from beneath by oxide layer 10008.

This flow may enable the formation of a horizontally-oriented monolithic 3D DRAM that utilizes zero additional masking steps per memory layer and is constructed by layer transfers of wafer sized doped mono-crystalline silicon layers and may be connected to an underlying multi-metal layer semiconductor device.

Persons of ordinary skill in the art will appreciate that the illustrations in FIGS. 100A through 100L are exemplary only and are not drawn to scale. Such skilled persons will further appreciate that many variations are possible such as, for example, the transistors may be of another type such as RCATs, or junction-less. Additionally, the contacts may utilize doped poly-crystalline silicon, or other conductive materials. Moreover, the stacked memory layer may be connected to a periphery circuit that is above the memory stack. Further, each gate of the double gate 3D DRAM can be independently controlled for better control of the memory cell. Many other modifications within the scope of the invention will suggest themselves to such skilled persons after reading this specification. Thus the invention is to be limited only by the appended claims.

Novel monolithic 3D memory technologies utilizing material resistance changes may be constructed in a similar manner. There are many types of resistance-based memories including phase change memory, Metal Oxide memory, resistive RAM (RRAM), memristors, solid-electrolyte memory, ferroelectric RAM, MRAM, etc. Background information on these resistive-memory types is given in "Overview of candidate device technologies for storage-class memory," *IBM Journal of Research and Development*, vol. 52, no. 4.5, pp. 449-464, July 2008 by Burr, G. W., et. al. The contents of this document are incorporated in this specification by reference.

As illustrated in FIGS. 101A to 101K, a resistance-based zero additional masking steps per memory layer 3D memory may be constructed that is suitable for 3D IC manufacturing. This 3D memory utilizes junction-less transistors and has a resistance-based memory element in series with a select or access transistor.

Figure 101A:
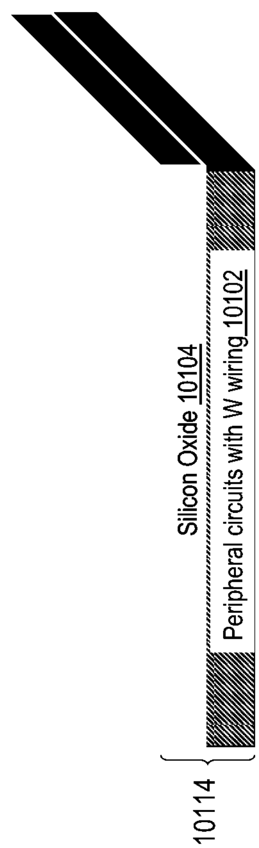

As illustrated in FIG. 101A, a silicon substrate with peripheral circuitry 10102 may be constructed with high temperature (greater than approximately 400° C.) resistant wiring, such as, for example, Tungsten. The peripheral circuitry substrate 10102 may include memory control circuits as well as circuitry for other purposes and of various types, such as, for example, analog, digital, RF, or memory. The peripheral circuitry substrate 10102 may include peripheral circuits that can withstand an additional rapid-thermal-anneal (RTA) and still remain operational and retain good performance. For this purpose, the peripheral circuits may be formed such that they have had a weak RTA or no RTA for activating dopants. The top surface of the peripheral circuitry substrate 10102 may be prepared for oxide wafer bonding with a deposition of a silicon oxide 10104, thus forming acceptor wafer 10114.

Figure 101B:
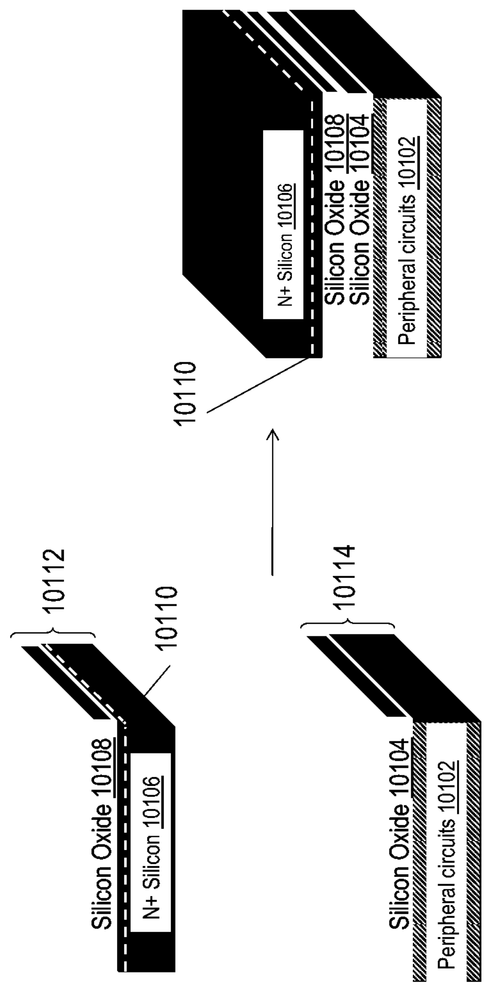

As illustrated in FIG. 101B, a mono-crystalline silicon donor wafer 10112 may be optionally processed to include a wafer sized layer of N+ doping (not shown) which may have a different dopant concentration than the N+ substrate 10106. The N+ doping layer may be formed by ion implantation and thermal anneal. A screen oxide 10108 may be grown or deposited prior to the implant to protect the silicon from implant contamination and to provide an oxide surface for later wafer to wafer bonding. A layer transfer demarcation plane 10110 (shown as a dashed line) may be formed in donor wafer 10112 within the N+ substrate 10106 or the N+ doping layer (not shown) by hydrogen implantation or other methods as previously described. Both the donor wafer 10112 and acceptor wafer 10114 may be prepared for wafer bonding as previously described and then bonded at the surfaces of oxide layer 10104 and oxide layer 10108, at a low temperature (less than approximately 400° C.) preferred for lowest stresses, or a moderate temperature (less than approximately 900° C.).

Figure 101C:
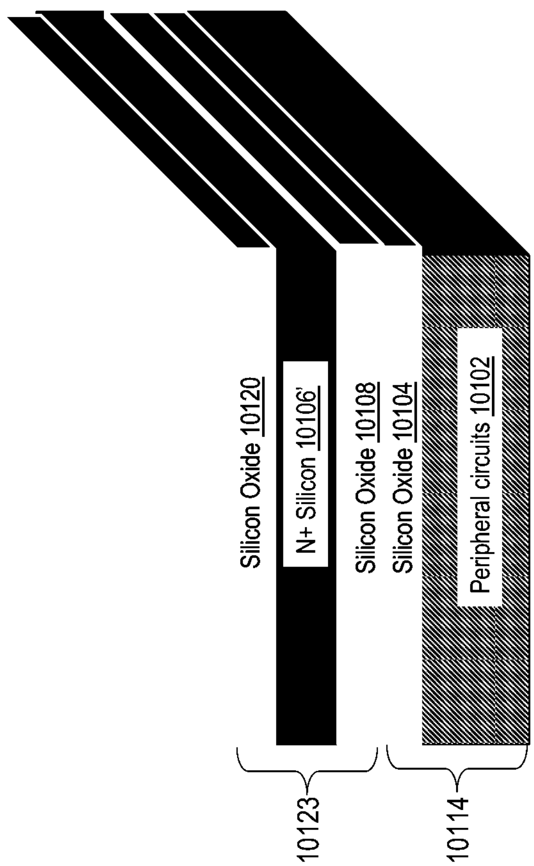

As illustrated in FIG. 101C, the portion of the N+ layer (not shown) and the N+ wafer substrate 10106 that are above the layer transfer demarcation plane 10110 may be removed by cleaving and polishing, or other processes as previously described, such as, for example, ion-cut or other methods, thus forming the remaining mono-crystalline silicon N+ layer 10106'. Remaining N+ layer 10106' and oxide layer 10108 have been layer transferred to acceptor wafer 10114. The top surface of N+ layer 10106' may be chemically or mechanically polished smooth and flat. Now transistors or portions of transistors may be formed and aligned to the acceptor wafer 10114 alignment marks (not shown). Oxide layer 10120 may be deposited to prepare the surface for later oxide to oxide bonding, leading to the formation of the first Si/SiO2 layer 10123 that includes silicon oxide layer 10120, N+ silicon layer 10106', and oxide layer 10108.

Figure 101D:
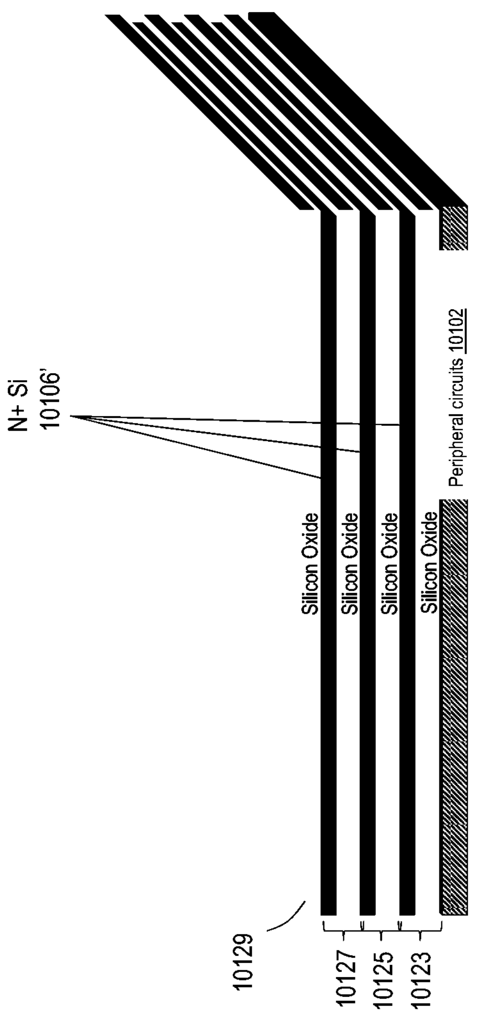

As illustrated in FIG. 101D, additional Si/SiO2 layers, such as, for example, second Si/SiO2 layer 10125 and third Si/SiO2 layer 10127, may each be formed as described in FIGS. 101A to 101C. Oxide layer 10129 may be deposited to electrically isolate the top N+ silicon layer.

Figure 101E:
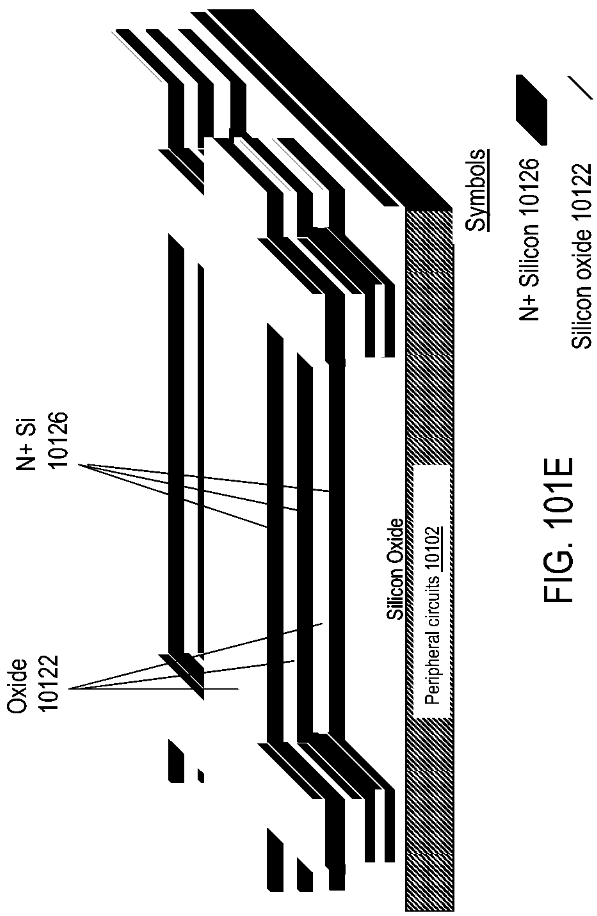

As illustrated in FIG. 101E, oxide 10129, third Si/SiO2 layer 10127, second Si/SiO2 layer 10125 and first Si/SiO2 layer 10123 may be lithographically defined and plasma/RIE etched to form a portion of the memory cell structure, which now includes regions of N+ silicon 10126 and oxide 10122.

Figure 101F:
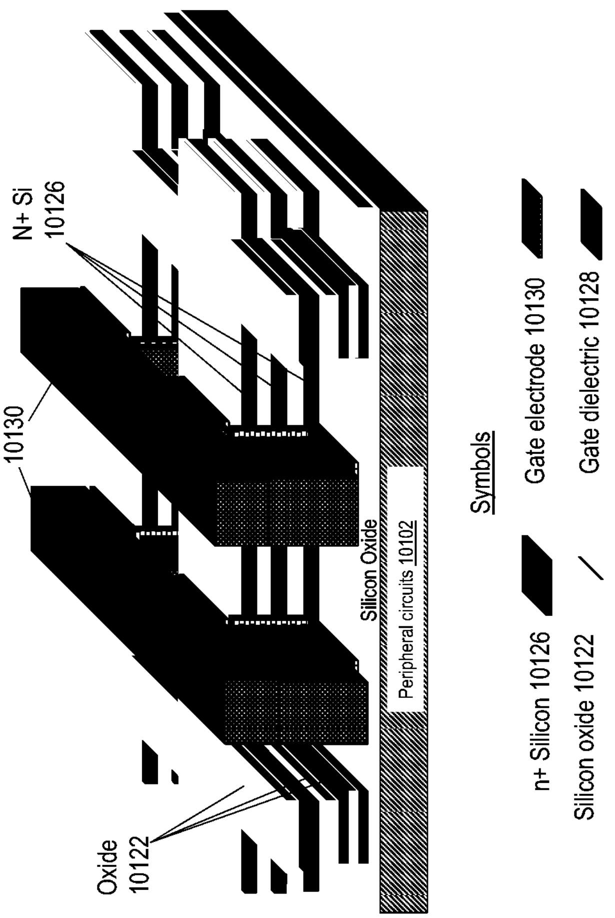

As illustrated in FIG. 101F, a gate dielectric and gate electrode material may be deposited, planarized with a chemical mechanical polish (CMP), and then lithographically defined and plasma/RIE etched to form gate dielectric regions 10128 which may either be self aligned to and covered by gate electrodes 10130 (shown), or cover the entire N+ silicon 10126 and oxide 10122 multi-layer structure. The gate stack including gate electrode 10130 and gate dielectric 10128 may be formed with a gate dielectric, such as, for example, thermal oxide, and a gate electrode material, such as, for example, poly-crystalline silicon. Alternatively, the gate dielectric may be an atomic layer deposited (ALD) material that is paired with a work function specific gate metal according to an industry standard of high k metal gate process schemes described previously. Moreover, the gate dielectric may be formed with a rapid thermal oxidation (RTO), a low temperature oxide deposition or low temperature microwave plasma oxidation of the silicon surfaces and then a gate electrode such as, for example, tungsten or aluminum may be deposited.

Figure 101G:
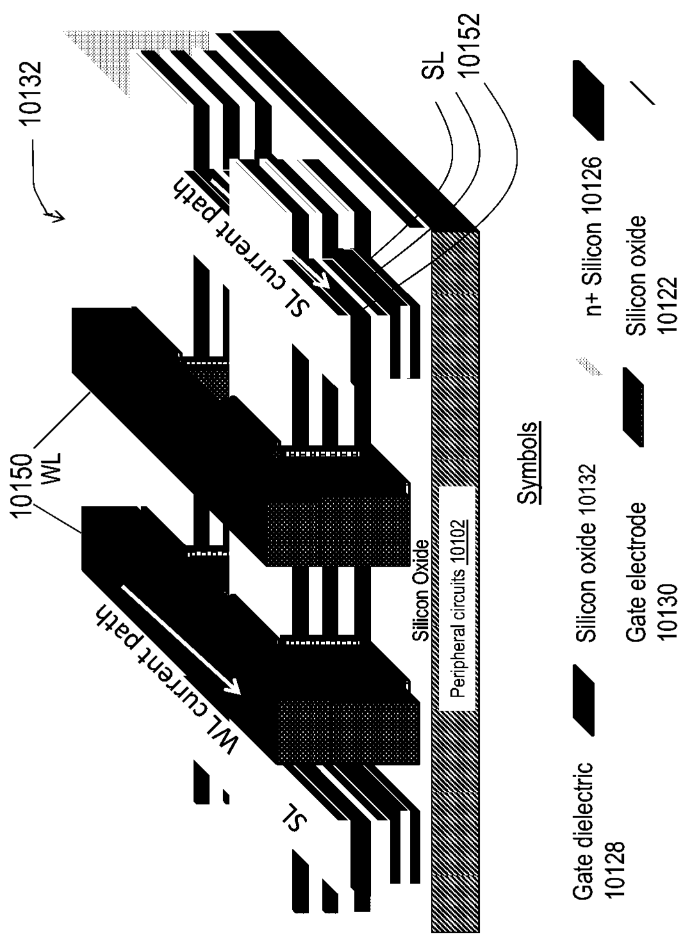

As illustrated in FIG. 101G, the entire structure may be covered with a gap fill oxide 10132, which may be planarized with chemical mechanical polishing. The oxide 10132 is shown transparent in the figure for clarity, along with word-line regions (WL) 10150, coupled with and composed of gate electrodes 10130, and source-line regions (SL) 10152, composed of N+ silicon regions 10126.

Figure 101H:
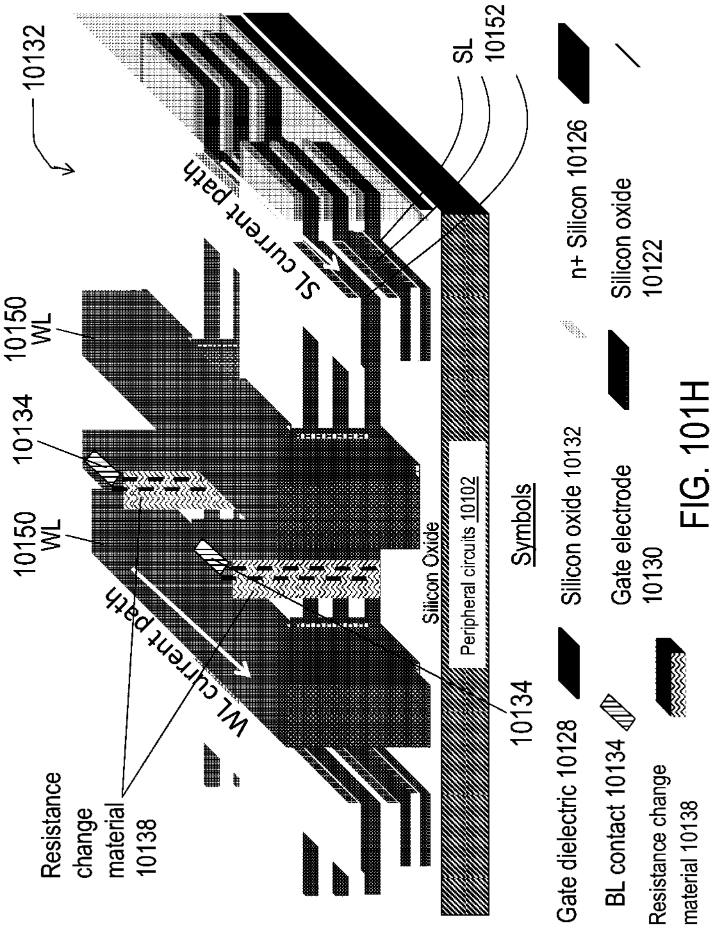

As illustrated in FIG. 101H, bit-line (BL) contacts 10134 may be lithographically defined, etched along with plasma/RIE through oxide 10132, the three N+ silicon regions 10126, and associated oxide vertical isolation regions to connect all memory layers vertically. BL contacts 10134 may then be processed by a photoresist removal. Resistance change memory material 10138, such as, for example, hafnium oxide, may then be deposited, preferably with atomic layer deposition (ALD). The electrode for the resistance change memory element may then be deposited by ALD to form the electrode/BL contact 10134. The excess deposited material may be polished to planarity at or below the top of oxide 10132. Each BL contact 10134 with resistive change material 10138 may be shared among substantially all layers of memory, shown as three layers of memory in FIG. 101H.

Figure 101I:
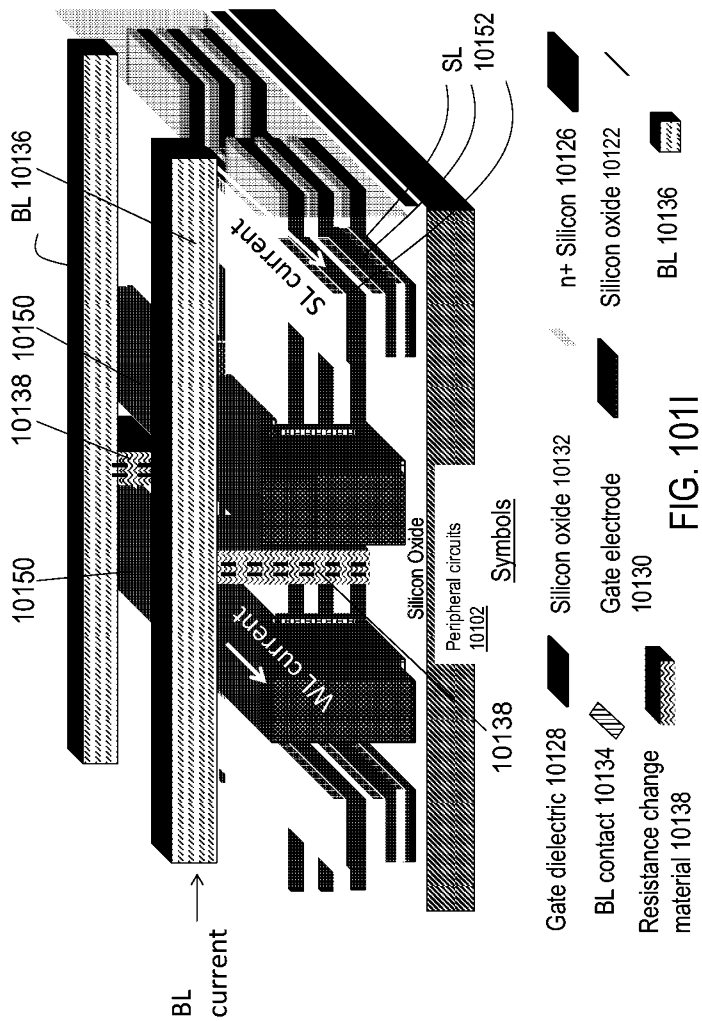

As illustrated in FIG. 101I, BL metal lines 10136 may be formed and connect to the associated BL contacts 10134 with resistive change material 10138. Contacts and associated metal interconnect lines (not shown) may be formed for the WL and SL at the memory array edges. A thru layer via 10160 (not shown) may be formed to electrically couple the BL, SL, and WL metallization to the acceptor substrate 10114 peripheral circuitry via an acceptor wafer metal connect pad 10180 (not shown).

Figure 101J:
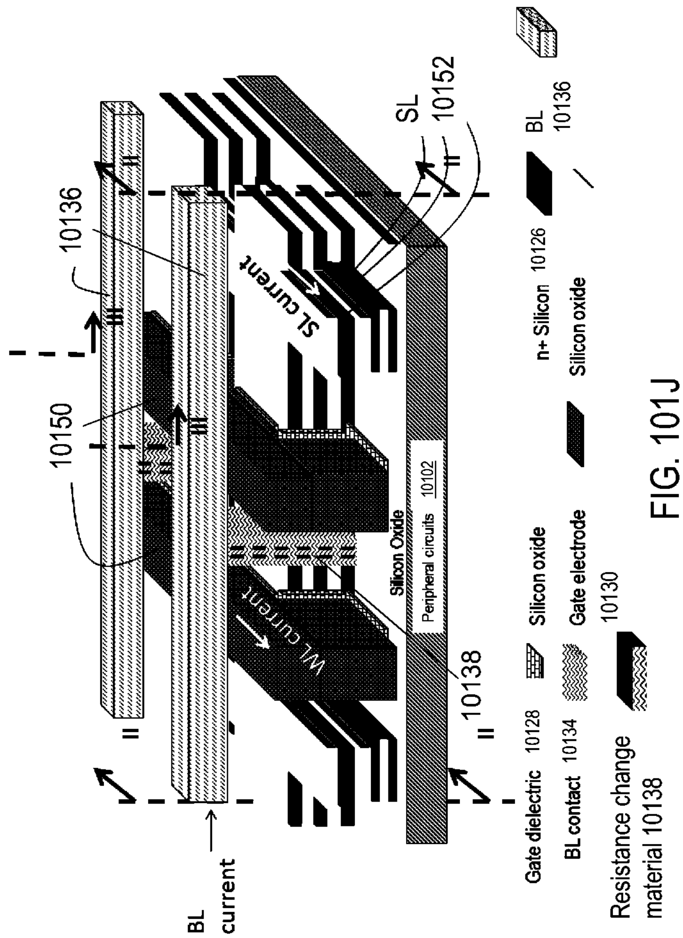

FIG. 101J1 shows a cross sectional cut II of FIG. 101J, while FIG. 101J2 shows a cross-sectional cut III of FIG. 101J. FIG. 101J1 shows BL metal line 10136, oxide 10132, BL contact/electrode 10134, resistive change material 10138, WL regions 10150, gate dielectric 10128, N+ silicon regions 10126, and peripheral circuits substrate 10102. The BL contact/electrode 10134 couples to one side of the three levels of resistive change material 10138. The other side of the resistive change material 10138 is coupled to N+ regions 10126. FIG. 101J2 shows BL metal lines 10136, oxide 10132, gate electrode 10130, gate dielectric 10128, N+ silicon regions 10126, interlayer oxide region ('ox'), and peripheral circuits substrate 10102. The gate electrode 10130 is common to substantially all six N+ silicon regions 10126 and forms six two-sided gated junction-less transistors as memory select transistors.

Figure 101K:
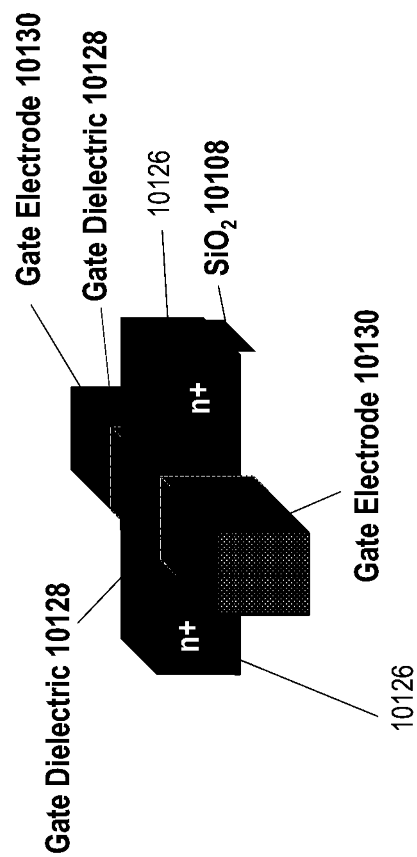

As illustrated in FIG. 101K, a single exemplary two-sided gate junction-less transistor on the first Si/SiO2 layer 10123 may include N+ silicon region 10126 (functioning as the source, drain, and transistor channel), and two gate electrodes 10130 with associated gate dielectrics 10128. The transistor is electrically isolated from beneath by oxide layer 10108.

This flow may enable the formation of a resistance-based multi-layer or 3D memory array with zero additional masking steps per memory layer, which utilizes junction-less transistors and has a resistance-based memory element in series with a select transistor, and is constructed by layer transfers of wafer sized doped mono-crystalline silicon layers, and this 3D memory array may be connected to an underlying multi-metal layer semiconductor device.

Persons of ordinary skill in the art will appreciate that the illustrations in FIGS. 101A through 101K are exemplary only and are not drawn to scale. Such skilled persons will further appreciate that many variations are possible such as, for example, the transistors may be of another type such as RCATs. Additionally, doping of each N+ layer may be slightly different to compensate for interconnect resistances. Moreover, the stacked memory layer may be connected to a periphery circuit that is above the memory stack. Further, each gate of the double gate 3D resistance based memory can be independently controlled for better control of the memory cell. Many other modifications within the scope of the invention will suggest themselves to such skilled persons after reading this specification. Thus the invention is to be limited only by the appended claims.

As illustrated in FIGS. 102A to 102L, a resistance-based 3D memory may be constructed with zero additional masking steps per memory layer, which is suitable for 3D IC manufacturing. This 3D memory utilizes double gated MOSFET transistors and has a resistance-based memory element in series with a select transistor.

Figure 102A:
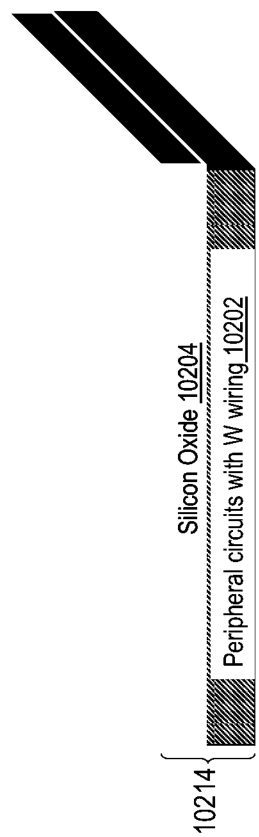

As illustrated in FIG. 102A, a silicon substrate with peripheral circuitry 10202 may be constructed with high temperature (greater than approximately 400° C.) resistant wiring, such as, for example, Tungsten. The peripheral circuitry substrate 10202 may include memory control circuits as well as circuitry for other purposes and of various types, such as, for example, analog, digital, RF, or memory. The peripheral circuitry substrate 10202 may include peripheral circuits that can withstand an additional rapid-thermal-anneal (RTA) and still remain operational and retain good performance. For this purpose, the peripheral circuits may be formed such that they have been subject to a weak RTA or no RTA for activating dopants. The top surface of the peripheral circuitry substrate 10202 may be prepared for oxide wafer bonding with a deposition of a silicon oxide 10204, thus forming acceptor wafer 10214.

Figure 102B:
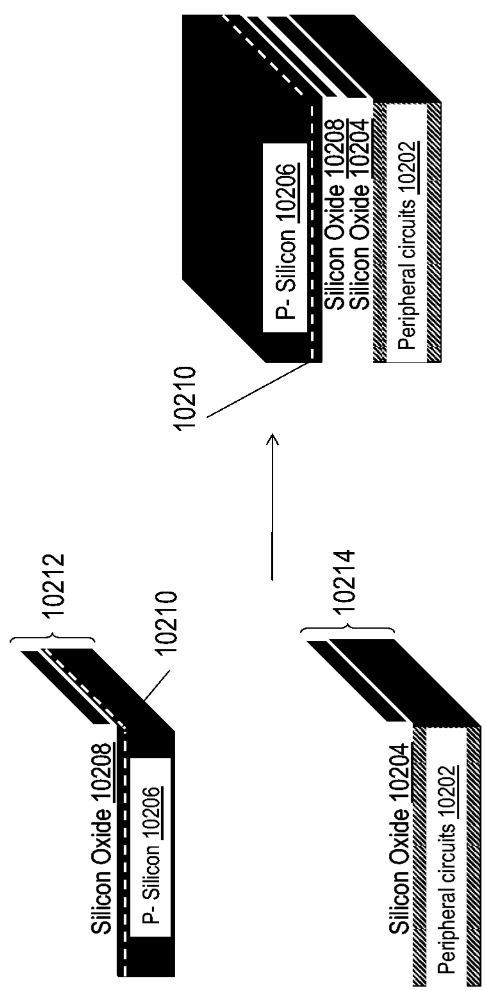

As illustrated in FIG. 102B, a mono-crystalline silicon donor wafer 10212 may be optionally processed to comprise a wafer sized layer of P− doping (not shown) which may have a different dopant concentration than the P− substrate 10206. The P− doping layer may be formed by ion implantation and thermal anneal. A screen oxide 10208 may be grown or deposited prior to the implant to protect the silicon from implant contamination and to provide an oxide surface for later wafer to wafer bonding. A layer transfer demarcation plane 10210 (shown as a dashed line) may be formed in donor wafer 10212 within the P− substrate 10206 or the P− doping layer (not shown) by hydrogen implantation or other methods as previously described. Both the donor wafer 10212 and acceptor wafer 10214 may be prepared for wafer bonding as previously described and then bonded at the surfaces of oxide layer 10204 and oxide layer 10208, at a low temperature (less than approximately 400° C. preferred for lowest stresses), or at a moderate temperature (less than approximately 900° C.).

Figure 102C:
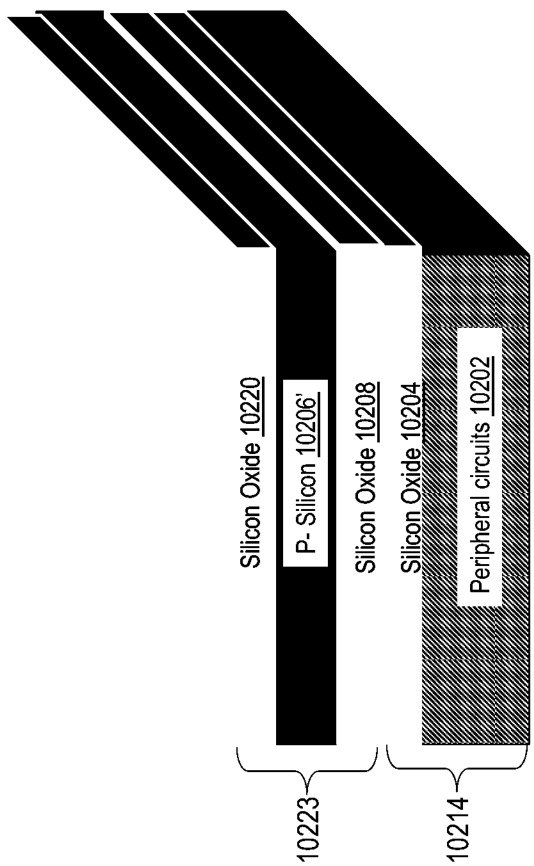

As illustrated in FIG. 102C, the portion of the P− layer (not shown) and the P− wafer substrate 10206 that are above the layer transfer demarcation plane 10210 may be removed by cleaving and polishing, or other processes as previously described, such as, for example, ion-cut or other methods, thus forming the remaining mono-crystalline silicon P− layer 10206'. Remaining P− layer 10206' and oxide layer 10208 have been layer transferred to acceptor wafer 10214. The top surface of P− layer 10206' may be chemically or mechanically polished smooth and flat. Now transistors or portions of transistors may be formed and aligned to the acceptor wafer 10214 alignment marks (not shown). Oxide layer 10220 may be deposited to prepare the surface for later oxide to oxide bonding. This now forms the first Si/SiO2 layer 10223 including silicon oxide layer 10220, P− silicon layer 10206', and oxide layer 10208.

Figure 102D:
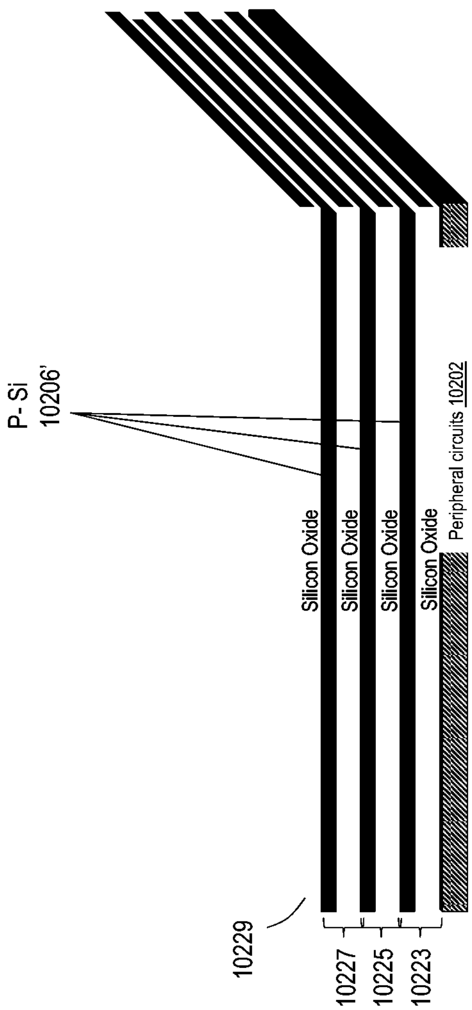

As illustrated in FIG. 102D, additional Si/SiO2 layers, such as second Si/SiO2 layer 10225 and third Si/SiO2 layer 10227, may each be formed as described in FIGS. 102A to 102C. Oxide layer 10229 may be deposited to electrically isolate the top silicon layer.

Figure 102E:
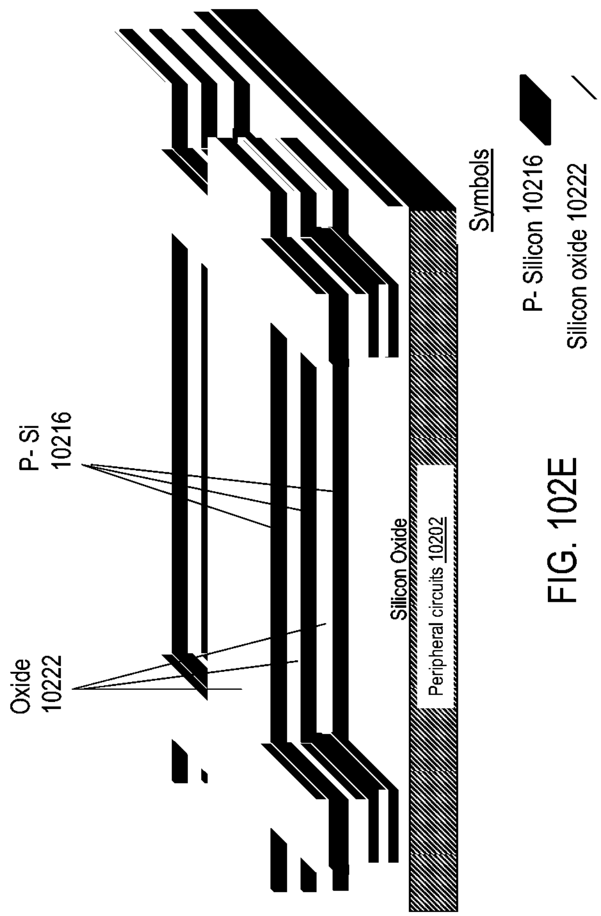

As illustrated in FIG. 102E, oxide 10229, third Si/SiO2 layer 10227, second Si/SiO2 layer 10225 and first Si/SiO2 layer 10223 may be lithographically defined and plasma/RIE etched to form a portion of the memory cell structure, which now includes regions of P− silicon 10216 and oxide 10222.

Figure 102F:
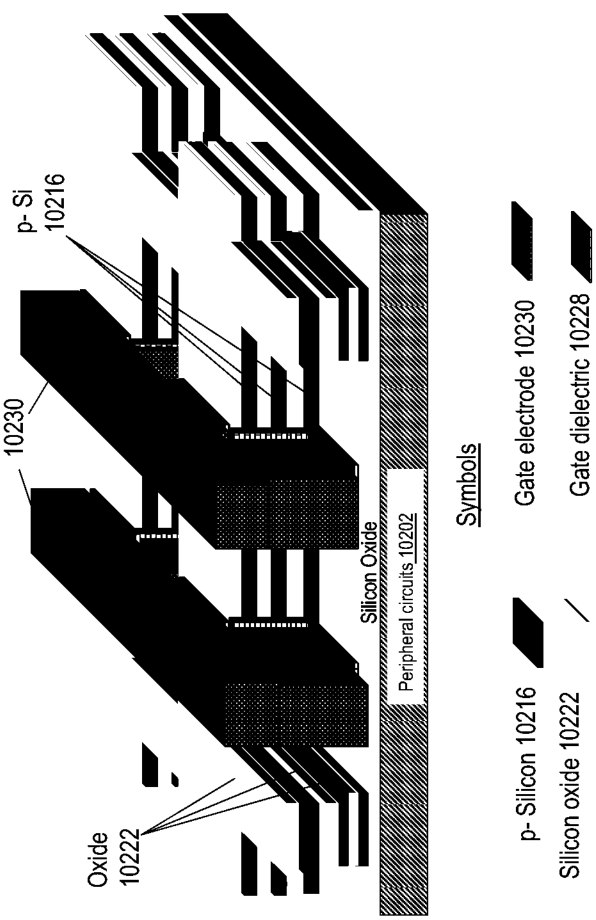

As illustrated in FIG. 102F, a gate dielectric and gate electrode material may be deposited, planarized with a chemical mechanical polish (CMP), and then lithographically defined and plasma/RIE etched to form gate dielectric regions 10228 which may either be self aligned to and covered by gate electrodes 10230 (shown), or may cover the entire silicon/oxide multi-layer structure. The gate stack including gate electrode 10230 and gate dielectric 10228 may be formed with a gate dielectric, such as, for example, thermal oxide, and a gate electrode material, such as, for example, polycrystalline silicon. Alternatively, the gate dielectric may be an atomic layer deposited (ALD) material that is paired with a work function specific gate metal according to an industry standard of high k metal gate process schemes described previously. Additionally, the gate dielectric may be formed with a rapid thermal oxidation (RTO), a low temperature oxide deposition or low temperature microwave plasma oxidation of the silicon surfaces and then a gate electrode such as tungsten or aluminum may be deposited.

Figure 102G:
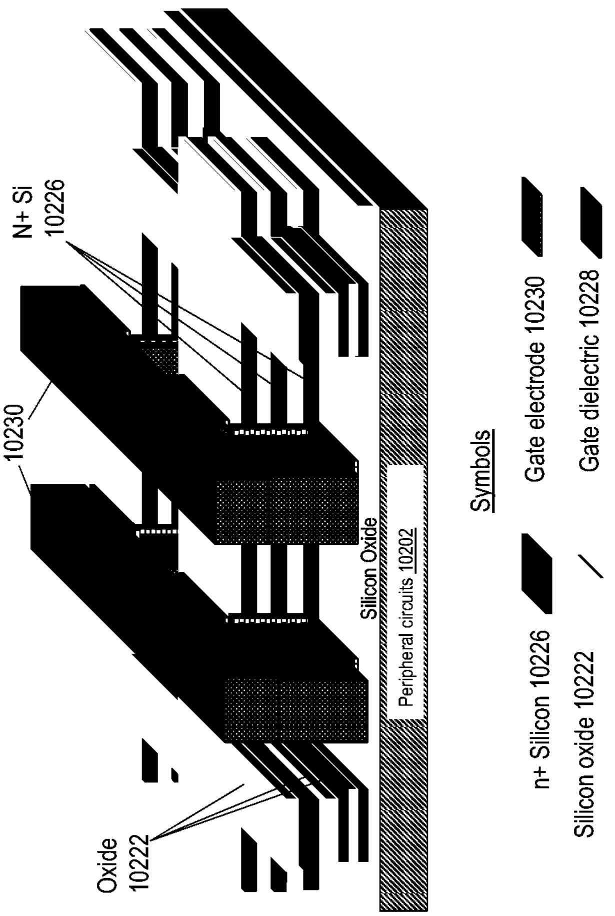

As illustrated in FIG. 102G, N+ silicon regions 10226 may be formed in a self aligned manner to the gate electrodes 10230 by ion implantation of an N type species, such as, for example, Arsenic, into the regions of P− silicon 10216 that are not blocked by the gate electrodes 10230. This implantation may also form the remaining regions of P− silicon 10217 (not shown) in the gate electrode 10230 blocked areas. Different implant energies or angles, or multiples of each, may be utilized to place the N type species into each layer of P− silicon regions 10216. Spacers (not shown) may be utilized during this multi-step implantation process and layers of silicon present in different layers of the stack may have different spacer widths to account for the differing lateral straggle of N type species implants. Bottom layers, such as, for example, 10223, could have larger spacer widths than top layers, such as, for example, 10227. Alternatively, angular ion implantation with substrate rotation may be utilized to compensate for the differing implant straggle. The top layer implantation may have a slanted angle, rather than perpendicular to the wafer surface, and hence land ions slightly underneath the gate electrode 10230 edges and closely match a more perpendicular lower layer implantation which may land ions slightly underneath the gate electrode 10230 edge due to the straggle effects of the greater implant energy needed to reach the lower layer. A rapid thermal anneal (RTA) may be conducted to activate the dopants in substantially all of the memory layers 10223, 10225, 10227 and in the peripheral circuits 10202. Alternatively, optical anneals, such as, for example, a laser based anneal, may be performed.

Figure 102H:
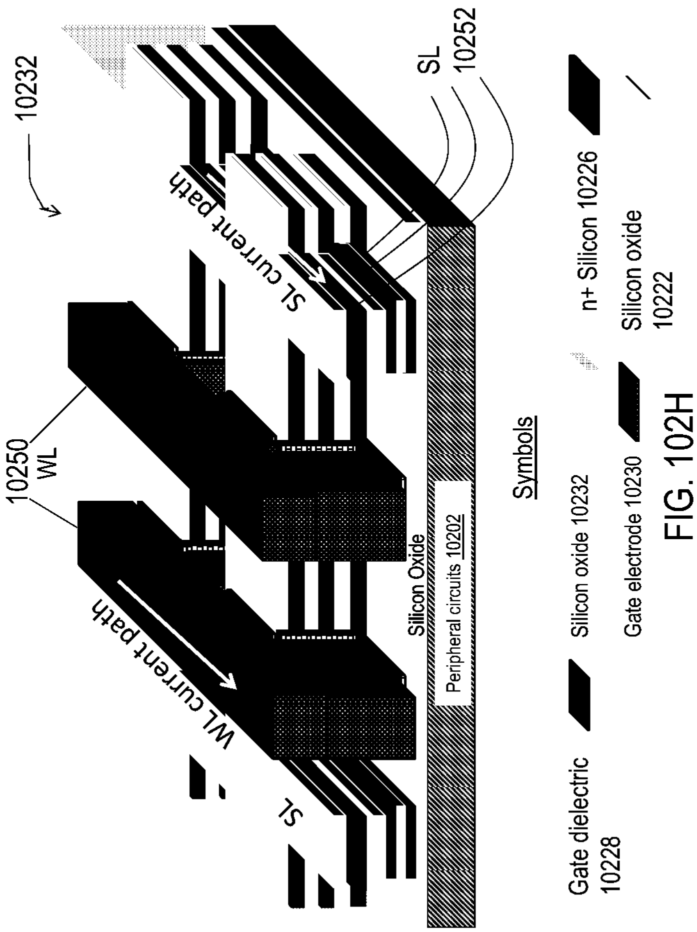

As illustrated in FIG. 102H, the entire structure may be covered with a gap fill oxide 10232, which may be planarized with chemical mechanical polishing. The oxide 10232 is shown transparent in the figure for clarity, along with word-line regions (WL) 10250, coupled with and composed of gate electrodes 10230, and source-line regions (SL) 10252, composed of indicated N+ silicon regions 10226.

Figure 102I:
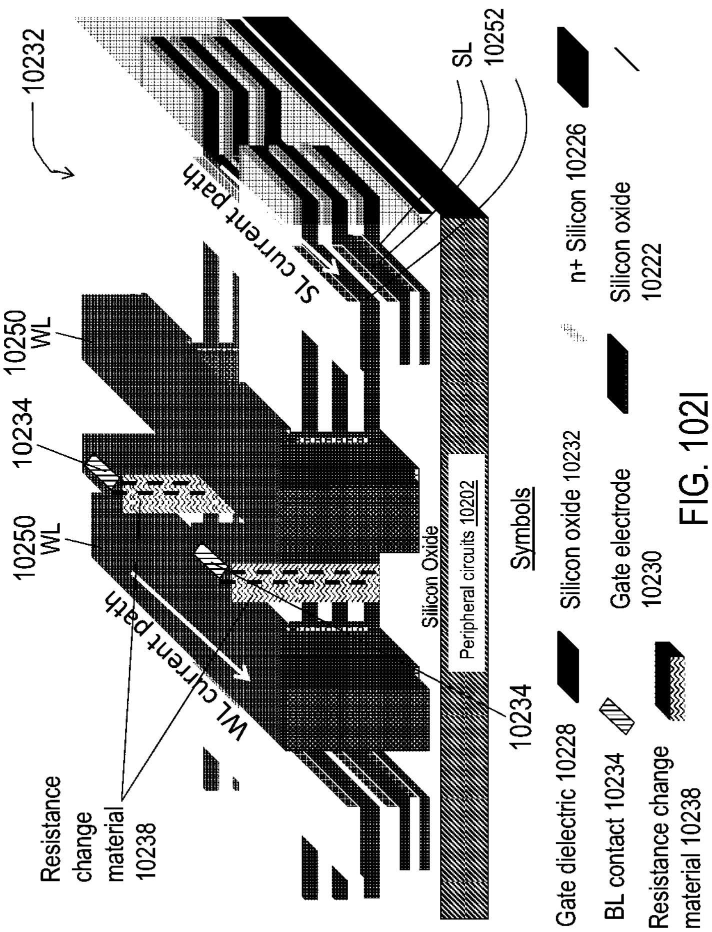

As illustrated in FIG. 102I, bit-line (BL) contacts 10234 may be lithographically defined, etched along with plasma/RIE through oxide 10232, the three N+ silicon regions 10226, and associated oxide vertical isolation regions to connect substantially all memory layers vertically, and followed by photoresist removal. Resistance change memory material 10238, such as hafnium oxide, may then be deposited, preferably with atomic layer deposition (ALD). The electrode for the resistance change memory element may then be deposited by ALD to form the electrode/BL contact 10234. The excess deposited material may be polished to planarity at or below the top of oxide 10232. Each BL contact 10234 with resistive change material 10238 may be shared among substantially all layers of memory, shown as three layers of memory in FIG. 102I.

Figure 102J:
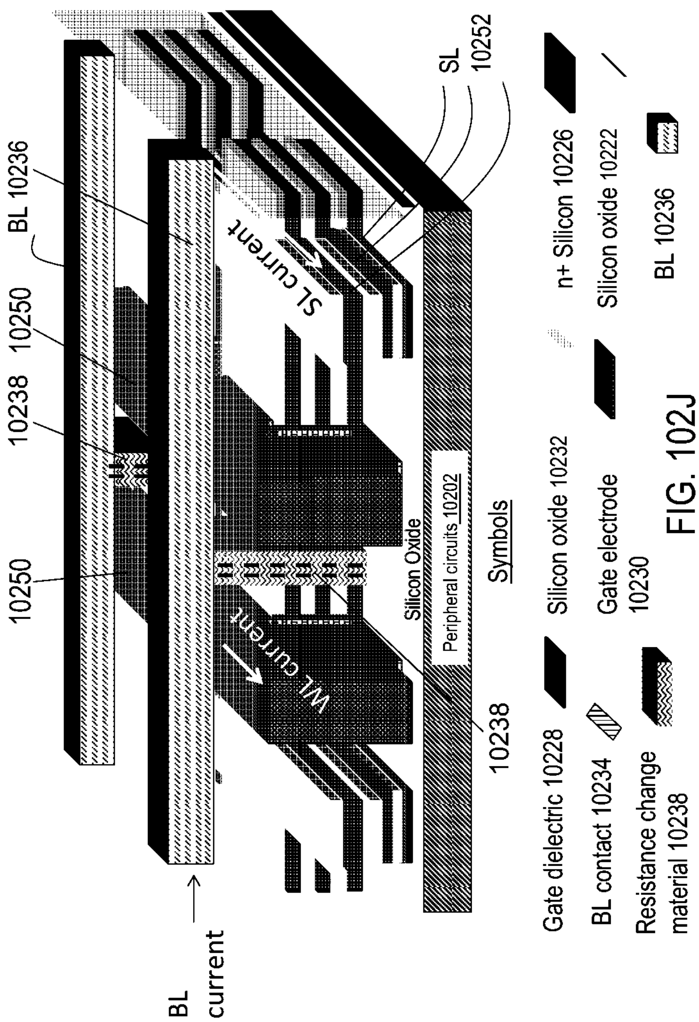

As illustrated in FIG. 102J, BL metal lines 10236 may be formed and connect to the associated BL contacts 10234 with resistive change material 10238. Contacts and associated metal interconnect lines (not shown) may be formed for the WL and SL at the memory array edges. A thru layer via 10260 (not shown) may be formed to electrically couple the BL, SL, and WL metallization to the acceptor substrate 10214 peripheral circuitry via an acceptor wafer metal connect pad 10280 (not shown).

Figure 102K:
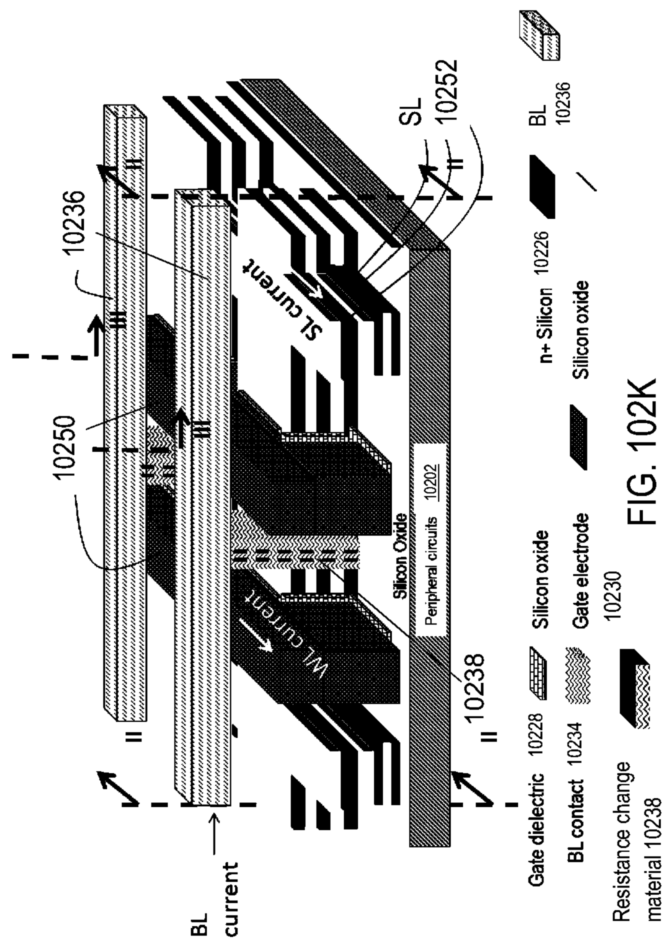

FIG. 102K1 is a cross-sectional cut II of FIG. 102K, while FIG. 102K2 is a cross-sectional cut III of FIG. 102K. FIG. 102K1 shows BL metal line 10236, oxide 10232, BL contact/electrode 10234, resistive change material 10238, WL regions 10250, gate dielectric 10228, P− silicon regions 10217, N+ silicon regions 10226, and peripheral circuits substrate 10202. The BL contact/electrode 10234 couples to one side of the three levels of resistive change material 10238. The other side of the resistive change material 10238 is coupled to N+ silicon regions 10226. FIG. 102K2 shows the P− regions 10217 with associated N+ regions 10226 on each side form the source, channel, and drain of the select transistor. BL metal lines 10236, oxide 10232, gate electrode 10230, gate dielectric 10228, P− silicon regions 10217, interlayer oxide regions ('ox'), and peripheral circuits substrate 10202. The gate electrode 10230 is common to substantially all six P− silicon regions 10217 and controls the six double gated MOSFET select transistors.

Figure 102L:
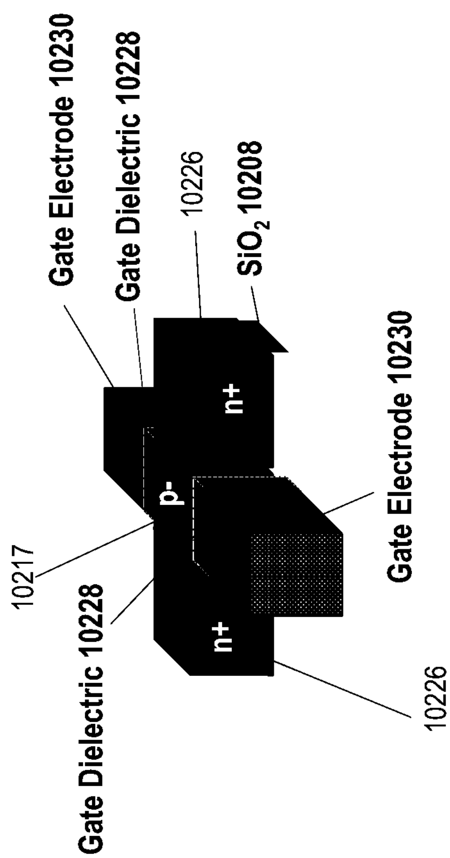

As illustrated in FIG. 102L, a single exemplary double gated MOSFET select transistor on the first Si/SiO2 layer 10223 may include P− silicon region 10217 (functioning as the transistor channel), N+ silicon regions 10226 (functioning as source and drain), and two gate electrodes 10230 with associated gate dielectrics 10228. The transistor is electrically isolated from beneath by oxide layer 10208.

The above flow may enable the formation of a resistance-based 3D memory with zero additional masking steps per memory layer constructed by layer transfers of wafer sized doped mono-crystalline silicon layers and may be connected to an underlying multi-metal layer semiconductor device.

Persons of ordinary skill in the art will appreciate that the illustrations in FIGS. 102A through 102L are exemplary only and are not drawn to scale. Such skilled persons will further appreciate that many variations are possible, such as, for example, the transistors may be of another type such as RCATs. The MOSFET selectors may utilize lightly doped drain and halo implants for channel engineering. Additionally, the contacts may utilize doped poly-crystalline silicon, or other conductive materials. Moreover, the stacked memory layer may be connected to a periphery circuit that is above the memory stack. Further, each gate of the double gate 3D DRAM can be independently controlled for better control of the memory cell. Many other modifications within the scope of the invention will suggest themselves to such skilled persons after reading this specification. Thus the invention is to be limited only by the appended claims.

As illustrated in FIGS. 103A to 103M, a resistance-based 3D memory with one additional masking step per memory layer may be constructed that is suitable for 3D IC manufacturing. This 3D memory utilizes double gated MOSFET select transistors and has a resistance-based memory element in series with the select transistor.

Figure 103A:
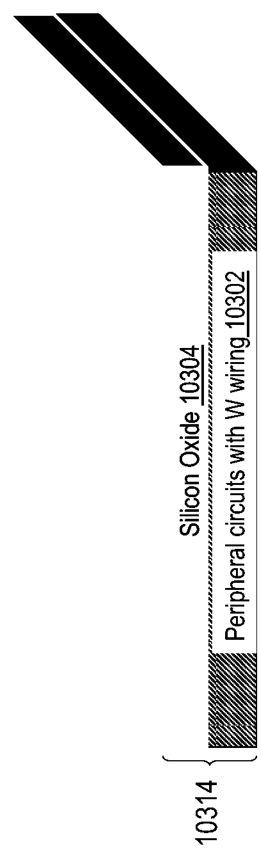

As illustrated in FIG. 103A, a silicon substrate with peripheral circuitry 10302 may be constructed with high temperature (greater than approximately 400° C.) resistant wiring, such as, for example, Tungsten. The peripheral circuitry substrate 10302 may include memory control circuits as well as circuitry for other purposes and of various types, such as, for example, analog, digital, RF, or memory. The peripheral circuitry substrate 10302 may include circuits that can withstand an additional rapid-thermal-anneal (RTA) and still remain operational and retain good performance. For this purpose, the peripheral circuits may be formed such that they have been subject to a weak RTA or no RTA for activating dopants. The top surface of the peripheral circuitry substrate 10302 may be prepared for oxide wafer bonding with a deposition of a silicon oxide 10304, thus forming acceptor wafer 10314.

Figure 103B:
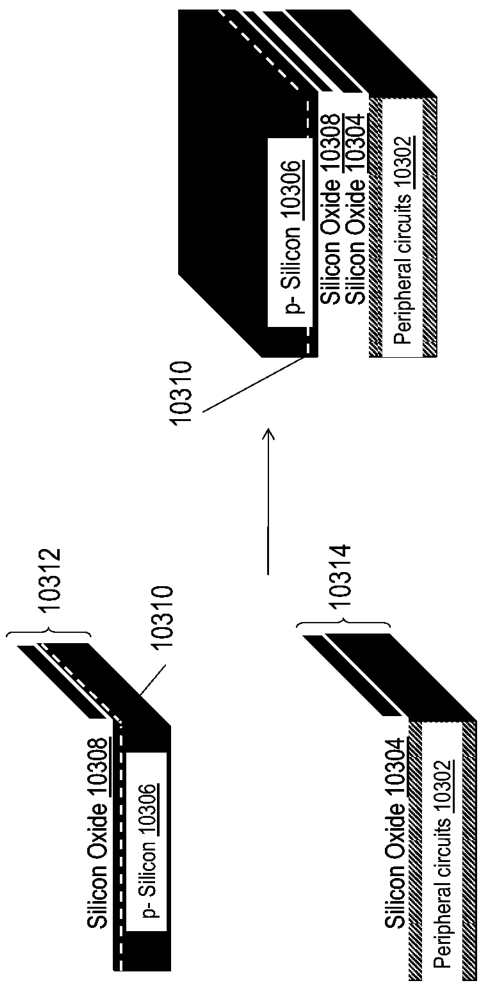

As illustrated in FIG. 103B, a mono-crystalline silicon donor wafer 10312 may be optionally processed to include a wafer sized layer of P− doping (not shown) which may have a different dopant concentration than the P− substrate 10306. The P− doping layer may be formed by ion implantation and thermal anneal. A screen oxide 10308 may be grown or deposited prior to the implant to protect the silicon from implant contamination and to provide an oxide surface for later wafer to wafer bonding. A layer transfer demarcation plane 10310 (shown as a dashed line) may be formed in donor wafer 10312 within the P− substrate 10306 or the P− doping layer (not shown) by hydrogen implantation or other methods as previously described. Both the donor wafer 10312 and acceptor wafer 10314 may be prepared for wafer bonding as previously described and then bonded at the surfaces of oxide layer 10304 and oxide layer 10308, at a low temperature (less than approximately 400° C. preferred for lowest stresses), or a moderate temperature (less than approximately 900° C.).

Figure 103C:
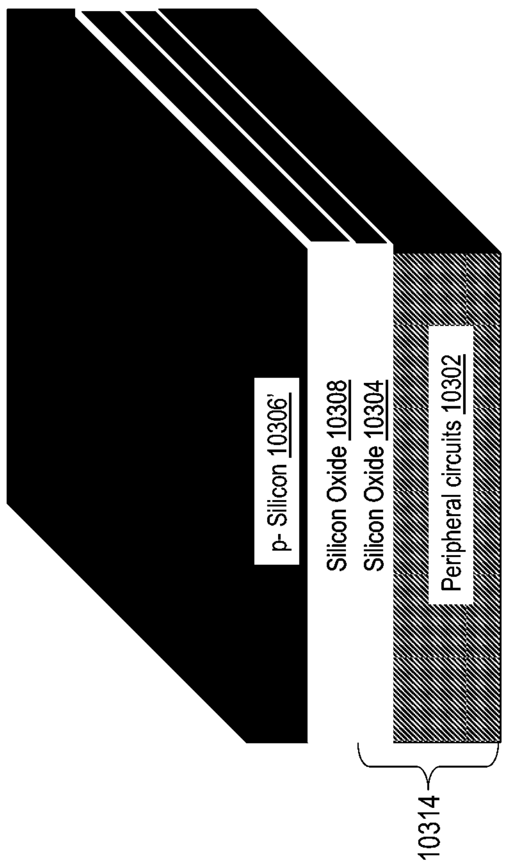

As illustrated in FIG. 103C, the portion of the P− layer (not shown) and the P− wafer substrate 10306 that are above the layer transfer demarcation plane 10310 may be removed by cleaving and polishing, or other processes as previously described, such as ion-cut or other methods, thus forming the remaining mono-crystalline silicon P− layer 10306'. Remaining P− layer 10306' and oxide layer 10308 have been layer transferred to acceptor wafer 10314. The top surface of P− layer 10306' may be chemically or mechanically polished smooth and flat. Now transistors or portions of transistors may be formed and aligned to the acceptor wafer 10314 alignment marks (not shown).

Figure 103D:
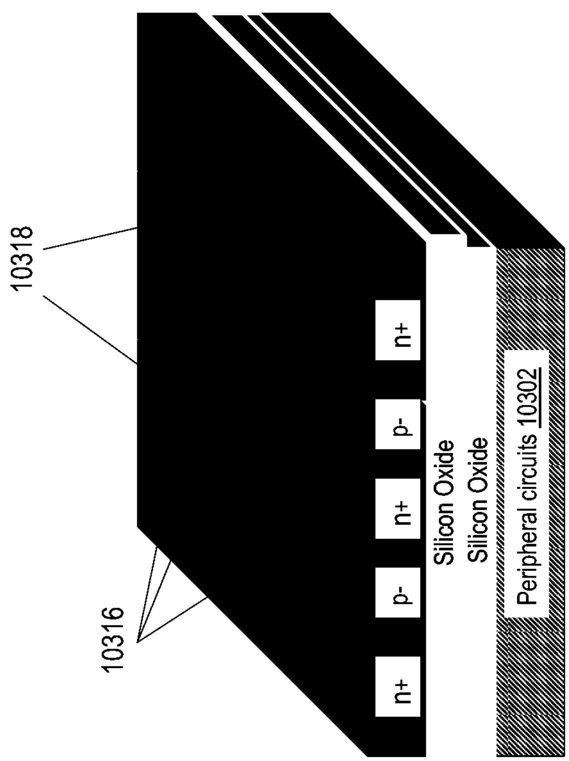

As illustrated in FIG. 103D, N+ silicon regions 10316 may be lithographically defined and N type species, such as, for example, Arsenic, may be ion implanted into P− silicon layer 10306'. This implantation also forms remaining regions of P− silicon 10318.

Figure 103E:
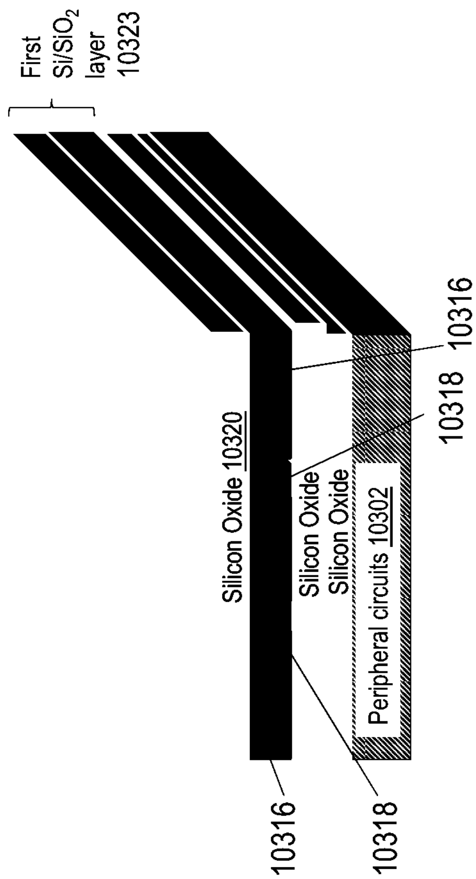

As illustrated in FIG. 103E, oxide layer 10320 may be deposited to prepare the surface for later oxide to oxide bonding, leading to the formation of the first Si/SiO2 layer 10323 including silicon oxide layer 10320, N+ silicon regions 10316, and P− silicon regions 10318.

Figure 103F:
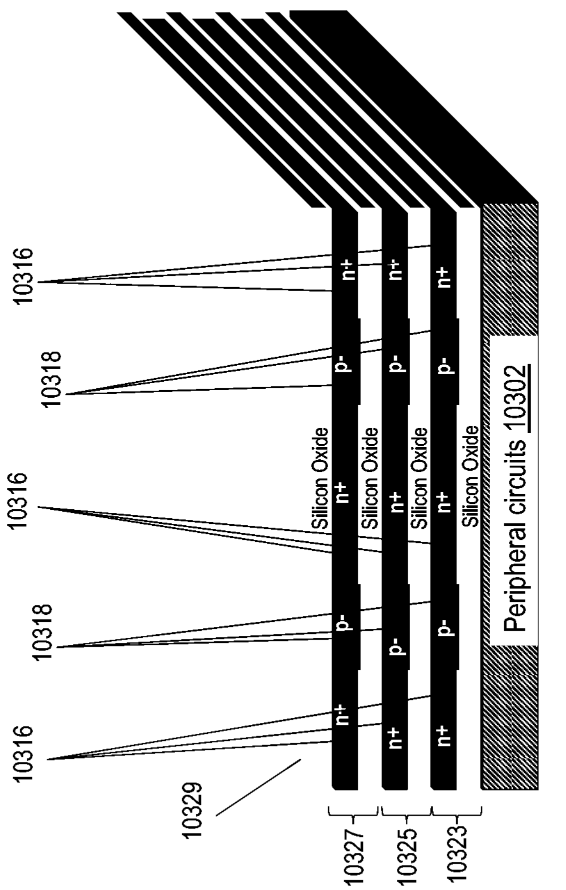

As illustrated in FIG. 103F, additional Si/SiO2 layers, such as, for example. second Si/SiO2 layer 10325 and third Si/SiO2 layer 10327, may each be formed as described in FIGS. 103A to 103E. Oxide layer 10329 may be deposited. After substantially all the desired numbers of memory layers are constructed, a rapid thermal anneal (RTA) may be conducted to activate the dopants in substantially all of the memory layers 10323, 10325, 10327 and in the peripheral circuits 10302. Alternatively, optical anneals, such as, for example, a laser based anneal, may be performed.

Figure 103G:
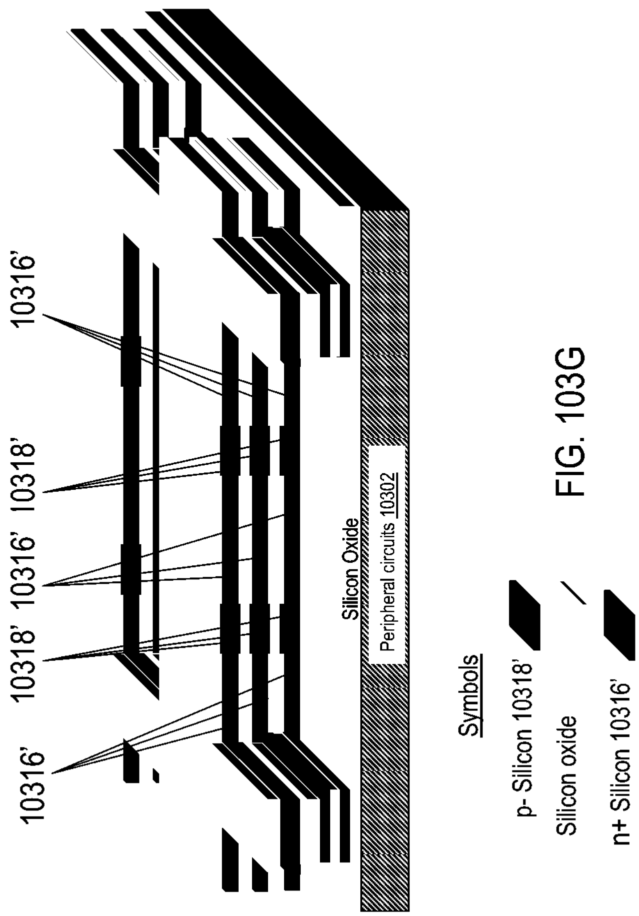

As illustrated in FIG. 103G, oxide layer 10329, third Si/SiO2 layer 10327, second Si/SiO2 layer 10325 and first Si/SiO2 layer 10323 may be lithographically defined and plasma/RIE etched to form a portion of the memory cell structure. The etching may result in regions of P− silicon 10318', which forms the transistor channels, and N+ silicon regions 10316', which form the source, drain and local source lines.

Figure 103H:
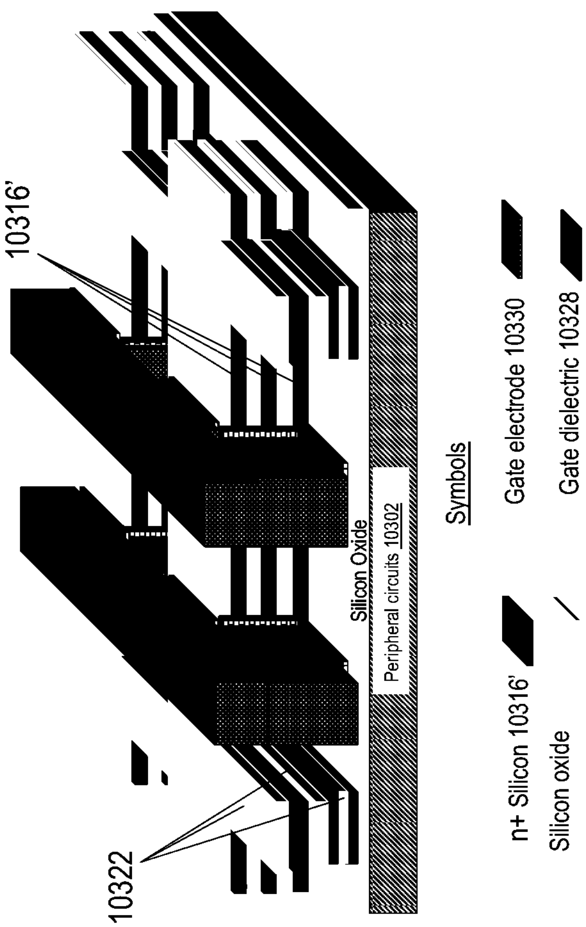

As illustrated in FIG. 103H, a gate dielectric and gate electrode material may be deposited, planarized with a chemical mechanical polish (CMP), and then lithographically defined and plasma/RIE etched to form gate dielectric regions 10328 which may be either self aligned to and covered by gate electrodes 10330 (shown), or cover substantially the entire silicon/oxide multi-layer structure. The gate electrode 10330 and gate dielectric 10328 stack may be sized and aligned such that P− silicon regions 10318' are substantially completely covered. The gate stack including gate electrode 10330 and gate dielectric 10328 may be formed with a gate dielectric, such as thermal oxide, and a gate electrode material, such as, for example, poly-crystalline silicon. Alternatively, the gate dielectric may be an atomic layer deposited (ALD) material that is paired with a work function specific gate metal according to an industry standard of high k metal gate process schemes described previously. Moreover, the gate dielectric may be formed with a rapid thermal oxidation (RTO), a low temperature oxide deposition or low temperature microwave plasma oxidation of the silicon surfaces and then a gate electrode such as tungsten or aluminum may be deposited.

Figure 103I:
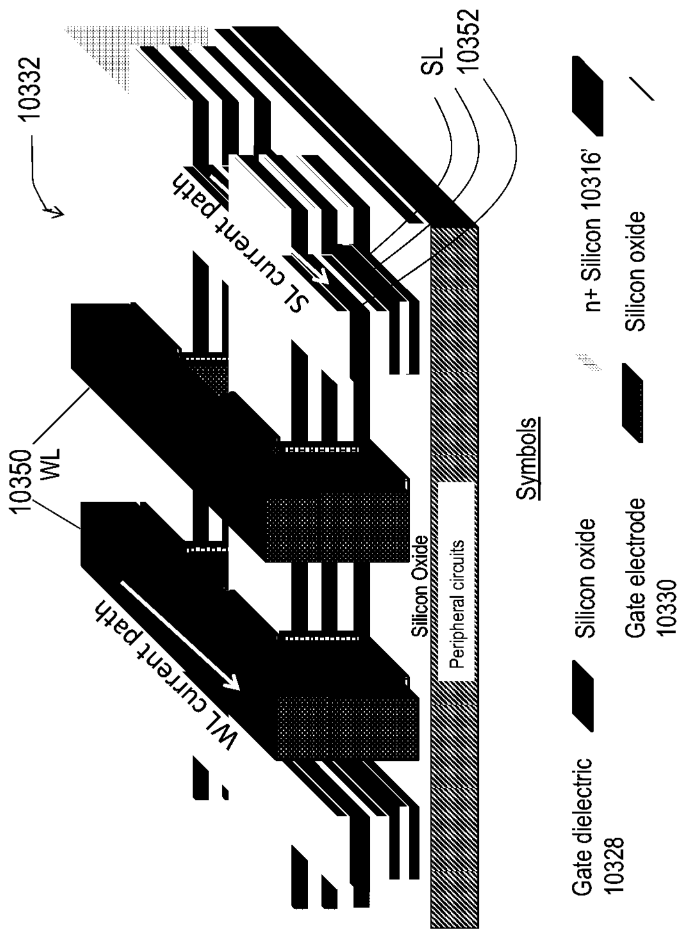

As illustrated in FIG. 103I, the entire structure may be covered with a gap fill oxide 10332, which may be planarized with chemical mechanical polishing. The oxide 10332 is shown transparent in the figure for clarity, along with word-line regions (WL) 10350, coupled with and composed of gate electrodes 10330, and source-line regions (SL) 10352, composed of indicated N+ silicon regions 10316'.

Figure 103J:
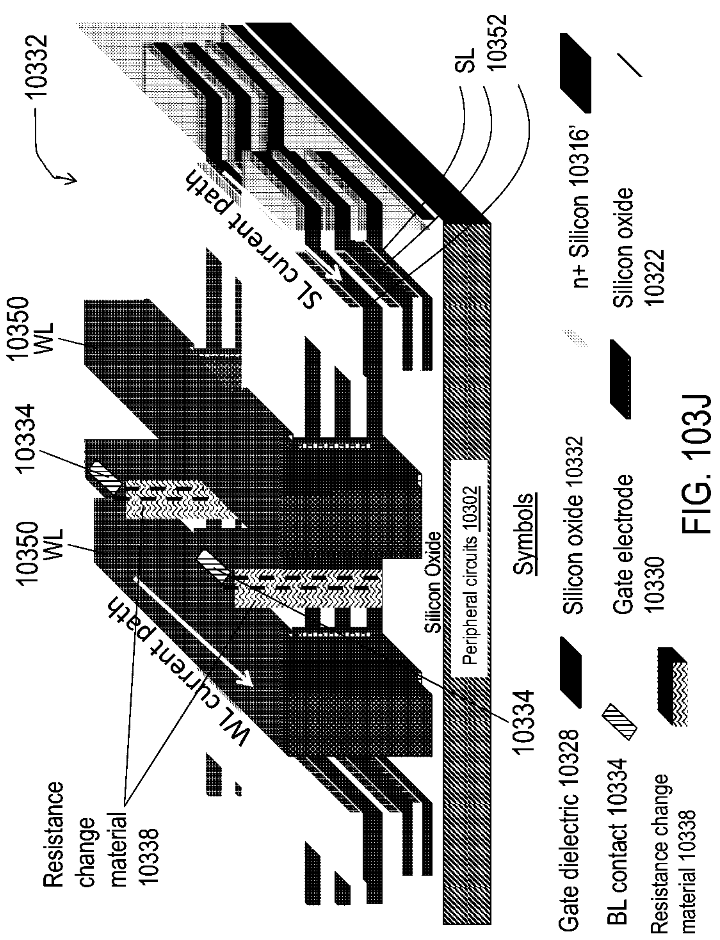

As illustrated in FIG. 103J, bit-line (BL) contacts 10334 may be lithographically defined, etched with plasma/RIE through oxide 10332, the three N+ silicon regions 10316', and the associated oxide vertical isolation regions to connect substantially all memory layers vertically. BL contacts 10334 may then be processed by a photoresist removal. Resistance change memory material 10338, such as, for example, hafnium oxide, may then be deposited, preferably with atomic layer deposition (ALD). The electrode for the resistance change memory element may then be deposited by ALD to form the BL contact/electrode 10334. The excess deposited material may be polished to planarity at or below the top of oxide 10332. Each BL contact/electrode 10334 with resistive change material 10338 may be shared among substantially all layers of memory, shown as three layers of memory in FIG. 103J.

Figure 103K:
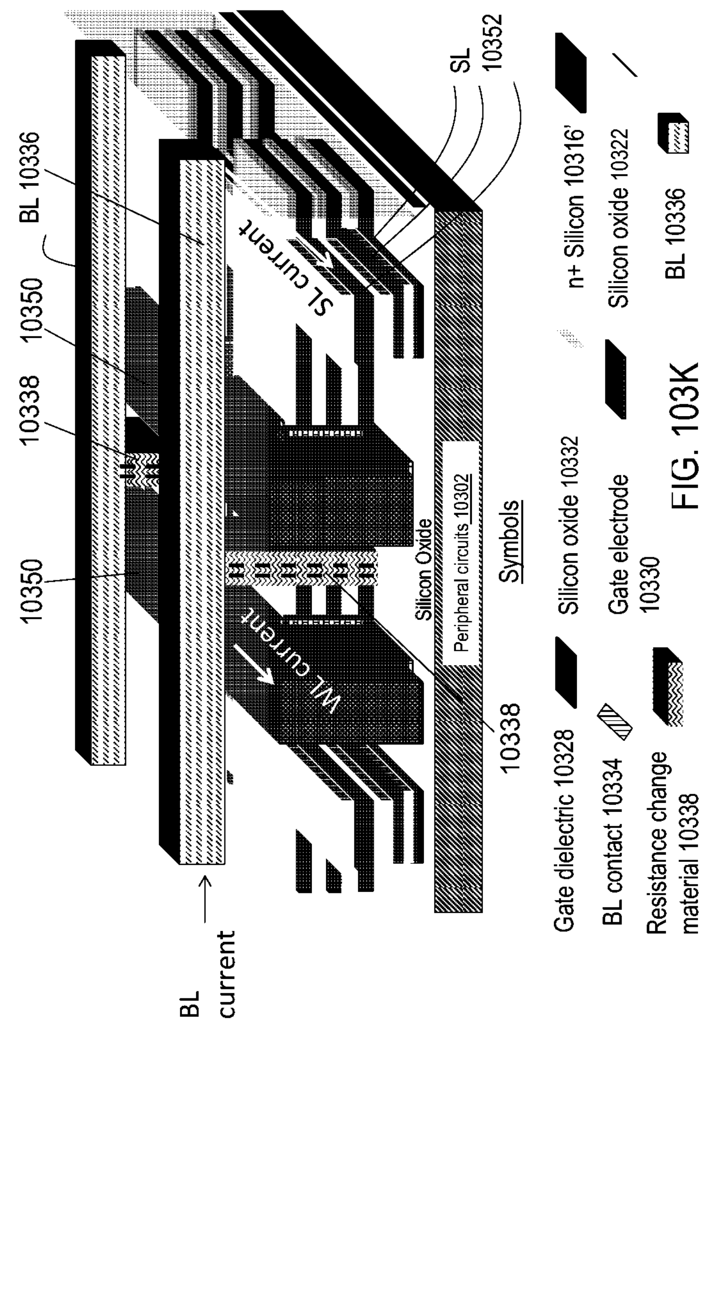

As illustrated in FIG. 103K, BL metal lines 10336 may be formed and connected to the associated BL contacts 10334 with resistive change material 10338. Contacts and associated metal interconnect lines (not shown) may be formed for the WL and SL at the memory array edges. A thru layer via 10360 (not shown) may be formed to electrically couple the BL, SL, and WL metallization to the acceptor substrate 10314 peripheral circuitry via an acceptor wafer metal connect pad 10380 (not shown).

Figure 103L:
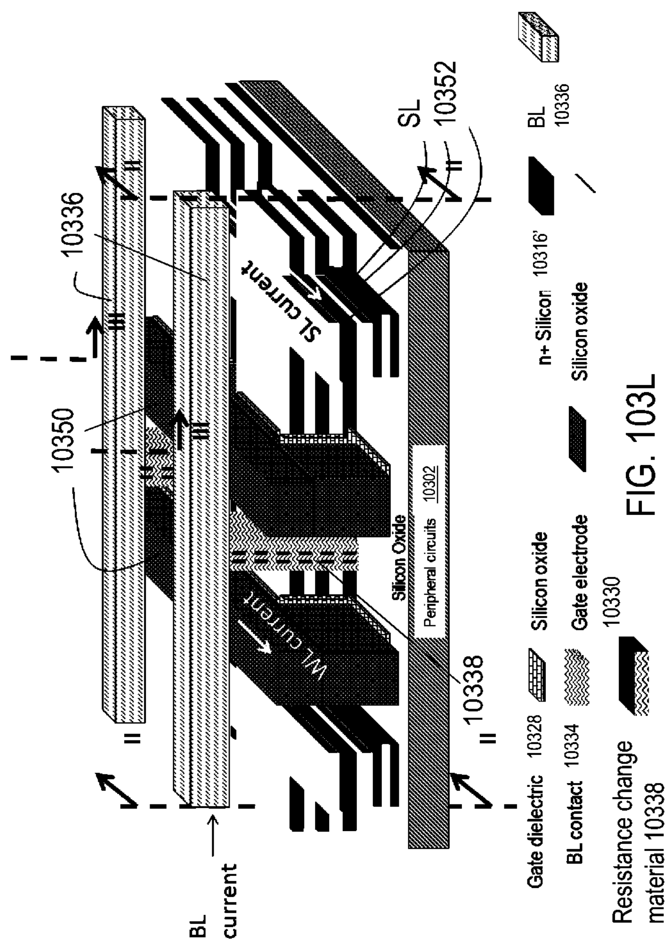
Figure 103M:
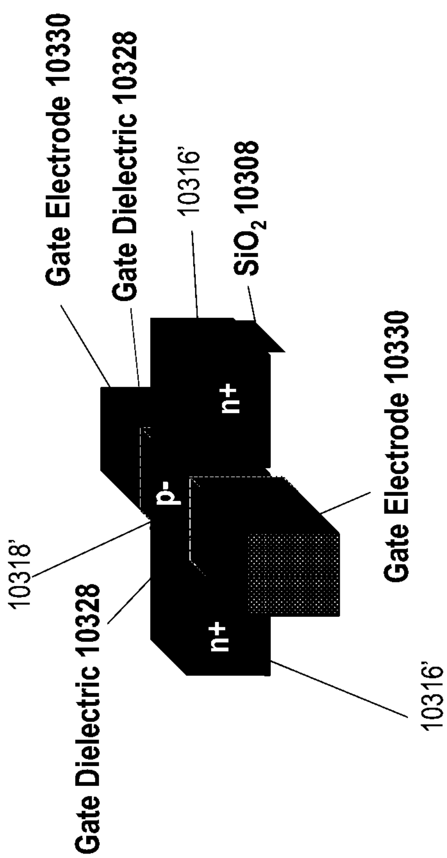

FIG. 103L1 is a cross section cut II view of FIG. 103L, while FIG. 103L2 is a cross-sectional cut III view of FIG. 103L. FIG. 103L2 shows BL metal line 10336, oxide 10332, BL contact/electrode 10334, resistive change material 10338, WL regions 10350, gate dielectric 10328, P− silicon regions 10318', N+ silicon regions 10316', and peripheral circuits substrate 10302. The BL contact/electrode 10334 couples to one side of the three levels of resistive change material 10338. The other side of the resistive change material 10338 is coupled to N+ silicon regions 10316'. The P− regions 10318' with associated N+ regions 10316' on each side form the source, channel, and drain of the select transistor. FIG. 103L2 shows BL metal lines 10336, oxide 10332, gate electrode 10330, gate dielectric 10328, P− silicon regions 10318', inter-layer oxide regions ('ox'), and peripheral circuits substrate 10302. The gate electrode 10330 is common to all six P− silicon regions 10318' and controls the six double gated MOSFET select transistors.

As illustrated in FIG. 103L, a single exemplary double gated MOSFET select transistor on the first Si/SiO2 layer 10323 may include P− silicon region 10318' (functioning as the transistor channel), N+ silicon regions 10316' (functioning as source and drain), and two gate electrodes 10330 with associated gate dielectrics 10328. The transistor is electrically isolated from beneath by oxide layer 10308.

The above flow may enable the formation of a resistance-based 3D memory with one additional masking step per memory layer constructed by layer transfers of wafer sized doped mono-crystalline silicon layers and may be connected to an underlying multi-metal layer semiconductor device.

Persons of ordinary skill in the art will appreciate that the illustrations in FIGS. 103A through 103M are exemplary only and are not drawn to scale. Such skilled persons will further appreciate that many variations are possible such as, for example, the transistors may be of another type, such as RCATs. Additionally, the contacts may utilize doped polycrystalline silicon, or other conductive materials. Moreover, the stacked memory layer may be connected to a periphery circuit that is above the memory stack. Further, Si/SiO2 layers 10322, 10324 and 10326 may be annealed layer-by-layer as soon as their associated implantations are complete by using a laser anneal system. Many other modifications within the scope of the invention will suggest themselves to such skilled persons after reading this specification. Thus the invention is to be limited only by the appended claims.

As illustrated in FIGS. 104A to 104F, a resistance-based 3D memory with two additional masking steps per memory layer may be constructed that is suitable for 3D IC manufacturing. This 3D memory utilizes single gate MOSFET select transistors and has a resistance-based memory element in series with the select transistor.

Figure 104A:
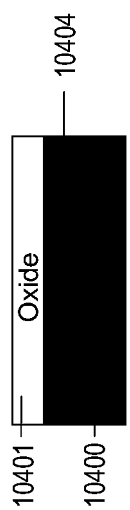

As illustrated in FIG. 104A, a P− substrate donor wafer 10400 may be processed to include a wafer sized layer of P− doping 10404. The P− layer 10404 may have the same or different dopant concentration than the P− substrate 10400. The P− doping layer 10404 may be formed by ion implantation and thermal anneal. A screen oxide 10401 may be grown before the implant to protect the silicon from implant contamination and to provide an oxide surface for later wafer to wafer bonding.

Figure 104B:
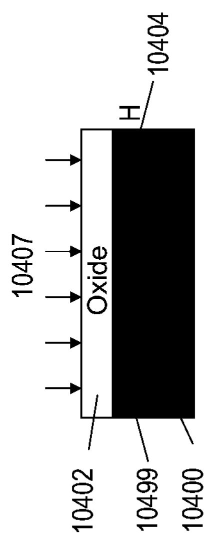

As illustrated in FIG. 104B, the top surface of donor wafer 10400 may be prepared for oxide wafer bonding with a deposition of an oxide 10402 or by thermal oxidation of the P− layer 10404 to form oxide layer 10402, or a re-oxidation of implant screen oxide 10401. A layer transfer demarcation plane 10499 (shown as a dashed line) may be formed in donor wafer 10400 or P− layer 10404 (shown) by hydrogen implantation 10407 or other methods as previously described. Both the donor wafer 10400 and acceptor wafer 10410 may be prepared for wafer bonding as previously described and then bonded, preferably at a low temperature (less than approximately 400° C.) to minimize stresses. The portion of the P− layer 10404 and the P− donor wafer substrate 10400 above the layer transfer demarcation plane 10499 may be removed by cleaving and polishing, or other processes as previously described, such as, for example, ion-cut or other methods.

Figure 104C:
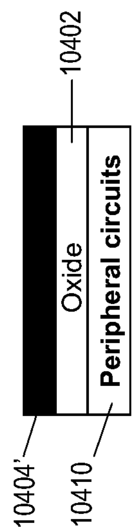

As illustrated in FIG. 104C, the remaining P− doped layer 10404', and oxide layer 10402 have been layer transferred to acceptor wafer 10410. Acceptor wafer 10410 may include peripheral circuits such that they can withstand an additional rapid-thermal-anneal (RTA) and still remain operational and retain good performance. For this purpose, the peripheral circuits may be formed such that they have been subject to a weak RTA or no RTA for activating dopants. Also, the peripheral circuits may utilize a refractory metal such as tungsten that can withstand high temperatures greater than approximately 400° C. The top surface of P− doped layer 10404' may be chemically or mechanically polished smooth and flat. Now transistors may be formed and aligned to the acceptor wafer 10410 alignment marks (not shown).

Figure 104D:
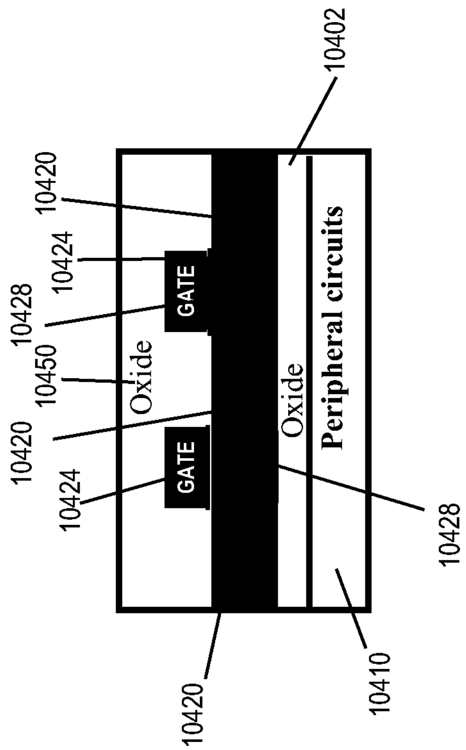

As illustrated in FIG. 104D, shallow trench isolation (STI) oxide regions (not shown) may be lithographically defined and plasma/RIE etched to at least the top level of oxide layer 10402, thus removing regions of P− mono-crystalline silicon layer 10404'. A gap-fill oxide may be deposited and CMP'ed flat to form conventional STI oxide regions and P− doped mono-crystalline silicon regions (not shown) for forming the transistors. Threshold adjust implants may or may not be performed at this time. A gate stack 10424 may be formed with a gate dielectric, such as, for example, thermal oxide, and a gate metal material, such as, for example, polycrystalline silicon. Alternatively, the gate oxide may be an atomic layer deposited (ALD) gate dielectric that is paired with a work function specific gate metal according to an industry standard of high k metal gate process schemes described previously. Moreover, the gate oxide may be formed with a rapid thermal oxidation (RTO), a low temperature oxide deposition or low temperature microwave plasma oxidation of the silicon surfaces and then a gate material such as, for example, tungsten or aluminum may be deposited. Gate stack self aligned LDD (Lightly Doped Drain) and halo punch-thru implants may be performed at this time to adjust junction and transistor breakdown characteristics. A conventional spacer deposition of oxide and nitride and a subsequent etch-back may be done to form implant offset spacers (not shown) on the gate stacks 10424. Then a self aligned N+ source and drain implant may be performed to create transistor source and drains 10420 and remaining P− silicon NMOS transistor channels 10428. High temperature anneal steps may or may not be done at this time to activate the implants and set initial junction depths. Finally, the entire structure may be covered with a gap fill oxide 10450, which may be planarized with chemical mechanical polishing. The oxide surface may be prepared for oxide to oxide wafer bonding as previously described.

Figure 104E:
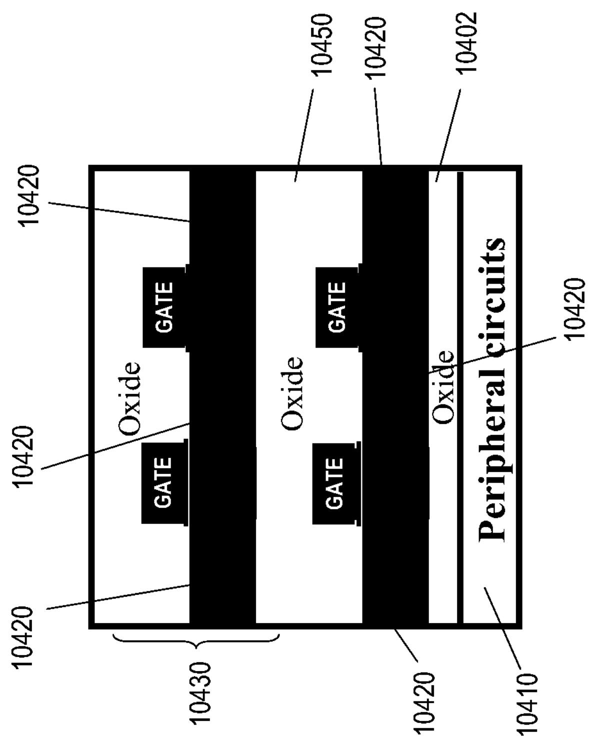

As illustrated in FIG. 104E, the transistor layer formation, bonding to acceptor wafer 10410 oxide 10450, and subsequent transistor formation as described in FIGS. 104A to 104D may be repeated to form the second tier 10430 of memory transistors. After substantially all the desired memory layers are constructed, a rapid thermal anneal (RTA) may be conducted to activate the dopants in substantially all of the memory layers and in the acceptor substrate 10410 peripheral circuits. Alternatively, optical anneals, such as, for example, a laser based anneal, may be performed.

Figure 104F:
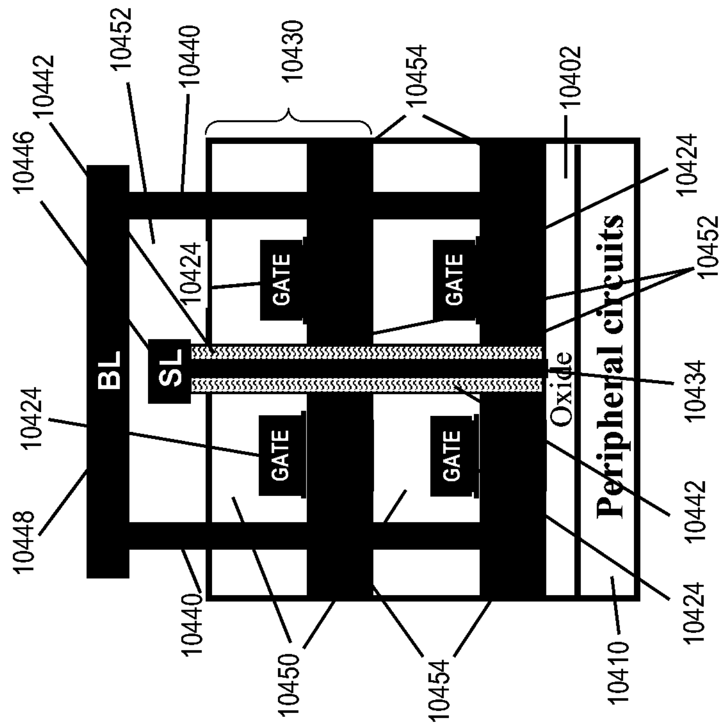

As illustrated in FIG. 104F, contacts and metal interconnects may be formed by lithography and plasma/RIE etch. Bit line (BL) contacts 10440 electrically couple the memory layers' transistor N+ regions on the transistor drain side 10454, and the source line contact 10442 electrically couples the memory layers' transistor N+ regions on the transistors source side 10452. The bit-line (BL) wiring 10448 and source-line (SL) wiring 10446 electrically couples the bit-line contacts 10440 and source-line contacts 10442 respectively. The gate stacks, such as 10434, may be connected with a contact and metallization (not shown) to form the word-lines (WLs). A thru layer via (not shown) may be formed to electrically couple the BL, SL, and WL metallization to the acceptor substrate 10410 peripheral circuitry via an acceptor wafer metal connect pad (not shown).

As illustrated in FIG. 104F, source-line (SL) contacts 10434 may be lithographically defined, etched with plasma/RIE through the oxide 10450 and N+ silicon regions 10420 of each memory tier, and the associated oxide vertical isolation regions to connect substantially all memory layers vertically. SL contacts may then be processed by a photoresist removal. Resistance change memory material 10442, such as, for example, hafnium oxide, may then be deposited, preferably with atomic layer deposition (ALD). The electrode for the resistance change memory element may then be deposited by ALD to form the SL contact/electrode 10434. The excess deposited material may be polished to planarity at or below the top of oxide 10450. Each SL contact/electrode 10434 with resistive change material 10442 may be shared among substantially all layers of memory, shown as two layers of memory in FIG. 104F. The SL contact 10434 electrically couples the memory layers' transistor N+ regions on the transistor source side 10452. SL metal lines 10446 may be formed and connected to the associated SL contacts 10434 with resistive change material 10442. Oxide layer 10452 may be deposited and planarized. Bit-line (BL) contacts 10440 may be lithographically defined, etched along with plasma/RIE through oxide 10452, the oxide 10450 and N+ silicon regions 10420 of each memory tier, and the associated oxide vertical isolation regions to connect substantially all memory layers vertically. BL contacts 10440 may then be processed by a photoresist removal. BL contacts 10440 electrically couple the memory layers' transistor N+ regions on the transistor drain side 10454. BL metal lines 10448 may be formed and connect to the associated BL contacts 10440. The gate stacks, such as 10424, may be connected with a contact and metallization (not shown) to form the word-lines (WLs). A thru layer via 10460 (not shown) may be formed to electrically couple the BL, SL, and WL metallization to the acceptor substrate 10410 peripheral circuitry via an acceptor wafer metal connect pad 10480 (not shown).

This flow may enable the formation of a resistance-based 3D memory with two additional masking steps per memory layer constructed by layer transfers of wafer sized doped layers and this 3D memory may be connected to an underlying multi-metal layer semiconductor device.

Persons of ordinary skill in the art will appreciate that the illustrations in FIGS. 104A through 104F are exemplary only and are not drawn to scale. Such skilled persons will further appreciate that many variations are possible such as, for example, the transistors may be of another type such as PMOS or RCATs. Additionally, the stacked memory layer may be connected to a periphery circuit that is above the memory stack. Moreover, each tier of memory could be configured with a slightly different donor wafer P− layer doping profile. Further, the memory could be organized in a different manner, such as BL and SL interchanged, or where there are buried wiring whereby wiring for the memory array is below the memory layers but above the periphery. Many other modifications within the scope of the invention will suggest themselves to such skilled persons after reading this specification. Thus the invention is to be limited only by the appended claims.

Charge trap NAND (Negated AND) memory devices are another form of popular commercial non-volatile memories. Charge trap device store their charge in a charge trap layer, wherein this charge trap layer then influences the channel of a transistor. Background information on charge-trap memory can be found in "*Integrated Interconnect Technologies for* 3*D Nanoelectronic Systems*", Artech House, 2009 by Bakir and Meindl (hereinafter Bakir), "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. and "Introduction to Flash memory," Proc. IEEE 91, 489-502 (2003) by R. Bez, et al. Work described in Bakir utilized selective epitaxy, laser recrystallization, or polysilicon to form the transistor channel, which results in less than satisfactory transistor performance. The architectures shown in FIGS. 105 and 106 are relevant for any type of charge-trap memory.

As illustrated in FIGS. 105A to 105G, a charge trap based two additional masking steps per memory layer 3D memory may be constructed that is suitable for 3D IC. This 3D memory utilizes NAND strings of charge trap transistors constructed in mono-crystalline silicon.

Figure 105A:
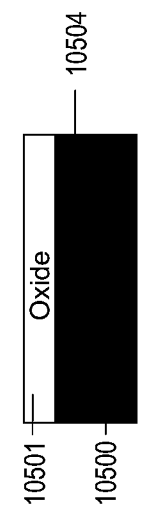

As illustrated in FIG. 105A, a P− substrate donor wafer 10500 may be processed to include a wafer sized layer of P− doping 10504. The P-doped layer 10504 may have the same or different dopant concentration than the P− substrate 10500. The P− doped layer 10504 may have a vertical dopant gradient. The P− doped layer 10504 may be formed by ion implantation and thermal anneal. A screen oxide 10501 may be grown before the implant to protect the silicon from implant contamination and to provide an oxide surface for later wafer to wafer bonding.

Figure 105B:
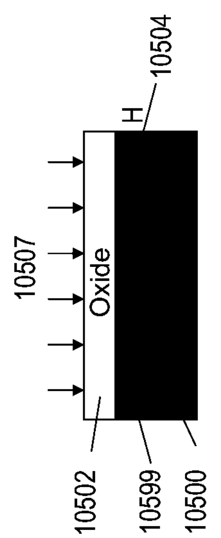

As illustrated in FIG. 105B, the top surface of donor wafer 10500 may be prepared for oxide wafer bonding with a deposition of an oxide 10502 or by thermal oxidation of the P− doped layer 10504 to form oxide layer 10502, or a re-oxidation of implant screen oxide 10501. A layer transfer demarcation plane 10599 (shown as a dashed line) may be formed in donor wafer 10500 or P− layer 10504 (shown) by hydrogen implantation 10507 or other methods as previously described. Both the donor wafer 10500 and acceptor wafer 10510 may be prepared for wafer bonding as previously described and then bonded, preferably at a low temperature (e.g., less than approximately 400° C.) to minimize stresses. The portion of the P− layer 10504 and the P− donor wafer substrate 10500 that are above the layer transfer demarcation plane 10599 may be removed by cleaving and polishing, or other processes as previously described, such as ion-cut or other methods.

Figure 105C:
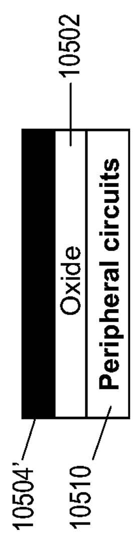

As illustrated in FIG. 105C, the remaining P− doped layer 10504', and oxide layer 10502 have been layer transferred to acceptor wafer 10510. Acceptor wafer 10510 may include peripheral circuits such that the accepter wafer can withstand an additional rapid-thermal-anneal (RTA) and still remain operational and retain good performance. For this purpose, the peripheral circuits may be formed such that they have been subject to a weak RTA or no RTA for activating dopants. Also, the peripheral circuits may utilize a refractory metal such as, for example, tungsten that can withstand high temperatures greater than approximately 400° C. The top surface of P− doped layer 10504' may be chemically or mechanically polished smooth and flat. Now transistors may be formed and aligned to the acceptor wafer 10510 alignment marks (not shown).

Figure 105D:
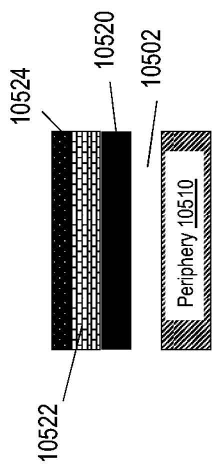

As illustrated in FIG. 105D, shallow trench isolation (STI) oxide regions (not shown) may be lithographically defined and plasma/RIE etched to at least the top level of oxide layer 10502, thus removing regions of P− mono-crystalline silicon layer 10504' and forming P− doped regions 10520. A gap-fill oxide may be deposited and CMP'ed flat to form conventional STI oxide regions and P− doped mono-crystalline silicon regions (not shown) for forming the transistors. Threshold adjust implants may or may not be performed at this time. A gate stack may be formed with growth or deposition of a charge trap gate dielectric 10522, such as, for example, thermal oxide and silicon nitride layers (ONO: Oxide-Nitride-Oxide), and a gate metal material 10524, such as, for example, doped or undoped poly-crystalline silicon. Alternatively, the charge trap gate dielectric may comprise silicon or III-V nano-crystals encased in an oxide.

Figure 105E:
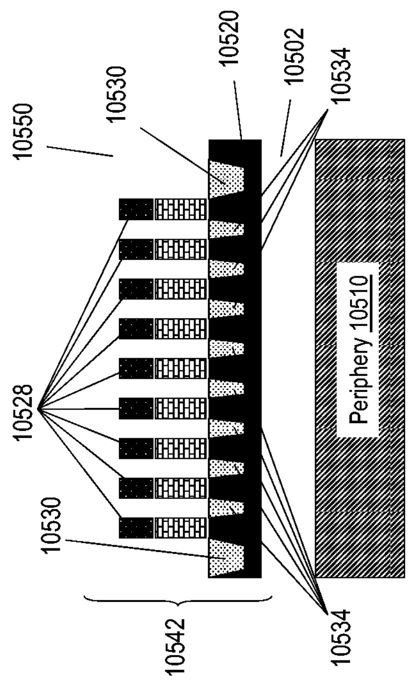

As illustrated in FIG. 105E, gate stacks 10528 may be lithographically defined and plasma/RIE etched, thus removing regions of gate metal material 10524 and charge trap gate dielectric 10522. A self aligned N+ source and drain implant may be performed to create inter-transistor source and drains 10534 and end of NAND string source and drains 10530. Finally, the entire structure may be covered with a gap fill oxide 10550 and the oxide planarized with chemical mechanical polishing. The oxide surface may be prepared for oxide to oxide wafer bonding as previously described. This now forms the first tier of memory transistors 10542 including silicon oxide layer 10550, gate stacks 10528, inter-transistor source and drains 10534, end of NAND string source and drains 10530, P− silicon regions 10520, and oxide 10502.

Figure 105F:
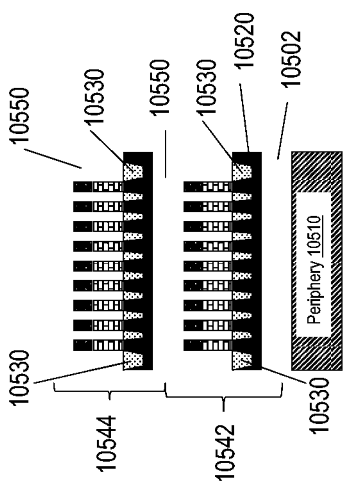

As illustrated in FIG. 105F, the transistor layer formation, bonding to acceptor wafer 10510 oxide 10550, and subsequent transistor formation as described in FIGS. 105A to 105D may be repeated to form the second tier 10544 of memory transistors on top of the first tier of memory transistors 10542. After substantially all the desired memory layers are constructed, a rapid thermal anneal (RTA) may be conducted to activate the dopants in substantially all of the memory layers and in the acceptor substrate 10510 peripheral circuits. Alternatively, optical anneals, such as, for example, a laser based anneal, may be performed.

Figure 105G:
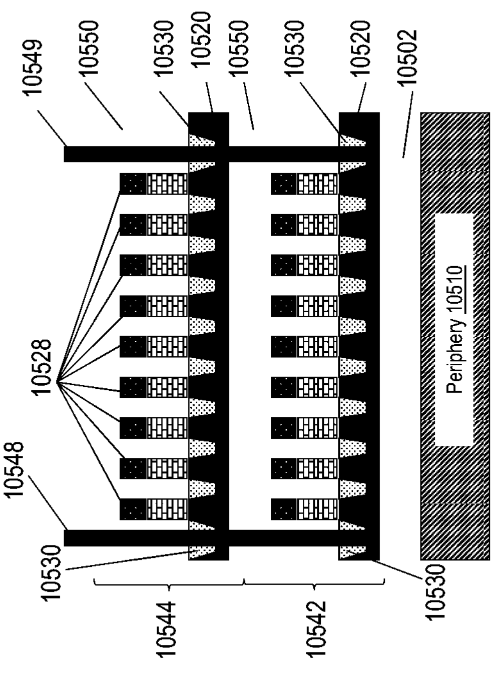

As illustrated in FIG. 105G, source line (SL) ground contact 10548 and bit line contact 10549 may be lithographically defined, etched along with plasma/RIE through oxide 10550, end of NAND string source and drains 10530, P− regions 10520 of each memory tier, and the associated oxide vertical isolation regions to connect substantially all memory layers vertically. SL ground contacts and bit line contact may then be processed by a photoresist removal. Metal or heavily doped poly-crystalline silicon may be utilized to fill the contacts and metallization utilized to form BL and SL wiring (not shown). The gate stacks 10528 may be connected with a contact and metallization to form the word-lines (WLs) and WL wiring (not shown). A thru layer via 10560 (not shown) may be formed to electrically couple the BL, SL, and WL metallization to the acceptor substrate 10510 peripheral circuitry via an acceptor wafer metal connect pad 10580 (not shown).

This flow may enable the formation of a charge trap based 3D memory with two additional masking steps per memory layer constructed by layer transfers of wafer sized doped layers of mono-crystalline silicon and this 3D memory may be connected to an underlying multi-metal layer semiconductor device.

Persons of ordinary skill in the art will appreciate that the illustrations in FIGS. 105A through 105G are exemplary only and are not drawn to scale. Such skilled persons will further appreciate that many variations are possible such as, for example, BL or SL select transistors may be constructed within the process flow. Moreover, the stacked memory layer may be connected to a periphery circuit that is above the memory stack. Additionally, each tier of memory could be configured with a slightly different donor wafer P− layer doping profile. Further, the memory could be organized in a different manner, such as BL and SL interchanged, or these architectures can be modified into a NOR flash memory style, or where buried wiring for the memory array is below the memory layers but above the periphery. Besides, the charge trap dielectric and gate layer may be deposited before the layer transfer and temporarily bonded to a carrier or holder wafer or substrate and then transferred to the acceptor substrate with periphery. Many other modifications within the scope of the invention will suggest themselves to such skilled persons after reading this specification. Thus the invention is to be limited only by the appended claims.

As illustrated in FIGS. 106A to 106G, a charge trap based 3D memory with zero additional masking steps per memory layer 3D memory may be constructed that is suitable for 3D IC manufacturing. This 3D memory utilizes NAND strings of charge trap junction-less transistors with junction-less select transistors constructed in mono-crystalline silicon.

Figure 106A:
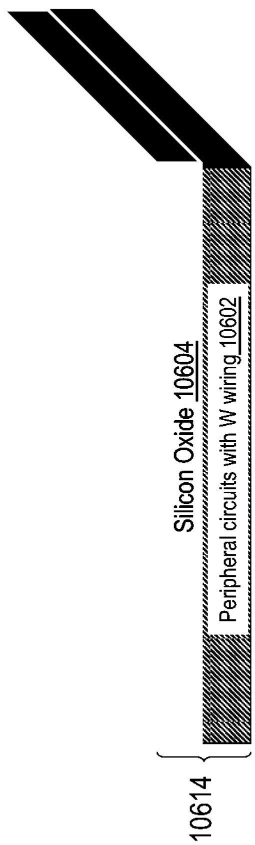

As illustrated in FIG. 106A, a silicon substrate with peripheral circuitry 10602 may be constructed with high temperature (e.g., greater than approximately 400° C.) resistant wiring, such as, for example, Tungsten. The peripheral circuitry substrate 10602 may include memory control circuits as well as circuitry for other purposes and of various types, such as, for example, analog, digital, RF, or memory. The peripheral circuitry substrate 10602 may include peripheral circuits that can withstand an additional rapid-thermal-anneal (RTA) and still remain operational and retain good performance. For this purpose, the peripheral circuits may be formed such that they have been subject to a weak RTA or no RTA for activating dopants. The top surface of the peripheral circuitry substrate 10602 may be prepared for oxide wafer bonding with a deposition of a silicon oxide 10604, thus forming acceptor wafer 10614.

Figure 106B:
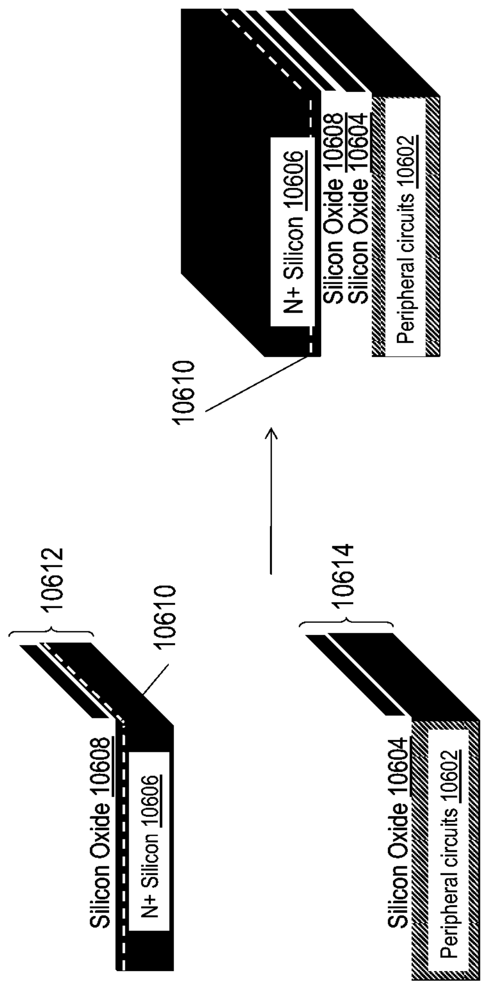

As illustrated in FIG. 106B, a mono-crystalline silicon donor wafer 10612 may be processed to include a wafer sized layer of N+ doping (not shown) which may have a different dopant concentration than the N+ substrate 10606. The N+ doping layer may be formed by ion implantation and thermal anneal. A screen oxide 10608 may be grown or deposited prior to the implant to protect the silicon from implant contamination and to provide an oxide surface for later wafer to wafer bonding. A layer transfer demarcation plane 10610 (shown as a dashed line) may be formed in donor wafer 10612 within the N+ substrate 10606 or the N+ doping layer (not shown) by hydrogen implantation or other methods as previously described. Both the donor wafer 10612 and acceptor wafer 10614 may be prepared for wafer bonding as previously described and then bonded at the surfaces of oxide layer 10604 and oxide layer 10608, at a low temperature (e.g., less than approximately 400° C. preferred for lowest stresses), or a moderate temperature (e.g., less than approximately 900° C.).

Figure 106C:
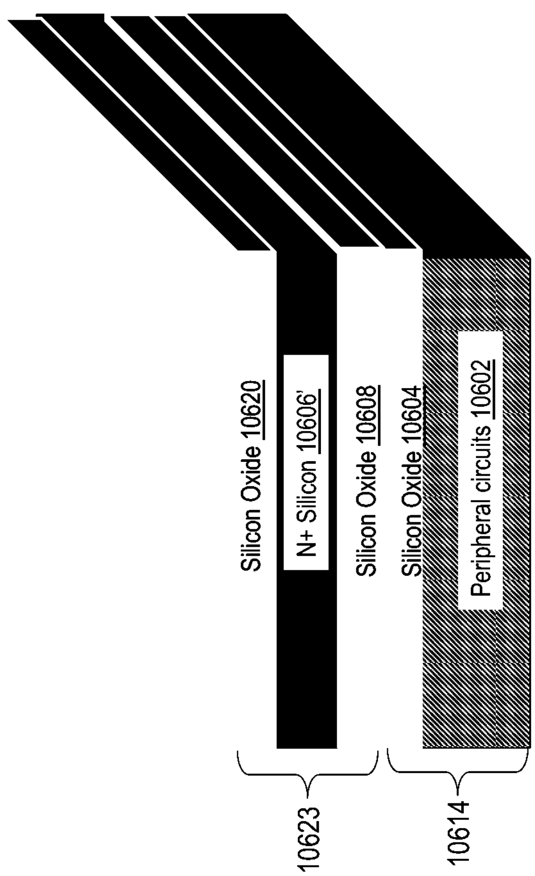

As illustrated in FIG. 106C, the portion of the N+ layer (not shown) and the N+ wafer substrate 10606 that are above the layer transfer demarcation plane 10610 may be removed by cleaving and polishing, or other processes as previously described, such as ion-cut or other methods, thus forming the remaining mono-crystalline silicon N+ layer 10606'. Remaining N+ layer 10606' and oxide layer 10608 have been layer transferred to acceptor wafer 10614. The top surface of N+ layer 10606' may be chemically or mechanically polished smooth and flat. Oxide layer 10620 may be deposited to prepare the surface for later oxide to oxide bonding. This now forms the first Si/SiO2 layer 10623 comprised of silicon oxide layer 10620, N+ silicon layer 10606', and oxide layer 10608.

Figure 106D:
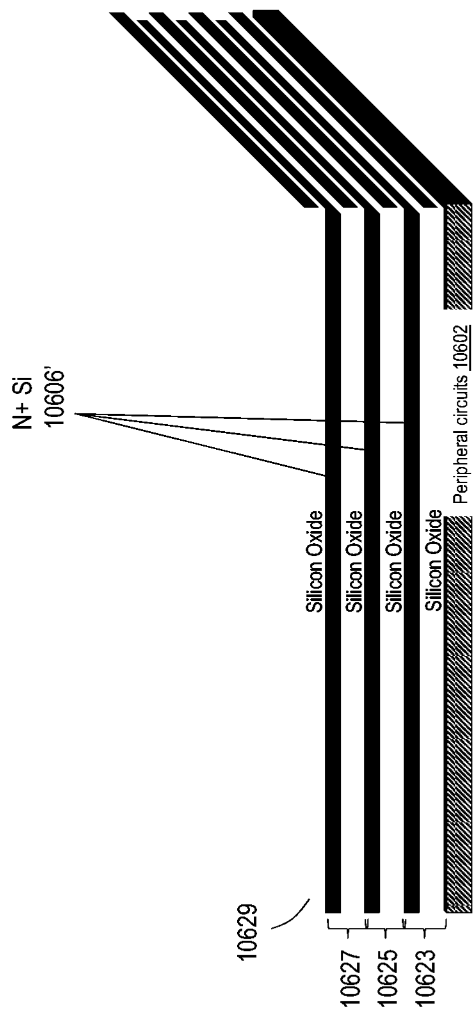

As illustrated in FIG. 106D, additional Si/SiO2 layers, such as, for example, second Si/SiO2 layer 10625 and third Si/SiO2 layer 10627, may each be formed as described in FIGS. 106A to 106C. Oxide layer 10629 may be deposited to electrically isolate the top N+ silicon layer.

Figure 106E:
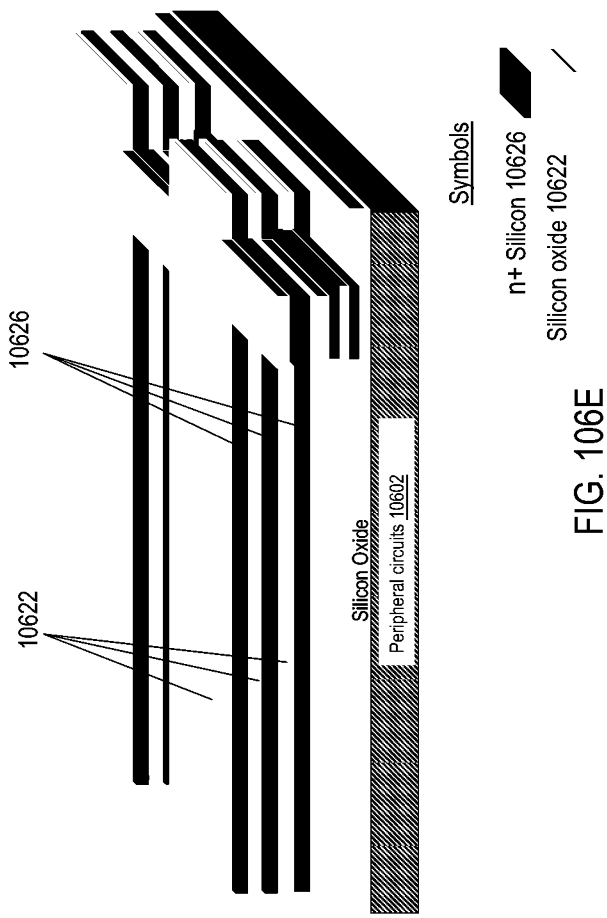

As illustrated in FIG. 106E, oxide 10629, third Si/SiO2 layer 10627, second Si/SiO2 layer 10625 and first Si/SiO2 layer 10623 may be lithographically defined and plasma/RIE etched to form a portion of the memory cell structure, which now includes regions of N+ silicon 10626 and oxide 10622.

Figure 106F:
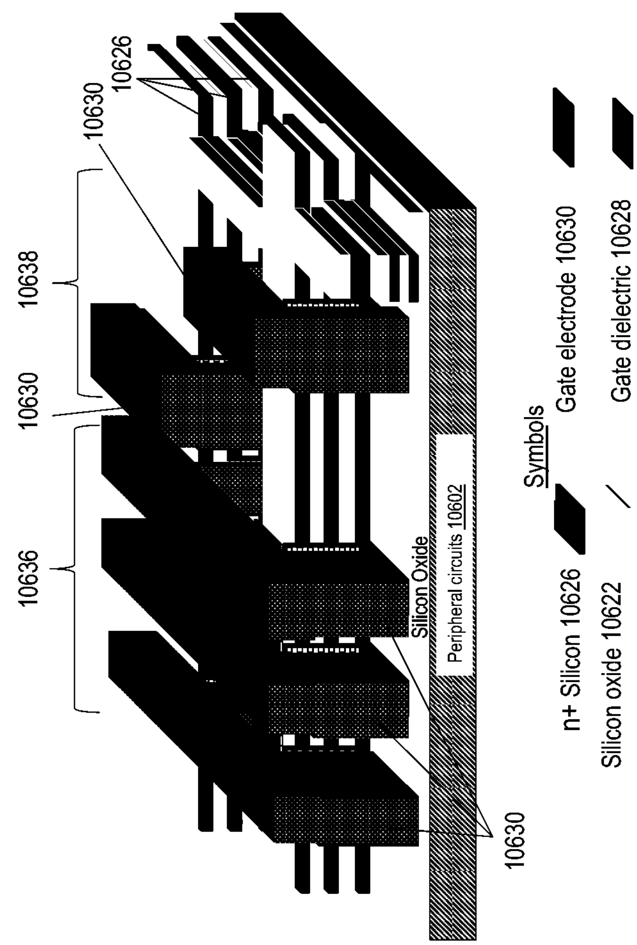

As illustrated in FIG. 106F, a gate stack may be formed with growth or deposition of a charge trap gate dielectric layer, such as thermal oxide and silicon nitride layers (ONO: Oxide-Nitride-Oxide), and a gate metal electrode layer, such as doped or undoped poly-crystalline silicon. The gate metal electrode layer may then be planarized with chemical mechanical polishing. Alternatively, the charge trap gate dielectric layer may comprise silicon or III-V nano-crystals encased in an oxide. The select gate area 10638 may comprise a non-charge trap dielectric. The gate metal electrode regions 10630 and gate dielectric regions 10628 of both the NAND string area 10636 and select transistor area 10638 may be lithographically defined and plasma/RIE etched.

Figure 106G:
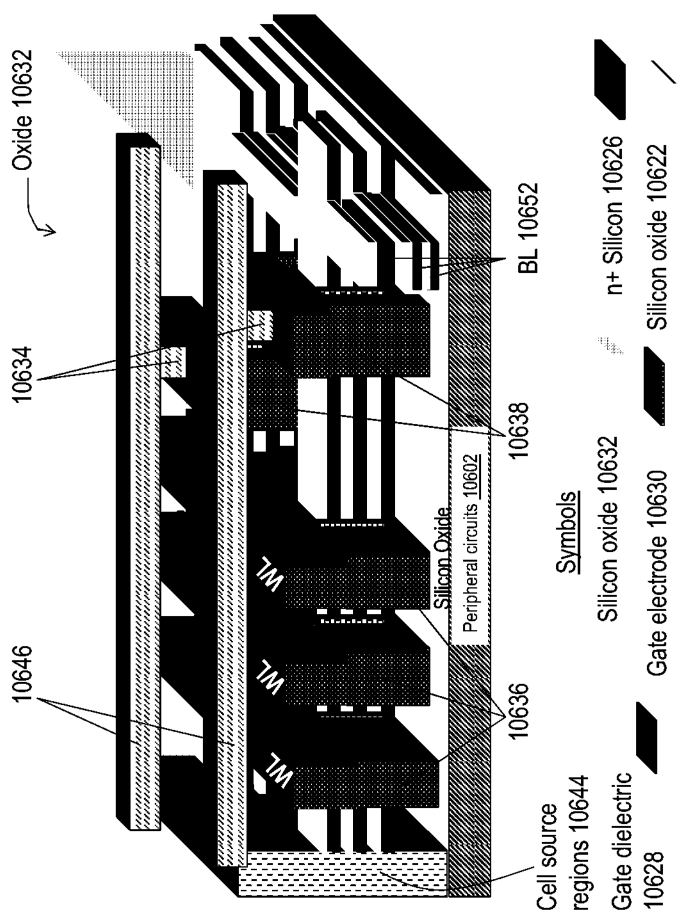

As illustrated in FIG. 106G, the entire structure may be covered with a gap fill oxide 10632, which may be planarized with chemical mechanical polishing. The oxide 10632 is shown transparent in the figure for clarity. Select metal lines 10646 may be formed and connected to the associated select gate contacts 10634. Contacts and associated metal interconnect lines (not shown) may be formed for the WL and SL at the memory array edges. Word-line regions (WL) 10636, gate electrodes 10630, and bit-line regions (BL) 10652 including indicated N+ silicon regions 10626, are shown. Source regions 10644 may be formed by trench contact etch and fill to couple to the N+ silicon regions on the source end of the NAND string 10636. A thru layer via 10660 (not shown) may be formed to electrically couple the BL, SL, and WL metallization to the acceptor substrate 10614 peripheral circuitry via an acceptor wafer metal connect pad 10680 (not shown).

This flow may enable the formation of a charge trap based 3D memory with zero additional masking steps per memory layer constructed by layer transfers of wafer sized doped layers of mono-crystalline silicon and this 3D memory may be connected to an underlying multi-metal layer semiconductor device.

Persons of ordinary skill in the art will appreciate that the illustrations in FIGS. 106A through 106G are exemplary only and are not drawn to scale. Such skilled persons will further appreciate that many variations are possible such as, for example, BL or SL contacts may be constructed in a staircase manner as described previously. Moreover, the stacked memory layer may be connected to a periphery circuit that is above the memory stack. Additionally, each tier of memory could be configured with a slightly different donor wafer N+ layer doping profile. Further, the memory could be organized in a different manner, such as BL and SL interchanged, or where buried wiring for the memory array is below the memory layers but above the periphery. Additional types of 3D charge trap memories may be constructed by layer transfer of mono-crystalline silicon; for example, those found in "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al., and "Multi-layered Vertical Gate NAND Flash overcoming stacking limit for terabit density storage", Symposium on VLSI Technology, 2009 by W. Kim, S. Choi, et al. Many other modifications within the scope of the invention will suggest themselves to such skilled persons after reading this specification. Thus the invention is to be limited only by the appended claims.

Floating gate (FG) memory devices are another form of popular commercial non-volatile memories. Floating gate devices store their charge in a conductive gate (FG) that is nominally isolated from unintentional electric fields, wherein the charge on the FG then influences the channel of a transistor. Background information on floating gate flash memory can be found in "Introduction to Flash memory", Proc. IEEE 91, 489-502 (2003) by R. Bez, et al. The architectures shown in FIGS. 107 and 108 are relevant for any type of floating gate memory.

As illustrated in FIGS. 107A to 107G, a floating gate based 3D memory with two additional masking steps per memory layer may be constructed that is suitable for 3D IC manufacturing. This 3D memory utilizes NAND strings of floating gate transistors constructed in mono-crystalline silicon.

Figure 107A:
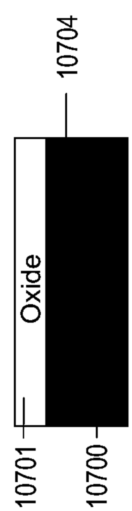

As illustrated in FIG. 107A, a P− substrate donor wafer 10700 may be processed to include a wafer sized layer of P− doping 10704. The P-doped layer 10704 may have the same or a different dopant concentration than the P− substrate 10700. The P− doped layer 10704 may have a vertical dopant gradient. The P− doped layer 10704 may be formed by ion implantation and thermal anneal. A screen oxide 10701 may be grown before the implant to protect the silicon from implant contamination and to provide an oxide surface for later wafer to wafer bonding.

Figure 107B:
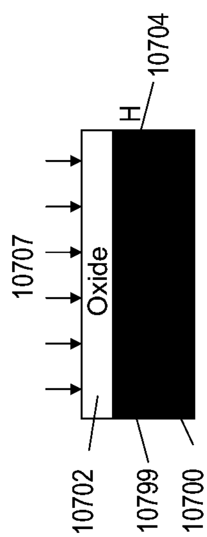

As illustrated in FIG. 107B, the top surface of donor wafer 10700 may be prepared for oxide wafer bonding with a deposition of an oxide 10702 or by thermal oxidation of the P− doped layer 10704 to form oxide layer 10702, or a re-oxidation of implant screen oxide 10701. A layer transfer demarcation plane 10799 (shown as a dashed line) may be formed in donor wafer 10700 or P− layer 10704 (shown) by hydrogen implantation 10707 or other methods as previously described. Both the donor wafer 10700 and acceptor wafer 10710 may be prepared for wafer bonding as previously described and then bonded, preferably at a low temperature (less than approximately 400° C.) to minimize stresses. The portion of the P− layer 10704 and the P− donor wafer substrate 10700 that are above the layer transfer demarcation plane 10799 may be removed by cleaving and polishing, or other processes as previously described, such as ion-cut or other methods.

Figure 107C:
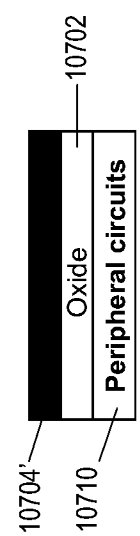

As illustrated in FIG. 107C, the remaining P− doped layer 10704', and oxide layer 10702 have been layer transferred to acceptor wafer 10710. Acceptor wafer 10710 may include peripheral circuits such that they can withstand an additional rapid-thermal-anneal (RTA) and still remain operational and retain good performance. For this purpose, the peripheral circuits may be formed such that they have been subject to a weak RTA or no RTA for activating dopants. Also, the peripheral circuits may utilize a refractory metal such as, for example, tungsten that can withstand high temperatures greater than approximately 400° C. The top surface of P− doped layer 10704' may be chemically or mechanically polished smooth and flat. Now transistors may be formed and aligned to the acceptor wafer 10710 alignment marks (not shown).

Figure 107D:
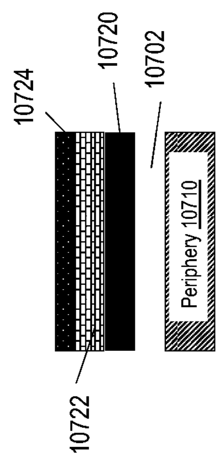

As illustrated in FIG. 107D a partial gate stack may be formed with growth or deposition of a tunnel oxide 10722, such as, for example, thermal oxide, and a FG gate metal material 10724, such as, for example, doped or undoped poly-crystalline silicon. Shallow trench isolation (STI) oxide regions (not shown) may be lithographically defined and plasma/RIE etched to at least the top level of oxide layer 10702, thus removing regions of P− mono-crystalline silicon layer 10704' and forming P− doped regions 10720. A gap-fill oxide may be deposited and CMP'ed flat to form conventional STI oxide regions (not shown).

Figure 107E:
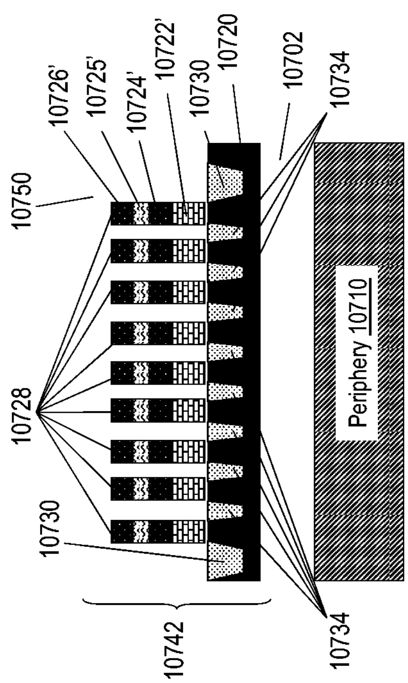

As illustrated in FIG. 107E, an inter-poly oxide layer 10725, such as silicon oxide and silicon nitride layers (ONO: Oxide-Nitride-Oxide), and a Control Gate (CG) gate metal material 10726, such as doped or undoped poly-crystalline silicon, may be deposited. The gate stacks 10728 may be lithographically defined and plasma/RIE etched, thus removing regions of CG gate metal material 10726, inter-poly oxide layer 10725, FG gate metal material 10724, and tunnel oxide 10722. This removal may result in the gate stacks 10728 including CG gate metal regions 10726', inter-poly oxide regions 10725', FG gate metal regions 10724, and tunnel oxide regions 10722'. Only one gate stack 10728 is annotated with region tie lines for clarity. A self aligned N+ source and drain implant may be performed to create inter-transistor source and drains 10734 and end of NAND string source and drains 10730. Finally, the entire structure may be covered with a gap fill oxide 10750, which may be planarized with chemical mechanical polishing. The oxide surface may be prepared for oxide to oxide wafer bonding as previously described. This now forms the first tier of memory transistors 10742 including silicon oxide layer 10750, gate stacks 10728, inter-transistor source and drains 10734, end of NAND string source and drains 10730, P− silicon regions 10720, and oxide 10702.

Figure 107F:
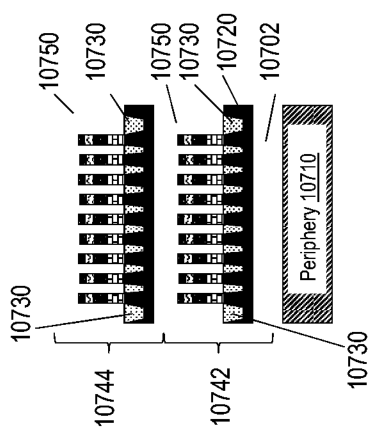

As illustrated in FIG. 107F, the transistor layer formation, bonding to acceptor wafer 10710 oxide 10750, and subsequent transistor formation as described in FIGS. 107A to 107D may be repeated to form the second tier 10744 of memory transistors on top of the first tier of memory transistors 10742. After substantially all the desired memory layers are constructed, a rapid thermal anneal (RTA) may be conducted to activate the dopants in substantially all of the memory layers and in the acceptor substrate 10710 peripheral circuits. Alternatively, optical anneals, such as, for example, a laser based anneal, may be performed.

Figure 107G:
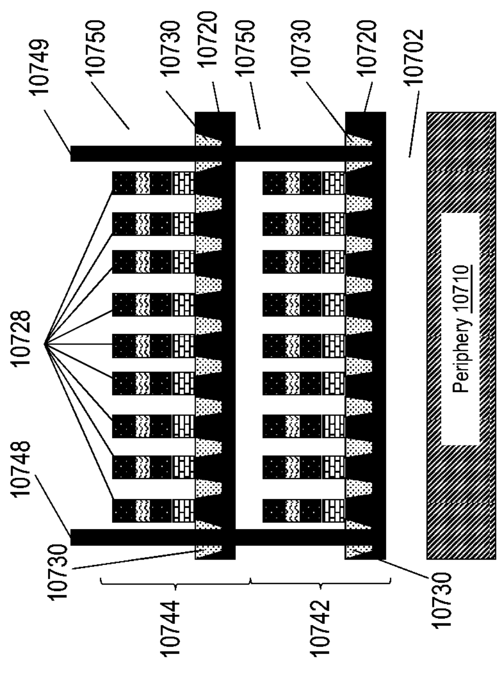

As illustrated in FIG. 107G, source line (SL) ground contact 10748 and bit line contact 10749 may be lithographically defined, etched with plasma/RIE through oxide 10750, end of NAND string source and drains 10730, and P− regions 10720 of each memory tier, and the associated oxide vertical isolation regions to connect substantially all memory layers vertically. SL ground contact 10748 and bit line contact 10749 may then be processed by a photoresist removal. Metal or heavily doped poly-crystalline silicon may be utilized to fill the contacts and metallization utilized to form BL and SL wiring (not shown). The gate stacks 10728 may be connected with a contact and metallization to form the word-lines (WLs) and WL wiring (not shown). A thru layer via 10760 (not shown) may be formed to electrically couple the BL, SL, and WL metallization to the acceptor substrate 10710 peripheral circuitry via an acceptor wafer metal connect pad 10780 (not shown).

This flow may enable the formation of a floating gate based 3D memory with two additional masking steps per memory layer constructed by layer transfers of wafer sized doped layers of mono-crystalline silicon and this 3D memory may be connected to an underlying multi-metal layer semiconductor device.

Persons of ordinary skill in the art will appreciate that the illustrations in FIGS. 107A through 107G are exemplary only and are not drawn to scale. Such skilled persons will further appreciate that many variations are possible such as, for example, BL or SL select transistors may be constructed within the process flow. Moreover, the stacked memory layer may be connected to a periphery circuit that is above the memory stack. Additionally, each tier of memory could be configured with a slightly different donor wafer P− layer doping profile. Further, the memory could be organized in a different manner, such as BL and SL interchanged, or where buried wiring for the memory array is below the memory layers but above the periphery. Many other modifications within the scope of the invention will suggest themselves to such skilled persons after reading this specification. Thus the invention is to be limited only by the appended claims.

As illustrated in FIGS. 108A to 108H, a floating gate based 3D memory with one additional masking step per memory layer 3D memory may be constructed that is suitable for 3D IC manufacturing. This 3D memory utilizes 3D floating gate junction-less transistors constructed in mono-crystalline silicon.

Figure 108A:
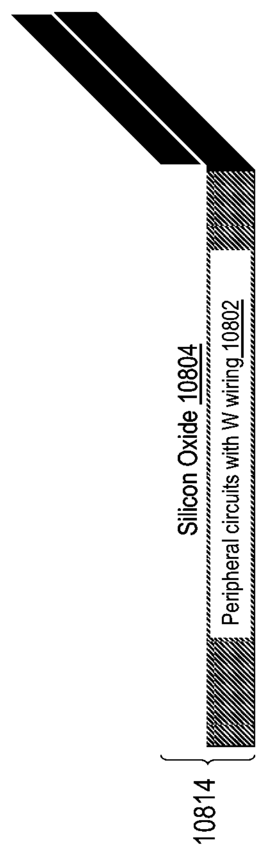

As illustrated in FIG. 108A, a silicon substrate with peripheral circuitry 10802 may be constructed with high temperature (greater than approximately 400° C.) resistant wiring, such as, for example, Tungsten. The peripheral circuitry substrate 10802 may include memory control circuits as well as circuitry for other purposes and of various types, such as, for example, analog, digital, RF, or memory. The peripheral circuitry substrate 10802 may include peripheral circuits that can withstand an additional rapid-thermal-anneal (RTA) and still remain operational and retain good performance. For this purpose, the peripheral circuits may be formed such that they have been subject to a weak RTA or no RTA for activating dopants. The top surface of the peripheral circuitry substrate 10802 may be prepared for oxide wafer bonding with a deposition of a silicon oxide 10804, thus forming acceptor wafer 10814.

Figure 108B:
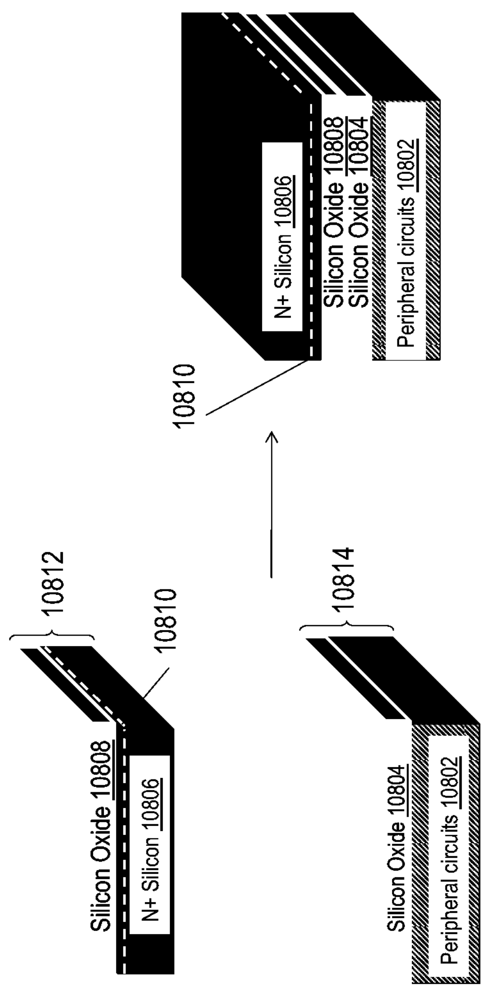

As illustrated in FIG. 108B, a mono-crystalline N+ doped silicon donor wafer 10812 may be processed to include a wafer sized layer of N+ doping (not shown) which may have a different dopant concentration than the N+ substrate 10806. The N+ doping layer may be formed by ion implantation and thermal anneal. A screen oxide 10808 may be grown or deposited prior to the implant to protect the silicon from implant contamination and to provide an oxide surface for later wafer to wafer bonding. A layer transfer demarcation plane 10810 (shown as a dashed line) may be formed in donor wafer 10812 within the N+ substrate 10806 or the N+ doping layer (not shown) by hydrogen implantation or other methods as previously described. Both the donor wafer 10812 and acceptor wafer 10814 may be prepared for wafer bonding as previously described and then bonded at the surfaces of oxide layer 10804 and oxide layer 10808, at a low temperature (e.g., less than approximately 400° C. preferred for lowest stresses), or a moderate temperature (e.g., less than approximately 900° C.).

Figure 108C:
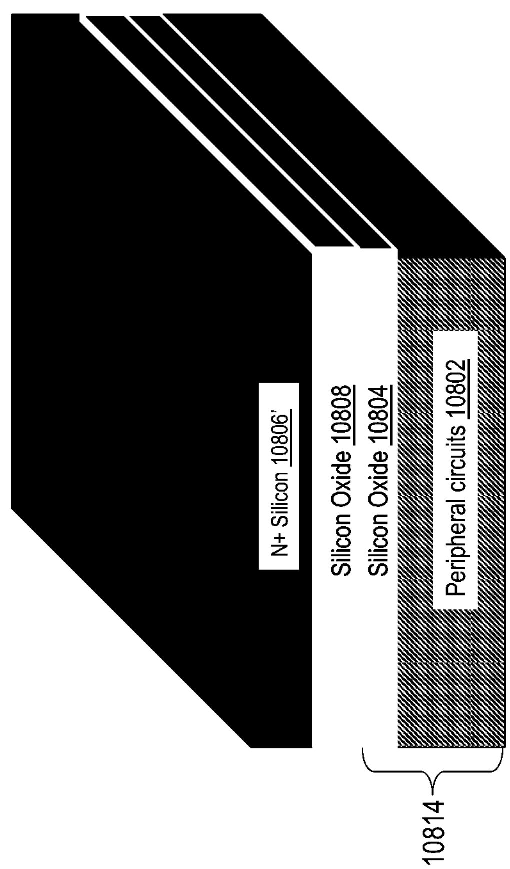

As illustrated in FIG. 108C, the portion of the N+ layer (not shown) and the N+ wafer substrate 10806 that are above the layer transfer demarcation plane 10810 may be removed by cleaving and polishing, or other processes as previously described, such as ion-cut or other methods, thus forming the remaining mono-crystalline silicon N+ layer 10806'. Remaining N+ layer 10806' and oxide layer 10808 have been layer transferred to acceptor wafer 10814. The top surface of N+ layer 10806' may be chemically or mechanically polished smooth and flat. Now transistors or portions of transistors may be formed and aligned to the acceptor wafer 10814 alignment marks (not shown).

Figure 108D:
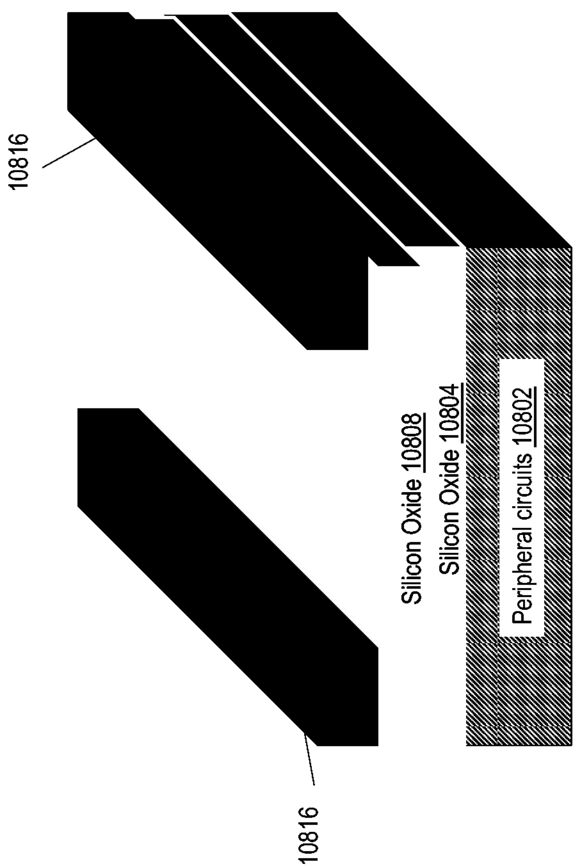

As illustrated in FIG. 108D N+ regions 10816 may be lithographically defined and then etched with plasma/RIE, thus removing regions of N+ layer 10806' and stopping on or partially within oxide layer 10808.

Figure 108E:
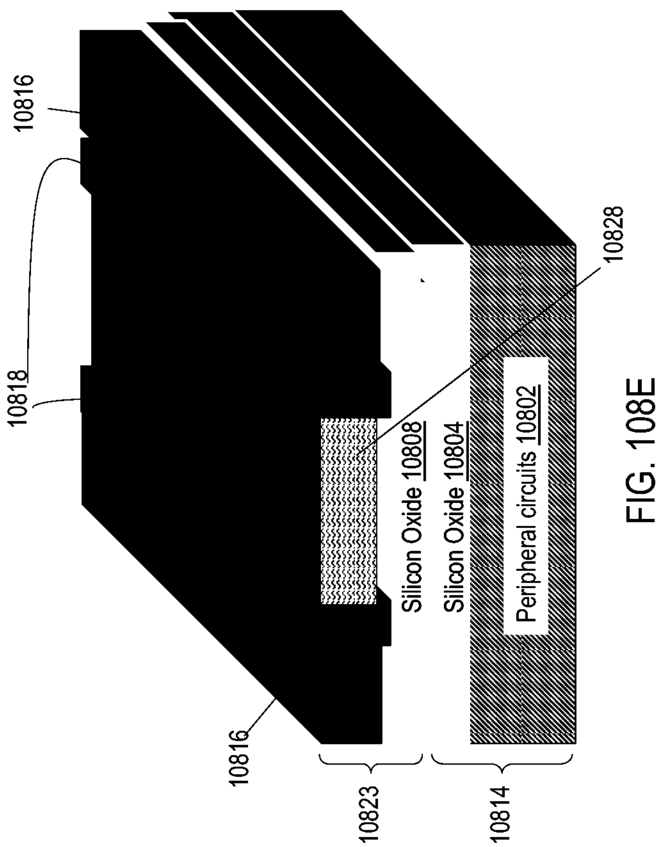

As illustrated in FIG. 108E, a tunneling dielectric 10818 may be grown or deposited, such as thermal silicon oxide, and a floating gate (FG) material 10828, such as doped or undoped poly-crystalline silicon, may be deposited. The structure may be planarized by chemical mechanical polishing to approximately the level of the N+ regions 10816. The surface may be prepared for oxide to oxide wafer bonding as previously described, such as a deposition of a thin oxide. This now forms the first memory layer 10823 including future FG regions 10828, tunneling dielectric 10818, N+ regions 10816 and oxide 10808.

Figure 108F:
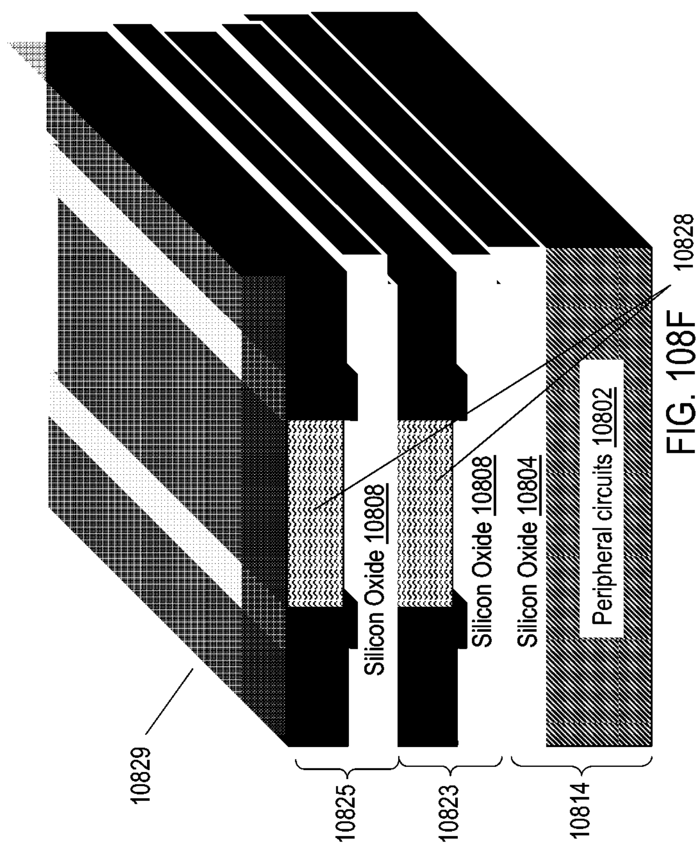

As illustrated in FIG. 108F, the N+ layer formation, bonding to an acceptor wafer, and subsequent memory layer formation as described in FIGS. 108A to 108E may be repeated to form the second layer 10825 of memory on top of the first memory layer 10823. A layer of oxide 10829 may then be deposited.

Figure 108G:
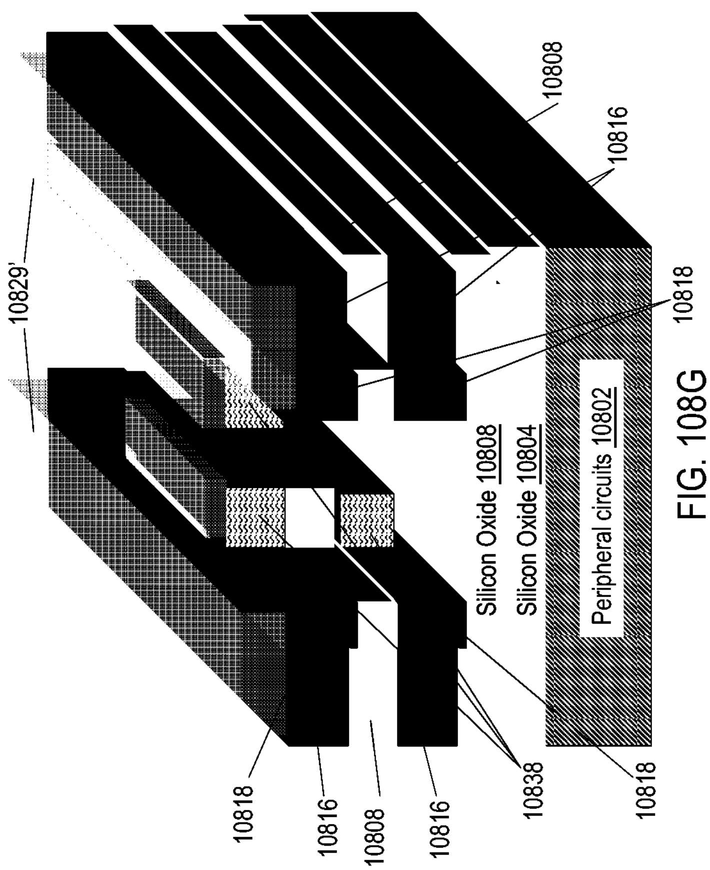

As illustrated in FIG. 108G, FG regions 10838 may be lithographically defined and then etched along with plasma/RIE removing portions of oxide layer 10829, future FG regions 10828 and oxide layer 10808 on the second layer of memory 10825 and future FG regions 10828 on the first layer of memory 10823, thus stopping on or partially within oxide layer 10808 of the first memory layer 10823.

Figure 108H:
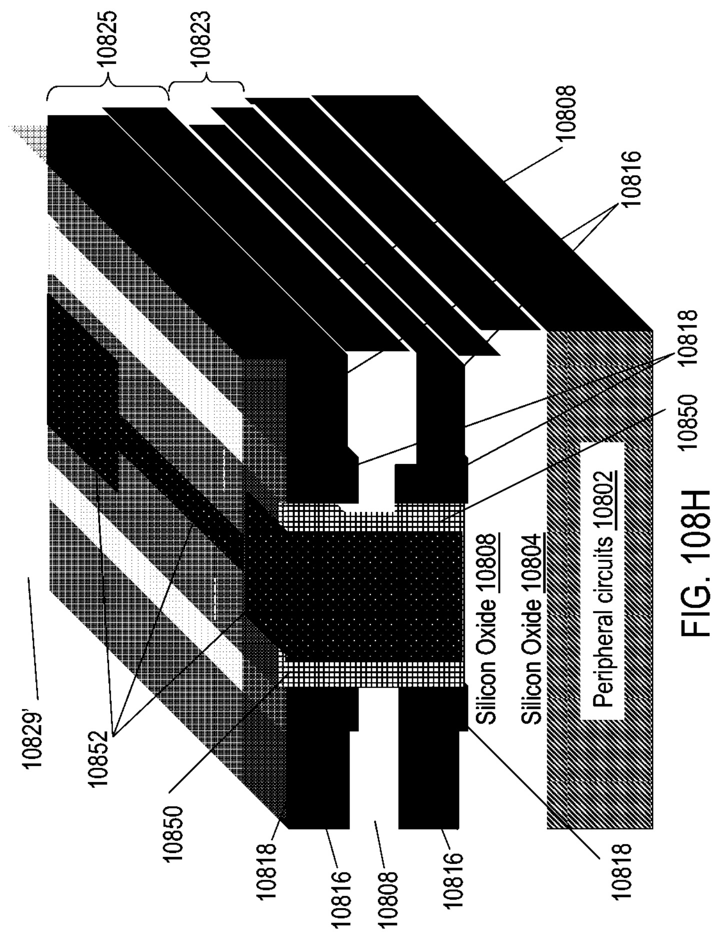

As illustrated in FIG. 108H, an inter-poly oxide layer 10850, such as, for example, silicon oxide and silicon nitride layers (ONO: Oxide-Nitride-Oxide), and a Control Gate (CG) gate material 10852, such as, for example, doped or undoped poly-crystalline silicon, may be deposited. The surface may be planarized by chemical mechanical polishing leaving a thinned oxide layer 10829'. As shown in the illustration, this results in the formation of 4 horizontally oriented floating gate memory cells with N+ junction-less transistors. Contacts and metal wiring to form well-know memory access/decoding schemes may be processed and a thru layer via (TLV) may be formed to electrically couple the memory access decoding to the acceptor substrate peripheral circuitry via an acceptor wafer metal connect pad.

This flow may enable the formation of a floating gate based 3D memory with one additional masking step per memory layer constructed by layer transfers of wafer sized doped layers of mono-crystalline silicon and this 3D memory may be connected to an underlying multi-metal layer semiconductor device.

Persons of ordinary skill in the art will appreciate that the illustrations in FIGS. 108A through 108H are exemplary only and are not drawn to scale. Such skilled persons will further appreciate that many variations are possible such as, for example, memory cell control lines could be built in a different layer rather than the same layer. Moreover, the stacked memory layers may be connected to a periphery circuit that is above the memory stack. Additionally, each tier of memory could be configured with a slightly different donor wafer N+ layer doping profile. Further, the memory could be organized in a different manner, such as BL and SL interchanged, or these architectures could be modified into a NOR flash memory style, or where buried wiring for the memory array is below the memory layers but above the periphery. Many other modifications within the scope of the invention will suggest themselves to such skilled persons after reading this specification.

The monolithic 3D integration concepts described in this patent application can lead to novel embodiments of poly-crystalline silicon based memory architectures. While the below concepts in FIGS. 109 and 110 are explained by using resistive memory architectures as an example, it will be clear to one skilled in the art that similar concepts can be applied to the NAND flash, charge trap, and DRAM memory architectures and process flows described previously in this patent application.

As illustrated in FIGS. 109A to 109K, a resistance-based 3D memory with zero additional masking steps per memory layer may be constructed with methods that are suitable for 3D IC manufacturing. This 3D memory utilizes poly-crystalline silicon junction-less transistors that may have either a positive or a negative threshold voltage and has a resistance-based memory element in series with a select or access transistor.

Figure 109A:
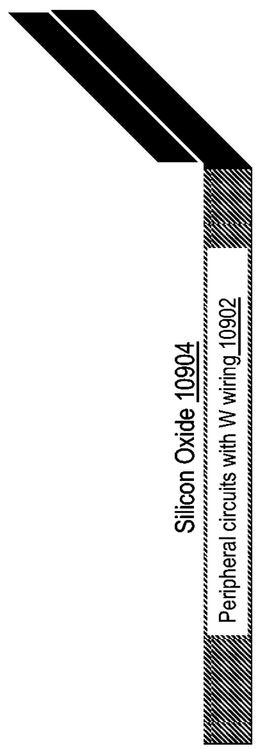

As illustrated in FIG. 109A, a silicon substrate with peripheral circuitry 10902 may be constructed with high temperature (greater than approximately 400° C.) resistant wiring, such as, for example, Tungsten. The peripheral circuitry substrate 10902 may include memory control circuits as well as circuitry for other purposes and of various types, such as, for example, analog, digital, RF, or memory. The peripheral circuitry substrate 10902 may include peripheral circuits that can withstand an additional rapid-thermal-anneal (RTA) and still remain operational and retain good performance. For this purpose, the peripheral circuits may be formed such that they have been subject to a partial or weak RTA or no RTA for activating dopants. Silicon oxide layer 10904 is deposited on the top surface of the peripheral circuitry substrate.

Figure 109B:
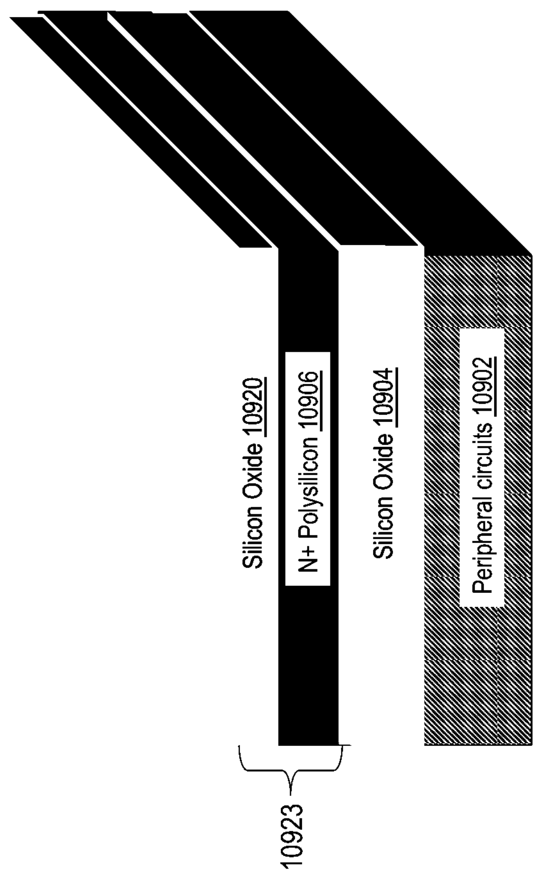

As illustrated in FIG. 109B, a layer of N+ doped poly-crystalline or amorphous silicon 10906 may be deposited. The amorphous silicon or poly-crystalline silicon layer 10906 may be deposited using a chemical vapor deposition process, such as LPCVD or PECVD, or other process methods, and may be deposited doped with N+ dopants, such as Arsenic or Phosphorous, or may be deposited un-doped and subsequently doped with, such as, ion implantation or PLAD (PLasma Assisted Doping) techniques. Silicon Oxide 10920 may then be deposited or grown. This now forms the first Si/SiO2 layer 10923 which includes N+ doped poly-crystalline or amorphous silicon layer 10906 and silicon oxide layer 10920.

Figure 109C:
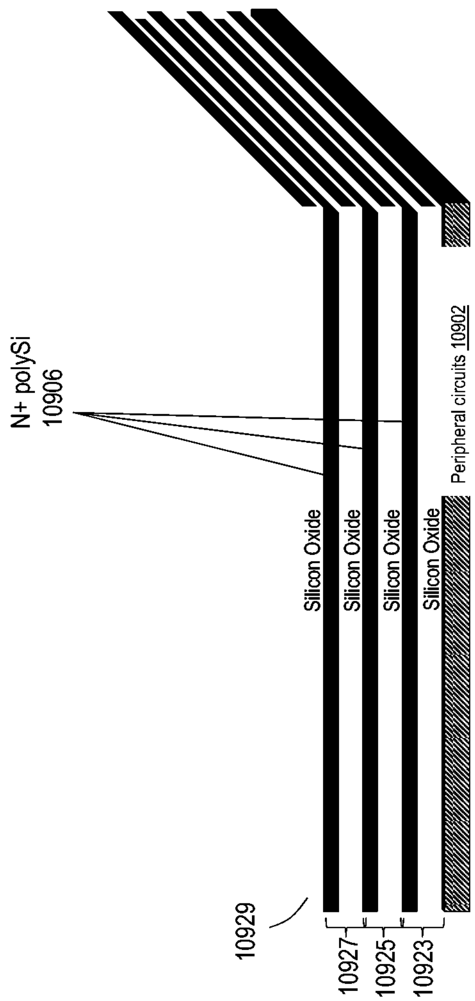

As illustrated in FIG. 109C, additional Si/SiO2 layers, such as, for example, second Si/SiO2 layer 10925 and third Si/SiO2 layer 10927, may each be formed as described in FIG. 109B. Oxide layer 10929 may be deposited to electrically isolate the top N+ doped poly-crystalline or amorphous silicon layer.

Figure 109D:
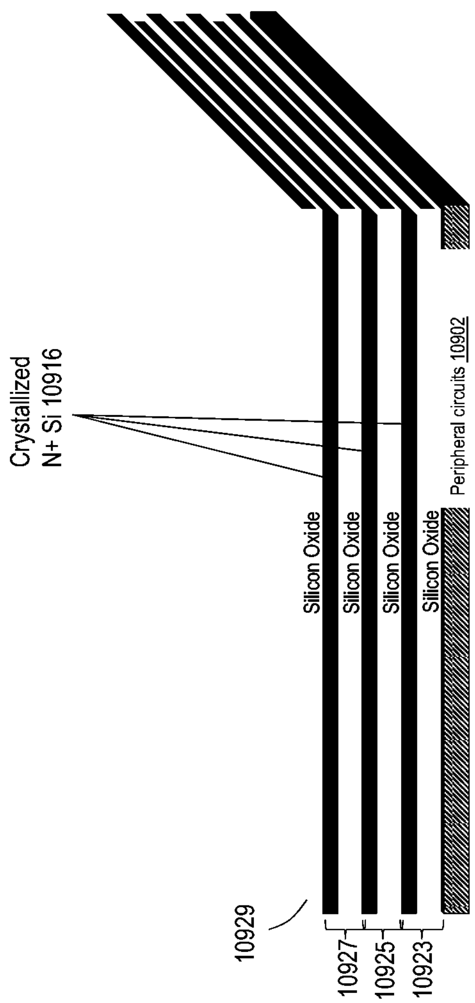

As illustrated in FIG. 109D, a Rapid Thermal Anneal (RTA) is conducted to crystallize the N+ doped poly-crystalline silicon or amorphous silicon layers 10906 of first Si/SiO2 layer 10923, second Si/SiO2 layer 10925, and third Si/SiO2 layer 10927, forming crystallized N+ silicon layers 10916. Temperatures during this RTA may be as high as approximately 800° C. Alternatively, an optical anneal, such as, for example, a laser anneal, could be performed alone or in combination with the RTA or other annealing processes.

Figure 109E:
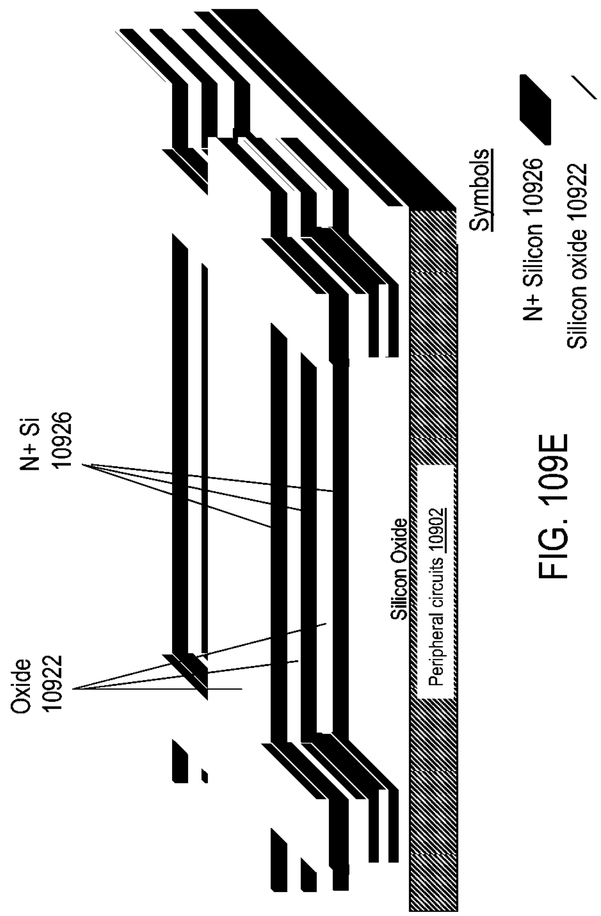

As illustrated in FIG. 109E, oxide 10929, third Si/SiO2 layer 10927, second Si/SiO2 layer 10925 and first Si/SiO2 layer 10923 may be lithographically defined and plasma/RIE etched to form a portion of the memory cell structure, which now includes multiple layers of regions of crystallized N+ silicon 10926 (previously crystallized N+ silicon layers 10916) and oxide 10922.

Figure 109F:
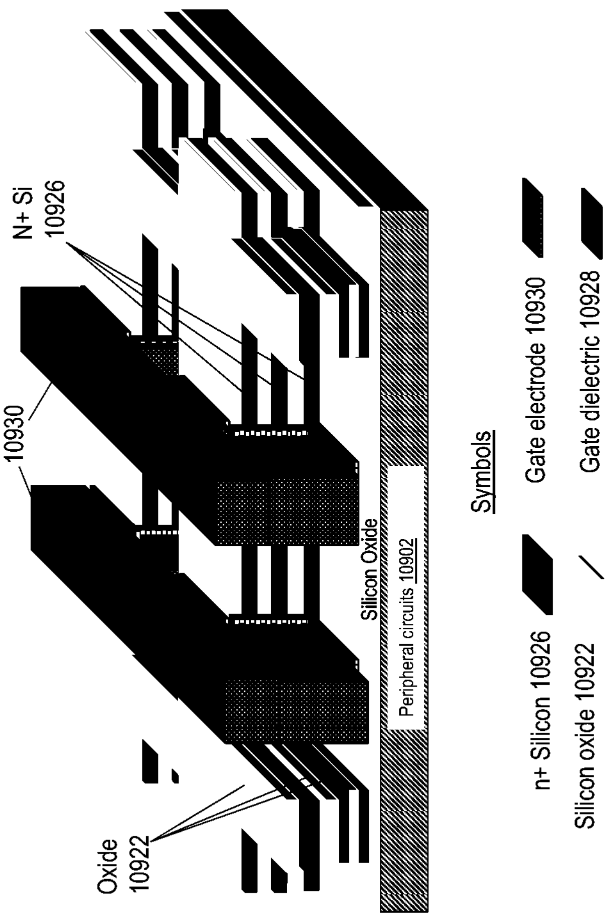

As illustrated in FIG. 109F, a gate dielectric and gate electrode material may be deposited, planarized with a chemical mechanical polish (CMP), and then lithographically defined and plasma/RIE etched to form gate dielectric regions 10928 which may either be self aligned to and covered by gate electrodes 10930 (shown), or cover the entire crystallized N+ silicon regions 10926 and oxide regions 10922 multi-layer structure. The gate stack including gate electrode 10930 and gate dielectric 10928 may be formed with a gate dielectric, such as thermal oxide, and a gate electrode material, such as poly-crystalline silicon. Alternatively, the gate dielectric may be an atomic layer deposited (ALD) material that is paired with a work function specific gate metal according to an industry standard of high k metal gate process schemes described previously. Furthermore, the gate dielectric may be formed with a rapid thermal oxidation (RTO), a low temperature oxide deposition or low temperature microwave plasma oxidation of the silicon surfaces and then a gate electrode such as tungsten or aluminum may be deposited.

Figure 109G:
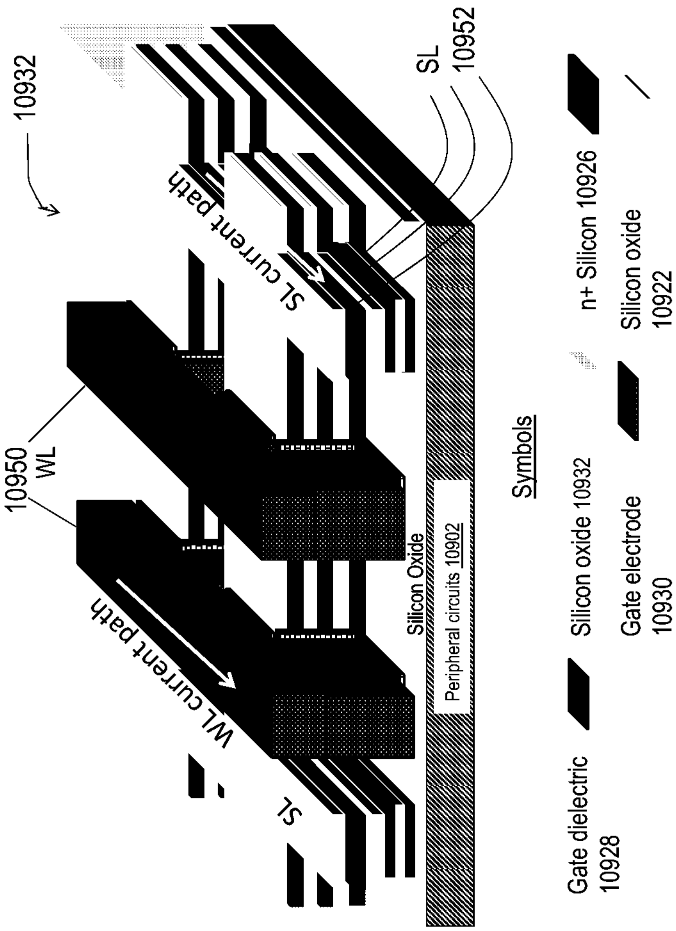

As illustrated in FIG. 109G, the entire structure may be covered with a gap fill oxide 10932, which may be planarized with chemical mechanical polishing. The oxide 10932 is shown transparently in the figure for clarity, along with word-line regions (WL) 10950, coupled with and composed of gate electrodes 10930, and source-line regions (SL) 10952, composed of crystallized N+ silicon regions 10926.

Figure 109H:
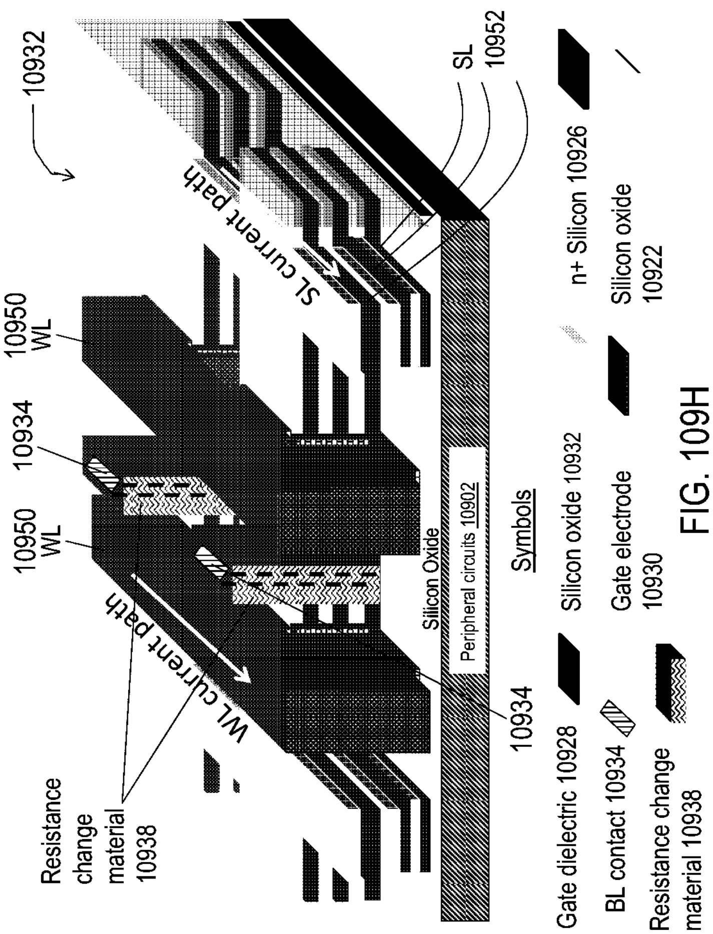

As illustrated in FIG. 109H, bit-line (BL) contacts 10934 may be lithographically defined, etched with plasma/RIE through oxide 10932, the three crystallized N+ silicon regions 10926, and associated oxide vertical isolation regions to connect substantially all memory layers vertically, and photoresist removed. Resistance change memory material 10938, such as, for example, hafnium oxides or titanium oxides, may then be deposited, preferably with atomic layer deposition (ALD). The electrode for the resistance change memory element may then be deposited by ALD to form the electrode/BL contact 10934. The excess deposited material may be polished to planarity at or below the top of oxide 10932. Each BL contact 10934 with resistive change material 10938 may be shared among substantially all layers of memory, shown as three layers of memory in FIG. 109H.

Figure 109I:
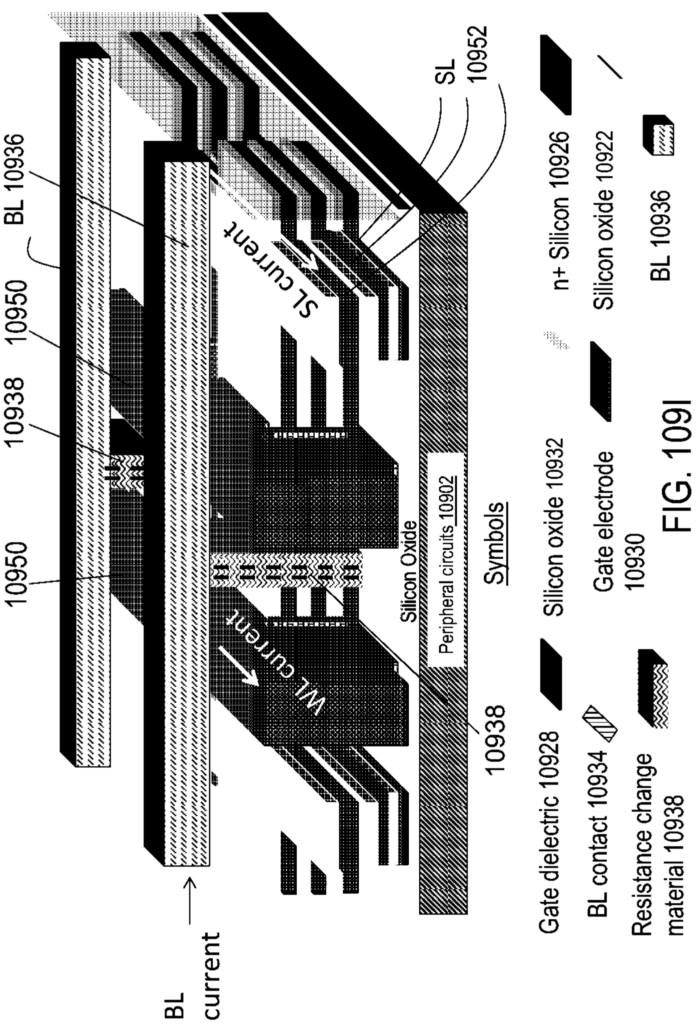

As illustrated in FIG. 109I, BL metal lines 10936 may be formed and connected to the associated BL contacts 10934 with resistive change material 10938. Contacts and associated metal interconnect lines (not shown) may be formed for the WL and SL at the memory array edges. A thru layer via 10960 (not shown) may be formed to electrically couple the BL, SL, and WL metallization to the acceptor substrate peripheral circuitry via an acceptor wafer metal connect pad 10980 (not shown).

Figure 109J:
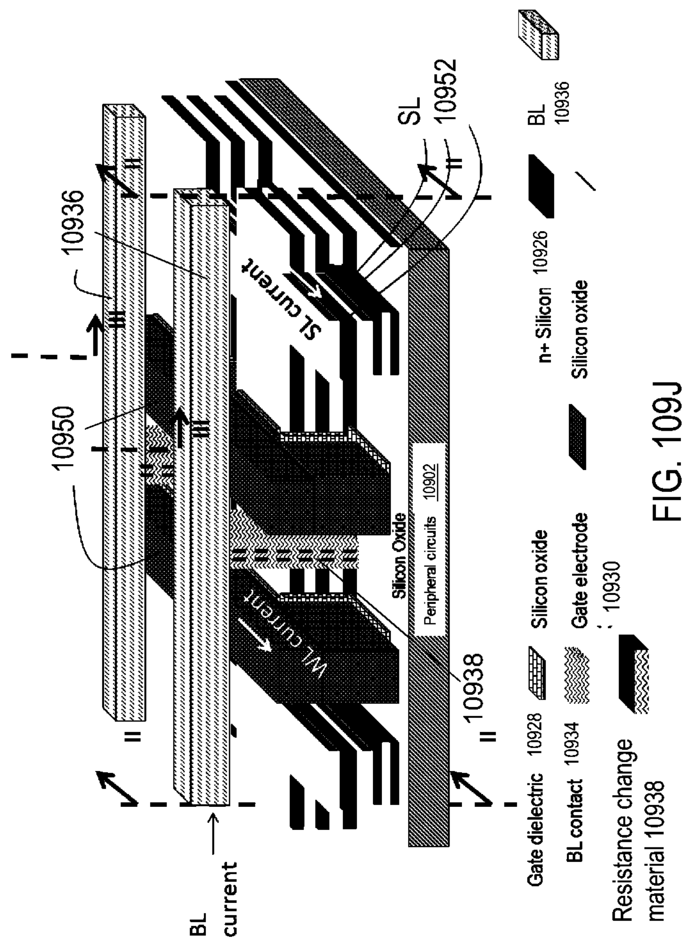

FIG. 109J1 is a cross sectional cut II view of FIG. 109J, while FIG. 109J2 is a cross sectional cut III view of FIG. 109J. FIG. 109J1 shows BL metal line 10936, oxide 10932, BL contact/electrode 10934, resistive change material 10938, WL regions 10950, gate dielectric 10928, crystallized N+ silicon regions 10926, and peripheral circuits substrate 10902. The BL contact/electrode 10934 couples to one side of the three levels of resistive change material 10938. The other side of the resistive change material 10938 is coupled to crystallized N+ regions 10926. FIG. 109J2 shows BL metal lines 10936, oxide 10932, gate electrode 10930, gate dielectric 10928, crystallized N+ silicon regions 10926, interlayer oxide region ('ox'), and peripheral circuits substrate 10902. The gate electrode 10930 is common to substantially all six crystallized N+ silicon regions 10926 and forms six two-sided gated junction-less transistors as memory select transistors.

Figure 109K:
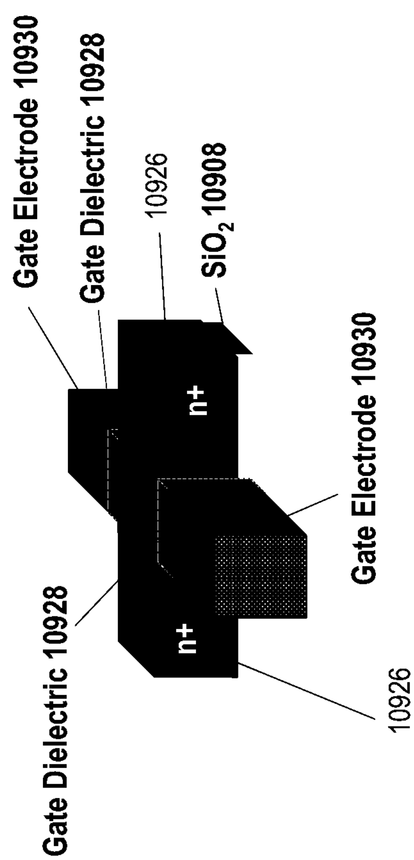

As illustrated in FIG. 109K, a single exemplary two-sided gated junction-less transistor on the first Si/SiO2 layer 10923 may include crystallized N+ silicon region 10926 (functioning as the source, drain, and transistor channel), and two gate electrodes 10930 with associated gate dielectrics 10928. The transistor is electrically isolated from beneath by oxide layer 10908.

This flow may enable the formation of a resistance-based multi-layer or 3D memory array with zero additional masking steps per memory layer, which utilizes poly-crystalline silicon junction-less transistors and has a resistance-based memory element in series with a select transistor, and is constructed by layer transfers of wafer sized doped poly-crystalline silicon layers, and this 3D memory array may be connected to an underlying multi-metal layer semiconductor device.

Persons of ordinary skill in the art will appreciate that the illustrations in FIGS. 109A through 109K are exemplary only and are not drawn to scale. Such skilled persons will further appreciate that many variations are possible such as, for example, the RTAs and/or optical anneals of the N+ doped poly-crystalline or amorphous silicon layers 10906 as described for FIG. 109D may be performed after each Si/SiO2 layer is formed in FIG. 109C. Additionally, N+ doped poly-crystalline or amorphous silicon layer 10906 may be doped P+, or with a combination of dopants and other polysilicon network modifiers to enhance the RTA or optical annealing and subsequent crystallization and lower the N+ silicon layer 10916 resistivity. Moreover, doping of each crystallized N+ layer may be slightly different to compensate for interconnect resistances. Furthermore, each gate of the double gated 3D resistance based memory can be independently controlled for better control of the memory cell. Many other modifications within the scope of the invention will suggest themselves to such skilled persons after reading this specification. Thus the invention is to be limited only by the appended claims.

As illustrated in FIGS. 110A to 110J, an alternative embodiment of a resistance-based 3D memory with zero additional masking steps per memory layer may be constructed with methods that are suitable for 3D IC manufacturing. This 3D memory utilizes poly-crystalline silicon junction-less transistors that may have either a positive or a negative threshold voltage, a resistance-based memory element in series with a select or access transistor, and may have the periphery circuitry layer formed or layer transferred on top of the 3D memory array.

Figure 110A:

As illustrated in FIG. 110A, a silicon oxide layer 11004 may be deposited or grown on top of silicon substrate 11002.

Figure 110B:
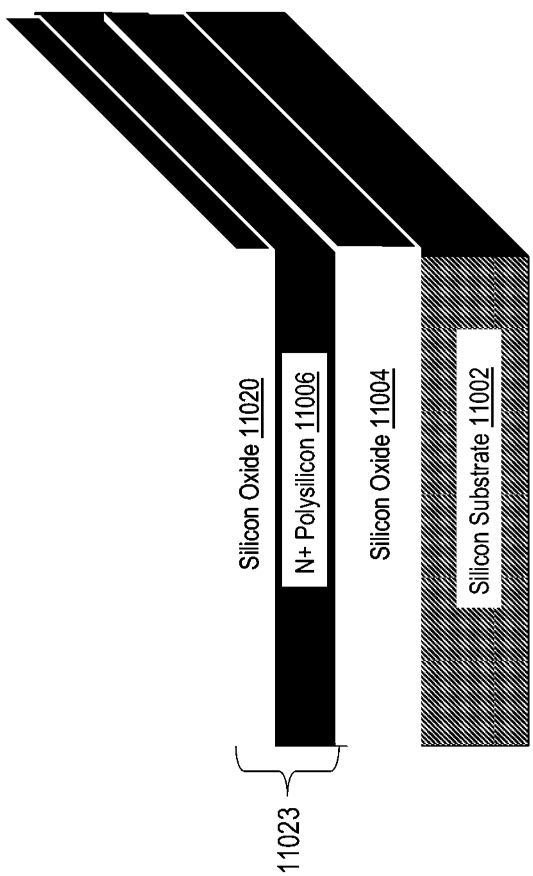

As illustrated in FIG. 110B, a layer of N+ doped poly-crystalline or amorphous silicon 11006 may be deposited. The amorphous silicon or poly-crystalline silicon layer 11006 may be deposited using a chemical vapor deposition process, such as LPCVD or PECVD, or other process methods, and may be deposited doped with N+ dopants, such as, for example, Arsenic or Phosphorous, or may be deposited un-doped and subsequently doped with, such as, for example, ion implantation or PLAD (PLasma Assisted Doping) techniques. Silicon Oxide 11020 may then be deposited or grown. This now forms the first Si/SiO2 layer 11023 comprised of N+ doped poly-crystalline or amorphous silicon layer 11006 and silicon oxide layer 11020.

Figure 110C:
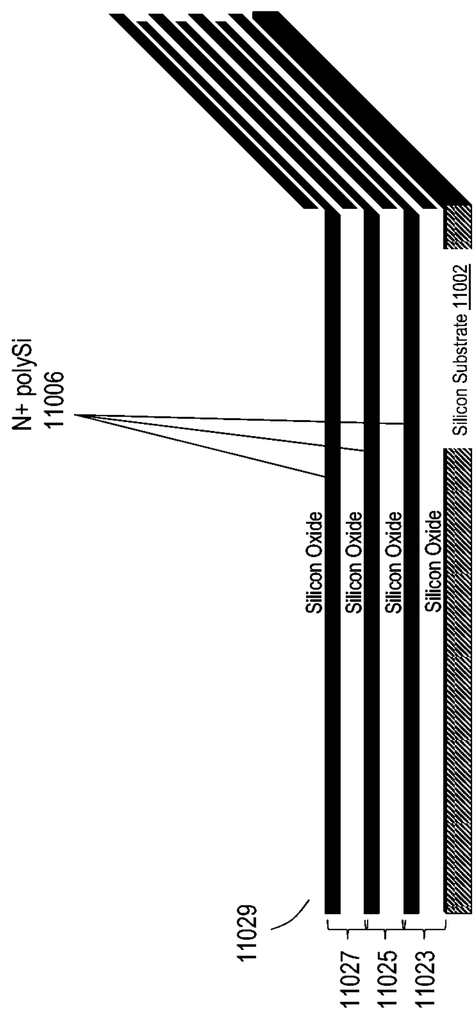

As illustrated in FIG. 110C, additional Si/SiO2 layers, such as, for example, second Si/SiO2 layer 11025 and third Si/SiO2 layer 11027, may each be formed as described in FIG. 110B. Oxide layer 11029 may be deposited to electrically isolate the top N+ doped poly-crystalline or amorphous silicon layer.

Figure 110D:
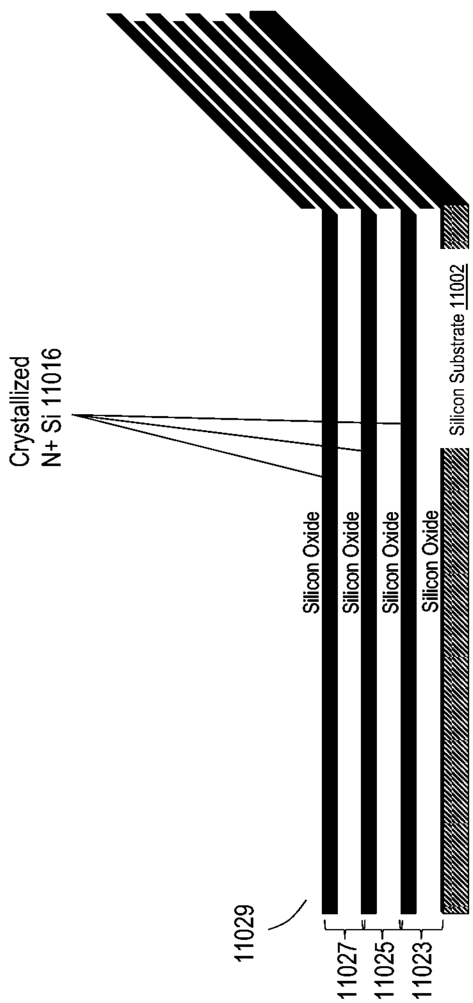

As illustrated in FIG. 110D, a Rapid Thermal Anneal (RTA) is conducted to crystallize the N+ doped poly-crystalline silicon or amorphous silicon layers 11006 of first Si/SiO2 layer 11023, second Si/SiO2 layer 11025, and third Si/SiO2 layer 11027, forming crystallized N+ silicon layers 11016. Alternatively, an optical anneal, such as, for example, a laser anneal, could be performed alone or in combination with the RTA or other annealing processes. Temperatures during this step could be as high as approximately 700° C., and could even be as high as, for example, 1400° C. Since there are no circuits or metallization underlying these layers of crystallized N+ silicon, very high temperatures (such as, for example, 1400° C.) can be used for the anneal process, leading to very good quality poly-crystalline silicon with few grain boundaries and very high carrier mobilities approaching those of mono-crystalline crystal silicon.

Figure 110E:
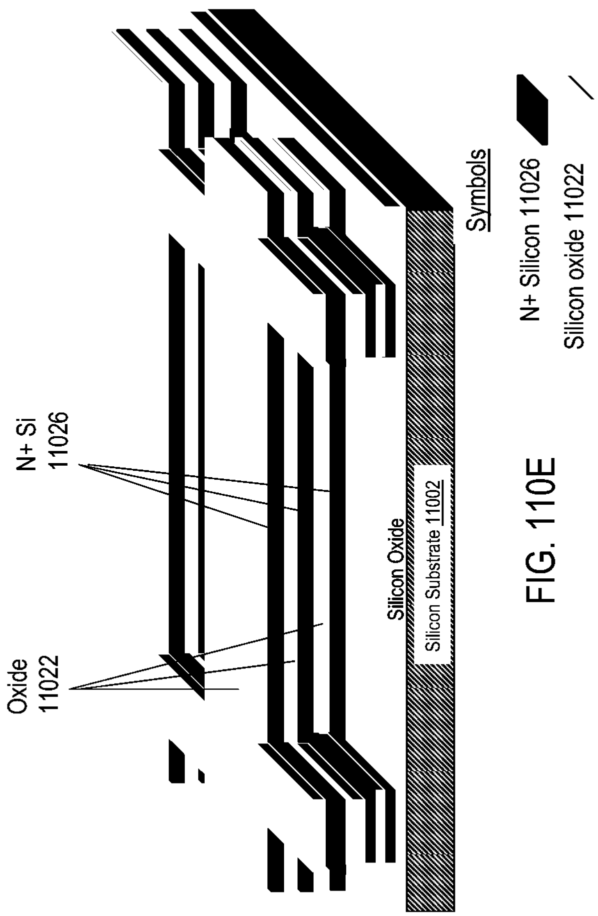

As illustrated in FIG. 110E, oxide 11029, third Si/SiO2 layer 11027, second Si/SiO2 layer 11025 and first Si/SiO2 layer 11023 may be lithographically defined and plasma/RIE etched to form a portion of the memory cell structure, which now includes multiple layers of regions of crystallized N+ silicon 11026 (previously crystallized N+ silicon layers 11016) and oxide 11022.

Figure 110F:
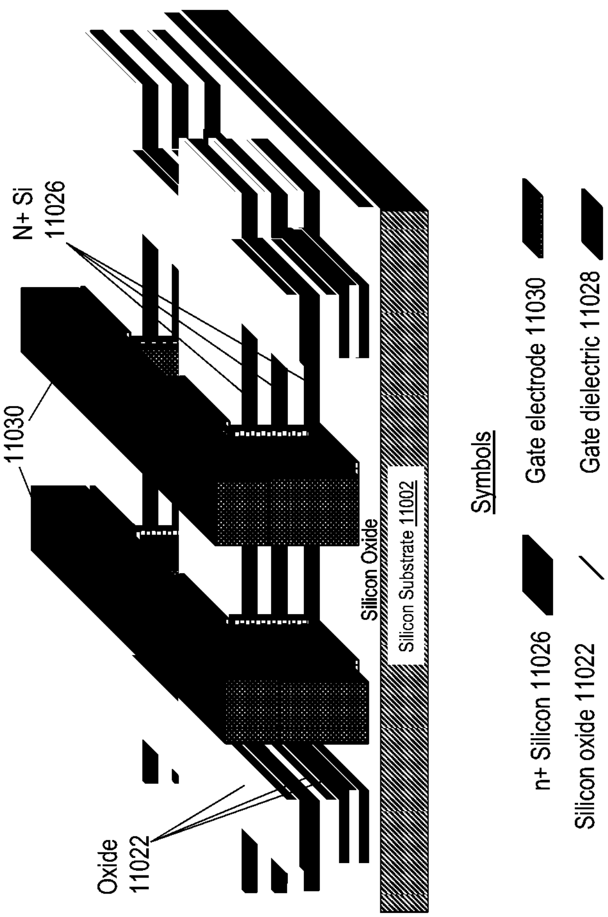

As illustrated in FIG. 110F, a gate dielectric and gate electrode material may be deposited, planarized with a chemical mechanical polish (CMP), and then lithographically defined and plasma/RIE etched to form gate dielectric regions 11028 which may either be self aligned to and covered by gate electrodes 11030 (shown), or cover the entire crystallized N+ silicon regions 11026 and oxide regions 11022 multi-layer structure. The gate stack including gate electrode 11030 and gate dielectric 11028 may be formed with a gate dielectric, such as thermal oxide, and a gate electrode material, such as poly-crystalline silicon. Alternatively, the gate dielectric may be an atomic layer deposited (ALD) material that is paired with a work function specific gate metal according to an industry standard of high k metal gate process schemes described previously. Additionally, the gate dielectric may be formed with a rapid thermal oxidation (RTO), a low temperature oxide deposition or low temperature microwave plasma oxidation of the silicon surfaces and then a gate electrode such as tungsten or aluminum may be deposited.

Figure 110G:
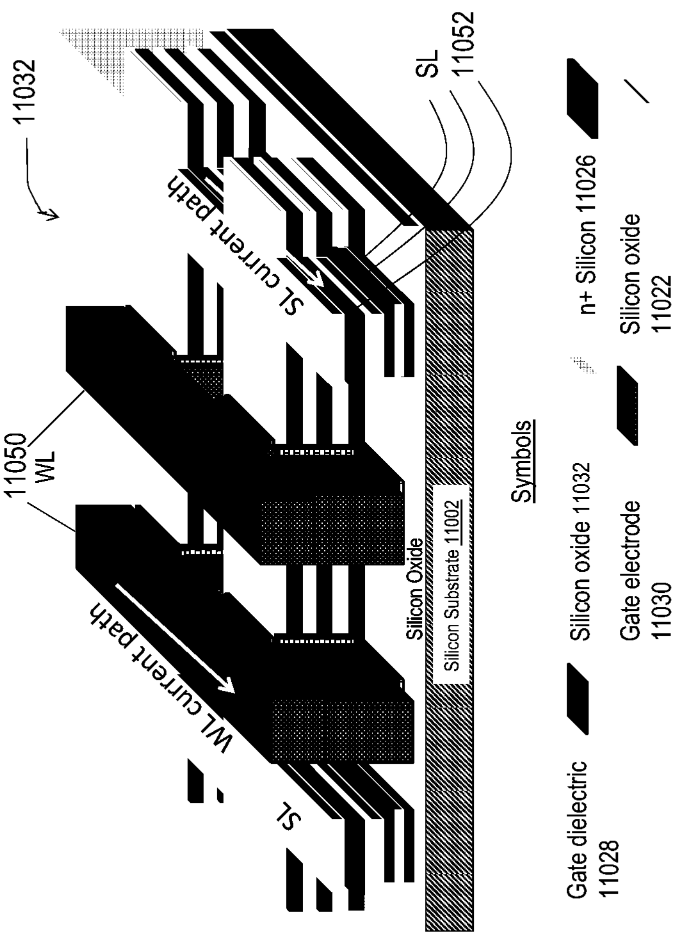

As illustrated in FIG. 110G, the entire structure may be covered with a gap fill oxide 11032, which may be planarized with chemical mechanical polishing. The oxide 11032 is shown transparently in the figure for clarity, along with word-line regions (WL) 11050, coupled with and composed of gate electrodes 11030, and source-line regions (SL) 11052, composed of crystallized N+ silicon regions 11026.

Figure 110H:
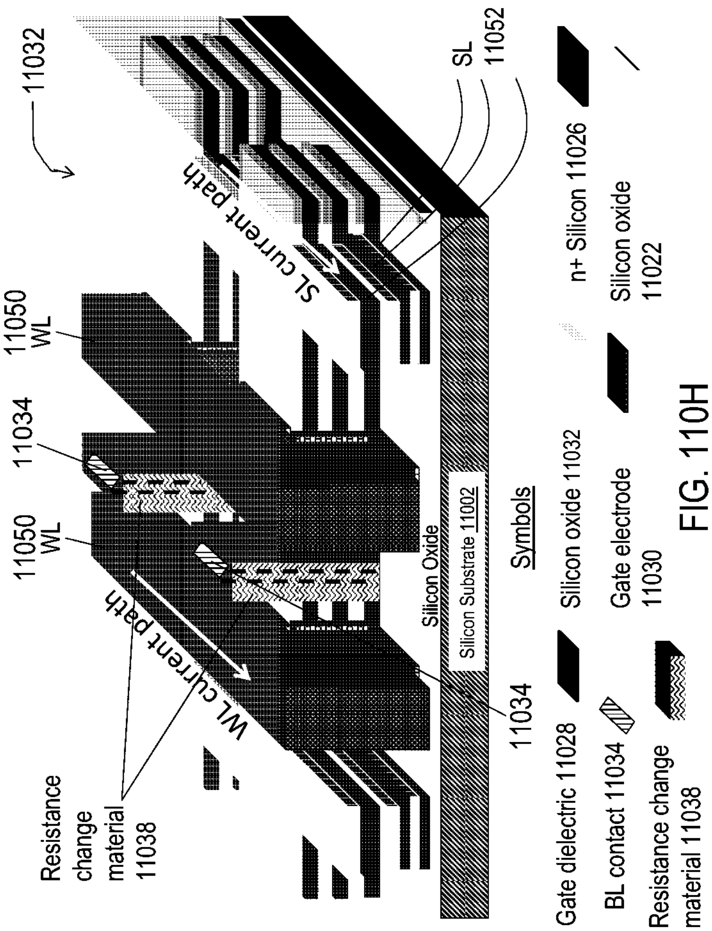

As illustrated in FIG. 110H, bit-line (BL) contacts 11034 may be lithographically defined, etched along with plasma/RIE through oxide 11032, the three crystallized N+ silicon regions 11026, and the associated oxide vertical isolation regions to connect substantially all memory layers vertically. BL contacts 11034 may then be processed by a photoresist removal. Resistance change memory material 11038, such as hafnium oxides or titanium oxides, may then be deposited, preferably with atomic layer deposition (ALD). The electrode for the resistance change memory element may then be deposited by ALD to form the electrode/BL contact 11034. The excess deposited material may be polished to planarity at or below the top of oxide 11032. Each BL contact 11034 with resistive change material 11038 may be shared among substantially all layers of memory, shown as three layers of memory in FIG. 110H.

Figure 110I:
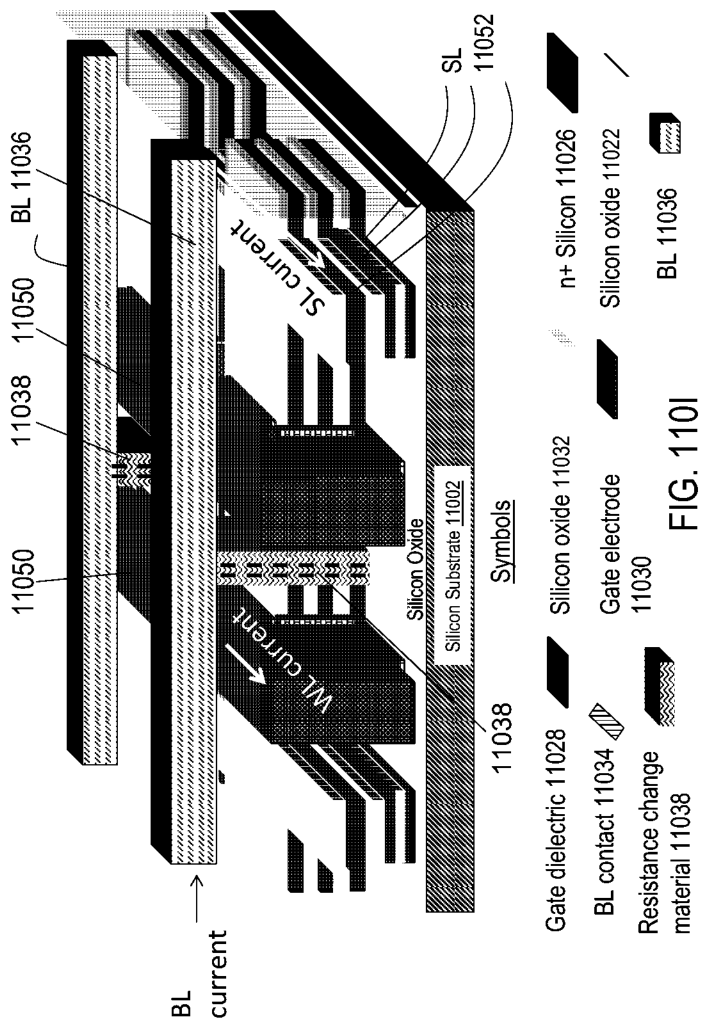

As illustrated in FIG. 110I, BL metal lines 11036 may be formed and connected to the associated BL contacts 11034 with resistive change material 11038. Contacts and associated metal interconnect lines (not shown) may be formed for the WL and SL at the memory array edges.

Figure 110J:
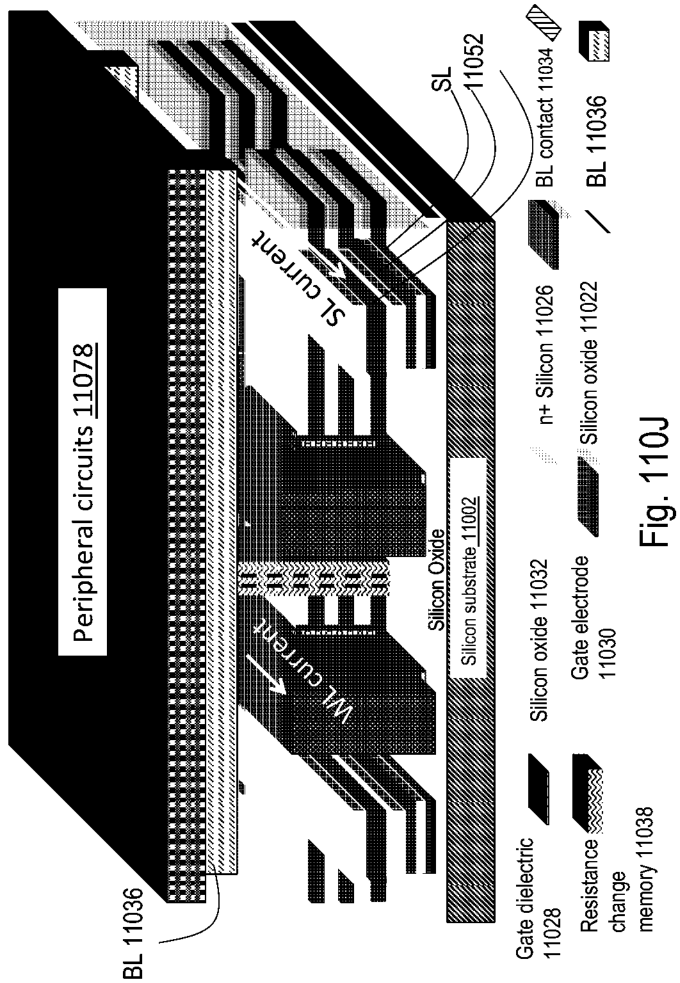

As illustrated in FIG. 110J, peripheral circuits 11078 may be constructed and then layer transferred, using methods described previously such as, for example, ion-cut with replacement gates, to the memory array, and then thru layer vias (not shown) may be formed to electrically couple the periphery circuitry to the memory array BL, WL, SL and other connections such as, for example, power and ground. Alternatively, the periphery circuitry may be formed and directly aligned to the memory array and silicon substrate 11002 utilizing the layer transfer of wafer sized doped layers and subsequent processing, such as, for example, the junction-less, RCAT, V-groove, or bipolar transistor formation flows as previously described.

This flow may enable the formation of a resistance-based multi-layer or 3D memory array with zero additional masking steps per memory layer, which utilizes poly-crystalline silicon junction-less transistors and has a resistance-based memory element in series with a select transistor, and is constructed by layer transfers of wafer sized doped poly-crystalline silicon layers, and this 3D memory array may be connected to an overlying multi-metal layer semiconductor device or periphery circuitry.

Persons of ordinary skill in the art will appreciate that the illustrations in FIGS. 110A through 110J are exemplary only and are not drawn to scale. Such skilled persons will further appreciate that many variations are possible such as, for example, the RTAs and/or optical anneals of the N+ doped poly-crystalline or amorphous silicon layers 11006 as described for FIG. 110D may be performed after each Si/SiO2 layer is formed in FIG. 110C. Additionally, N+ doped poly-crystalline or amorphous silicon layer 11006 may be doped P+, or with a combination of dopants and other polysilicon network modifiers to enhance the RTA or optical annealing crystallization and subsequent crystallization, and lower the N+ silicon layer 11016 resistivity. Moreover, doping of each crystallized N+ layer may be slightly different to compensate for interconnect resistances. Besides, each gate of the double gated 3D resistance based memory can be independently controlled for better control of the memory cell. Furthermore, by proper choice of materials for memory layer transistors and memory layer wires (e.g., by using tungsten and other materials that withstand high temperature processing for wiring), standard CMOS transistors may be processed at high temperatures (e.g., >700° C.) to form the periphery circuitry 11078. Many other modifications within the scope of the invention will suggest themselves to such skilled persons after reading this specification. Thus the invention is to be limited only by the appended claims.

An alternative embodiment of this invention may be a monolithic 3D DRAM we call NuDRAM. It may utilize layer transfer and cleaving methods described in this document. It may provide high-quality single crystal silicon at low effective thermal budget, leading to considerable advantage over prior art.

One embodiment of this invention may be constructed with the process flow depicted in FIG. 88(A)-(F). FIG. 88(A) describes the first step in the process. A p− wafer 8801 may be implanted with n type dopant to form an n+ layer 8802, following which an RTA may be performed. Alternatively, the n+ layer 8802 may be formed by epitaxy.

FIG. 88(B) shows the next step in the process. Hydrogen may be implanted into the wafer at a certain depth in the p− region 8801. Final position of the hydrogen is depicted by the dotted line 8803.

FIG. 88(C) describes the next step in the process. The wafer may be attached to a temporary carrier wafer 8804 using an adhesive. For example, one could use a polyimide adhesive from Dupont for this purpose along with a temporary carrier wafer 8804 made of glass. The wafer may then be cleaved at the hydrogen plane 8803 using any cleave method described in this document. After cleave, the cleaved surface is polished with CMP and an oxide 8805 is deposited on this surface. The structure of the wafer after substantially all these processes are carried out is shown in FIG. 88(C).

FIG. 88(D) illustrates the next step in the process. A wafer with DRAM peripheral circuits 8806 such as sense amplifiers, row decoders, etc. may now be used as a base on top of which the wafer in FIG. 88(C) is bonded, using oxide-to-oxide bonding at surface 8807. The temporary carrier 8804 may then be removed. Then, a step of masking, etching, and oxidation may be performed, to define rows of diffusion, isolated by oxide similarly to 8905 of FIG. 89 (B). The rows of diffusion and isolation may be aligned with the underlying peripheral circuits 8806. After forming isolation regions, RCATs may be constructed by etching, and then depositing gate dielectric 8809 and gate electrode 8808. This procedure is further explained in the descriptions for FIG. 67. The gate electrode mask may be aligned to the underlying peripheral circuits 8806. An oxide layer 8810 may be deposited and polished with CMP.

FIG. 88(E) shows the next step of the process. A second RCAT layer 8812 may be formed atop the first RCAT layer 8811 using steps similar to FIG. 88(A)-(D). These steps could be repeated multiple times to form the desired multilayer 3D DRAM.

Figure 88:
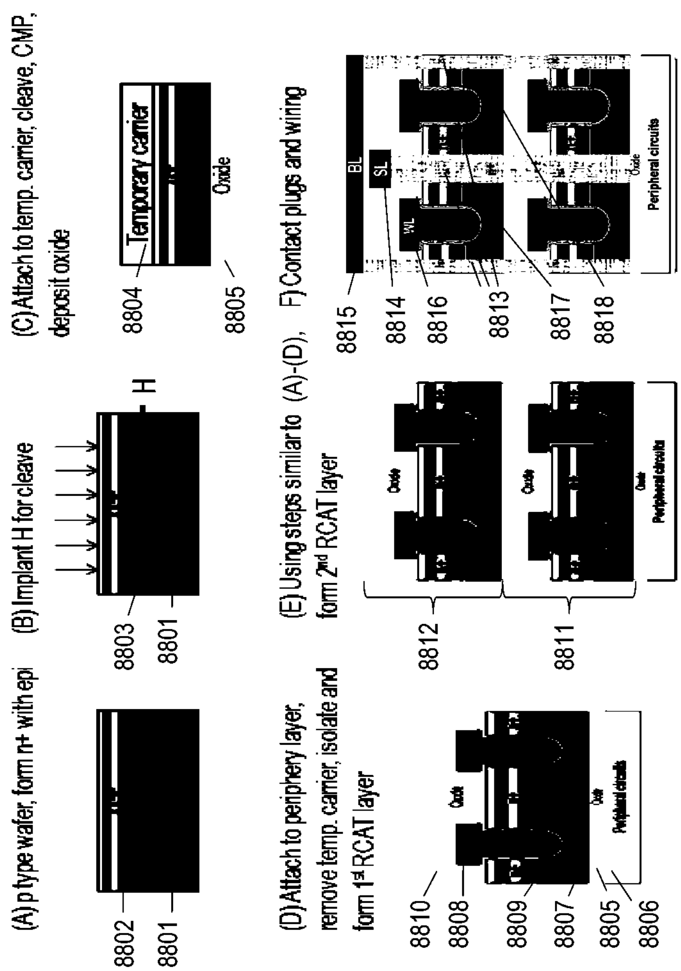
FIG. 88 A-F are drawing illustrations of a formation of 3D DRAM.
Figure 89:
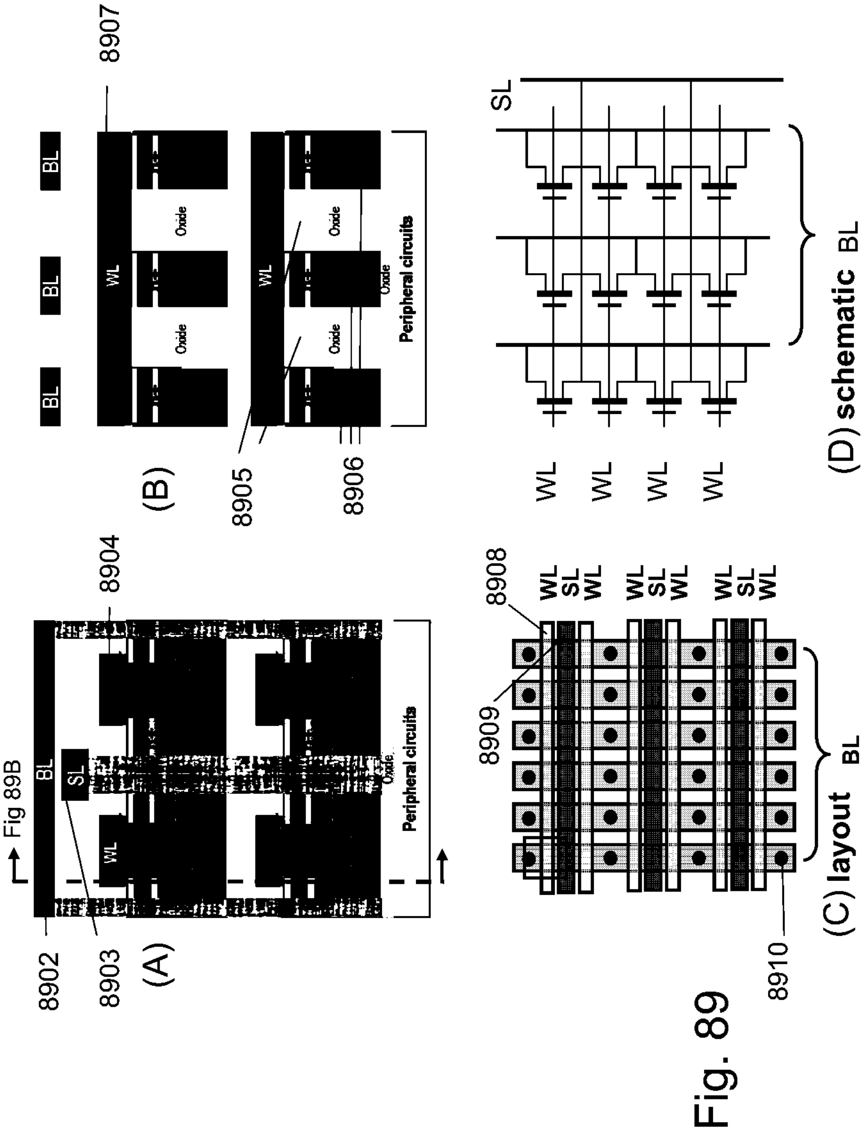
FIG. 89 A-D are drawing illustrations of a formation of 3D DRAM.

The next step of the process is described with respect to FIG. 88(F). Via holes may be etched to source 8814 and drain 8815 through substantially all of the layers of the stack. As this step is also performed in alignment with the peripheral circuits 8806, an etch stop could be designed or no vulnerable element should be placed underneath the designated etch locations. This is similar to a conventional DRAM array wherein the gates 8816 of multiple RCAT transistors are connected by poly line or metal line perpendicular to the plane of the illustration in FIG. 88. This connection of gate electrodes may form the word-line, similar to that illustrated in FIG. 89A-D. The layout may spread the word-lines of the multilayer DRAM structure so that for each layer there may be one vertical contact hole connection to allow peripheral circuits 8806 to control each layer's word-line independently. Via holes may then be filled with heavily doped polysilicon 8813. The heavily doped polysilicon 8813 may be constructed using a low temperature (below 400° C.) process such as PECVD. The heavily doped polysilicon 8813 may not only improve the contact of multiple sources, drains, and word-lines of the 3D DRAM, but also serve the purpose of separating adjacent p− layers 8817 and 8818. Alternatively, oxide may be utilized for isolation. Multiple layers of interconnects and vias may then be constructed to form Bit-Lines 8815 and Source-Lines 8814 to complete the DRAM array. While RCAT transistors are shown in FIG. 88, a process flow similar to FIG. 88A-F can be developed for other types of low-temperature processed stackable transistors as well. For example, V-groove transistors and other transistors described in other embodiments of the current invention can be developed.

FIG. 89(A)-(D) show the side-views, layout, and schematic of one part of the NuDRAM array described in FIG. 88(A)-(F). FIG. 89(A) shows one particular cross-sectional view of the NuDRAM array. The Bit-Lines (BL) 8902 may run in a direction perpendicular to the word-lines (WL) 8904 and source-lines (SL) 8903.

A cross-sectional view taken along the plane indicated by the broken line as shown in FIG. 89(B). Oxide isolation regions 8905 may separate p− layers 8906 of adjacent transistors. WL 8907 may essentially comprise of gate electrodes of each transistor connected together.

A layout of this array is shown in FIG. 89(C). The WL wiring 8908 and SL wiring 8909 may be perpendicular to the BL wiring 8910. A schematic of the NuDRAM array (FIG. 89(D)) reveals connections for WLs, BLs and SLs at the array level.

Another variation embodiment of the current invention is described in FIG. 90(A)-(F). FIG. 90(A) describes the first step in the process. A p− wafer 9001 may include an n+ epi layer 9002 and a p− epi layer 9003 grown over the n+ epi layer. Alternatively, these layers could be formed with implant. An oxide layer 9004 may be grown or deposited over the wafer as well.

FIG. 90(B) shows the next step in the process. Hydrogen H+, or other atomic species, may be implanted into the wafer at a certain depth in the n+ region 9002. The final position of the hydrogen is depicted by the dotted line 9005.

FIG. 90(C) describes the next step in the process. The wafer may be flipped and attached to a wafer with DRAM peripheral circuits 9006 using oxide-to-oxide bonding. The wafer may then be cleaved at the hydrogen plane 9005 using low temperature (less than 400° C.) cleave methods described in this document. After cleave, the cleaved surface may be polished with CMP.

As shown in FIG. 90(D), a step of masking, etching, and low temperature oxide deposition may be performed, to define rows of diffusion, isolated by said oxide. Said rows of diffusion and isolation may be aligned with the underlying peripheral circuits 9006. After forming isolation regions, RCATs may be constructed with masking, etch, gate dielectric 9009 and gate electrode 9008 deposition. The procedure for this is explained in the description for FIG. 67. Said gates may be aligned to the underlying peripheral circuits 9006. An oxide layer 9010 may be deposited and polished with CMP.

FIG. 90(E) shows the next step of the process. A second RCAT layer 9012 may be formed atop the first RCAT layer 9011 using steps similar to FIG. 90(A)-(D). These steps could be repeated multiple times to form the desired multilayer 3D DRAM.

Figure 90:
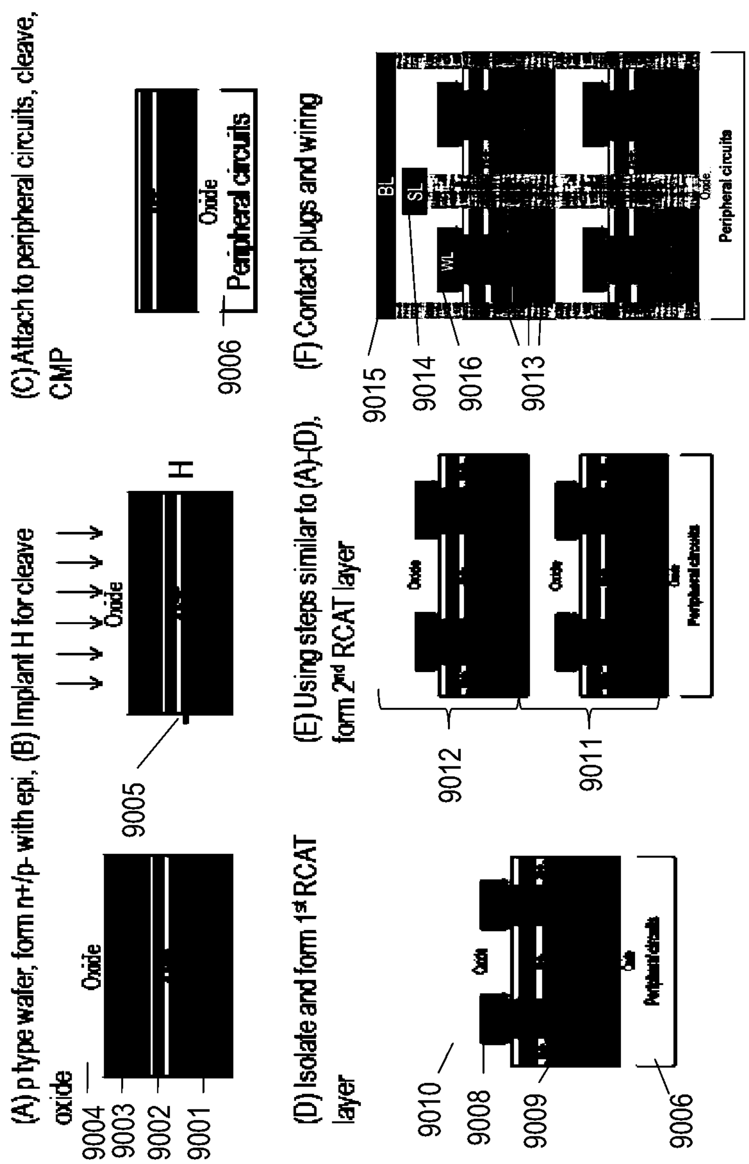
FIG. 90 A-F are drawing illustrations of a formation of 3D DRAM.

The next step of the process is described in FIG. 90(F). Via holes may be etched to the source and drain connections through substantially all of the layers in the stack, similar to a conventional DRAM array wherein the gate electrodes 9016 of multiple RCAT transistors are connected by poly line perpendicular to the plane of the illustration in FIG. 90. This connection of gate electrodes may form the word-line. The layout may spread the word-lines of the multilayer DRAM structure so that for each layer there may be one vertical hole to allow the peripheral circuit 9006 to control each layer word-line independently. Via holes may then be filled with heavily doped polysilicon 9013. The heavily doped silicon 9013 may be constructed using a low temperature process below 400° C. such as PECVD. Multiple layers of interconnects and vias may then be constructed to form bit-lines 9015 and source-lines 9014 to complete the DRAM array. Array organization of the NuDRAM described in FIG. 90 is similar to FIG. 89. While RCAT transistors are shown in FIG. 90, a process flow similar to FIG. 90 can be developed for other types of low-temperature processed stackable transistors as well. For example, V-groove transistors and other transistors previously described in other embodiments of this invention can be developed.

Yet another flow for constructing NuDRAMs is shown in FIG. 91A-L. The process description begins in FIG. 91A with forming shallow trench isolation 9102 in an SOI p− wafer 9101. The buried oxide layer is indicated as 9119.

Figure 91A:
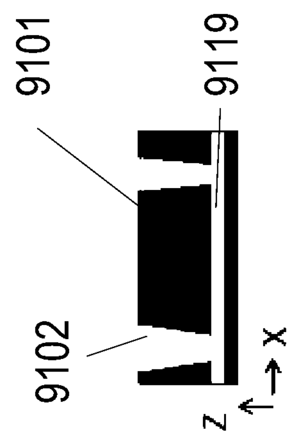
FIG. 91A-L are drawing illustrations of a formation of 3D DRAM.
Figure 91B:
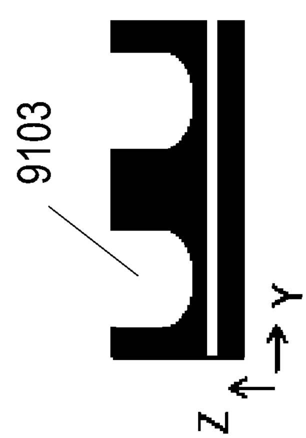

Following this, a gate trench etch 9103 may be performed as illustrated in FIG. 91B. FIG. 91B shows a cross-sectional view of the NuDRAM in the YZ plane, compared to the XZ plane for FIG. 91A (therefore the shallow trench isolation 9102 is not shown in FIG. 91B).

Figure 91C:
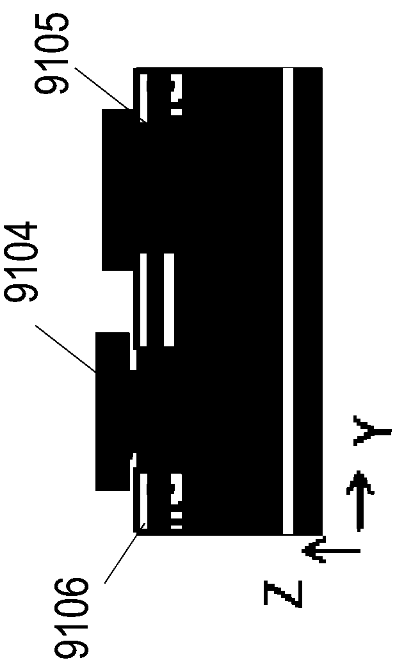

The next step in the process is illustrated in FIG. 91C. A gate dielectric layer 9105 may be formed and the RCAT gate electrode 9104 may be formed using procedures similar to FIG. 67E. Ion implantation may then be carried out to form source and drain n+ regions 9106.

Figure 91D:
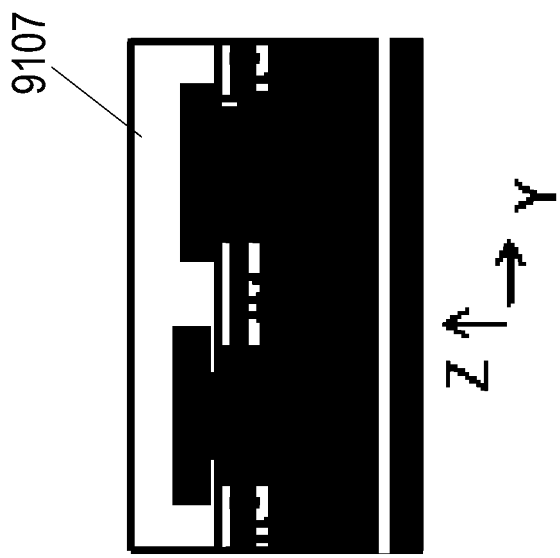

FIG. 91D shows an inter-layer dielectric 9107 formed and polished.

Figure 91E:
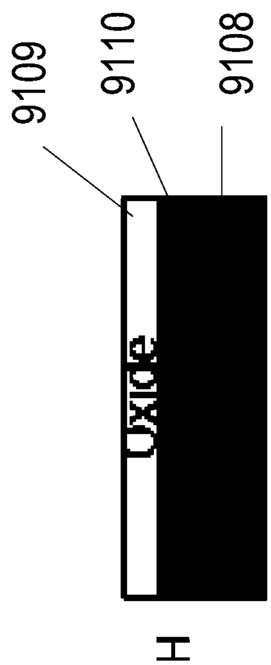

FIG. 91E reveals the next step in the process. Another p− wafer 9108 may be taken, an oxide 9109 may be grown on p− wafer 9108 following which hydrogen H+, or other atomic species, may be implanted at a certain depth 9110 for cleave purposes.

This "higher layer" 9108 may then be flipped and bonded to the lower wafer 9101 using oxide-to-oxide bonding. A cleave may then be performed at the hydrogen plane 9110, following which a CMP may be performed resulting in the structure as illustrated in FIG. 91F.

Figure 91F:
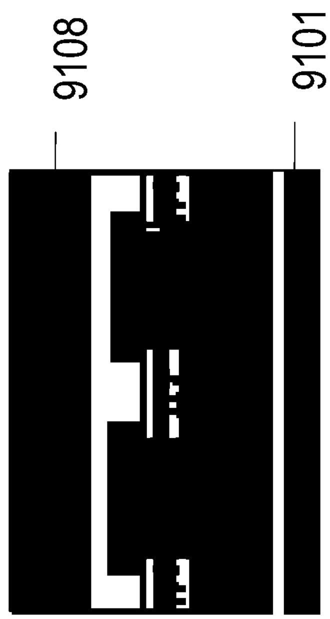
Figure 91G:
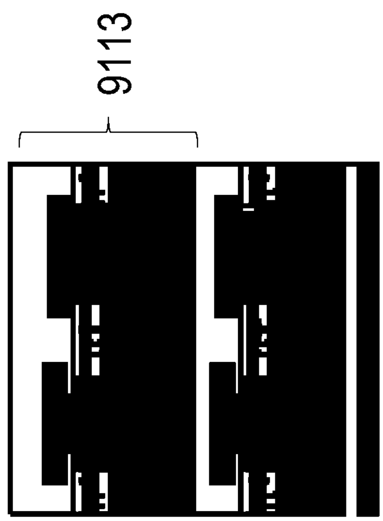

FIG. 91G shows the next step in the process. Another layer of RCATs 9113 may be constructed using procedures similar to those shown in FIG. 91B-D. This layer of RCATs may be aligned to features in the bottom wafer 9101.

Figure 91H:
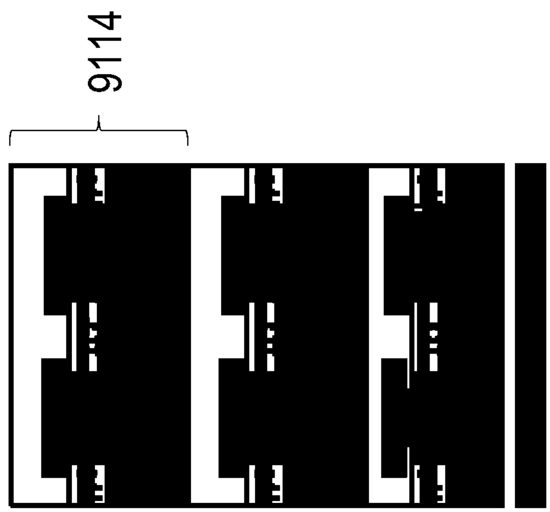

As shown in FIG. 91H, one or more layers of RCATs 9114 can then be constructed using procedures similar to those shown in FIG. 91E-G.

Figure 91I:
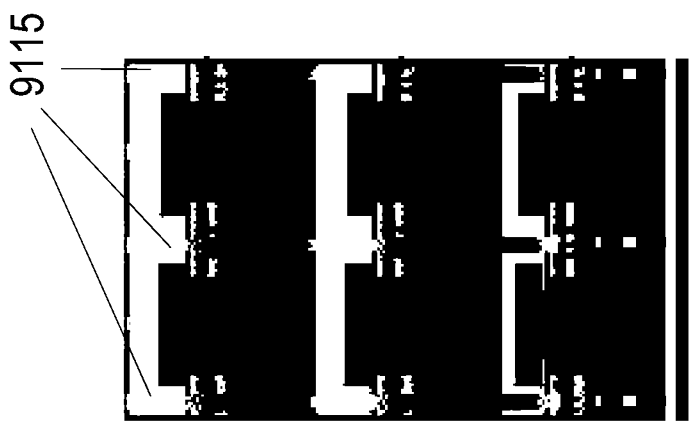

FIG. 91I illustrates vias 9115 being formed to different n+ regions and also to WL layers. These vias 9115 may be constructed with heavily doped polysilicon.

Figure 91J:
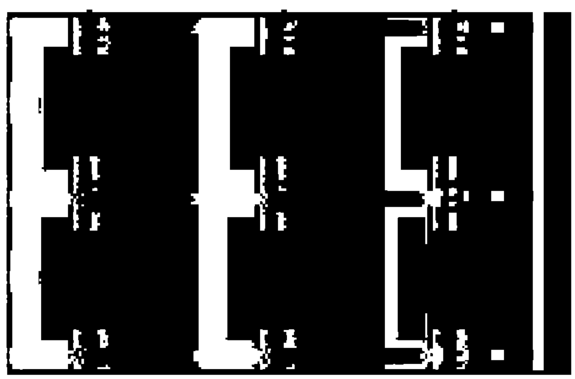

FIG. 91J shows the next step in the process where a Rapid Thermal Anneal (RTA) may be done to activate implanted dopants and to crystallize poly Si regions of substantially all layers.

Figure 91K:
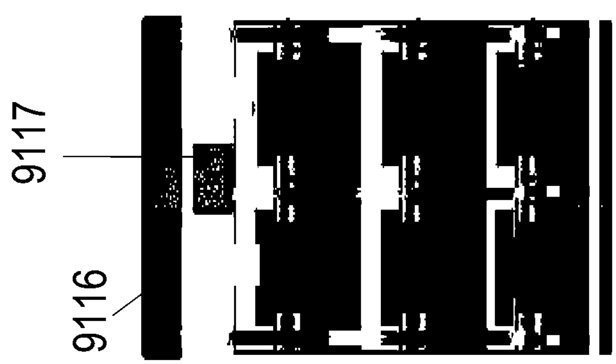

FIG. 91K illustrates bit-lines BLs 9116 and source-lines SLs 9117 being formed.

Figure 91L:
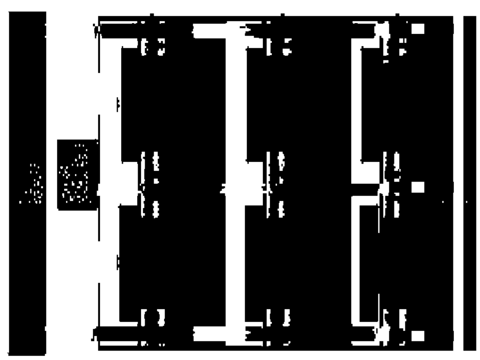

Following the formations of BLs 9116 and SL 9117, FIG. 91L shows a new layer of transistors and vias for DRAM peripheral circuits 9118 formed using procedures described previously (e.g., V-groove MOSFETs can be formed as described in FIG. 29A-G). These peripheral circuits 9118 may be aligned to the DRAM transistor layers below. DRAM transistors for this embodiment can be of any type (either high temperature (i.e., >400° C.) processed or low temperature (i.e., <400° C.) processed transistors), while peripheral circuits may be low temperature processed transistors since they are constructed after Aluminum or Copper wiring layers 9116 and 9117. Array architecture for the embodiment shown in FIG. 91 may be similar to the one indicated in FIG. 89.

A variation of the flow shown in FIG. 91A-L may be used as an alternative process for fabricating NuDRAMs. Peripheral circuit layers may first be constructed with substantially all steps complete for transistors except the RTA. One or more levels of tungsten metal may be used for local wiring of these peripheral circuits. Following this, multiple layers of RCATs may be constructed with layer transfer as described in FIG. 91, after which an RTA may be conducted. Highly conductive copper or aluminum wire layers may then be added for the completion of the DRAM flow. This flow reduces the fabrication cost by sharing the RTA, the high temperature steps, doing them once for substantially all crystallized layers and also allows the use of similar design for the 3D NuDRAM peripheral circuit as used in conventional 2D DRAM. For this process flow, DRAM transistors may be of any type, and are not restricted to low temperature etch-defined transistors such as RCAT or V-groove transistors.

Figure 92:
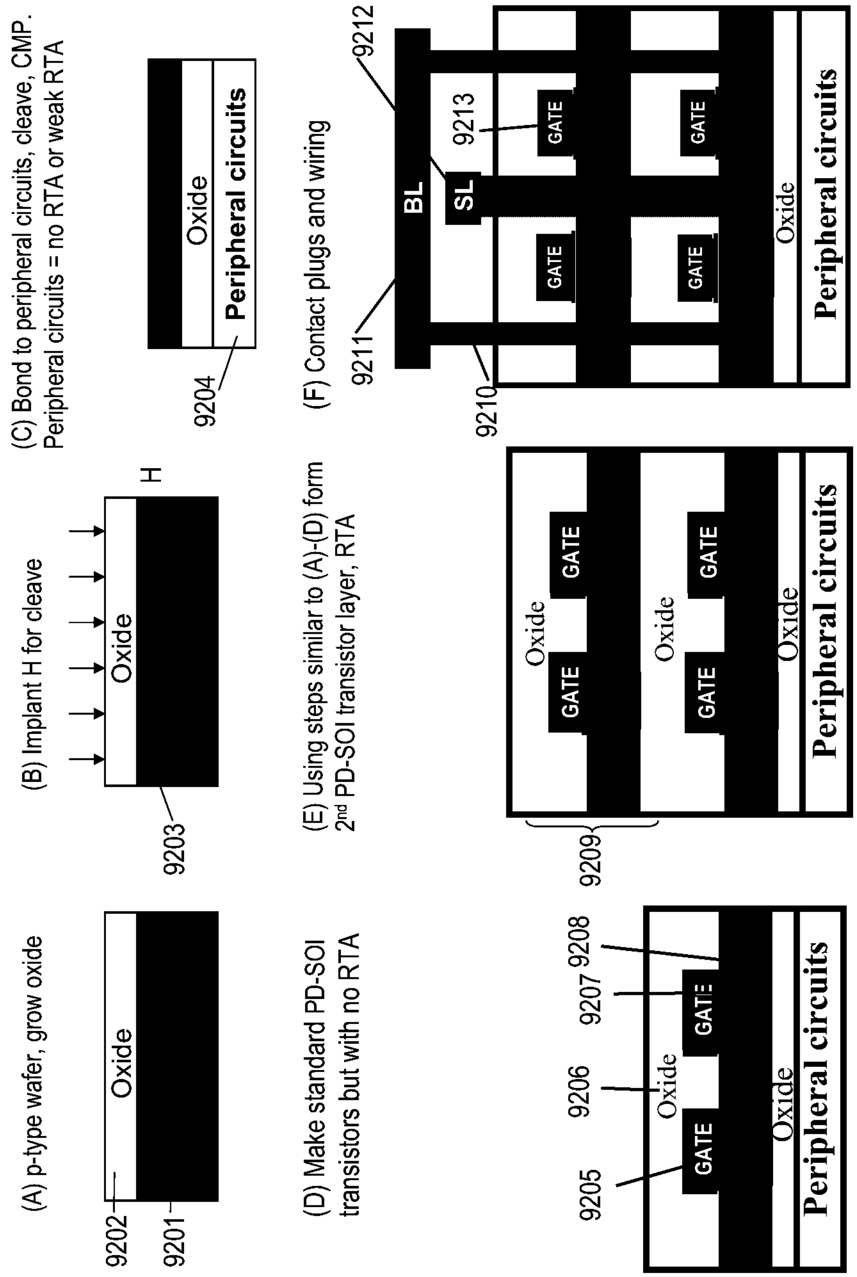
FIG. 92A-F are drawing illustrations of a formation of 3D DRAM.

An illustration of a NuDRAM constructed with partially depleted SOI transistors is given in FIG. 92A-F. FIG. 92A describes the first step in the process. A p− wafer 9201 may have an oxide layer 9202 grown over it. FIG. 92B shows the next step in the process. Hydrogen H+ may be implanted into the wafer at a certain depth in the p− region 9201. The final position of the hydrogen is depicted by the dotted line 9203. FIG. 92C describes the next step in the process. A wafer with DRAM peripheral circuits 9204 may be prepared. This wafer may have transistors that have not seen RTA processes. Alternatively, a weak or partial RTA for the peripheral circuits may be used. Multiple levels of tungsten interconnect to connect together transistors in 9204 are prepared. The wafer from FIG. 92B may be flipped and attached to the wafer with DRAM peripheral circuits 9204 using oxide-to-oxide bonding. The wafer may then be cleaved at the hydrogen plane 9203 using any cleave method described in this document. After cleave, the cleaved surface may be polished with CMP. FIG. 92D shows the next step in the process. A step of masking, etching, and low temperature oxide deposition may be performed, to define rows of diffusion, isolated by said oxide. Said rows of diffusion and isolation may be aligned with the underlying peripheral circuits 9204. After forming isolation regions, partially depleted SOI (PD-SOI) transistors may be constructed with formation of a gate dielectric 9207, a gate electrode 9205, and then patterning and etch of 9207 and 9205 followed by formation of ion implanted source/drain regions 9208. Note that no RTA may be done at this step to activate the implanted source/drain regions 9208. The masking step in FIG. 92D may be aligned to the underlying peripheral circuits 9204. An oxide layer 9206 may be deposited and polished with CMP. FIG. 92E shows the next step of the process. A second PD-SOI transistor layer 9209 may be formed atop the first PD-SOI transistor layer using steps similar to FIG. 92A-D. These may be repeated multiple times to form the desired multilayer 3D DRAM. An RTA to activate dopants and crystallize polysilicon regions in substantially all the transistor layers may then be conducted. The next step of the process is described in FIG. 92F. Via holes 9210 may be masked and may be etched to word-lines and source and drain connections through substantially all of the layers in the stack. Note that the gates of transistors 9213 are connected together to form word-lines in a similar fashion to FIG. 89. Via holes may then be filled with a metal such as tungsten. Alternatively, heavily doped polysilicon may be used. Multiple layers of interconnects and vias may be constructed to form Bit-Lines 9211 and Source-Lines 9212 to complete the DRAM array. Array organization of the NuDRAM described in FIG. 92 is similar to FIG. 89.

For the purpose of programming transistors, a single type of top transistor could be sufficient. Yet for logic type circuitry two complementing transistors might be helpful to allow CMOS type logic. Accordingly the above described various mono-type transistor flows could be performed twice. First perform substantially all the steps to build the 'n' type, and than do an additional layer transfer to build the 'p' type on top of it.

Figure 30:
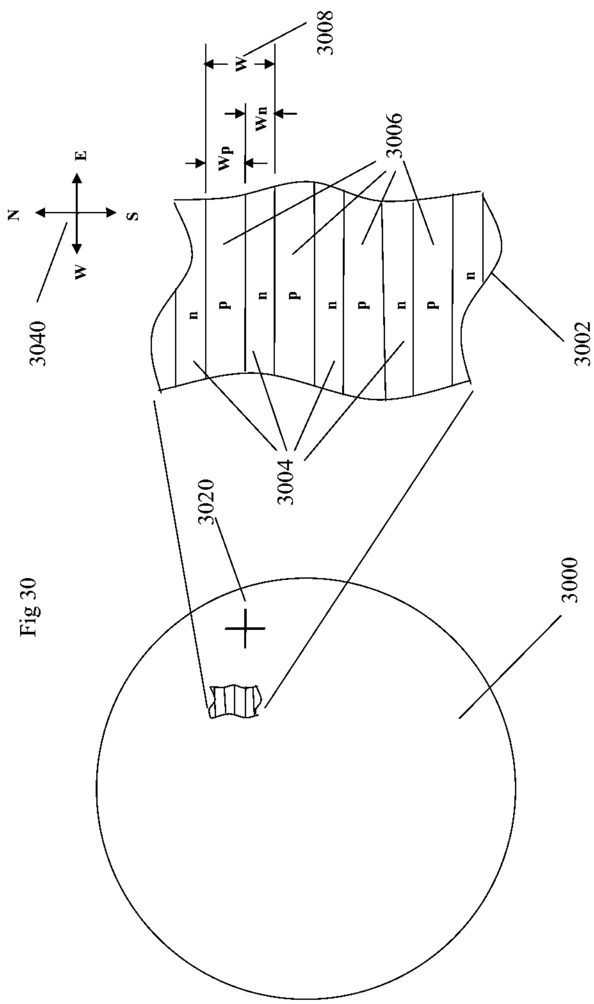
FIG. 30 is a drawing illustration of a donor wafer.

An additional alternative is to build both 'n' type and 'p' type transistors on the same layer. The challenge is to form these transistors aligned to the underlying layers 808. The innovative solution is described with the help of FIGS. 30 to 33. The flow could be applied to any transistor constructed in a manner suitable for wafer transfer including, but not limited to horizontal or vertical MOSFETs, JFETs, horizontal and vertical junction-less transistors, RCATs, Spherical-RCATs, etc. The main difference is that now the donor wafer 3000 is pre-processed to build not just one transistor type but both types by comprising alternating rows throughout donor wafer 3000 for the build of rows of 'n' type transistors 3004 and rows of 'p' type transistors 3006 as illustrated in FIG. 30. FIG. 30 also includes a four cardinal directions indicator 3040, which will be used through FIG. 33 to assist the explanation. The width of the n-type rows 3004 is Wn and the width of the p-type rows 3006 is Wp and their sum W 3008 is the width of the repeating pattern. The rows traverse from East to West and the alternating repeats substantially all the way from North to South. The donor wafer rows 3004 and 3006 may extend in length East to West by the acceptor die width plus the maximum donor wafer to acceptor wafer misalignment, or alternatively, may extend the entire length of a donor wafer East to West. In fact the wafer could be considered as divided into reticle projections which in most cases may contain a few dies per image or step field. In most cases, the scribe line designed for future dicing of the wafer to individual dies may be more than 20 microns wide. The wafer to wafer misalignment may be about 1 micron. Accordingly, extending patterns into the scribe line may allow full use of the patterns within the die boundaries with minimal effect on the dicing scribe lines. Wn and Wp could be set for the minimum width of the corresponding transistor plus its isolation in the selected process node. The wafer 3000 also has an alignment mark 3020 which is on the same layers of the donor wafer as the n 3004 and p 3006 rows and accordingly could be used later to properly align additional patterning and processing steps to said n 3004 and p 3006 rows.

The donor wafer 3000 will be placed on top of the main wafer 3100 for a layer transfer as described previously. The state of the art allows for very good angular alignment of this bonding step but it is difficult to achieve a better than approximately 1 □m position alignment.

Persons of ordinary skill in the art will appreciate that the directions North, South, East and West are used for illustrative purposes only, have no relationship to true geographic directions, that the North-South direction could become the East-West direction (and vice versa) by merely rotating the wafer 90*o* and that the rows of 'n' type transistors 3004 and rows of 'p' type transistors 3006 could also run North-South as a matter of design choice with corresponding adjustments to the rest of the fabrication process. Such skilled persons will further appreciate that the rows of 'n' type transistors 3004 and rows of 'p' type transistors 3006 can have many different organizations as a matter of design choice. For example, the rows of 'n' type transistors 3004 and rows of 'p' type transistors 3006 can each comprise a single row of transistors in parallel, multiple rows of transistors in parallel, multiple groups of transistors of different dimensions and orientations and types (either individually or in groups), and different ratios of transistor sizes or numbers between the rows of 'n' type transistors 3004 and rows of 'p' type transistors 3006, etc. Thus the scope of the invention is to be limited only by the appended claims.

Figure 31:
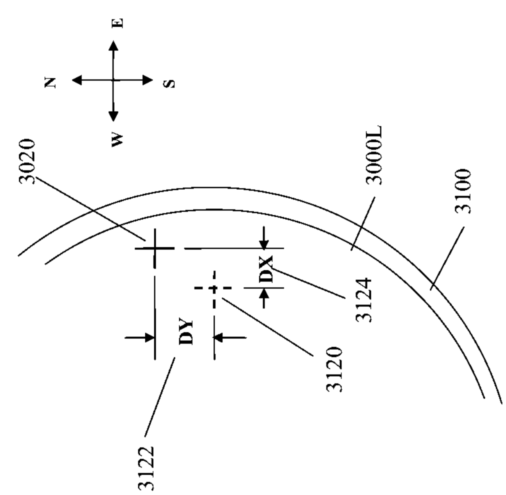
FIG. 31 is a drawing illustration of a transferred layer on top of a main wafer.

FIG. 31 illustrates the main wafer 3100 with its alignment mark 3120 and the transferred layer 3000L of the donor wafer 3000 with its alignment mark 3020. The misalignment in the East-West direction is DX 3124 and the misalignment in the North-South direction is DY 3122. For simplicity of the following explanations, the alignment marks 3120 and 3020 may be assumed set so that the alignment mark of the transferred layer 3020 is always north of the alignment mark of the base wafer 3120, though the cases where alignment mark 3020 is either perfectly aligned with (within tolerances) or south of alignment mark 3120 are handled in an appropriately similar manner. In addition, these alignment marks may be placed in only a few locations on each wafer, within each step field, within each die, within each repeating pattern W, or in other locations as a matter of design choice.

In the construction of this described monolithic 3D Integrated Circuits the objective is to connect structures built on layer 3000L to the underlying main wafer 3100 and to structures on 808 layers at about the same density and accuracy as the connections between layers in 808, which may need alignment accuracies on the order of tens of nm or better.

In the direction East-West the approach will be the same as was described before with respect to FIGS. 21 through 29. The pre-fabricated structures on the donor wafer 3000 are the same regardless of the misalignment DX 3124. Therefore just like before, the pre-fabricated structures may be aligned using the underlying alignment mark 3120 to form the transistors out of the rows of 'n' type transistors 3004 and rows of 'p' type transistors 3006 by etching and additional processes as described regardless of DX. In the North-South direction it is now different as the pattern does change. Yet the advantage of the proposed structure of the repeating pattern in the North-South direction of alternating rows illustrated in FIG. 30 arises from the fact that for every distance W 3008, the pattern repeats. Accordingly the effective alignment uncertainty may be reduced to W 3008 as the pattern in the North-South direction keeps repeating every W.

Figure 32:
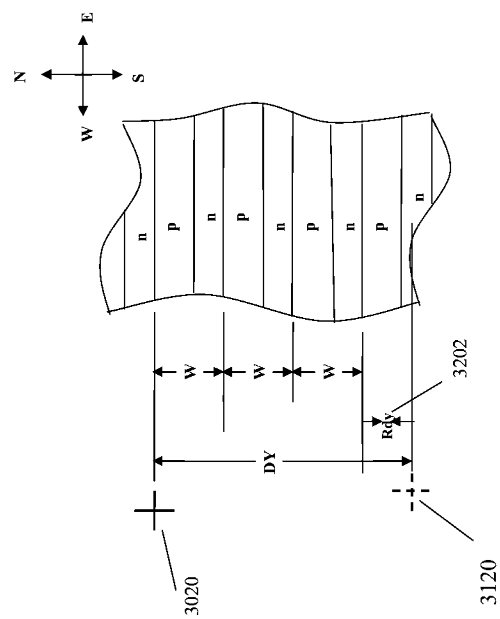
FIG. 32 is a drawing illustration of a measured alignment offset.

So the effective alignment uncertainty may be calculated as to how many Ws-full patterns of 'n' 3004 and 'p' 3006 row pairs would fit in DY 3122 and what would be the residue Rdy 3202 (remainder of DY modulo W, 0<=Rdy<W) as illustrated in FIG. 32. Accordingly, to properly align to the nearest n 3004 and p 3006 in the North-South direction, the alignment will be to the underlying alignment mark 3120 offset by Rdy 3202. Accordingly, the alignment may be done based on the misalignment between the alignment marks of the acceptor wafer alignment mark 3120 and the donor wafer alignment marks 3020 by taking into account the repeating distance W 3008 and calculating the resultant required of offset Rdy 3202. Alignment mark 3120, covered by the wafer 3000L during alignment, may be visible and usable to the stepper or lithographic tool alignment system when infra-red (IR) light and optics are being used.

Figure 69:
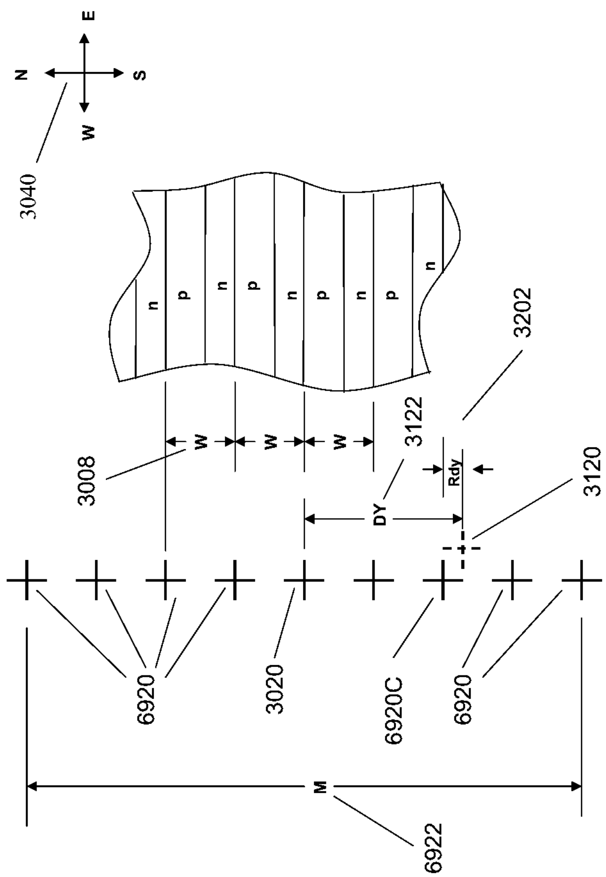
FIG. 69 is a drawing illustration of a donor wafer.

Alternatively, multiple alignment marks on the donor wafer could be used as illustrated in FIG. 69. The donor wafer alignment mark 3020 may be replicated precisely every W 6920 in the North to South direction for a distance to cover the full extent of potential North to South misalignment M 6922 between the donor wafer and the acceptor wafer. The residue Rdy 3202 may therefore be the North to South misalignment between the closest donor wafer alignment mark 6920C and the acceptor wafer alignment mark 3120. Accordingly, instead of alignment to the underlying alignment mark 3120 offset by Rdy 3202, alignment can be to the donor layer's closest alignment mark 6920C. Accordingly, the alignment may be done based on the misalignment between the alignment marks of the acceptor wafer alignment mark 3120 and the donor wafer alignment marks 6920 by choosing the closest alignment mark 6920C on the donor wafer.

The illustration in FIG. 69 was made to simplify the explanation, and in actual usage the alignment marks might take a larger area than W×W. In such a case, to avoid having the alignment marks 6920 overlapping each other, an offset could be used with proper marking to allow proper alignment.

Figure 33A:
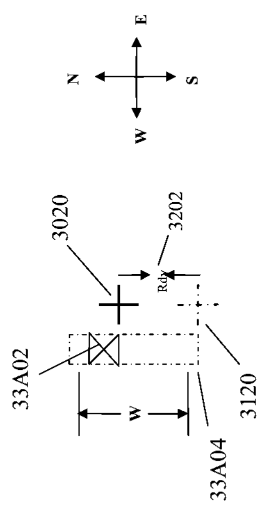
FIG. 33A, 33B is a drawing illustration of a connection strip.
Figure 33B:
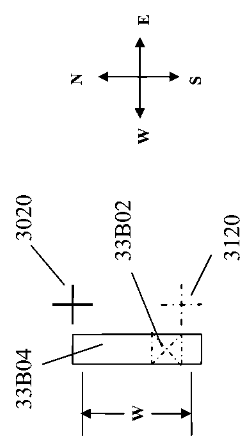

Each wafer that will be processed accordingly through this flow will have a specific Rdy 3202 which will be subject to the actual misalignment DY 3122. But the masks used for patterning the various patterns need to be pre-designed and fabricated and remain the same for substantially all wafers (processed for the same end-device) regardless of the actual misalignment. In order to improve the connection between structures on the transferred layer 3000L and the underlying main wafer 3100, the underlying wafer 3100 is designed to have a landing zone of a strip 33A04 going North-South of length W 3008 plus any extension necessary for the via design rules, as illustrated in FIG. 33A. The landing zone extension, in length or width, for via design rules may include compensation for angular misalignment due to the wafer to wafer bonding that is not compensated for by the stepper overlay algorithms, and may include uncompensated donor wafer bow and warp. The strip 33A04 may be part of the base wafer 3100 and accordingly aligned to its alignment mark 3120. Via 33A02 going down and being part of a top layer 3000L pattern (aligned to the underlying alignment mark 3120 with Rdy offset) will be connected to the landing zone 33A04.

Alternatively a North-South landing strip 33B04 with at least W length, plus extensions per the via design rules and other compensations described above, may be made on the upper layer 3000L and accordingly aligned to the underlying alignment mark 3120 with Rdy offset, thus connected to the via 33B02 coming 'up' and being part of the underlying pattern aligned to the underlying alignment mark 3120 (with no offset).

Figure 34A:
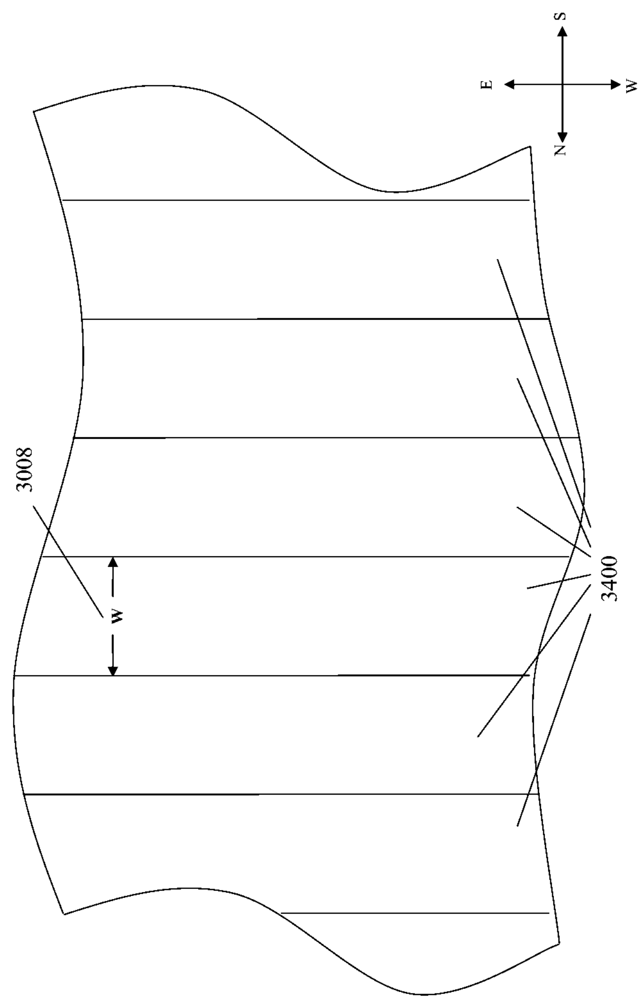
FIG. 34 A-E are drawing illustrations of pre-processed wafers used for a layer transfer.

An example of a process flow to create complementary transistors on a single transferred layer for CMOS logic is as follows. First, a donor wafer may be preprocessed to be prepared for the layer transfer. This complementary donor wafer may be specifically processed to create repeating rows 3400 of p and n wells whereby their combined widths is W 3008 as illustrated in FIG. 34A. Repeating rows 3400 may be as long as an acceptor die width plus the maximum donor wafer to acceptor wafer misalignment, or alternatively, may extend the entire length of a donor wafer. FIG. 34A may be rotated 90 degrees with respect to FIG. 30 as indicated by the four cardinal directions indicator, to be in the same orientation as subsequent FIGS. 34B through 35G.

Figures 34B, 34C, 34D:
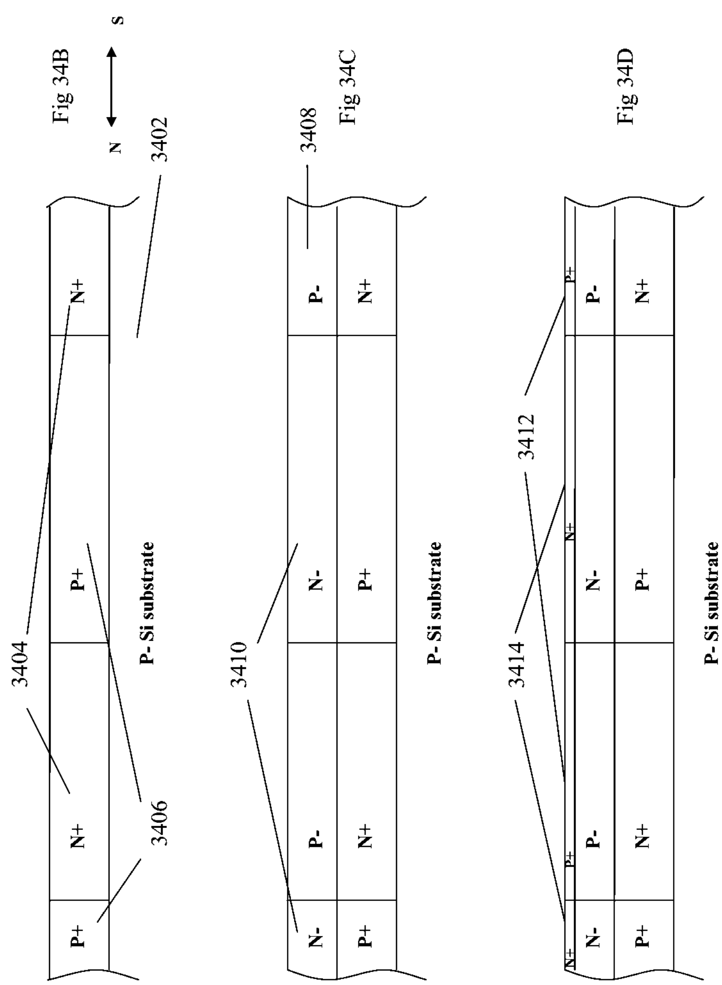

FIG. 34B is a cross-sectional drawing illustration of a pre-processed wafer used for a layer transfer. A P− wafer 3402 is processed to have a "buried" layer of N+ 3404 and of P+ 3406 by masking, ion implantation, and activation in repeated widths of W 3008.

This is followed by a P− epi growth (epitaxial growth) 3408 and a mask, ion implantation, and anneal of N− regions 3410 in FIG. 34C.

Next, a shallow P+ 3412 and N+ 3414 are formed by mask, shallow ion implantation, and RTA activation as shown in FIG. 34D.

Figure 34E:
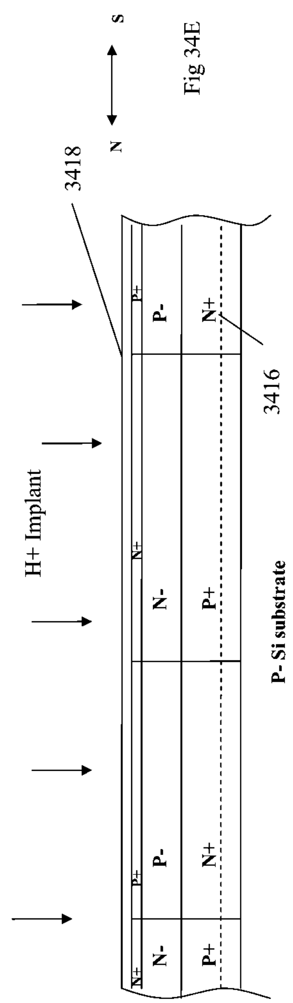

FIG. 34E is a drawing illustration of the pre-processed wafer for a layer transfer by an implant of an atomic species, such as H+, preparing the SmartCut "cleaving plane" 3416 in the lower part of the deep N+& P+ regions. A thin layer of oxide 3418 may be deposited or grown to facilitate the oxide-oxide bonding to the layer 808. This oxide 3418 may be deposited or grown before the H+ implant, and may comprise differing thicknesses over the P+ 3412 and N+ 3414 regions so as to allow an even H+ implant range stopping to facilitate a level and continuous Smart Cut cleave plane 3416. Adjusting the depth of the H+ implant if needed could be achieved in other ways including different implant depth setting for the P+ 3412 and N+ 3414 regions.

Figures 35A, 35B, 35C:
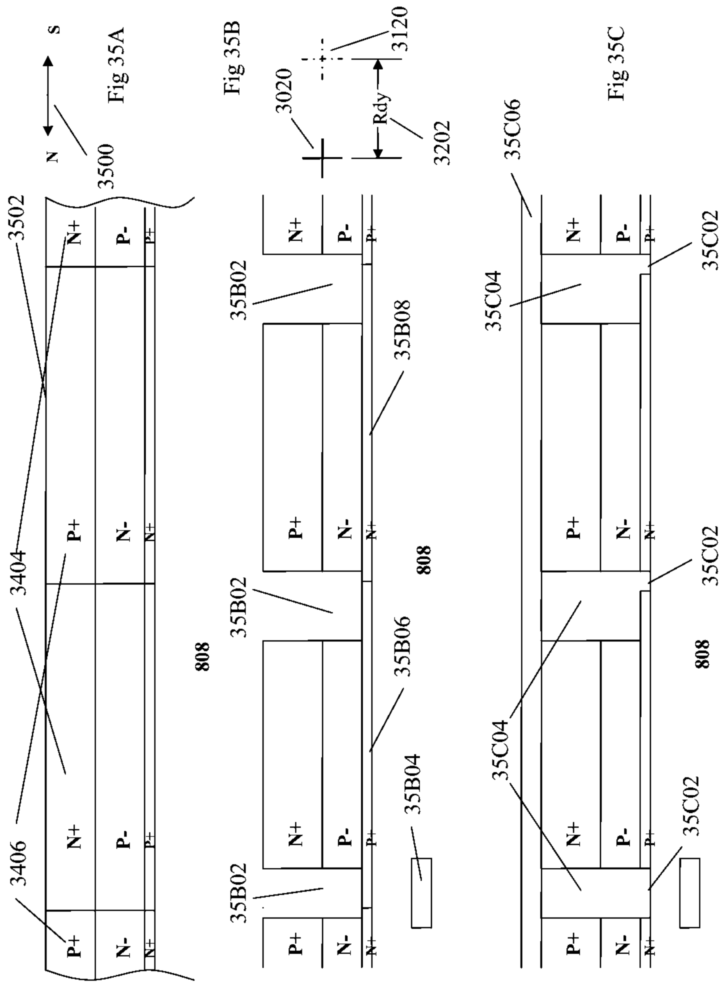
FIG. 35 A-G are drawing illustrations of formations of top planar transistors.

Now a layer-transfer-flow is performed, as illustrated in FIG. 20, to transfer the pre-processed striped multi-well single crystal silicon wafer on top of 808 as shown in FIG. 35A. The cleaved surface 3502 may or may not be smoothed by a combination of CMP and chemical polish techniques.

A variation of the p & n well stripe donor wafer preprocessing above is to also preprocess the well isolations with shallow trench etching, dielectric fill, and CMP prior to the layer transfer.

The step by step low temperature formation side views of the planar CMOS transistors on the complementary donor wafer (FIG. 34) is illustrated in FIGS. 35A to 35G. FIG. 35A illustrates the layer transferred on top of wafer or layer 808 after the smart cut 3502 wherein the N+ 3404 & P+ 3406 are on top running in the East to West direction (i.e., perpendicular to the plane of the drawing) and repeating widths in the North to South direction as indicated by cardinal 3500.

Then the substrate P+ 35B06 and N+ 35B08 source and 808 metal layer 35B04 access openings, as well as the transistor isolation 35B02 are masked and etched in FIG. 35B. This and substantially all subsequent masking layers are aligned as described and shown above in FIGS. 30-32 and is illustrated in FIG. 35B where the layer alignment mark 3020 is aligned with offset Rdy to the base wafer layer 808 alignment mark 3120.

Utilizing an additional masking layer, the isolation region 35C02 is defined by etching substantially all the way to the top of preprocessed wafer or layer 808 to provide full isolation between transistors or groups of transistors in FIG. 35C. Then a Low-Temperature Oxide 35C04 is deposited and chemically mechanically polished. Then a thin polish stop layer 35C06 such as low temperature silicon nitride is deposited resulting in the structure illustrated in FIG. 35C.

Figures 35D, 35E, 35F:
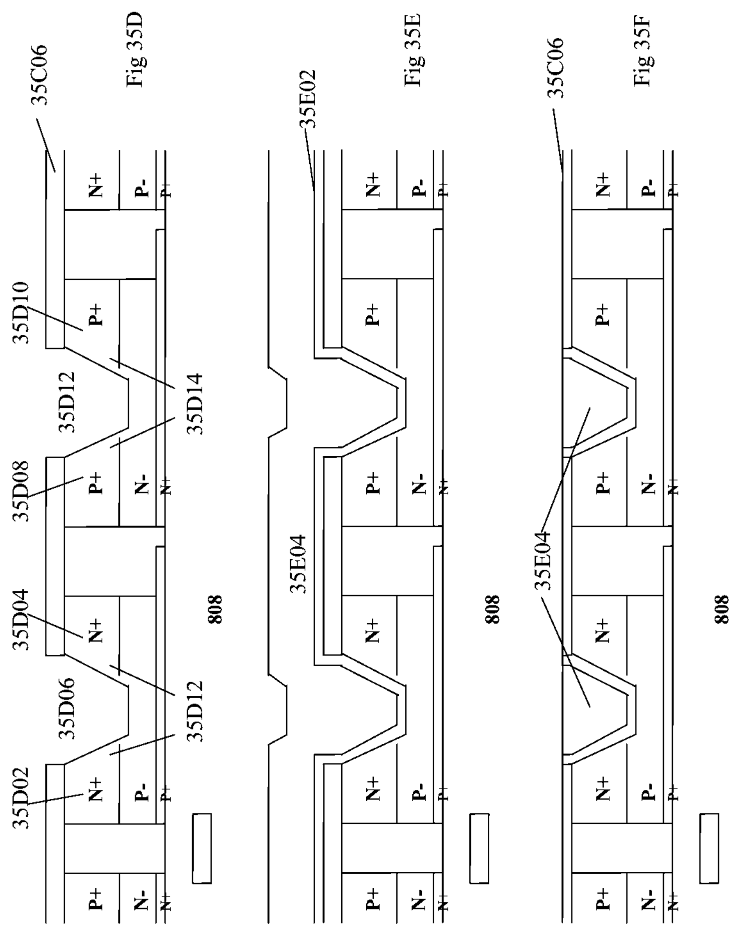

The n-channel source 35D02, drain 35D04 and self-aligned gate 35D06 are defined by masking and etching the thin polish stop layer 35C06 and then a sloped N+ etch as illustrated in FIG. 35D. The above is repeated on the P+ to form the p-channel source 35D08, drain 35D10 and self-aligned gate 35D12 to create the complementary devices and form Complementary Metal Oxide Semiconductor (CMOS). Both sloped (35-90 degrees, 45 is shown) etches may be accomplished with wet chemistry or plasma etching techniques. This etch forms N+ angular source and drain extensions 35D12 and P+ angular source and drain extension 35D14.

FIG. 35E illustrates the structure following deposition and densification of a low temperature based Gate Dielectric 35E02, or alternatively a low temperature microwave plasma oxidation of the silicon surfaces, to serve as the n & p MOSFET gate oxide, and then deposition of a gate material 35E04, such as aluminum or tungsten. Alternatively, a high-k metal gate structure may be formed as follows. Following an industry standard HF/SC1/SC2 clean to create an atomically smooth surface, a high-k dielectric 35E02 is deposited. The semiconductor industry has chosen Hafnium-based dielectrics as the leading material of choice to replace SiO2 and Silicon oxynitride. The Hafnium-based family of dielectrics includes hafnium oxide and hafnium silicate/hafnium silicon oxynitride. Hafnium oxide, HfO2, has a dielectric constant twice as much as that of hafnium silicate/hafnium silicon oxynitride (HfSiO/HfSiON k~15). The choice of the metal is critical for the device to perform properly. A metal replacing N+ poly as the gate electrode needs to have a work function of approximately 4.2 eV for the device to operate properly and at the right threshold voltage. Alternatively, a metal replacing P+ poly as the gate electrode needs to have a work function of approximately 5.2 eV to operate properly. The TiAl and TiAlN based family of metals, for example, could be used to tune the work function of the metal from 4.2 eV to 5.2 eV. The gate oxides and gate metals may be different between the n and p channel devices, and is accomplished with selective removal of one type and replacement of the other type.

Figure 35G:
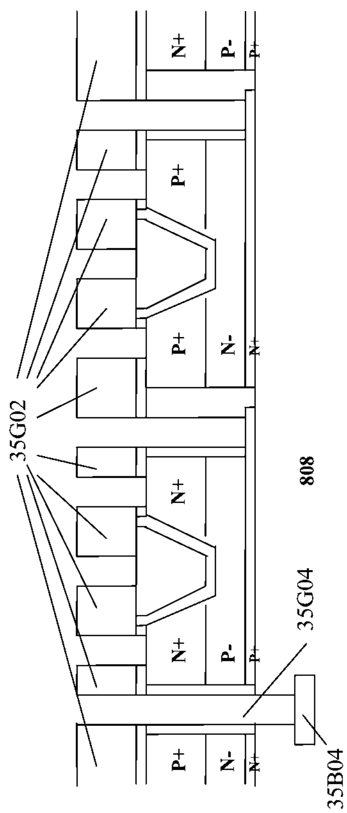

FIG. 35F illustrates the structure following a chemical mechanical polishing of the metal gate 35E04 utilizing the nitride polish stop layer 35C06. Finally a thick oxide 35G02 is deposited and contact openings are masked and etched preparing the transistors to be connected as illustrated in FIG. 35G. This figure also illustrates the layer transfer silicon via 35G04 masked and etched to provide interconnection of the top transistor wiring to the lower layer 808 interconnect wiring 35B04. This flow enables the formation of mono-crystalline top CMOS transistors that could be connected to the underlying multi-metal layer semiconductor device without exposing the underlying devices and interconnects metals to high temperature. These transistors could be used as programming transistors of the antifuse on layer 807 or for other functions such as logic or memory in a 3D integrated circuit that may be electrically coupled to metal layers in preprocessed wafer or layer 808. An additional advantage of this flow is that the SmartCut H+, or other atomic species, implant step is done prior to the formation of the MOS transistor gates avoiding potential damage to the gate function.

Persons of ordinary skill in the art will appreciate that while the transistors fabricated in FIGS. 34A through 35G are shown with their conductive channels oriented in a north-south direction and their gate electrodes oriented in an east-west direction for clarity in explaining the simultaneous fabrication of P-channel and N-channel transistors, that other orientations and organizations are possible. Such skilled persons will further appreciate that the transistors may be rotated 90° with their gate electrodes oriented in a north-south direction. For example, it will be evident to such skilled persons that transistors aligned with each other along an east-west row can either be electrically isolated from each other with Low-Temperature Oxide 35C04 or share source and drain regions and contacts as a matter of design choice. Such skilled persons will also realize that rows of 'n' type transistors 3004 may contain multiple N-channel transistors aligned in a north-south direction and rows of 'p' type transistors 3006 may contain multiple P-channel transistors aligned in a north-south direction, specifically to form back-to-back sub-rows of P-channel and N-channel transistors for efficient logic layouts in which adjacent sub-rows of the same type share power supply lines and connections. Many other design choices are possible within the scope of the invention and will suggest themselves to such skilled persons, thus the invention is to be limited only by the appended claims.

Alternatively, full CMOS devices may be constructed with a single layer transfer of wafer sized doped layers. The process flow will be described below for the case of n-RCATs and p-RCATs, but may apply to any of the above devices constructed out of wafer sized transferred doped layers.

As illustrated in FIGS. 95A to 95I, an n-RCAT and p-RCAT may be constructed in a single layer transfer of wafer sized doped layer with a process flow that is suitable for 3D IC manufacturing.

Figures 95A, 95B:
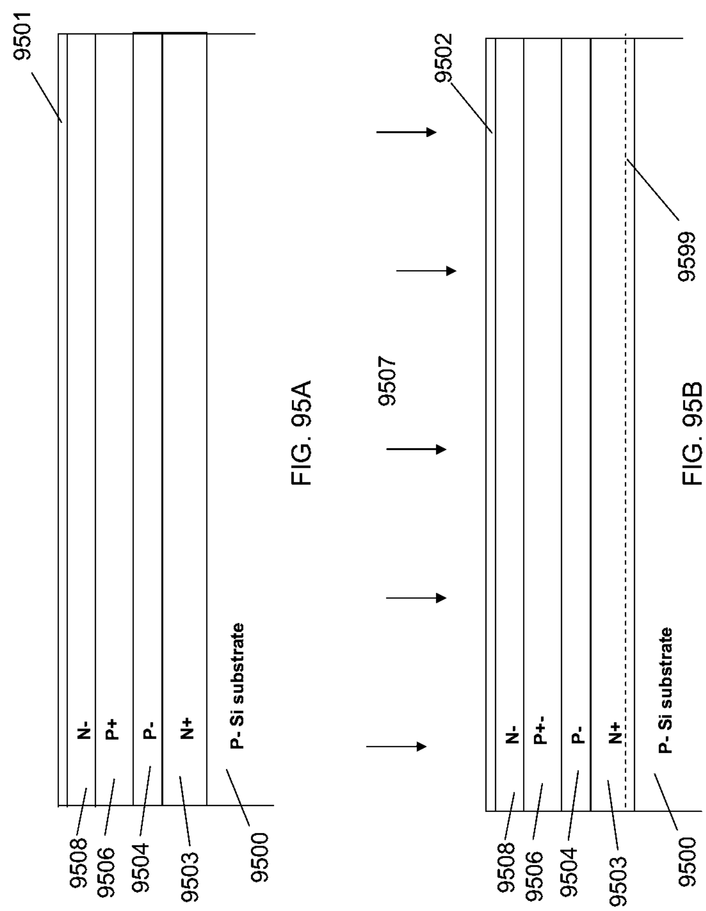

As illustrated in FIG. 95A, a P− substrate donor wafer 9500 may be processed to include four wafer sized layers of N+ doping 9503, P− doping 9504, P+ doping 9506, and N− doping 9508. The P− layer 9504 may have the same or a different dopant concentration than the P− substrate 9500. The four doped layers 9503, 9504, 9506, and 9508 may be formed by ion implantation and thermal anneal. The layer stack may alternatively be formed by successive epitaxially deposited doped silicon layers or by a combination of epitaxy and implantation and anneals. P− layer 9504 and N− layer 9508 may also have graded doping to mitigate transistor performance issues, such as short channel effects. A screen oxide 9501 may be grown or deposited before an implant to protect the silicon from implant contamination and to provide an oxide surface for later wafer to wafer bonding. These processes may be done at temperatures above 400° C. as the layer transfer to the processed substrate with metal interconnects has yet to be done.

As illustrated in FIG. 95B, the top surface of donor wafer 9500 may be prepared for oxide wafer bonding with a deposition of an oxide 9502 or by thermal oxidation of the N− layer 9508 to form oxide layer 9502, or a re-oxidation of implant screen oxide 9501. A layer transfer demarcation plane 9599 (shown as a dashed line) may be formed in donor wafer 9500 or N+ layer 9503 (shown) by hydrogen implantation 9507 or other methods as previously described. Both the donor wafer 9500 and acceptor wafer 9510 may be prepared for wafer bonding as previously described and then low temperature (less than approximately 400° C.) bonded. The portion of the N+ layer 9503 and the P− donor wafer substrate 9500 that are above the layer transfer demarcation plane 9599 may be removed by cleaving and polishing, or other low temperature processes as previously described. This process of an ion implanted atomic species, such as, for example, Hydrogen, forming a layer transfer demarcation plane, and subsequent cleaving or thinning, may be called 'ion-cut'. Acceptor wafer 9510 may have similar meanings as wafer 808 previously described with reference to FIG. 8.

Figure 95C:
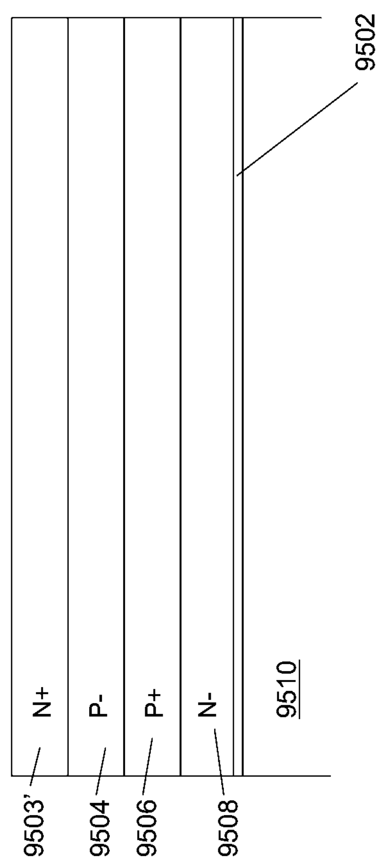

As illustrated in FIG. 95C, the remaining N+ layer 9503', P− doped layer 9504, P+ doped layer 9506, N− doped layer 9508, and oxide layer 9502 have been layer transferred to acceptor wafer 9510. The top surface of N+ layer 9503' may be chemically or mechanically polished smooth and flat. Now multiple transistors may be formed with low temperature (less than approximately 400° C.) processing and aligned to the acceptor wafer 9510 alignment marks (not shown). For illustration clarity, the oxide layers, such as 9502, used to facilitate the wafer to wafer bond are not shown in subsequent drawings.

Figure 95D:
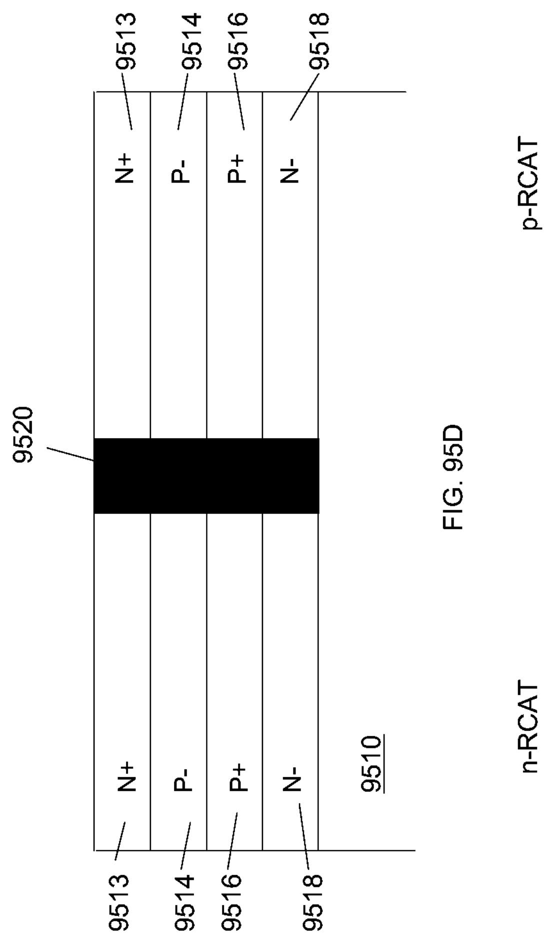

As illustrated in FIG. 95D the transistor isolation region may be lithographically defined and then formed by plasma/RIE etch removal of portions of N+ doped layer 9503', P− doped layer 9504, P+ doped layer 9506, and N− doped layer 9508 to at least the top oxide of acceptor substrate 9510. Then a low-temperature gap fill oxide may be deposited and chemically mechanically polished, remaining in transistor isolation region 9520. Thus formed are future RCAT transistor regions N+ doped 9513, P− doped 9514, P+ doped 9516, and N− doped 9518.

Figure 95E:
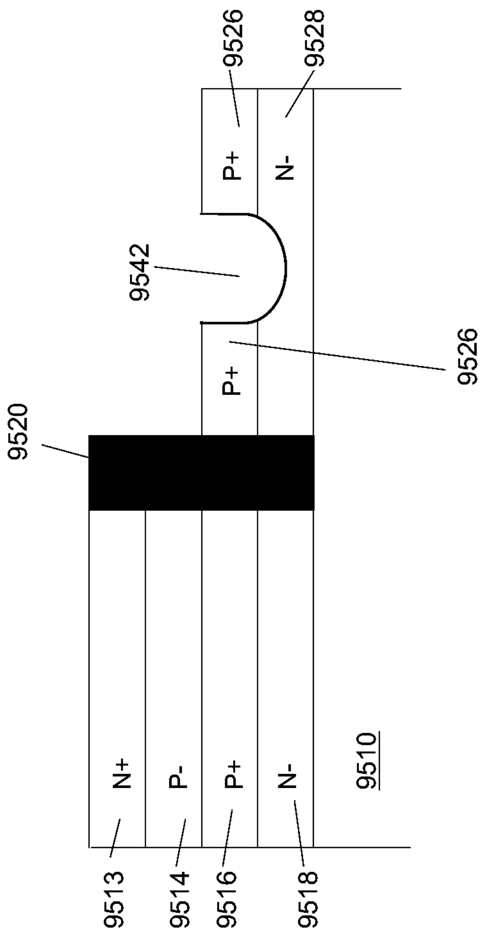

As illustrated in FIG. 95E the N+ doped region 9513 and P− doped region 9514 of the p-RCAT portion of the wafer are lithographically defined and removed by either plasma/RIE etch or a selective wet etch. Then the p-RCAT recessed channel 9542 may be mask defined and etched. The recessed channel surfaces and edges may be smoothed by wet chemical or plasma/RIE etching techniques to mitigate high field effects. These process steps form P+ source and drain regions 9526 and N transistor channel region 9528.

Figure 95F:
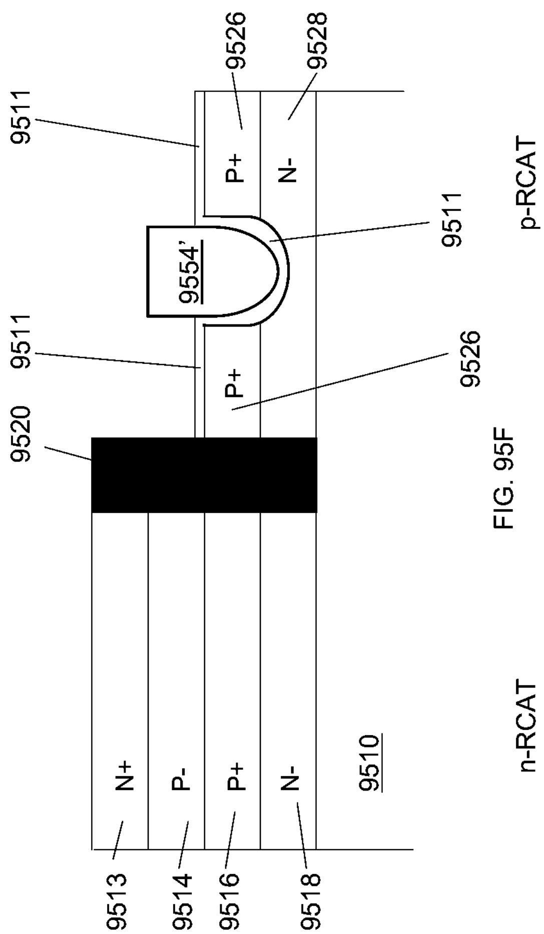

As illustrated in FIG. 95F, a gate oxide 9511 may be formed and a gate metal material may be deposited. The gate oxide 9511 may be an atomic layer deposited (ALD) gate dielectric that is paired with a work function specific gate metal according to an industry standard of high k metal gate process schemes described previously and targeted for an p-channel RCAT utility. Alternatively, the gate oxide 9511 may be formed with a low temperature oxide deposition or low temperature microwave plasma oxidation of the silicon surfaces and then a gate material such as platinum or aluminum may be deposited. Then the gate material may be chemically mechanically polished, and the p-RCAT gate electrode 9554' defined by masking and etching.

Figure 95G:
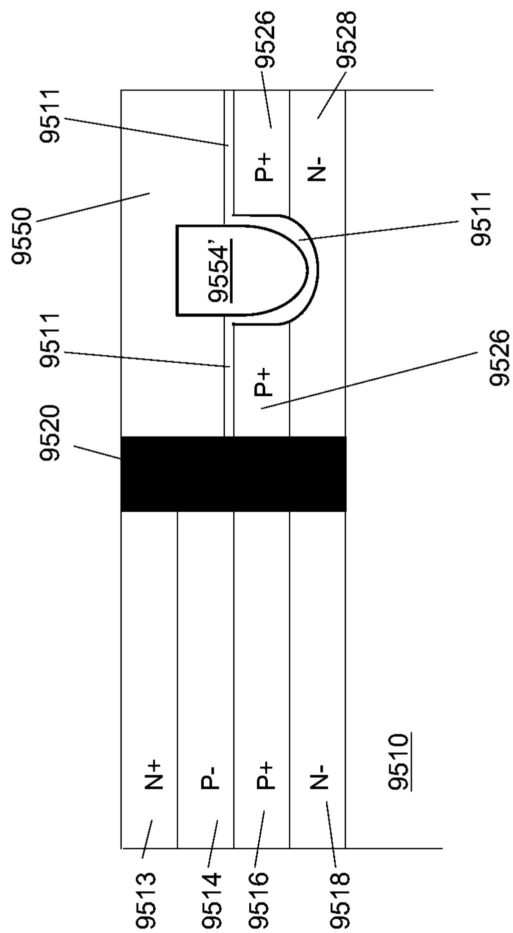

As illustrated in FIG. 95G, a low temperature oxide 9550 may be deposited and planarized, covering the formed p-RCAT so that the processing to form the n-RCAT may proceed.

Figure 95H:
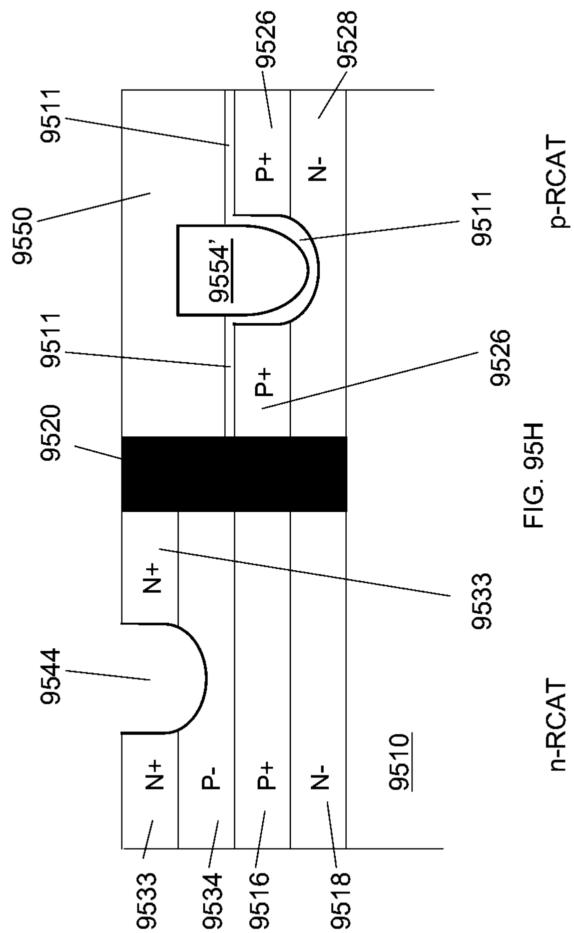

As illustrated in FIG. 95H the n-RCAT recessed channel 9544 may be mask defined and etched. The recessed channel surfaces and edges may be smoothed by wet chemical or plasma/RIE etching techniques to mitigate high field effects. These process steps form N+ source and drain regions 9533 and P− transistor channel region 9534.

Figure 95I:
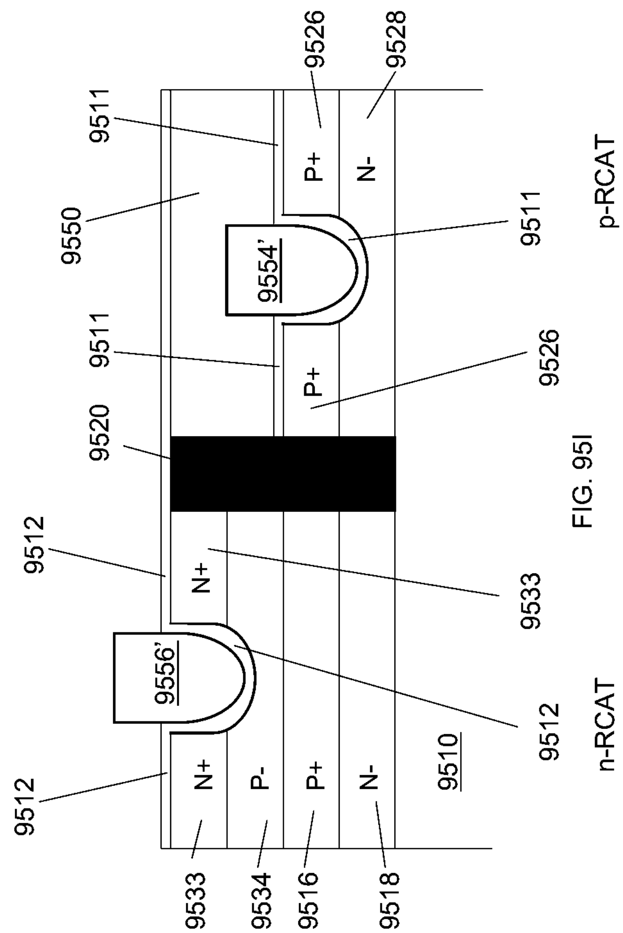

As illustrated in FIG. 95I, a gate oxide 9512 may be formed and a gate metal material may be deposited. The gate oxide 9512 may be an atomic layer deposited (ALD) gate dielectric that is paired with a work function specific gate metal according to an industry standard of high k metal gate process schemes described previously and targeted for use in a n-channel RCAT. Additionally, the gate oxide 9512 may be formed with a low temperature oxide deposition or low temperature microwave plasma oxidation of the silicon surfaces and then a gate material such as tungsten or aluminum may be deposited. Then the gate material may be chemically mechanically polished, and the gate electrode 9556' defined by masking and etching.

Figure 95J:
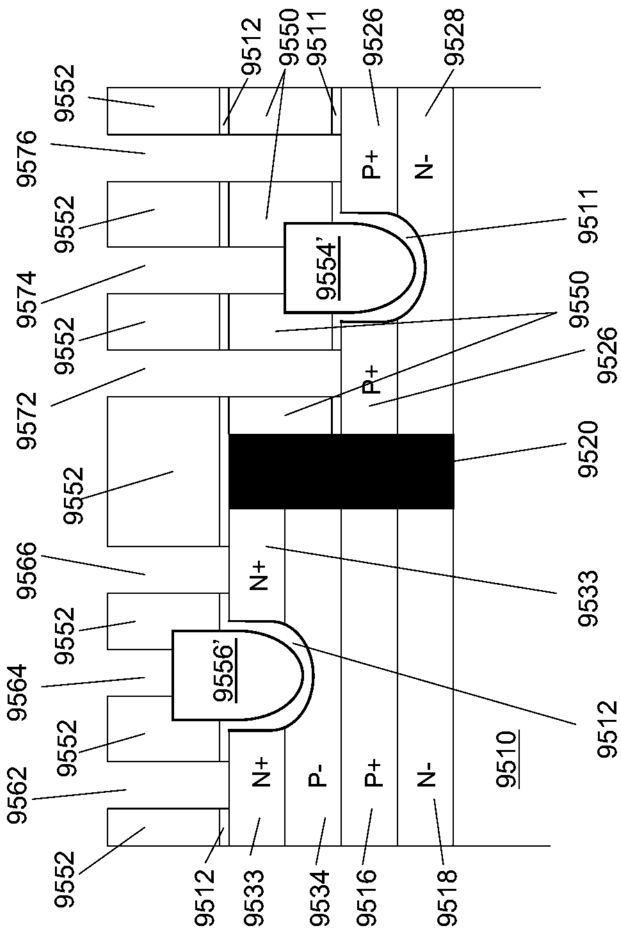

As illustrated in FIG. 95J, the entire structure may be covered with a Low Temperature Oxide 9552, which may be planarized with chemical mechanical polishing. Contacts and metal interconnects may be formed by lithography and plasma/RIE etch. The n-RCAT N+ source and drain regions 9533, P− transistor channel region 9534, gate dielectric 9512 and gate electrode 9556' are shown. The p-RCAT P+ source and drain regions 9526, N− transistor channel region 9528, gate dielectric 9511 and gate electrode 9554' are shown. Transistor isolation region 9520, oxide 9552, n-RCAT source contact 9562, gate contact 9564, and drain contact 9566 are shown. p-RCAT source contact 9572, gate contact 9574, and drain contact 9576 are shown. The n-RCAT source contact 9562 and drain contact 9566 provide electrical coupling to their respective N+ regions 9533. The n-RCAT gate contact 9564 provides electrical coupling to gate electrode 9556'. The p-RCAT source contact 9572 and drain contact 9576 provide electrical coupling to their respective N+ regions 9526. The p-RCAT gate contact 9574 provides electrical coupling to gate electrode 9554'. Contacts (not shown) to P+ doped region 9516, and N− doped region 9518 may be made to allow biasing for noise suppression and back-gate/substrate biasing.

Interconnect metallization may then be conventionally formed. The thru layer via (not shown) may be formed to electrically couple the complementary RCAT layer metallization to the acceptor substrate 9510 at acceptor wafer metal connect pad (not shown). This flow may enable the formation of a mono-crystalline silicon n-RCAT and p-RCAT constructed in a single layer transfer of prefabricated wafer sized doped layers, which may be formed and connected to the underlying multi-metal layer semiconductor device without exposing the underlying devices to a high temperature.

Persons of ordinary skill in the art will appreciate that the illustrations in FIGS. 95A through 95J are exemplary only and are not drawn to scale. Such skilled persons will further appreciate that many variations are possible such as, for example, the n-RCAT may be processed prior to the p-RCAT, or that various etch hard masks may be employed. Such skilled persons will further appreciate that devices other than a complementary RCAT may be created with minor variations of the process flow, such as, for example, complementary bipolar junction transistors, or complementary raised source drain extension transistors, or complementary junction-less transistors, or complementary V-groove transistors. Many other modifications within the scope of the invention will suggest themselves to such skilled persons after reading this specification. Thus the invention is to be limited only by the appended claims.

An alternative method whereby to build both ‘n’ type and ‘p’ type transistors on the same layer may be to partially process the first phase of transistor formation on the donor wafer with normal CMOS processing including a ‘dummy gate’, a process known as gate-last transistors. In this embodiment of the invention, a layer transfer of the mono-crystalline silicon may be performed after the dummy gate is completed and before the formation of a replacement gate. Processing prior to layer transfer may have no temperature restrictions and the processing during and after layer transfer may be limited to low temperatures, generally, for example, below 400° C. The dummy gate and the replacement gate may include various materials such as silicon and silicon dioxide, or metal and low k materials such as TiAlN and HfO2. An example may be the high-k metal gate (HKMG) CMOS transistors that have been developed for the 45 nm, 32 nm, 22 nm, and future CMOS generations. Intel and TSMC have shown the advantages of a ‘gate-last’ approach to construct high performance HKMG CMOS transistors (C, Auth et al., VLSI 2008, pp 128-129 and C. H. Jan. et al, 2009 IEDM p. 647).

Figures 70A, 70B:
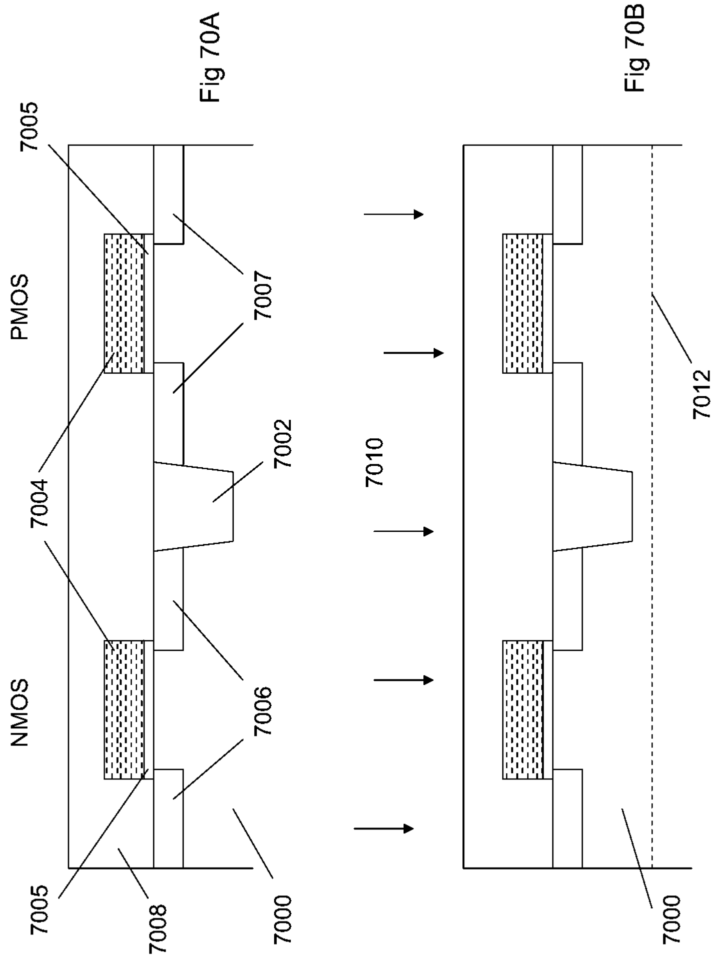
FIGS. 70 A, B, B-1, and C-H are drawing illustrations of formation of top planar transistors.
Figures 1, 70B:
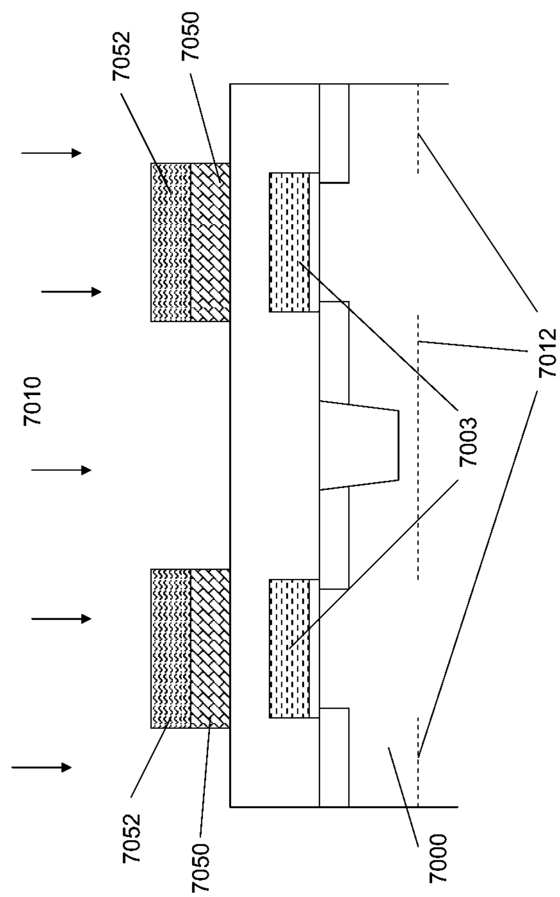

As illustrated in FIG. 70A, a bulk silicon donor wafer 7000 may be processed in the normal state of the art HKMG gate-last manner up to the step prior to where CMP exposure of the polysilicon dummy gates takes place. FIG. 70A illustrates a cross section of the bulk silicon donor wafer 7000, the isolation 7002 between transistors, the polysilicon 7004 and gate oxide 7005 of both n-type and p-type CMOS dummy gates, their associated source and drains 7006 for NMOS and 7007 for PMOS, and the interlayer dielectric (ILD) 7008. These structures of FIG. 70A illustrate completion of the first phase of transistor formation. At this step, or alternatively just after a CMP of layer 7008 to expose the polysilicon dummy gates or to planarize the oxide layer 7008 and not expose the dummy gates, an implant of an atomic species 7010, such as, for example, H+, may prepare the cleaving plane 7012 in the bulk of the donor substrate for layer transfer suitability, as illustrated in FIG. 70B.

Figure 70C:
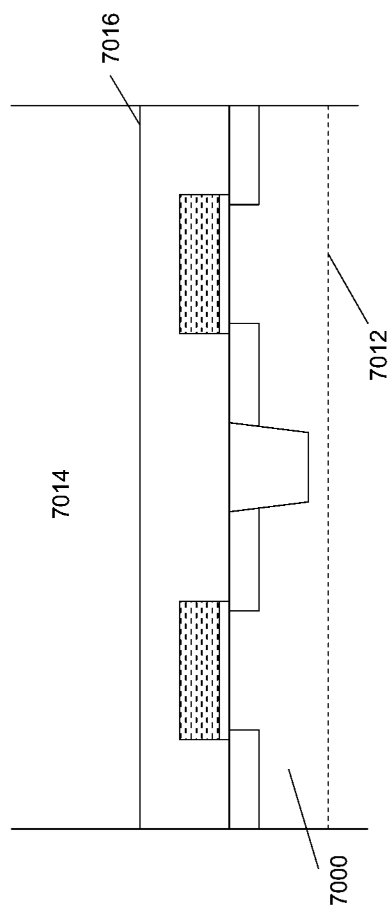

The donor wafer 7000 may be now temporarily bonded to carrier substrate 7014 at interface 7016 as illustrated in FIG. 70C with a low temperature process that may facilitate a low temperature release. The carrier substrate 7014 may be a glass substrate to enable state of the art optical alignment with the acceptor wafer. A temporary bond between the carrier substrate 7014 and the donor wafer 7000 at interface 7016 may be made with a polymeric material, such as polyimide DuPont HD3007, which can be released at a later step by laser ablation, Ultra-Violet radiation exposure, or thermal decomposition. Alternatively, a temporary bond may be made with uni-polar or bi-polar electrostatic technology such as, for example, the Apache tool from Beam Services Inc.

Figure 70D:
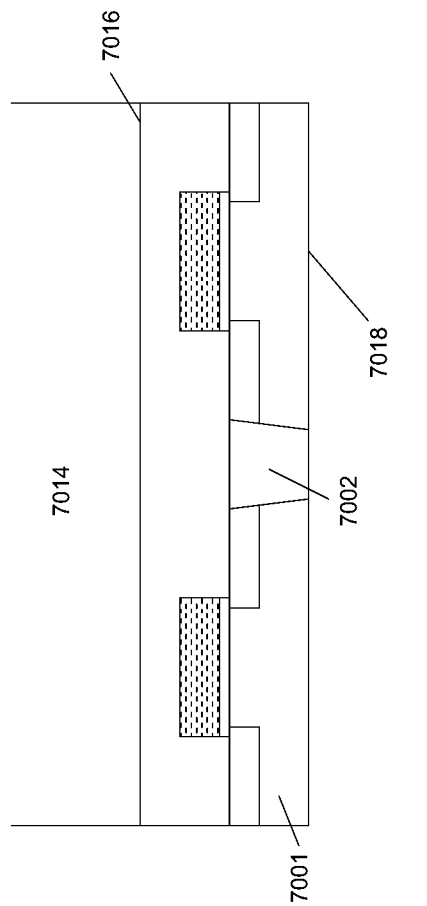

The donor wafer 7000 may then be cleaved at the cleaving plane 7012 and may be thinned by chemical mechanical polishing (CMP) so that the transistor isolation 7002 may be exposed at the donor wafer face 7018 as illustrated in FIG. 70D. Alternatively, the CMP could continue to the bottom of the junctions to create a fully depleted SW layer.

Figure 70E:
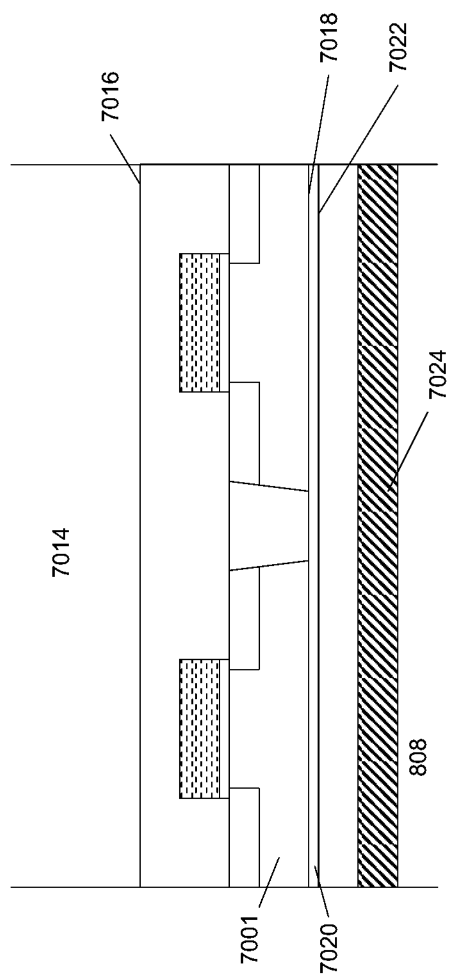

As shown in FIG. 70E, the thin mono-crystalline donor layer face 7018 may be prepared for layer transfer by a low temperature oxidation or deposition of an oxide 7020, and plasma or other surface treatments to prepare the oxide surface 7022 for wafer oxide-to-oxide bonding. Similar surface preparation may be performed on the 808 acceptor wafer in preparation for oxide-to-oxide bonding.

A low temperature (for example, less than 400° C.) layer transfer flow may be performed, as illustrated in FIG. 70E, to transfer the thinned and first phase of transistor formation pre-processed HKMG silicon layer 7001 with attached carrier substrate 7014 to the acceptor wafer 808 with a top metallization comprising metal strips 7024 to act as landing pads for connection between the circuits formed on the transferred layer with the underlying circuits—layers 808.

Figure 70F:
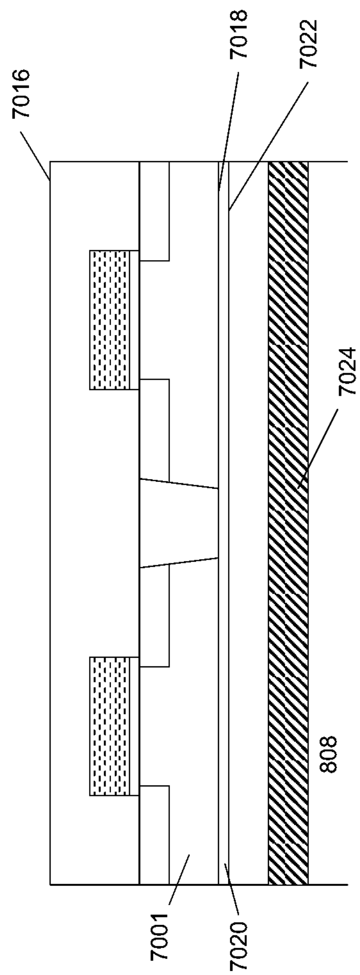

As illustrated in FIG. 70F, the carrier substrate 7014 may then be released using a low temperature process such as laser ablation.

Figure 70G:
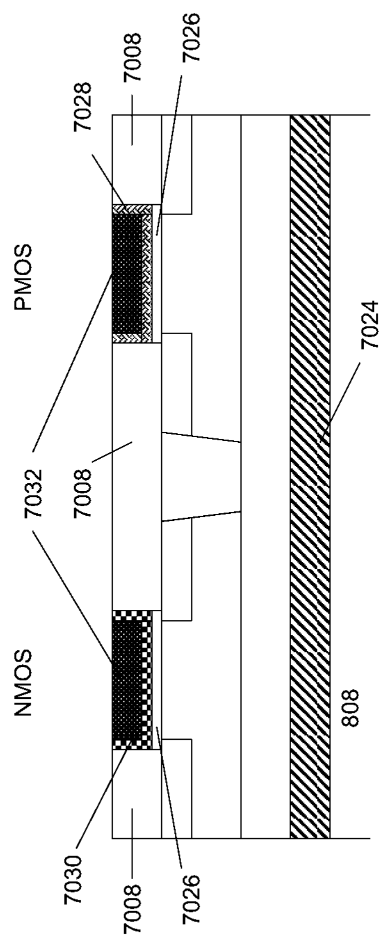

The bonded combination of acceptor wafer 808 and HKMG transistor silicon layer 7001 may now be ready for normal state of the art gate-last transistor formation completion. As illustrated in FIG. 70G, the inter layer dielectric 7008 may be chemical mechanically polished to expose the top of the polysilicon dummy gates. The dummy polysilicon gates may then be removed by etching and the hi-k gate dielectric 7026 and the PMOS specific work function metal gate 7028 may be deposited. The PMOS work function metal gate may be removed from the NMOS transistors and the NMOS specific work function metal gate 7030 may be deposited. An aluminum fill 7032 may be performed on both NMOS and PMOS gates and the metal CMP'ed.

Figure 70H:
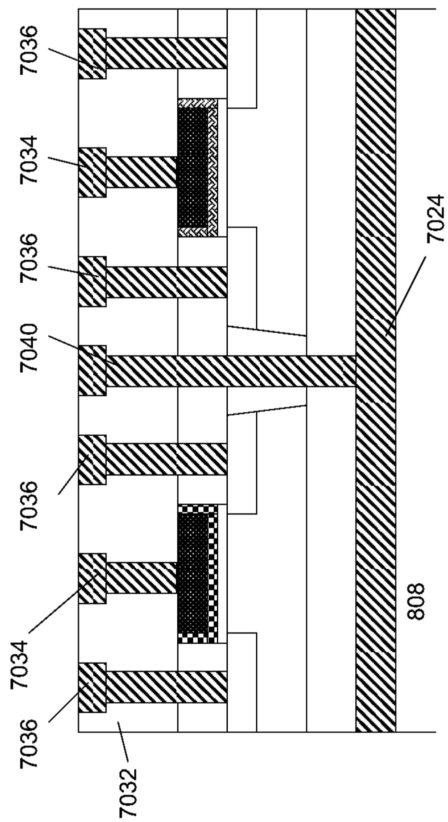

As illustrated in FIG. 70H, a dielectric layer 7032 may be deposited and the normal gate 7034 and source/drain 7036 contact formation and metallization may now be performed to connect the transistors on that mono-crystalline layer and to connect to the acceptor wafer 808 top metallization strip 7024 with through via 7040 providing connection through the transferred layer from the donor wafer to the acceptor wafer. The top metal layer may be formed to act as the acceptor wafer landing strips for a repeat of the above process flow to stack another preprocessed thin mono-crystalline layer of two-phase formed transistors. The above process flow may also be utilized to construct gates of other types, such as, for example, doped polysilicon on thermal oxide, doped polysilicon on oxynitride, or other metal gate configurations, as 'dummy gates,' perform a layer transfer of the thin mono-crystalline layer, replace the gate electrode and gate oxide, and then proceed with low temperature interconnect processing.

Figure 82A:
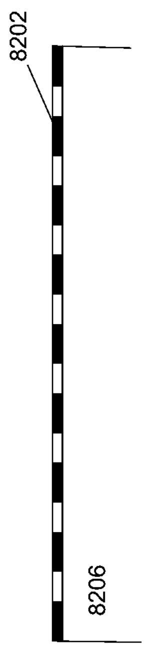
FIG. 82 A-G are drawing illustrations of a formation of top planar transistors.

Alternatively, the carrier substrate 7014 may be a silicon wafer, and infra red light and optics could be utilized for alignments. FIGS. 82A-G are used to illustrate the use of a carrier wafer. FIG. 82A illustrates the first step of preparing transistors with dummy gates 8202 on first donor wafer 8206. The first step may complete the first phase of transistor formation.

Figure 82B:
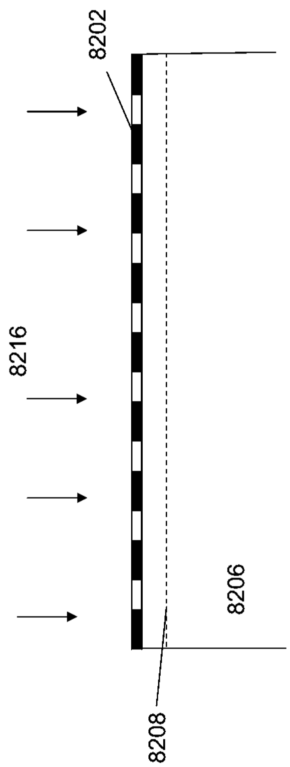

FIG. 82B illustrates forming a cleave line 8208 by implant 8216 of atomic particles such as H+.

Figure 82C:
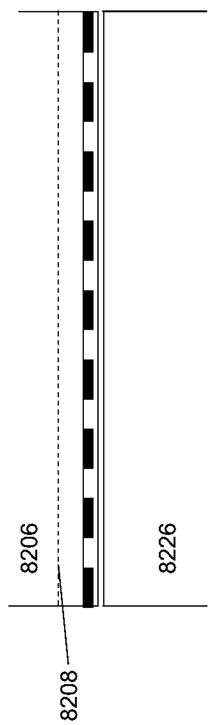

FIG. 82C illustrates permanently bonding the first donor wafer 8206 to a second donor wafer 8226. The permanent bonding may be oxide-to-oxide wafer bonding as described previously.

Figure 82D:
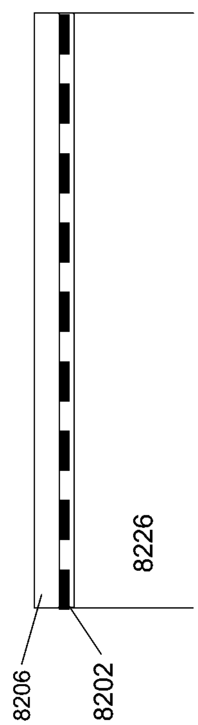

FIG. 82D illustrates the second donor wafer 8226 acting as a carrier wafer after cleaving the first donor wafer off; leaving a thin layer 8206 with the now buried dummy gate transistors 8202.

Figure 82E:
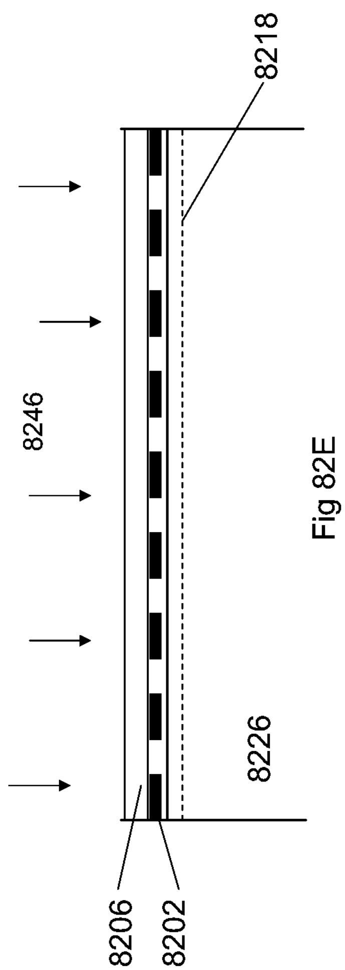

FIG. 82E illustrates forming a second cleave line 8218 in the second donor wafer 8226 by implant 8246 of atomic species such as, for example, H+.

Figure 82F:
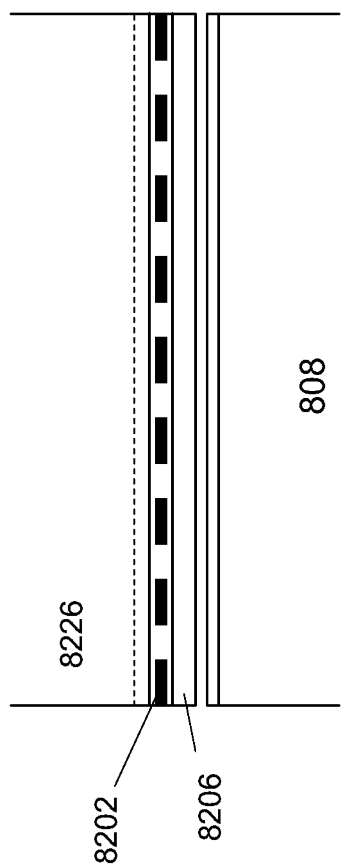

FIG. 82F illustrates the second layer transfer step to bring the dummy gate transistors 8202 ready to be permanently bonded to the house 808. For simplicity of the explanation, the steps of surface layer preparation done for each of these bonding steps have been left out.

Figure 82G:
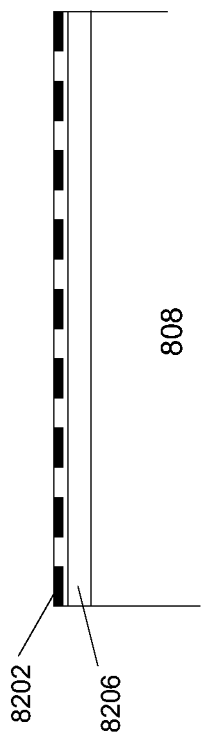

FIG. 82G illustrates the house 808 with the dummy gate transistor 8202 on top after cleaving off the second donor wafer and removing the layers on top of the dummy gate transistors. Now the flow may proceed to replace the dummy gates with the final gates, form the metal interconnection layers, and continue the 3D fabrication process.

An interesting alternative is available when using the carrier wafer flow. In this flow we can use the two sides of the transferred layer to build NMOS on one side and PMOS on the other side. Timing properly the replacement gate step in such a flow could enable full performance transistors properly aligned to each other. Compact 3D library cells may be constructed from this process flow.

Figure 83A:
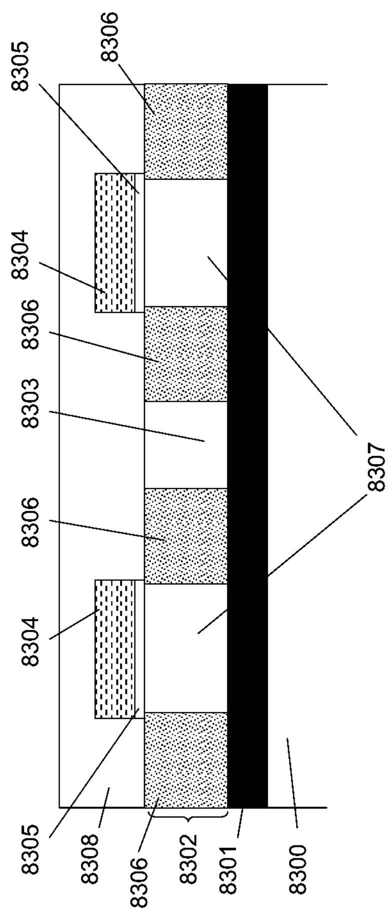
FIG. 83 A-L are drawing illustrations of a formation of top planar transistors.

As illustrated in FIG. 83A, an SOI (Silicon On Insulator) donor wafer 8300 may be processed according to normal state of the art using, e.g., a HKMG gate-last process, with adjusted thermal cycles to compensate for later thermal processing, up to the step prior to where CMP exposure of the polysilicon dummy gates takes place. Alternatively, the donor wafer 8300 may start as a bulk silicon wafer and utilize an oxygen implantation and thermal anneal to form a buried oxide layer, such as the SIMOX process (i.e., separation by implantation of oxygen). FIG. 83A illustrates a cross section of the SOI donor wafer substrate 8300, the buried oxide (i.e., BOX) 8301, the thin silicon layer 8302 of the SOI wafer, the isolation 8303 between transistors, the polysilicon 8304 and gate oxide 8305 of n-type CMOS dummy gates, their associated source and drains 8306 for NMOS, the NMOS transistor channel 8307, and the NMOS interlayer dielectric (ILD) 8308. Alternatively, PMOS devices or full CMOS devices may be constructed at this stage. This stage may complete the first phase of transistor formation.

Figure 83B:
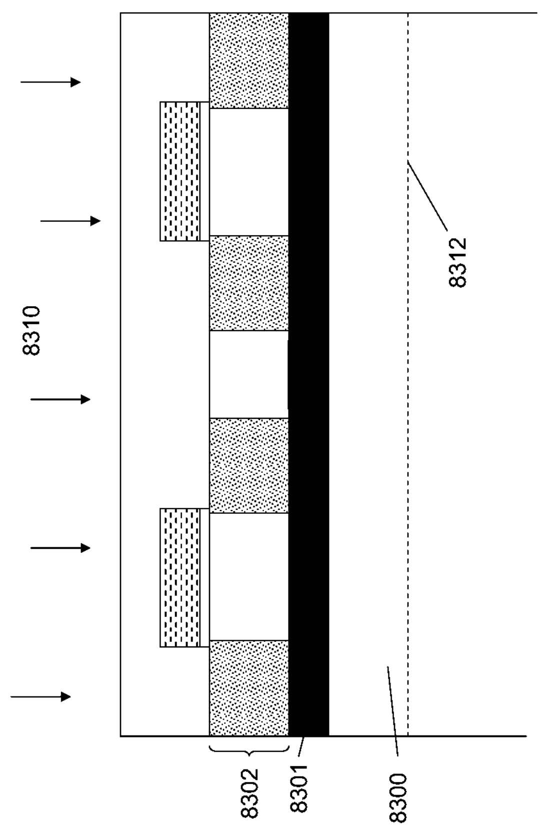

At this step, or alternatively just after a CMP of layer 8308 to expose the polysilicon dummy gates or to planarize the oxide layer 8308 and not expose the dummy gates, an implant of an atomic species 8310, such as, for example, H+, may prepare the cleaving plane 8312 in the bulk of the donor substrate for layer transfer suitability, as illustrated in FIG. 83B.

Figure 83C:
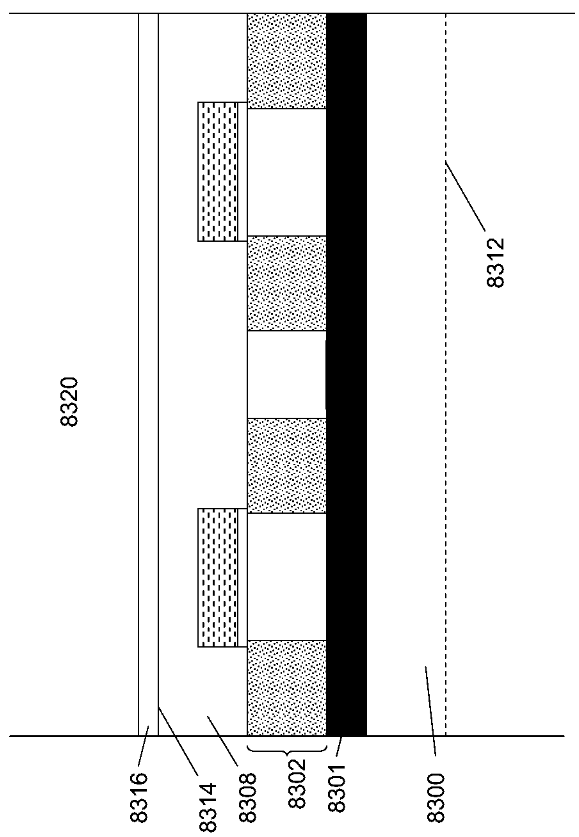

The SOI donor wafer 8300 may now be permanently bonded to a carrier wafer 8320 that has been prepared with an oxide layer 8316 for oxide-to-oxide bonding to the donor wafer surface 8314 as illustrated in FIG. 83C.

Figure 83D:
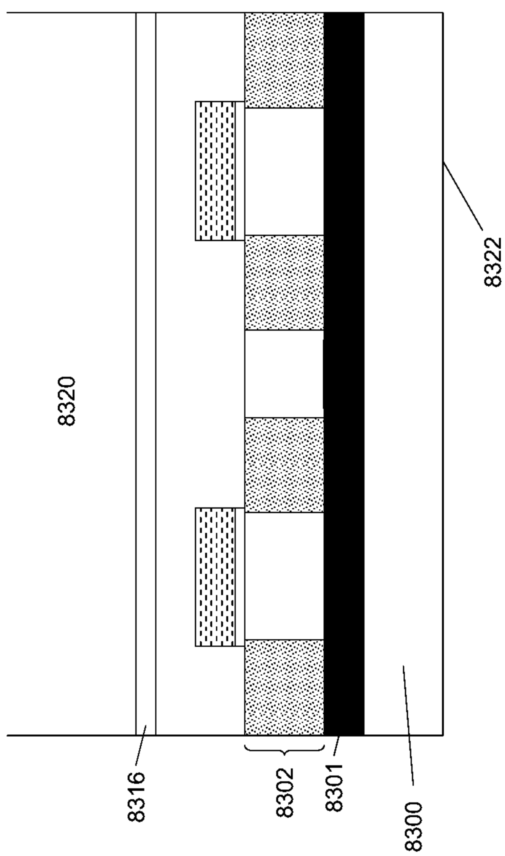

As illustrated in FIG. 83D, the donor wafer 8300 may then be cleaved at the cleaving plane 8312 and may be thinned by chemical mechanical polishing (CMP) and surface 8322 may be prepared for transistor formation.

Figure 83E:
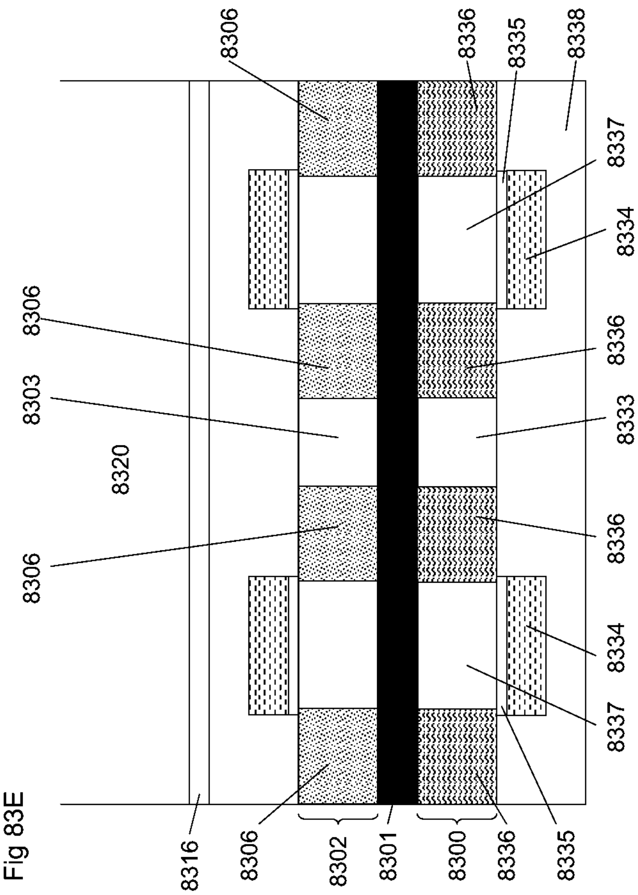

The donor wafer layer 8300 at surface 8322 may be processed in the normal state of the art gate last processing to form the PMOS transistors with dummy gates. FIG. 83E illustrates the cross section after the PMOS devices are formed showing the buried oxide (BOX) 8301, the now thin silicon layer 8300 of the SOI substrate, the isolation 8333 between transistors, the polysilicon 8334 and gate oxide 8335 of p-type CMOS dummy gates, their associated source and drains 8336 for PMOS, the PMOS transistor channel 8337, and the PMOS interlayer dielectric (ILD) 8338. The PMOS transistors may be precisely aligned at state of the art tolerances to the NMOS transistors due to the shared substrate 8300 possessing the same alignment marks. At this step, or alternatively just after a CMP of layer 8338, the processing flow may proceed to expose the PMOS polysilicon dummy gates or to planarize the oxide layer 8338 and not expose the dummy gates. Now the wafer could be put into a high temperature anneal to activate both the NMOS and the PMOS transistors.

Figure 83F:
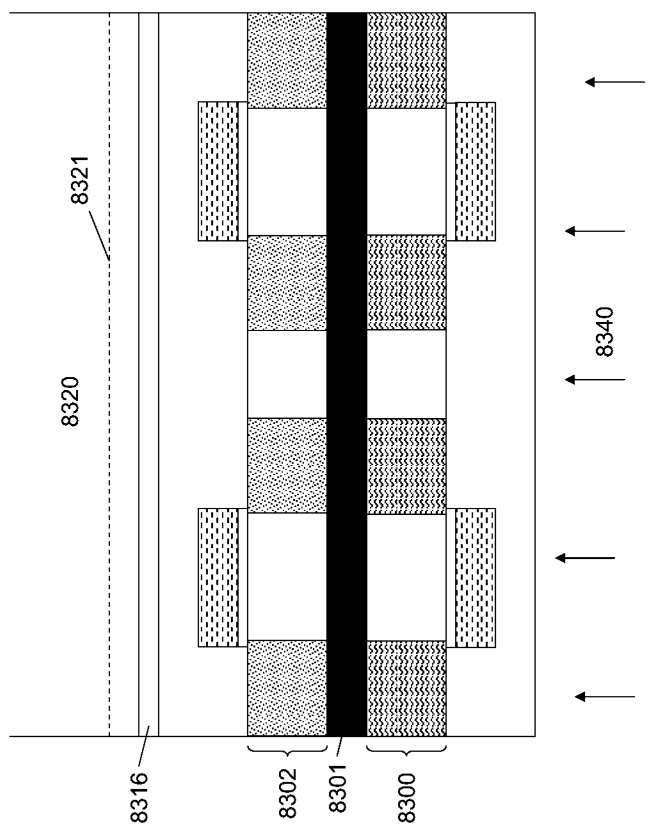

Then an implant of an atomic species 8340, such as, for example, H+, may prepare the cleaving plane 8321 in the bulk of the carrier wafer substrate 8320 for layer transfer suitability, as illustrated in FIG. 83F.

Figure 83G:
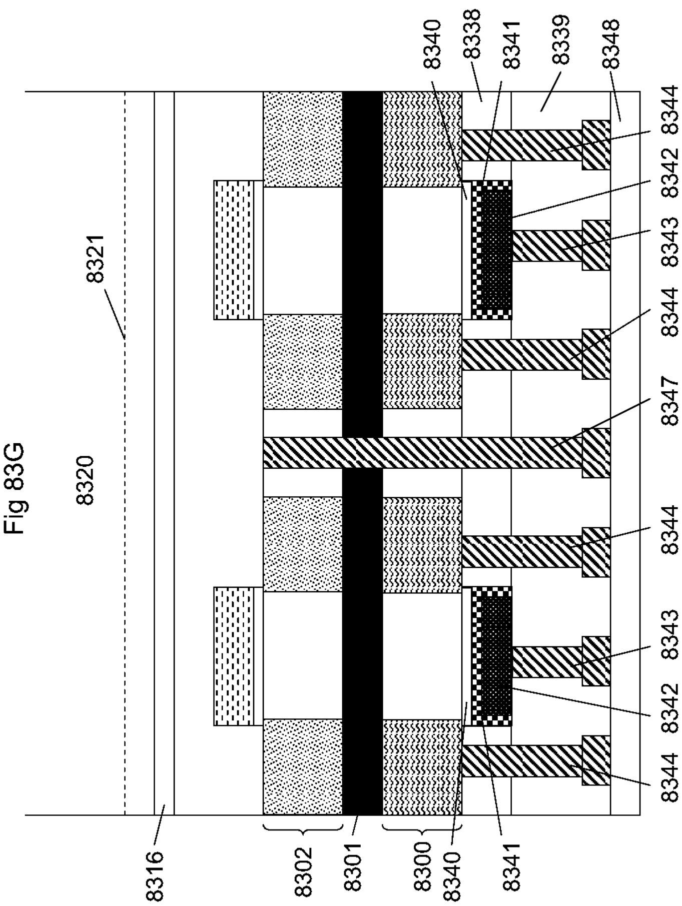

The PMOS transistors may now be ready for normal state of the art gate-last transistor formation completion. As illustrated in FIG. 83G, the inter layer dielectric 8338 may be chemical mechanically polished to expose the top of the polysilicon dummy gates. The dummy polysilicon gates may then be removed by etch and the PMOS hi-k gate dielectric 8340 and the PMOS specific work function metal gate 8341 may be deposited. An aluminum fill 8342 may be performed on the PMOS gates and the metal CMP'ed. A dielectric layer 8339 may be deposited and the normal gate 8343 and source/drain 8344 contact formation and metallization. The PMOS layer to NMOS layer via 8347 and metallization may be partially formed as illustrated in FIG. 83G and an oxide layer 8348 may be deposited to prepare for bonding.

Figure 83H:
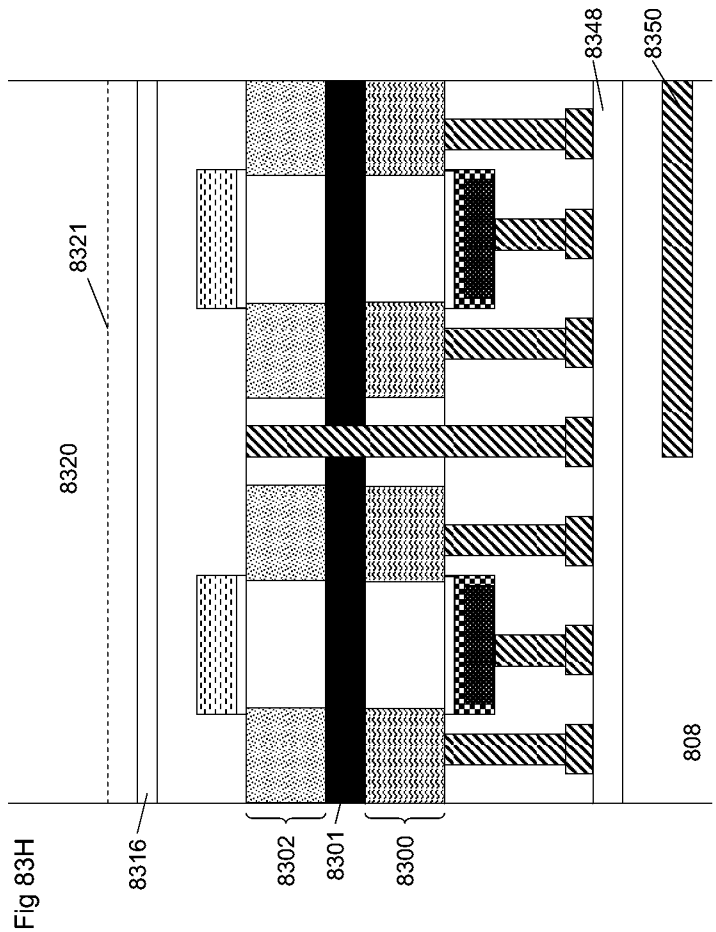

The carrier wafer and two sided n/p layer may then be aligned and permanently bonded to House acceptor wafer 808 with associated metal landing strip 8350 as illustrated in FIG. 83H.

Figure 83I:
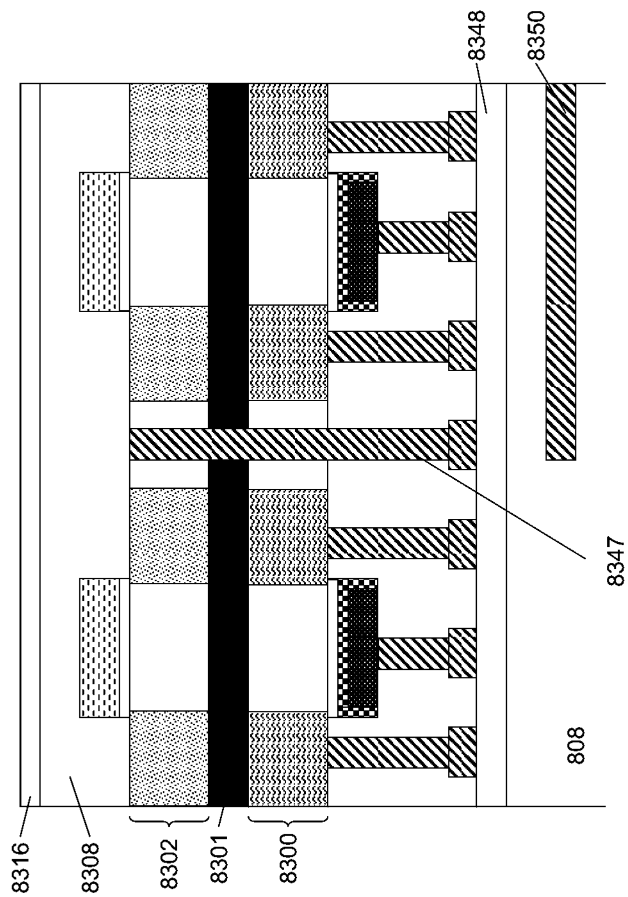

The carrier wafer 8320 may then be cleaved at the cleaving plane 8321 and may be thinned by chemical mechanical polishing (CMP) to oxide layer 8316 as illustrated in FIG. 83I.

Figure 83J:
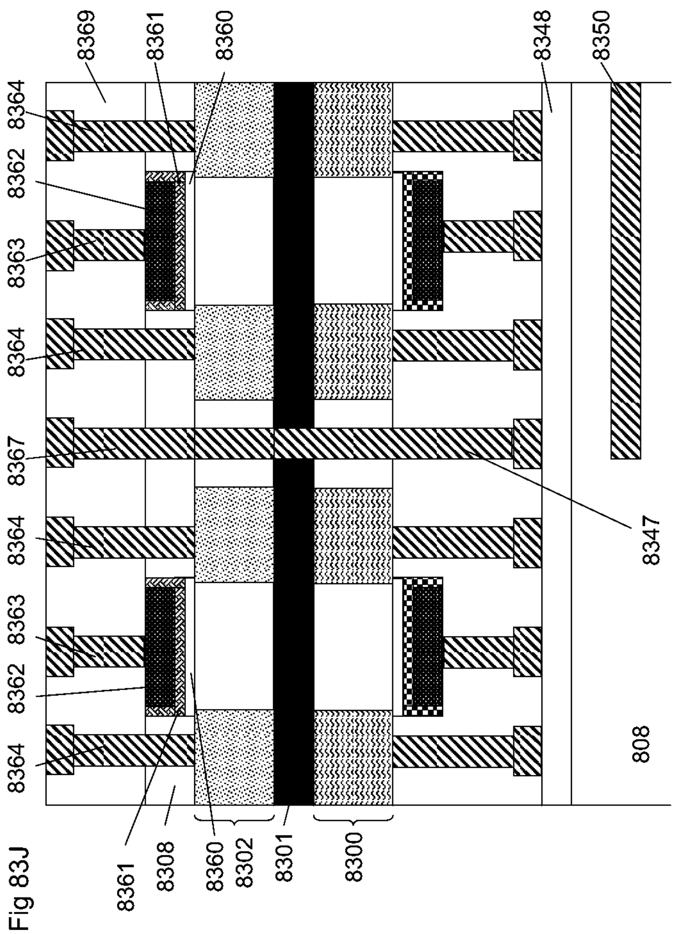

The NMOS transistors are now ready for normal state of the art gate-last transistor formation completion. As illustrated in FIG. 83J, the NMOS inter layer dielectric 8308 may be chemical mechanically polished to expose the top of the NMOS polysilicon dummy gates. The dummy polysilicon gates may then be removed by etching and the NMOS hi-k gate dielectric 8360 and the NMOS specific work function metal gate 8361 may be deposited. An aluminum fill 8362 may be performed on the NMOS gates and the metal CMP'ed. A dielectric layer 8369 may be deposited and the normal gate 8363 and source/drain 8364 contacts may be formed and metalized. The NMOS layer to PMOS layer via 8367 to connect to 8347 and the metallization of via 8367 may be formed.

Figure 83K:
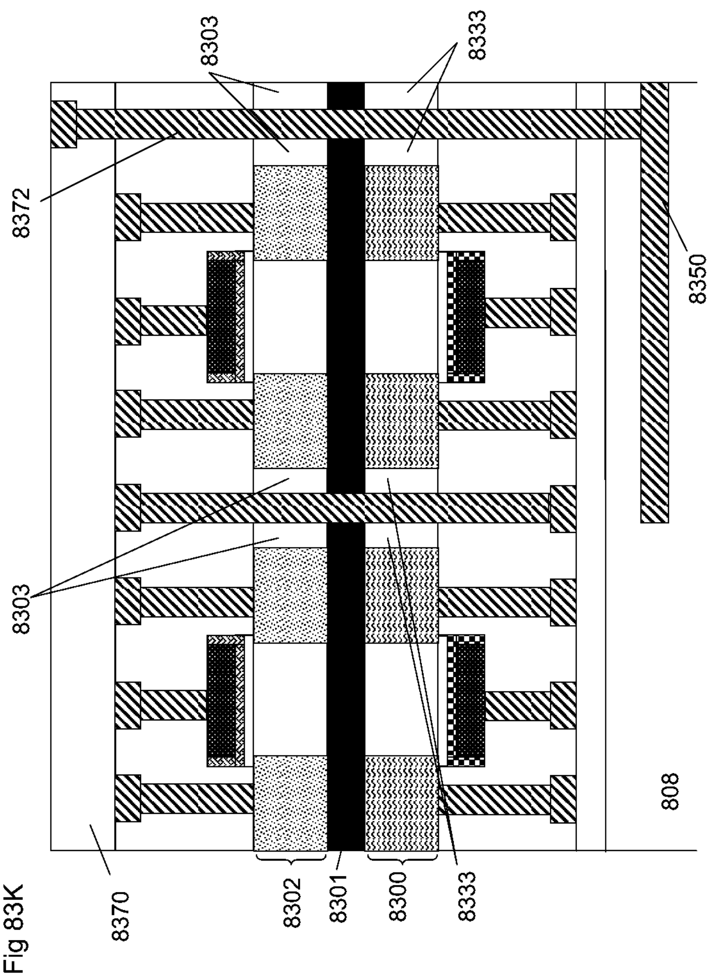

As illustrated in FIG. 83K, a dielectric layer 8370 may be deposited. Layer-to-layer through via 8372 may then be aligned, masked, etched, and metalized to electrically connect to the acceptor wafer 808 and metal-landing strip 8350. A topmost metal layer of the layer stack illustrated in FIG. 83K may be formed to act as the acceptor wafer landing strips for a repeat of the above process flow to stack another preprocessed thin mono-crystalline layer of transistors. Persons of ordinary skill in the art will appreciate that the illustrations in FIGS. 83A through 83K are exemplary only and are not drawn to scale. Such skilled persons will further appreciate that many variations are possible such as, for example, the transistor layers on each side of box 8301 may comprise full CMOS, or one side may be CMOS and the other n-type MOSFET transistors, or other combinations and types of semiconductor devices. Many other modifications within the scope of the invention will suggest themselves to such skilled persons after reading this specification. Thus the invention is to be limited only by the appended claims.

Figure 83L:
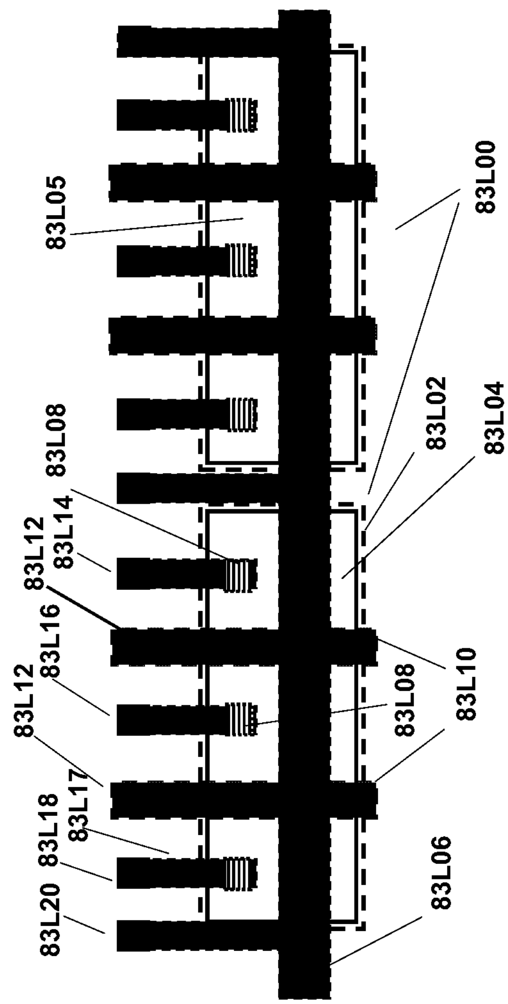

FIG. 83L is a top view drawing illustration of a repeating cell 83L00 as a building block for forming gate array, of two NMOS transistors 83L04 with shared diffusion 83L05 overlaying 'face down' two PMOS transistors 83L02 with shared diffusion. The NMOS transistors gates overlay the PMOS transistors gates 83L10 and the overlayed gates are connected to each other by via 83L12. The Vdd power line 83L06 could run as part of the face down generic structure with connection to the upper layer using vias 83L20. The diffusion connection 83L08 will be using the face down metal generic structure 83L17 and brought up by vias 83L14, 83L16, 83L18.

FIG. 83L1 is a drawing illustration of the generic cell 83L00 customized by custom NMOS transistor contacts 83L22, 83L24 and custom metal 83L26 to form a double inverter. The Vss power line 83L25 may run on top of the NMOS transistors.

FIG. 83L2 is a drawing illustration of the generic cell 83L00 customized to a NOR function, FIG. 83L3 is a drawing illustration of the generic cell 83L00 customized to a NAND function and FIG. 83L4 is a drawing illustration of the generic cell 83L00 customized to a multiplexer function. Accordingly cell 83L00 could be customized to substantially all the desired logic functions so a generic gate array using array of cells 83L00 could be customized with custom contacts vias and metal layers to any logic function.

Another alternative, with reference to FIG. 70 and description, is illustrated in FIG. 70B-1 whereby the implant of an atomic species 7010, such as, for example, H+, may be screened from the sensitive gate areas 7003 by first masking and etching a shield implant stopping layer of a dense material 7050, for example 5000 angstroms of Tantalum, and may be combined with 5,000 angstroms of photoresist 7052. This may create a segmented cleave plane 7012 in the bulk of the donor wafer silicon wafer and additional polishing may be applied to provide a smooth bonding surface for layer transfer suitability.

Additional alternatives to the use of an SOI donor wafer may be employed to isolate transistors in the vertical direction. For example, a pn junction may be formed between the vertically stacked transistors and may be biased. Also, oxygen ions may be implanted between the vertically stacked transistors and annealed to form a buried oxide layer. Also, a silicon-on-replacement-insulator technique may be utilized for the first formed dummy transistors wherein a buried SiGe layer is selectively etched out and refilled with oxide, thereby creating islands of electrically isolated silicon.

An alternative embodiment of the above process flow with reference to FIG. 70 is illustrated in FIGS. 81A to 81F and may provide a face down CMOS planar transistor layer on top of a preprocessed House substrate. The CMOS planar transistors may be fabricated with dummy gates and the cleave plane 7012 may be created in the donor wafer as described previously and illustrated in FIGS. 70A and 70B. Then the dummy gates may be replaced as described previously and illustrated in FIG. 81A.

The contact and metallization steps may be performed as illustrated in FIG. 81B to allow future connections to the transistors once they are face down.

The face 8102 of donor wafer 8100 may be prepared for bonding by deposition of an oxide 8104, and plasma or other surface treatments to prepare the oxide surface 8106 for wafer-to-wafer oxide-to-oxide bonding as illustrated in FIG. 81C.

Similar surface preparation may be performed on the 808 acceptor wafer in preparation for the oxide-to-oxide bonding. Now a low temperature (e.g., less than 400° C.) layer transfer flow may be performed, as illustrated in FIG. 81D, to transfer the prepared donor wafer 8100 with top surface 8106 to the acceptor wafer 808. Acceptor wafer 808 may be preprocessed with transistor circuitry and metal interconnect and may have a top metallization comprising metal strips 8124 to act as landing pads for connection between the circuits formed on the transferred layer with the underlying circuit layers in house 808. For FIG. 81D to FIG. 81F, an additional STI (shallow trench isolation) isolation 8130 without via 7040 may be added to the illustration.

The donor wafer 8100 may then be cleaved at the cleaving plane 7012 and may be thinned by chemical mechanical polishing (CMP) so that the transistor isolations 7002 and 8130 may be exposed as illustrated in FIG. 81E. Alternatively, the CMP could continue to the bottom of the junctions to create a fully depleted SOI layer.

As illustrated in FIG. 81F, a low-temperature oxide or low-k dielectric 8136 may be deposited and planarized. The through via 8128 to house 808 acceptor wafer landing strip 8124 and contact 8140 to thru via 7040 may be etched, metalized, and connected by metal line 8150 to provide electrical connection from the donor wafer transistors to the acceptor wafer. The length of landing strips 8124 may be at least the repeat width W plus margin per the proper via design rules as shown in FIGS. 32 and 33A. The landing zone strip extension for proper via design rules may include angular misalignment of the wafer-to-wafer bonding that is not compensated for by the stepper overlay algorithms, and may include uncompensated donor wafer bow and warp.

The face down flow has some advantages such as, for example, enabling double gate transistors, back biased transistors, or access to the floating body in memory applications. For example, a back gate for a double gate transistor may be constructed as illustrated in FIG. 81E-1. A low temperature gate oxide 8160 with gate material 8162 may be grown or deposited and defined by lithographic and etch processes as described previously.

The metal hookup may be constructed as illustrated in FIG. 81F-1.

As illustrated in FIG. 81F-2, fully depleted SOI transistors with junctions 8170 and 8171 may be alternatively constructed in this flow as described in respect to CMP thinning illustrated in FIG. 81E.

An alternative embodiment of the above double gate process flow that may provide a back gate in a face-up flow is illustrated in FIGS. 85A to 85E with reference to FIG. 70. The CMOS planar transistors may be fabricated with the dummy gates and the cleave plane 7012 may be created in the donor wafer, bulk or SOI, as described and illustrated in FIGS. 70A and 70B. The donor wafer may be attached either permanently or temporarily to the carrier substrate as described and illustrated in FIG. 70C and then cleaved and thinned to the STI 7002 as shown in FIG. 70D. Alternatively, the CMP could continue to the bottom of the junctions to create a fully depleted SOI layer.

Figure 85A:
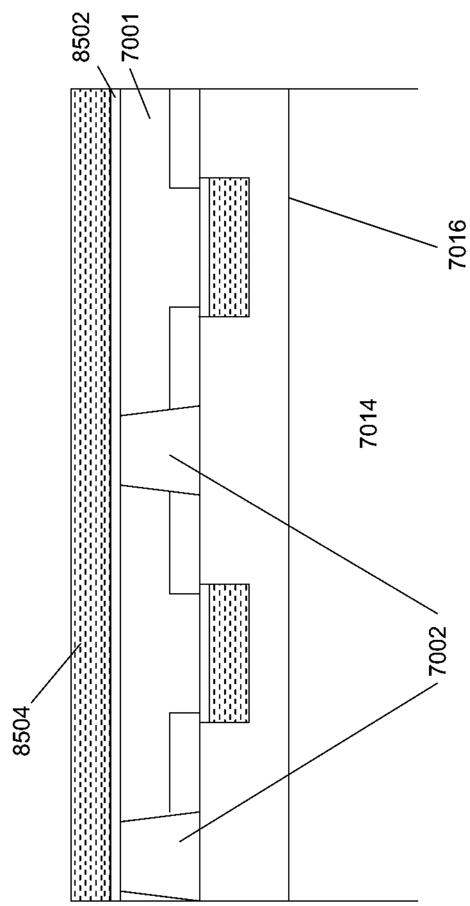
FIG. 85 A-E are drawing illustrations of formation of top planar transistors.

A second gate oxide 8502 may be grown or deposited as illustrated in FIG. 85A and a gate material 8504 may be deposited. The gate oxide 8502 and gate material 8504 may be formed with low temperature (e.g., less than 400° C.) materials and processing, such as previously described TEL SPA gate oxide and amorphous silicon, ALD techniques, or hi-k metal gate stack (HKMG), or may be formed with a higher temperature gate oxide or oxynitride and doped polysilicon if the carrier substrate bond is permanent and the existing planar transistor dopant movement is accounted for.

Figure 85B:
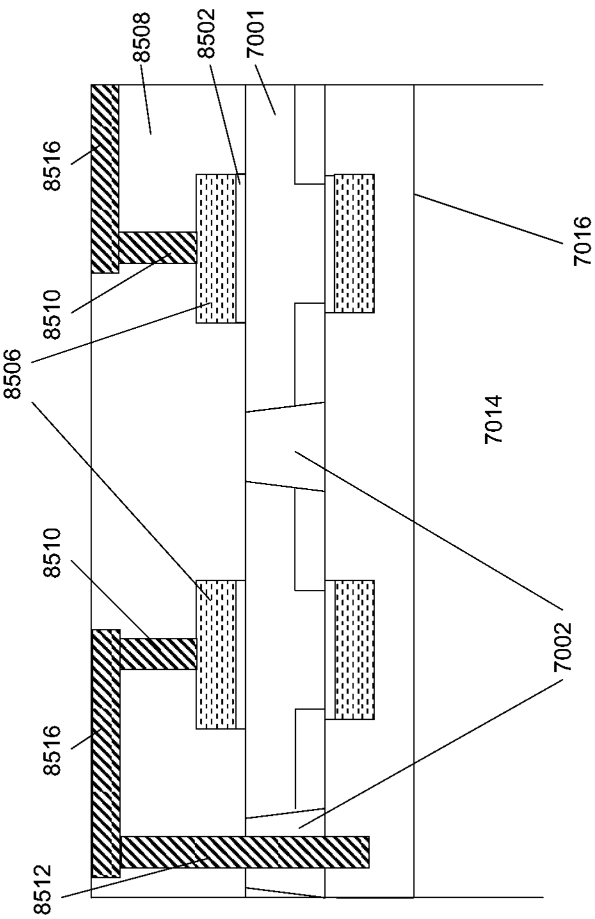

The gate stack 8506 may be defined, a dielectric 8508 may be deposited and planarized, and then local contacts 8510 and layer to layer contacts 8512 and metallization 8516 may be formed as illustrated in FIG. 85B.

Figure 85C:
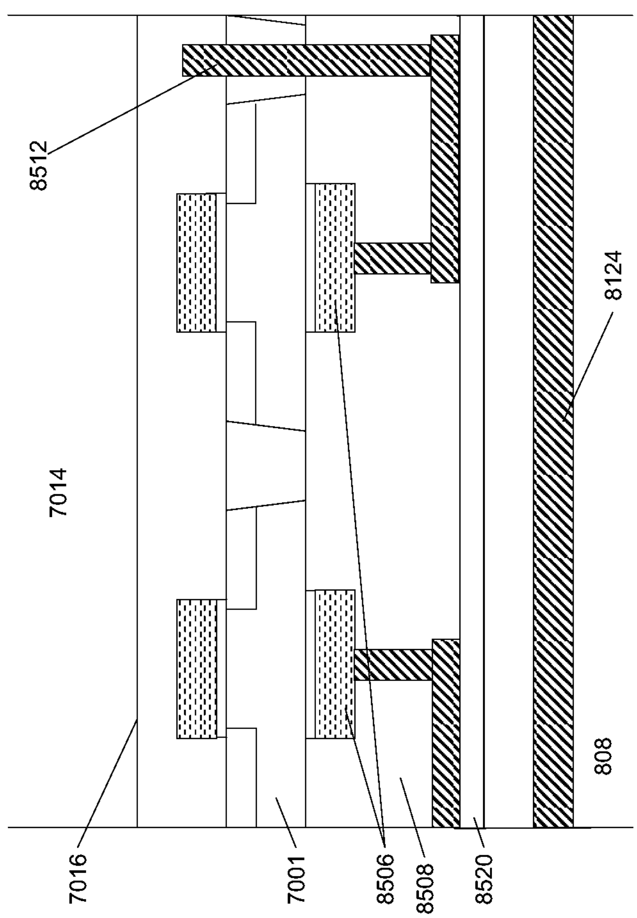

As shown in FIG. 85C, the thin mono-crystalline donor and carrier substrate stack may be prepared for layer transfer by methods previously described including oxide layer 8520. Similar surface preparation may be performed on house 808 acceptor wafer in preparation for oxide-to-oxide bonding. Now a low temperature (e.g., less than 400° C.) layer transfer flow may be performed, as illustrated in FIG. 85C, to transfer the thinned and first-phase-transistor-formation-pre-processed HKMG silicon layer 7001 and back gates 8506 with attached carrier substrate 7014 to the acceptor wafer 808. The acceptor wafer 808 may have a top metallization comprising metal strips 8124 to act as landing pads for connection between the circuits formed on the transferred layer with the underlying circuit layers 808.

Figure 85D:
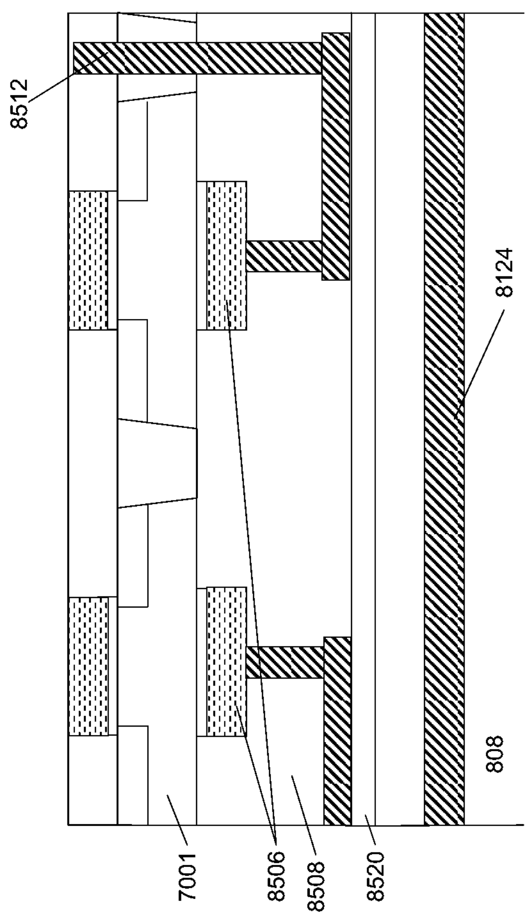

As illustrated in FIG. 85D, the carrier substrate 7014 may then be released at surface 7016 as previously described.

Figure 85E:
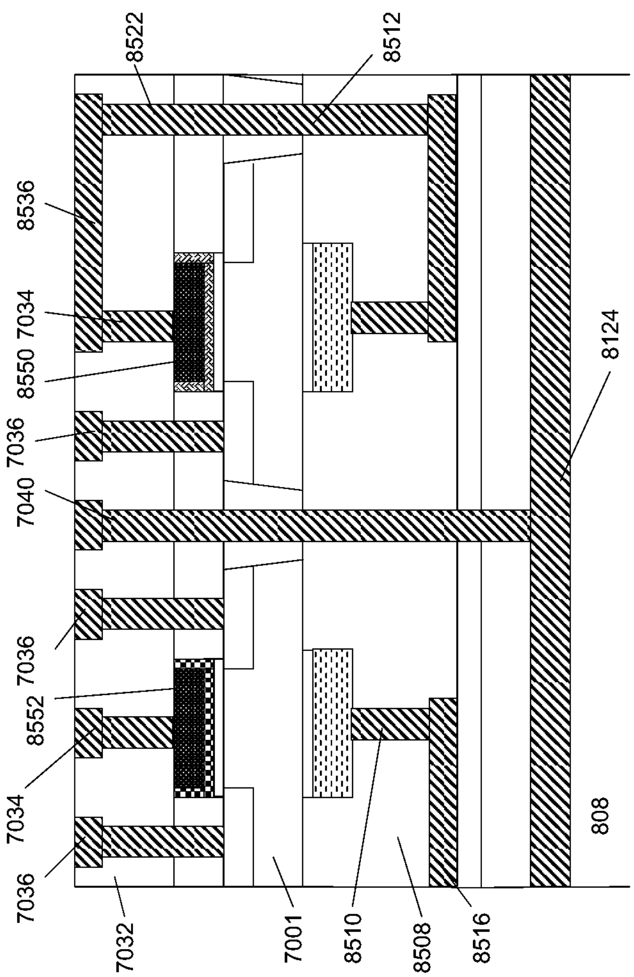

The bonded combination of acceptor wafer 808 and HKMG transistor silicon layer 7001 may now be ready for normal state of the art gate-last transistor formation completion as illustrated in FIG. 85E and connection to the acceptor wafer House 808 thru layer to layer via 7040. The top transistor 8550 may be back gated by connecting the top gate to the bottom gate thru gate contact 7034 to metal line 8536 and to contact 8522 to connect to the donor wafer layer through layer contact 8512. The top transistor 8552 may be back biased by connecting metal line 8516 to a back bias circuit that may be in the top transistor level or in the House 808.

The current invention may overcome the challenge of forming these planar transistors aligned to the underlying layers 808 as described in association with FIGS. 71 to 79 and FIGS. 30 to 33. The general flow may be applied to the transistor constructions described before as relating to FIGS. 70 A-H. In one embodiment, the donor wafer 3000 may be pre-processed to build not just one transistor type but both types by comprising alternating parallel rows that are the die width plus maximum donor wafer to acceptor wafer misalignment in length. Alternatively, the rows may be made wafer long for the first phase of transistor formation of ‘n’ type 3004 and ‘p’ type 3006 transistors as illustrated in FIG. 30. FIG. 30 may also include a four cardinal directions 3040 indicator, which will be used through FIGS. 71 to 78. As shown in the blown up projection 3002, the width of the n-type rows 3004 is Wn and the width of the p-type rows 3006 is Wp and their sum W 3008 is the width of the repeating pattern. The rows traverse from East to West and the alternating pattern repeats substantially all the way across the wafer from North to South. Wn and Wp may be set for the minimum width of the corresponding transistor plus its isolation in the selected process node. The wafer 3000 may also have an alignment mark 3020 on the same layers of the donor wafer as the n 3004 and p 3006 rows and accordingly may be used later to properly align additional patterning and processing steps to the n 3004 and p 3006 rows.

Figure 71:
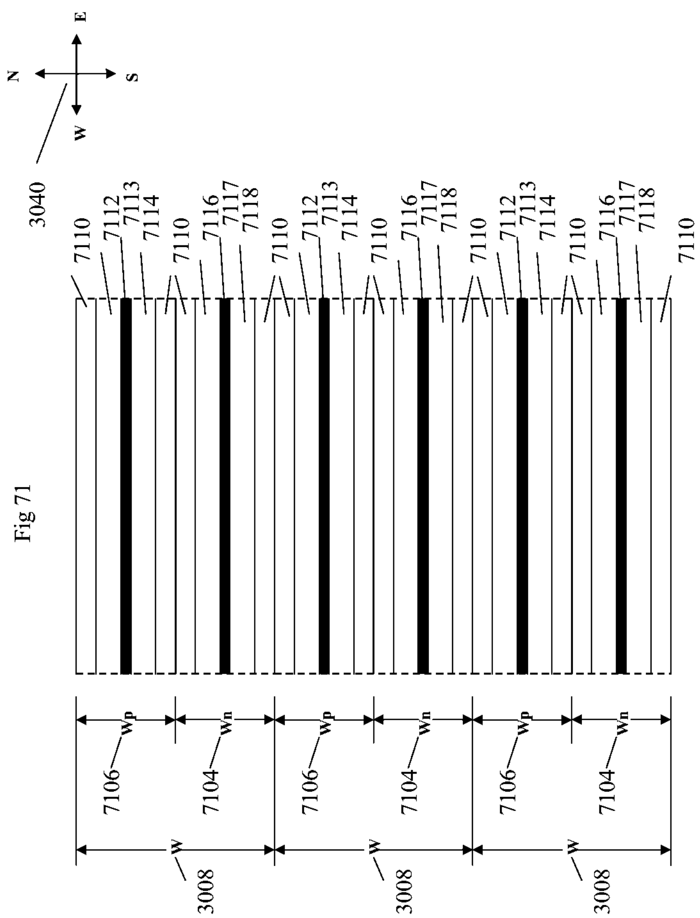
FIG. 71 is a drawing illustration of a layout for a donor wafer.

As illustrated in FIG. 71, the width of the p type transistor row width repeat Wp 7106 may be composed of two transistor isolations 7110 of width 2F each, plus a transistor source 7112 of width 2.5F, a PMOS gate 7113 of width F, and a transistor drain 7114 of width 2.5F. The total Wp may be 10F, where F is 2 times lambda, the minimum design rule. The width of the n type transistor row width repeat Wn 7104 may be composed of two transistor isolations 7110 of width 2F each, plus a transistor source 7116 of width 2.5F, a NMOS gate 7117 of width F, and a transistor drain 7118 of width 2.5F. The total Wn may be 10F and the total repeat W 3008 may be 20F.

The donor wafer layer 3000L, now thinned and the first-phase-transistor-formation pre-processed HKMG silicon layer 7001 with the attached carrier substrate 7014 completed as described previously in relation to FIG. 70E, may be placed on top of the acceptor wafer 3100 as illustrated in FIG. 31. The state of the art alignment methods allow for very good angular alignment of this bonding step but it is difficult to achieve a better than approximately 1 □m position alignment. FIG. 31 illustrates the acceptor wafer 3100 with its corresponding alignment mark 3120 and the transferred layer 3000L of the donor wafer with its corresponding alignment mark 3020. The misalignment in the East-West direction is DX 3124 and the misalignment in the North-South direction is DY 3122. These alignment marks 3120 and 3020 may be placed in only a few locations on each wafer, or within each step field, or within each die, or within each repeat W. The alignment approach involving residue Rdy 3202 and the landing zone stripes 33A04 and 33B04 as described previously in respect to FIGS. 32, 33A and 33B may be utilized to improve the density and reliability of the electrical connection from the transferred donor wafer layer to the acceptor wafer.

The low temperature post layer transfer process flow for the donor wafer layout with gates parallel to the source and drains as shown in FIG. 71 is illustrated in FIGS. 72A to 72F.

Figure 72A:
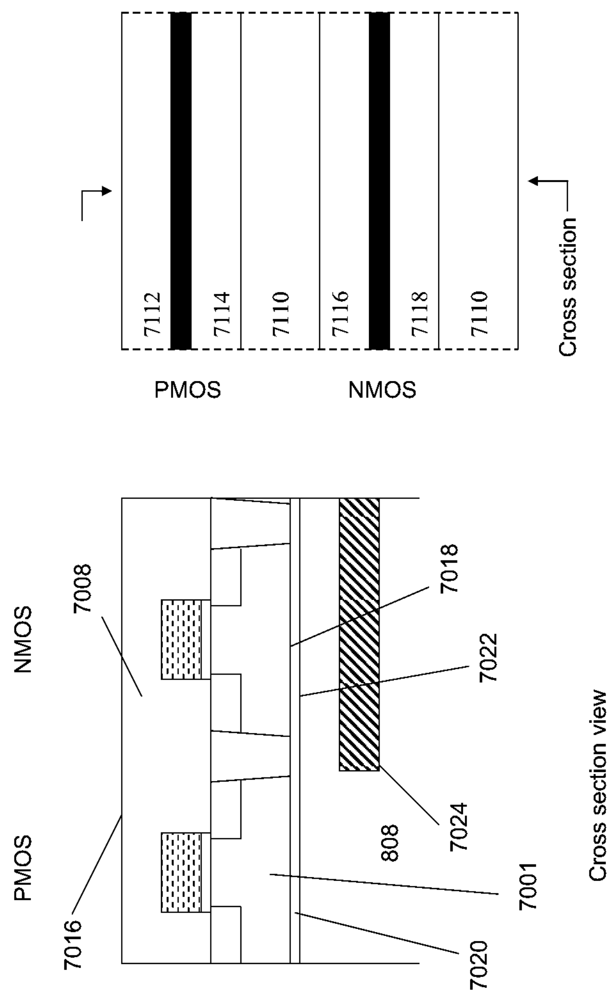
FIG. 72 A-F are drawing illustrations of formation of top planar transistors.

FIG. 72A illustrates the top view and cross-sectional view of the wafer after layer transfer of the first phase of transistor formation, layer transfer & bonding of the thin mono-crystalline preprocessed donor layer to the acceptor wafer, and release of the bonded structure from the carrier substrate, as previously described up to and including FIG. 70F.

Figure 72B:
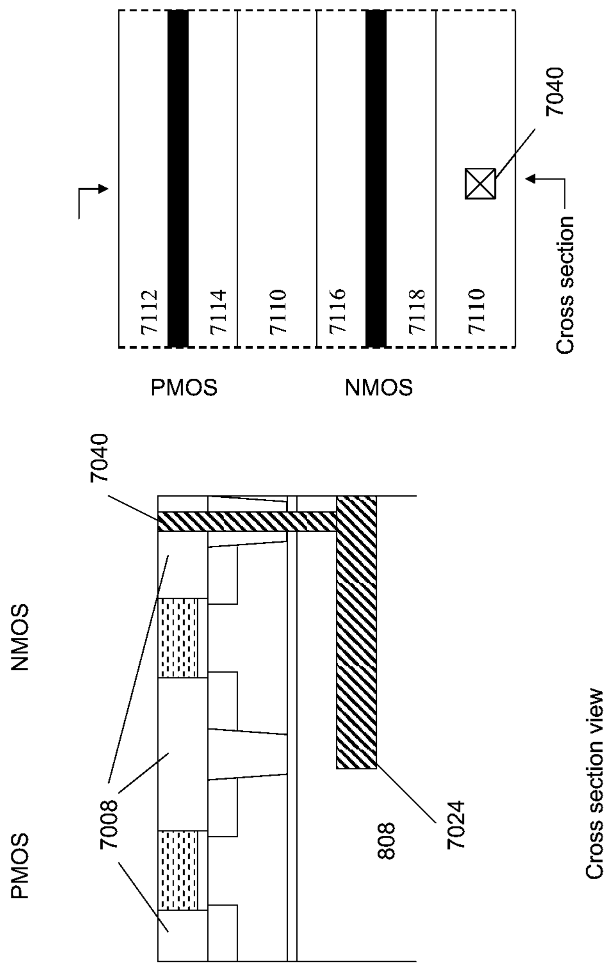

The interlayer dielectric (ILD) 7008 may be chemical mechanical polished (CMP'd) to expose the top of the dummy polysilicon and the layer-to-layer via 7040 may be etched, metal filled, and CMP'd flat as illustrated in FIG. 72B.

Figure 72C:
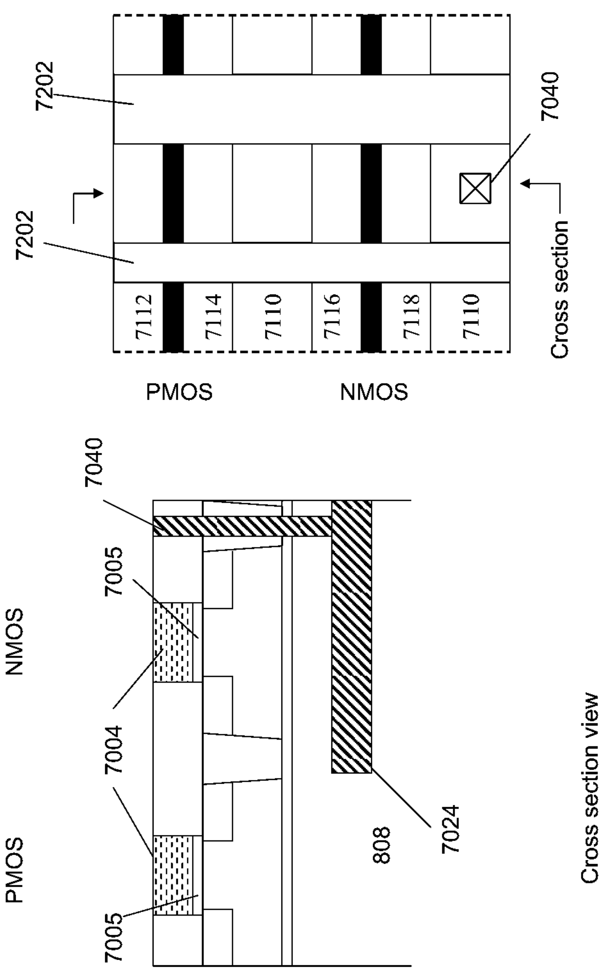

The long rows of pre-formed transistors may be etched into desired lengths or segments by forming isolation regions 7202 as illustrated in FIG. 72C. A low temperature oxidation may be performed to repair damage to the transistor edge and the regions 7202 may be filled with a dielectric and CMP'd flat so to provide isolation between transistor segments.

Alternatively, regions 7202 may be selectively opened and filled for the PMOS and NMOS transistors separately to provide compressive or tensile stress enhancement to the transistor channels for carrier mobility enhancement.

Figure 72D:
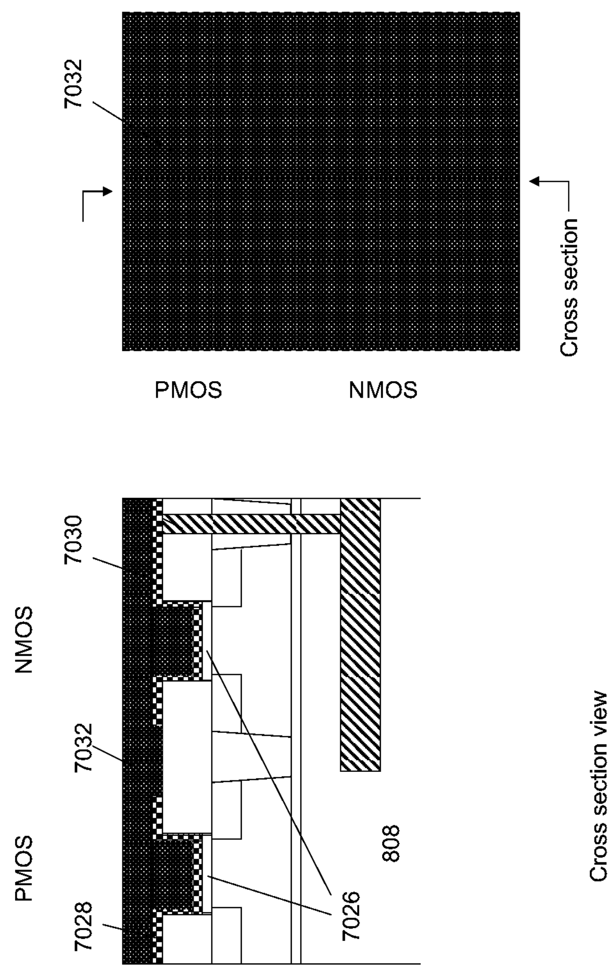

The polysilicon 7004 and oxide 7005 dummy gates may now be etched out to provide some gate overlap between the isolation 7202 edge and the normal replacement gate deposition of high-k dielectric 7026, PMOS metal gate 7028 and NMOS metal gate 7030. In addition, aluminum overfill 7032 may be performed. The CMP of the Aluminum 7032 may be performed to planarize the surface for the gate definition as illustrated in FIG. 72D.

Figure 72E:
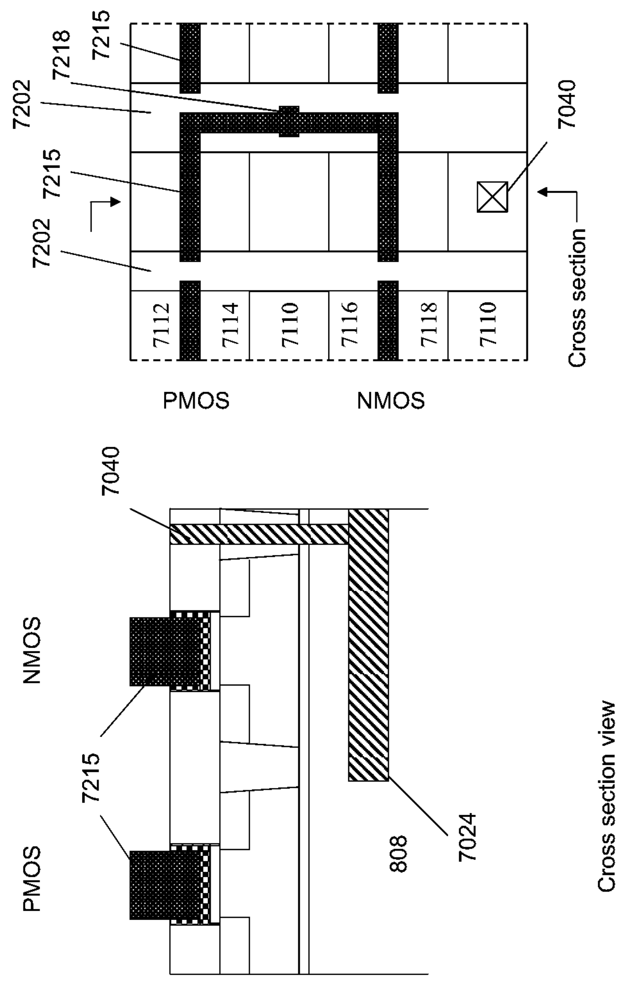

The replacement gates 7215 may be patterned and etched as illustrated in FIG. 72E and may provide a gate contact landing area 7218.

An interlayer dielectric may be deposited and planarized with CMP, and normal contact formation and metallization may be performed to make gate 7220, source 7222, drain 7224, and interlayer via 7240 connections as illustrated in FIG. 72F.

Figure 73:
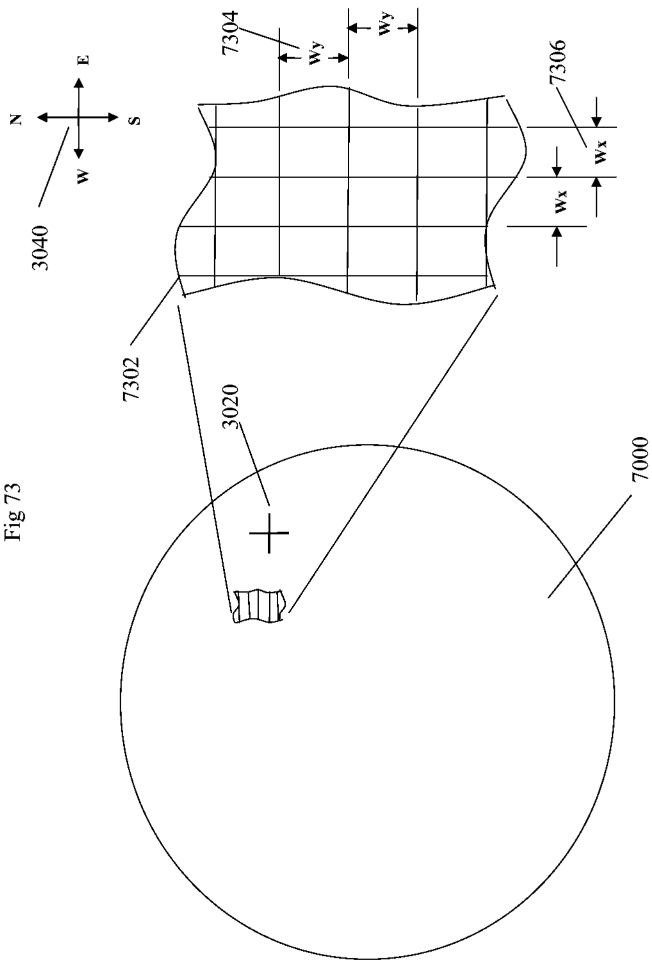
FIG. 73 is a drawing illustration of a donor wafer.
Figure 74:
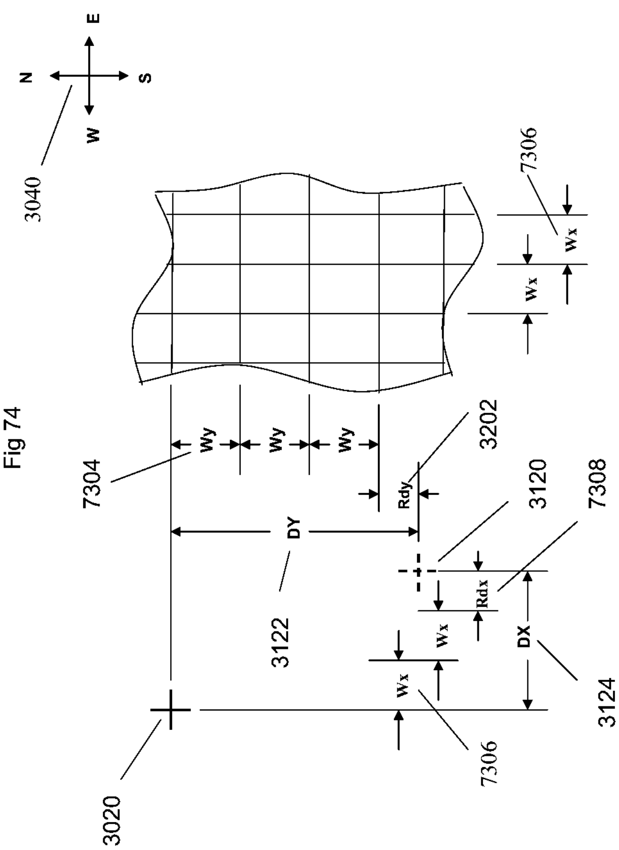
FIG. 74 is a drawing illustration of a measured alignment offset.
Figure 75:
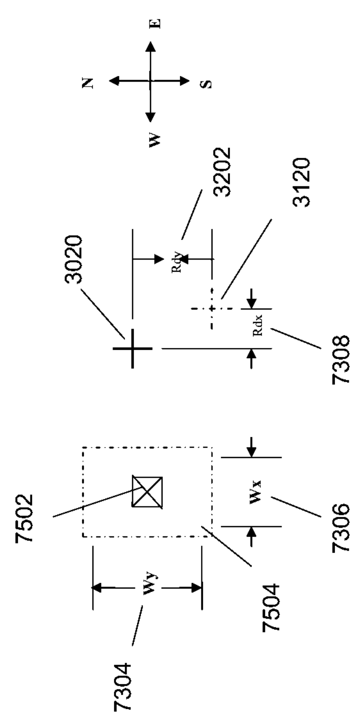
FIG. 75 is a drawing illustration of a connection strip.

In an alternative embodiment, the donor wafer 7000 may be pre-processed for the first phase of transistor formation to build n and p type dummy transistors comprising repeated patterns in both directions. FIGS. 73, 74, 75 include a four cardinal directions 3040 indicator, which may be used to assist the explanation. As illustrated in the blown-up projection 7302 in FIG. 73, the width Wy 7304 corresponds to the repeating pattern rows that may traverse the acceptor die East to West width plus the maximum donor wafer to acceptor wafer misalignment length, or alternatively traverse the length of the donor wafer from East to West, and the repeats may extend substantially all the way across the wafer from North to South. Similarly, the width Wx 7306 corresponds to the repeating pattern rows that may traverse the acceptor die North to South width plus the maximum donor wafer to acceptor wafer misalignment length, or alternatively traverse the length of the donor wafer from North to South, and the repeats may extend substantially all the way across the wafer from East to West. The donor wafer 7000 may also have an alignment mark 3020 on the same layers of the donor wafer as the Wx 7306 and Wy 7304 repeating patterns rows. Accordingly, alignment mark 3020 may be used later to properly align additional patterning and processing steps to said rows.

The donor wafer layer 3000L, now thinned and comprising the first phase of transistor formation pre-processed HKMG silicon layer 7001 with attached carrier substrate 7014 completed as described previously in relation to FIG. 70E, may be placed on top of the acceptor wafer 3100 as illustrated in FIG. 31. The state of the art alignment may allow for very good angular alignment of this bonding step but it is difficult to achieve a better than approximately 1 □m position alignment. FIG. 31 illustrates the acceptor wafer 3100 with its corresponding alignment mark 3120 and the transferred layer 3000L of the donor wafer with its corresponding alignment mark 3020. The misalignment in the East-West direction is DX 3124 and the misalignment in the North-South direction is DY 3122. These alignment marks may be placed in only a few locations on each wafer, or within each step field, or within each die, or within each repeat W.

The proposed structure, illustrated in FIG. 74, comprise repeating patterns in both the North-South and East-West direction of alternating rows of parallel transistor bands. The advantage of the proposed structure is that the transistor and the processing could be similar to the acceptor wafer processing, thereby significantly reducing the development cost of 3D integrated devices. Accordingly the effective alignment uncertainty may be reduced to Wy 7304 in the North to South direction and Wx 7306 in the West to East direction. Accordingly, the alignment residue Rdy 3202 (remainder of DY modulo Wy, 0<=Rdy<Wy) in the North to South direction could be calculated. Accordingly, the North-South direction alignment may be to the underlying alignment mark 3120 offset by Rdy 3202 to properly align to the nearest Wy. Similarly, the effective alignment uncertainty may be reduced to Wx 7306 in the East to West direction. The alignment residue Rdx 7308 (remainder of DX modulo Wx, 0<=Rdx<Wx) in the West to East direction could be calculated in a manner similar to that of Rdy 3202. Likewise, the East-West direction alignment may be performed to the underlying alignment mark 3120 offset by Rdx 7308 to properly align to the nearest Wx.

Each wafer to be processed according to this flow may have at least one specific Rdx 7308 and Rdy 3202 which may be subject to the actual misalignment DX 3124 and DY 3122 and Wx and Wy. The masks used for patterning the various circuit patterns may be pre-designed and fabricated and remain the same for substantially all wafers (processed for the same end-device) regardless of the actual wafer to wafer misalignment. In order to allow the connection between structures on the donor layer 7001 and the underlying acceptor wafer 808, the underlying wafer 808 may be designed to have a landing zone rectangle 7504 extending North-South of length Wy 7304 plus any extension necessary for the via design rules, and extending East-West of length Wx 7306 plus any extension required for the via design rules, as illustrated in FIG. 75. The landing zone rectangle extension for via design rules may also include angular misalignment of the wafer-to-wafer bonding not compensated by the stepper overlay algorithms, and may include uncompensated donor wafer bow and warp. The rectangle landing zone 7504 may be part of the acceptor wafer 808 and may be accordingly aligned to its alignment mark 3120. Through via 7502 going down and being part of the donor layer 7001 pattern may be aligned to the underlying alignment mark 3120 by offsets Rdx 7308 and Rdy 3202 respectively, providing connections to the landing zone 7504.

Figure 77:
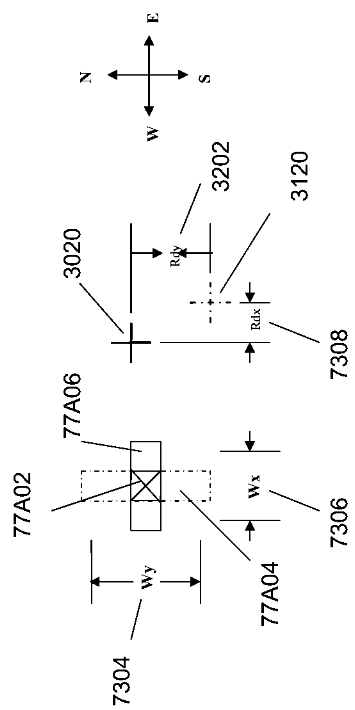
FIG. 77 is a drawing illustration of a connection strip.

In an alternative embodiment, the rectangular landing zone 7504 in acceptor substrate 808 may be replaced by a landing strip 77A04 in the acceptor wafer and an orthogonal landing strip 77A06 in the donor layer as illustrated in FIG. 77. Through via 77A02 going down and being part of the donor layer 7001 pattern may be aligned to the underlying alignment mark 3120 by offsets Rdx 7308 and Rdy 3202 respectively, providing connections to the landing strip 77A06.

Figure 76:
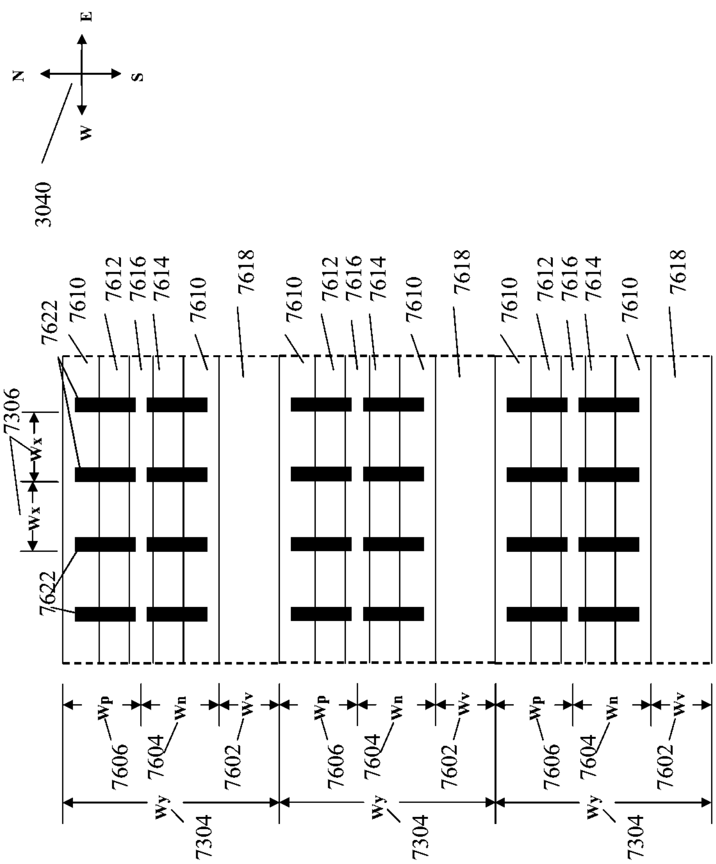
FIG. 76 is a drawing illustration of a layout for a donor wafer.

FIG. 76 illustrates a repeating pattern in both the North-South and East-West direction. This repeating pattern may be a repeating pattern of transistors, of which each transistor has gate 7622, forming a band of transistors along the East-West axis. The repeating pattern in the North-South direction may comprise parallel bands of transistors, of which each transistor has active area 7612 or 7614. The transistors may have their gates 7622 fully defined. The structure may therefore be repeating in East-West with repetitions of Wx 7306. In the North-South direction the structure may repeat every Wy 7304. The width Wv 7602 of the layer to layer via channel 7618 may be 5F, and the width of the n type transistor row width repeat Wn 7604 may be composed of two transistor isolations 7610 of 3F width and shared isolation region 7616 of 1F width, plus a transistor active area 7614 of width 2.5F. The width of the p type transistor row width repeat Wp 7606 may be composed of two transistor isolations 7610 of 3F width and shared 7616 of 1F, plus a transistor active area 7612 of width 2.5F. The total Wy 7304 may be 18F, the addition of Wv+Wn+Wp, where F is two times lambda, the minimum design rule. The gates 7622 may be of width F and spaced 4F apart from each other in the East-West direction. The East-West repeat width Wx 7306 may be 5F. Adjacent transistors in the East-West direction may be electrically isolated from each other by biasing the gate in-between to the appropriate off state; i.e., grounded gate for NMOS and Vdd gate for PMOS.

The donor wafer layer 3000L, now thinned and comprising the first-phase-transistor-formation pre-processed HKMG silicon layer 7001 with attached carrier substrate 7014 completed as described previously in relation to FIG. 70E, may be placed on top of the acceptor wafer 3100 as illustrated in FIG. 31. The DX 3124 and DY 3122 misalignment and, as described previously, the associated Rdx 7308 and Rdy 3202 may be calculated. The connection between structures on the donor layer 7001 and the underlying wafer 808, may be designed to have a landing strip 77A04 going North-South of length Wy 7304 plus any extension necessary for the via design rules, as illustrated in FIG. 77. The landing strip extension for via design rules may include angular misalignment of the wafer to wafer bonding not compensated for by the stepper overlay algorithms, and may include uncompensated donor wafer bow and warp. The strip 77A04 may be part of the wafer 808 and may be accordingly aligned to its alignment mark 3120. The landing strip 77A06 may be part of the donor wafer layers and may be oriented in parallel to the transistor bands and accordingly going East-West. Landing strip 77A06 may be aligned to the main wafer alignment mark 3120 with offsets of Rdx and Rdy (i.e., equivalent to alignment to donor wafer alignment mark 3020). Through via 77A02 connecting these two landing strips 77A04 and 77A06 may be part of a top layer 7001 pattern. The via 77A02 may be aligned to the main wafer 808 alignment mark in the West-East direction and to the main wafer alignment mark 3120 with Rdy offset in the North-South direction.

Figure 78A:
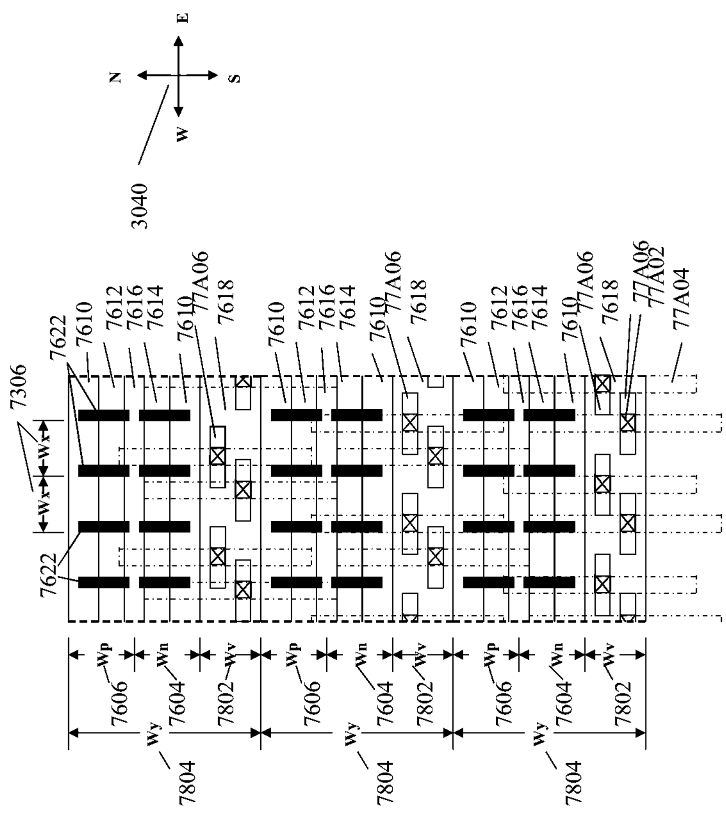
FIG. 78A, 78B, 78C are drawing illustrations of a layout for a donor wafer.

Alternatively, the repeating pattern of continuous diffusion sea of gates described in FIG. 76 may have an enlarged Wv 7802 for multiple rows of landing strips 77A06 as illustrated in FIG. 78A. The width Wv 7802 of the layer-to-layer via channel 7618 may be 10F, and the total Wy 7804 North-South pattern repeat may be 23F.

Figure 78B:
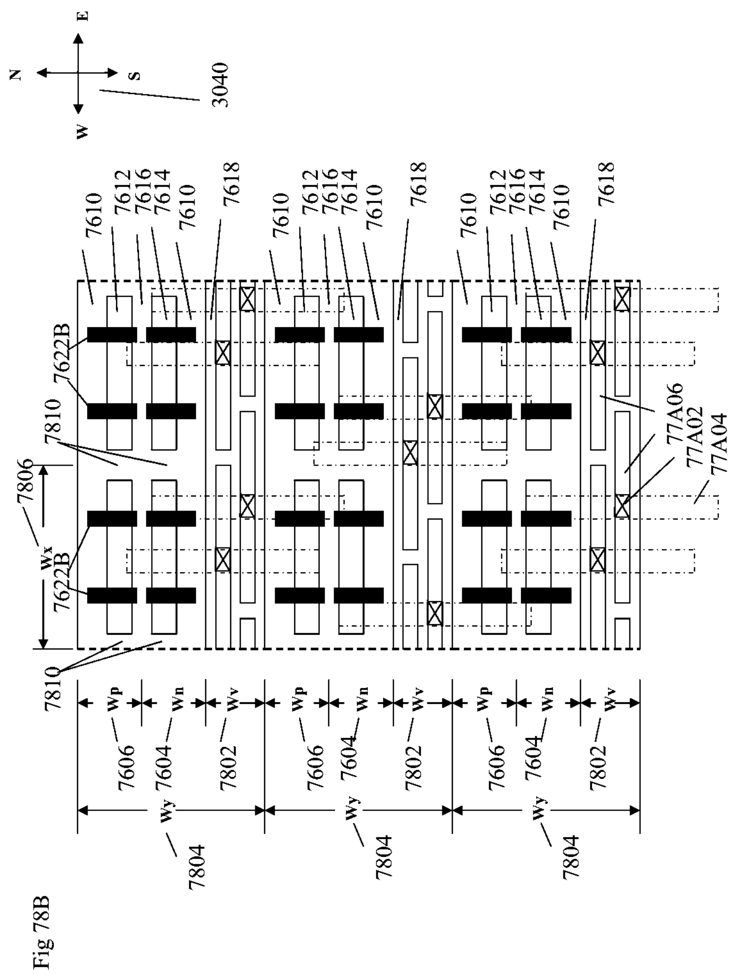

In an alternative embodiment, the gates 7622B may be repeated in the East to West direction as pairs with an additional repeat of isolations 7810 as illustrated in FIG. 78B. This repeating pattern of transistors, of which each transistor has gate 7622B, may form a band of transistors along the East-West axis. The repeating pattern in the North-South direction comprises parallel bands of these transistor, of which each transistor has active area 7612 or 7614. The East-West pattern repeat width Wx 7806 may be 14F and the length of the donor wafer landing strips 77A06 may be designed of length Wx 7806 plus any extension necessary by design rules as described previously. The donor wafer landing strip 77A06 may be oriented parallel to the transistor bands and accordingly going East-West.

Figure 78C:
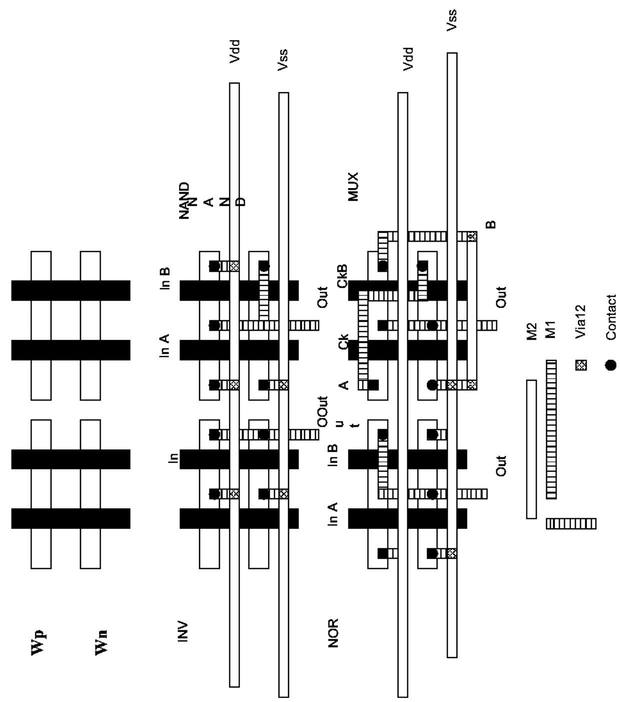

FIG. 78C illustrates a section of a Gate Array terrain with a repeating transistor cell structure. The cell is similar to the one of FIG. 78B wherein the respective gates of the N transistors are connected to the gates of the P transistors. FIG. 78C illustrates an implementation of basic logic cells: Inv, NAND, NOR, MUX.

Figure 79:
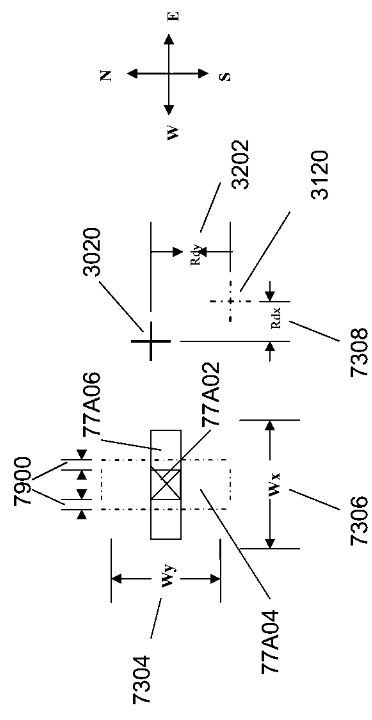
FIG. 79 is a drawing illustration of a connection strip.

Alternatively, to increase the density of thru layer via connections in the donor wafer layer to layer via channel, the donor landing strip 77A06 may be designed to be less than Wx 7306 in length by utilizing increases 7900 in the width of the landing strip in the House 77A04 and offsetting the through layer via 77A02 properly as illustrated in FIG. 79. The landing strips 77A04 and 77A06 may be aligned as described previously. Via 77A02 may be aligned to the main wafer alignment mark 3120 with Rdy offset in the North-South direction, and in the East-West direction to the acceptor wafer 808 alignment mark 3120 as described previously plus an additional shift towards East. The offset size may be equal to the reduction of the donor wafer landing strip 77A06.

In an additional embodiment, a block of a non repeating pattern device structures may be prepared on a donor wafer and layer transferred using the above described techniques. This donor wafer of non-repeating pattern device structure may be a memory block of DRAM, or a block of Input-Output circuits, or any other block. A general connectivity structure 8002 may be used to connect the donor wafer non-repeating pattern device structure 8004 to the acceptor wafer—house wafer die 8000.

Figure 80:
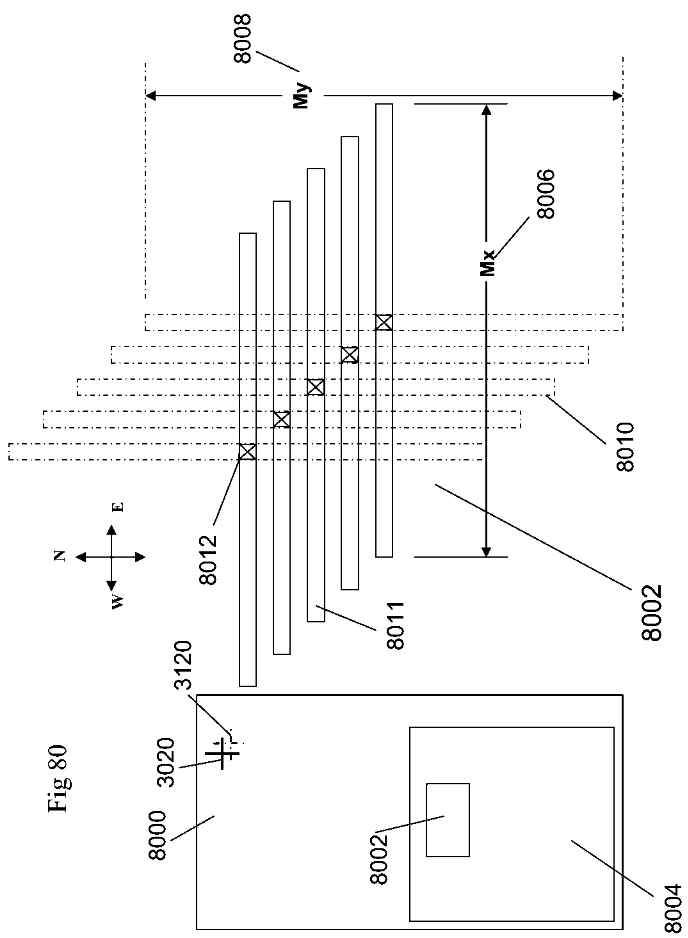
FIG. 80 is a drawing illustration of a connection strip array structure.

House 808 wafer die 8000 is illustrated in FIG. 80. The connectivity structure 8002 may be drawn inside or outside of the non-repeating structure 8004. Mx 8006 may be the maximum donor wafer to acceptor wafer 8000 misalignment plus any extension necessary by design rules as described previously in the East-West direction and My 8008 may be the maximum donor wafer to acceptor wafer misalignment plus any extension necessary by design rules as described previously in the North-South direction from the layer transfer process. Mx 8006 and My 8008 may also include incremental misalignment resulting from the angular misalignment of the wafer to wafer bonding not compensated for by the stepper overlay algorithms, and may include uncompensated donor wafer bow and warp. The acceptor wafer North-South landing strip 8010 may have a length of My 8008 aligned to the acceptor wafer alignment mark 3120. The donor wafer East-West landing strip 8011 may have a length of Mx 8006 aligned to the donor wafer alignment mark 3020. The through layer via 8012 connecting them may be aligned to the acceptor wafer alignment mark 3120 in the East West direction and to the donor wafer alignment mark 3020 in the North-South direction. For the purpose of illustration, the lower metal landing strip of the donor wafer was oriented East-West and the upper metal landing strip of the acceptor was oriented North-South. The orientation of the landing strips could be exchanged.

The donor wafer may comprise sections of repeating device structure elements such as those illustrated in FIG. 76 and FIG. 78B in combination with device structure elements that do not repeat. These two elements, one repeating and the other non-repeating, would be patterned separately since the non-repeating elements pattern should be aligned to the donor wafer alignment mark 3020, while the pattern for the repeating elements would be aligned to the acceptor wafer alignment mark 3120 with an offset (Rdx & Rdy) as was described previously. Accordingly, a variation of the general connectivity structure illustrated in FIG. 80 could be used to connect between to these two elements. The East-West landing strips 8011 could be aligned to the donor wafer alignment marks 3020 together with the non repeating elements and the North-South landing strips 8010 would be aligned to the acceptor wafer alignment mark 3120 with the offset together with the repeating elements pattern. The vias 8012 connecting these strips would need to be aligned in the North-South direction to the donor wafer alignment marks 3020 and in the East-West direction to the acceptor wafer alignment mark 3120 with the offset.

The above flows, whether single type transistor donor wafer or complementary type transistor donor wafer, could be repeated multiple times to build a multi level 3D monolithic integrated system. These flows could also provide a mix of device technologies in a monolithic 3D manner. For example, device I/O or analog circuitry such as, for example, phase-locked loops (PLL), clock distribution, or RF circuits could be integrated with CMOS logic circuits via layer transfer, or bipolar circuits could be integrated with CMOS logic circuits, or analog devices could be integrated with logic, and so on. Prior art shows alternative technologies of constructing 3D devices. The most common technologies are, either using thin film transistors (TFT) to construct a monolithic 3D device, or stacking prefabricated wafers and then using a through silicon via (TSV) to connect the prefabricated wafers. The TFT approach is limited by the performance of thin film transistors while the stacking approach is limited by the relatively large lateral size of the TSV via (on the order of a few microns) due to the relatively large thickness of the 3D layer (about 60 microns) and accordingly the relatively low density of the through silicon vias connecting them. According to many embodiments of the present invention that construct 3D IC based on layer transfer techniques, the transferred layer may be a thin layer of less than 0.4 micron. This 3D IC with transferred layer according to some embodiments of the present invention is in sharp contrast to TSV based 3D ICs in the prior art where the layers connected by TSV are more than 5 microns thick and in most cases more than 50 microns thick.

The alternative process flows presented in FIGS. 20 to 35, 40, 54 to 61, and 65 to 94 provides true monolithic 3D integrated circuits. It allows the use of layers of single crystal silicon transistors with the ability to have the upper transistors aligned to the underlying circuits as well as those layers aligned each to other and only limited by the Stepper capabilities. Similarly the contact pitch between the upper transistors and the underlying circuits is compatible with the contact pitch of the underlying layers. While in the best current stacking approach the stack wafers are a few microns thick, the alternative process flow presented in FIGS. 20 to 35, 40, 54 to 61, and 65 to 94 suggests very thin layers of typically 100 nm, but recent work has demonstrated layers approximately 20 nm thin.

Accordingly the presented alternatives allow for true monolithic 3D devices. This monolithic 3D technology provides the ability to integrate with full density, and to be scaled to tighter features, at the same pace as the semiconductor industry.

Additionally, true monolithic 3D devices allow the formation of various sub-circuit structures in a spatially efficient configuration with higher performance than 2D equivalent structures. Illustrated below are some examples of how a 3D 'library' of cells may be constructed in the true monolithic 3D fashion.

Figure 42:
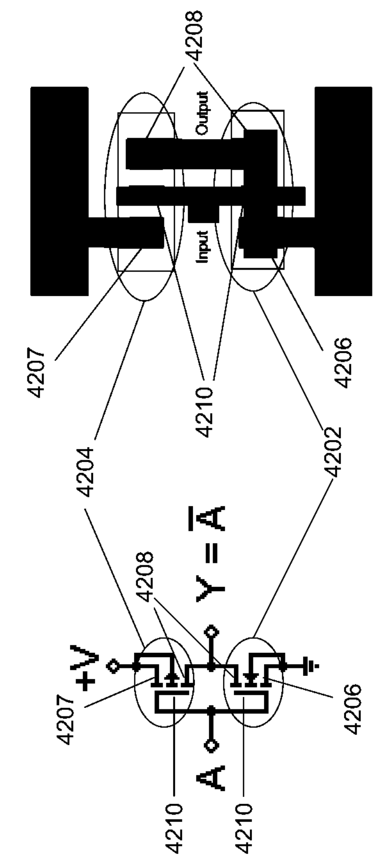
FIG. 42 is a drawing illustration of an inverter cell.

FIG. 42 illustrates a typical 2D CMOS inverter layout and schematic diagram where the NMOS transistor 4202 and the PMOS transistor 4204 are laid out side by side and are in differently doped wells. The NMOS source 4206 is typically grounded, the NMOS and PMOS drains 4208 are electrically tied together, the NMOS & PMOS gates 4210 are electrically tied together, and the PMOS 4207 source is tied to +Vdd. The structure built in 3D described below will take advantage of these connections in the 3rd dimension.

Figure 43A:
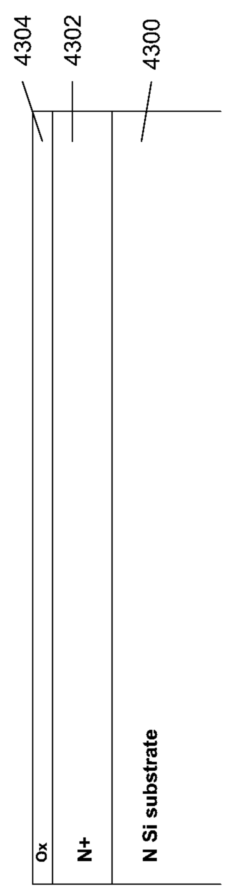
FIG. 43 A-C is a drawing illustration of preparation steps for formation of a 3D cell.
Figure 43B:
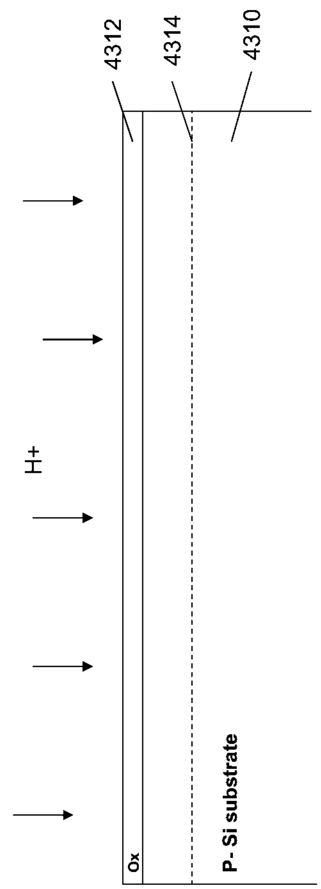
Figure 43C:
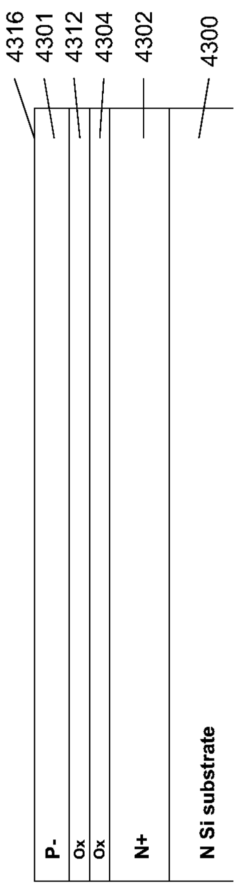

An acceptor wafer is preprocessed as illustrated in FIG. 43A. A heavily doped N single crystal silicon wafer 4300 may be implanted with a heavy dose of N+ species, and annealed to create an even lower resistivity layer 4302. Alternatively, a high temperature resistant metal such as Tungsten may be added as a low resistance interconnect layer, as a sheet layer or as a defined geometry metallization. An oxide 4304 is grown or deposited to prepare the wafer for bonding. A donor wafer is preprocessed to prepare for layer transfer as illustrated in FIG. 43B. FIG. 43B is a drawing illustration of the pre-processed donor wafer used for a layer transfer. A P− wafer 4310 is processed to make it ready for a layer transfer by a deposition or growth of an oxide 4312, surface plasma treatments, and by an implant of an atomic species such as H+ preparing the SmartCut cleaving plane 4314. Now a layer-transfer-flow may be performed to transfer the pre-processed single crystal silicon donor wafer on top of the acceptor wafer as illustrated in FIG. 43C. The cleaved surface 4316 may or may not be smoothed by a combination of CMP, chemical polish, and epitaxial (EPI) smoothing techniques.

Figure 44A:
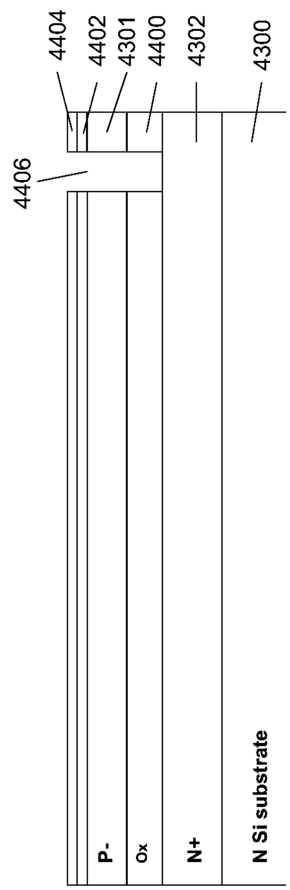
FIG. 44 A-F is a drawing illustration of steps for formation of a 3D cell.
Figure 44B:
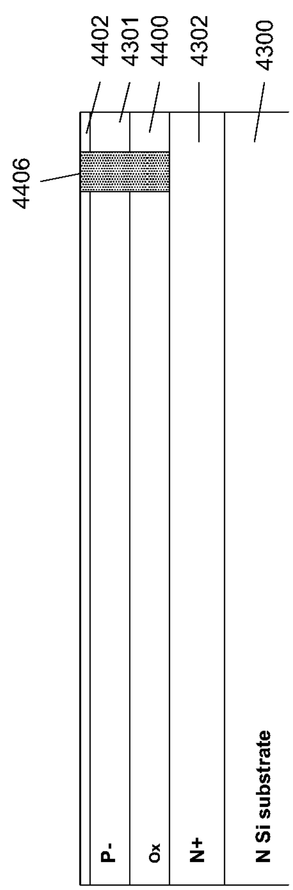

A process flow to create devices and interconnect to build the 3D library is illustrated in FIGS. 44A to G. As illustrated in FIG. 44A, a polish stop layer 4404, such as silicon nitride or amorphous carbon, may be deposited after a protecting oxide layer 4402. The NMOS source to ground connection 4406 is masked and etched to contact the heavily doped N+ layer 4302 that serves as a ground plane. This may be done at typical contact layer size and precision. For the sake of clarity, the two oxide layers, 4304 from the acceptor and 4312 from the donor wafer, are combined and designated as 4400. The NMOS source to ground connection 4406 is filled with a deposition of heavily doped polysilicon or amorphous silicon, or a high melting point metal such as tungsten, and then chemically mechanically polished as illustrated in FIG. 44B to the level of the protecting oxide layer 4404.

Figure 44C:
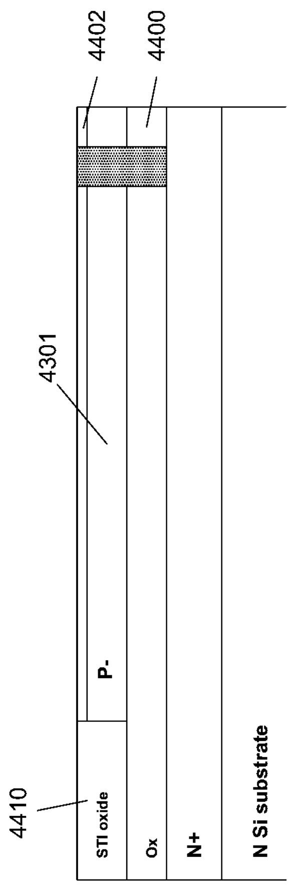

Now a standard NMOS transistor formation process flow is performed, with two exceptions. First, no photolithographic masking steps are used for an implant step that differentiates NMOS and PMOS devices, as only the NMOS devices are being formed now. Second, high temperature anneal steps may or may not be done during the NMOS formation, as some or substantially all of the necessary anneals can be done after the PMOS formation described later. A typical shallow trench (STI) isolation region 4410 is formed between the eventual NMOS transistors by masking, plasma etching of the unmasked regions of P− layer 4301 to the oxide layer 4400, stripping the masking layer, depositing a gap-fill oxide, and chemical mechanically polishing the gap-fill oxide flat as illustrated in FIG. 44C. Threshold adjust implants may or may not be performed at this time. The silicon surface is cleaned of remaining oxide with an HF (Hydrofluoric Acid) etch.

Figure 44D:
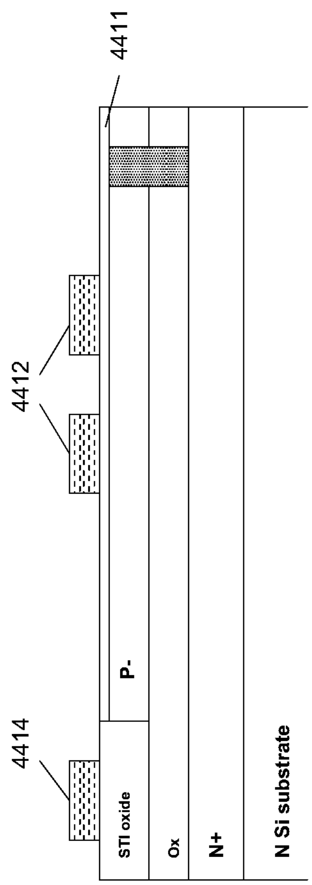

A gate oxide 4411 is thermally grown and doped polysilicon is deposited to form the gate stack. The gate stack is lithographically defined and etched, creating NMOS gates 4412 and the poly on STI interconnect 4414 as illustrated in FIG. 44D. Alternatively, a high-k metal gate process sequence may be utilized at this stage to form the gate stacks 4412 and interconnect over STI 4414. Gate stack self aligned LDD (Lightly Doped Drain) and halo punch-thru implants may be performed at this time to adjust junction and transistor breakdown characteristics.

Figure 44E:
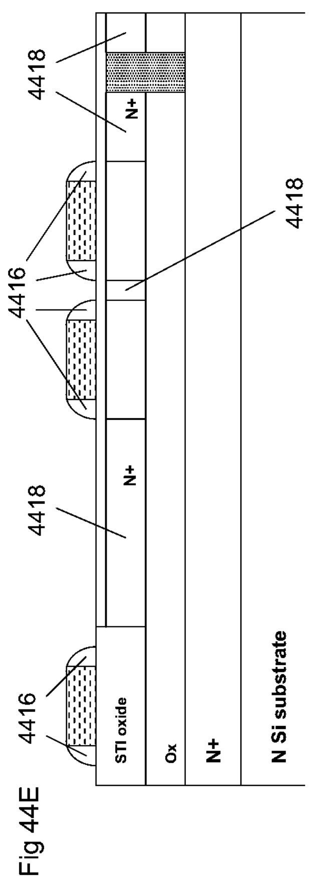
Figure 44F:
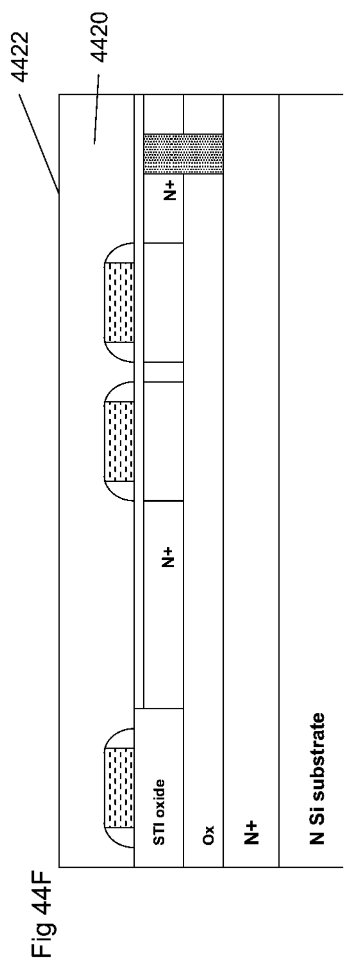

FIG. 44E illustrates a typical spacer deposition of oxide and nitride and a subsequent etchback, to form implant offset spacers 4416 on the gate stacks and then a self aligned N+ source and drain implant is performed to create the NMOS transistor source and drain 4418. High temperature anneal steps may or may not be done at this time to activate the implants and set initial junction depths. A self aligned silicide may then be formed. Additionally, one or more metal interconnect layers with associated contacts and vias (not shown) may be constructed utilizing standard semiconductor manufacturing processes. The metal layer may be constructed at lower temperature using such metals as Copper or Aluminum, or may be constructed with refractory metals such as Tungsten to provide high temperature utility at greater than 400 degrees Centigrade. A thick oxide 4420 may be deposited as illustrated in FIG. 44F and CMP'd (chemical mechanically polished) flat. The wafer surface 4422 may be treated with a plasma activation in preparation to be an acceptor wafer for the next layer transfer.

Figure 45A:
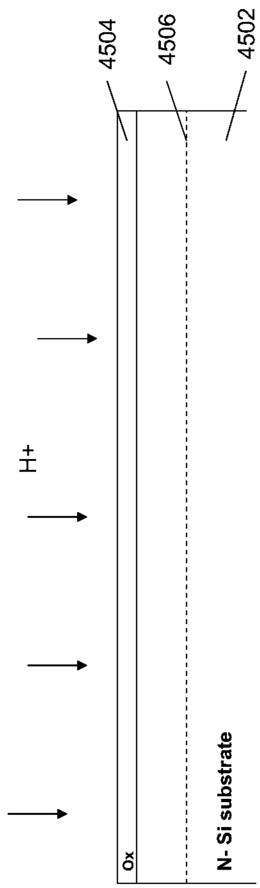
FIG. 45 A-G is a drawing illustration of steps for formation of a 3D cell.

A donor wafer to create PMOS devices is preprocessed to prepare for layer transfer as illustrated in FIG. 45A. An N− wafer 4502 is processed to make it ready for a layer transfer by a deposition or growth of an oxide 4504, surface plasma treatments, and by an implant of an atomic species, such as H+, preparing the SmartCut cleaving plane 4506.

Figure 45B:
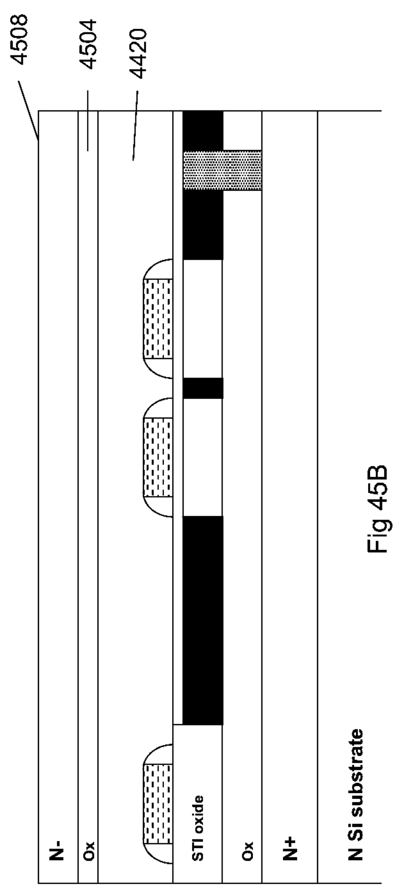

Now a layer-transfer-flow may be performed to transfer the pre-processed single crystal silicon donor wafer on top of the acceptor wafer as illustrated in FIG. 45B, bonding the acceptor wafer oxide 4420 to the donor wafer oxide 4504. To optimize the PMOS mobility, the donor wafer may be rotated 90 degrees with respect to the acceptor wafer as part of the bonding process to facilitate creation of the PMOS channel in the <110> silicon plane direction. The cleaved surface 4508 may or may not be smoothed by a combination of CMP, chemical polish, and epitaxial (EPI) smoothing techniques.

For the sake of clarity, the two oxide layers, 4420 from the acceptor and 4504 from the donor wafer, are combined and designated as 4500. Now a standard PMOS transistor formation process flow is performed, with one exception. No photolithographic masking steps are used for the implant steps that differentiate NMOS and PMOS devices, as only the PMOS devices are being formed now. An advantage of this 3D cell structure is the independent formation of the PMOS transistors and the NMOS transistors. Therefore, each transistor formation may be optimized independently. This may be accomplished by the independent selection of the crystal orientation, various stress materials and techniques, such as, for example, doping profiles, material thicknesses and compositions, temperature cycles, and so forth.

Figure 45C:
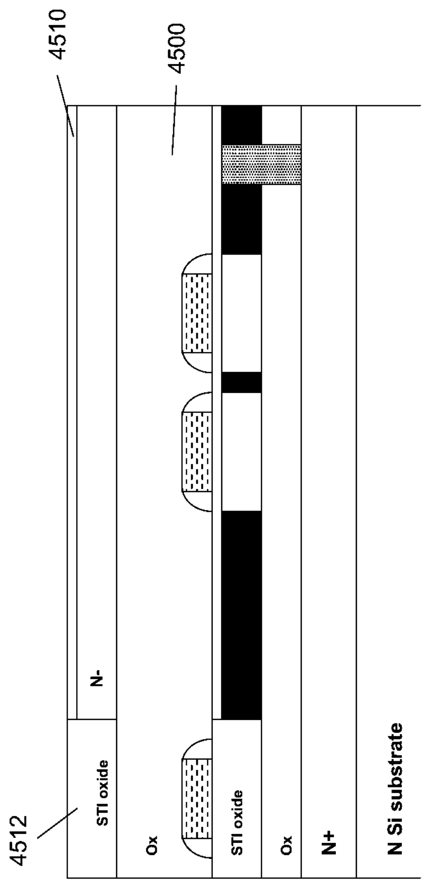

A polishing stop layer, such as silicon nitride or amorphous carbon, may be deposited after a protecting oxide layer 4510. A typical shallow trench (STI) isolation region 4512 is formed between the eventual PMOS transistors by lithographic definition, plasma etching to the oxide layer 4500, depositing a gap-fill oxide, and chemical mechanically polishing flat as illustrated in FIG. 45C. Threshold adjust implants may or may not be performed at this time.

Figure 45D:
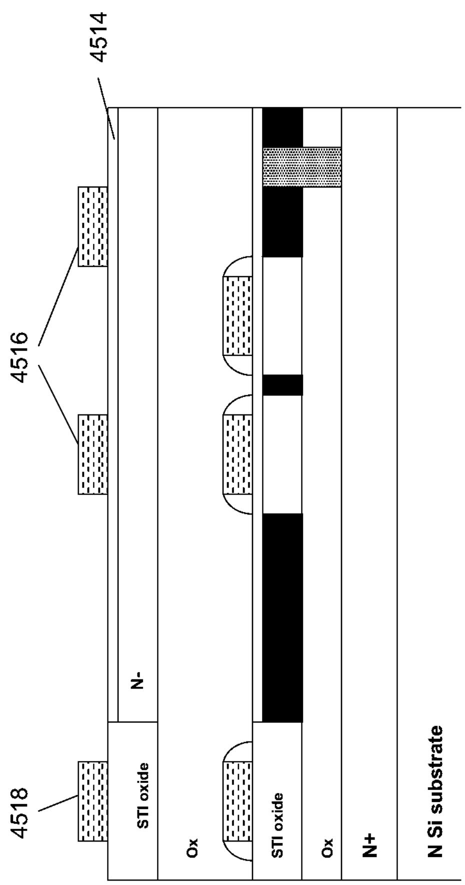

The silicon surface is cleaned of remaining oxide with an HF (Hydrofluoric Acid) etch. A gate oxide 4514 is thermally grown and doped polysilicon is deposited to form the gate stack. The gate stack is lithographically defined and etched, creating PMOS gates 4516 and the poly on STI interconnect 4518 as illustrated in FIG. 45D. Alternatively, a high-k metal gate process sequence may be utilized at this stage to form the gate stacks 4516 and interconnect over STI 4518. Gate stack self aligned LDD (Lightly Doped Drain) and halo punch-thru implants may be performed at this time to adjust junction and transistor breakdown characteristics.

Figure 45E:
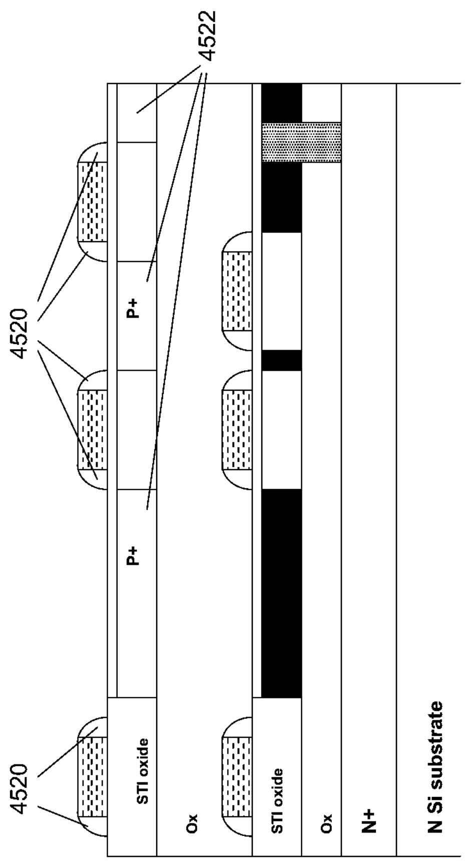

FIG. 45E illustrates a typical spacer deposition of oxide and nitride and a subsequent etchback, to form implant offset spacers 4520 on the gate stacks and then a self aligned P+ source and drain implant is performed to create the PMOS transistor source and drain regions 4522. Thermal anneals to activate implants and set junctions in both the PMOS and NMOS devices may be performed with RTA (Rapid Thermal Anneal) or furnace thermal exposures. Alternatively, laser annealing may be utilized after the NMOS and PMOS sources and drain implants to activate implants and set the junctions. Optically absorptive and reflective layers as described previously may be employed to anneal implants and activate junctions.

Figure 45F:
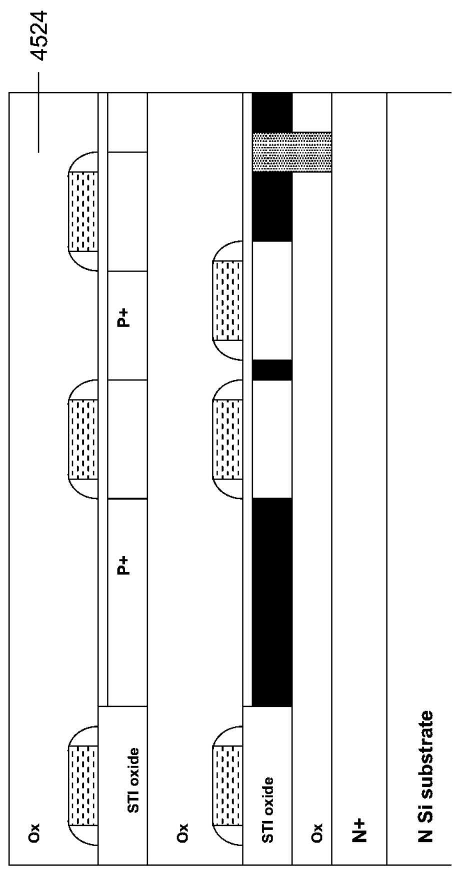

A thick oxide 4524 is deposited as illustrated in FIG. 45F and CMP'ed (chemical mechanically polished) flat.

Figure 45G:
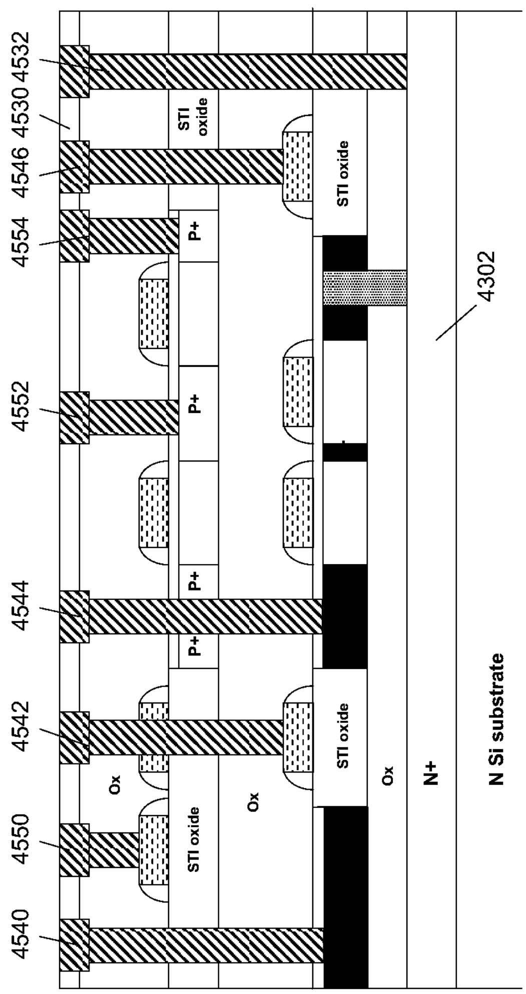

FIG. 45G illustrates the formation of the three groups of eight interlayer contacts. An etch stop and polishing stop layer or layers 4530 may be deposited, such as silicon nitride or amorphous carbon. First, the deepest contact 4532 to the N+ ground plane layer 4302, as well as the NMOS drain only contact 4540 and the NMOS only gate on STI contact 4546 are masked and etched in a first contact step. Then the NMOS & PMOS gate on STI interconnect contact 4542 and the NMOS and PMOS drain contact 4544 are masked and etched in a second contact step. Then the PMOS level contacts are masked and etched: the PMOS gate interconnect on STI contact 4550, the PMOS only source contact 4552, and the PMOS only drain contact 4554 in a third contact step. Alternatively, the shallowest contacts may be masked and etched first, followed by the mid-level, and then the deepest contacts. The metal lines are mask defined and etched, filled with barrier metals and copper interconnect, and CMP'ed in a normal Dual Damascene interconnect scheme, thereby completing the eight types of contact connections.

Figure 46A:
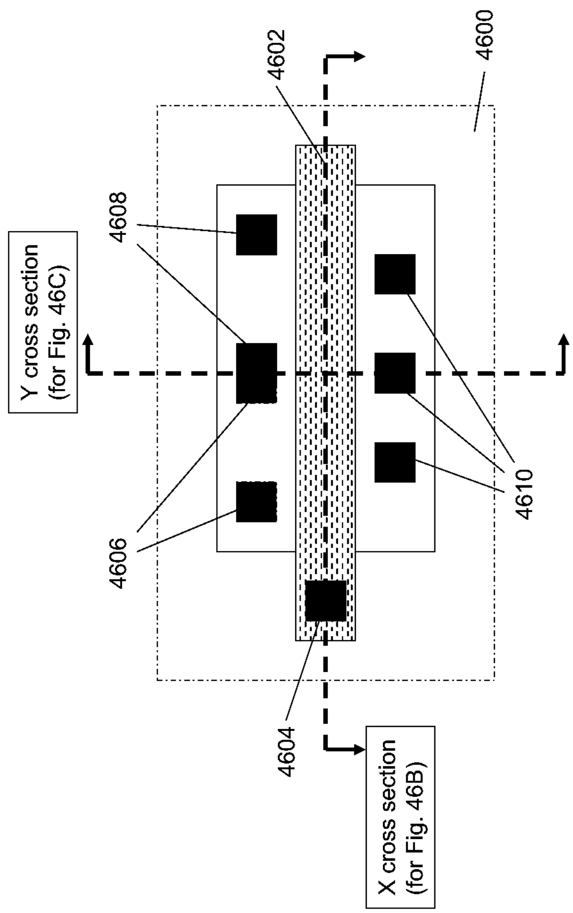
FIG. 46 A-C is a drawing illustration of a layout and cross sections of a 3D inverter cell.
Figure 46B:
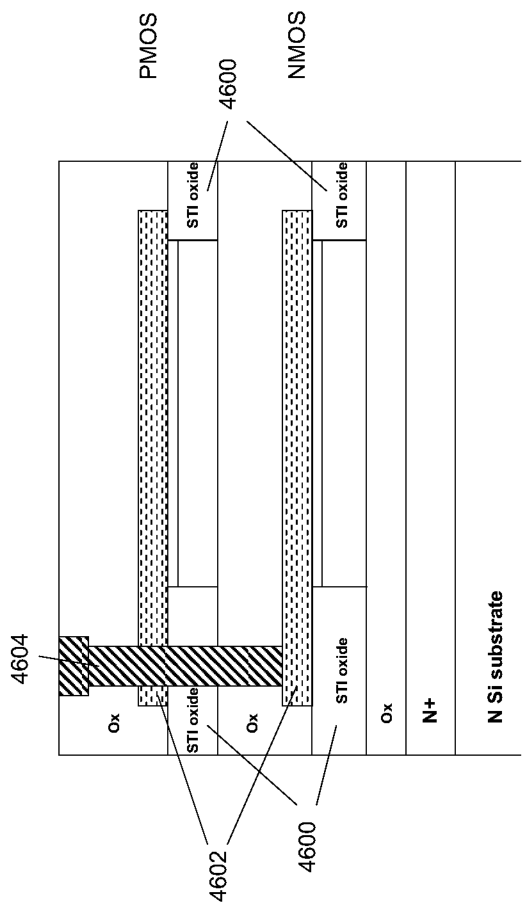
Figure 46C:
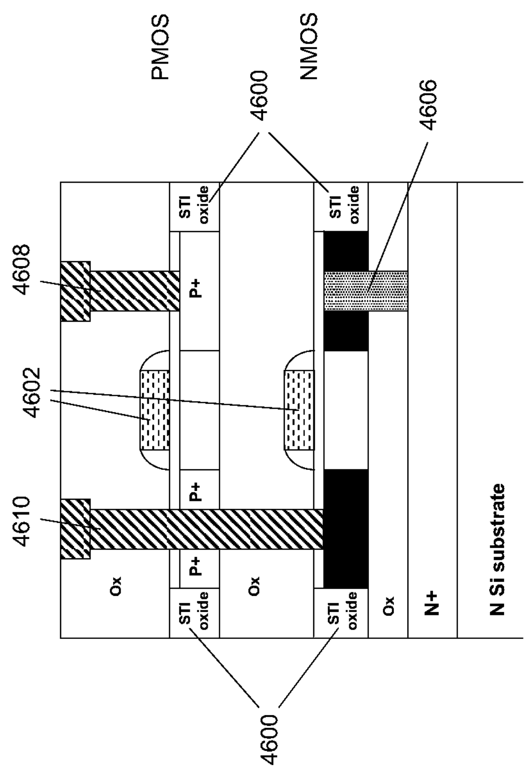

With reference to the 2D CMOS inverter cell schematic and layout illustrated in FIG. 42, the above process flow may be used to construct a compact 3D CMOS inverter cell example as illustrated in FIGS. 46A thru 46C. The topside view of the 3D cell is illustrated in FIG. 46A where the STI (shallow trench isolation) 4600 for both NMOS and PMOS is drawn coincident and the PMOS is on top of the NMOS.

The X direction cross sectional view is illustrated in FIG. 46B and the Y direction cross sectional view is illustrated in FIG. 46C. The NMOS and PMOS gates 4602 are drawn coincident and stacked, and are connected by an NMOS gate on STI to PMOS gate on STI contact 4604, which is similar to contact 4542 in FIG. 45G. This is the connection for inverter input signal A as illustrated in FIG. 42. The N+ source contact to the ground plane 4606, which is similar to contact 4406 in FIG. 44B, in FIGS. 46A & C makes the NMOS source to ground connection 4206 illustrated in FIG. 42. The PMOS source contacts 4608, which are similar to contact 4552 in FIG. 45G, make the PMOS source connection to +V 4207 as shown in FIG. 42. The NMOS and PMOS drain shared contacts 4610, which are similar to contact 4544 in FIG. 45G, make the shared connection 4208 as the output Y in FIG. 42. The ground to ground plane contact, similar to contact 4532 in FIG. 45G, is not shown. This contact may not be needed in every cell and may be shared.

Figure 47:
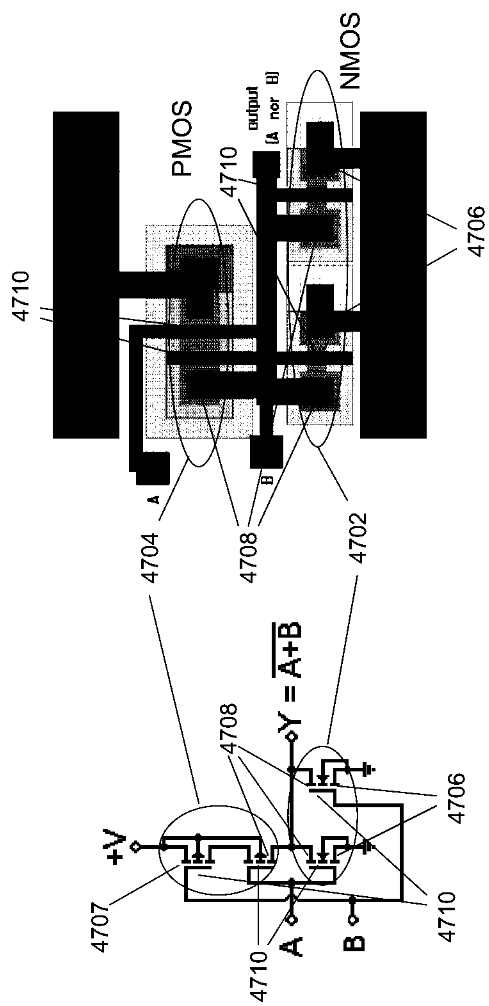
FIG. 47 is a drawing illustration of a 2-input NOR cell.

Other 3D logic or memory cells may be constructed in a similar fashion. An example of a typical 2D 2-input NOR cell schematic and layout is illustrated in FIG. 47. The NMOS transistors 4702 and the PMOS transistors 4704 are laid out side by side and are in differently doped wells. The NMOS sources 4706 are typically grounded, both of the NMOS drains and one of the PMOS drains 4708 are electrically tied together to generate the output Y, and the NMOS & PMOS gates 4710 are electrically paired together for input A or input B. The structure built in 3D described below will take advantage of these connections in the 3rd dimension.

Figure 48A:
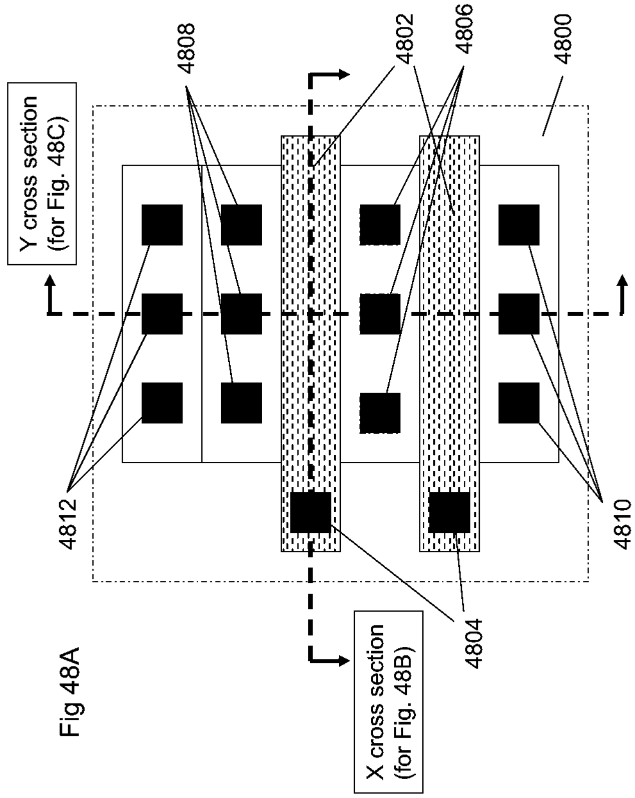
FIG. 48 A-C are drawing illustrations of a layout and cross sections of a 3D 2-input NOR cell.
Figure 48B:
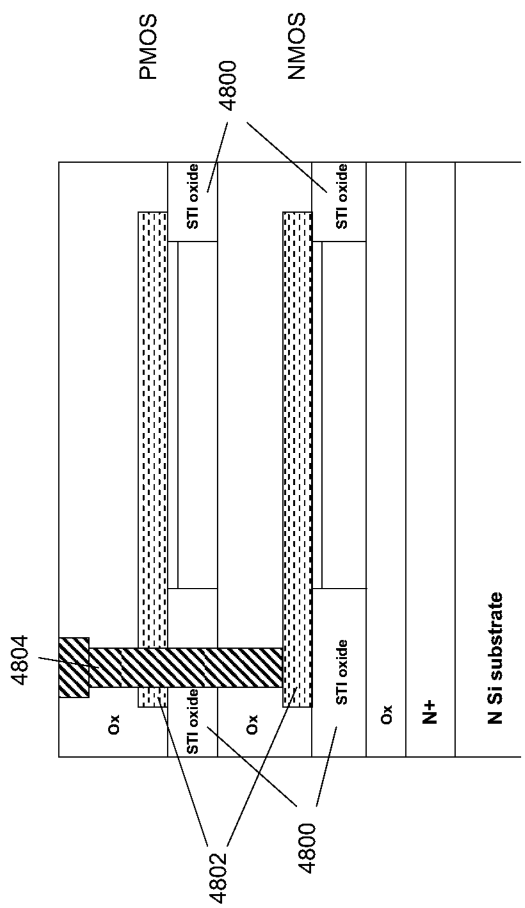
Figure 48C:
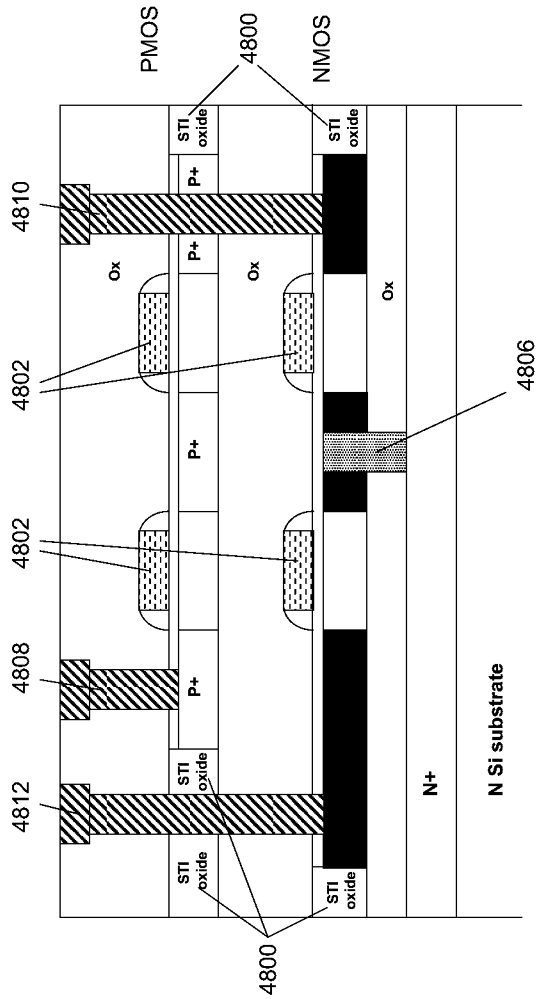

The above process flow may be used to construct a compact 3D 2-input NOR cell example as illustrated in FIGS. 48A thru 48C. The topside view of the 3D cell is illustrated in FIG. 48A where the STI (shallow trench isolation) 4800 for both NMOS and PMOS is drawn coincident on the bottom and sides, and not on the top silicon layer to allow NMOS drain only connections to be made. The cell X cross sectional view is illustrated in FIG. 48B and the Y cross sectional view is illustrated in FIG. 48C.

The NMOS and PMOS gates 4802 are drawn coincident and stacked, and each are connected by a NMOS gate on STI to PMOS gate on STI contact 4804, which is similar to contact 4542 in FIG. 45G. These are the connections for input signals A & B as illustrated in FIG. 47.

The N+ source contact to the ground plane 4806 in FIGS. 48A & C makes the NMOS source to ground connection 4706 illustrated in FIG. 47. The PMOS source contacts 4808, which are similar to contact 4552 in FIG. 45G, make the PMOS source connection to +V 4707 as shown in FIG. 47. The NMOS and PMOS drain shared contacts 4810, which are similar to contact 4544 in FIG. 45G, make the shared connection 4708 as the output Y in FIG. 47. The NMOS source contacts 4812, which are similar to contact 4540 in FIG. 45, make the NMOS connection to Output Y, which is connected to the NMOS and PMOS drain shared contacts 4810 with metal to form output Y in FIG. 47. The ground to ground plane contact, similar to contact 4532 in FIG. 45G, is not shown. This contact may not be needed in every cell and may be shared.

Figure 49A:
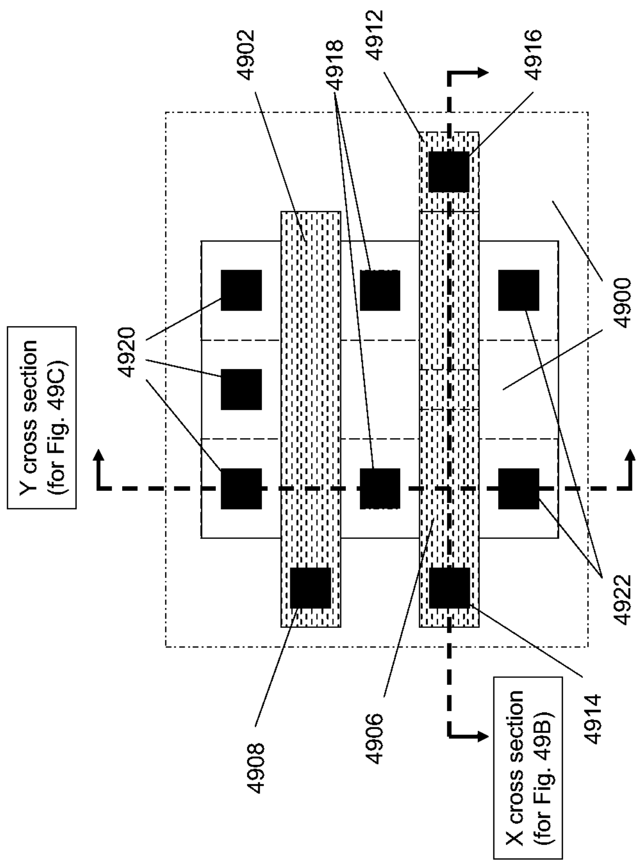
FIG. 49 A-C are drawing illustrations of a 3D 2-input NOR cell.
Figure 49B:
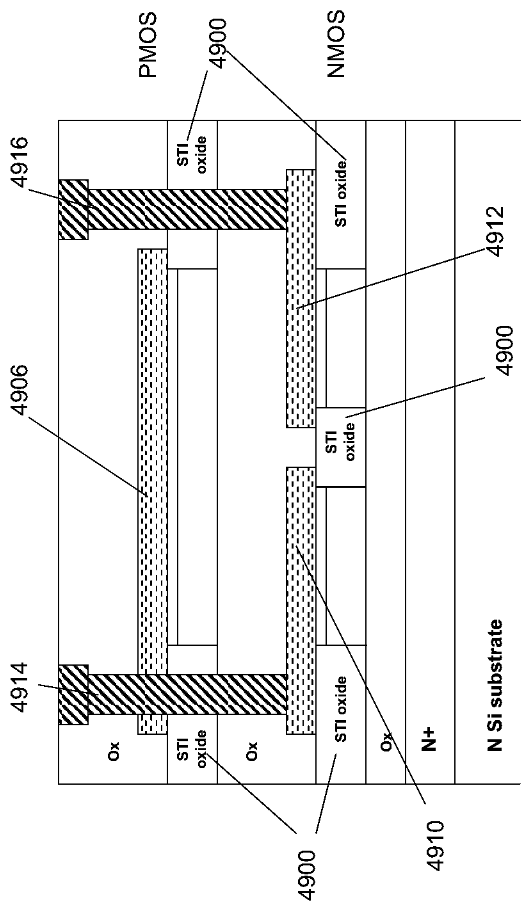
Figure 49C:
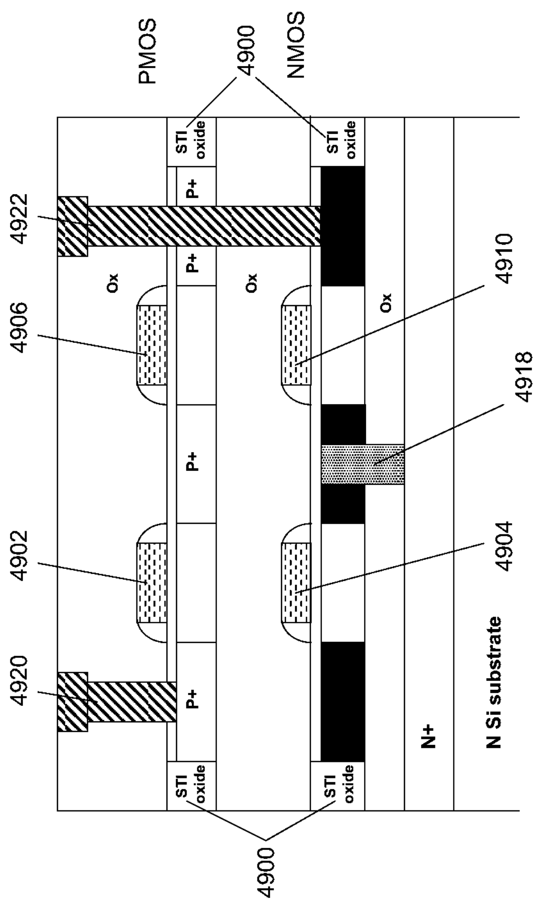

The above process flow may be used to construct an alternative compact 3D 2-input NOR cell example as illustrated in FIGS. 49A thru 49C. The topside view of the 3D cell is illustrated in FIG. 49A where the STI (shallow trench isolation) 4900 for both NMOS and PMOS may be drawn coincident on the top and sides, but not on the bottom silicon layer to allow isolation between the NMOS-A and NMOS-B transistors and allow independent gate connections. The NMOS or PMOS transistors referred to with the letter -A or -B identify which NMOS or PMOS transistor gate is connected to, either the A input or the B input, as illustrated in FIG. 47. The cell X cross sectional view is illustrated in FIG. 49B and the Y cross sectional view is illustrated in FIG. 49C.

The PMOS-B gate 4902 may be drawn coincident and stacked with dummy gate 4904, and the PMOS-B gate 4902 is connected to input B by PMOS gate only on STI contact 4908. Both the NMOS-A gate 4910 and NMOS-B gate 4912 are drawn underneath the PMOS-A gate 4906. The NMOS-A gate 4910 and the PMOS-A gate 4912 are connected together and to input A by NMOS gate on STI to PMOS gate on STI contact 4914, which is similar to contact 4542 in FIG. 45G. The NMOS-B gate 4912 is connected to input B by a NMOS only gate on STI contact 4916, which is similar to contact 4546 illustrated in FIG. 45G. These are the connections for input signals A & B 4710 as illustrated in FIG. 47.

The N+ source contact to the ground plane 4918 in FIGS. 49A & C forms the NMOS source to ground connection 4706 illustrated in FIG. 47 and is similar to ground connection 4406 in FIG. 44B. The PMOS-B source contacts 4920 to Vdd, which are similar to contact 4552 in FIG. 45G, form the PMOS source connection to +V 4707 as shown in FIG. 47. The NMOS-A, NMOS-B, and PMOS-B drain shared contacts 4922, which are similar to contact 4544 in FIG. 45G, form the shared connection 4708 as the output Y in FIG. 47. The ground to ground plane contact, similar to contact 4532 in FIG. 45G, is not shown. This contact may not be needed in every cell and may be shared.

Figure 50A:
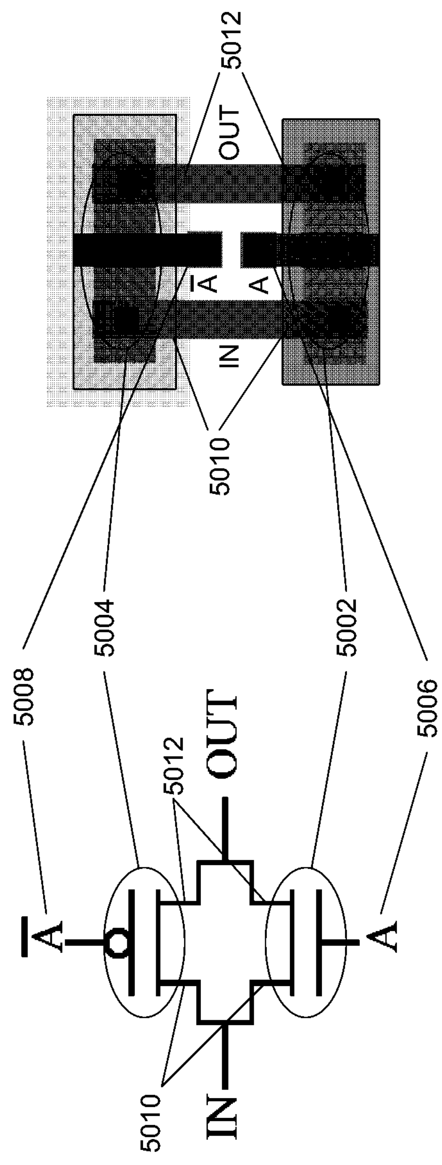
FIG. 50 A-D are drawing illustrations of a 3D CMOS Transmission cell.

The above process flow may also be used to construct a CMOS transmission gate. An example of a typical 2D CMOS transmission gate schematic and layout is illustrated in FIG. 50A. The NMOS transistor 5002 and the PMOS transistor 5004 are laid out side by side and are in differently doped wells. The control signal A as the NMOS gate input 5006 and its complement $\overline{A}$ as the PMOS gate input 5008 allow a signal from the input to fully pass to the output when both NMOS and PMOS transistors are turned on (A=1, $\overline{A}$=0), and not to pass any input signal when both are turned off (A=0, $\overline{A}$=1). The NMOS and PMOS sources 5010 are electrically tied together and to the input, and the NMOS and PMOS drains 5012 are electrically tied together to generate the output. The structure built in 3D described below will take advantage of these connections in the 3rd dimension.

Figure 50B:
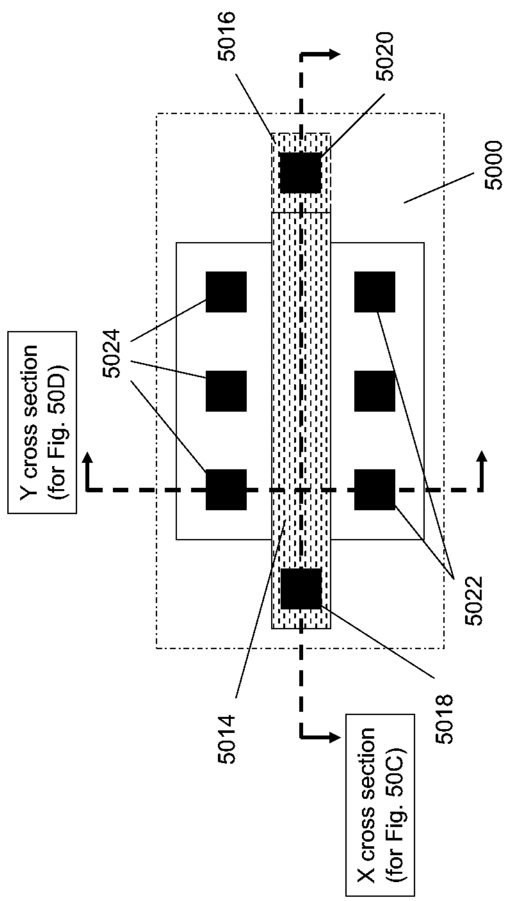
Figure 50C:
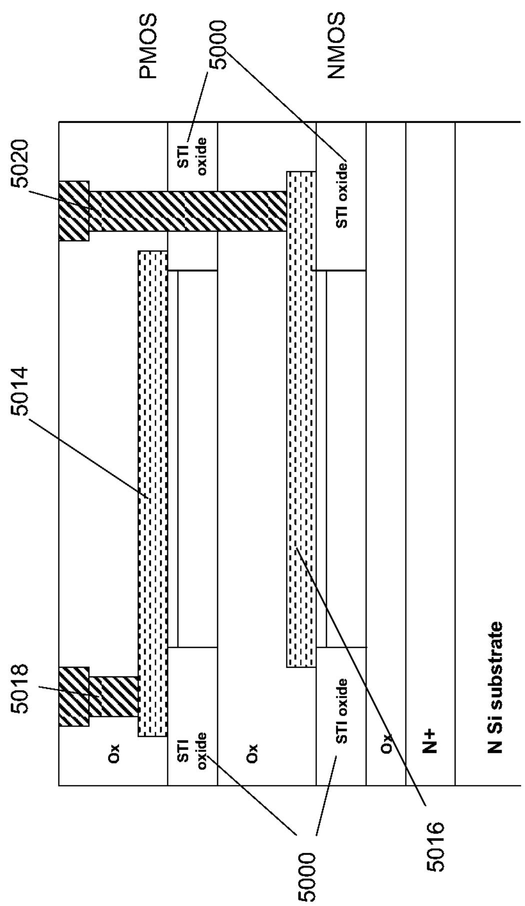
Figure 50D:
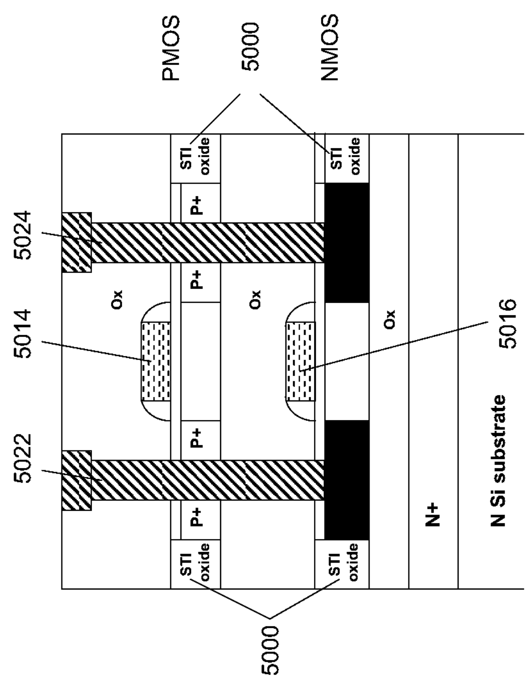

The above process flow may be used to construct a compact 3D CMOS transmission cell example as illustrated in FIGS. 50B thru 50D. The topside view of the 3D cell is illustrated in FIG. 50B where the STI (shallow trench isolation) 5000 for both NMOS and PMOS may be drawn coincident on the top and sides. The cell X cross sectional view is illustrated in FIG. 50C and the Y cross sectional view is illustrated in FIG. 50D. The PMOS gate 5014 may be drawn coincident and stacked with the NMOS gate 5016. The PMOS gate 5014 is connected to control signal $\overline{A}$ 5008 by PMOS gate only on STI contact 5018. The NMOS gate 5016 is connected to control signal A 5006 by NMOS gate only on STI contact 5020. The NMOS and PMOS source shared contacts 5022 make the shared connection 5010 for the input in FIG. 50A. The NMOS and PMOS drain shared contacts 5024 make the shared connection 5012 for the output in FIG. 50A.

Additional logic and memory cells, such as a 2-input NAND gate, a transmission gate, an MOS driver, a flip-flop, a 6T SRAM, a floating body DRAM, a CAM (Content Addressable Memory) array, etc. may be similarly constructed with this 3D process flow and methodology.

Another more compact 3D library may be constructed whereby one or more layers of metal interconnect may be allowed between the NMOS and PMOS devices. This methodology may allow more compact cell construction especially when the cells are complex; however, the top PMOS devices should now be made with a low-temperature layer transfer and transistor formation process as shown previously, unless the metals between the NMOS and PMOS layers are constructed with refractory metals, such as, for example, Tungsten.

Accordingly, the library process flow proceeds as described above for FIGS. 43 and 44. Then the layer or layers of conventional metal interconnect may be constructed on top of the NMOS devices, and then that wafer is treated as the acceptor wafer or 'House' wafer 808 and the PMOS devices may be layer transferred and constructed in one of the low temperature flows as shown in FIGS. 21, 22, 29, 39, and 40.

Figure 51A:
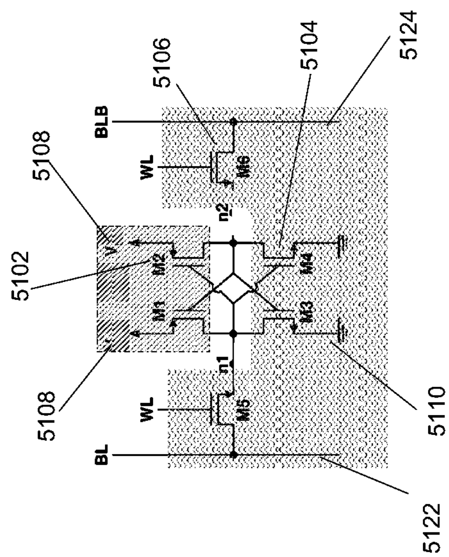
FIG. 51A-D are drawing illustrations of a 3D CMOS SRAM cell.

The above process flow may be used to construct, for example, a compact 3D CMOS 6-Transistor SRAM (Static Random Access Memory) cell as illustrated, for example, in FIGS. 51A thru 51D. The SRAM cell schematic is illustrated in FIG. 51A. Access to the cell is controlled by the word line transistors M5 and M6 where M6 is labeled as 5106. These access transistors control the connection to the bit line 5122 and the bit line bar line 5124. The two cross coupled inverters M1-M4 are pulled high to Vdd 5108 with M1 or M2 5102, and are pulled to ground 5110 thru transistors M3 or M4 5104.

Figure 51B:
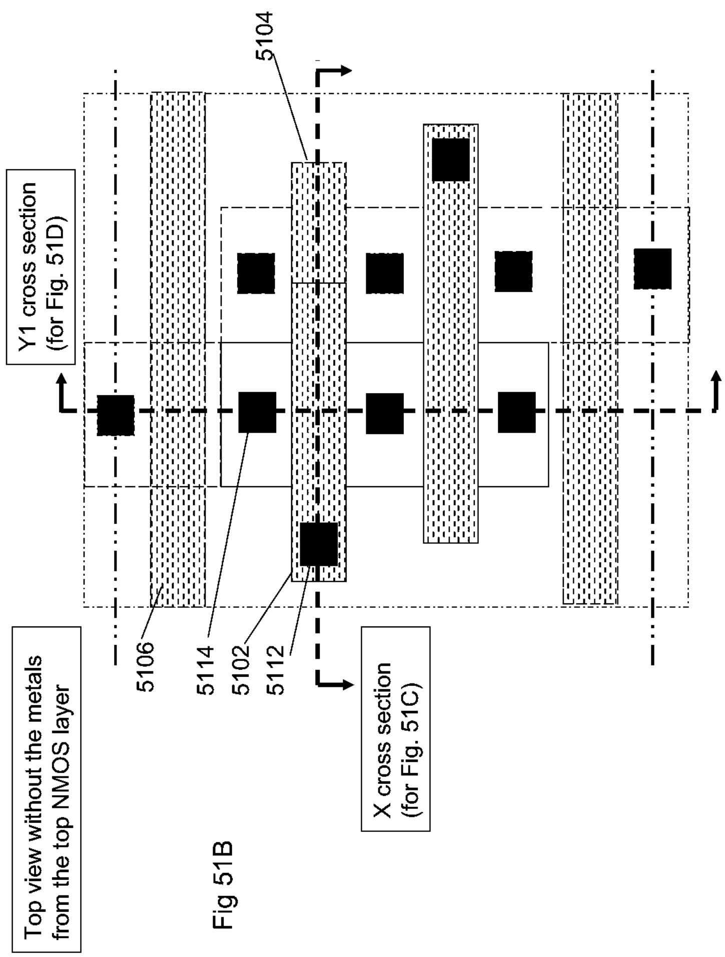
Figure 51C:
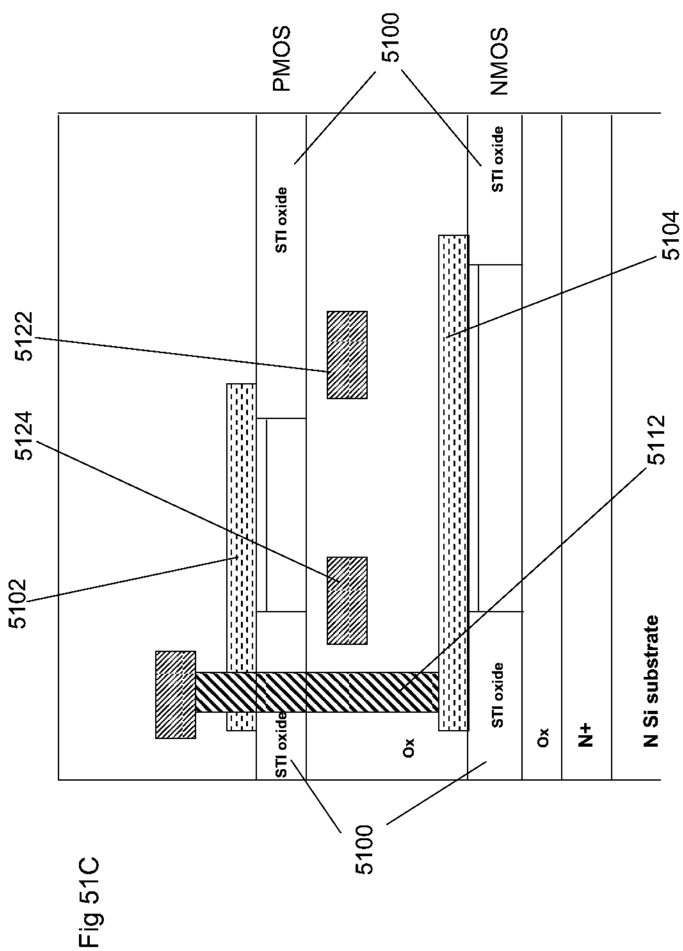
Figure 51D:
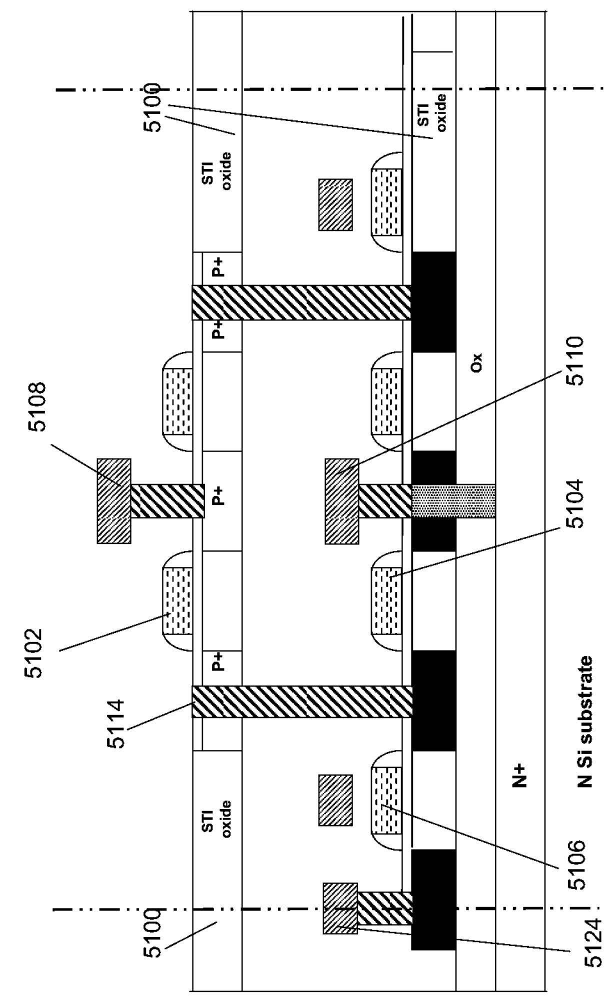

The topside NMOS, with no metal shown, view of the 3D SRAM cell is illustrated in FIG. 51B, the SRAM cell X cross sectional view is illustrated in FIG. 51C, and the Y cross sectional view is illustrated in FIG. 51D. NMOS word line access transistor M6 5106 is connected to the bit line bar 5124 with a contact to NMOS metal 1. The NMOS pull down transistor 5104 is connected to the ground line 5110 by a contact to NMOS metal 1 and to the back plane N+ ground layer. The bit line 5122 in NMOS metal 1 and transistor isolation oxide 5100 are illustrated. The Vdd supply 5108 is brought into the cell on PMOS metal 1 and connected to M2 5102 thru a contact to P+. The PMOS poly on STI to NMOS poly on STI contact 5112 connects the gates of both M2 5102 and M4 5104 to illustrate the 3D cross coupling. The common drain connection of M2 and M4 to the bit bar access transistor M6 is made thru the PMOS P+ to NMOS N+ contact 5114.

Figure 62A:
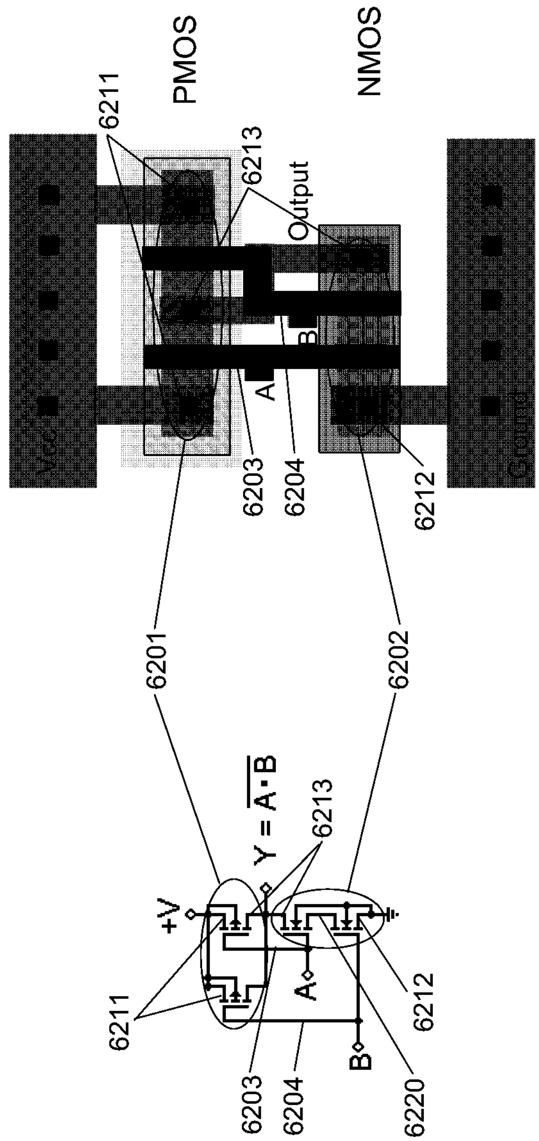
FIG. 62 A-D are drawing illustrations of a 3D NAND2 cell.

The above process flow may also be used to construct a compact 3D CMOS 2 Input NAND cell example as illustrated in FIGS. 62A thru 62D. The NAND-2 cell schematic and 2D layout is illustrated in FIG. 62A. The two PMOS transistor 6201 sources 6211 are tied together and to V+ supply and the PMOS drains are tied together and to one NMOS drain 6213 and to the output Y. Input A 6203 is tied to one PMOS gate and one NMOS gate. Input B 6204 is tied to the other PMOS and NMOS gates. For the two NMOS transistors 6202, the NMOS A drain is tied 6220 to the NMOS B source. The PMOS B drain 6212 is tied to ground. The structure built in 3D described below will take advantage of these connections in the 3rd dimension.

Figure 62B:
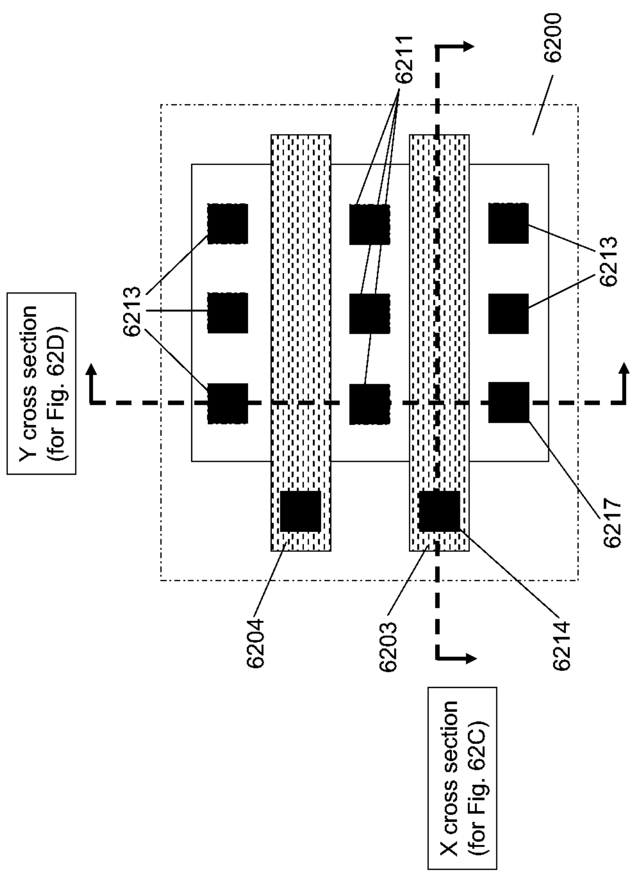
Figure 62C:
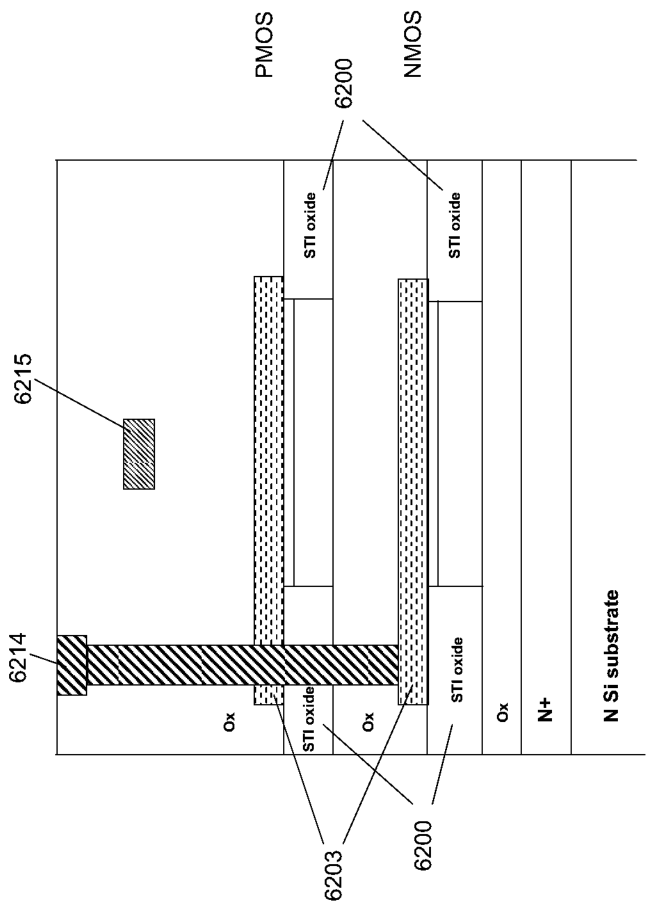
Figure 62D:
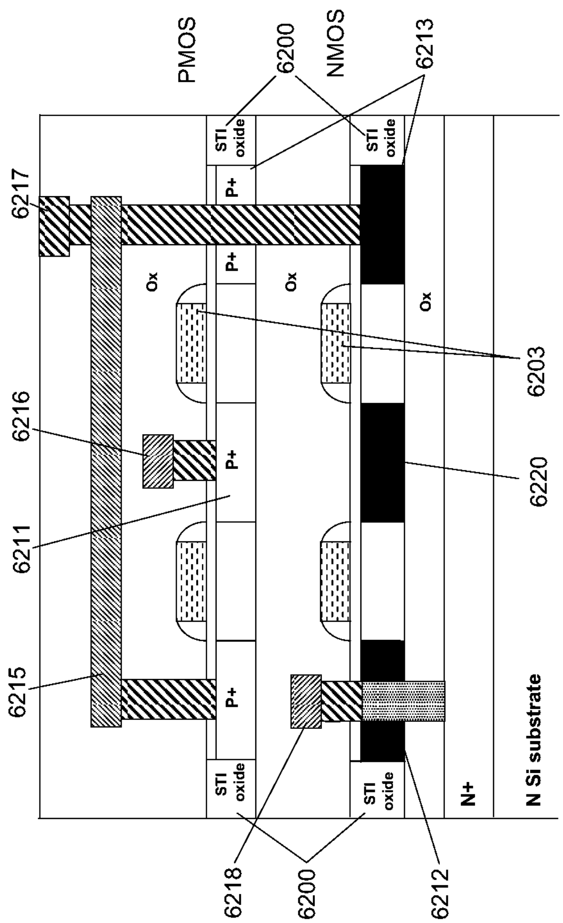

The topside view of the 3D NAND-2 cell, with no metal shown, is illustrated in FIG. 62B, the NAND-2 cell X cross sectional views is illustrated in FIG. 62C, and the Y cross sectional view is illustrated in FIG. 62D. The two PMOS sources 6211 are tied together in the PMOS silicon layer and to the V+ supply metal 6216 in the PMOS metal 1 layer thru a contact. The NMOS A drain and the PMOS A drain are tied 6213 together with a thru P+ to N+ contact and to the Output Y metal 6217 in PMOS metal 2, and also connected to the PMOS B drain contact thru PMOS metal 1 6215. Input A on PMOS metal 2 6214 is tied 6203 to both the PMOS A gate and the NMOS A gate with a PMOS gate on STI to NMOS gate on STI contact. Input B is tied 6204 to the PMOS B gate and the NMOS B using a P+ gate on STI to NMOS gate on STI contact. The NMOS A source and the NMOS B drain are tied together 6220 in the NMOS silicon layer. The NMOS B source 6212 is tied connected to the ground line 6218 by a contact to NMOS metal 1 and to the back plane N+ ground layer. The transistor isolation oxides 6200 are illustrated.

Another compact 3D library may be constructed whereby one or more layers of metal interconnect is allowed between more than two NMOS and PMOS device layers. This methodology allows a more compact cell construction especially when the cells are complex; however, devices above the first NMOS layer should now be made with a low temperature layer transfer and transistor formation process as shown previously.

Accordingly, the library process flow proceeds as described above for FIGS. 43 and 44. Then the layer or layers of conventional metal interconnect may be constructed on top of the NMOS devices, and then that wafer is treated as the acceptor wafer or house 808 and the PMOS devices may be layer transferred and constructed in one of the low temperature flows as shown in FIGS. 21, 22, 29, 39, and 40. And then this low temperature process may be repeated again to form another layer of PMOS or NMOS device, and so on.

Figure 53A:
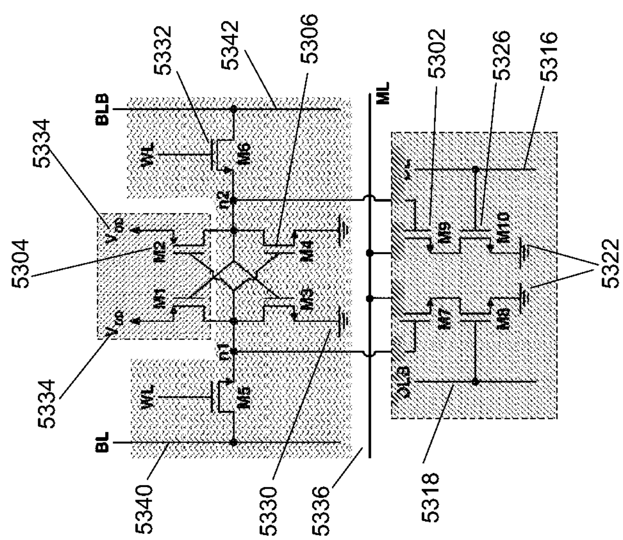
FIG. 53 A-E are drawing illustrations of a 3D CAM cell.

The above process flow may also be used to construct a compact 3D CMOS Content Addressable Memory (CAM) array as illustrated in FIGS. 53A to 53E. The CAM cell schematic is illustrated in FIG. 53A. Access to the SRAM cell is controlled by the word line transistors M5 and M6 where M6 is labeled as 5332. These access transistors control the connection to the bit line 5342 and the bit line bar line 5340. The two cross coupled inverters M1-M4 are pulled high to Vdd 5334 with M1 or M2 5304, and are pulled to ground 5330 thru transistors M3 or M4 5306. The match line 5336 delivers comparison circuit match or mismatch state to the match address encoder. The detect line 5316 and detect line bar 5318 select the comparison circuit cell for the address search and connect to the gates of the pull down transistors M8 and M10 5326 to ground 5322. The SRAM state read transistors M7 and M9 5302 gates are connected to the SRAM cell nodes n1 and n2 to read the SRAM cell state into the comparison cell. The structure built in 3D described below may take advantage of these connections in the 3rd dimension.

Figure 53B:
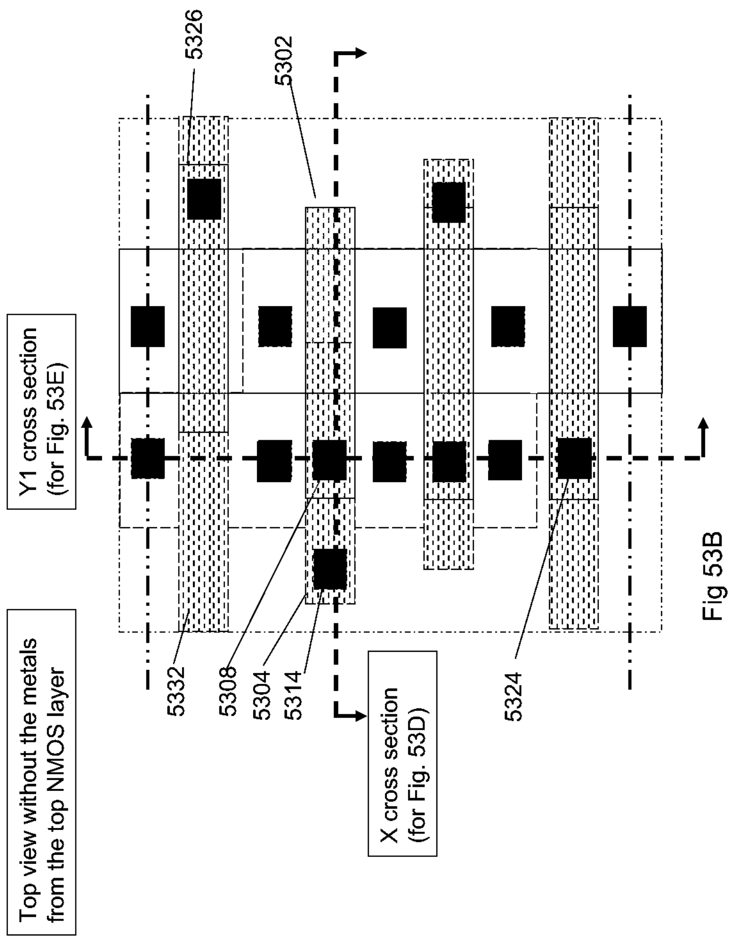
Figure 53C:
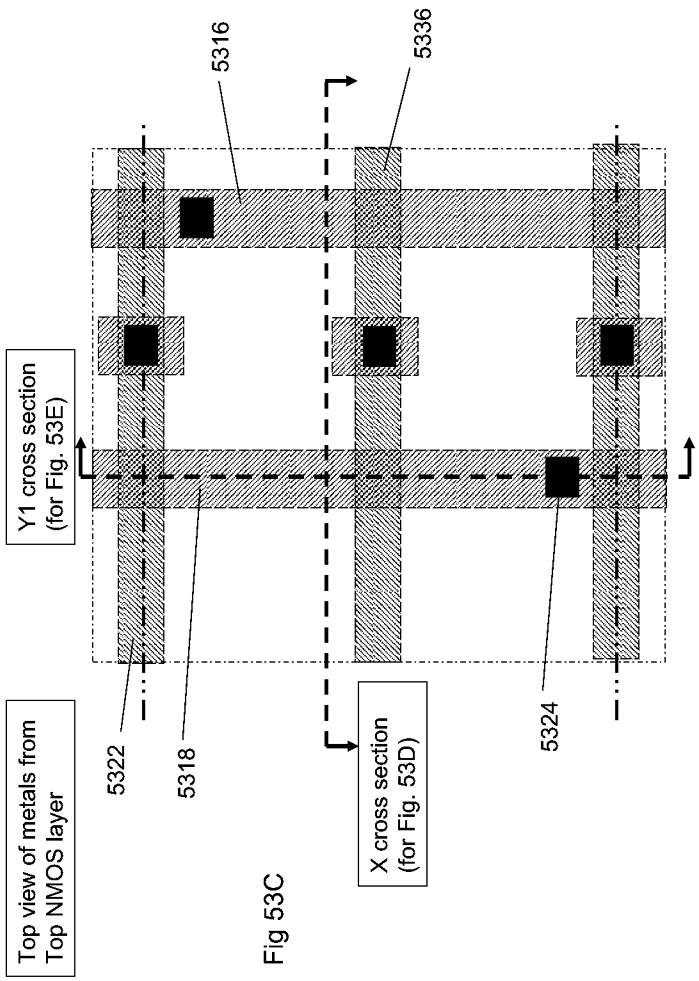
Figure 53D:
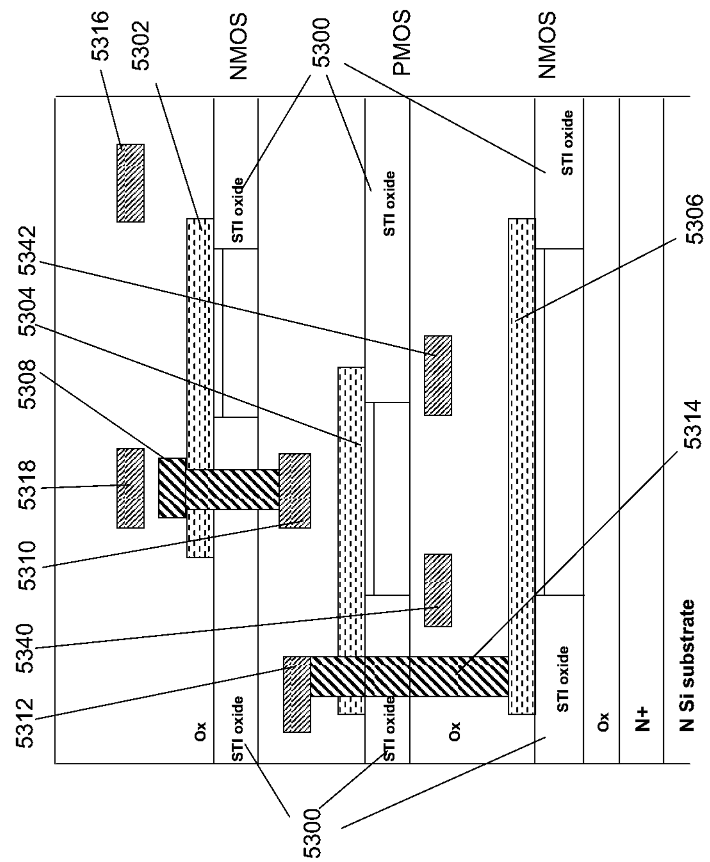
Figure 53E:
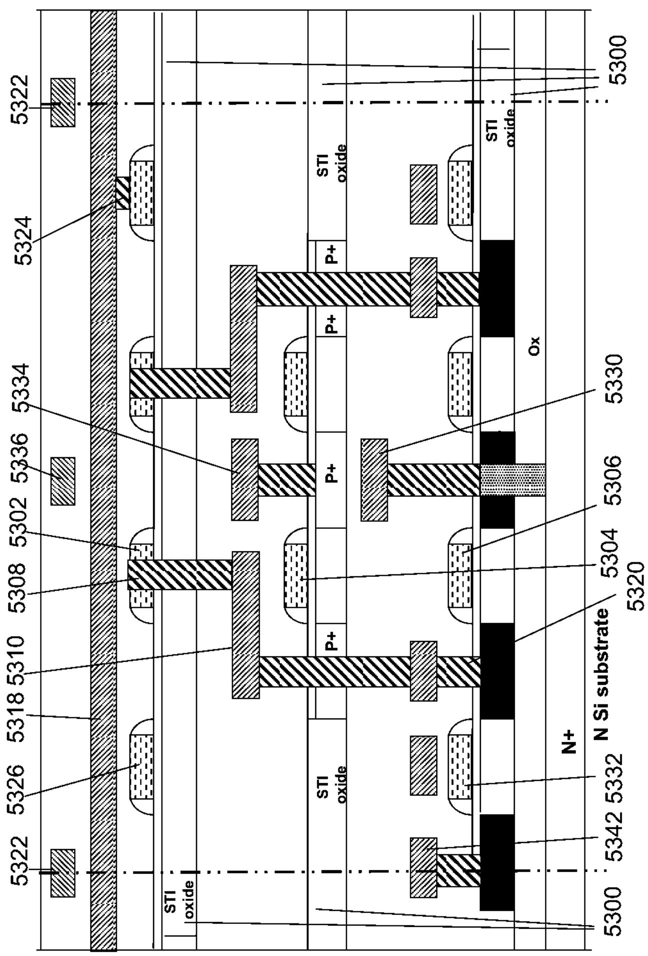

The topside top NMOS view of the 3D CAM cell, without metals shown, is illustrated in FIG. 53B, the topside top NMOS view of the 3D CAM cell, with metal shown, is illustrated in FIG. 53C, the 3DCAM cell X cross sectional view is illustrated in FIG. 53D, and the Y cross sectional view is illustrated in FIG. 53E. The bottom NMOS word line access transistor M6 5332 is connected to the bit line bar 5342 with an N+ contact to NMOS metal 1. The bottom NMOS pull down transistor 5306 is connected to the ground line 5330 by an N+ contact to NMOS metal 1 and to the back plane N+ ground layer. The bit line 5340 is in NMOS metal 1 and transistor isolation oxides 5300 are illustrated. The ground 5322 is brought into the cell on top NMOS metal-2. The Vdd supply 5334 is brought into the cell on PMOS metal-1 5334 and connects to M2 5304 thru a contact to P+. The PMOS poly on STI to bottom NMOS poly on STI contact 5314 connects the gates of both M2 5304 and M4 5306 to illustrate the SRAM 3D cross coupling and connects to the comparison cell node n1 thru PMOS metal-1 5312. The common drain connection of M2 and M4 to the bit bar access transistor M6 is made thru the PMOS P+ to NMOS N+ contact 5320 and connects node n2 to the M9 gate 5302 via PMOS metal-1 5310 and metal to gate on STI contact 5308. Top NMOS comparison cell ground pulldown transistor M10 gate 5326 is connected to detect line 5316 with a NMOS metal-2 to gate poly on STI contact. The detect line bar 5318 in top NMOS metal-2 connects thru contact 5324 to the gate of M8 in the top NMOS layer. The match line 5336 in top NMOS metal-2 connects to the drain side of M9 and M7.

Another compact 3D library may be constructed whereby one or more layers of metal interconnect is allowed between the NMOS and PMOS devices and one or more of the devices is constructed vertically.

Figure 63A:
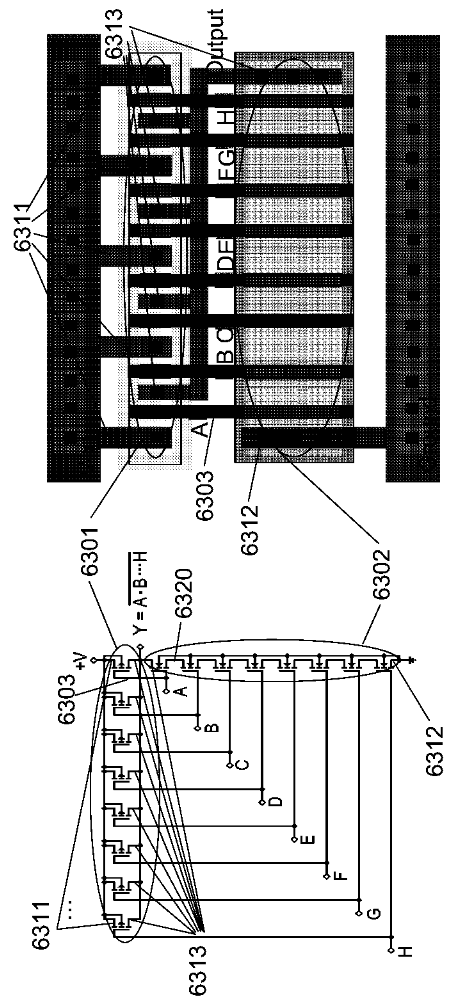
FIG. 63 A-G are drawing illustrations of a 3D NAND8 cell.

A compact 3D CMOS 8 Input NAND cell may be constructed as illustrated in FIGS. 63A thru 63G. The NAND-8 cell schematic and 2D layout is illustrated in FIG. 63A. The eight PMOS transistor 6301 sources 6311 are tied together and to V+ supply and the PMOS drains are tied together 6313 and to the NMOS A drain and to the output Y. Inputs A to H are tied to one PMOS gate and one NMOS gate. Input A is tied to the PMOS A gate and NMOS A gate, input B is tied to the PMOS B gate and NMOS B gate, and so forth through input H is tied to the PMOS H gate and NMOS H gate. The eight NMOS transistors 6302 are coupled in series between the output Y and the PMOS drains 6313 and ground. The structure built in 3D described below will take advantage of these connections in the 3rd dimension.

Figure 63B:
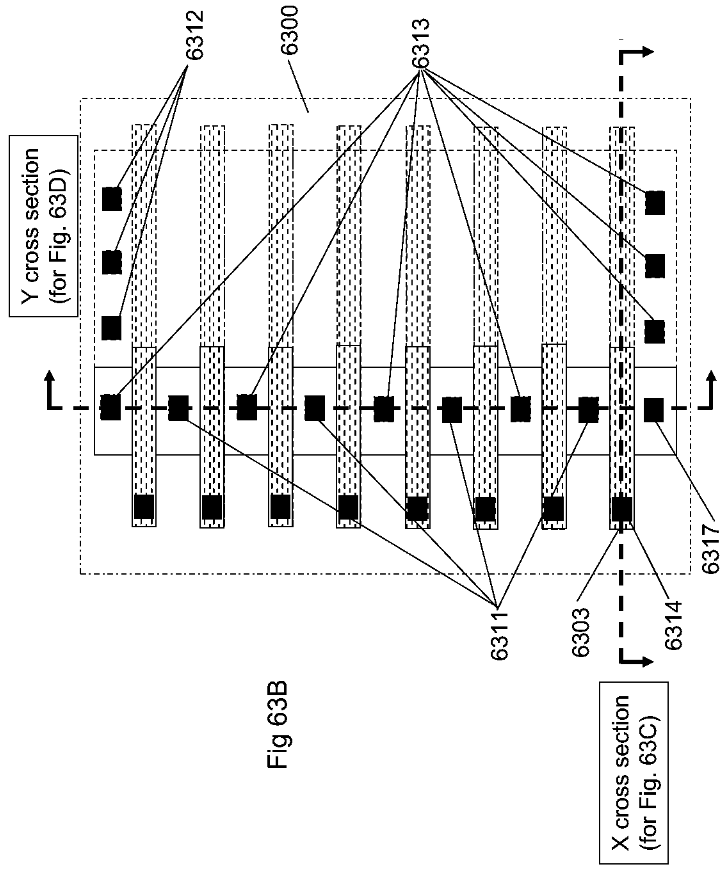
Figure 63C:
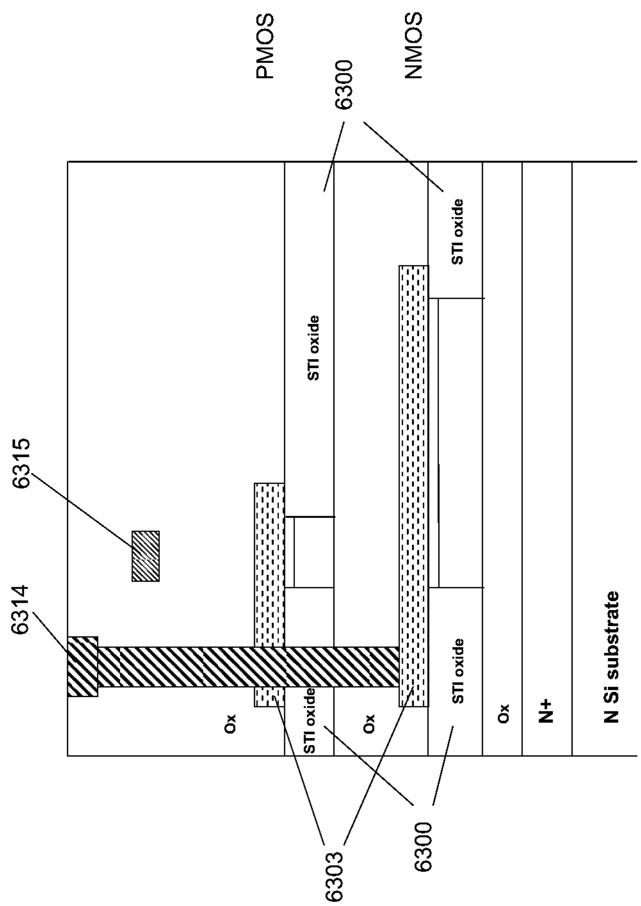
Figure 63D:
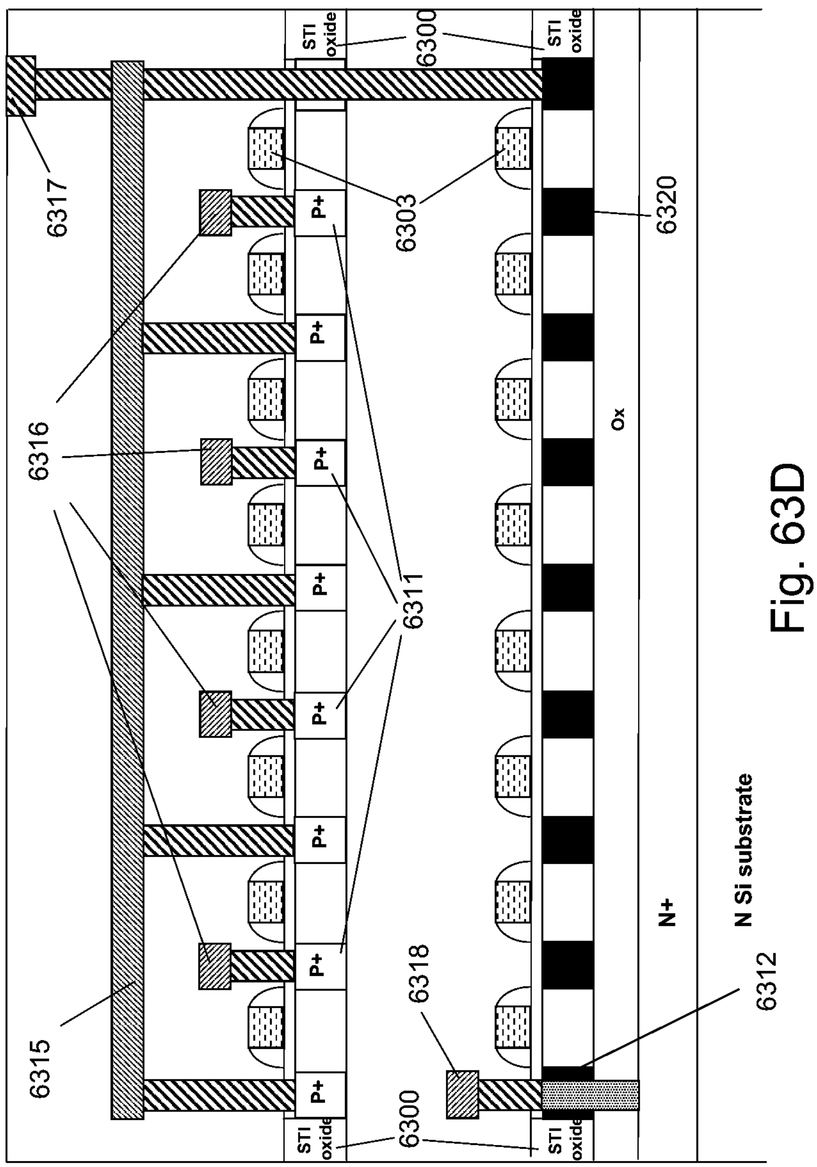
Figure 63E:
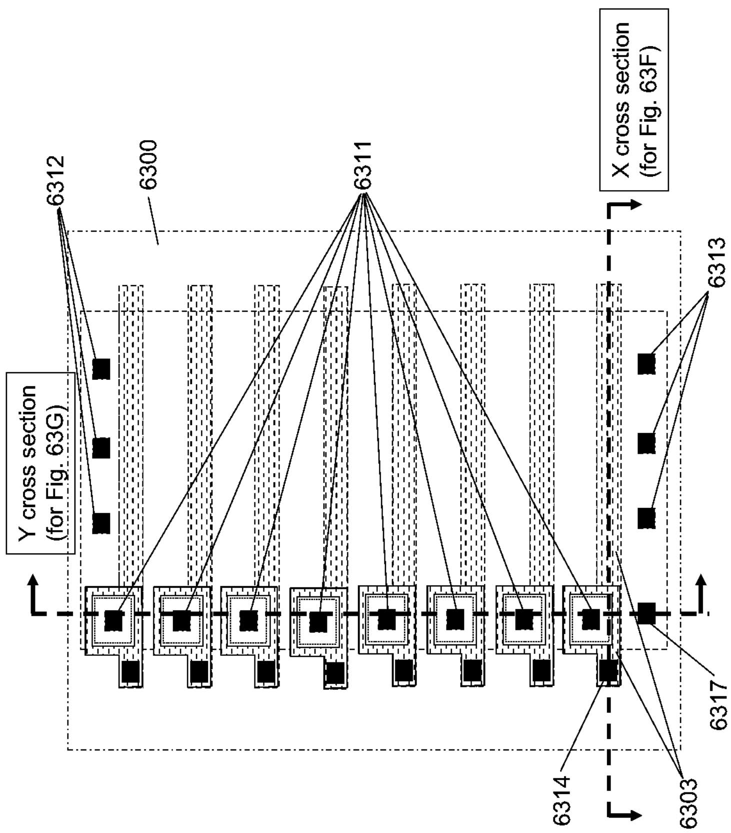
Figure 63F:
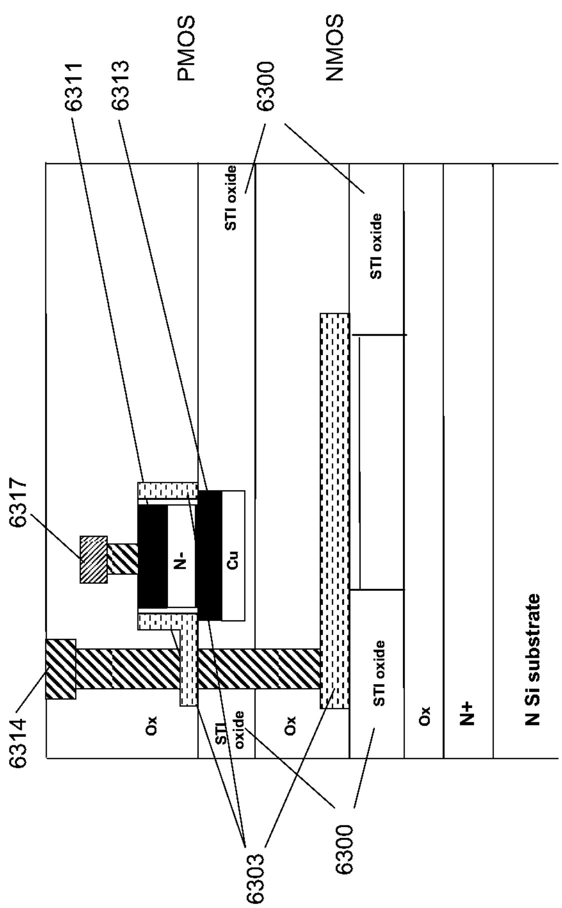
Figure 63G:
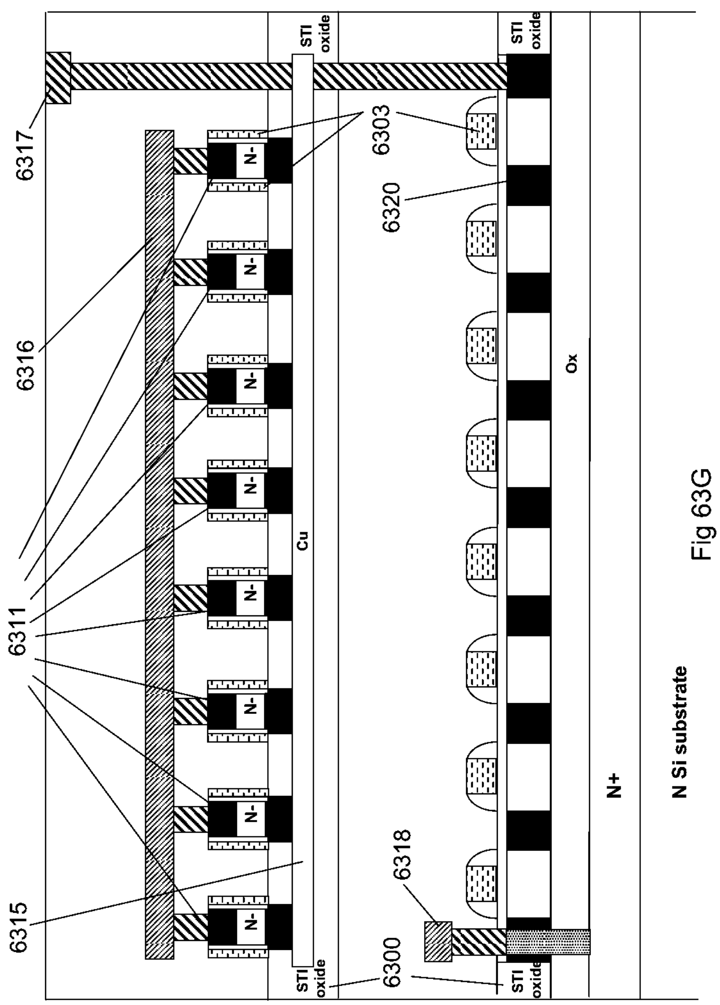

The topside view of the 3D NAND-8 cell, with no metal shown and with horizontal NMOS and PMOS devices, is illustrated in FIG. 63B, the cell X cross sectional views is illustrated in FIG. 63C, and the Y cross sectional view is illustrated in FIG. 63D. The NAND-8 cell with vertical PMOS and horizontal NMOS devices are shown in FIG. 63E for topside view, 63F for the X cross section view, and 63H for the Y cross sectional view. The same reference numbers are used for analogous structures in the embodiment shown in FIGS. 63B through 63D and the embodiment shown in FIGS. 63E through 63G. The eight PMOS sources 6311 are tied together in the PMOS silicon layer and to the V+ supply metal 6316 in the PMOS metal 1 layer thru P+ to Metal contacts. The NMOS A drain and the PMOS A drain are tied 6313 together with a thru P+ to N+ contact 6317 and to the output Y supply metal 6315 in PMOS metal 2, and also connected to substantially all of the PMOS drain contacts thru PMOS metal 1 6315. Input A on PMOS metal 2 6314 is tied 6303 to both the PMOS A gate and the NMOS A gate with a PMOS gate on STI to NMOS gate on STI contact 6314. Substantially all the other inputs are tied to P and N gates in similar fashion. The NMOS A source and the NMOS B drain are tied together 6320 in the NMOS silicon layer. The NMOS H source 6312 is tied connected to the ground line 6318 by a contact to NMOS metal 1 and to the back plane N+ ground layer. The transistor isolation oxides 6300 are illustrated.

Figure 64A:
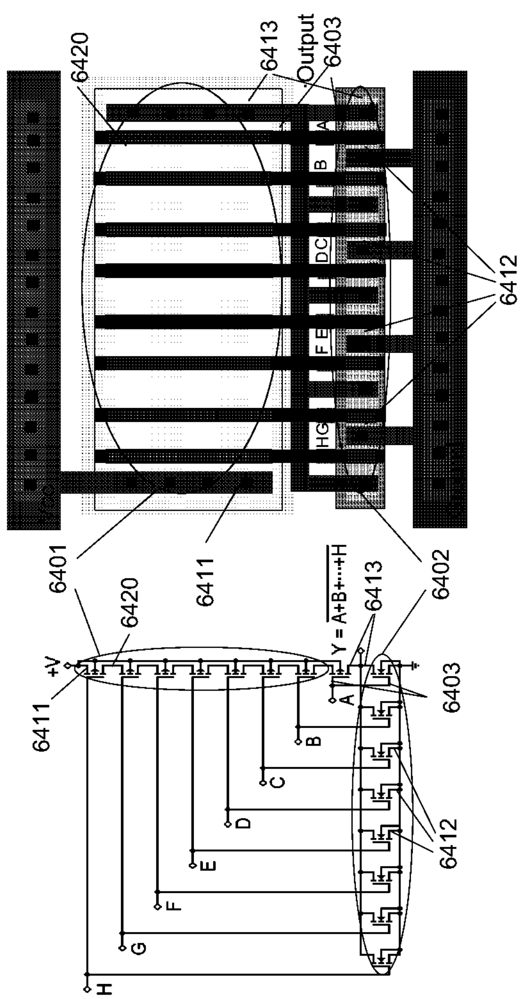
FIG. 64 A-G are drawing illustrations of a 3D NOR8 cell.

A compact 3D CMOS 8 Input NOR may be constructed as illustrated in FIGS. 64A thru 64G. The NOR-8 cell schematic and 2D layout is illustrated in FIG. 64A. The PMOS H transistor source 6411 may be tied to V+ supply. The NMOS transistors 6402 drains are tied together 6413 and to the drain of PMOS A and to Output Y. Inputs A to H are tied to one PMOS gate and one NMOS gate. Input A is tied 6403 to the PMOS A gate and NMOS A gate. The NMOS sources are substantially all tied 6412 to ground. The PMOS H drain is tied 6420 to the next PMOS source in the stack, PMOS G, and repeated so forth for PMOS transistors 6401. The structure built in 3D described below will take advantage of these connections in the 3rd dimension.

Figure 64B:
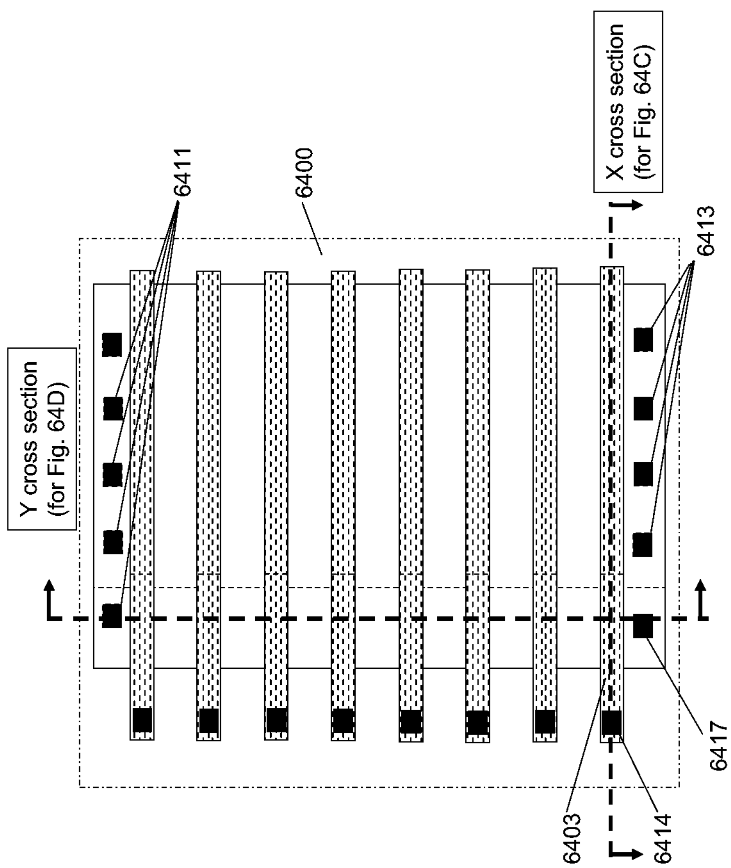
Figure 64C:
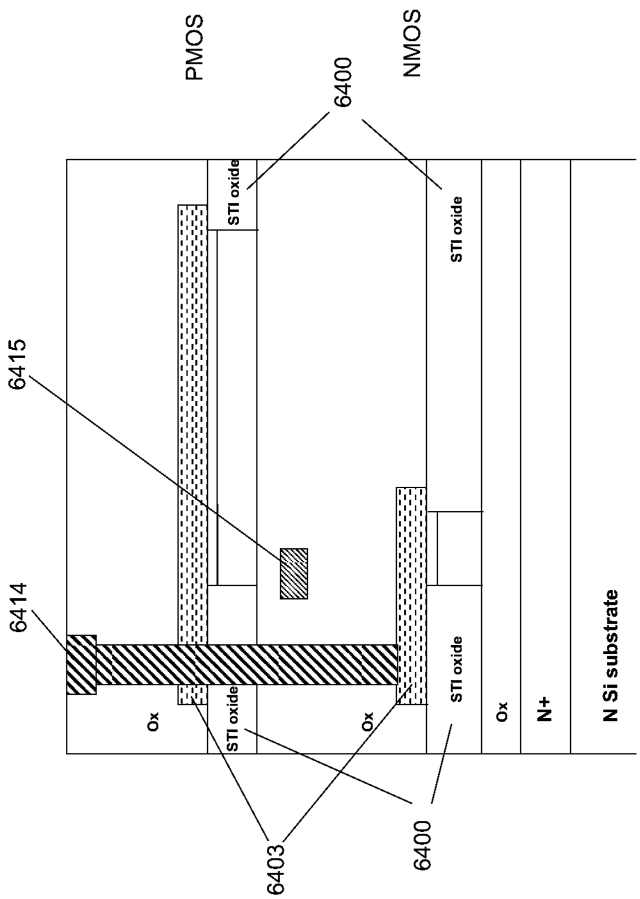
Figure 64D:
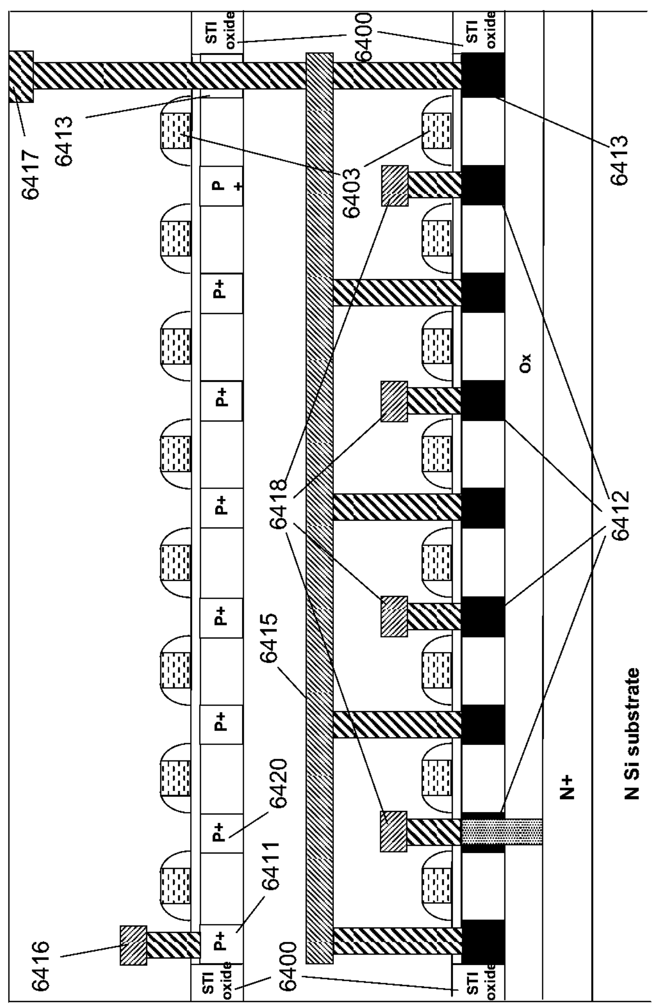
Figure 64E:
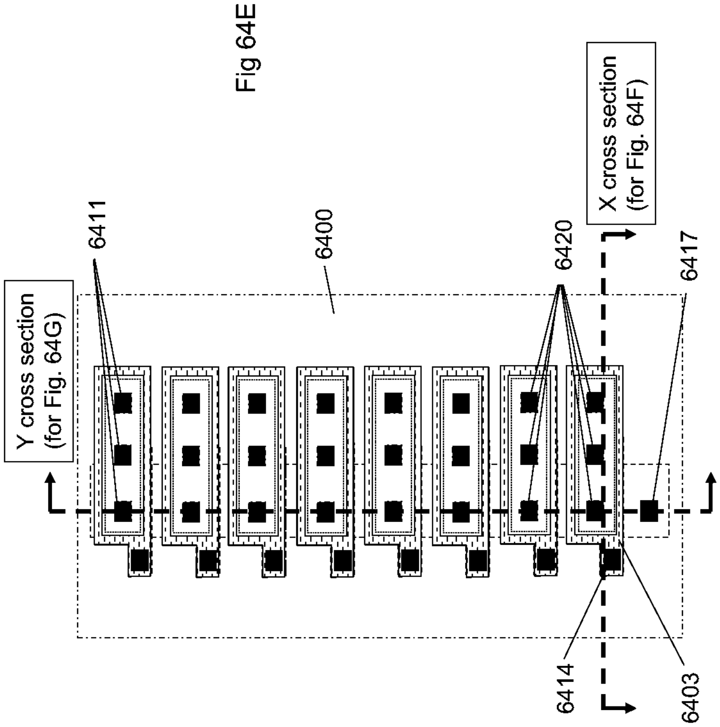
Figure 64F:
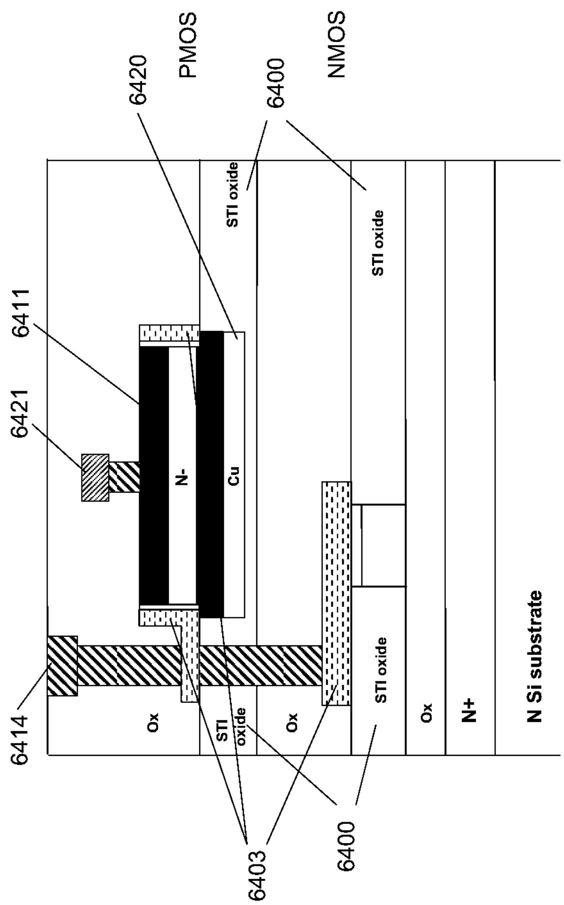
Figure 64G:
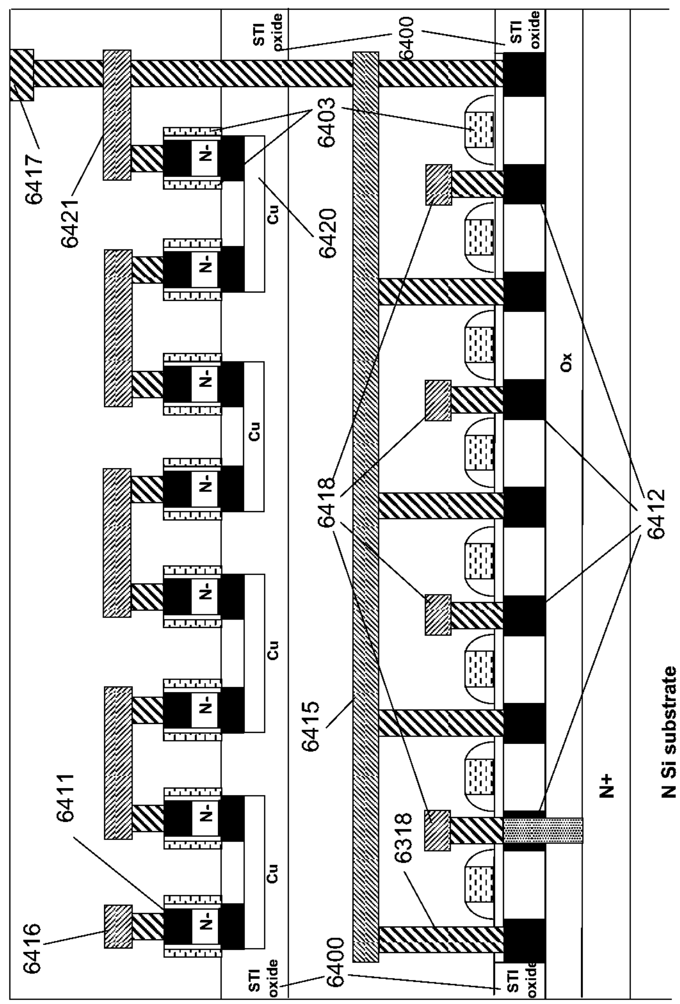

The topside view of the 3D NOR-8 cell, with no metal shown and with horizontal NMOS and PMOS devices, is illustrated in FIG. 64B, the cell X cross sectional views is illustrated in FIG. 64C, and the Y cross sectional view is illustrated in FIG. 64D. The NAND-8 cell with vertical PMOS and horizontal NMOS devices are shown in FIG. 64E for topside view, 64F for the X cross section view, and 64G for the Y cross sectional view. The PMOS H source 6411 is tied to the V+ supply metal 6421 in the PMOS metal 1 layer thru a P+ to Metal contact. The PMOS H drain is tied 6420 to PMOS G source in the PMOS silicon layer. The NMOS sources 6412 are substantially all tied to ground by N+ to NMOS metal-1 contacts to metal lines 6418 and to the backplane N+ ground layer in the N− substrate. Input A on PMOS metal-2 is tied to both PMOS and NMOS gates 6403 with a gate on STI to gate on STI contact 6414. The NMOS drains are substantially all tied together with NMOS metal-2 6415 to the NMOS A drain and PMOS A drain 6413 by the P+ to N+ to PMOS metal-2 contact 6417, which is tied to output Y. FIG. 64G illustrates the use of vertical PMOS transistors to compactly tie the stack sources and drain, and make a very compact area cell shown in FIG. 64E. The transistor isolation oxides 6400 are illustrated.

Accordingly a CMOS circuit may be constructed where the various circuit cells are built on two silicon layers achieving a smaller circuit area and shorter intra and inter transistor interconnects. As interconnects become dominating for power and speed, packing circuits in a smaller area would result in a lower power and faster speed end device.

Persons of ordinary skill in the art will appreciate that a number of different process flows have been described with exemplary logic gates and memory cells used as representative circuits. Such skilled persons will further appreciate that whichever flow is chosen for an individual design, a library of all the desired logic functions for use in the design may be created so that the cells may easily be reused either within that individual design or in subsequent ones employing the same flow. Such skilled persons will also appreciate that many different design styles may be used for a given design. For example, a library of logic cells could be built in a manor that has uniform height called standard cells as is well known in the art. Alternatively, a library could be created for use in long continuous strips of transistors called a gated array which is also known in the art. In another alternative embodiment, a library of cells could be created for use in a hand crafted or custom design as is well known in the art. For example, in yet another alternative embodiment, any combination of libraries of logic cells tailored to these design approaches can be used in a particular design as a matter of design choice, the libraries chosen may employ the same process flow if they are to be used on the same layers of a 3D IC. Different flows may be used on different levels of a 3D IC, and one or more libraries of cells appropriate for each respective level may be used in a single design.

Also known in the art are computer program products that may be stored in computer readable media for use in data processing systems employed to automate the design process, more commonly known as computer aided design (CAD) software. Persons of ordinary skill in the art will appreciate the advantages of designing the cell libraries in a manner compatible with the use of CAD software.

Persons of ordinary skill in the art will realize that libraries of I/O cells, analog function cells, complete memory blocks of various types, and other circuits may also be created for one or more processing flows to be used in a design and that such libraries may also be made compatible with CAD software. Many other uses and embodiments will suggest themselves to such skilled persons after reading this specification, thus the scope of the invention is to be limited only by the appended claims.

Figure 59:
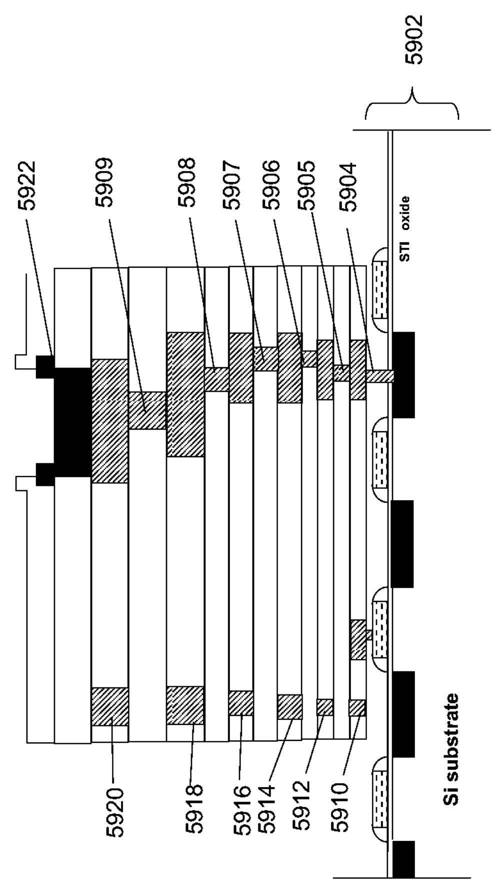
FIG. 59 is a drawing illustration of a metal interconnect stack prior art.

Additionally, when circuit cells are built on two or more layers of thin silicon as shown above, and enjoy the dense vertical thru silicon via interconnections, the metallization layer scheme to take advantage of this dense 3D technology may be improved as follows. FIG. 59 illustrates the prior art of silicon integrated circuit metallization schemes. The conventional transistor silicon layer 5902 is connected to the first metal layer 5910 thru the contact 5904. The dimensions of this interconnect pair of contact and metal lines generally are at the minimum line resolution of the lithography and etch capability for that technology process node. Traditionally, this is called a "1X" design rule metal layer. Usually, the next metal layer is also at the "1X" design rule, the metal line 5912 and via below 5905 and via above 5906 that connects metals 5912 with 5910 or with 5914 where desired. Then the next few layers are often constructed at twice the minimum lithographic and etch capability and called '2X' metal layers, and have thicker metal for higher current carrying capability. These are illustrated with metal line 5914 paired with via 5907 and metal line 5916 paired with via 5908 in FIG. 59. Accordingly, the metal via pairs of 5918 with 5909, and 5920 with bond pad opening 5922, represent the '4X' metallization layers where the planar and thickness dimensions are again larger and thicker than the 2X and 1X layers. The precise number of 1X or 2X or 4X layers may vary depending on interconnection needs and other requirements; however, the general flow is that of increasingly larger metal line, metal space, and via dimensions as the metal layers are farther from the silicon transistors and closer to the bond pads.

Figure 60:
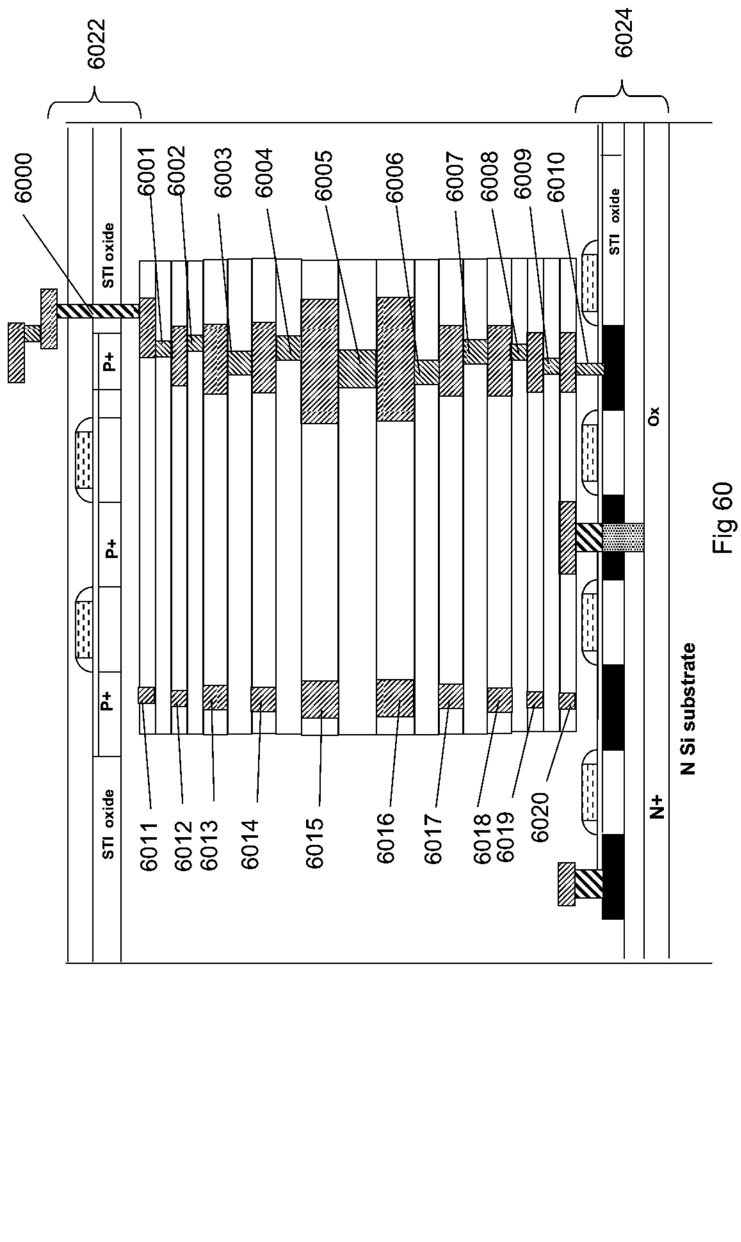
FIG. 60 is a drawing illustration of a metal interconnect stack.

The metallization layer scheme may be improved for 3D circuits as illustrated in FIG. 60. The first mono- or poly-crystalline silicon device layer 6024 is illustrated as the NMOS silicon transistor layer from the above 3D library cells, but may also be a conventional logic transistor silicon substrate or layer. The '1X' metal layers 6020 and 6019 are connected with contact 6010 to the silicon transistors and vias 6008 and 6009 to each other or metal line 6018. The 2X layer pairs metal 6018 with via 6007 and metal 6017 with via 6006. The 4X metal layer 6016 is paired with via 6005 and metal 6015, also at 4X. However, now via 6004 is constructed in 2X design rules to enable metal line 6014 to be at 2X. Metal line 6013 and via 6003 are also at 2X design rules and thicknesses. Vias 6002 and 6001 are paired with metal lines 6012 and 6011 at the 1X minimum design rule dimensions and thickness. The thru silicon via 6000 of the illustrated PMOS layer transferred silicon 6022 may then be constructed at the 1X minimum design rules and provide for maximum density of the top layer. The precise numbers of 1X or 2X or 4X layers may vary depending on circuit area and current carrying metallization design rules and tradeoffs. The layer transferred top transistor layer 6022 may be any of the low temperature devices illustrated herein.

When a transferred layer is not optically transparent to shorter wavelength light, and hence not able to detect alignment marks and images to a nanometer or tens of nanometer resolution, due to the transferred layer or its carrier or holder substrate's thickness, infra-red (IR) optics and imaging may be utilized for alignment purposes. However, the resolution and alignment capability may not be satisfactory. In this embodiment, alignment windows are created that allow use of the shorter wavelength light for alignment purposes during layer transfer flows.

Figure 111A:
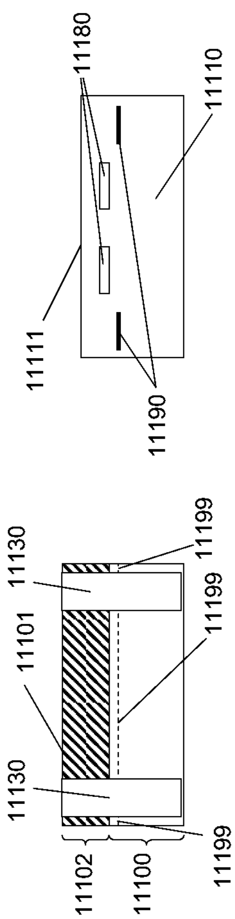

As illustrated in FIG. 111A, a generalized process flow may begin with a donor wafer 11100 that is preprocessed with layers 11102 of conducting, semi-conducting or insulating materials that may be formed by deposition, ion implantation and anneal, oxidation, epitaxial growth, combinations of above, or other semiconductor processing steps and methods. The donor wafer 11100 may also be preprocessed with a layer transfer demarcation plane 11199, such as, for example, a hydrogen implant cleave plane, before or after layers 11102 are formed, or may be thinned by other methods previously described. Alignment windows 11130 may be lithographically defined, plasma/RIE etched, and then filled with shorter wavelength transparent material, such as, for example, silicon dioxide, and planarized with chemical mechanical polishing (CMP). Optionally, donor wafer 11100 may be further thinned by CMP. The size and placement on donor wafer 11100 of the alignment widows 11130 may be determined based on the maximum misalignment tolerance of the alignment scheme used while bonding the donor wafer 11100 to the acceptor wafer 11110, and the placement locations of the acceptor wafer alignment marks 11190. Alignment windows 11130 may be processed before or after layers 11102 are formed. Acceptor wafer 11110 may be a preprocessed wafer that has fully functional circuitry or may be a wafer with previously transferred layers, or may be a blank carrier or holder wafer, or other kinds of substrates and may be called a target wafer. The acceptor wafer 11110 and the donor wafer 11100 may be, for example, a bulk mono-crystalline silicon wafer or a Silicon On Insulator (SOI) wafer or a Germanium on Insulator (GeOI) wafer. Acceptor wafer 11110 metal connect pads or strips 11180 and acceptor wafer alignment marks 11190 are shown.

Both the donor wafer 11100 and the acceptor wafer 11110 bonding surfaces 11101 and 11111 may be prepared for wafer bonding by depositions, polishes, plasma, or wet chemistry treatments to facilitate successful wafer to wafer bonding.

Figure 111B:
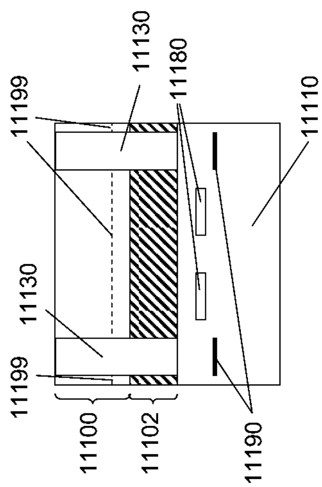

As illustrated in FIG. 111B, the donor wafer 11100 with layers 11102, alignment windows 11130, and layer transfer demarcation plane 11199 may then be flipped over, high resolution aligned to acceptor wafer alignment marks 11190, and bonded to the acceptor wafer 11110.

Figure 111C:
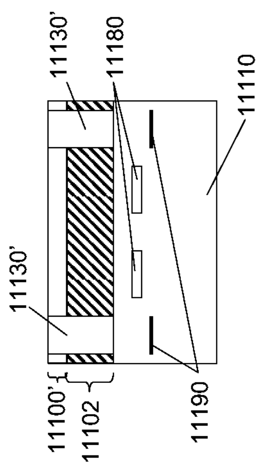

As illustrated in FIG. 111C, the donor wafer 11100 may be cleaved at or thinned to the layer transfer demarcation plane, leaving a portion of the donor wafer 11100', alignment windows 11130' and the pre-processed layers 11102 aligned and bonded to the acceptor wafer 11110.

Figure 111D:
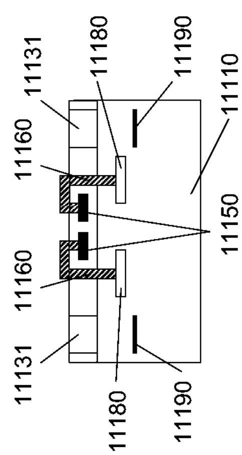

As illustrated in FIG. 111D, the remaining donor wafer portion 11100' may be removed by polishing or etching and the transferred layers 11102 may be further processed to create donor wafer device structures 11150 that are precisely aligned to the acceptor wafer alignment marks 11190, and the alignment windows 11130' may be further processed into alignment window regions 11131. These donor wafer device structures 11150 may utilize thru layer vias (TLVs) 11160 to electrically couple the donor wafer device structures 11150 to the acceptor wafer metal connect pads or strips 11180. As the transferred layers 11102 are thin, on the order of 200 nm or less in thickness, the TLVs may be easily manufactured as a normal metal to metal via may be, and said TLV may have state of the art diameters such as nanometers or tens of nanometers.

An additional use for the high density of TLVs 11160 in FIG. 111D, or any such TLVs in this document, may be to thermally conduct heat generated by the active circuitry from one layer to another connected by the TLVs, such as, for example, donor layers and device structures to acceptor wafer or substrate. TLVs 11160 may also be utilized to conduct heat to an on chip thermoelectric cooler, heat sink, or other heat removing device. A portion of TLVs on a 3D IC may be utilized primarily for electrical coupling, and a portion may be primarily utilized for thermal conduction. In many cases, the TLVs may provide utility for both electrical coupling and thermal conduction.

As layers are stacked in a 3D IC, the power density per unit area increases. The thermal conductivity of mono-crystalline silicon is poor at 150 W/m-K and silicon dioxide, the most common electrical insulator in modern silicon integrated circuits, has a very poor thermal conductivity at 1.4 W/m-K. If a heat sink is placed at the top of a 3D IC stack, then the bottom chip or layer (farthest from the heat sink) has the poorest thermal conductivity to that heat sink, since the heat from that bottom layer must travel thru the silicon dioxide and silicon of the chip(s) or layer(s) above it.

As illustrated in FIG. 112, a heat spreader layer 11205 may be deposited on top of a thin silicon dioxide layer 11203 which is deposited on the top surface of the interconnect metallization layers 11201 of substrate 11202. Heat spreader layer 11205 may include Plasma Enhanced Chemical Vapor Deposited Diamond Like Carbon (PECVD DLC), which has a thermal conductivity of 1000 W/m-K, or another thermally conductive material, such as Chemical Vapor Deposited (CVD) graphene (5000 W/m-K) or copper (400 W/m-K). Heat spreader layer 11205 may be of thickness approximately 20 nm up to approximately 1 micron. The preferred thickness range is approximately 50 nm to 100 nm and the preferred electrical conductivity of the heat spreader layer 11205 is an insulator to enable minimum design rule diameters of the future thru layer vias. If the heat spreader is electrically conducting, the TLV openings need to be somewhat enlarged to allow for the deposition of a non-conducting coating layer on the TLV walls before the conducting core of the TLV is deposited. Alternatively, if the heat spreader layer 11205 is electrically conducting, it may be masked and etched to provide the landing pads for the thru layer vias and a large grid around them for heat transfer, which could also be used as the ground plane or as power and ground straps for the circuits above and below it. Oxide layer 11204 may be deposited (and may be planarized to fill any gaps in the heat transfer layer) to prepare for wafer to wafer oxide bonding. Acceptor substrate 11214 may include substrate 11202, interconnect metallization layers 11201, thin silicon dioxide layer 11203, heat spreader layer 11205, and oxide layer 11204. The donor wafer substrate 11206 may be processed with wafer sized layers of doping as previously described, in preparation for forming transistors and circuitry (such as, for example, junction-less, RCAT, V-groove, and bipolar) after the layer transfer. A screen oxide 11207 may be grown or deposited prior to the implant or implants to protect the silicon from implant contamination, if implantation is utilized, and to provide an oxide surface for later wafer to wafer bonding. A layer transfer demarcation plane 11299 (shown as a dashed line) may be formed in donor wafer substrate 11206 by hydrogen implantation, 'ion-cut' method, or other methods as previously described. Donor wafer 11212 may include donor substrate 11206, layer transfer demarcation plane 11299, screen oxide 11207, and any other layers (not shown) in preparation for forming transistors as discussed previously. Both the donor wafer 11212 and acceptor wafer 11214 may be prepared for wafer bonding as previously described and then bonded at the surfaces of oxide layer 11204 and oxide layer 11207, at a low temperature (less than approximately 400° C.). The portion of donor substrate 11206 that is above the layer transfer demarcation plane 11299 may be removed by cleaving and polishing, or other processes as previously described, such as ion-cut or other methods, thus forming the remaining transferred layers 11206'. Alternatively, donor wafer 11212 may be constructed and then layer transferred, using methods described previously such as, for example, ion-cut with replacement gates (not shown), to the acceptor substrate 11214. Now transistors or portions of transistors may be formed and aligned to the acceptor wafer alignment marks (not shown) and thru layer vias formed as previously described. Thus, a 3D IC with an integrated heat spreader is constructed.

As illustrated in FIG. 113, a set of power and ground grids, such as bottom transistor layer power and ground grid 11307 and top transistor layer power and ground grid 11306, may be connected by thru layer power and ground vias 11304 and thermally coupled to the electrically non-conducting heat spreader layer 11305. If the heat spreader is an electrical conductor, then it could either only be used as a ground plane, or a pattern should be created with power and ground strips in between the landing pads for the TLVs. The density of the power and ground grids and the thru layer vias to the power and ground grids may be designed to substantially improve a certain overall thermal resistance for substantially all the circuits in the 3D IC stack. Bonding oxides 11310, printed wiring board 11300, package heat spreader 11325, bottom transistor layer 11302, top transistor layer 11312, and heat sink 11330 are shown. Thus, a 3D IC with an integrated heat sink, heat spreaders, and thru layer vias to the power and ground grid is constructed.

Figure 113A:
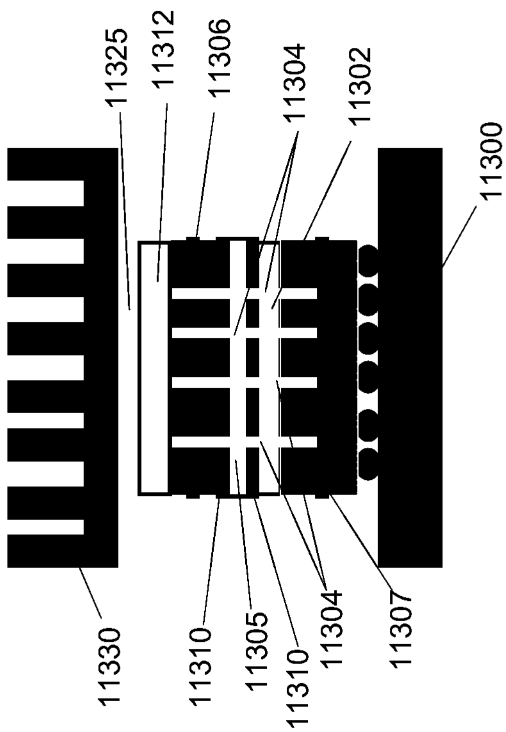
Figure 113B:
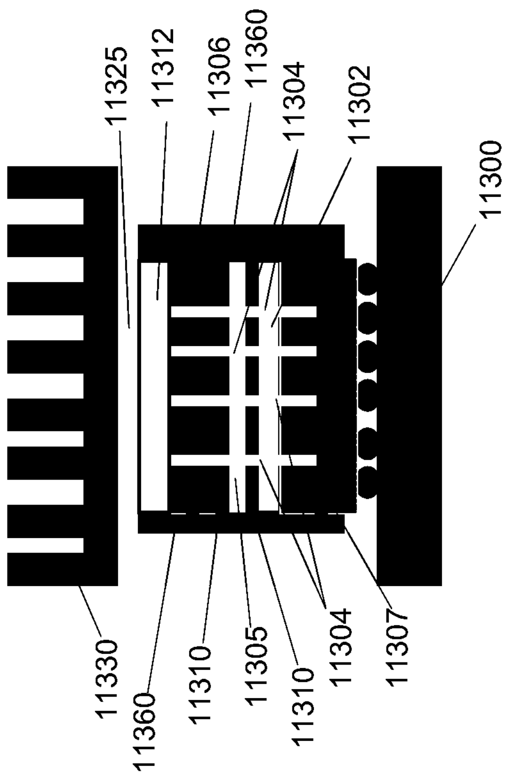

As illustrated in FIG. 113B, thermally conducting material, such as PECVD DLC, may be formed on the sidewalls of the 3D IC structure of FIG. 113A to form sidewall thermal conductors 11360 for sideways heat removal. Bottom transistor layer power and ground grid 11307, top transistor layer power and ground grid 11306, thru layer power and ground vias 11304, heat spreader layer 11305, bonding oxides 11310, printed wiring board 11300, package heat spreader 11325, bottom transistor layer 11302, top transistor layer 11312, and heat sink 11330 are shown.

As well, the independent formation of each transistor layer enables the use of materials other than silicon to construct transistors. For example, a thin III-V compound quantum well channel such as InGaAs and InSb may be utilized on one or more of the 3D layers described above by direct layer transfer or deposition and the use of buffer compounds such as GaAs and InAlAs to buffer the silicon and III-V lattice mismatches. This enables high mobility transistors that can be optimized independently for p and re-channel use, solving the integration difficulties of incorporating n and p III-V transistors on the same substrate, and also the difficulty of integrating the III-V transistors with conventional silicon transistors on the same substrate. For example, the first layer silicon transistors and metallization generally cannot be exposed to temperatures higher than 400° C. The III-V compounds, buffer layers, and dopings generally need processing temperatures above that 400° C. threshold. By use of the pre deposited, doped, and annealed layer donor wafer formation and subsequent donor to acceptor wafer transfer techniques described above and illustrated in FIGS. 14, 20 to 29, and 43 to 45, III-V transistors and circuits may be constructed on top of silicon transistors and circuits without damaging said underlying silicon transistors and circuits. As well, any stress mismatches between the dissimilar materials desired to be integrated, such as silicon and III-V compounds, may be mitigated by the oxide layers, or specialized buffer layers, that are vertically in-between the dissimilar material layers. Additionally, this now enables the integration of optoelectronic elements, communication, and data path processing with conventional silicon logic and memory transistors and silicon circuits. Another example of a material other than silicon that the independent formation of each transistor layer enables is Germanium.

It should be noted that this 3D IC technology could be used for many applications. As an example the various structures presented in FIGS. 15 to 19 having been constructed in the 'foundation,' which may be below the main or primary or house layer, could be just as well be 'fabricated' in the "Attic," which may be above the main or primary or house layer, by using the techniques described in relation to FIGS. 21 to 35.

Figure 36:
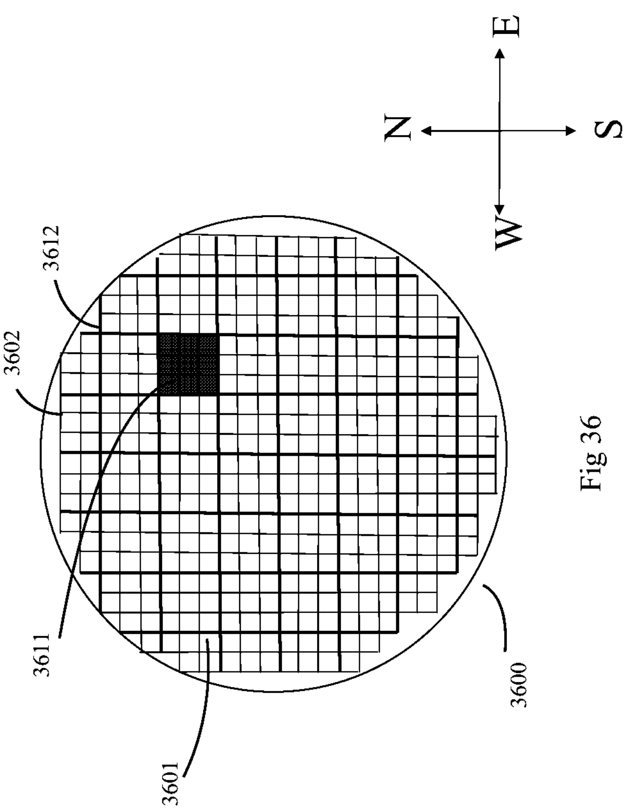
FIG. 36 is a drawing illustration of a tile array wafer.

It also should be noted that the 3D programmable system, where the logic fabric is sized by dicing a wafer of tiled array as illustrated in FIG. 36, could utilize the 'monolithic' 3D techniques related to FIG. 14 in respect to the 'Foundation', or to FIGS. 21 through 35 in respect to the Attic, to add 10 or memories as presented in FIG. 11. So while in many cases constructing a 3D programmable system using TSV could be preferable there might be cases where it will be better to use the 'Foundation' or 'Attic".

When a substrate wafer, carrier wafer, or donor wafer is thinned by a cleaving method and a chemical mechanical polish (CMP) in this document, there are other methods that may be employed to thin the wafer. For example, a boron implant and anneal may be utilized to create a layer in the silicon substrate to be thinned that will provide a wet chemical etch stop plane. A dry etch, such as a halogen gas cluster beam, may be employed to thin a silicon substrate and then smooth the silicon surface with an oxygen gas cluster beam. Additionally, these thinning techniques may be utilized independently or in combination to achieve the proper thickness and defect free surface as may be needed by the process flow.

Figure 9A:
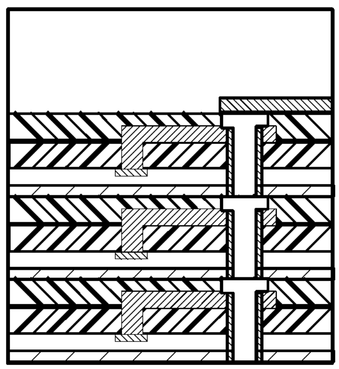
FIG. 9A-C are a drawing illustration of an IC system utilizing Through Silicon Via of a prior art.
Figure 9B:
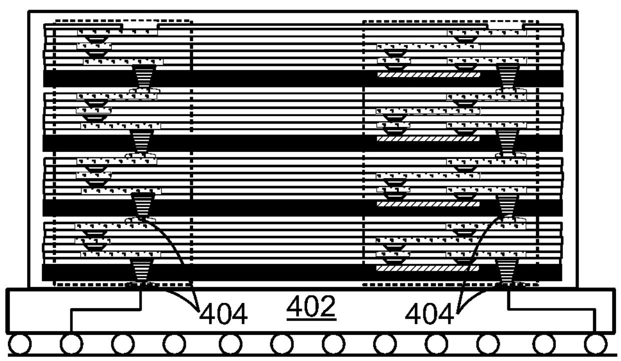
Figure 9C:
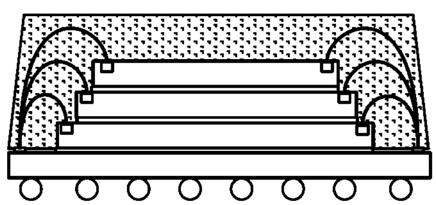

FIGS. 9A through 9C illustrates alternative configurations for three-dimensional—3D integration of multiple dies constructing IC system and utilizing Through Silicon Via. FIG. 9A illustrates an example in which the Through Silicon Via is continuing vertically through substantially all the dies constructing a global cross-die connection.

FIG. 9B provides an illustration of similar sized dies constructing a 3D system. FIG. 9B shows that the Through Silicon Via 404 is at the same relative location in substantially all the dies constructing a standard interface.

FIG. 9C illustrates a 3D system with dies having different sizes. FIG. 9C also illustrates the use of wire bonding from substantially all three dies in connecting the IC system to the outside.

Figure 10A:
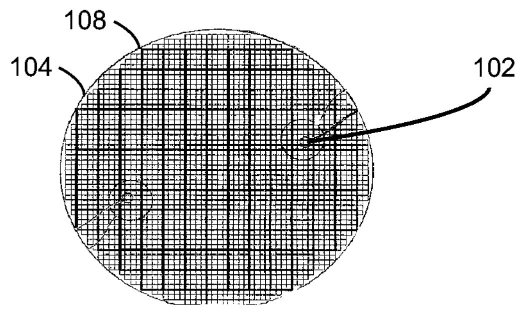
FIG. 10A is a drawing illustration of continuous array wafer of a prior art.
Figure 10B:
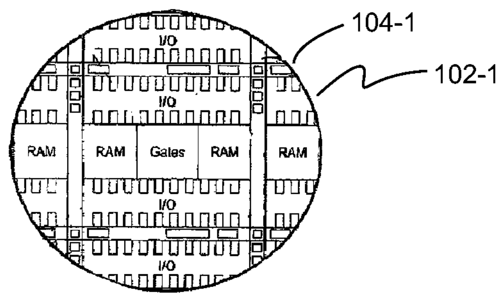
FIG. 10B is a drawing illustration of continuous array portion of wafer of a prior art.
Figure 10C:
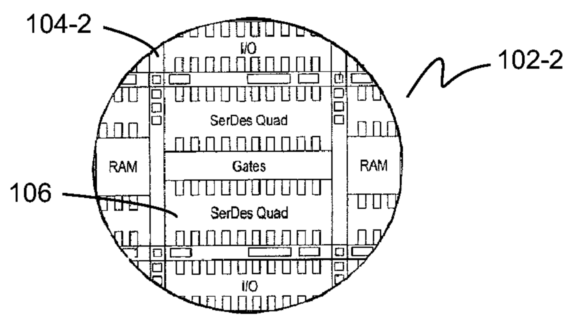
FIG. 10C is a drawing illustration of continuous array portion of wafer of a prior art.

FIG. 10A is a drawing illustration of a continuous array wafer of a prior art U.S. Pat. No. 7,337,425. The bubble 102 shows the repeating tile of the continuous array, and the lines 104 are the horizontal and vertical potential dicing lines. The tile 102 could be constructed as in FIG. 10B 102-1 with potential dicing line 104-1 or as in FIG. 10C with SerDes Quad 106 as part of the tile 102-2 and potential dicing lines 104-2.

In general logic devices comprise varying quantities of logic elements, varying amounts of memories, and varying amounts of I/O. The continuous array of the prior art allows defining various die sizes out of the same wafers and accordingly varying amounts of logic, but it is far more difficult to vary the three-way ratio between logic, I/O, and memory. In addition, there exists different types of memories such as SRAM, DRAM, Flash, and others, and there exist different types of I/O such as SerDes. Some applications might need still other functions like processor, DSP, analog functions, and others.

Embodiments of the current invention may enable a different approach. Instead of trying to put substantially all of these different functions onto one programmable die, which will need a large number of very expensive mask sets, it uses Through-Silicon Via to construct configurable systems. The technology of "Package of integrated circuits and vertical integration" has been described in U.S. Pat. No. 6,322,903 issued to Oleg Siniaguine and Sergey Savastiouk on Nov. 27, 2001.

Accordingly embodiments of the current invention may suggest the use of a continuous array of tiles focusing each one on a single, or very few types of, function. Then, it constructs the end-system by integrating the desired amount from each type of tiles, in a 3D IC system.

Figure 11A:
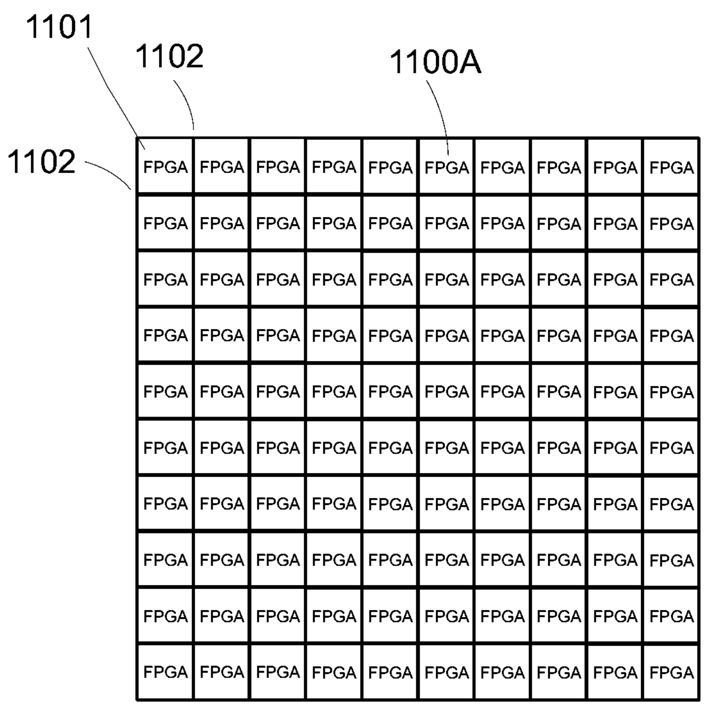
FIG. 11A through 11F are a drawing illustration of one reticle site on a wafer.

FIG. 11A is a drawing illustration of one reticle site on a wafer comprising tiles of programmable logic 1100A denoted FPGA. Such wafer is a continuous array of programmable logic. 1102 are potential dicing lines to support various die sizes and the amount of logic to be constructed from one mask set. This die could be used as a base 1202A, 1202B, 1202C or 1202D of the 3D system as in FIG. 12. In one alternative of this invention these dies may carry mostly logic, and the desired memory and I/O may be provided on other dies, which may be connected by means of Through-Silicon Via. It should be noted that in some cases it will be desired not to have metal lines, even if unused, in the dicing streets 108. In such case, at least for the logic dies, one may use dedicated masks to allow connection over the unused potential dicing lines to connect the individual tiles according to the desire die size. The actual dicing lines are also called streets.

It should be noted that in general the lithography over the wafer is done by repeatedly projecting what is named reticle over the wafer in a "step-and-repeat" manner. In some cases it might be preferable to consider differently the separation between repeating tile 102 within a reticle image vs. tiles that relate to two projections. For simplicity this description will use the term wafer but in some cases it will apply only to tiles with one reticle.

The repeating tile 102 could be of various sizes. For FPGA applications it may be reasonable to assume tile 1101 to have an edge size between 0.5 mm to 1 mm which allows good balance between the end-device size and acceptable relative area loss due to the unused potential dice lines 1102.

There are many advantages for a uniform repeating tile structure of FIG. 11A where a programmable device could be constructed by dicing the wafer to the desired size of programmable device. Yet it is still helpful that the end-device act as a complete integrated device rather than just as a collection of individual tiles 1101. FIG. 36 illustrates a wafer 3600 carrying an array of tiles 3601 with potential dice lines 3602 to be diced along actual dice lines 3612 to construct an end-device 3611 of 3×3 tiles. The end device 3611 is bounded by the actual dice lines 3612.

Figure 37:
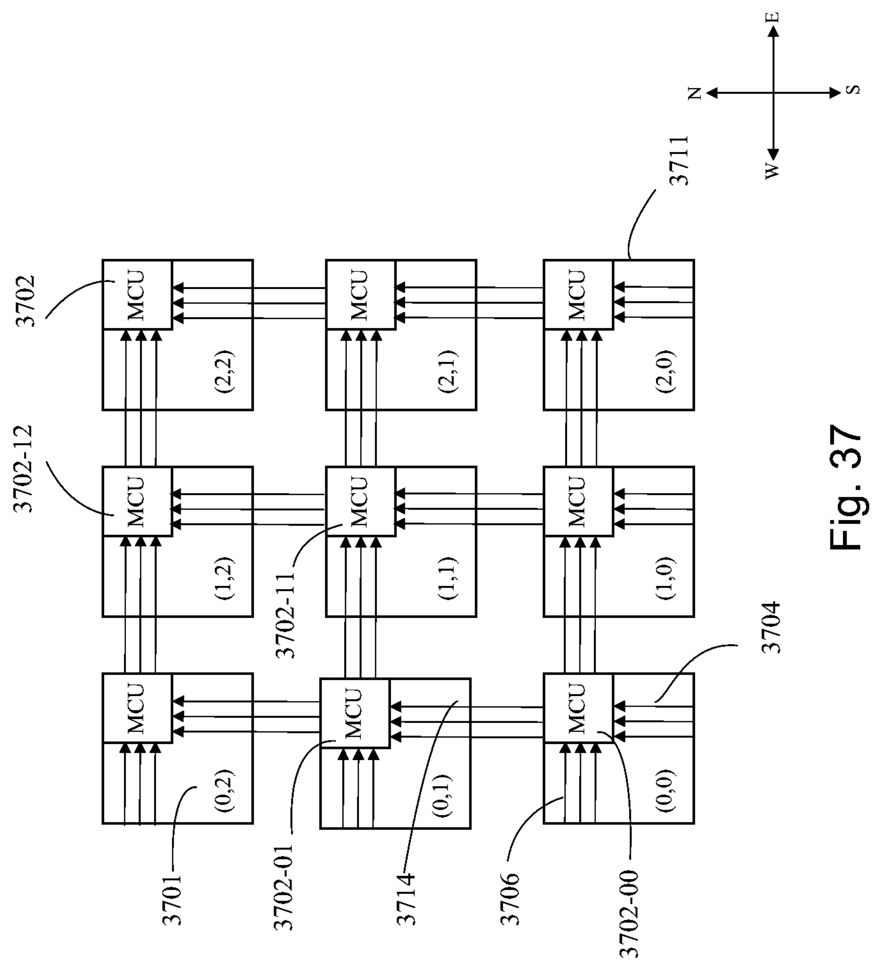
FIG. 37 is a drawing illustration of a programmable end device.

FIG. 37 is a drawing illustration of an end-device 3611 comprising 9 tiles 3701 [(0,0) to (2,2)] such as tile 3601. Each tile 3701 contains a tiny micro control unit—MCU 3702. The micro control unit could have a common architecture such as an 8051 with its own program memory and data memory. The MCUs in each tile will be used to load the FPGA tile 3701 with its programmed function and substantially all its needed initialization for proper operation of the device. The MCU of each tile is connected (for example, MCU-MCU connections 3714 & 3704) so to be controlled by the tile west of it or the tile south of it, in that order of priority. So, for example, the MCU 3702-11 will be controlled by MCU 3702-01. The MCU 3702-01 has no MCU west of it so it will be controlled by the MCU south of it 3702-00 through connection 3714. Accordingly the MCU 3702-00 which is in south-west corner has no tile MCU to control it through connection 3706 or connection 3704 and it will therefore be the master control unit of the end-device.

Figure 38:
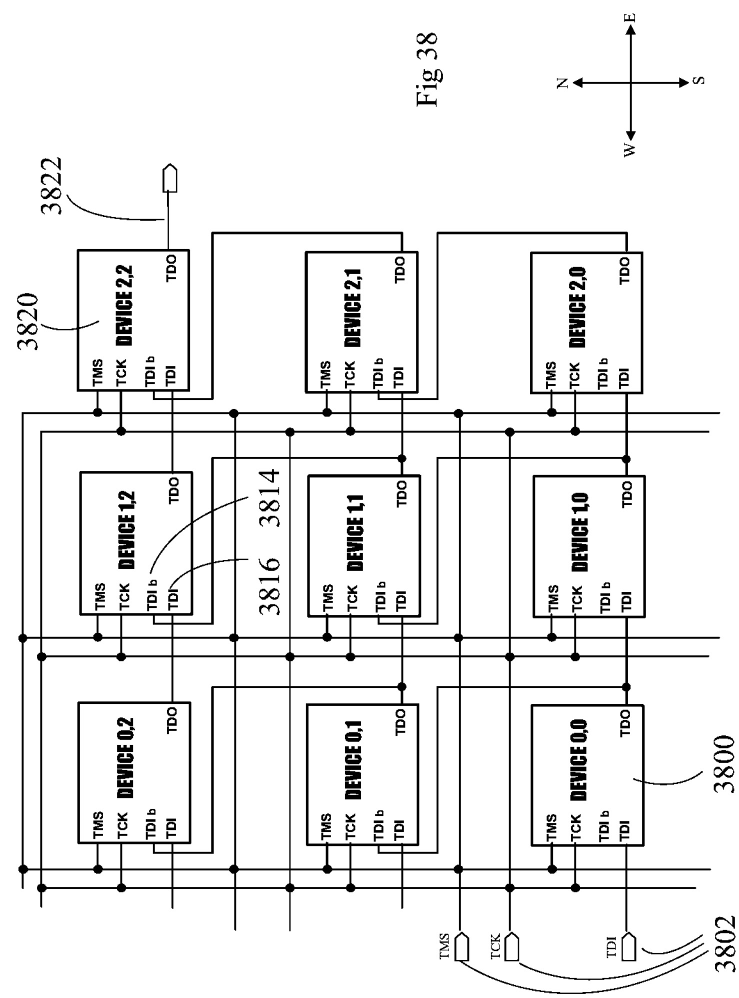
FIG. 38 is a drawing illustration of modified JTAG connections.

FIG. 38 illustrates a simple control connectivity utilizing a slightly modified Joint Test Action Group (JTAG)-based MCU architecture to support such a tiling approach. Each MCU has two Time-Delay-Integration (TDI) inputs, TDI 3816 from the device on its west side and TDIb 3814 from the MCU on its south side. As long as the input from its west side TDI 3816 is active it will be the controlling input, otherwise the TDIb 3814 from the south side will be the controlling input. Again in this illustration the Tile at the south-west corner 3800 will take control as the master. Its control inputs 3802 would be used to control the end-device and through this MCU 3800 it will spread to substantially all other tiles. In the structure illustrated in FIG. 38 the outputs of the end-device 3611 are collected from the MCU of the tile at the north-east corner 3820 at the TDO output 3822. These MCUs and their connectivity would be used to load the end-device functions, initialize it, test it, debug it, program its clocks, and substantially all other desired control functions. Once the end-device has completed its set up or other control and initialization functions such as testing or debugging, these MCUs could be then utilized for user functions as part of the end-device operation.

An additional advantage for this construction of a tiled FPGA array with MCUs is in the construction of an SoC with embedded FPGA function. A single tile 3601 could be connected to an SoC using Through Silicon Vias—TSVs and accordingly provides a self-contained embedded FPGA function.

Clearly, the same scheme can be modified to use the East/North (or any other combination of orthogonal directions) to encode effectively an identical priority scheme.

Figure 11B:
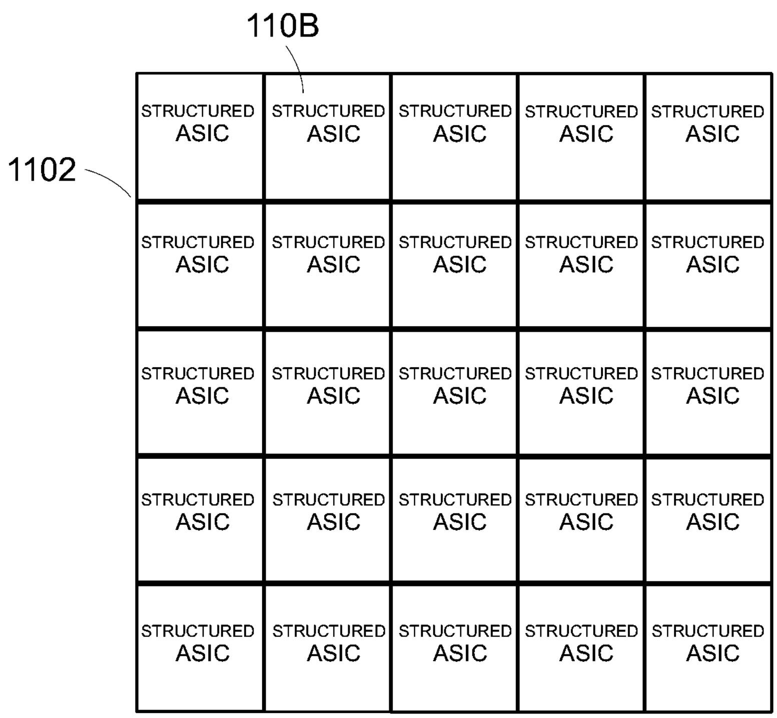

FIG. 11B is a drawing illustration of an alternative reticle site on a wafer comprising tiles of Structured ASIC 1100B. Such wafer may be, for example, a continuous array of configurable logic. 1102 are potential dicing lines to support various die sizes and the amount of logic to be constructed. This die could be used as a base 1202A, 1202B, 1202C or 1202D of the 3D system as in FIG. 12.

Figure 11C:
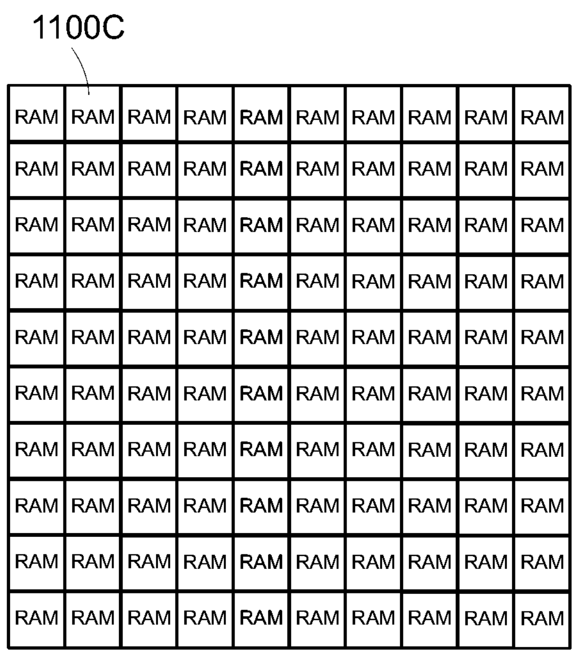

FIG. 11C is a drawing illustration of another reticle site on a wafer comprising tiles of RAM 1100C. Such wafer may be a continuous array of memories. The die diced out of such wafer may be a memory die component of the 3D integrated system. It might include an antifuse layer or other form of configuration technique to function as a configurable memory die. Yet it might be constructed as a multiplicity of memories connected by a multiplicity of Through-Silicon Vias to the configurable die, which may also be used to configure the raw memories of the memory die to the desired function in the configurable system.

Figure 11D:
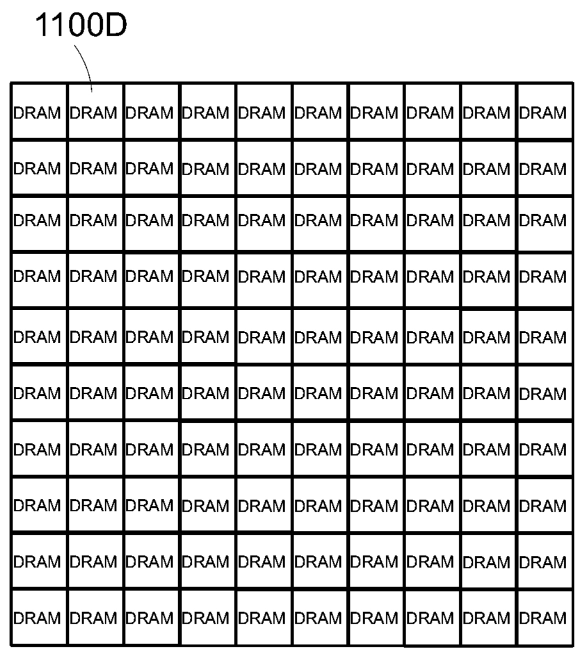

FIG. 11D is a drawing illustration of another reticle site on a wafer comprising tiles of DRAM 1100D. Such wafer may be a continuous array of DRAM memories.

Figure 11E:
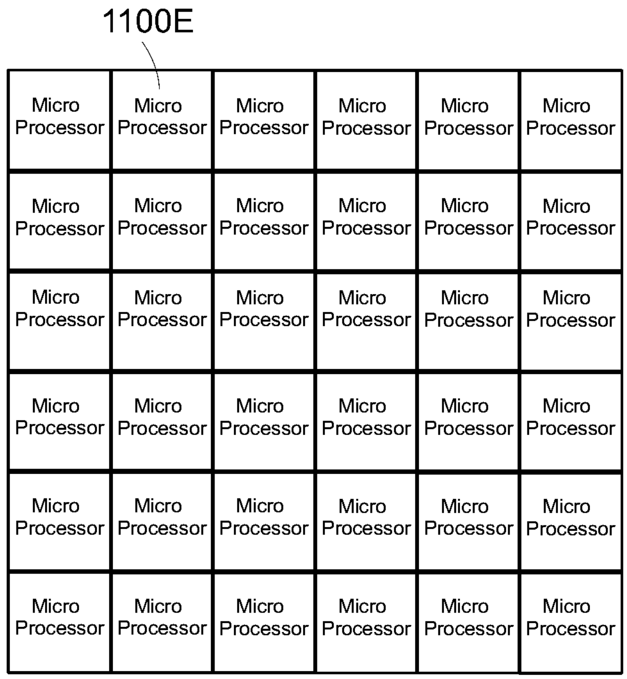

FIG. 11E is a drawing illustration of another reticle site on a wafer comprising tiles of microprocessor or microcontroller cores 1100E. Such wafer may be a continuous array of Processors.

Figure 11F:
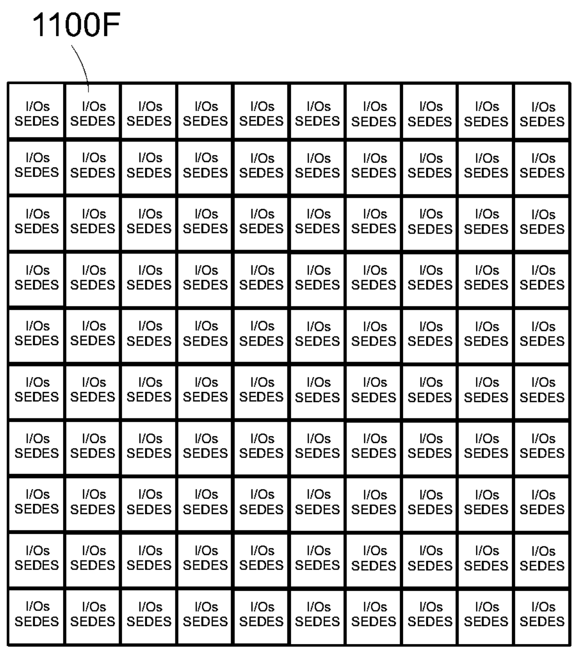

FIG. 11F is a drawing illustration of another reticle site on a wafer comprising tiles of I/Os 1100F. This could include groups of SerDes. Such a wafer may be a continuous tile of I/Os. The die diced out of such wafer may be an I/O die component of a 3D integrated system. It could include an antifuse layer or other form of configuration technique such as SRAM to configure these I/Os of the configurable I/O die to their function in the configurable system. Yet it might be constructed as a multiplicity of I/O connected by a multiplicity of Through-Silicon Vias to the configurable die, which may also be used to configure the raw I/Os of the I/O die to the desired function in the configurable system.

I/O circuits are a good example of where it could be advantageous to utilize an older generation process. Usually, the process drivers are SRAM and logic circuits. It often takes longer to develop the analog function associated with I/O circuits, SerDes circuits, PLLs, and other linear functions. Additionally, while there may be an advantage to using smaller transistors for the logic functionality, I/Os may need stronger drive and relatively larger transistors. Accordingly, using an older process may be more cost effective, as the older process wafer might cost less while still performing effectively.

An additional function that it might be advantageous to pull out of the programmable logic die and onto one of the other dies in the 3D system, connected by Through-Silicon-Vias, may be the Clock circuits and their associated PLL, DLL, and control. Clock circuits and distribution. These circuits may often be area consuming and may also be challenging in view of noise generation. They also could in many cases be more effectively implemented using an older process. The Clock tree and distribution circuits could be included in the I/O die. Additionally the clock signal could be transferred to the programmable die using the Through-Silicon-Vias (TSVs) or by optical means. A technique to transfer data between dies by optical means was presented for example in U.S. Pat. No. 6,052,498 assigned to Intel Corp.

Alternatively an optical clock distribution could be used. There are new techniques to build optical guides on silicon or other substrates. An optical clock distribution may be utilized to minimize the power used for clock signal distribution and would enable low skew and low noise for the rest of the digital system. Having the optical clock constructed on a different die and than connected to the digital die by means of Through-Silicon-Vias or by optical means make it very practical, when compared to the prior art of integrating optical clock distribution with logic on the same die.

Alternatively the optical clock distribution guides and potentially some of the support electronics such as the conversion of the optical signal to electronic signal could be integrated by using layer transfer and smart cut approaches as been described before in FIGS. 14 and 20. The optical clock distribution guides and potentially some of the support electronics could be first built on the 'Foundation' wafer 1402 and then a thin layer 1404 may be transferred on top of it using the 'smart cut' flow, so substantially all the following construction of the primary circuit would take place afterward. The optical guide and its support electronics would be able to withstand the high temperatures necessary for the processing of transistors on layer 1404.

And as related to FIG. 20, the optical guide, and the proper semiconductor structures on which at a later stage the support electronics would be processed, could be pre-built on layer 2019. Using the 'smart cut' flow it would be then transferred on top of a fully processed wafer 808. The optical guide should be able to withstand the ion implant 2008 necessary for the 'smart cut' while the support electronics would be finalized in flows similar to the ones presented in FIGS. 21 to 35, and 39 to 94. This means that the landing target for the clock signal will need to accommodate the approximately 1 micron misalignment of the transferred layer 2004 to the prefabricated-primary circuit and its upper layer 808. Such misalignment could be acceptable for many designs. Alternatively only the base structure for the support electronics would be pre-fabricated on layer 2019 and the optical guide will be constructed after the layer transfer along with finalized flows of the support electronics using flows similar to the ones presented in relating to FIGS. 21-35, and 39 to 94. Alternatively, the support electronics could be fabricated on top of a fully processed wafer 808 by using flows similar to the ones presented in relating to FIGS. 21-35, and 39 to 94. Then an additional layer transfer on top of the support electronics would be utilized to construct the optical wave guides at low temperature.

Having wafers dedicated to each of these functions may support high volume generic product manufacturing. Then, similar to Lego® blocks, many different configurable systems could be constructed with various amounts of logic memory and I/O. In addition to the alternatives presented in FIG. 11A through 11F there many other useful functions that could be built and that could be incorporated into the 3D Configurable System. Examples of such may be image sensors, analog, data acquisition functions, photovoltaic devices, non-volatile memory, and so forth.

An additional function that would fit well for 3D systems using TSVs, as described, is a power control function. In many cases it is desired to shut down power at times to a portion of the IC that is not currently operational. Using controlled power distribution by an external die connected by TSVs is advantageous as the power supply voltage to this external die could be higher because it is using an older process. Having a higher supply voltage allows easier and better control of power distribution to the controlled die.

Those components of configurable systems could be built by one vendor, or by multiple vendors, who agree on a standard physical interface to allow mix-and-match of various dies from various vendors.

The construction of the 3D Programmable System could be done for the general market use or custom-tailored for a specific customer.

Another advantage of some embodiments of this invention may be an ability to mix and match various processes. It might be advantageous to use memory from a leading edge process, while the I/O, and maybe an analog function die, could be used from an older process of mature technology (e.g., as discussed above).

Figure 12A:
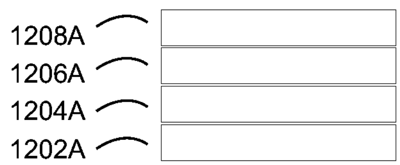
FIG. 12A through 12E are a drawing illustration of Configurable system.
Figure 12B:
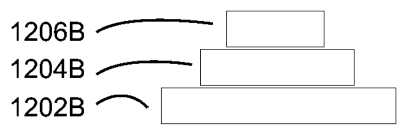
Figure 12C:
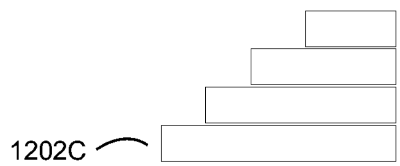
Figure 12D:
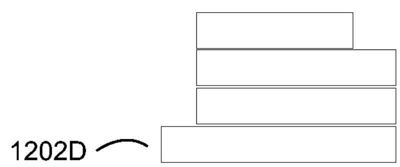
Figure 12E:
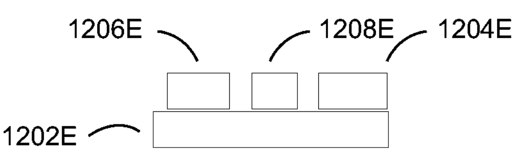

FIGS. 12A through 12E illustrate integrated circuit systems. An integrated circuit system that comprises configurable die could be called a Configurable System. FIG. 12A through 12E are drawings illustrating integrated circuit systems or Configurable Systems with various options of die sizes within the 3D system and alignments of the various dies. FIG. 12E presents a 3D structure with some lateral options. In such case a few dies 1204E, 1206E, 1208E are placed on the same underlying die 1202E allowing relatively smaller die to be placed on the same mother die. For example die 1204E could be a SerDes die while die 1206E could be an analog data acquisition die. It could be advantageous to fabricate these die on different wafers using different process and than integrate them in one system. When the dies are relatively small then it might be useful to place them side by side (such as FIG. 12E) instead of one on top of the other (FIGS. 12A-D).

The Through Silicon Via technology is constantly evolving. In the early generations such via would be 10 microns in diameter. Advanced work is now demonstrating Through Silicon Via with less than a 1-micron diameter. Yet, the density of connections horizontally within the die may typically still be far denser than the vertical connection using Through Silicon Via.

In another alternative of the present invention the logic portion could be broken up into multiple dies, which may be of the same size, to be integrated to a 3D configurable system. Similarly it could be advantageous to divide the memory into multiple dies, and so forth, with other function.

Recent work on 3D integration shows effective ways to bond wafers together and then dice those bonded wafers. This kind of assembly may lead to die structures like FIG. 12A or FIG. 12D. Alternatively for some 3D assembly techniques it may be better to have dies of different sizes. Furthermore, breaking the logic function into multiple vertically integrated dies may be used to reduce the average length of some of the heavily loaded wires such as clock signals and data buses, which may, in turn, improve performance.

Figure 84A:
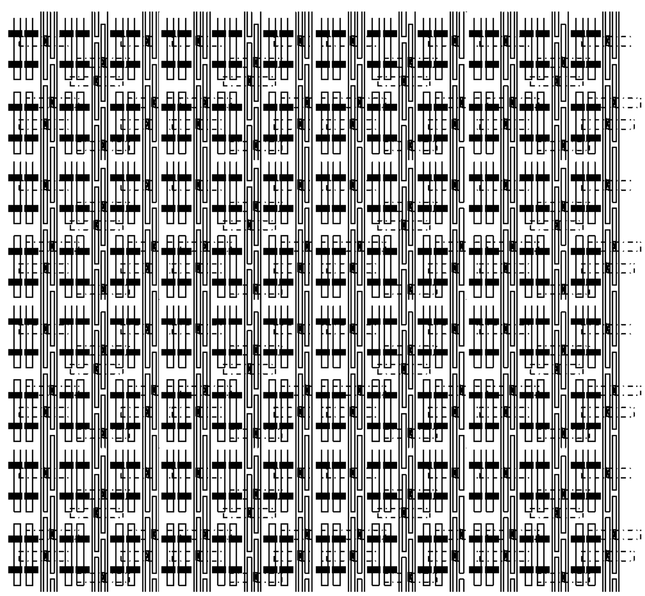
FIG. 84 A-G are drawing illustrations of continuous transistor arrays.
Figure 84B:
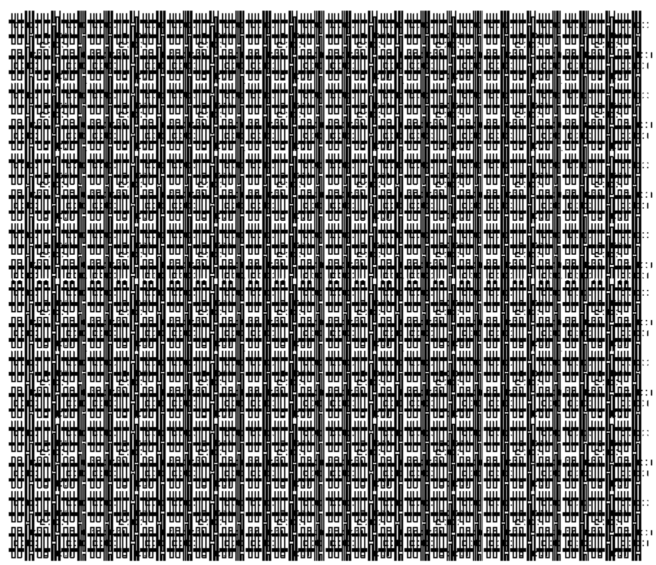
Figure 84C:
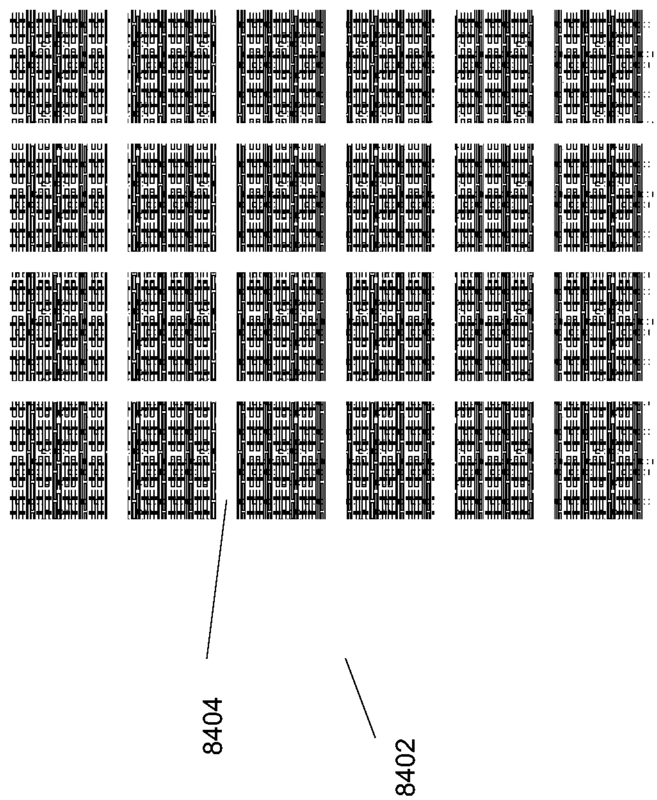

An additional variation of the invention may be the adaptation of the continuous array (presented in relation to FIGS. 10 and 11) to the general logic device and even more so for the 3D IC system. Lithography limitations may pose considerable concern to advanced device design. Accordingly regular structures may be highly desirable and layers may be constructed in a mostly regular fashion and in most cases with one orientation at a time. Additionally, highly vertically-connected 3D IC system could be most efficiently constructed by separating logic memories and I/O into dedicated layers. For a logic-only layer, the structures presented in FIG. 76 or FIG. 78A-C could be used extensively, as illustrated in FIG. 84. In such a case, the repeating logic pattern 8402 could be made full reticle size. FIG. 84A illustrates a repeating pattern of the logic cells of FIG. 78B wherein the logic cell is repeating 8×12 times. FIG. 84B illustrates the same logic repeating many more times to fully fill a reticle. The multiple masks used to construct the logic terrain could be used for multiple logic layers within one 3D IC and for multiple ICs. Such a repeating structure could comprise the logic P and N transistors, their corresponding contact layers, and even the landing strips for connecting to the underlying layers. The interconnect layers on top of these logic terrain could be made custom per design or partially custom depending on the design methodology used. The custom metal interconnect may leave the logic terrain unused in the dicing streets area. Alternatively a dicing-streets mask could be used to etch away the unused transistors in the streets area 8404 as illustrated in FIG. 84C.

The continuous logic terrain could use any transistor style including the various transistors previously presented. An additional advantage to some of the 3D layer transfer techniques previously presented may be the option to pre-build, in high volume, transistor terrains for further reduction of 3D custom IC manufacturing costs.

Similarly a memory terrain could be constructed as a continuous repeating memory structure with a fully populated reticle. The non-repeating elements of most memories may be the address decoder and some times the sense circuits. Those non repeating elements may be constructed using the logic transistors of the underlying or overlying layer.

Figure 84D:
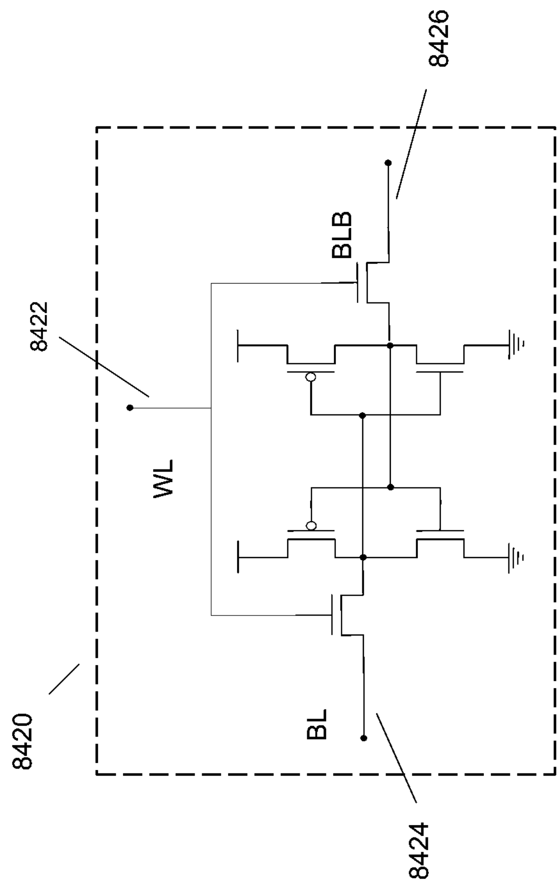

FIGS. 84D-G are drawing illustrations of an SRAM memory terrain. FIG. 84D illustrates a conventional 6 transistor SRAM cell 8420 controlled by Word Line (WL) 8422 and Bit Lines (BL, BLB) 8424, 8426. Usually the SRAM bit cell is specially designed to be very compact.

Figure 84E:
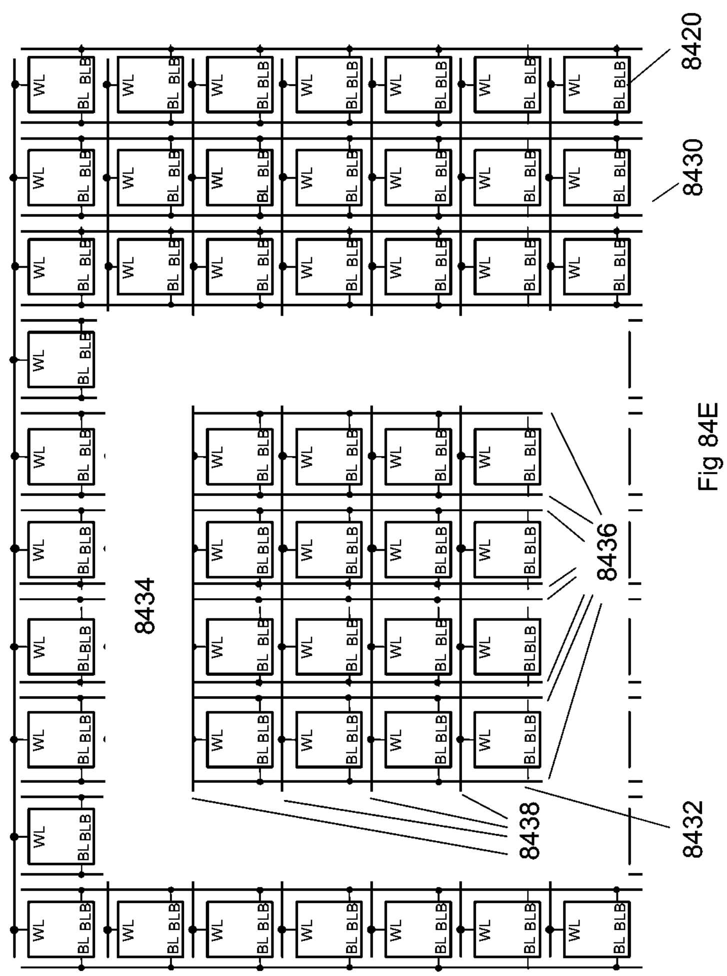

The generic continuous array 8430 may be a reticle step field sized terrain of SRAM bit cells 8420 wherein the transistor layers and even the Metal 1 layer may be used by substantially all designs. FIG. 84E illustrates such continuous array 8430 wherein a 4×4 memory block 8432 has been defined by etching the cells around it 8434. The memory may be customized by custom metal masks such metal 2 and metal 3. To control the memory block the Word Lines 8438 and the Bit Lines 8436 may be connected by through vias to the logic terrain underneath or above it.

Figure 84F:
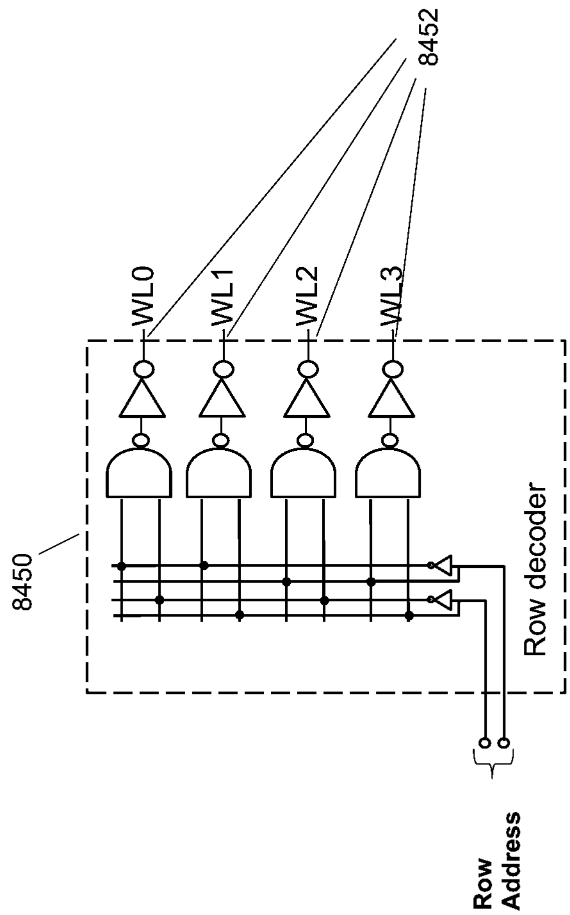
Figure 84G:
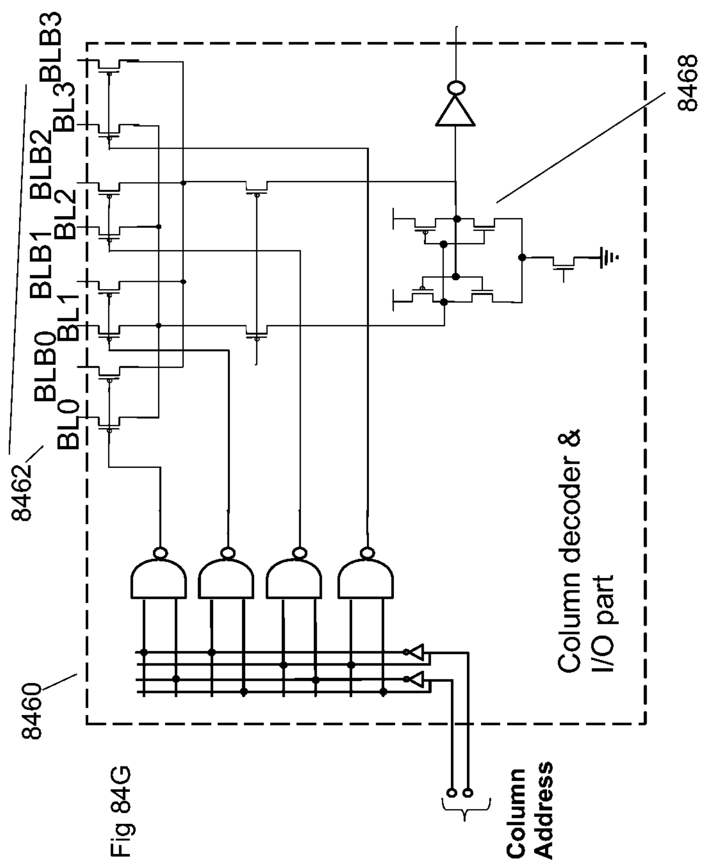

FIG. 84F illustrates the logic structure 8450 that may be constructed on the logic terrain to drive the Word Lines 8452. FIG. 84G illustrates the logic structure 8460 that may be constructed on the logic terrain to drive the Bit Lines 8462. FIG. 84G also illustrates the read sense circuit 8468 that may read the memory content from the bit lines 8462. In a similar fashion, other memory structures may be constructed from the uncommitted memory terrain using the uncommitted logic terrain close to the intended memory structure. In a similar fashion, other types of memory, such as flash or DRAM, may comprise the memory terrain. Furthermore, the memory terrain may be etched away at the edge of the projected die borders to define dicing streets similar to that indicated in FIG. 84C for a logic terrain.

Constructing 3D ICs utilizing multiple layers of different function may combine 3D layers using the layer transfer techniques according to some embodiments of the current invention, with fully prefabricated device connected by industry standard TSV technique.

An additional aspect of the current invention may provide a yield repair for random logic. The 3D IC techniques thus presented may allow the construction of a very complex logic 3D IC by using multiple layers of logic. In such a complex 3D IC, enabling the repair of random defects common in IC manufacturing may be highly desirable. Repair of repeating structures is known and commonly used in memories and will be presented in respect to FIG. 41. Another alternative is a repair for random logic leveraging the attributes of the presented 3D IC techniques and Direct Write eBeam technology such as, for example, technologies offered by Advantest, Fujitsu Microelectronics and Vistec.

Figure 86A:
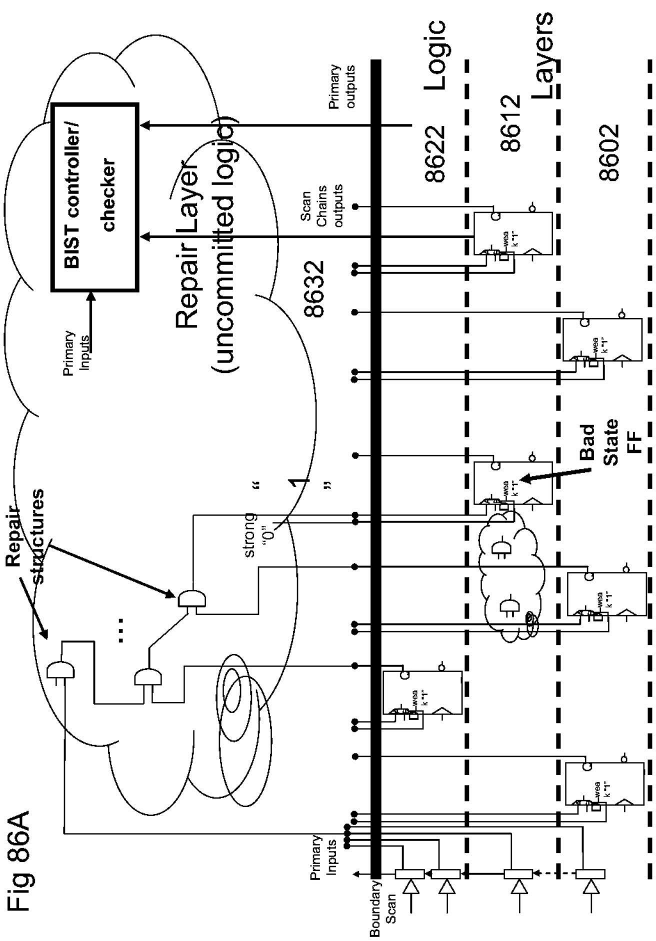
FIG. 86A is a drawing illustration of a 3D logic IC structured for repair.

FIG. 86A illustrates a 3D logic IC structured for repair. The illustrated 3D logic IC may comprise three logic layers 8602, 8612, 8622 and an upper layer of repair logic 8632. In each logic layer substantially all primary outputs, the Flip Flop (FF) outputs, may be fed to the upper layer 8632, the repair layer. The upper layer 8632 initially may comprise a repeating structure of uncommitted logic transistors similar to those of FIGS. 76 and 78.

Figure 87:
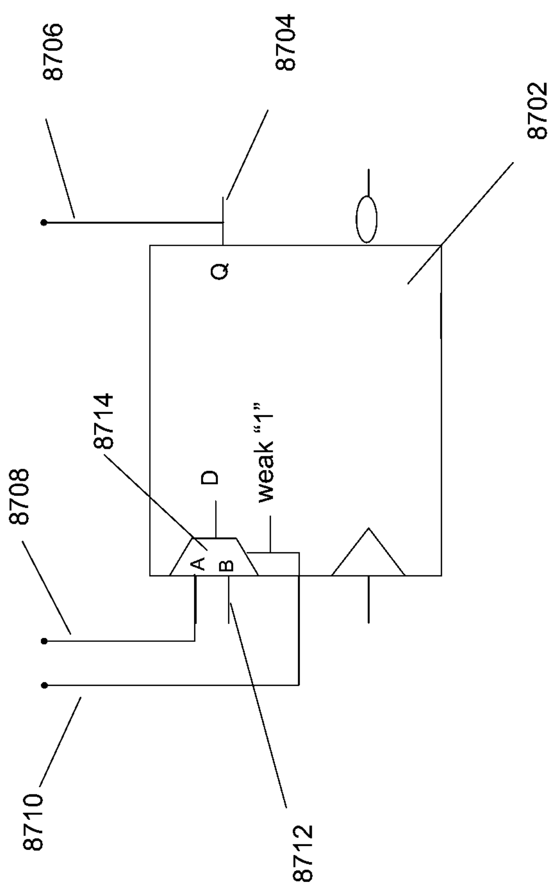
FIG. 87 is a drawing illustration of a Flip Flop designed for repairable 3D IC logic.

FIG. 87 illustrates a Flip Flop designed for repairable 3D IC logic. Such Flip Flop 8702 may include, in addition to its normal output 8704, a branch 8706 going up to the top layer, and the repair logic layer 8632. For each Flip Flop, two lines may originate from the top layer 8632, namely, the repair input 8708 and the control 8710. The normal input to the Flip Flop 8712 may go in through a multiplexer 8714 designed to select the normal input 8712 as long as the top control 8710 is floating. But once the top control 8710 is active low the multiplexer 8714 may select the repair input 8708. A faulty input may impact more than one primary input. The repair may then recreate substantially all the necessary logic to replace substantially all the faulty inputs in a similar fashion.

Multiple alternatives may exist for inserting the new input, including the use of programmability such as, for example, a one-time-programmable element to switch the multiplexer 8714 from the original input 8712 to the repaired input 8708 without the need of a top control wire 8710.

At the fabrication, the 3D IC wafer may go through a full scan test. If a fault is detected, a yield repair process would be applied. Using the design data base, repair logic may be built on the upper layer 8632. The repair logic has access to substantially all the primary outputs as they are all available on the top layer. Accordingly, those outputs needed for the repair may be used in the reconstruction of the exact logic found to be faulty. The reconstructed logic may include some enhancement such as drive size or metal wires strength to compensate for the longer lines going up and then down. The repair logic, as a de-facto replacement of the faulty logic 'cone,' may be built using the uncommitted transistors on the top layer. The top layer may be customized with a custom metal layer defined for each die on the wafer by utilizing the direct write eBeam. The replacement signal 8708 may be connected to the proper Flip Flop and become active by having the top control signal 8710 active low.

The repair flow may also be used for performance enhancement. If the wafer test includes timing measurements, a slow performing logic 'cone' could be replaced in a similar manner to a faulty logic 'cone' described previously, e.g., in the preceding paragraph.

Figure 86B:
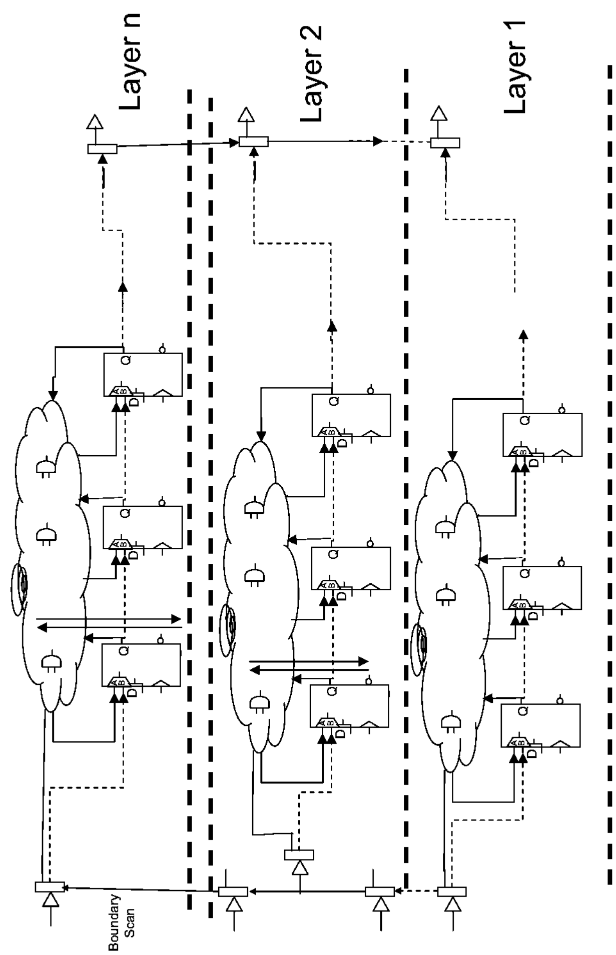
FIG. 86B is a drawing illustration of a 3D IC with scan chain confined to each layer.

FIG. 86B is a drawing illustration of a 3D IC wherein the scan chains are designed so each is confined to one layer. This confinement may allow testing of each layer as it is fabricated and could be useful in many ways. For example, after a circuit layer is completed and then tested showing very bad yield, then the wafer could be removed and not continued for building additional 3D circuit layers on top of bad base. Alternatively, a design may be constructed to be very modular and therefore the next transferred circuit layer could comprise replacement modules for the underlying faulty base layer similar to what was suggested in respect to FIG. 41.

Figure 86C:
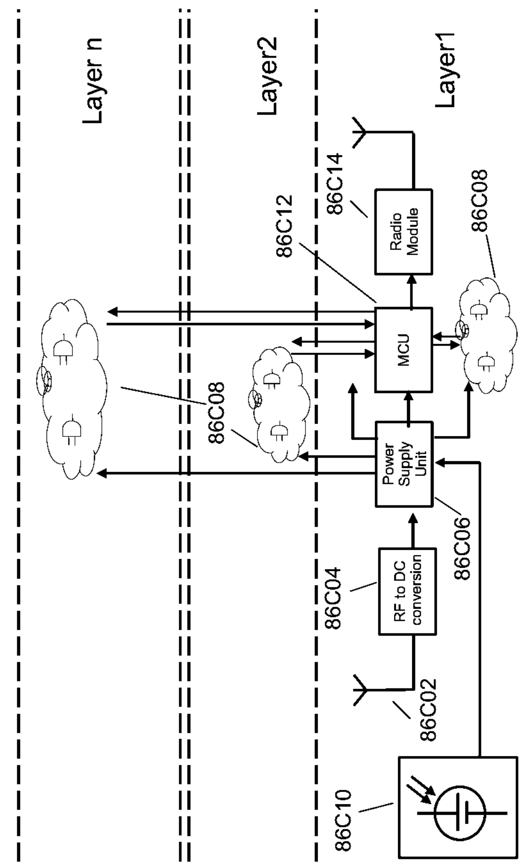
FIG. 86C is a drawing illustration of contact-less testing.

The elements of the invention related to FIGS. 86A and 86B may need testing of the wafer during the fabrication phase, which might be of concern in respect to debris associated with making physical contact with a wafer for testing if the wafer is probed when tested. FIG. 86C is a drawing illustration of an embodiment which provides for contact-less automated self testing. A contact-less power harvesting element might be used to harvest the electromagnetic energy directed at the circuit of interest by a coil base antenna 86C02, an RF to DC conversion circuit 86C04, and a power supply unit 86C06 to generate the necessary supply voltages to run the self test circuits and the various 3D IC circuits 86C08 to be tested. Alternatively, a tiny photo voltaic cell 86C10 could be used to convert light beam energy to electric current which will be converted by the power supply unit 86C06 to the needed voltages. Once the circuits are powered, a Micro Control Unit 86C12 could perform a full scan test of all existing circuits 86C08. The self test could be full scan or other BIST (Built In Self Test) alternatives. The test result could be transmitted using wireless radio module 86C14 to a base unit outside of the 3D IC wafer. Such contact less wafer testing could be used for the test as was referenced in respect to FIG. 86A and FIG. 86B or for other application such as wafer to wafer or die to wafer integration using TSVs. Alternative uses of contact-less testing could be applied to various combinations of the invention. One example is where a carrier wafer method may be used to create a wafer transfer layer whereby transistors and the metal layers connecting them to form functional electronic circuits are constructed. Those functional circuits could be contact-lessly tested to validate proper yield, and, if appropriate, actions to repair or activate built-in redundancy may be done. Then using layer transfer, the tested functional circuit layer may be transferred on top of another processed wafer 808, and then be connected be utilizing one of the approaches presented before.

According to the yield repair design methodology, substantially all the primary outputs 8706 may go up and substantially all primary inputs 8712 could be replaced by signals coming from the top 8708.

An additional advantage of this yield repair design methodology may be the ability to reuse logic layers from one design to another design. For example, a 3D IC system may be designed wherein one of the layers may comprise a WiFi transceiver receiver. And such circuit may now be needed for a completely different 3D IC. It might be advantageous to reuse the same WiFi transceiver receiver in the new design by just having the receiver as one of the new 3D IC design layers to save the redesign effort and the associated NRE (non recurring expense) for masks and etc. The reuse could be applied to many other functions, allowing the 3D IC to resemble the old way of integrating function—the PC (printed circuit) Board. For such a concept to work well, a connectivity standard for the connection of wires up and down may be desirable.

Another application of these concepts could be the use of the upper layer to modify the clock timing by adjusting the clock of the actual device and its various fabricated elements. Scan circuits could be used to measure the clock skew and report it to an external design tool. The external design tool could construct the timing modification that would be applied by the clock modification circuits. A direct write ebeam could then be used to form the transistors and circuitry on the top layer to apply those clock modifications for a better yield and performance of the 3D IC end product.

An alternative approach to increase yield of complex systems through use of 3D structure is to duplicate the same design on two layers vertically stacked on top of each other and use BIST techniques similar to those described in the previous sections to identify and replace malfunctioning logic cones. This should prove particularly effective repairing very large ICs with very low yields at manufacturing stage using one-time, or hard to reverse, repair structures such as, for example, antifuses or Direct-Write e-Beam customization. Similar repair approach can also assist systems that may need a self-healing ability at every power-up sequence through use of memory-based repair structures as described with regard to FIG. 114 below.

FIG. 114 is a drawing illustration of one possible implementation of this concept. Two vertically stacked logic layers 11401 and 11402 implement essentially an identical design. The design (same on each layer) is scan-based and includes BIST Controller/Checker on each layer 11451 and 11452 that can communicate with each other either directly or through an external tester. 11421 is a representative Flip-Flop (FF) on the first layer that has its corresponding FF 11422 on layer 2, each fed by its respective identical logic cones 11411 and 11412. The output of flip flop 11421 is coupled to the A input of multiplexer 11431 and the B input of multiplexer 11432 through vertical connection 11406, while the output of flip flop 11422 is coupled to the A input of multiplexer 11432 and the B input of multiplexer 11431 through vertical connection 11405. Each such output multiplexer is respectively controlled from control points 11441 and 11442, and multiplexer outputs drive the respective following logic stages at each layer. Thus, either logic cone 11411 and flip flop 11421 or logic cone 11412 and flip flop 11422 may be either programmably coupleable or selectively coupleable to the following logic stages at each layer.

The multiplexer control points 11441 and 11442 can be implemented using a memory cell, a fuse, an Antifuse, or any other customizable element such as, for example, a metal link that can be customized by a Direct-Write e-Beam machine. If a memory cell is used, its contents can be stored in a ROM, a flash memory, or in some other non-volatile storage medium elsewhere in the 3D IC or in the system in which contents are deployed and loaded upon a system power up, a system reset, or on-demand during system maintenance.

Upon power on, the BCC initializes all multiplexer controls to select inputs A and runs diagnostic test on the design on each layer. Failing Flip Flops (FFs) are identified at each logic layer using scan and BIST techniques, and as long as there is no pair of corresponding FF that fails, the BCCs can communicate with each other (directly or through an external tester) to determine which working FF to use and program the multiplexer controls 11441 and 11442 accordingly.

If multiplexer controls 11441 and 11442 are reprogrammable with respect to using memory cells, such test and repair process can potentially occur for every power on instance, or on demand, and the 3D IC can self-repair in-circuit. If the multiplexer controls are one-time programmable, the diagnostic and repair process may need to be performed using external equipment. It should be noted that the techniques for contact-less testing and repair as previously described with regard to FIG. 86C can be applicable in this situation.

An alternative embodiment of this concept can use multiplexing 8714 at the inputs of the FF such as described in FIG. 87. In that case both the Q and the inverted Q of FFs may be used, if present.

Person skilled in the art will appreciate that this repair technique of selecting one of two possible outputs from two essentially similar blocks vertically stacked on top of each other can be applied to other types of blocks in addition to FF described above. Examples of such include, but are not limited to, analog blocks, I/O, memory, and other blocks. In such cases the selection of the working output may need specialized multiplexing but the essential nature of the technique remains unchanged.

Such person will also appreciate that once the BIST diagnosis of both layers is complete, a mechanism similar to the one used to define the multiplexer controls can also be used to selectively power off unused sections of a logic layers to save on power dissipation.

Yet another variation on the invention is to use vertical stacking for on the fly repair using redundancy concepts such as Triple (or higher) Modular Redundancy ("TMR"). TMR is a well known concept in the high-reliability industry where three copies of each circuit are manufactured and their outputs are channeled through a majority voting circuitry. Such TMR system will continue to operate correctly as long as no more than a single fault occurs in any TMR block. A major problem in designing TMR ICs is that when the circuitry is triplicated, the interconnections become significantly longer which slows down the system speed, and the routing becomes more complex which slows down system design. Another major problem for TMR is that its design process is expensive because of correspondingly large design size, while its market is limited.

Vertical stacking offers a natural solution of replicating the system image on top of each other. FIG. 115 illustrates such a system with three layers 11501 11502 11503, where combinatorial logic is replicated such as in logic cones 11511-1, 11511-2, and 11511-3, and FFs are replicated such as 11521-1, 11521-2, and 11521-3. One of the layers, 11501 in this depiction, includes a majority voting circuitry 11531 that arbitrates among the local FF output 11551 and the vertically stacked FF outputs 11552 and 11553 to produce a final fault tolerant FF output that needs to be distributed to all logic layers as 11541-1, 11541-2, 11541-3.

Person skilled in the art will appreciate that variations on this configuration are possible such as dedicating a separate layer just to the voting circuitry that will make layers 11501, 11502 and 11503 logically identical; relocating the voting circuitry to the input of the FFs rather than to its output; or extending the redundancy replication to more than 3 instances (and stacked layers).

The above mentioned method for designing Triple Modular Redundancy (TMR) addresses both of the mentioned weaknesses. First, there is essentially no additional routing congestion in any layer because of TMR, and the design at each layer can be optimally implemented in a single image rather than in triplicate. Second, any design implemented for non high-reliability market can be converted to TMR design with minimal effort by vertical stacking of three original images and adding a majority voting circuitry either to one of the layers as in FIG. 115, to all three layers, or as a separate layer. A TMR circuit can be shipped from the factory with known errors present (masked by the TMR redundancy), or a Repair Layer can be added to repair any known errors for an even higher degree of reliability.

The exemplary embodiments discussed so far are primarily concerned with yield enhancement and repair in the factory prior to shipping a 3D IC to a customer. Another aspect of the present invention is providing redundancy and self-repair once the 3D IC is deployed in the field. This is a desirable product characteristic because defects may occur in products tested as operating correctly in the factory. For example, defects can occur due to a delayed failure mechanism such as a defective gate dielectric in a transistor that develops into a short circuit between the gate and the underlying transistor source, drain or body. Immediately after fabrication, such a transistor may function correctly during factory testing, but with time and applied voltages and temperatures, the defect can develop into a failure which may be detected during subsequent tests in the field. Many other delayed failure mechanisms are known. Regardless of the nature of the delayed defect, if it creates a logic error in the 3D IC then subsequent testing according to the present invention may be used to detect and repair it.

FIG. 119 illustrates an exemplary 3D IC generally indicated by 11900 according to an embodiment of the present invention. 3D IC 11900 includes two layers labeled Layer 1 and Layer 2 and separated by a dashed line in the figure. Layer 1 and Layer 2 may be bonded together into a single 3D IC using methods known in the art. The electrical coupling of signals between Layer 1 and Layer 2 may be realized with Through-Silicon Via (TSV) or some other interlayer technology. Layer 1 and Layer 2 may each include a single layer of semiconductor devices called a Transistor Layer and its associated interconnections (typically realized in one or more physical Metal Layers) which are called Interconnection Layers. The combination of a Transistor Layer and one or more Interconnection Layers is called a Circuit Layer. Layer 1 and Layer 2 may each include one or more Circuit Layers of devices and interconnections as a matter of design choice.

Despite differences in construction details, Layer 1 and Layer 2 in 3D IC 11900 perform substantially identical logic functions. In some embodiments, Layer 1 and Layer 2 may each be fabricated using the same masks for all layers to reduce manufacturing costs. In other embodiments, there may be small variations on one or more mask layers. For example, there may be an option on one of the mask layers which creates a different logic signal on each layer which tells the control logic blocks on Layer 1 and Layer 2 that they are the controllers Layer 1 and Layer 2 respectively in cases where this is important. Other differences between the layers may be present as a matter of design choice.

Layer 1 may include Control Logic 11910, representative scan flip-flops 11911, 11912 and 11913, and representative combinational logic clouds 11914 and 11915, while Layer 2 may include Control Logic 11920, representative scan flip-flops 11921, 11922 and 11923, and representative logic clouds 11924 and 11925. Control Logic 11910 and scan flip-flops 11911, 11912 and 11913 are coupled together to form a scan chain for set scan testing of combinational logic clouds 11914 and 11915 in a manner previously described. Control Logic 11920 and scan flip-flops 11921, 11922 and 11923 are also coupled together to form a scan chain for set scan testing of combinational logic clouds 11924 and 11925. Control Logic blocks 11910 and 11920 are coupled together to allow coordination of the testing on both Layers. In some embodiments, Control Logic blocks 11910 and 11920 may test either themselves or each other. If one of them is bad, the other can be used to control testing on both Layer 1 and Layer 2.

Persons of ordinary skill in the art will appreciate that the scan chains in FIG. 119 are representative only, that in a practical design there may be millions of flip-flops which may broken into multiple scan chains, and the inventive principles disclosed herein apply regardless of the size and scale of the design.

As with previously described embodiments, the Layer 1 and Layer 2 scan chains may be used in the factory for a variety of testing purposes. For example, Layer 1 and Layer 2 may each have an associated Repair Layer (not shown in FIG. 119) which was used to correct any defective logic cones or logic blocks which originally occurred on either Layer 1 or Layer 2 during their fabrication processes. Alternatively, a single Repair Layer may be shared by Layer 1 and Layer 2.

FIG. 120 illustrates exemplary scan flip-flop 12000 (surrounded by the dashed line in the figure) suitable for use with some embodiments of the current invention. Scan flip-flop 12000 may be used for the scan flip-flop instances 11911, 11912, 11913, 11921, 11922 and 11923 in FIG. 119. Present in FIG. 120 is D-type flip-flop 12002 which has a Q output coupled to the Q output of scan flip-flop 12000, a D input coupled to the output of multiplexer 12004, and a clock input coupled to the CLK signal. Multiplexer 12004 also has a first data input coupled to the output of multiplexer 12006, a second data input coupled to the SI (Scan Input) input of scan flip-flop 12000, and a select input coupled to the SE (Scan Enable) signal. Multiplexer 12006 has a first and second data inputs coupled to the D0 and D1 inputs of scan flip-flop 12000 and a select input coupled to the LAYER_SEL signal.

The SE, LAYER_SEL and CLK signals are not shown as coupled to input ports on scan flip-flop 12000 to avoid over complicating the disclosure—particularly in drawings like FIG. 119 where multiple instances of scan flip-flop 12000 appear and explicitly routing them would detract attention from the concepts being presented. In a practical design, all three of those signals are typically coupled to an appropriate circuit for every instance of scan flip-flop 12000.

When asserted, the SE signal places scan flip-flop 12000 into scan mode causing multiplexer 12004 to gate the SI input to the D input of D-type flip-flop 12002. Since this signal goes to all scan flip-flops 12000 in a scan chain, thus connecting them together as a shift register allowing vectors to be shifted in and test results to be shifted out. When SE is not asserted, multiplexer 12004 selects the output of multiplexer 12006 to present to the D input of D-type flip-flop 12002.

The CLK signal is shown as an "internal" signal here since its origin will differ from embodiment to embodiment as a matter of design choice. In practical designs, a clock signal (or some variation of it) is typically routed to every flip-flop in its functional domain. In some scan test architectures, CLK will be selected by a third multiplexer (not shown in FIG. 120) from a domain clock used in functional operation and a scan clock for use in scan testing. In such cases, the SCAN_EN signal will typically be coupled to the select input of the third multiplexer so that D-type flip-flop 12002 will be correctly clocked in both scan and functional modes of operation. In other scan architectures, the functional domain clock may be used as the scan clock during test modes and no additional multiplexer is needed. Persons of ordinary skill in the art will appreciate that many different scan architectures are known and will realize that the particular scan architecture in any given embodiment will be a matter of design choice and in no way limits the present invention.

The LAYER_SEL signal determines the data source of scan flip-flop 12000 in normal operating mode. As illustrated in FIG. 119, input D1 is coupled to the output of the logic cone of the Layer (either Layer 1 or Layer 2) where scan flip-flop 12000 is located, while input D0 is coupled to the output of the corresponding logic cone on the other Layer. The default value for LAYER_SEL is thus logic-1 which selects the output from the same Layer. Each scan flip-flop 12000 has its own unique LAYER_SEL signal. This allows a defective logic cone on one Layer to be programmably or selectively replaced by its counterpart on the other Layer. In such cases, the signal coupled to D1 being replaced is called a Faulty Signal while the signal coupled to D0 replacing it is called a Repair Signal.

FIG. 121A illustrates an exemplary 3D IC generally indicated by 12100. Like the embodiment of FIG. 119, 3D IC 12100 includes two Layers labeled Layer 1 and Layer 2 and separated by a dashed line in the drawing figure. Layer 1 may include Layer 1 Logic Cone 12110, scan flip-flop 12112, and XOR gate 12114, while Layer 2 may include Layer 2 Logic Cone 12120, scan flip-flop 12122, and XOR gate 12124. The scan flip-flop 12000 of FIG. 120 may be used for scan flip-flops 12112 and 12122, though the SI and other internal connections are not shown in FIG. 121A. The output of Layer 1 Logic Cone 12110 (labeled DATA1 in the drawing figure) is coupled to the D1 input of scan flip-flop 12112 on Layer 1 and the D0 input of scan flip-flop 12122 on Layer 2. Similarly, the output of Layer 2 Logic Cone 12120 (labeled DATA2 in the drawing figure) is coupled to the D1 input of scan flip-flop 12122 on Layer 2 and the D0 input of scan flip-flop 12112 on Layer 1. Each of the scan flip-flops 12112 and 12122 has its own LAYER_SEL signal (not shown in FIG. 121A) that selects between its D0 and D1 inputs in a manner similar to that illustrated in FIG. 120.

XOR gate 12114 has a first input coupled to DATA1, a second input coupled to DATA2, and an output coupled to signal ERROR1. Similarly, XOR gate 12124 has a first input coupled to DATA2, a second input coupled to DATA1, and an output coupled to signal ERROR2. If the logic values present on the signals on DATA1 and DATA2 are not equal, ERROR1 and ERROR2 will equal logic-1 signifying there is a logic error present. If the signals on DATA1 and DATA2 are equal, ERROR1 and ERROR2 will equal logic-0 signifying there is no logic error present. Persons of ordinary skill in art will appreciate that the underlying assumption here is that only one of the Logic Cones 12110 and 12120 will be bad simultaneously. Since both Layer 1 and Layer 2 have already been factory tested, verified and, in some embodiments, repaired, the statistical likelihood of both logic cones developing a failure in the field is extremely unlikely even without any factor repair, thus validating the assumption.

In 3DIC 12100, the testing may be done in a number of different ways as a matter of design choice. For example, the clock could be stopped occasionally and the status of the ERROR1 and ERROR2 signals monitored in a spot check manner during a system maintenance period. Alternatively, operation can be halted and scan vectors run with a comparison done on every vector. In some embodiments, a BIST testing scheme using Linear Feedback Shift Registers to generate pseudo-random vectors for Cyclic Redundancy Checking may be employed. These methods all involve stopping system operation and entering a test mode. Other methods of monitoring possible error conditions in real time will be discussed below.

In order to effect a repair in 3D IC 12100, two determinations are typically made: (1) the location of the logic cone with the error, and (2) which of the two corresponding logic cones is operating correctly at that location. Thus a method of monitoring the ERROR1 and ERROR2 signals and a method of controlling the LAYER_SEL signals of scan flip-flops 12112 and 12122 are may be needed, though there are other approaches. In a practical embodiment, a method of reading and writing the state of the LAYER_SEL signal may be needed for factory testing to verify that Layer 1 and Layer 2 are both operating correctly.

Typically, the LAYER_SEL signal for each scan flip-flop will be held in a programmable element like, for example, a volatile memory circuit like a latch storing one bit of binary data (not shown in FIG. 121A). In some embodiments, the correct value of each programmable element or latch may be determined at system power up, at a system reset, or on demand as a routine part of system maintenance. Alternatively, the correct value for each programmable element or latch may be determined at an earlier point in time and stored in a non-volatile medium like a flash memory or by programming antifuses internal to 3D IC 12100, or the values may be stored elsewhere in the system in which 3D IC 12100 is deployed. In those embodiments, the data stored in the non-volatile medium may be read from its storage location in some manner and written to the LAYER_SEL latches.

Various methods of monitoring ERROR1 and ERROR2 are possible. For example, a separate shift register chain on each Layer (not shown in FIG. 121A) could be employed to capture the ERROR1 and ERROR2 values, though this would carry a significant area penalty. Alternatively, the ERROR1 and ERROR2 signals could be coupled to scan flip-flops 12112 and 12122 respectively (not shown in FIG. 121A), captured in a test mode, and shifted out. This would carry less overhead per scan flip-flop, but would still be expensive.

The cost of monitoring the ERROR1 and ERROR2 signals can be reduced further if it is combined with the circuitry necessary to write and read the latches storing the LAYER_SEL information. In some embodiments, for example, the LAYER_SEL latch may be coupled to the corresponding scan flip-flop 12000 and have its value read and written through the scan chain. Alternatively, the logic cone, the scan flip-flop, the XOR gate, and the LAYER_SEL latch may all be addressed using the same addressing circuitry.

Illustrated in FIG. 121B is circuitry for monitoring ERROR2 and controlling its associated LAYER_SEL latch by addressing in 3D IC 12100. Present in FIG. 121B is 3D IC 12100, a portion of the Layer 2 circuitry as discussed in FIG. 121A including scan flip-flop 12122 and XOR gate 12124. A substantially identical circuit (not shown in FIG. 121B) will be present on Layer 1 involving scan flip-flop 12112 and XOR gate 12114.

Also present in FIG. 121B is LAYER_SEL latch 12170 which is coupled to scan flip-flop 12122 through the LAY- ER_SEL signal. The value of the data stored in latch 12170 determines which logic cone is used by scan flip-flop 12122 in normal operation. Latch 12170 is coupled to COL_ADDR line 12174 (the column address line), ROW_ADDR line 12176 (the row address line) and COL_BIT line 12178. These lines may be used to read and write the contents of latch 12170 in a manner similar to any SRAM circuit known in the art. In some embodiments, a complementary COL_BIT line (not shown in FIG. 121B) with inverted binary data may be present. In a logic design, whether implemented in full custom, semi-custom, gate array or ASIC design or some other design methodology, the scan flip-flops will not line up neatly in rows and columns the way memory cells do in a memory block. In some embodiments, a tool may be used to assign the scan flip-flops into virtual rows and columns for addressing purposes. Then the various virtual row and column lines would be routed like any other signals in the design.

The ERROR2 line 12172 may be read at the same address as latch 12170 using the circuit including N-channel transistors 12182, 12184 and 12186 and P-channel transistors 12190 and 12192. N-channel transistor 12182 has a gate terminal coupled to ERROR2 line 12172, a source terminal coupled to ground, and a drain terminal coupled to the source of N-channel transistor 12184. N-channel transistor 12184 has a gate terminal coupled to COL_ADDR line 12174, a source terminal coupled to N-channel transistor 12182, and a drain terminal coupled to the source of N-channel transistor 12186. N-channel transistor 12186 has a gate terminal coupled to ROW_ADDR line 12176, a source terminal coupled to the drain N-channel transistor 12184, and a drain terminal coupled to the drain of P-channel transistor 12190 and the gate of P-channel transistor 12192 through line 12188. P-channel transistor 12190 has a gate terminal coupled to ground, a source terminal coupled to the positive power supply, and a drain terminal coupled to line 12188. P-channel transistor 12192 has a gate terminal coupled to line 12188, a source terminal coupled to the positive power supply, and a drain terminal coupled to COL_BIT line 12178.

If the particular ERROR2 line 12172 in FIG. 121B is not addressed (i.e., either COL_ADDR line 12174 equals the ground voltage level (logic-0) or ROW_ADDR line 12176 equals the ground voltage supply voltage level (logic-0)), then the transistor stack including the three N-channel transistors 12182, 12184 and 12186 will be non-conductive. The P-channel transistor 12190 functions as a weak pull-up device pulling the voltage level on line 12188 to the positive power supply voltage (logic-1) when the N-channel transistor stack is non-conductive. This causes P-channel transistor 12192 to be non-conductive presenting high impedance to COL_BIT line 12178.

A weak pull-down (not shown in FIG. 121B) is coupled to COL_BIT line 12178. If all the memory cells coupled to COL_BIT line 12178 present high impedance, then the weak pull-down will pull the voltage level to ground (logic-0).

If the particular ERROR2 line 12172 in FIG. 121B is addressed (i.e., both COL_ADDR line 12174 and ROW_ADDR line 12176 are at the positive power supply voltage level (logic-1)), then the transistor stack including the three N-channel transistors 12182, 12184 and 12186 will be non-conductive if ERROR2=logic-0 and conductive if ERROR2=logic-1. Thus the logic value of ERROR2 may be propagated through P-channel transistors 12190 and 12192 and onto the COL_BIT line 12178.

An advantage of the addressing scheme of FIG. 121B is that a broadcast ready mode is available by addressing all of the rows and columns simultaneously and monitoring all of the column bit lines 12178. If all the column bit lines 12178 are logic-0, all of the ERROR2 signals are logic-0 meaning there are no bad logic cones present on Layer 2. Since field correctable errors will be relatively rare, this can save a lot of time locating errors relative to a scan flip-flop chain approach. If one or more bit lines is logic-1, faulty logic cones will only be present on those columns and the row addresses can be cycled quickly to find their exact addresses. Another advantage of the scheme is that large groups or all of the LAYER_SEL latches can be initialized simultaneously to the default value of logic-1 quickly during a power up or reset condition.

At each location where a faulty logic cone is present, if any, the defect is isolated to a particular layer so that the correctly functioning logic cone may be selected by the corresponding scan flip-flop on both Layer 1 and Layer 2. If a large non-volatile memory is present in the 3D IC 12100 or in the external system, then automatic test pattern generated (ATPG) vectors may be used in a manner similar to the factory repair embodiments. In this case, the scan itself is capable of identifying both the location and the correctly functioning layer. Unfortunately, this scan requires a large number of vectors and a correspondingly large amount of available non-volatile memory which may not be available in all embodiments.

Using some form of Built In Self Test (BIST) leads to the advantage of being self contained inside 3D IC 12100 without needing the storage of large numbers of test vectors. Unfortunately, BIST tests tend to be of the "go" or "no go" variety. They identify the presence of an error, but are not particularly good at diagnosing either the location or the nature of the fault. Fortunately, there are ways to combine the monitoring of the error signals previously described with BIST techniques and appropriate design methodology to quickly determine the correct values of the LAYER_SEL latches.

FIG. 122 illustrates an exemplary portion of the logic design implemented in a 3D IC such as, for example, 11900 of FIG. 119 or 12100 of FIG. 121A. The logic design is present on both Layer 1 and Layer 2 with substantially identical gate-level implementations. Preferably, all of the flip-flops (not illustrated in FIG. 122) in the design are implemented using scan flip-flops similar or identical in function to scan flip-flop 12000 of FIG. 120. Preferably, all of the scan flip-flops on each Layer have the sort of interconnections with the corresponding scan flip-flop on the other Layer as described in conjunction with FIG. 121A. Preferably, each scan flip-flop will have an associated error signal generator (e.g., an XOR gate) for detecting the presence of a faulty logic cone, and a LAYER_SEL latch to control which logic cone is fed to the flip-flop in normal operating mode as described in conjunction with FIGS. 121A and 121B.

Present in FIG. 122 is an exemplary logic function block (LFB) 12200. Typically LFB 12200 has a plurality of inputs, an exemplary instance being indicated by reference number 12202, and a plurality of outputs, an exemplary instance being indicated by reference number 12204. Preferably LFB 12200 is designed in a hierarchical manner, meaning that it typically has smaller logic function blocks such as 12210 and 12220 instantiated within it. Circuits internal to LFBs 12210 and 12220 are considered to be at a "lower" level of the hierarchy than circuits present in the "top" level of LFB 12200 which are considered to be at a "higher" level in the hierarchy. LFB 12200 is exemplary only. Many other configurations are possible. There may be more (or less) than two LFBs instantiated internal to LFB 12200. There may also be individual logic gates and other circuits instantiated internal to LFB 12200 not shown in FIG. 122 to avoid overcomplicating the disclosure. LFBs 12210 and 12220 may have internally instantiated even smaller blocks forming even lower levels in the hierarchy. Similarly, Logic Function Block 12200 may itself be instantiated in another LFB at an even higher level of the hierarchy of the overall design.

Present in LFB 12200 is Linear Feedback Shift Register (LFSR) circuit 12230 for generating pseudo-random input vectors for LFB 12200 in a manner well known in the art. In FIG. 122 one bit of LFSR 12230 is associated with each of the inputs 12202 of LFB 12200. If an input 12202 couples directly to a flip-flop (preferably a scan flip-flop similar to 12000) then that scan flip-flop may be modified to have the additional LFSR functionality to generate pseudo-random input vectors. If an input 12202 couples directly to combinatorial logic, it will be intercepted in test mode and its value determined and replaced by a corresponding bit in LFSR 12230 during testing. Alternatively, the LFSR circuit 12230 will intercept all input signals during testing regardless of the type of circuitry it connects to internal to LFB 12200.

Thus during a BIST test, all the inputs of LFB 12200 may be exercised with pseudo-random input vectors generated by LSFR 12230. As is known in the art, LSFR 12230 may be a single LSFR or a number of smaller LSFRs as a matter of design choice. LSFR 12230 is preferably implemented using a primitive polynomial to generate a maximum length sequence of pseudo-random vectors. LSFR 12230 needs to be seeded to a known value, so that the sequence of pseudo-random vectors is deterministic. The seeding logic can be inexpensively implemented internal to the LSFR 12230 flip-flops and initialized, for example, in response to a reset signal.

Also present in LFB 12200 is Cyclic Redundancy Check (CRC) circuit 12232 for generating a signature of the LFB 12200 outputs generated in response to the pseudo-random input vectors generated by LFSR 12230 in a manner well known in the art. In FIG. 122 one bit of CRC 12232 is associated with each of the outputs 12204 of LFB 12200. If an output 12204 couples directly to a flip-flop (preferably a scan flip-flop similar to 12000), then that scan flip-flop may be modified to have the additional CRC functionality to generate the signature. If an output 12204 couples directly to combinatorial logic, it will be monitored in test mode and its value coupled to a corresponding bit in CRC 12232. Alternatively, all the bits in CRC will passively monitor an output regardless of the source of the signal internal to LFB 12200.

Thus during a BIST test, all the outputs of LFB 12200 may be analyzed to determine the correctness of their responses to the stimuli provided by the pseudo-random input vectors generated by LSFR 12230. As is known in the art, CRC 12232 may be a single CRC or a number of smaller CRCs as a matter of design choice. As known in the art, a CRC circuit is a special case of an LSFR, with additional circuits present to merge the observed data into the pseudo-random pattern sequence generated by the base LSFR. The CRC 12232 is preferably implemented using a primitive polynomial to generate a maximum sequence of pseudo-random patterns. CRC 12232 needs to be seeded to a known value, so that the signature generated by the pseudo-random input vectors is deterministic. The seeding logic can be inexpensively implemented internal to the LSFR 12230 flip-flops and initialized, for example, in response to a reset signal. After completion of the test, the value present in the CRC 12232 is compared to the known value of the signature. If all the bits in CRC 12232 match, the signature is valid and the LFB 12200 is deemed to be functioning correctly. If one or more of the bits in CRC 12232 does not match, the signature is invalid and the LFB 12200 is deemed to not be functioning correctly. The value of the expected signature can be inexpensively implemented internal to the CRC 12232 flip-flops and compared internally to CRC 12232 in response to an evaluate signal.

As shown in FIG. 122, LFB 12210 includes LFSR circuit 12212, CRC circuit 12214, and logic function 12216. Since its input/output structure is analogous to that of LFB 12200, it can be tested in a similar manner albeit on a smaller scale. If 12200 is instantiated into a larger block with a similar input/output structure, 12200 may be tested as part of that larger block or tested separately as a matter of design choice. It is not necessary that all blocks in the hierarchy have this input/output structure if it is deemed unnecessary to test them individually. An example of this is LFB 12220 instantiated inside LFB 12200 which does not have an LFSR circuit on the inputs and a CRC circuit on the outputs and which is tested along with the rest of LFB 12200.

Persons of ordinary skill in the art will appreciate that other BIST test approaches are known in the art and that any of them may be used to determine if LFB 12200 is functional or faulty.

In order to repair a 3D IC like 3D IC 12100 of FIG. 121A using the block BIST approach, the part is put in a test mode and the DATA1 and DATA2 signals are compared at each scan flip-flop 12000 on Layer 1 and Layer 2 and the resulting ERROR1 and ERROR2 signals are monitored as described in the above embodiments or possibly using some other method. The location of the faulty logic cone is determined with regards to its location in the logic design hierarchy. For example, if the faulty logic cone were located inside LFB 12210 then the BIST routine for only that block would be run on both Layer 1 and Layer 2. The results of the two tests determine which of the blocks (and by implication which of the logic cones) is functional and which is faulty. Then the LAYER_SEL latches for the corresponding scan flip-flops 12000 can be set so that each receives the repair signal from the functional logic cone and ignores the faulty signal. Thus the layer determination can be made for a modest cost in hardware in a shorter period of time without the need for expensive ATPG testing.

FIG. 123 illustrates an alternative embodiment with the ability to perform field repair of individual logic cones. An exemplary 3D IC indicated generally by 12300 may include two layers labeled Layer 1 and Layer 2 and separated by a dashed line in the drawing figure. Layer 1 and Layer 2 are bonded together to form 3D IC 12300 using methods known in the art and interconnected using TSVs or some other inter-layer interconnect technology. Layer 1 may comprise Control Logic block 12310, scan flip-flops 12311 and 12312, multiplexers 12313 and 12314, and Logic cone 12315. Similarly, Layer 2 comprises Control Logic block 12320, scan flip-flops 12321 and 12322, multiplexers 12323 and 12324, and Logic cone 12325.

In Layer 1, scan flip-flops 12311 and 12312 are coupled in series with Control Logic block 12310 to form a scan chain. Scan flip-flops 12311 and 12312 can be ordinary scan flip-flops of a type known in the art. The Q outputs of scan flip-flops 12311 and 12312 are coupled to the D1 data inputs of multiplexers 12313 and 12314 respectively. Representative logic cone 12315 has a representative input coupled to the output of multiplexer 12313 and an output coupled to the D input of scan flip-flop 12312.

In Layer 2, scan flip-flops 12321 and 12322 are coupled in series with Control Logic block 12320 to form a scan chain. Scan flip-flops 12321 and 12322 can be ordinary scan flip-flops of a type known in the art. The Q outputs of scan flip-flops 12321 and 12322 are coupled to the D1 data inputs of multiplexers 12323 and 12324 respectively. Representative logic cone 12325 has a representative input coupled to the output of multiplexer 12323 and an output coupled to the D input of scan flip-flop 12322.

The Q output of scan flip-flop 12311 is coupled to the D0 input of multiplexer 12323, the Q output of scan flip-flop 12321 is coupled to the D0 input of multiplexer 12313, the Q output of scan flip-flop 12312 is coupled to the D0 input of multiplexer 12324, and the Q output of scan flip-flop 12322 is coupled to the D0 input of multiplexer 12314. Control Logic block 12310 is coupled to Control Logic block 12320 in a manner that allows coordination between testing functions between layers. In some embodiments, the Control Logic blocks 12310 and 12320 can test themselves or each other and, if one is faulty, the other can control testing on both layers. These interlayer couplings may be realized by TSVs or by some other interlayer interconnect technology.

The logic functions performed on Layer 1 are substantially identical to the logic functions performed on Layer 2. The embodiment of 3D IC 12300 in FIG. 123 is similar to the embodiment of 3D IC 11900 shown in FIG. 119, with the primary difference being that the multiplexers used to implement the interlayer programmable or selectable cross couplings for logic cone replacement are located immediately after the scan flip-flops instead of being immediately before them as in exemplary scan flip-flop 12000 of FIG. 120 and in exemplary 3D IC 11900 of FIG. 119.

FIG. 124 illustrates an exemplary 3D IC indicated generally by 12400 which is also constructed using this approach. Exemplary 3D IC 12400 includes two Layers labeled Layer 1 and Layer 2 and separated by a dashed line in the drawing figure. Layer 1 and Layer 2 are bonded together to form 3D IC 12400 and interconnected using TSVs or some other interlayer interconnect technology. Layer 1 comprises Layer 1 Logic Cone 12410, scan flip-flop 12412, multiplexer 12414, and XOR gate 12416. Similarly, Layer 2 includes Layer 2 Logic Cone 12420, scan flip-flop 12422, multiplexer 12424, and XOR gate 12426.

Layer 1 Logic Cone 12410 and Layer 2 Logic Cone 12420 implement substantially identical logic functions. In order to detect a faulty logic cone, the output of the logic cones 12410 and 12420 are captured in scan flip-flops 12412 and 12422 respectively in a test mode. The Q outputs of the scan flip-flops 12412 and 12422 are labeled Q1 and Q2 respectively in FIG. 124. Q1 and Q2 are compared using the XOR gates 12416 and 12426 to generate error signals ERROR1 and ERROR2 respectively. Each of the multiplexers 12414 and 12424 has a select input coupled to a layer select latch (not shown in FIG. 124) preferably located in the same layer as the corresponding multiplexer within relatively close proximity to allow selectable or programmable coupling of Q1 and Q2 to either DATA1 or DATA2.

All the methods of evaluating ERROR1 and ERROR2 described in conjunction with the embodiments of FIGS. 121A, 121B and 122 may be employed to evaluate ERROR1 and ERROR2 in FIG. 124. Similarly, once ERROR1 and ERROR2 are evaluated, the correct values may be applied to the layer select latches for the multiplexers 12414 and 12424 to effect a logic cone replacement if necessary. In this embodiment, logic cone replacement also includes replacing the associated scan flip-flop.

FIG. 125A illustrates an exemplary embodiment with an even more economical approach to realizing field repair. An exemplary 3D IC generally indicated by 12500 which includes two Layers labeled Layer 1 and Layer 2 and separated by a dashed line in the drawing figure. Each of Layer 1 and Layer 2 includes at least one Circuit Layer. Layer 1 and Layer 2 are bonded together using techniques known in the art to form 3D IC 12500 and interconnected with TSVs or other interlayer interconnect technology. Each Layer further includes an instance of Logic Function Block 12510, each of which in turn comprises an instance of Logic Function Block 12520. LFB 12520 includes LSFR circuits on its inputs (not shown in FIG. 125A) and CRC circuits on its outputs (not shown in FIG. 125A) in a manner analogous to that described with respect to LFB 12200 in FIG. 122.

Each instance of LFB 12520 has a plurality of multiplexers 12522 associated with its inputs and a plurality of multiplexers 12524 associated with its outputs. These multiplexers may be used to programmably or selectively replace the entire instance of LFB 12520 on either Layer 1 or Layer 2 with its counterpart on the other layer.

On power up, system reset, or on demand from control logic located internal to 3D IC 12500 or elsewhere in the system where 3D IC 12500 is deployed, the various blocks in the hierarchy can be tested. Any faulty block at any level of the hierarchy with BIST capability may be programmably and selectively replaced by its corresponding instance on the other Layer. Since this is determined at the block level, this decision can be made locally by the BIST control logic in each block (not shown in FIG. 125A), though some coordination may be required with higher level blocks in the hierarchy with regards to which Layer the plurality of multiplexers 12522 sources the inputs to the functional LFB 12520 in the case of multiple repairs in the same vicinity in the design hierarchy. Since both Layer 1 and Layer 2 preferably leave the factory fully functional, or alternatively nearly fully functional, a simple approach is to designate one of the Layers, for example, Layer 1, as the primary functional layer. Then the BIST controllers of each block can coordinate locally and decide which block should have its inputs and outputs coupled to Layer 1 through the Layer 1 multiplexers 12522 and 12524.

Persons of ordinary skill in the art will appreciate that significant area can be saved by employing this embodiment. For example, since LFBs are evaluated instead of individual logic cones, the interlayer selection multiplexers for each individual flip-flop like multiplexer 12006 in FIG. 120 and multiplexer 12414 in FIG. 124 can be removed along with the LAYER_SEL latches 12170 of FIG. 121B since this function is now handled by the pluralities of multiplexers 12522 and 12524 in FIG. 125A, all of which may be controlled by one or more control signals in parallel. Similarly, the error signal generators (e.g., XOR gates 12114 and 12124 in FIGS. 121A and 12416 and 12426 in FIG. 124) and any circuitry needed to read them (e.g., coupling them to the scan flip-flops) or the addressing circuitry described in conjunction with FIG. 121B may also be removed, since in this embodiment entire Logic Function Blocks, rather than individual Logic Cones, are being replaced.

Even the scan chains may be removed in some embodiments, though this is a matter of design choice. In embodiments where the scan chains are removed, factory testing and repair would also have to rely on the block BIST circuits. When a bad block is detected, an entire new block would need to be crafted on the Repair Layer with e-Beam. Typically this takes more time than crafting a replacement logic cone due to the greater number of patterns to shape, and the area savings may need to be compared to the test time losses to determine the economically superior decision.

Removing the scan chains also entails a risk in the early debug and prototyping stage of the design, since BIST circuitry is not very good for diagnosing the nature of problems. If there is a problem in the design itself, the absence of scan testing will make it harder to find and fix the problem, and the cost in terms of lost time to market can be very high and hard to quantify. Prudence might suggest leaving the scan chains in for reasons unrelated to the field repair aspects of the present invention.

Another advantage to embodiments using the block BIST approach is described in conjunction with FIG. 125B. One disadvantage to some of the earlier embodiments is that the majority of circuitry on both Layer 1 and Layer 2 is active during normal operation. Thus power can be substantially reduced relative to earlier embodiments by operating only one instance of a block on one of the layers whenever possible.

Present in FIG. 125B are 3D IC 12500, Layer 1 and Layer 2, and two instances each of LFBs 12510 and 12520, and pluralities of multiplexers 12522 and 12524 previously discussed. Also present in each Layer in FIG. 125B is a power select multiplexer 12530 associated with that layer's version of LFB 12520. Each power select multiplexer 12530 has an output coupled to the power terminal of its associated LFB 12520, a first select input coupled to the positive power supply (labeled VCC in the figure), and a second input coupled to the ground potential power supply (labeled GND in the figure). Each power select multiplexer 12530 has a select input (not shown in FIG. 125B) coupled to control logic (also not shown in FIG. 125B), typically present in duplicate on Layer 1 and Layer 2 though it may be located elsewhere internal to 3D IC 12500 or possibly elsewhere in the system where 3D IC 12500 is deployed.

Persons of ordinary skill in the art will appreciate that there are many ways to programmably or selectively power down a block inside an integrated circuit known in the art and that the use of power multiplexer 12530 in the embodiment of FIG. 125B is exemplary only. Any method of powering down LFB 12520 is within the scope of the invention. For example, a power switch could be used for both VCC and GND. Alternatively, the power switch for GND could be omitted and the power supply node allowed to "float" down to ground when VCC is decoupled from LFB 12530. In some embodiments, VCC may be controlled by a transistor, like either a source follower or an emitter follower which is itself controlled by a voltage regulator, and VCC may be removed by disabling or switching off the transistor in some way. Many other alternatives are possible.

In some embodiments, control logic (not shown in FIG. 125B) uses the BIST circuits present in each block to stitch together a single copy of the design (using each block's plurality of input and output multiplexers which function similarly to pluralities of multiplexers 12522 and 12524 associated with LFB 12520) including functional copies of all the LFBs. When this mapping is complete, all of the faulty LFBs and the unused functional LFBs are powered off using their associated power select multiplexers (similar to power select multiplexer 12530). Thus the power consumption can be reduced to the level that a single copy of the design would require using standard two dimensional integrated circuit technology.

Alternatively, if a layer, for example, Layer 1 is designated as the primary layer, then the BIST controllers in each block can independently determine which version of the block is to be used. Then the settings of the pluralities of multiplexers 12522 and 12524 are set to couple the used block to Layer 1 and the settings of multiplexers 12530 can be set to power down the unused block. Typically, this should reduce the power consumption by half relative to embodiments where power select multiplexers 12530 or equivalent are not implemented.

There are test techniques known in the art that are a compromise between the detailed diagnostic capabilities of scan testing with the simplicity of BIST testing. In embodiments employing such schemes, each BIST block (smaller than a typical LFB, but typically including a few tens to a few hundreds of logic cones) stores a small number of initial states in particular scan flip-flops while most of the scan flip-flops can use a default value. CAD tools may be used to analyze the design's net-list to identify the necessary scan flip-flops to allow efficient testing.

During test mode, the BIST controller shifts in the initial values and then starts the clocking the design. The BIST controller has a signature register which might be a CRC or some other circuit which monitors bits internal to the block being tested. After a predetermined number of clock cycles, the BIST controller stops clocking the design, shifts out the data stored in the scan flip-flops while adding their contents to the block signature, and compares the signature to a small number of stored signatures (one for each of the stored initial states.

This approach has the advantage of not needing a large number of stored scan vectors and the "go" or "no go" simplicity of BIST testing. The test block is less fine than identifying a single faulty logic cone, but much coarser than a large Logic Function Block. In general, the finer the test granularity (i.e., the smaller the size of the circuitry being substituted for faulty circuitry) the less chance of a delayed fault showing up in the same test block on both Layer 1 and Layer 2. Once the functional status of the BIST block has been determined, the appropriate values are written to the latches controlling the interlayer multiplexers to replace a faulty BIST block on one if the layers, if necessary. In some embodiments, faulty and unused BIST blocks may be powered down to conserve power.

While discussions of the various exemplary embodiments described so far concern themselves with finding and repairing defective logic cones or logic function blocks in a static test mode, embodiments of the present invention can address failures due to noise or timing. For example, in 3D IC 11900 of FIG. 119 and in 3D IC 12300 of FIG. 123 the scan chains can be used to perform at-speed testing in a manner known in the art. One approach involves shifting a vector in through the scan chains, applying two or more at-speed clock pulses, and then shifting out the results through the scan chain. This will catch any logic cones that are functionally correct at low speed testing but are operating too slowly to function in the circuit at full clock speed. While this approach will allow field repair of slow logic cones, it may need the time, intelligence and memory capacity necessary to store, run, and evaluate scan vectors.

Another approach is to use block BIST testing at power up, reset, or on-demand to over-clock each block at ever increasing frequencies until one fails, determine which layer version of the block is operating faster, and then substitute the faster block for the slower one at each instance in the design. This approach has the more modest time, intelligence and memory requirements generally associated with block BIST testing, but it still needs placing of the 3D IC in a test mode.

FIG. 126 illustrates an embodiment where errors due to slow logic cones can be monitored in real time while the circuit is in normal operating mode. An exemplary 3D IC generally indicated at 12600 includes two Layers labeled Layer 1 and Layer 2 that are separated by a dashed line in the drawing figure. The Layers each include one or more Circuit Layers and are bonded together to form 3D IC 12600. The layers are electrically coupled together using TSVs or some other interlayer interconnect technology.

FIG. 126 focuses on the operation of circuitry coupled to the output of a single Layer 2 Logic Cone 12620, though substantially identical circuitry is also present on Layer 1 (not shown in FIG. 82). Also present in FIG. 126 is scan flip-flop 12622 with its D input coupled to the output of Layer 2 Logic Cone 12620 and its Q output coupled to the D1 input of multiplexer 12624 through interlayer line 12612 labeled Q2 in the figure. Multiplexer 12624 has an output DATA2 coupled to a logic cone (not shown in FIG. 126) and a D0 input coupled the Q1 output of the Layer 1 flip-flop corresponding to flip-flop 12622 (not shown in the figure) through interlayer line 12610.

XOR gate 12626 has a first input coupled to Q1, a second input coupled to Q2, and an output coupled to a first input of AND gate 12646. AND gate 12646 also has a second input coupled to TEST_EN line 12648 and an output coupled to the Set input of RS flip-flop 3828. RS flip-flop also has a Reset input coupled to Layer 2 Reset line 12630 and an output coupled to a first input of OR gate 12632 and the gate of N-channel transistor 12638. OR gate 12632 also has a second input coupled to Layer 20R-chain Input line 12634 and an output coupled to Layer 20R-chain Output line 12636.

Layer 2 control logic (not shown in FIG. 126) controls the operation of XOR gate 12626, AND gate 12646, RS flip-flop 12628, and OR gate 12636. The TEST_EN line 12648 is used to disable the testing process with regards to Q1 and Q2. This is desirable in cases where, for example, a functional error has already been repaired and differences between Q1 and Q2 are routinely expected and would interfere with the background testing process looking for marginal timing errors.

Layer 2 Reset line 12630 is used to reset the internal state of RS flip-flop 12628 to logic-0 along with all the other RS flip-flops associated with other logic cones on Layer 2. OR gate 12632 is coupled together with all of the other OR-gates associated with other logic cones on Layer 2 to form a large Layer 2 distributed OR function coupled to all of the Layer 2 RS flip-flops like 12628 in FIG. 126. If all of the RS flip-flops are reset to logic-0, then the output of the distributed OR function will be logic-0. If a difference in logic state occurs between the flip-flops generating the Q1 and Q2 signals, XOR gate 12626 will present a logic-1 through AND gate 12646 (if TEST_EN=logic-1) to the Set input of RS flip-flop 12628 causing it to change state and present a logic-1 to the first input of OR gate 12632, which in turn will produce a logic-1 at the output of the Layer 2 distributed OR function (not shown in FIG. 126) notifying the control logic (not shown in the figure) that an error has occurred.

The control logic can then use the stack of N-channel transistors 12638, 12640 and 12642 to determine the location of the logic cone producing the error. Transistor 12638 has a gate terminal coupled to the Q output of RS flip-flop 12628, a source terminal coupled to ground, and a drain terminal coupled to the source of transistor 12640. Transistor 12640 has a gate terminal coupled to the row address line ROW_ADDR line, a source terminal coupled to the drain of transistor 12638, and a drain terminal coupled to the source of transistor 12642. Transistor 12642 has a gate terminal coupled to the column address line COL_ADDR line, a source terminal coupled to the drain of transistor 12640, and a drain terminal coupled to the sense line SENSE.

The row and column addresses are virtual addresses, since in a logic design the locations of the flip-flops will not be neatly arranged in rows and columns. In some embodiments a Computer Aided Design (CAD) tool is used to modify the net-list to correctly address each logic cone and then the ROW_ADDR and COL_ADDR signals are routed like any other signal in the design.

This produces an efficient way for the control logic to cycle through the virtual address space. If COL_ADDR=ROW_ADDR=logic-1 and the state of RS flip-flop is logic-1, then the transistor stack will pull SENSE=logic-0. Thus a logic-1 will only occur at a virtual address location where the RS flip-flop has captured an error. Once an error has been detected, RS flip-flop 12628 can be reset to logic-0 with the Layer 2 Reset line 12630 where it will be able to detect another error in the future.

The control logic can be designed to handle an error in any of a number of ways. For example, errors can be logged and if a logic error occurs repeatedly for the same logic cone location, then a test mode can be entered to determine if a repair is necessary at that location. This is a good approach to handle intermittent errors resulting from marginal logic cones that only occasionally fail, for example, due to noise, and may be tested as functional in normal testing. Alternatively, action can be taken upon receipt of the first error notification as a matter of design choice.

As discussed earlier in conjunction with FIG. 27, using Triple Modular Redundancy (TMR) at the logic cone level can also function as an effective field repair method, though it really creates a high level of redundancy that masks rather than repairs errors due to delayed failure mechanisms or marginally slow logic cones. If factory repair is used to make sure all the equivalent logic cones on each layer test functional before the 3D IC is shipped from the factory, the level of redundancy is even higher. The cost of having three layers versus having two layers, with or without a repair layer must be factored into determining the best embodiment for any application.

An alternative TMR approach is shown in exemplary 3D IC 12700 in FIG. 127. Present in FIG. 127 are substantially identical Layers labeled Layer 1, Layer 2 and Layer 3 separated by dashed lines in the figure. Layer 1, Layer 2 and Layer 3 may each include one or more circuit layers and are bonded together to form 3D IC 12700 using techniques known in the art. Layer 1 comprises Layer 1 Logic Cone 12710, flip-flop 12714, and majority-of-three (MAJ3) gate 12716. Layer 2 may include Layer 2 Logic Cone 12720, flip-flop 12724, and MAJ3 gate 12726. Layer 3 may include Layer 3 Logic Cone 12730, flip-flop 12734, and MAJ3 gate 12736.

The logic cones 12710, 12720 and 12730 all perform a substantially identical logic function. The flip-flops 12714, 12724 and 12734 are preferably scan flip-flops. If a Repair Layer is present (not shown in FIG. 127), then the flip-flop 2502 of FIG. 25 may be used to implement repair of a defective logic cone before 3D IC 12700 is shipped from the factory. The MAJ3 gates 12716, 12726 and 12736 compare the outputs from the three flip-flops 12714, 12724 and 12734 and output a logic value consistent with the majority of the inputs: specifically if two or three of the three inputs equal logic-0, then the MAJ3 gate will output logic-0; and if two or three of the three inputs equal logic-1, then the MAJ3 gate will output logic-1. Thus if one of the three logic cones or one of the three flip-flops is defective, the correct logic value will be present at the output of all three MAJ3 gates.

One advantage of the embodiment of FIG. 127 is that Layer 1, Layer 2 or Layer 3 can all be fabricated using all or nearly all of the same masks. Another advantage is that MAJ3 gates 12716, 12726 and 12736 also effectively function as a Single Event Upset (SEU) filter for high reliability or radiation tolerant applications as described in Rezgui cited above.

Another TMR approach is shown in exemplary 3D IC 12800 in FIG. 128. In this embodiment, the MAJ3 gates are placed between the logic cones and their respective flip-flops. Present in FIG. 128 are substantially identical Layers labeled Layer 1, Layer 2 and Layer 3 separated by dashed lines in the figure. Layer 1, Layer 2 and Layer 3 may each include one or more circuit layers and are bonded together to form 3D IC 12800 using techniques known in the art. Layer 1 comprises Layer 1 Logic Cone 12810, flip-flop 12814, and majority-of-three (MAJ3) gate 12812. Layer 2 may include Layer 2 Logic Cone 12820, flip-flop 12824, and MAJ3 gate 12822. Layer 3 may include Layer 3 Logic Cone 12830, flip-flop 12834, and MAJ3 gate 12832.

The logic cones 12810, 12820 and 12830 all perform a substantially identical logic function. The flip-flops 12814, 12824 and 12834 are preferably scan flip-flops. If a Repair Layer is present (not shown in FIG. 128), then the flip-flop 2502 of FIG. 25 may be used to implement repair of a defective logic cone before 3D IC 12800 is shipped from the factory. The MAJ3 gates 12812, 12822 and 12832 compare the outputs from the three logic cones 12810, 12820 and 12830 and output a logic value consistent with the majority of the inputs. Thus if one of the three logic cones is defective, the correct logic value will be present at the output of all three MAJ3 gates.

One advantage of the embodiment of FIG. 128 is that Layer 1, Layer 2 or Layer 3 can all be fabricated using all or nearly all of the same masks. Another advantage is that MAJ3 gates 12712, 12722 and 12732 also effectively function as a Single Event Transient (SET) filter for high reliability or radiation tolerant applications as described in Rezgui cited above.

Another TMR embodiment is shown in exemplary 3D IC 12900 in FIG. 129. In this embodiment, the MAJ3 gates are placed between the logic cones and their respective flip-flops. Present in FIG. 129 are substantially identical Layers labeled Layer 1, Layer 2 and Layer 3 separated by dashed lines in the figure. Layer 1, Layer 2 and Layer 3 may each include one or more circuit layers and are bonded together to form 3D IC 12900 using techniques known in the art. Layer 1 comprises Layer 1 Logic Cone 12910, flip-flop 12914, and majority-of-three (MAJ3) gates 12912 and 12916. Layer 2 may include Layer 2 Logic Cone 12920, flip-flop 12924, and MAJ3 gates 12922 and 12926. Layer 3 may include Layer 3 Logic Cone 12930, flip-flop 12934, and MAJ3 gates 12932 and 12936.

The logic cones 12910, 12920 and 12930 all perform a substantially identical logic function. The flip-flops 12914, 12924 and 12934 are preferably scan flip-flops. If a Repair Layer is present (not shown in FIG. 129), then the flip-flop 2502 of FIG. 25 may be used to implement repair of a defective logic cone before 3D IC 12900 is shipped from the factory. The MAJ3 gates 12912, 12922 and 12932 compare the outputs from the three logic cones 12910, 12920 and 12930 and output a logic value consistent with the majority of the inputs. Similarly, the MAJ3 gates 12916, 12926 and 12936 compare the outputs from the three flip-flops 12914, 12924 and 12934 and output a logic value consistent with the majority of the inputs. Thus if one of the three logic cones or one of the three flip-flops is defective, the correct logic value will be present at the output of all six of the MAJ3 gates.

One advantage of the embodiment of FIG. 129 is that Layer 1, Layer 2 or Layer 3 can all be fabricated using all or nearly all of the same masks. Another advantage is that MAJ3 gates 12712, 12722 and 12732 also effectively function as a Single Event Transient (SET) filter while MAJ3 gates 12716, 12726 and 12736 also effectively function as a Single Event Upset (SEU) filter for high reliability or radiation tolerant applications as described in Rezgui cited above.

Some embodiments of the current invention can be applied to a large variety of commercial as well as high-reliability aerospace and military applications. The ability to fix defects in the factory with Repair Layers combined with the ability to automatically fix delayed defects (by masking them with three layer TMR embodiments or replacing faulty circuits with two layer replacement embodiments) allows the creation of much larger and more complex three dimensional systems than is possible with conventional two dimensional integrated circuit (IC) technology. These various aspects of the present invention can be traded off against the cost requirements of the target application.

In order to reduce the cost of a 3D IC according to some embodiments of the current invention, it is desirable to use the same set of masks to manufacture each Layer. This can be done by creating an identical structure of vias in an appropriate pattern on each layer and then offsetting it by a desired amount when aligning Layer 1 and Layer 2.

FIG. 130A illustrates a via pattern 13000 which is constructed on Layer 1 of 3D ICs like 11900, 12100, 12200, 12300, 12400, 12500 and 12600 previously discussed. At a minimum the metal overlap pad at each via location 13002, 13004, 13006 and 13008 may be present on the top and bottom metal layers of Layer 1. Via pattern 13000 occurs in proximity to each repair or replacement multiplexer on Layer 1 where via metal overlap pads 13002 and 13004 (labeled L1/D0 for Layer 1 input D0 in the figure) are coupled to the D0 multiplexer input at that location, and via metal overlap pads 13006 and 13008 (labeled L1/D1 for Layer 1 input D1 in the figure) are coupled to the D1 multiplexer input.

Similarly, FIG. 130B illustrates a substantially identical via pattern 13010 which is constructed on Layer 2 of 3D ICs like 11900, 12100, 12200, 12300, 12400, 12500 and 12600 previously discussed. At a minimum the metal overlap pad at each via location 13012, 13014, 13016 and 13018 may be present on the top and bottom metal layers of Layer 2. Via pattern 13010 occurs in proximity to each repair or replacement multiplexer on Layer 2 where via metal overlap pads 13012 and 13014 (labeled L2/D0 for Layer 2 input D0 in the figure) are coupled to the D0 multiplexer input at that location, and via metal overlap pads 13016 and 13018 (labeled L2/D1 for Layer 2 input D1 in the figure) are coupled to the D1 multiplexer input.

FIG. 130C illustrates a top view where via patterns 13000 and 13010 are aligned offset by one interlayer interconnection pitch. The interlayer interconnects may be TSVs or some other interlayer interconnect technology. Present in FIG. 130C are via metal overlap pads 13002, 13004, 13006, 13008, 13012, 13014, 13016 and 13018 previously discussed. In FIG. 130C Layer 2 is offset by one interlayer connection pitch to the right relative to Layer 1. This offset causes via metal overlap pads 13004 and 13018 to physically overlap with each other. Similarly, this offset causes via metal overlap pads 13006 and 13012 to physically overlap with each other. If Through Silicon Vias or other interlayer vertical coupling points are placed at these two overlap locations (using a single mask) then multiplexer input D1 of Layer 2 is coupled to multiplexer input D0 of Layer 1 and multiplexer input D0 of Layer 2 is coupled to multiplexer input D1 of Layer 1. This is precisely the interlayer connection topology necessary to realize the repair or replacement of logic cones and functional blocks in, for example, the embodiments described with respect to FIGS. 121A and 123.

FIG. 130D illustrates a side view of a structure employing the technique described in conjunction with FIGS. 130A, 130B and 130C. Present in FIG. 130D is an exemplary 3D IC generally indicated by 13020 comprising two instances of Layer 13030 stacked together with the top instance labeled Layer 2 and the bottom instance labeled Layer 1 in the figure. Each instance of Layer 13020 may include an exemplary transistor 13031, an exemplary contact 13032, exemplary metal 1 13033, exemplary via 1 13034, exemplary metal 2 13035, exemplary via 2 13036, and exemplary metal 3 13037.

The dashed oval labeled 13000 indicates the part of the Layer 1 corresponding to via pattern 13000 in FIGS. 130A and 130C. Similarly, the dashed oval labeled 13010 indicates the part of the Layer 2 corresponding to via pattern 13010 in FIGS. 130B and 130C. An interlayer via such as TSV 13040 in this example is shown coupling the signal D1 of Layer 2 to the signal D0 of Layer 1. A second interlayer via, not shown since it is out of the plane of FIG. 130D, couples the signal D01 of Layer 2 to the signal D1 of Layer 1. As can be seen in FIG. 130D, while Layer 1 is identical to Layer 2, Layer 2 is offset by one interlayer via pitch allowing the TSVs to correctly align to each layer while only requiring a single interlayer via mask to make the correct interlayer connections.

As previously discussed, in some embodiments of the present invention it is desirable for the control logic on each Layer of a 3D IC to know which layer it is. It is also desirable to use all of the same masks for each Layers. In an embodiment using the one interlayer via pitch offset between layers to correctly couple the functional and repair connections, a different via pattern can be placed in proximity to the control logic to exploit the interlayer offset and uniquely identify each of the layers to its control logic.

FIG. 131A illustrates a via pattern 13100 which is constructed on Layer 1 of 3D ICs like 11900, 12100, 12200, 12300, 12400, 12500 and 12600 previously discussed. At a minimum the metal overlap pad at each via location 13102, 13104, and 13106 may be present on the top and bottom metal layers of Layer 1. Via pattern 13100 occurs in proximity to control logic on Layer 1. Via metal overlap pad 13102 is coupled to ground (labeled L1/G in the figure for Layer 1 Ground). Via metal overlap pad 13104 is coupled to a signal named ID (labeled L1/ID in the figure for Layer 1 ID). Via metal overlap pad 13106 is coupled to the power supply voltage (labeled L1/V in the figure for Layer 1 VCC).

FIG. 131B illustrates a via pattern 13110 which is constructed on Layer 1 of 3D ICs like 11900, 12100, 12200, 12300, 12400, 12500 and 12600 previously discussed. At a minimum the metal overlap pad at each via location 13112, 13114, and 13116 may be present on the top and bottom metal layers of Layer 2. Via pattern 13110 occurs in proximity to control logic on Layer 2. Via metal overlap pad 13112 is coupled to ground (labeled L2/G in the figure for Layer 2 Ground). Via metal overlap pad 13114 is coupled to a signal named ID (labeled L2/ID in the figure for Layer 2 ID). Via metal overlap pad 13116 is coupled to the power supply voltage (labeled L2/V in the figure for Layer 2 VCC).

FIG. 131C illustrates a top view where via patterns 13100 and 13110 are aligned offset by one interlayer interconnection pitch. The interlayer interconnects may be TSVs or some other interlayer interconnect technology. Present in FIG. 130C are via metal overlap pads 13102, 13104, 13106, 13112, 13114, and 13016 previously discussed. In FIG. 130C Layer 2 is offset by one interlayer connection pitch to the right relative to Layer 1. This offset causes via metal overlap pads 13104 and 13112 to physically overlap with each other. Similarly, this offset causes via metal overlap pads 13106 and 13114 to physically overlap with each other. If Through Silicon Vias or other interlayer vertical coupling points are placed at these two overlap locations (using a single mask) then the Layer 1 ID signal is coupled to ground and the Layer 2 ID signal is coupled to VCC. This configuration allows the control logic in Layer 1 and Layer 2 to uniquely know their vertical position in the stack.

Persons of ordinary skill in the art will appreciate that the metal connections between Layer 1 and Layer 2 will typically be much larger including larger pads and numerous TSVs or other interlayer interconnections. This increased size makes alignment of the power supply nodes easy and ensures that L1/V and L2/V will both be at the positive power supply potential and that L1/G and L2/G will both be at ground potential.

Several embodiments of the present invention utilize Triple Modular Redundancy (TMR) distributed over three Layers. In such embodiments it may be desirable to use the same masks for all three Layers.

FIG. 132A illustrates a via metal overlap pattern 13200 including a 3×3 array of TSVs (or other interlayer coupling technology). The TMR interlayer connections occur in the proximity of a majority-of-three (MAJ3) gate typically fanning in or out from either a flip-flop or functional block. Thus at each location on each of the three layers we have the function f(X0, X1, X2)=MAJ3(X0, X1, X2) being implemented where X0, X1 and X2 are the three inputs to the MAJ3 gate. For purposes of this discussion, the X0 input is always coupled to the version of the signal generated on the same layer as the MAJ3 gate and the X1 and X2 inputs come from the other two layers.

In via pattern 13200, via metal overlap pads 13202, 13212 and 13216 are coupled to the X0 input of the MAJ3 gate on that layer, via metal overlap pads 13204, 13208 and 13218 are coupled to the X1 input of the MAJ3 gate on that layer, and via metal overlap pads 13206, 13210 and 13214 are coupled to the X2 input of the MAJ3 gate on that layer.

FIG. 132B illustrates an exemplary 3D IC generally indicated by 13220 having three Layers labeled Layer 1, Layer 2 and Layer 3 from bottom to top. Each layer may include an instance of via pattern 13200 in the proximity of each MAJ3 gate used to implement a TMR related interlayer coupling. Layer 2 is offset one interlayer via pitch to the right relative to Layer 1 while Layer 3 is offset one interlayer via pitch to the right relative to Layer 2. The illustration in FIG. 132B is an abstraction. While it correctly shows the two interlayer via pitch offsets in the horizontal direction, a person of ordinary skill in the art will realize that each row of via metal overlap pads in each instance of 13200 is horizontally aligned with the same row in the other instances.

Thus there are three locations where a via metal overlap pad is aligned on all three layers. FIG. 132B shows three interlayer vias 13230, 13240 and 13250 placed in those locations coupling Layer 1 to Layer 2 and three more interlayer vias 13232, 13242 and 13252 placed in those locations coupling Layer 2 to Layer 3. The same interlayer via mask may be used for both interlayer via fabrication steps.

Thus the interlayer vias 13230 and 13232 are vertically aligned and couple together the Layer 1 X2 MAJ3 gate input, the Layer 2 X0 MAJ3 gate input, and the Layer 3 X1 MAJ3 gate input. Similarly, the interlayer vias 13240 and 13242 are vertically aligned and couple together the Layer 1 X1 MAJ3 gate input, the Layer 2 X2 MAJ3 gate input, and the Layer 3 X0 MAJ3 gate input. Finally, the interlayer vias 13250 and 13252 are vertically aligned and couple together the Layer 1 X0 MAJ3 gate input, the Layer 2 X1 MAJ3 gate input, and the Layer 3 X2 MAJ3 gate input. Since the X0 input of the MAJ3 gate in each layer is driven from that layer, each driver is coupled to a different MAJ3 gate input on each layer preventing drivers from being shorted together and the each MAJ3 gate on each layer receives inputs from each of the three drivers on the three Layers.

Some embodiments of the current invention can be applied to a large variety of commercial as well as high-reliability aerospace and military applications. The ability to fix defects in the factory with Repair Layers combined with the ability to automatically fix delayed defects (by masking them with three layer TMR embodiments or replacing faulty circuits with two layer replacement embodiments) allows the creation of much larger and more complex three dimensional systems than is possible with conventional two dimensional integrated circuit (IC) technology. These various aspects of the present invention can be traded off against the cost requirements of the target application.

For example, a 3D IC targeted at inexpensive consumer products where cost is dominant consideration might do factory repair to maximize yield in the factory but not include any field repair circuitry to minimize costs in products with short useful lifetimes. A 3D IC aimed at higher end consumer or lower end business products might use factory repair combined with two layer field replacement. A 3D IC targeted at enterprise class computing devices which balance cost and reliability might skip doing factory repair and use TMR for both acceptable yields as well as field repair. A 3D IC targeted at high reliability, military, aerospace, space, or radiation-tolerant applications might do factory repair to ensure that all three instances of every circuit are fully functional and use TMR for field repair as well as SET and SEU filtering. Battery operated devices for the military market might add circuitry to allow the device to operate only one of the three TMR layers to save battery life and include a radiation detection circuit which automatically switches into TMR mode when needed if the operating environment changes. Many other combinations and tradeoffs are possible within the scope of the invention.

It is worth noting that many of the principles of the present invention are also applicable to conventional two dimensional integrated circuits (2D ICs). For example, an analogous of the two layer field repair embodiments could be built on a single layer with both versions of the duplicate circuitry on a single 2D IC employing the same cross connections between the duplicate versions. A programmable technology like, for example, fuses, antifuses, flash memory storage, etc., could be used to effect both factory repair and field repair. Similarly, an analogous versions of some of the TMR embodiments are unique topologies in 2D ICs as well as in 3D ICs which would also improve the yield or reliability of 2D IC systems if implemented on a single layer.

Figure 13:
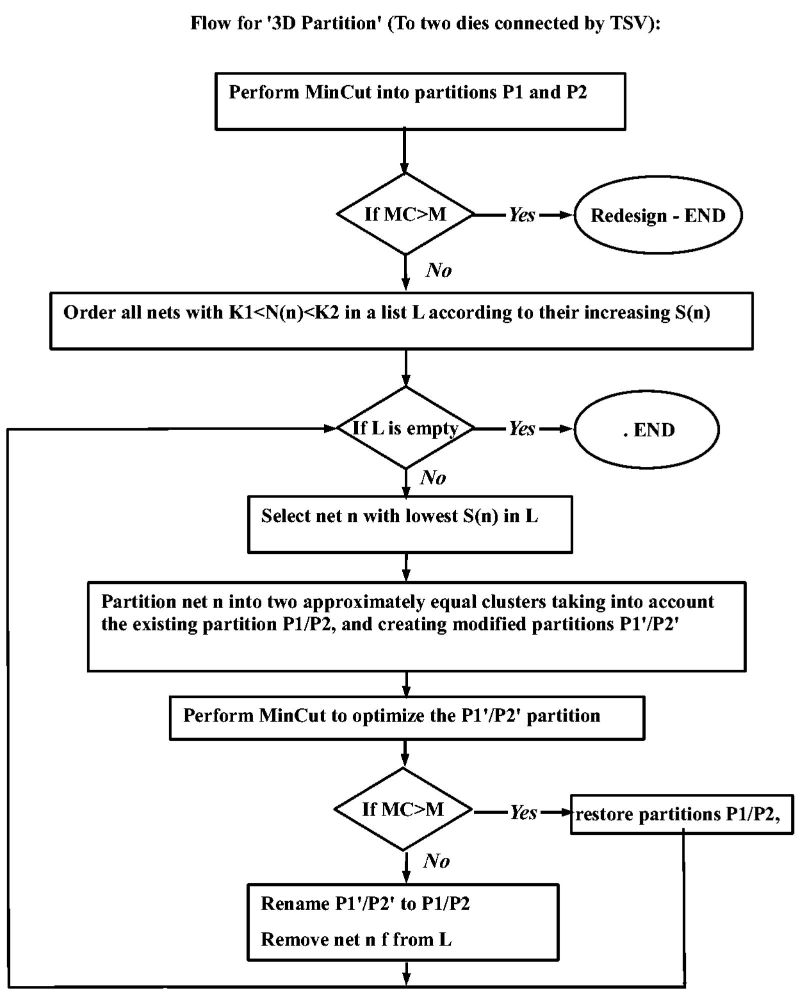
FIG. 13 a drawing illustration of a flow chart for 3D logic partitioning.

FIG. 13 is a flow-chart illustration for 3D logic partitioning. The partitioning of a logic design to two or more vertically connected dies presents a different challenge for a Place and Route—P&R—tool. A place and route tool is a type of CAD software capable of operating on libraries of logic cells (as well as libraries of other types of cells) as previously discussed. The common layout flow of prior art P & R tools may typically start with planning the placement followed by the routing. But the design of the logic of vertically connected dies may give priority to the much-reduced frequency of connections between dies and may create a need for a special design flow and CAD software specifically to support the design flow. In fact, a 3D system might merit planning some of the routing first as presented in the flows of FIG. 13.

The flow chart of FIG. 13 uses the following terms:

M—The number of TSVs available for logic;

N(n)—The number of nodes connected to net n;

S(n)—The median slack of net n;

MinCut—a known algorithm to partition logic design (netlist) to two pieces about equal in size with a minimum number of nets (MC) connecting the pieces;

MC—number of nets connecting the two partitions;

K1, K2—Two parameters selected by the designer.

One idea of the proposed flow of FIG. 13 is to construct a list of nets in the logic design that connect more than K1 nodes and less than K2 nodes. K1 and K2 are parameters that could be selected by the designer and could be modified in an iterative process. K1 should be high enough so to limit the number of nets put into the list. The flow's objective is to assign the TSVs to the nets that have tight timing constraints—critical nets. And also have many nodes whereby having the ability to spread the placement on multiple die help to reduce the overall physical length to meet the timing constraints. The number of nets in the list should be close but smaller than the number of TSVs. Accordingly K1 should be set high enough to achieve this objective. K2 is the upper boundary for nets with the number of nodes N(n) that would justify special treatment.

Critical nets may be identified usually by using static timing analysis of the design to identify the critical paths and the available "slack" time on these paths, and pass the constraints for these paths to the floor planning, layout, and routing tools so that the final design is not degraded beyond the requirement.

Once the list is constructed it is priority-ordered according to increasing slack, or the median slack, S(n), of the nets. Then, using a partitioning algorithm, such as, but not limited to, MinCut, the design may be split into two parts, with the highest priority nets split about equally between the two parts. The objective is to give the nets that have tight slack a better chance to be placed close enough to meet the timing challenge. Those nets that have higher than K1 nodes tend to get spread over a larger area, and by spreading into three dimensions we get a better chance to meet the timing challenge.

The Flow of FIG. 13 suggests an iterative process of allocating the TSVs to those nets that have many nodes and are with the tightest timing challenge, or smallest slack.

Clearly the same Flow could be adjusted to three-way partition or any other number according to the number of dies the logic will be spread on.

Constructing a 3D Configurable System comprising antifuse based logic also provides features that may implement yield enhancement through utilizing redundancies. This may be even more convenient in a 3D structure of embodiments of the current invention because the memories may not be sprinkled between the logic but may rather be concentrated in the memory die, which may be vertically connected to the logic die. Constructing redundancy in the memory, and the proper self-repair flow, may have a smaller effect on the logic and system performance.

The potential dicing streets of the continuous array of this invention represent some loss of silicon area. The narrower the street the lower the loss is, and therefore, it may be advantageous to use advanced dicing techniques that can create and work with narrow streets.

One such advanced dicing technique may be the use of lasers for dicing the 3D IC wafers. Laser dicing techniques, including the use of water jets to cool the substrate and remove debris, may be employed to minimize damage to the 3D IC structures and may also be utilized to cut sensitive layers in the 3D IC, and then a conventional saw finish may be used.

An additional advantage of the 3D Configurable System of various embodiments of this invention may be a reduction in testing cost. This is the result of building a unique system by using standard 'Lego®' blocks. Testing standard blocks could reduce the cost of testing by using standard probe cards and standard test programs.

The disclosure presents two forms of 3D IC system, first by using TSV and second by using the method referred to herein as the 'Attic' described in, for example, FIGS. 21 to 35 and 39 to 40. Those two methods could even work together as a devices could have multiple layers of mono- or poly-crystalline silicon produced using layer transfer or deposits and the techniques referred to herein as the 'Foundation' and the 'Attic' and then connected together using TSV. The most significant difference is that prior TSVs are associated with a relatively large misalignment (approximately 1 micron) and limited connections (TSV) per mm sq. of approximately 10,000 for a connected fully fabricated device while the disclosed 'smart-cut'—layer transferred techniques allow 3D structures with a very small misalignment (<10 nm) and high number of connections (vias) per mm sq. of approximately 100,000,000, since they are produced in an integrated fabrication flow. An advantage of 3D using TSV is the ability to test each device before integrating it and utilize the Known Good Die (KGD) in the 3D stack or system. This is very helpful to provide good yield and reasonable costs of the 3D Integrated System.

An additional alternative of the invention is a method to allow redundancy so that the highly integrated 3D systems using the layer transfer technique could be produced with good yield. For the purpose of illustrating this redundancy invention we will use the programmable tile array presented in FIGS. 11A, 36-38.

Figure 41:
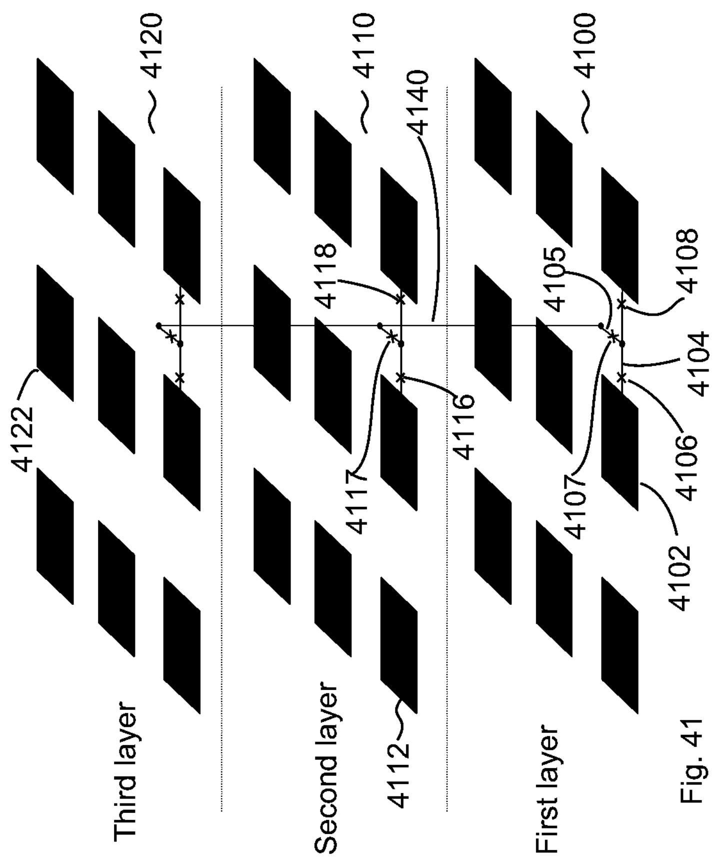
FIG. 41 is a drawing illustration of a 3D IC system with redundancy.

FIG. 41 is a drawing illustration of a 3D IC system with redundancy. It illustrates a 3D IC programmable system comprising: first programmable layer 4100 of 3×3 tiles 4102, overlaid by second programmable layer 4110 of 3×3 tiles 4112, overlaid by third programmable layer 4120 of 3×3 tiles 4122. Between a tile and its neighbor tile in the layer there are many programmable connections 4104. The programmable element 4106 could be antifuse, pass transistor controlled driver, floating gate flash transistor, or similar electrically programmable element. Each inter-tile connection 4104 has a branch out programmable connection 4105 connected to inter-layer vertical connection 4140. The end product is designed so that at least one layer such as 4110 is left for redundancy.

When the end product programmable system is being programmed for the end application each tile will run its own Built-in Test using its own MCU. A tile that is detected to have a defect will be replaced by the tile in the redundancy layer 4110. The replacement will be done by the tile that is at the same location but in the redundancy layer and therefore it should have an acceptable impact on the overall product functionality and performance. For example, if tile (1,0,0) has a defect then tile (1,0,1) will be programmed to have exactly the same function and will replace tile (1,0,0) by properly setting the inter tile programmable connections. Therefore, if defective tile (1,0,0) was supposed to be connected to tile (2,0,0) by connection 4104 with programmable element 4106, then programmable element 4106 would be turned off and programmable elements 4116, 4117, 4107 will be turned on instead. A similar multilayer connection structure should be used for any connection in or out of a repeating tile. So if the tile has a defect the redundant tile of the redundant layer would be programmed to the defected tile functionality and the multilayer inter tile structure would be activated to disconnect the faulty tile and connect the redundant tile. The inter layer vertical connection 4140 could be also used when tile (2,0,0) is defective to insert tile (2,0,1), of the redundant layer, instead. In such case (2,0,1) will be programmed to have exactly the same function as tile (2,0,0), programmable element 4108 will be turned off and programmable elements 4118, 4117, 4107 will be turned on instead.

An additional embodiment of the invention may be a modified TSV (Through Silicon Via) flow. This flow may be for wafer-to-wafer TSV and may provide a technique whereby the thickness of the added wafer may be reduced to about 1 micrometer (micron). FIG. 93 A to D illustrate such a technique. The first wafer 9302 may be the base on top of which the 'hybrid' 3D structure may be built. A second wafer 9304 may be bonded on top of the first wafer 9302. The new top wafer may be face-down so that the circuits 9305 may be face-to-face with the first wafer 9302 circuits 9303.

The bond may be oxide-to-oxide in some applications or copper-to-copper in other applications. In addition, the bond may be by a hybrid bond wherein some of the bonding surface may be oxide and some may be copper.

Figure 93A:
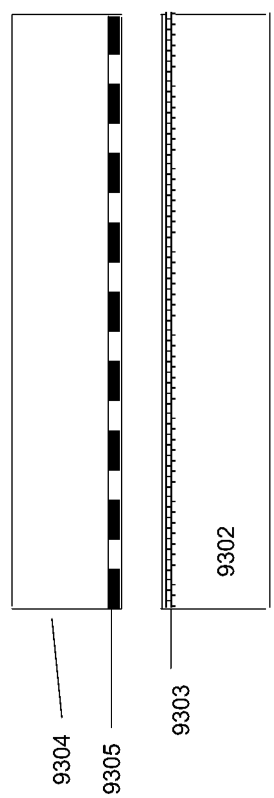
FIG. 93 A-D are drawing illustrations of an advanced TSV flow.
Figure 93B:
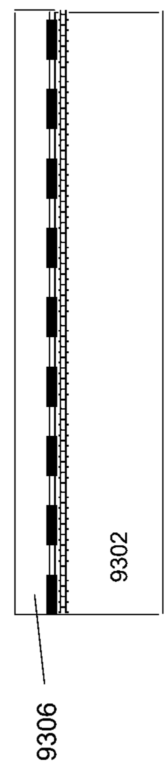

After bonding, the top wafer 9304 may be thinned down to about 60 micron in a conventional back-lap and CMP process. FIG. 93B illustrates the now thinned wafer 9306 bonded to the first wafer 9302.

Figure 93C:

The next step may comprise a high accuracy measurement of the top wafer 9306 thickness. Then, using a high power 1-4 MeV H+ implant, a cleave plane 9310 may be defined in the top wafer 9306. The cleave plane 9310 may be positioned approximately 1 micron above the bond surface as illustrated in FIG. 93C. This process may be performed with a special high power implanter such as, for example, the implanter used by SiGen Corporation for their PV (PhotoVoltaic) application.

Figure 93D:
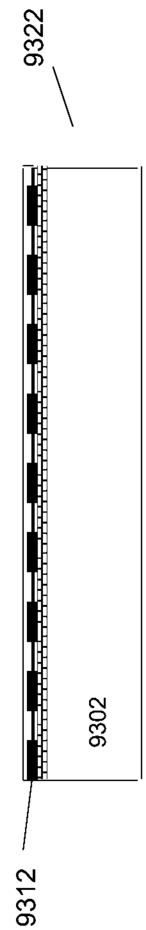

Having the accurate measure of the top wafer 9306 thickness and the highly controlled implant process may enable cleaving most of the top wafer 9306 out thereby leaving a very thin layer 9312 of about 1 micron, bonded on top of the first wafer 9302 as illustrated in FIG. 93D.

An advantage of this process flow may be that an additional wafer with circuits could now be placed and bonded on top of the bonded structure 9322 in a similar manner. But first a connection layer may be built on the back of 9312 to allow electrical connection to the bonded structure 9322 circuits. Having the top layer thinned to a single micron level may allow such electrical connection metal layers to be fully aligned to the top wafer 9312 electrical circuits 9305 and may allows the vias through the back side of top layer 9312 to be relatively small, of about 100 nm in diameter.

The thinning of the top layer 9312 may enable the modified TSV to be at the level of 100 nm vs. the 5 microns necessary for TSVs that need to go through 50 microns of silicon. Unfortunately the misalignment of the wafer-to-wafer bonding process may still be quite significant at about +/−0.5 micron. Accordingly, as described elsewhere in this document in relation to FIG. 75, a landing pad of approximately 1×1 microns may be used on the top of the first wafer 9302 to connect with a small metal contact on the face of the second wafer 9304 while using copper-to-copper bonding. This process may represent a connection density of approximately 1 connection per 1 square micron.

It may be desirable to increase the connection density using a concept as illustrated in FIG. 80 and the associated explanations. In the modified TSV case, it may be much more challenging to do so because the two wafers being bonded may be fully processed and once bonded, only very limited access to the landing strips may be available. However, to construct a via, etching through all layers may be needed. FIG. 94 illustrates a method and structures to address these issues.

Figures 94A, 94B:
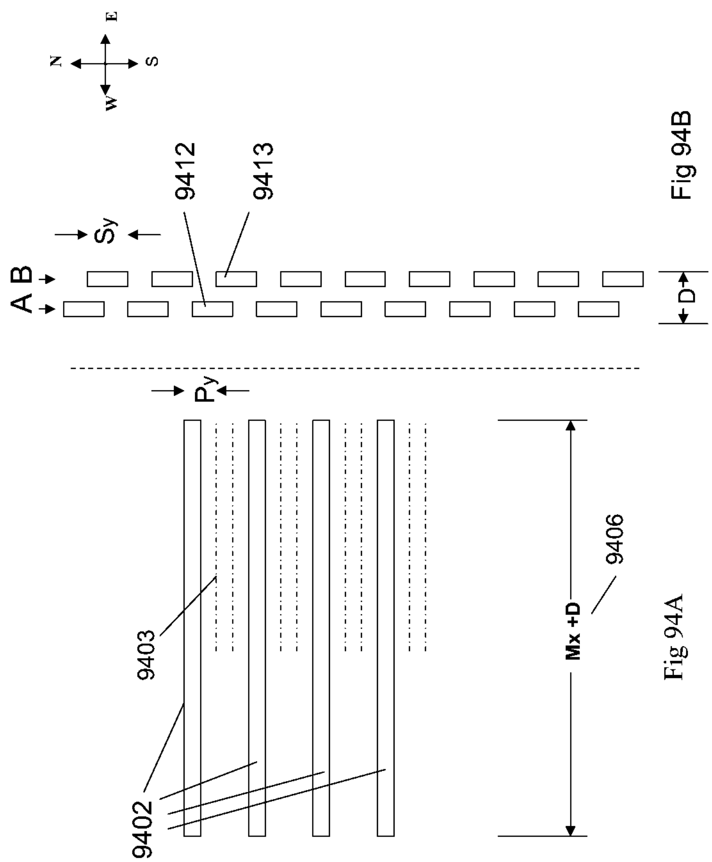

FIG. 94A illustrates four metal landing strips 9402 exposed at the upper layer of the first wafer 9302. The landing strips 9402 may be oriented East-West at a length 9406 of the maximum East-West bonding misalignment Mx plus a delta D, which will be explained later. The pitch of the landing strip may be twice the minimum pitch Py of this upper layer of the first wafer 9302. 9403 may indicate an unused potential room for an additional metal strip.

FIG. 94B illustrates landing strips 9412, 9413 exposed at the top of the second wafer 9312. FIG. 94B also shows two columns of landing strips, namely, A and B going North to South. The length of these landing strips is 1.25 Py. The two wafers 9302 and 9312 may be bonded copper-to-copper and the landing strips of FIG. 94A and FIG. 94B may be designed so that the bonding misalignment does not exceed the maximum misalignment Mx in the East-West direction and My in the North-South direction. The landing strips 9412 and 9413 of FIG. 94B may be designed so that they may never unintentionally short to landing strips 9402 of 94A and that either row A landing strips 9412 or row B landing strips 9413 may achieve full contact with landing strips 9402. The delta D may be the size from the East edge of landing strips 9413 of row B to the West edge of A landing strips 9412. The number of landing strips 9412 and 9413 of FIG. 94B may be designed to cover the FIG. 94A landing strips 9402 plus My to cover maximum misalignment error in the North-South direction.

Figure 94C:
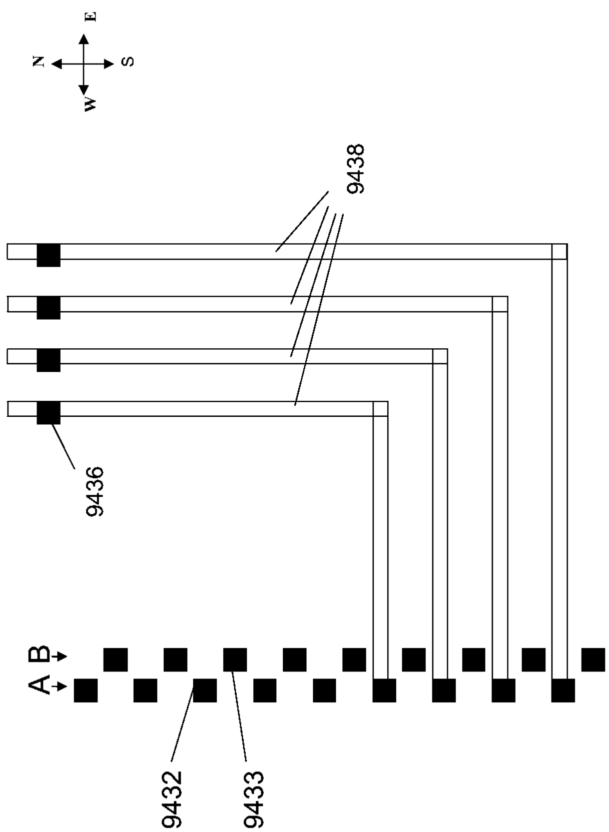

Substantially all the landing strips 9412 and 9413 of FIG. 94B may be routed by the internal routing of the top wafer 9312 to the bottom of the wafer next to the transistor layers. The location on the bottom of the wafer is illustrated in FIG. 93D as the upper side of the 9322 structure. Now new vias 9432 may be formed to connect the landing strips to the top surface of the bonded structure using conventional wafer processing steps. FIG. 94C illustrates all the via connections routed to the landing strips of FIG. 94B, arranged in row A 9432 and row B 9433. In addition, the vias 9436 for bringing in the signals may also be processed. All these vias may be aligned to the top wafer 9312.

As illustrated in FIG. 94C, a metal mask may now be used to connect, for example, four of the vias 9432 and 9433 to the four vias 9436 using metal strips 9438. This metal mask may be aligned to the top wafer 9312 in the East-West direction. This metal mask may also be aligned to the top wafer 9312 in the North-South direction but with a special offset that is based on the bonding misalignment in the North-South direction. The length of the metal structure 9438 in the North South direction may be enough to cover the worst case North-South direction bonding misalignment.

It should be stated again that the invention could be applied to many applications other than programmable logic such a Graphics Processor which may comprise many repeating processing units. Other applications might include general logic design in 3D ASICs (Application Specific Integrated Circuits) or systems combining ASIC layers with layers comprising at least in part other special functions. Persons of ordinary skill in the art will appreciate that many more embodiment and combinations are possible by employing the inventive principles contained herein and such embodiments will readily suggest themselves to such skilled persons. Thus the invention is not to be limited in any way except by the appended claims.

Yet another alternative to implement 3D redundancy to improve yield by replacing a defective circuit is by the use of Direct Write E-beam instead of a programmable connection.

An additional variation of the programmable 3D system may comprise a tiled array of programmable logic tiles connected with I/O structures that are pre fabricated on the base wafer 1402 of FIG. 14.

In yet an additional variation, the programmable 3D system may comprise a tiled array of programmable logic tiles connected with I/O structures that are pre-fabricated on top of the finished base wafer 1402 by using any of the techniques presented in conjunction to FIGS. 21-35 or FIGS. 39-40. In fact any of the alternative structures presented in FIG. 11 may be fabricated on top of each other by the 3D techniques presented in conjunction with FIGS. 21-35 or FIGS. 39-40. Accordingly many variations of 3D programmable systems may be constructed with a limited set of masks by mixing different structures to form various 3D programmable systems by varying the amount and 3D position of logic and type of I/Os and type of memories and so forth.

Additional flexibility and reuse of masks may be achieved by utilizing only a portion of the full reticle exposure. Modern steppers allow covering portions of the reticle and hence projecting only a portion of the reticle. Accordingly a portion of a mask set may be used for one function while another portion of that same mask set would be used for another function. For example, let the structure of FIG. 37 represent the logic portion of the end device of a 3D programmable system. On top of that 3×3 programmable tile structure I/O structures could be built utilizing process techniques according to FIGS. 21-35 or FIGS. 39-40. There may be a set of masks where various portions provide for the overlay of different I/O structures; for example, one portion comprising simple I/Os, and another of Serializer/Deserializer (Ser/Des) I/Os. Each set is designed to provide tiles of I/O that perfectly overlay the programmable logic tiles. Then out of these two portions on one mask set, multiple variations of end systems could be produced, including one with all nine tiles as simple I/Os, another with SerDes overlaying tile (0,0) while simple I/Os are overlaying the other eight tiles, another with SerDes overlaying tiles (0,0), (0,1) and (0,2) while simple I/Os are overlaying the other 6 tiles, and so forth. In fact, if properly designed, multiples of layers could be fabricated one on top of the other offering a large variety of end products from a limited set of masks. Persons of ordinary skill in the art will appreciate that this technique has applicability beyond programmable logic and may profitably be employed in the construction of many 3D ICs and 3D systems. Thus the scope of the invention is only to be limited by the appended claims.

In yet an additional alternative of the current invention, the 3D antifuse Configurable System, may also comprise a Programming Die. In some cases of FPGA products, and primarily in antifuse-based products, there is an external apparatus that may be used for the programming the device. In many cases it is a user convenience to integrate this programming function into the FPGA device. This may result in a significant die overhead as the programming process needs higher voltages as well as control logic. The programmer function could be designed into a dedicated Programming Die. Such a Programmer Die could comprise the charge pump, to generate the higher programming voltage, and a controller with the associated programming to program the antifuse configurable dies within the 3D Configurable circuits, and the programming check circuits. The Programming Die might be fabricated using a lower cost older semiconductor process. An additional advantage of this 3D architecture of the Configurable System may be a high volume cost reduction option wherein the antifuse layer may be replaced with a custom layer and, therefore, the Programming Die could be removed from the 3D system for a more cost effective high volume production.

It will be appreciated by persons of ordinary skill in the art, that the present invention is using the term antifuse as it is the common name in the industry, but it also refers in this invention to any micro element that functions like a switch, meaning a micro element that initially has highly resistive-OFF state, and electronically it could be made to switch to a very low resistance-ON state. It could also correspond to a device to switch ON-OFF multiple times—a re-programmable switch. As an example there are new innovations, such as the electro-statically actuated Metal-Droplet micro-switch introduced by C. J. Kim of UCLA micro & nano manufacturing lab, that may be compatible for integration onto CMOS chips.

It will be appreciated by persons skilled in the art that the present invention is not limited to antifuse configurable logic and it will be applicable to other non-volatile configurable logic. A good example for such is the Flash based configurable logic. Flash programming may also need higher voltages, and having the programming transistors and the programming circuits in the base diffusion layer may reduce the overall density of the base diffusion layer. Using various embodiments of the current invention may be useful and could allow a higher device density. It is therefore suggested to build the programming transistors and the programming circuits, not as part of the diffusion layer, but according to one or more embodiments of the present invention. In high volume production one or more custom masks could be used to replace the function of the Flash programming and accordingly save the need to add on the programming transistors and the programming circuits.

Unlike metal-to-metal antifuses that could be placed as part of the metal interconnection, Flash circuits need to be fabricated in the base diffusion layers. As such it might be less efficient to have the programming transistor in a layer far above. An alternative embodiment of the current invention is to use Through-Silicon-Via 816 to connect the configurable logic device and its Flash devices to an underlying structure 814 comprising the programming transistors.

In this document, various terms have been used while generally referring to the element. For example, "house" refers to the first mono-crystalline layer with its transistors and metal interconnection layer or layers. This first mono-crystalline layer has also been referred to as the main wafer and sometimes as the acceptor wafer and sometimes as the base wafer.

Some embodiments of the current invention may include alternative techniques to build IC (Integrated Circuit) devices including techniques and methods to construct 3D IC systems. Some embodiments of the present invention may enable device solutions with far less power consumption than prior art. These device solutions could be very useful for the growing application of mobile electronic devices such as mobile phones, smart phone, cameras and the like. For example, incorporating the 3D IC semiconductor devices according to some embodiments of the present invention within these mobile electronic devices could provide superior mobile units that could operate much more efficiently and for a much longer time than with prior art technology.

3D ICs according to some embodiments of the current invention could also enable electronic and semiconductor devices with much a higher performance due to the shorter interconnect as well as semiconductor devices with far more complexity via multiple levels of logic and providing the ability to repair or use redundancy. The achievable complexity of the semiconductor devices according to some embodiments of the present invention could far exceed what was practical with the prior art technology. These advantages could lead to more powerful computer systems and improved systems that have embedded computers.

Some embodiments of the current invention may also enable the design of state of the art electronic systems at a greatly reduced non-recurring engineering (NRE) cost by the use of high density 3D FPGAs or various forms of 3D array base ICs with reduced custom masks as been described previously. These systems could be deployed in many products and in many market segments. Reduction of the NRE may enable new product family or application development and deployment early in the product lifecycle by lowering the risk of upfront investment prior to a market being developed. The above advantages may also be provided by various mixes such as reduced NRE using generic masks for layers of logic and other generic mask for layers of memories and building a very complex system using the repair technology to overcome the inherent yield limitation. Another form of mix could be building a 3D FPGA and add on it 3D layers of customizable logic and memory so the end system could have field programmable logic on top of the factory customized logic. In fact there are many ways to mix the many innovative elements to form 3D IC to support the need of an end system, including using multiple devices wherein more than one device incorporates elements of the invention. An end system could benefits from memory device utilizing the invention 3D memory together with high performance 3D FPGA together with high density 3D logic and so forth. Using devices that use one or multiple elements of the invention would allow for better performance and or lower power and other advantages resulting from the inventions to provide the end system with a competitive edge. Such end system could be electronic based products or other type of systems that include some level of embedded electronics, such as, for example, cars, remote controlled vehicles, etc.

To improve the contact resistance of very small scaled contacts, the semiconductor industry employs various metal silicides, such as, for example, cobalt silicide, titanium silicide, tantalum silicide, and nickel silicide. The current advanced CMOS processes, such as, for example, 45 nm, 32 nm, and 22 nm employ nickel silicides to improve deep submicron source and drain contact resistances. Background information on silicides utilized for contact resistance reduction can be found in "NiSi Salicide Technology for Scaled CMOS," H. Iwai, et. al., Microelectronic Engineering, 60 (2002), pp 157-169; "Nickel vs. Cobalt Silicide integration for sub-50 nm CMOS", B. Froment, et. al., IMEC ESS Circuits, 2003; and "65 and 45-nm Devices—an Overview", D. James, Semicon West, July 2008, ctr 024377. To achieve the lowest nickel silicide contact and source/drain resistances, the nickel on silicon must be heated to at least 450° C.

Thus it may be desirable to enable low resistances for process flows in this document where the post layer transfer temperature exposures must remain under approximately 400° C. due to metallization, such as, for example, copper and aluminum, and low-k dielectrics present. The example process flow forms a Recessed Channel Array Transistor (RCAT), but this or similar flows may be applied to other process flows and devices, such as, for example, S-RCAT, JLT, V-groove, JFET, bipolar, and replacement gate flows.

Figure 133A:
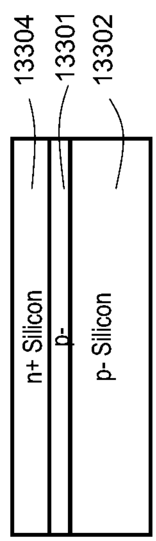

A planar n-channel Recessed Channel Array Transistor (RCAT) with metal silicide source & drain contacts suitable for a 3D IC may be constructed. As illustrated in FIG. 133A, a P− substrate donor wafer 13302 may be processed to include wafer sized layers of N+ doping 13304, and P− doping 13301 across the wafer. The N+ doped layer 13304 may be formed by ion implantation and thermal anneal. In addition, P− doped layer 13301 may have additional ion implantation and anneal processing to provide a different dopant level than P− substrate 13302. P− doped layer 13301 may also have graded P− doping to mitigate transistor performance issues, such as, for example, short channel effects, after the RCAT is formed. The layer stack may alternatively be formed by successive epitaxially deposited doped silicon layers of P− doping 13301 and N+ doping 13304, or by a combination of epitaxy and implantation Annealing of implants and doping may utilize optical annealing techniques or types of Rapid Thermal Anneal (RTA or spike).

Figure 133B:
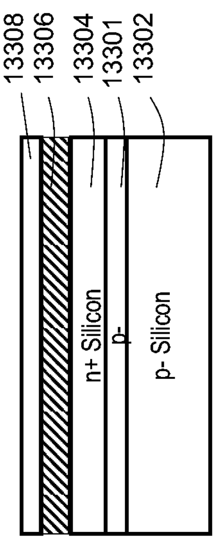

As illustrated in FIG. 133B, a silicon reactive metal, such as, for example, Nickel or Cobalt, may be deposited onto N+ doped layer 13304 and annealed, utilizing anneal techniques such as, for example, RTA, thermal, or optical, thus forming metal silicide layer 13306. The top surface of donor wafer 13301 may be prepared for oxide wafer bonding with a deposition of an oxide to form oxide layer 13308.

Figure 133C:
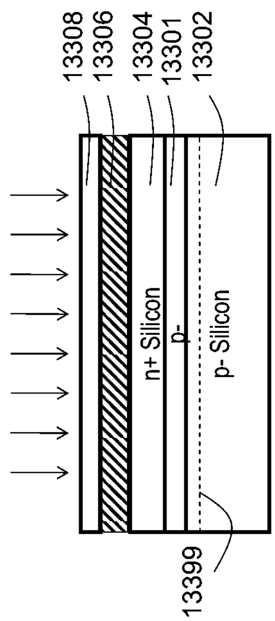

As illustrated in FIG. 133C, a layer transfer demarcation plane (shown as dashed line) 13399 may be formed by hydrogen implantation or other methods as previously described.

Figure 133D:
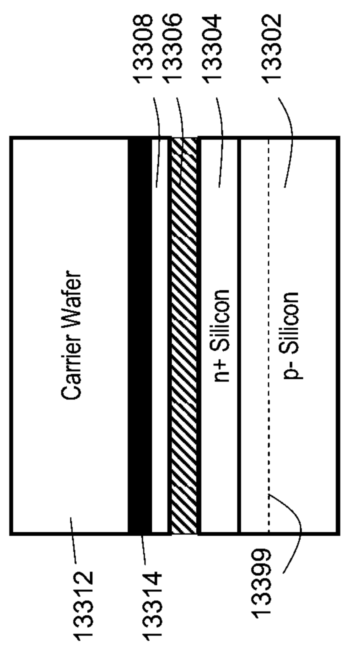

As illustrated in FIG. 133D donor wafer 13302 with layer transfer demarcation plane 13399, P− doped layer 13301, N+ doped layer 13304, metal silicide layer 13306, and oxide layer 13308 may be temporarily bonded to carrier or holder substrate 13312 with a low temperature process that may facilitate a low temperature release. The carrier or holder substrate 13312 may be a glass substrate to enable state of the art optical alignment with the acceptor wafer. A temporary bond between the carrier or holder substrate 13312 and the donor wafer 13302 may be made with a polymeric material, such as, for example, polyimide DuPont HD3007, which can be released at a later step by laser ablation, Ultra-Violet radiation exposure, or thermal decomposition, shown as adhesive layer 13314. Alternatively, a temporary bond may be made with uni-polar or bi-polar electrostatic technology such as, for example, the Apache tool from Beam Services Inc.

Figure 133E:
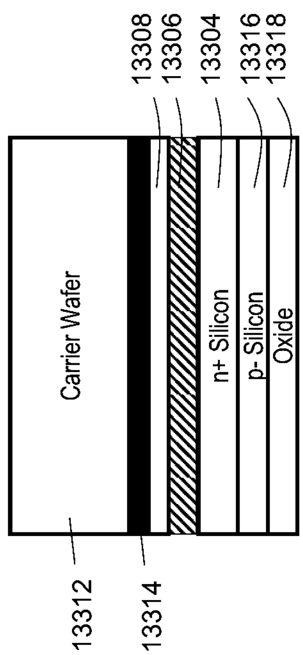

As illustrated in FIG. 133E, the portion of the donor wafer 13302 that is below the layer transfer demarcation plane 13399 may be removed by cleaving or other processes as previously described, such as, for example, ion-cut or other methods. The remaining donor wafer P− doped layer 13301 may be thinned by chemical mechanical polishing (CMP) so that the P− layer 13316 may be formed to the desired thickness. Oxide 13318 may be deposited on the exposed surface of P− layer 13316.

Figure 133F:
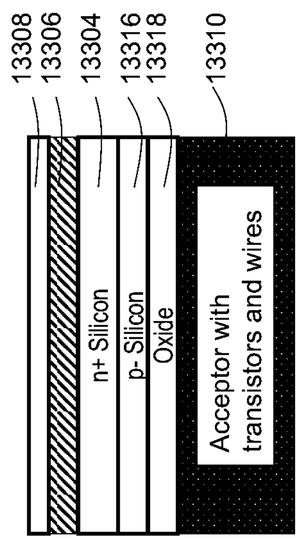

As illustrated in FIG. 133F, both the donor wafer 13302 and acceptor substrate or wafer 13310 may be prepared for wafer bonding as previously described and then low temperature (less than approximately 400° C.) aligned and oxide to oxide bonded. Acceptor substrate 13310, as described previously, may compromise, for example, transistors, circuitry, metal, such as, for example, aluminum or copper, interconnect wiring, and thru layer via metal interconnect strips or pads. The carrier or holder substrate 13312 may then be released using a low temperature process such as, for example, laser ablation. Oxide layer 13318, P− layer 13316, N+ doped layer 13304, metal silicide layer 13306, and oxide layer 13308 have been layer transferred to acceptor wafer 13310. The top surface of oxide 13308 may be chemically or mechanically polished. Now RCAT transistors are formed with low temperature (less than approximately 400° C.) processing and aligned to the acceptor wafer 13310 alignment marks (not shown).

Figure 133G:
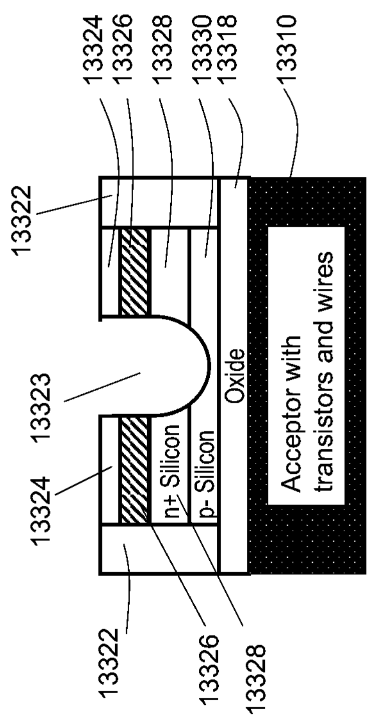

As illustrated in FIG. 133G, the transistor isolation regions 13322 may be formed by mask defining and then plasma/RIE etching oxide layer 13308, metal silicide layer 13306, N+ doped layer 13304, and P− layer 13316 to the top of oxide layer 13318. Then a low-temperature gap fill oxide may be deposited and chemically mechanically polished, with the oxide remaining in isolation regions 13322. Then the recessed channel 13323 may be mask defined and etched. The recessed channel surfaces and edges may be smoothed by wet chemical or plasma/RIE etching techniques to mitigate high field effects. These process steps form oxide regions 13324, metal silicide source and drain regions 13326, N+ source and drain regions 13328 and P− channel region 13330.

Figure 133H:
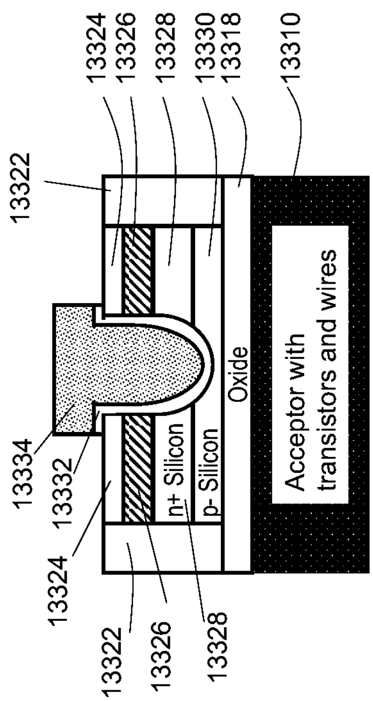

As illustrated in FIG. 133H, a gate dielectric 13332 may be formed and a gate metal material may be deposited. The gate dielectric 13332 may be an atomic layer deposited (ALD) gate dielectric that is paired with a work function specific gate metal in the industry standard high k metal gate process schemes described previously. Or the gate dielectric 13332 may be formed with a low temperature oxide deposition or low temperature microwave plasma oxidation of the silicon surfaces and then a gate material such as, for example, tungsten or aluminum may be deposited. Then the gate material may be chemically mechanically polished, and the gate area defined by masking and etching, thus forming gate electrode 13334.

Figure 133I:
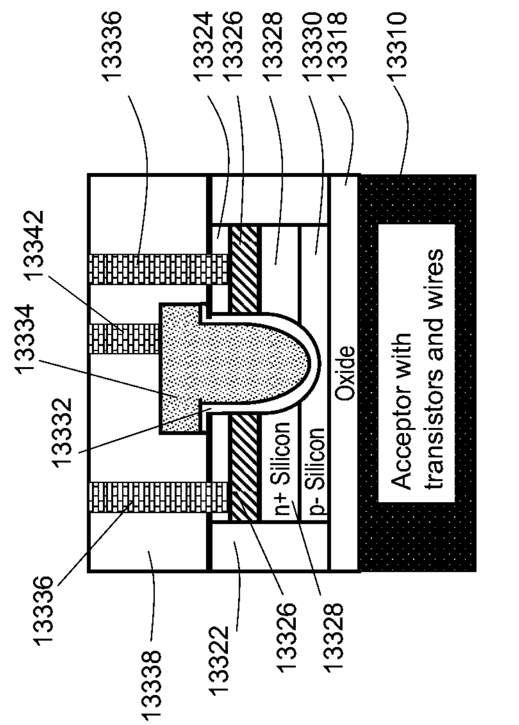

As illustrated in FIG. 133I, a low temperature thick oxide 13338 is deposited and source, gate, and drain contacts, and thru layer via (not shown) openings are masked and etched preparing the transistors to be connected via metallization. Thus gate contact 13342 connects to gate electrode 13334, and source & drain contacts 13336 connect to metal silicide source and drain regions 13326.

Persons of ordinary skill in the art will appreciate that the illustrations in FIGS. 133A through 133I are exemplary only and are not drawn to scale. Such skilled persons will further appreciate that many variations are possible such as, for example, the temporary carrier substrate may be replaced by a carrier wafer and a permanently bonded carrier wafer flow such as described in FIG. 40 may be employed. Many other modifications within the scope of the invention will suggest themselves to such skilled persons after reading this specification. Thus the invention is to be limited only by the appended claims.

With the high density of layer to layer interconnection and the formation of memory devices & transistors that are enabled by embodiments in this document, novel FPGA (Field Programmable Gate Array) programming architectures and devices may be employed to create cost, area, and performance efficient 3D FPGAs. The pass transistor, or switch, and the memory device that controls the ON or OFF state of the pass transistor may reside in separate layers and may be connected by thru layer vias (TLVs) to each other and the routing network metal lines, or the pass transistor and memory devices may reside in the same layer and TLVs may be utilized to connect to the network metal lines.

Figure 134A:
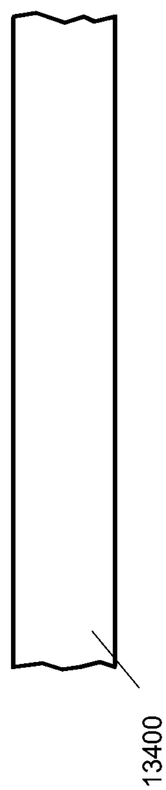

As illustrated in FIG. 134A, acceptor wafer 13400 may be processed to compromise logic circuits, analog circuits, and other devices, with metal interconnection and a metal configuration network to form the base FPGA. Acceptor wafer 13400 may also include configuration elements such as, for example, switches, pass transistors, memory elements, programming transistors, and may contain a foundation layer or layers as described previously.

Figure 134B:
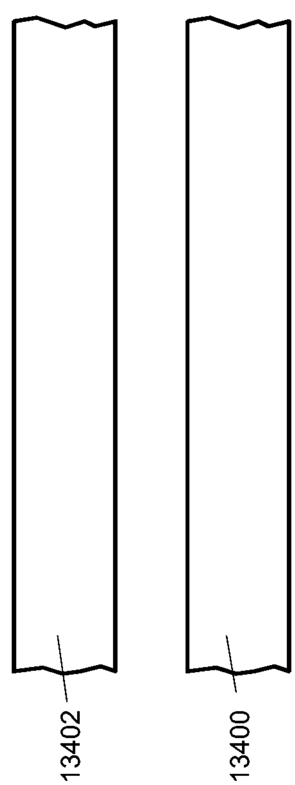

As illustrated in FIG. 134B, donor wafer 13402 may be preprocessed with a layer or layers of pass transistors or switches or partially formed pass transistors or switches. The pass transistors may be constructed utilizing the partial transistor process flows described previously, such as, for example, RCAT or JLT or others, or may utilize the replacement gate techniques, such as, for example, CMOS or CMOS N over P or gate array, with or without a carrier wafer, as described previously. Donor wafer 13402 and acceptor substrate 13400 and associated surfaces may be prepared for wafer bonding as previously described.

Figure 134C:
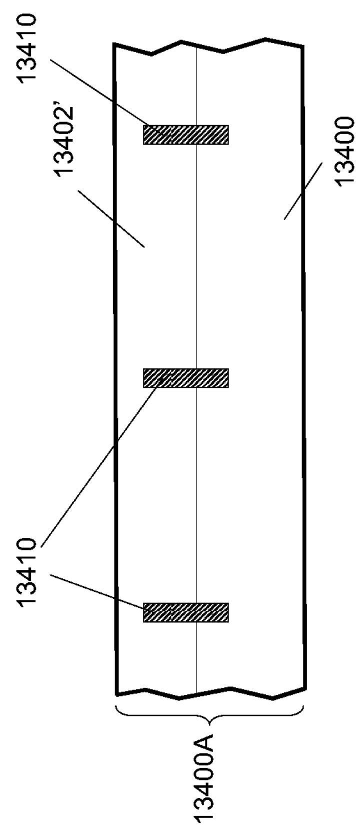

As illustrated in FIG. 134C, donor wafer 13402 and acceptor substrate 13400 may be bonded at a low temperature (less than approximately 400° C.) and a portion of donor wafer 13402 may be removed by cleaving and polishing, or other processes as previously described, such as, for example, ion-cut or other methods, thus forming the remaining pass transistor layer 13402'. Now transistors or portions of transistors may be formed or completed and may be aligned to the acceptor substrate 13400 alignment marks (not shown) as described previously. Thru layer vias (TLVs) 13410 may be formed as described previously and as well as interconnect and dielectric layers. Thus acceptor substrate with pass transistors 13400A is formed, which may include acceptor substrate 13400, pass transistor layer 13402', and TLVs 13410.

Figure 134D:
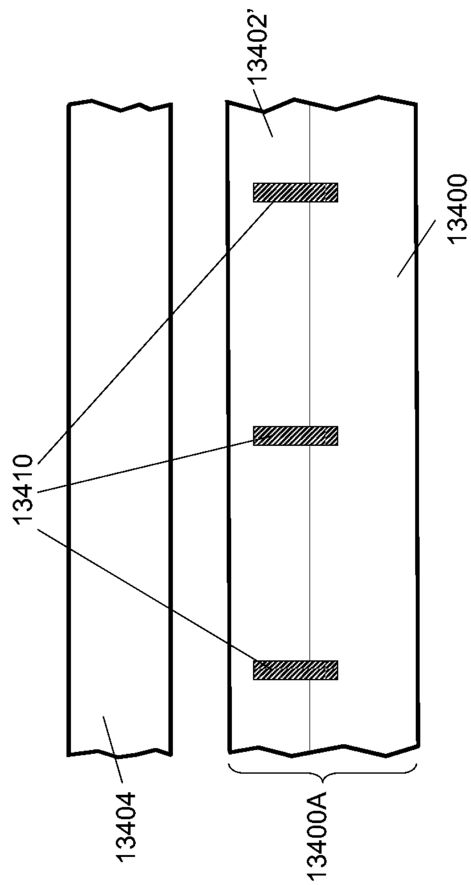

As illustrated in FIG. 134D, memory element donor wafer 13404 may be preprocessed with a layer or layers of memory elements or partially formed memory elements. The memory elements may be constructed utilizing the partial memory process flows described previously, such as, for example, RCAT DRAM, JLT, or others, or may utilize the replacement gate techniques, such as, for example, CMOS gate array to form SRAM elements, with or without a carrier wafer, as described previously, or may be constructed with non-volatile memory, such as, for example, R-RAM or FG Flash as described previously. Memory element donor wafer 13404 and acceptor substrate 13400A and associated surfaces may be prepared for wafer bonding as previously described.

Figure 134E:
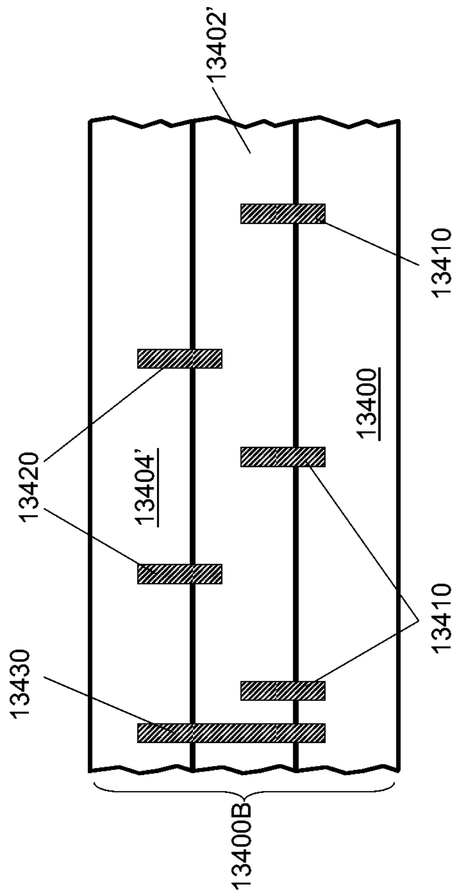

As illustrated in FIG. 134E, memory element donor wafer 13404 and acceptor substrate 13400A may be bonded at a low temperature (less than approximately 400° C.) and a portion of memory element donor wafer 13404 may be removed by cleaving and polishing, or other processes as previously described, such as, for example, ion-cut or other methods, thus forming the remaining memory element layer 13404'. Now memory elements & transistors or portions of memory elements & transistors may be formed or completed and may be aligned to the acceptor substrate 13400A alignment marks (not shown) as described previously. Memory to switch thru layer vias 13420 and memory to acceptor thru layer vias 13430 as well as interconnect and dielectric layers may be formed as described previously. Thus acceptor substrate with pass transistors and memory elements 13400B is formed, which may include acceptor substrate 13400, pass transistor layer 13402', TLVs 13410, memory to switch thru layer vias 13420, memory to acceptor thru layer vias 13430, and memory element layer 13404'.

Figure 134F:
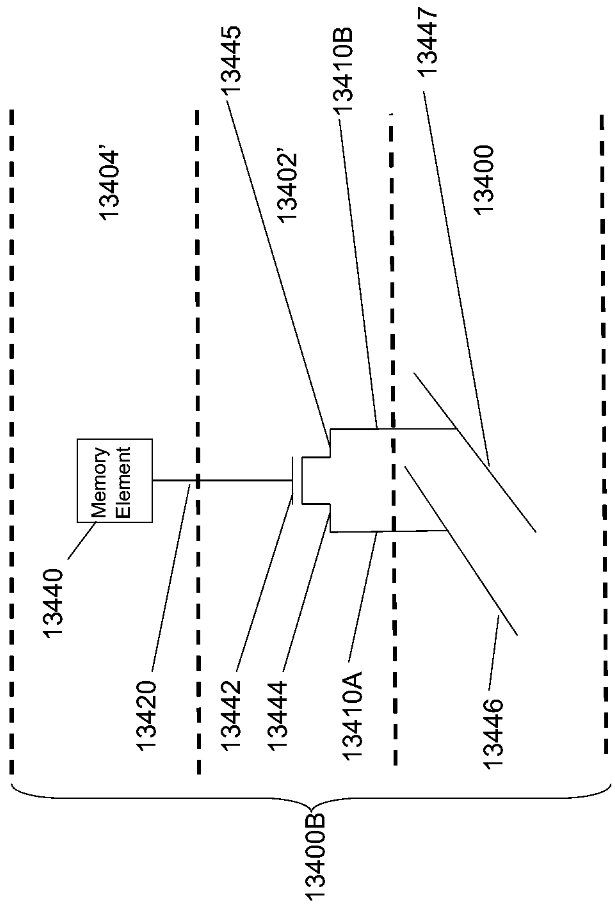

As illustrated in FIG. 134F, a simple schematic of important elements of acceptor substrate with pass transistors and memory elements 13400B is shown. An exemplary memory element 13440 residing in memory element layer 13404' may be electrically coupled to exemplary pass transistor gate 13442, residing in pass transistor layer 13402', with memory to switch thru layer vias 13420. The pass transistor source 13444, residing in pass transistor layer 13402', may be electrically coupled to FPGA configuration network metal line 13446, residing in acceptor substrate 13400, with TLV 13410A. The pass transistor drain 13445, residing in pass transistor layer 13402', may be electrically coupled to FPGA configuration network metal line 13447, residing in acceptor substrate 13400, with TLV 13410B. The memory element 13440 may be programmed with signals from off chip, or above, within, or below the memory element layer 13404'. The memory element 13440 may also include an inverter configuration, wherein one memory cell, such as, for example, a FG Flash cell, may couple the gate of the pass transistor to power supply Vcc if turned on, and another FG Flash device may couple the gate of the pass transistor to ground if turned on. Thus, FPGA configuration network metal line 13446, which may be carrying the output signal from a logic element in acceptor substrate 13400, may be electrically coupled to FPGA configuration network metal line 13447, which may route to the input of a logic element elsewhere in acceptor substrate 13430.

Persons of ordinary skill in the art will appreciate that the illustrations in FIGS. 134A through 134F are exemplary only and are not drawn to scale. Such skilled persons will further appreciate that many variations are possible such as, for example, the memory element layer 13404' may be constructed below pass transistor layer 13402'. Additionally, the pass transistor layer 13402' may include control and logic circuitry in addition to the pass transistors or switches. Moreover, the memory element layer 13404' may comprise control and logic circuitry in addition to the memory elements. Further, that the pass transistor element may instead be a transmission gate, or may be an active drive type switch. Many other modifications within the scope of the invention will suggest themselves to such skilled persons after reading this specification. Thus the invention is to be limited only by the appended claims.

Figure 135A:
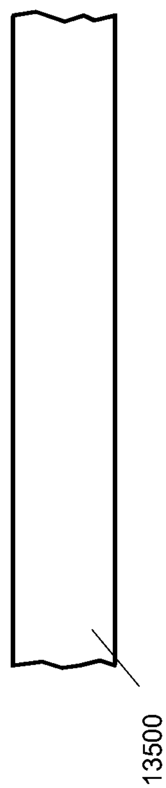

The pass transistor, or switch, and the memory device that controls the ON or OFF state of the pass transistor may reside in the same layer and TLVs may be utilized to connect to the network metal lines. As illustrated in FIG. 135A, acceptor wafer 13500 may be processed to compromise logic circuits, analog circuits, and other devices, with metal interconnection and a metal configuration network to form the base FPGA. Acceptor wafer 13500 may also include configuration elements such as, for example, switches, pass transistors, memory elements, programming transistors, and may contain a foundation layer or layers as described previously.

Figure 135B:
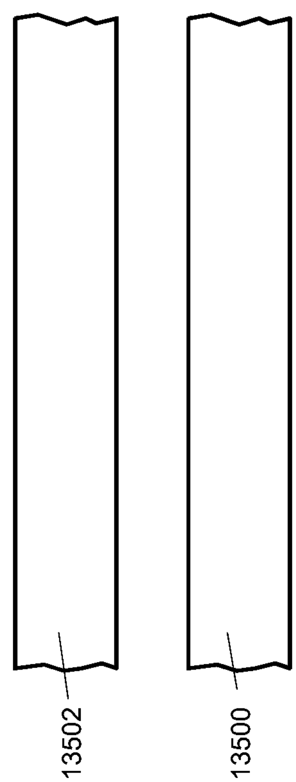

As illustrated in FIG. 135B, donor wafer 13502 may be preprocessed with a layer or layers of pass transistors or switches or partially formed pass transistors or switches. The pass transistors may be constructed utilizing the partial transistor process flows described previously, such as, for example, RCAT or JLT or others, or may utilize the replacement gate techniques, such as, for example, CMOS or CMOS N over P or CMOS gate array, with or without a carrier wafer, as described previously. Donor wafer 13502 may be preprocessed with a layer or layers of memory elements or partially formed memory elements. The memory elements may be constructed utilizing the partial memory process flows described previously, such as, for example, RCAT DRAM or others, or may utilize the replacement gate techniques, such as, for example, CMOS gate array to form SRAM elements, with or without a carrier wafer, as described previously. The memory elements may be formed simultaneously with the pass transistor, for example, such as, for example, by utilizing a CMOS gate array replacement gate process where a CMOS pass transistor and SRAM memory element, such as a 6-transistor cell, may be formed, or an RCAT pass transistor formed with an RCAT DRAM memory. Donor wafer 13502 and acceptor substrate 13500 and associated surfaces may be prepared for wafer bonding as previously described.

Figure 135C:
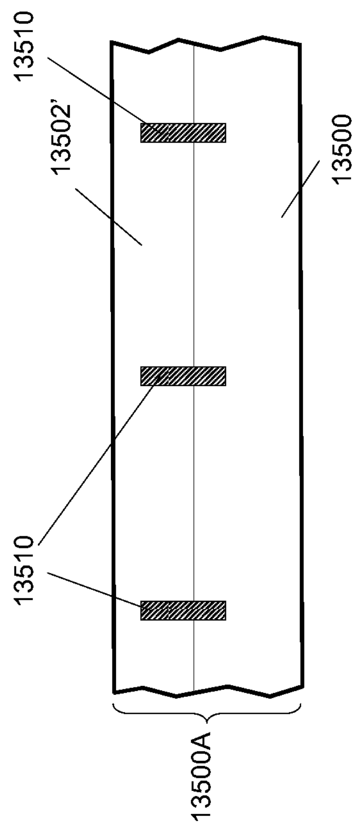

As illustrated in FIG. 135C, donor wafer 13502 and acceptor substrate 13500 may be bonded at a low temperature (less than approximately 400° C.) and a portion of donor wafer 13502 may be removed by cleaving and polishing, or other processes as previously described, such as, for example, ion-cut or other methods, thus forming the remaining pass transistor & memory layer 13502'. Now transistors or portions of transistors and memory elements may be formed or completed and may be aligned to the acceptor substrate 13500 alignment marks (not shown) as described previously. Thru layer vias (TLVs) 13510 may be formed as described previously. Thus acceptor substrate with pass transistors & memory elements 13500A is formed, which may include acceptor substrate 13500, pass transistor & memory element layer 13502', and TLVs 13510.

Figure 135D:
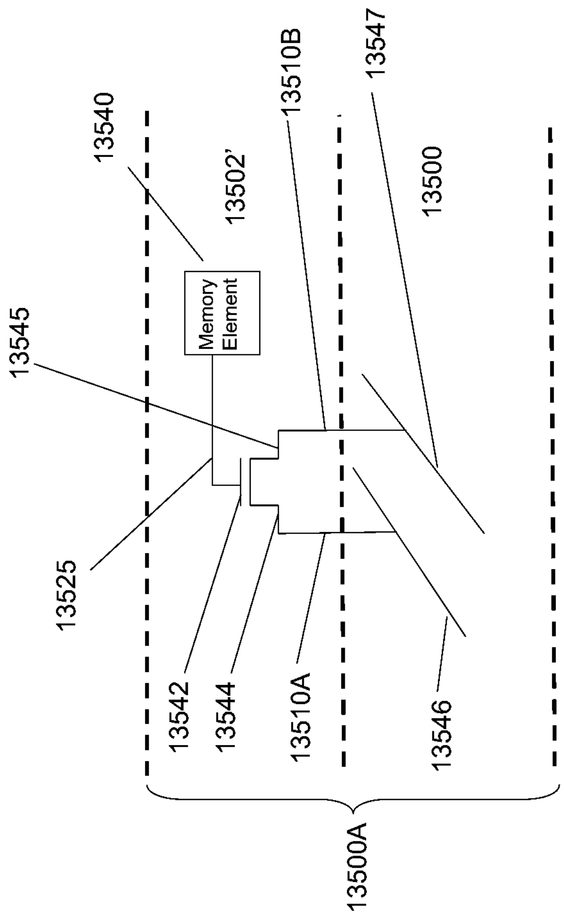

As illustrated in FIG. 135D, a simple schematic of important elements of acceptor substrate with pass transistors & memory elements 13500A is shown. An exemplary memory element 13540 residing in pass transistor & memory layer 13502' may be electrically coupled to exemplary pass transistor gate 13542, also residing in pass transistor & memory layer 13502', with pass transistor & memory layer interconnect metallization 13525. The pass transistor source 13544, residing in pass transistor & memory layer 13502', may be electrically coupled to FPGA configuration network metal line 13546, residing in acceptor substrate 13500, with TLV 13510A. The pass transistor drain 13545, residing in pass transistor & memory layer 13502', may be electrically coupled to FPGA configuration network metal line 13547, residing in acceptor substrate 13500, with TLV 13510B. The memory element 13540 may be programmed with signals from off chip, or above, within, or below the pass transistor & memory layer 13502'. The memory element 13540 may also include an inverter configuration, wherein one memory cell, such as, for example, a FG Flash cell, may couple the gate of the pass transistor to power supply Vcc if turned on, and another FG Flash device may couple the gate of the pass transistor to ground if turned on. Thus, FPGA configuration network metal line 13546, which may be carrying the output signal from a logic element in acceptor substrate 13500, may be electrically coupled to FPGA configuration network metal line 13547, which may route to the input of a logic element elsewhere in acceptor substrate 13530.

Persons of ordinary skill in the art will appreciate that the illustrations in FIGS. 135A through 135D are exemplary only and are not drawn to scale. Such skilled persons will further appreciate that many variations are possible such as, for example, the pass transistor & memory layer 13502' may include control and logic circuitry in addition to the pass transistors or switches and memory elements. Additionally, that the pass transistor element may instead be a transmission gate, or may be an active drive type switch. Many other modifications within the scope of the invention will suggest themselves to such skilled persons after reading this specification. Thus the invention is to be limited only by the appended claims.

As illustrated in FIG. 136, a non-volatile configuration switch with integrated floating gate (FG) Flash memory is shown. The control gate 13602 and floating gate 13604 are common to both the sense transistor channel 13620 and the switch transistor channel 13610. Switch transistor source 13612 and switch transistor drain 13614 may be coupled to the FPGA configuration network metal lines. The sense transistor source 13622 and the sense transistor drain 13624 may be coupled to the program, erase, and read circuits. This integrated NVM switch has been utilized by FPGA maker Actel Corporation and is manufactured in a high temperature (greater than approximately 400° C.) 2D embedded FG flash process technology.

As illustrated in FIGS. 137A to 137G, a 1T NVM FPGA cell may be constructed with a single layer transfer of wafer sized doped layers and post layer transfer processing with a process flow that is suitable for 3D IC manufacturing. This cell may be programmed with signals from off chip, or above, within, or below the cell layer.

Figures 137A, 137B:
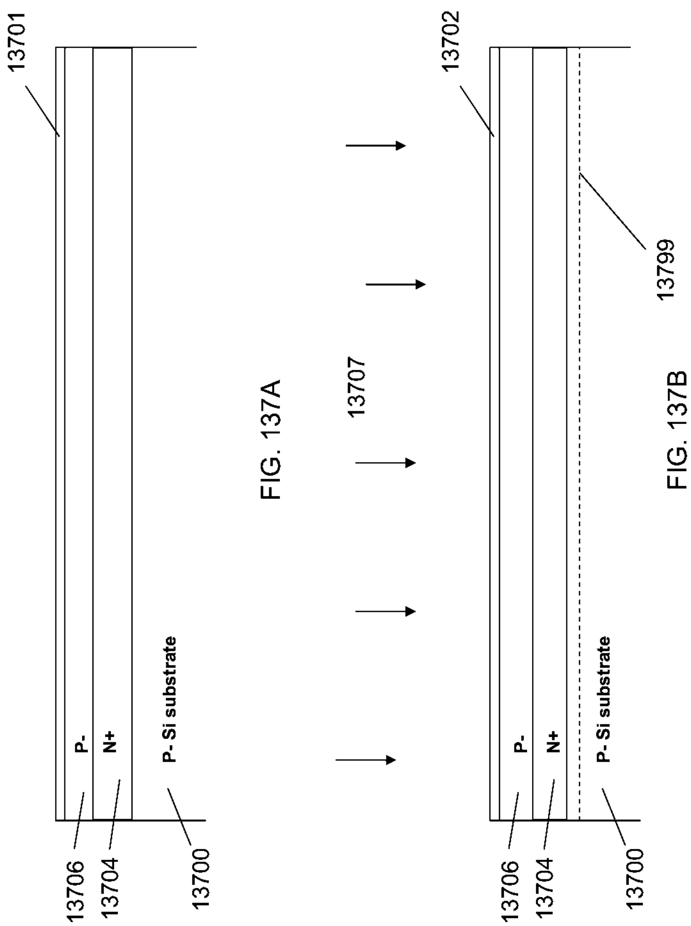

As illustrated in FIG. 137A, a P− substrate donor wafer 13700 may be processed to include two wafer sized layers of N+ doping 13704 and P− doping 13706. The P− doped layer 13706 may have the same or a different dopant concentration than the P− substrate 13700. The doped layers may be formed by ion implantation and thermal anneal. The layer stack may alternatively be formed by successive epitaxially deposited doped silicon layers or by a combination of epitaxy and implantation and anneals. P− doped layer 13706 and N+ doped layer 13704 may also have graded doping to mitigate transistor performance issues, such as, for example, short channel effects, and enhance programming and erase efficiency. A screen oxide 13701 may be grown or deposited before an implant to protect the silicon from implant contamination and to provide an oxide surface for later wafer to wafer bonding. These processes may be done at temperatures above 400° C. as the layer transfer to the processed substrate with metal interconnects has yet to be done.

As illustrated in FIG. 137B, the top surface of donor wafer 13700 may be prepared for oxide wafer bonding with a deposition of an oxide 13702 or by thermal oxidation of the P− doped layer 13706 to form oxide layer 13702, or a re-oxidation of implant screen oxide 13701. A layer transfer demarcation plane 13799 (shown as a dashed line) may be formed in donor wafer 13700 (shown) or N+ doped layer 13704 by hydrogen implantation 13707 or other methods as previously described. Both the donor wafer 13700 and acceptor wafer 13710 may be prepared for wafer bonding as previously described and then low temperature (less than approximately 400° C.) bonded. The portion of the P− donor wafer substrate 13700 that is above the layer transfer demarcation plane 13799 may be removed by cleaving and polishing, or other low temperature processes as previously described. This process of an ion implanted atomic species, such as, from example, Hydrogen, forming a layer transfer demarcation plane, and subsequent cleaving or thinning, may be called 'ion-cut'. Acceptor wafer 13710 may have similar meanings as wafer 808 previously described with reference to FIG. 8.

Figure 137C:
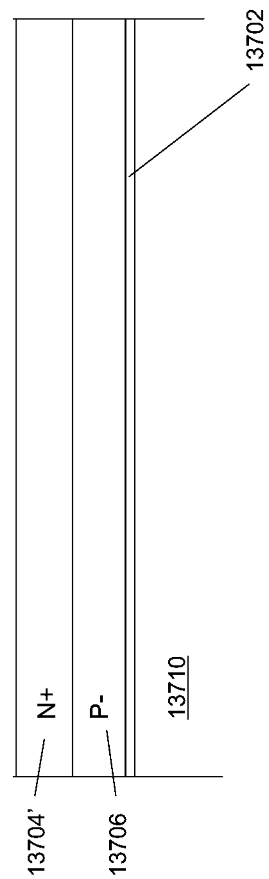

As illustrated in FIG. 137C, the remaining N+ doped layer 13704' and P− doped layer 13706, and oxide layer 13702 have been layer transferred to acceptor wafer 13710. The top surface of N+ doped layer 13704' may be chemically or mechanically polished smooth and flat. Now FG and other transistors may be formed with low temperature (less than approximately 400° C.) processing and aligned to the acceptor wafer 13710 alignment marks (not shown). For illustration clarity, the oxide layers, such as, for example, 13702, used to facilitate the wafer to wafer bond are not shown in subsequent drawings.

Figure 137D:
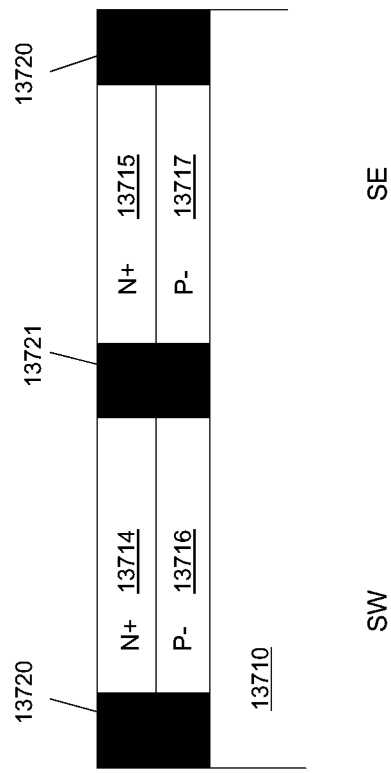

As illustrated in FIG. 137D, the transistor isolation regions may be lithographically defined and then formed by plasma/RIE etch removal of portions of N+ doped layer 13704' and P− doped layer 13706 to at least the top oxide of acceptor substrate 13710. Then a low-temperature gap fill oxide may be deposited and chemically mechanically polished, remaining in transistor isolation regions 13720 and SW-to-SE isolation region 13721. "SW' in the FIG. 137 illustrations denotes that portion of the illustration where the switch transistor will be formed, and 'SE' denotes that portion of the illustration where the sense transistor will be formed. Thus formed are future SW transistor regions N+ doped 13714 and P− doped 13716, and future SE transistor regions N+ doped 13715, and P− doped 13717.

Figure 137E:
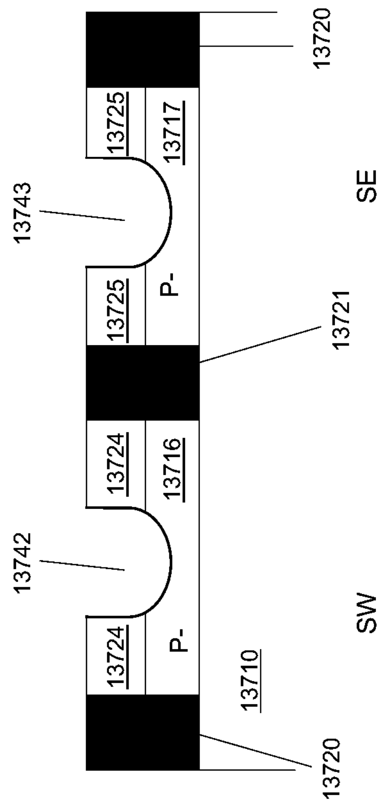

As illustrated in FIG. 137E, the SW recessed channel 13742 and SE recessed channel 13743 may be lithographically defined and etched, removing portions future SW transistor regions N+ doped 13714 and P− doped 13716, and future SE transistor regions N+ doped 13715, and P− doped 13717. The recessed channel surfaces and edges may be smoothed by wet chemical or plasma/RIE etching techniques to mitigate high field effects. The SW recessed channel 13742 and SE recessed channel 13743 may be mask defined and etched separately or at the same step. The SW channel width may be larger than the SE channel width. These process steps form SW source and drain regions 13724, SE source and drain regions 13725, SW transistor channel region 13716 and SE transistor channel region 13717.

Figure 137F:
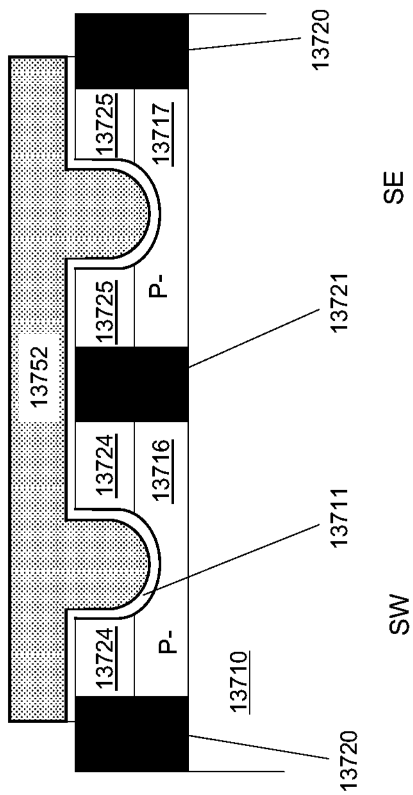

As illustrated in FIG. 137F, a tunneling dielectric 13711 may be formed and a floating gate material may be deposited. The tunneling dielectric 13711 may be an atomic layer deposited (ALD) dielectric. Or the tunneling dielectric 13711 may be formed with a low temperature oxide deposition or low temperature microwave plasma oxidation of the silicon surfaces. Then a floating gate material, such as, for example, doped poly-crystalline or amorphous silicon, may be deposited. Then the floating gate material may be chemically mechanically polished, and the floating gate 13752 may be partially or fully formed by lithographic definition and plasma/RIE etching.

Figure 137G:
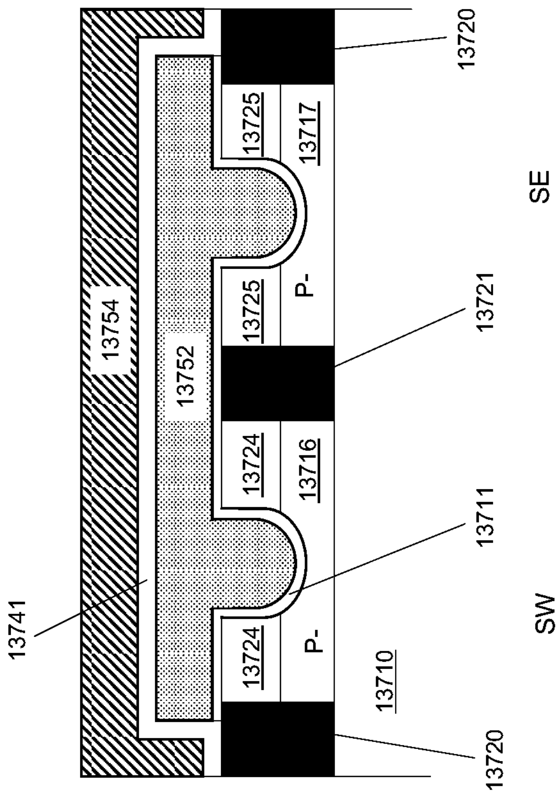

As illustrated in FIG. 137G, an inter-poly dielectric 13741 may be formed by either low temperature oxidation and depositions of a dielectric or layers of dielectrics, such as, for example, oxide-nitride-oxide (ONO) layers, and then a control gate material, such as, for example, doped poly-crystalline or amorphous silicon, may be deposited. The control gate material may be chemically mechanically polished, and the control gate 13754 may be formed by lithographic definition and plasma/RIE etching. The etching of control gate 13754 may also include etching portions of the inter-poly dielectric and portions of the floating gate 13752 in a self-aligned stack etch process. Logic transistors for control functions may be formed (not shown) utilizing 3D IC compatible methods described in the document, such as, for example, RCAT, V-groove, and contacts, including thru layer vias, and interconnect metallization may be constructed. This flow enables the formation of a mono-crystalline silicon 1T NVM FPGA configuration cell constructed in a single layer transfer of prefabricated wafer sized doped layers, which may be formed and connected to the underlying multi-metal layer semiconductor device without exposing the underlying devices to a high temperature.

Persons of ordinary skill in the art will appreciate that the illustrations in FIGS. 137A through 137G are exemplary only and are not drawn to scale. Such skilled persons will further appreciate that many variations are possible such as, for example, the floating gate may include nano-crystals of silicon or other materials. Additionally, that a common well cell may be constructed by removing the SW-to-SE isolation 13721. Moreover, that the slope of the recess of the channel transistor may be from zero to 180 degrees. Further, that logic transistors and devices may be constructed by using the control gate as the device gate. Additionally, that the logic device gate may be made separately from the control gate formation. Moreover, the 1T NVM FPGA configuration cell may be constructed with a charge trap technique NVM, a resistive memory technique, and may also have a junction-less SW or SE transistor construction. Many other modifications within the scope of the invention will suggest themselves to such skilled persons after reading this specification. Thus the invention is to be limited only by the appended claims.

It will also be appreciated by persons of ordinary skill in the art that the present invention is not limited to what has been particularly shown and described hereinabove. Rather, the scope of the present invention includes both combinations and sub-combinations of the various features described hereinabove as well as modifications and variations which would occur to such skilled persons upon reading the foregoing description. Thus the invention is to be limited only by the appended claims.

The invention claimed is:

1. A 3D IC based system, comprising:

a first layer comprising first transistors;

an interconnection layer overlying said first transistors, said interconnection layer providing interconnection for said first transistors;

a bonding layer overlying said interconnection layer;

a second layer overlying said bonding layer; and a carrier substrate for the transferring of said second layer, wherein said second layer comprises at least one through second layer via, wherein said at least one through second layer via has a diameter of less than 100 nm, wherein said second layer comprises a plurality of second transistors, and wherein said second layer is transferred from a donor wafer.

2. A system according to claim 1, wherein said second transistors form at least one second circuit, and wherein said first transistors form a first circuit substantially the same as the second circuit, and the semiconductor device further comprises:

a switch operable to cause one of said first and second circuits to be replaced by the other of said first and second circuits.

3. A system according to claim 1, further comprising:

a heat spreader between said first layer and said second layer.

4. A system according to claim 1, wherein said at least one through second layer via is adapted to conduct heat.

5. A system according to claim 1, wherein at least one of said second transistors comprise a back-bias.

6. A system according to claim 1, wherein said interconnection layer comprises copper or aluminum.

7. A system according to claim 1 wherein at least one of said second transistors is one of:

(i) a recessed-channel transistor (RCAT);

(ii) a junction-less transistor;

(iii) a replacement-gate transistor;

(iv) a Finfet transistor; or (v) a double gate transistor.

8. A 3D IC based system, comprising:

a first layer comprising first transistors;

an interconnection layer overlying said first transistors, said interconnection layer providing interconnection for said first transistors;

a bonding layer overlying said interconnection layer;

a second layer overlying said bonding layer; and a reusable carrier substrate for the transferring of said second layer, wherein said second layer comprises at least one through second layer via, wherein said at least one through second layer via has a diameter of less than 100 nm, wherein said second layer comprises a plurality of second transistors, and wherein said second layer is transferred from a donor wafer.

9. A system according to claim 8, wherein said second transistors form at least one second circuit, and wherein said first transistors form a first circuit substantially the same as the second circuit, and the semiconductor device further comprises:

a switch operable to cause one of said first and second circuits to be replaced by the other of said first and second circuits.

10. A system according to claim 8, further comprising:

a heat spreader between said first layer and said second layer.

11. A system according to claim 8, wherein said at least one through layer via is adapted to conduct heat.

12. A system according to claim 8, wherein at least one of said second transistors comprise a back-bias.

13. A system according to claim 8, wherein said interconnection layer comprises copper or aluminum.

14. A system according to claim 8, wherein at least one of said second transistors is one of:

(i) a recessed-channel transistor (RCAT);

(ii) a junction-less transistor;

(iii) a replacement-gate transistor;

(iv) a Finfet transistor; or (v) a double gate transistor.

15. A semiconductor device, comprising:

a first layer comprising first transistors;

an interconnection layer overlying said first transistors, said interconnection layer providing interconnection for said first transistors;

a bonding layer overlying said interconnection layer; and a second layer overlying said bonding layer, wherein said second layer comprises a plurality of second transistors on one side of said second layer and a plurality of third transistors on a second side of said second layer.

16. A semiconductor device according to claim 15, wherein said second transistors form at least one second circuit, and wherein said third transistors form a first circuit substantially the same as the second circuit, and the semiconductor device further comprises:

a switch operable to cause one of said first and second circuits to be replaced by the other of said first and second circuits.

17. A semiconductor device according to claim 15, further comprising:

a heat spreader between said first layer and said second layer.

18. A semiconductor device according to claim 15, wherein said second layer comprises at least one through layer via adapted to conduct heat, and wherein said at least one through layer via has a diameter of less than 100 nm.

19. A semiconductor device according to claim 15, wherein at least one of said second transistors comprise a back-bias.

20. A semiconductor device according to claim 15, wherein said interconnection layer comprises copper or aluminum.

21. A semiconductor device according to claim 15, wherein at least one of said second transistors is one of:

(i) a recessed-channel transistor (RCAT);

(ii) a junction-less transistor;

(iii) a replacement-gate transistor;

(iv) a Finfet transistor; or (v) a double gate transistor.

22. A semiconductor device, comprising:

a first layer comprising first transistors;

an interconnection layer overlying said first transistors, said interconnection layer providing interconnection for said first transistors;

a bonding layer overlying said interconnection layer;

a second layer overlying said bonding layer, wherein said second layer comprises a plurality of second transistors on a first side of said second layer, wherein said first side faces said interconnection layer; and at least one through second layer via, wherein said at least one through second layer via has a diameter of less than 100 nm.

23. A semiconductor device according to claim 22, wherein said first layer comprises a first alignment mark, and wherein said at least one through second layer via is partially aligned to said first alignment mark.

24. A semiconductor device according to claim 22, wherein said second transistors form at least one second circuit, and wherein said first transistors form a first circuit substantially the same as the second circuit, and the semiconductor device further comprises:

a switch operable to cause one of said first and second circuits to be replaced by the other of said first and second circuits.

25. A semiconductor device according to claim 22, further comprising:

a heat spreader between said first layer and said second layer.

26. A semiconductor device according to claim 22, wherein said at least one through second layer via is adapted to conduct heat.

27. A semiconductor device according to claim 22, wherein at least one of said second transistors comprise a back-bias.

28. A semiconductor device according to claim 22, wherein said interconnection layer comprises copper or aluminum.

29. A semiconductor device according to claim 22, wherein at least one of said second transistors is one of:

(i) a recessed-channel transistor (RCAT);

(ii) a junction-less transistor;

(iii) a replacement-gate transistor;

(iv) a Finfet transistor; or (v) a double gate transistor.

30. A semiconductor device according to claim 22, wherein said interconnection layer comprises a first metal layer overlying said first layer and a second metal layer overlying said first metal layer; and wherein said first metal layer is substantially thicker than said second metal layer.

* * * * *